US011689315B2

(12) United States Patent
Murakami et al.

(10) Patent No.: US 11,689,315 B2
(45) Date of Patent: *Jun. 27, 2023

(54) TRANSMISSION METHOD, RECEPTION METHOD, TRANSMITTER, AND RECEIVER

(71) Applicant: Panasonic Intellectual Property Corporation of America, Torrance, CA (US)

(72) Inventors: Yutaka Murakami, Kanagawa (JP); Tomohiro Kimura, Osaka (JP); Mikihiro Ouchi, Osaka (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 17/463,811

(22) Filed: Sep. 1, 2021

(65) Prior Publication Data

US 2021/0409150 A1 Dec. 30, 2021

Related U.S. Application Data

(63) Continuation of application No. 16/901,295, filed on Jun. 15, 2020, now Pat. No. 11,153,036, which is a (Continued)

(30) Foreign Application Priority Data

Dec. 27, 2013 (JP) ................................ 2013-270949

(51) Int. Cl.
*H03M 13/00* (2006.01)
*H04L 1/00* (2006.01)
(Continued)

(52) U.S. Cl.
CPC ........ *H04L 1/0041* (2013.01); *H03M 13/255* (2013.01); *H04L 1/0045* (2013.01);
(Continued)

(58) Field of Classification Search
CPC ... H04L 1/0041; H04L 1/0045; H04L 1/0057; H04L 1/0071; H04L 1/0643; H04L 27/34;
(Continued)

(56) References Cited

U.S. PATENT DOCUMENTS 9,577,679 B2 2/2017 Jeong
9,859,922 B2 * 1/2018 Shinohara ........... H03M 13/356
(Continued)

FOREIGN PATENT DOCUMENTS

WO 2004/014013 2/2004
WO 2008/082277 7/2008

OTHER PUBLICATIONS

Extended European Search Report dated Jan. 26, 2017 in corresponding European patent application No. 14875389.0.
(Continued)

*Primary Examiner* — Christine T. Tu
(74) *Attorney, Agent, or Firm* — Wenderoth, Lind & Ponack, L.L.P.

(57) ABSTRACT

In a transmission method according to one aspect of the present disclosure, a encoder performs error correction coding on an information bit string to generate a code word. A mapper modulates a first bit string in which the number of bits is the predetermined integral multiple of (X+Y) in the code word using a first scheme, the first scheme being a set of a modulation scheme in which an X-bit bit string is mapped to generate a first complex signal and a modulation scheme in which a Y-bit bit string is mapped to generate a second complex signal, and modulates a second bit string in
(Continued)

which the first bit string is removed from the code word using a second scheme different from the first scheme.

1 Claim, 162 Drawing Sheets

Related U.S. Application Data continuation of application No. 16/360,221, filed on Mar. 21, 2019, now Pat. No. 10,727,975, which is a continuation of application No. 16/034,783, filed on Jul. 13, 2018, now Pat. No. 10,291,351, which is a continuation of application No. 15/190,163, filed on Jun. 22, 2016, now Pat. No. 10,057,007, which is a continuation of application No. PCT/JP2014/006341, filed on Dec. 19, 2014.

(51) Int. Cl.

| | |
|---|---|
| ***H04L 27/34*** | (2006.01) |
| ***H03M 13/25*** | (2006.01) |
| ***H04L 1/06*** | (2006.01) |
| *H03M 13/11* | (2006.01) |
| *H04B 7/06* | (2006.01) |
| *H04B 7/0413* | (2017.01) |
| *H04L 27/18* | (2006.01) |

(52) U.S. Cl.
CPC .......... *H04L 1/0057* (2013.01); *H04L 1/0071* (2013.01); *H04L 1/0643* (2013.01); *H04L 27/34* (2013.01); *H03M 13/1102* (2013.01); *H03M 13/1165* (2013.01); *H04B 7/0413* (2013.01); *H04B 7/0669* (2013.01); *H04L 27/18* (2013.01); *H04L 2001/0093* (2013.01)

(58) Field of Classification Search
CPC ............ H04L 27/18; H04L 2001/0093; H04B 7/0413; H04B 7/0669; H03M 13/255; H03M 13/1102; H03M 13/1165
See application file for complete search history.

(56) References Cited

U.S. PATENT DOCUMENTS

2007/0165104 A1 7/2007 Khan et al.
2014/0068385 A1 3/2014 Zhang
2014/0153625 A1 6/2014 Vojcic
2015/0188568 A1 7/2015 Myung
2016/0013841 A1 1/2016 Murakami
2016/0013952 A1 1/2016 Nakamura
2016/0198217 A1 7/2016 Ko
2017/0104553 A1 4/2017 Liu
2017/0149592 A1 5/2017 Kim
2017/0230061 A1 8/2017 Zhang
2017/0244588 A1 8/2017 Ling
2018/0048417 A1 2/2018 Arambepola
2019/0007067 A1* 1/2019 Zhang ................. H03M 13/036
2022/0140843 A1* 5/2022 Park ...................... H04L 1/0041 375/340

OTHER PUBLICATIONS

International Search Report of PCT application No. PCT/JP2014/006341 dated Mar. 10, 2015.
R. G. Gallager, "Low-Density Parity-Check Codes" IRE Transactions on information theory, pp. 21-28, 1962.
Ben Lu et al., "Performance Analysis and Design Optimization of LDPC-Coded MIMO OFDM Systems" IEEE Transactions on signal processing, vol. 52, No. 2, pp. 348-361, Feb. 2004.
Catherine Douillard et al., "Turbo Codes With Rate-m/(m+1) Constituent Convolutional Codes" IEEE transactions on communications, vol. 53, No. 10, pp. 1630-1638, Oct. 2005.
Claude Berrou et al., "The Ten-Year-Old Turbo Codes are Entering into Service" IEEE Communication Magazine, vol. 41, No. 8, pp. 110-116, Aug. 2003.
DVB Document A122, "Frame structure channel coding and modulation for a second generation digital terrestrial television broadcasting system (DVB-T2)", Jun. 2008.
David J. C. MacKay, "Good Error-Correcting Codes Based on Very Sparse Matrices" IEEE Transactions on information theory, vol. 45, No. 2, pp. 399-431, Mar. 1999.
Siavash M. Alamouti, "A Simple Transmit Diversity Technique for Wireless Communications" IEEE J. Select Areas Commun., vol. 16, No. 8, pp. 1451-1458, Oct. 1998.
Vahid Tarokh et al., "Space-Time Block Coding for Wireless Communications: Performance Results" IEEE J. Selected Areas Commun., vol. 17, No. 3, pp. 451-460, Mar. 1999.

* cited by examiner b0, b1, b2, b3: 0000 TO 1111 b0, b1, b2, b3, b4, b5: 000000 TO 111111

TRANSMISSION METHOD, RECEPTION METHOD, TRANSMITTER, AND RECEIVER

BACKGROUND

1. Technical Field

The present disclosure relates to a transmission method and a reception method with a transmitter and a receiver, in which a multi-antenna is used.

2. Description of the Related Art

Conventionally, for example, there is a communication method called MIMO (Multiple-Input Multiple-Output) as a communication method in which a multi-antenna is used.

In the multi-antenna communication typified by MIMO, at least one series of transmitted data is modulated, and modulated signals are simultaneously transmitted at an identical frequency (common frequency) from different antennas, which allows enhancement of data reception quality and/or data communication rate (per unit time).

FIG. 72 is a view illustrating an outline of a spatial multiplex MIMO scheme. In the MIMO scheme of FIG. 72, configuration examples of a transmitter and a receiver are illustrated for two transmitting antennas (TX1 and TX2), two receiving antennas (RX1 and RX2), and two transmitted modulated signals (transmission streams).

The transmitter includes a signal generator and a radio processor. The signal generator performs communication path coding of the data to perform MIMO precoding processing, and generates two transmitted signals z1(t) and z2(t) that can simultaneously be transmitted at an identical frequency (common frequency). The radio processor multiplexes each transmitted signal in a frequency direction as needed basis, namely, performs a multi-carrier modulation (for example, OFDM scheme)), and inserts a pilot signal that is used when the receiver estimates a transmission path distortion, a frequency offset, and a phase distortion. (Alternatively, the pilot signal may be used to estimate another distortion, or the pilot signal may be used to detect a signal in the receiver. A usage mode of the pilot signal in the receiver is not limited to the above estimations or the signal detection.) The transmitting antenna transmits z1(t) and z2(t) using two antennas (TX1 and TX2).

The receiver includes receiving antennas (RX1 and RX2), a radio processor, a channel variation estimator, and a signal processor. Receiving antenna (RX1) receives the signals transmitted from two transmitting antennas (TX1 and TX2) of the transmitter. The channel variation estimator estimates a channel variation using the pilot signal, and supplies an estimated value of the channel variation to the signal processor. Based on channel values estimated as the signals received by the two receiving antennas, the signal processor restores pieces of data included in z1(t) and z2(t), and obtains the pieces of data as one piece of received data. The received data may be a hard decision value of "0" and "1" or a soft decision value such as a log-likelihood or a log-likelihood ratio.

Various coding methods such as a turbo code and an LDPC (Low-Density Parity-Check) code are used as the coding method (NPLs 1 and 2).

CITATION LIST

Non-Patent Literature

NPL 1: R. G. Gallager, "Low-density parity-check codes," IRE Trans. Inform. Theory, IT-8, pp-21-28, 1962.

NPL 2: "Performance analysis and design optimization of LDPC-coded MIMO OFDM systems" IEEE Trans. Signal Processing, vol. 52, no. 2, pp. 348-361, February 2004.

NPL 3: C. Douillard, and C. Berrou, "Turbo codes with rate-m/(m+1) constituent convolutional codes," IEEE Trans. Commun., vol. 53, no. 10, pp. 1630-1638, October 2005.

NPL 4: C. Berrou, "The ten-year-old turbo codes are entering into service", IEEE Communication Magazine, vol. 41, no. 8, pp. 110-116, August 2003.

NPL 5: DVB Document A122, Framing structure, channel coding and modulation for a second generation digital terrestrial television broadcasting system (DVB-T2), June 2008.

NPL 6: D. J. C. Mackay, "Good error-correcting codes based on very sparse matrices," IEEE Trans. Inform. Theory, vol. 45, no. 2, pp 399-431, March 1999.

NPL 7: S. M. Alamouti, "A simple transmit diversity technique for wireless communications," IEEE J. Select. Areas Commun., vol. 16, no. 8, pp. 1451-1458, October 1998.

NPL 8: V. Tarokh, H. Jafrkhani, and A. R. Calderbank, "Space-time block coding for wireless communications: Performance results," IEEE J. Select. Areas Commun., vol. 17, no. 3, no. 3, pp. 451-460, March 1999.

SUMMARY

In one general aspect, the techniques disclosed here feature a transmission method including: performing error correction coding on an information bit string to generate a code word having a number of bits that is greater than a predetermined integral multiple of (X+Y); modulating a first bit string in which the number of bits is the predetermined integral multiple of (X+Y) in the code word using a first scheme, the first scheme being a set of a modulation scheme in which mapping an X-bit bit string to generate a first complex signal and a modulation scheme in which mapping a Y-bit bit string to generate a second complex signal; and modulating a second bit string in which the first bit string is removed from the code word using a second scheme different from the first scheme.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF DRAWINGS

FIG. 115 is a view illustrating an arrangement example of the 64QAM signal points in the I-Q plane;

FIG. 116 is a view illustrating an arrangement example of the 256QAM signal points in the I-Q plane;

FIG. 117 is a view illustrating a configuration example of the transmitter;

FIG. 118 is a view illustrating a configuration example of the receiver;

FIG. 119 is a view illustrating an arrangement example of the 16QAM signal points in the I-Q plane;

FIG. 120 is a view illustrating an arrangement example of the 64QAM signal points in the I-Q plane;

FIG. 121 is a view illustrating an arrangement example of the 256QAM signal points in the I-Q plane;

FIG. 122 is a view illustrating a configuration example of the transmitter;

FIG. 123 is a view illustrating an example of the frame configuration;

FIG. 124 is a view illustrating a configuration example of the receiver;

FIG. 125 is a view illustrating a configuration example of the transmitter;

FIG. 126 is a view illustrating an example of the frame configuration;

Figure 127:
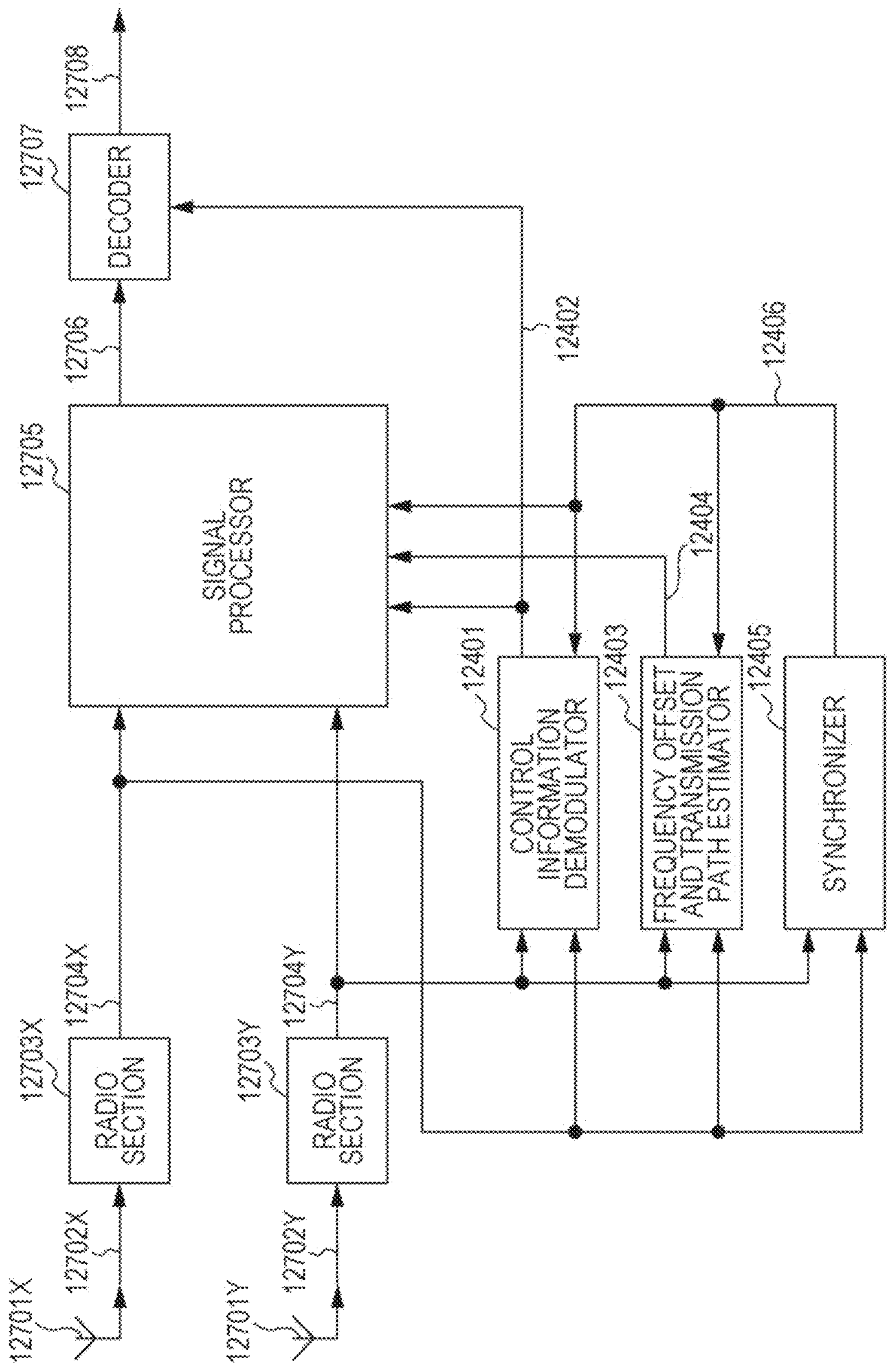
Figure 128:
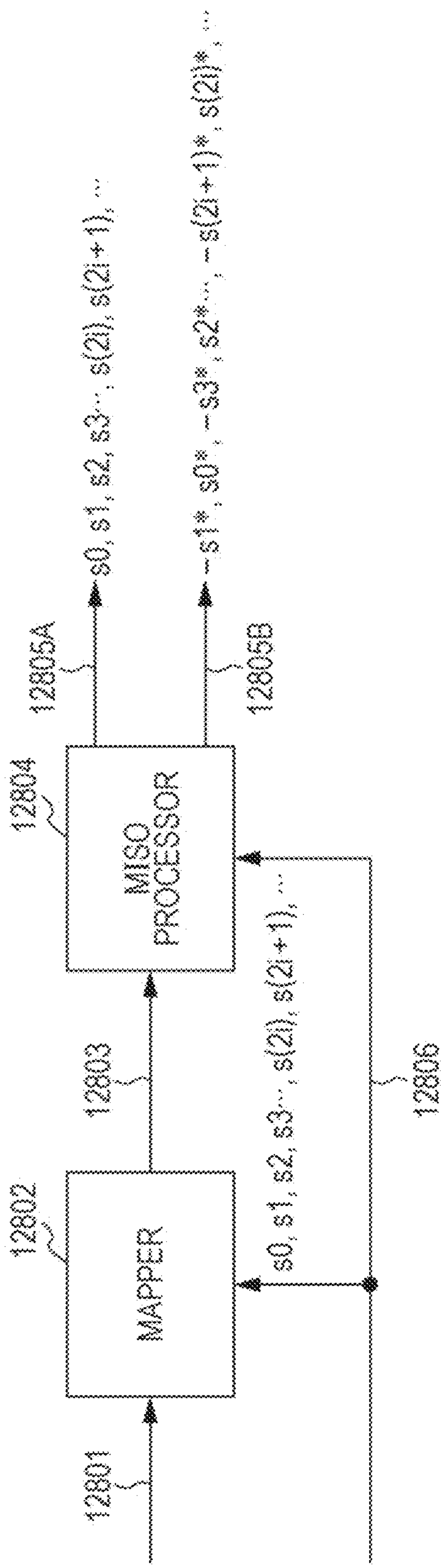
Figure 129:
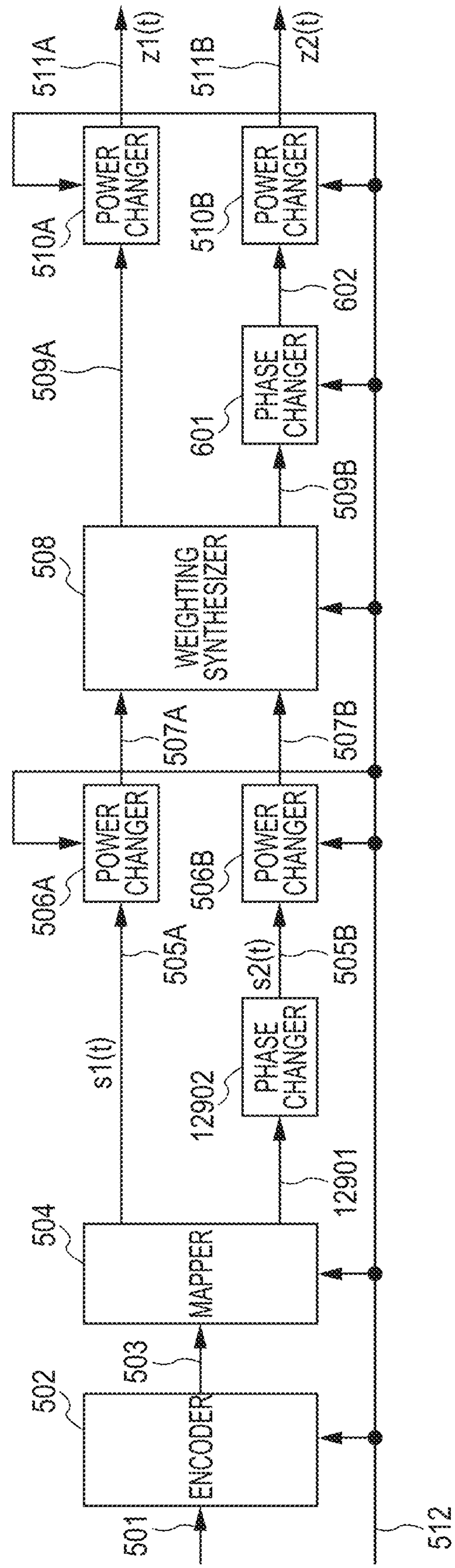
Figure 130:
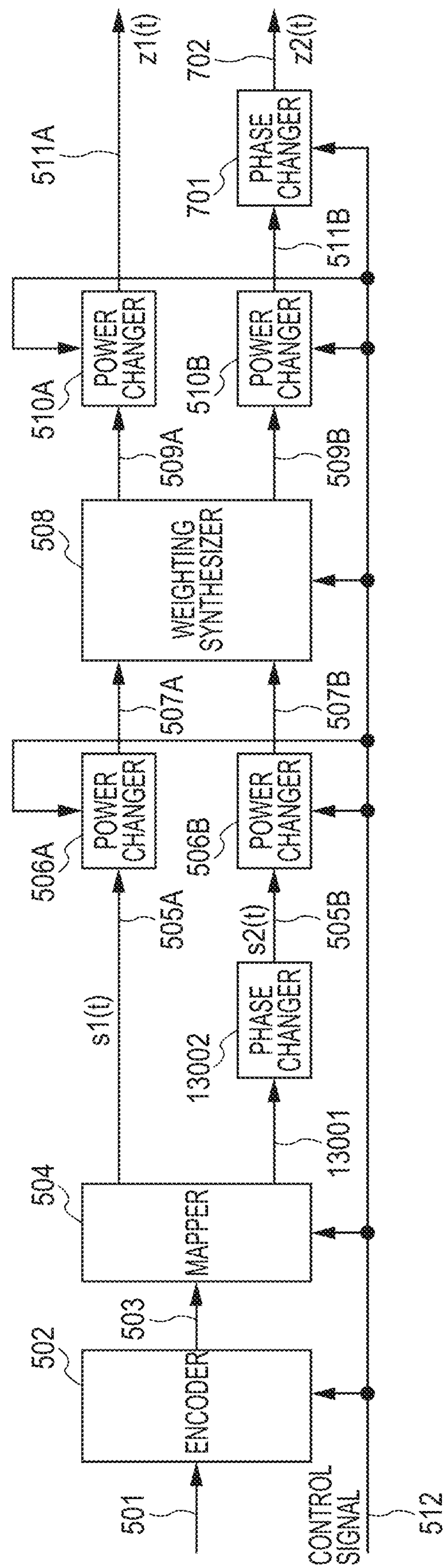
Figure 131:
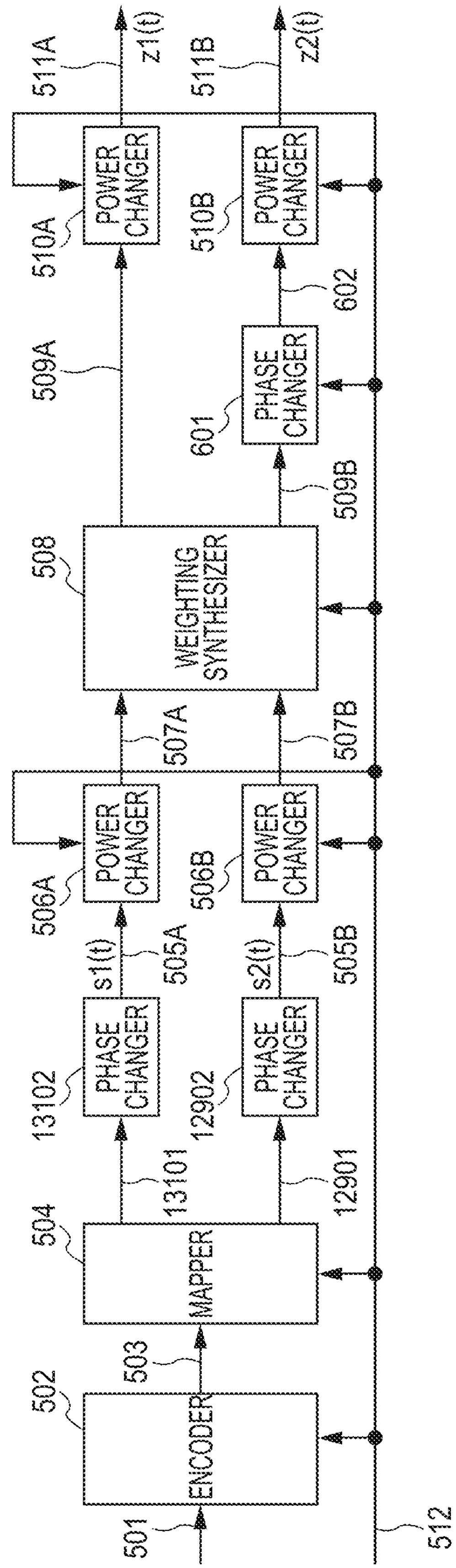
Figure 132:
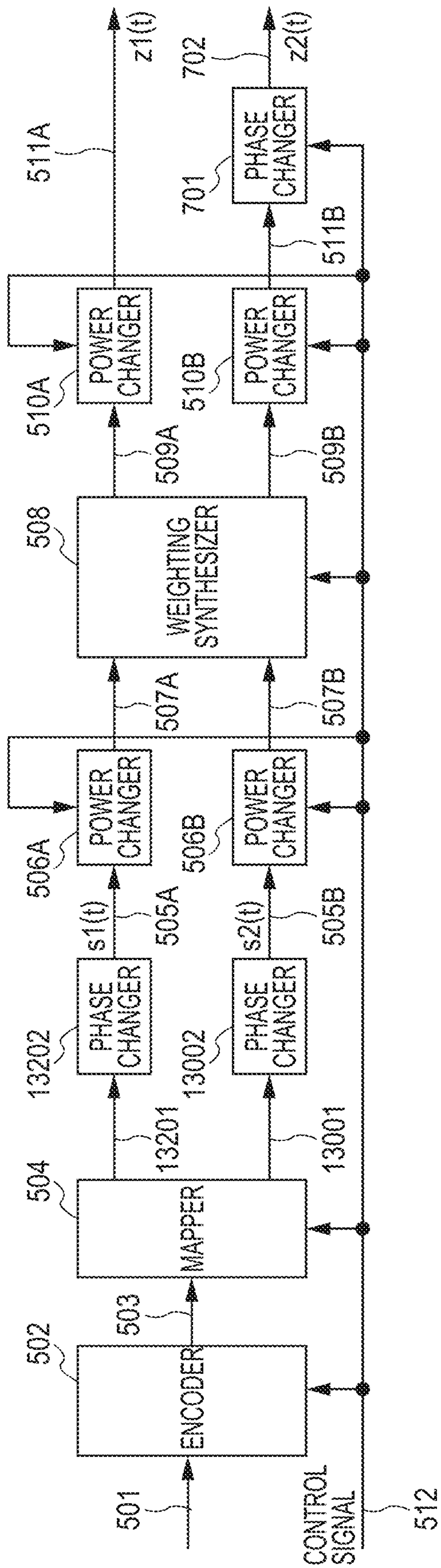
Figure 133:
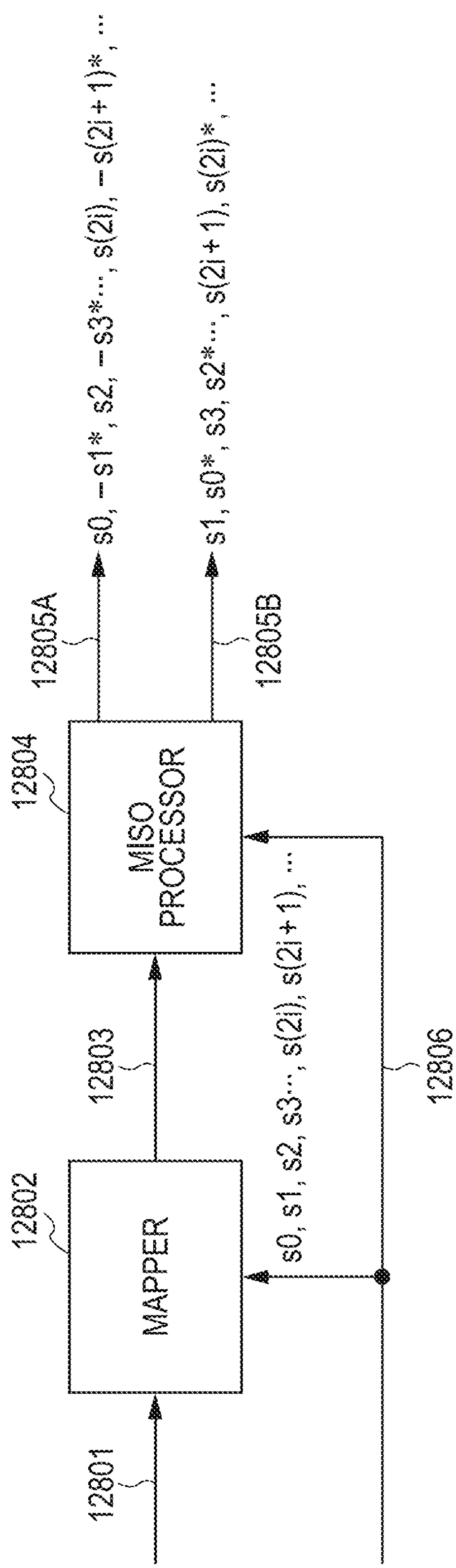
Figure 134:
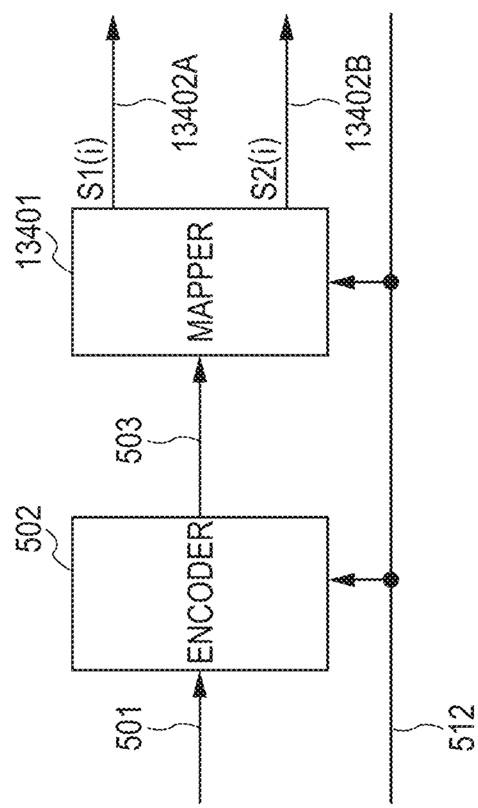
Figure 135:
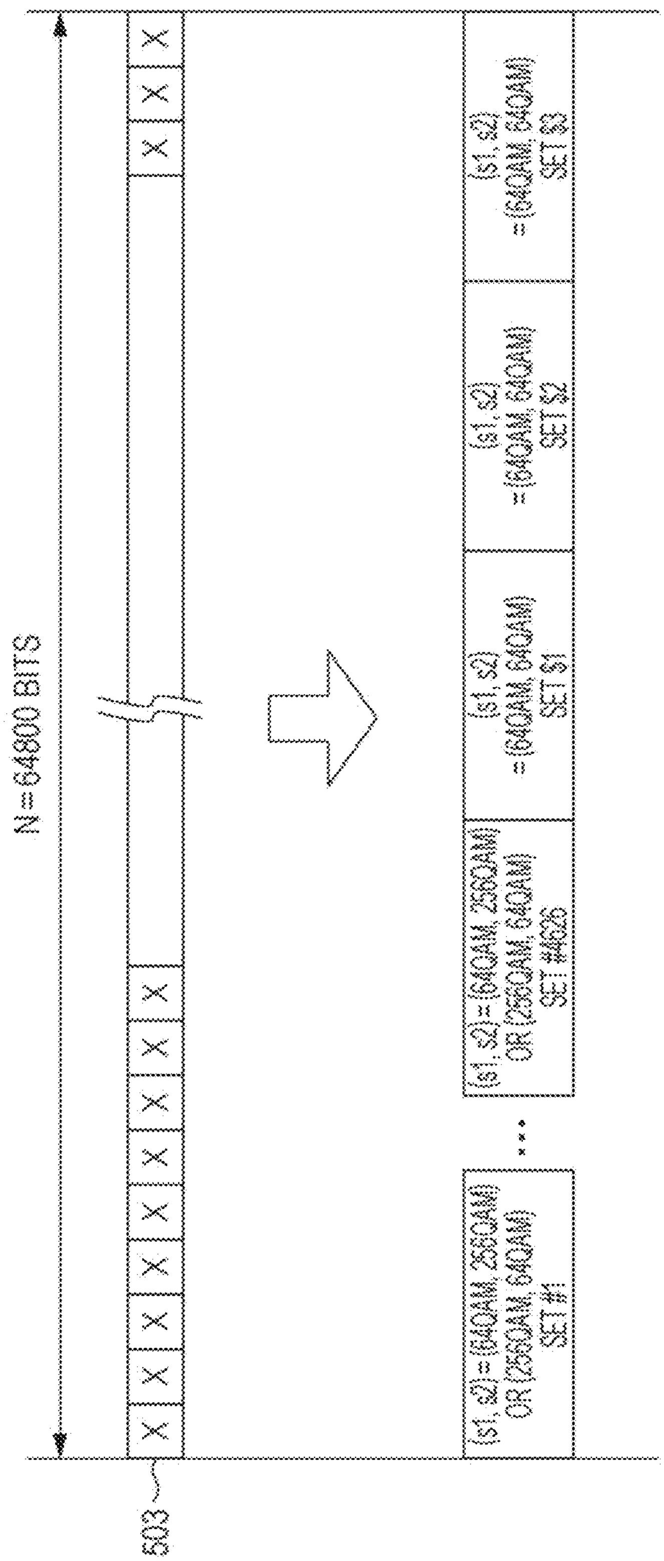
Figure 136:
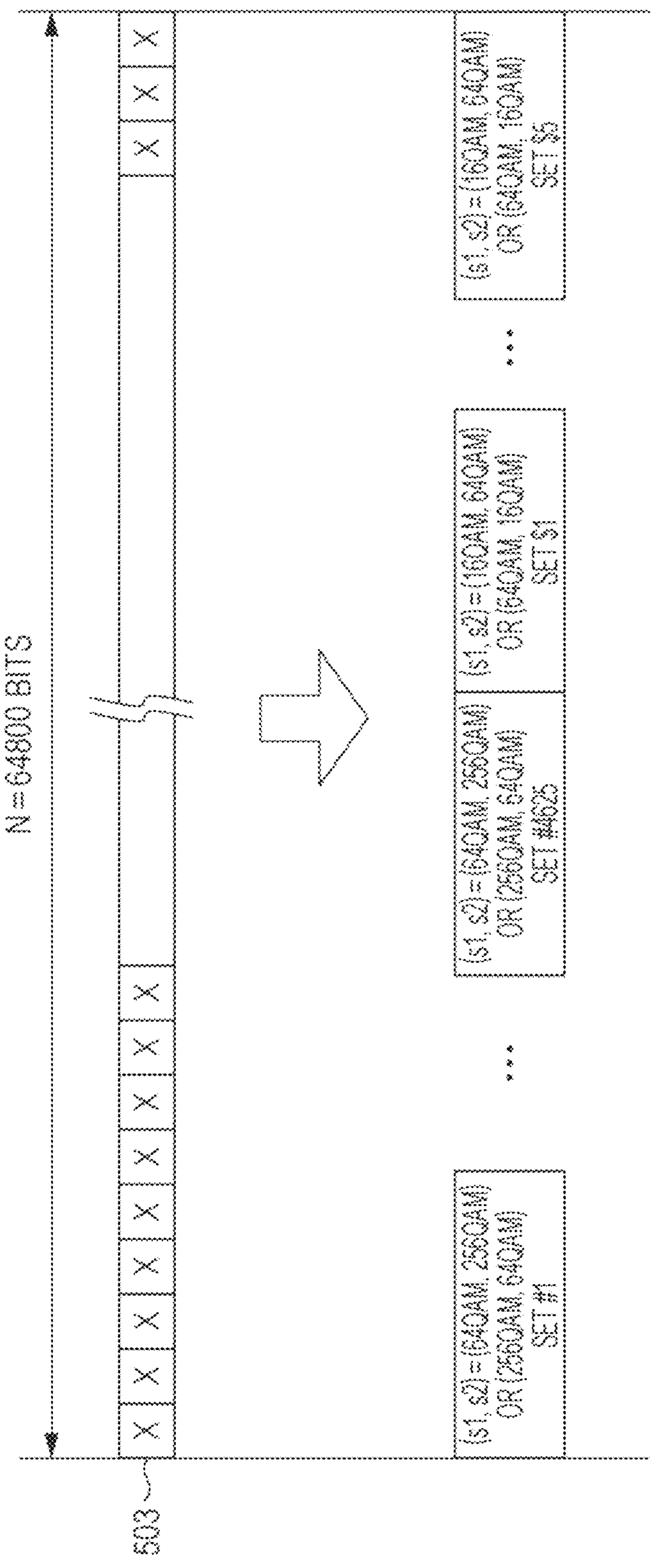
Figure 137:
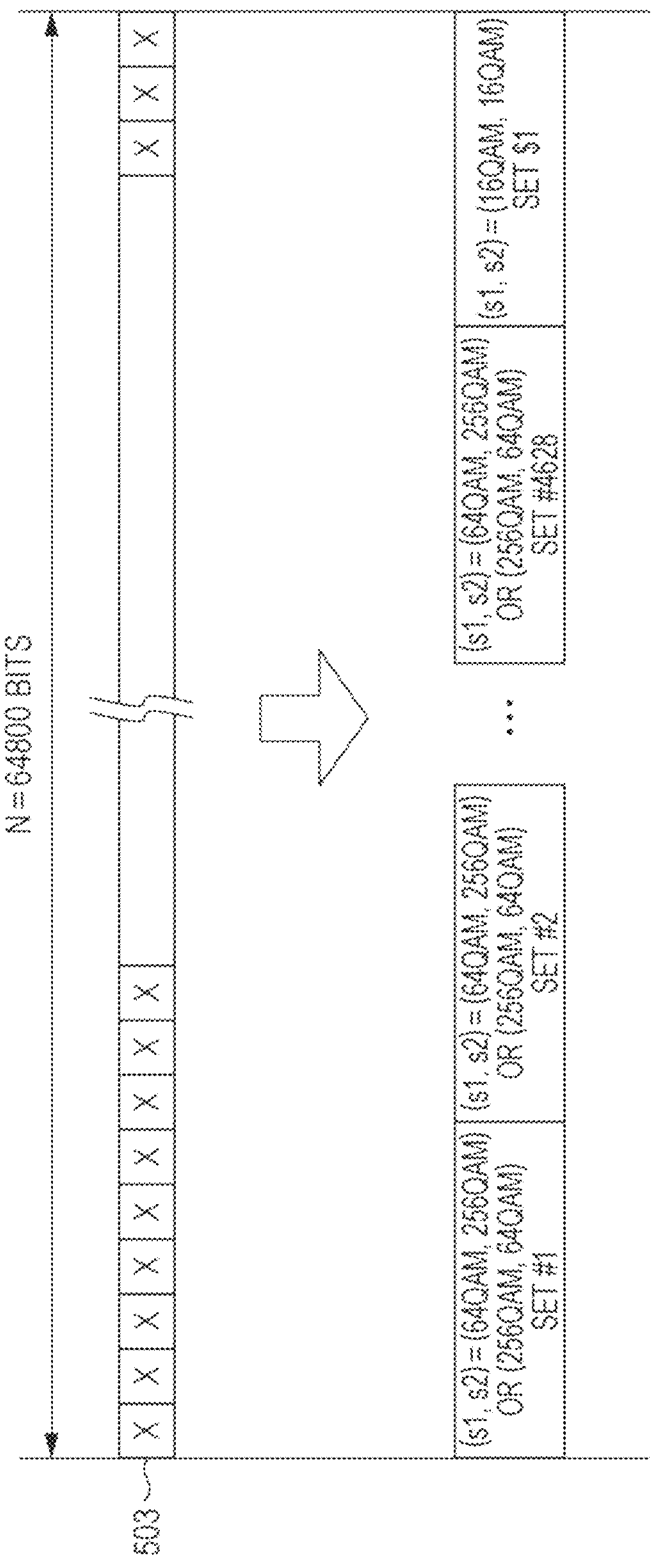
Figure 138:
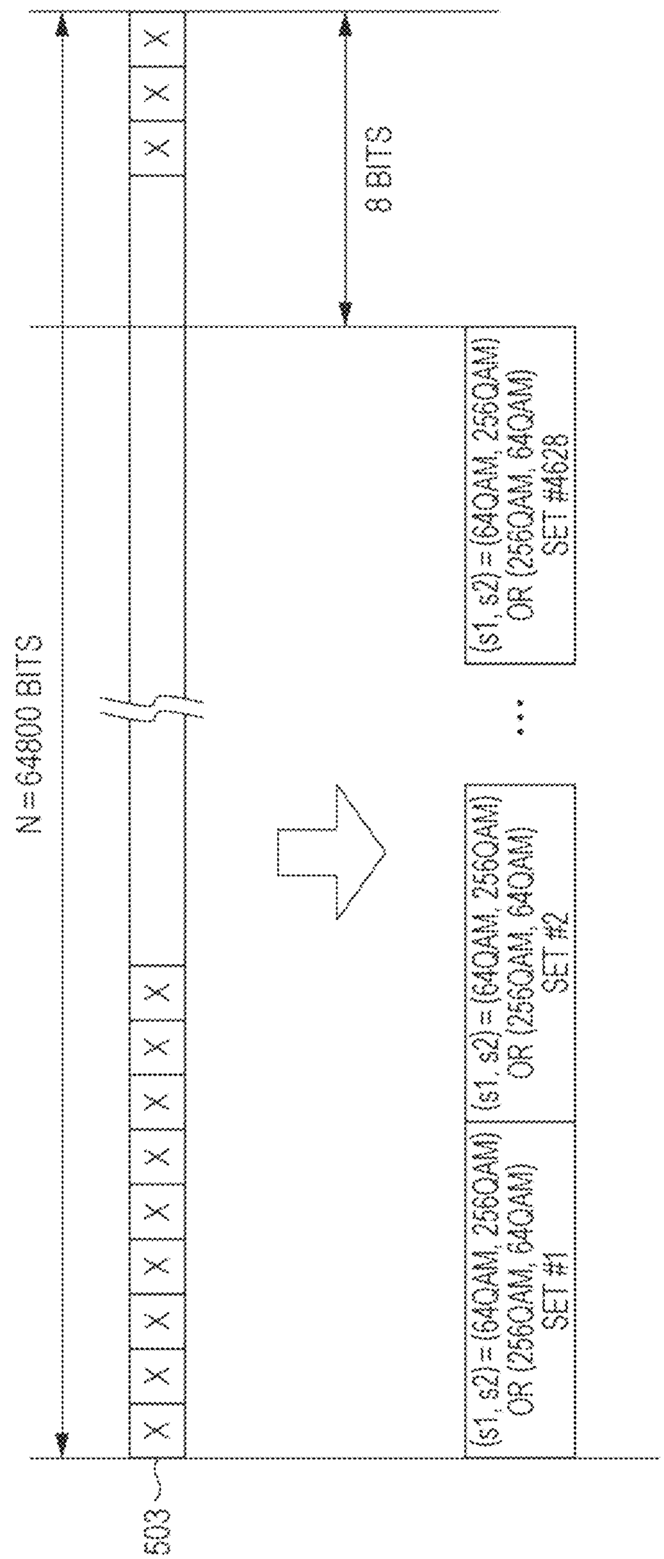
Figure 139:
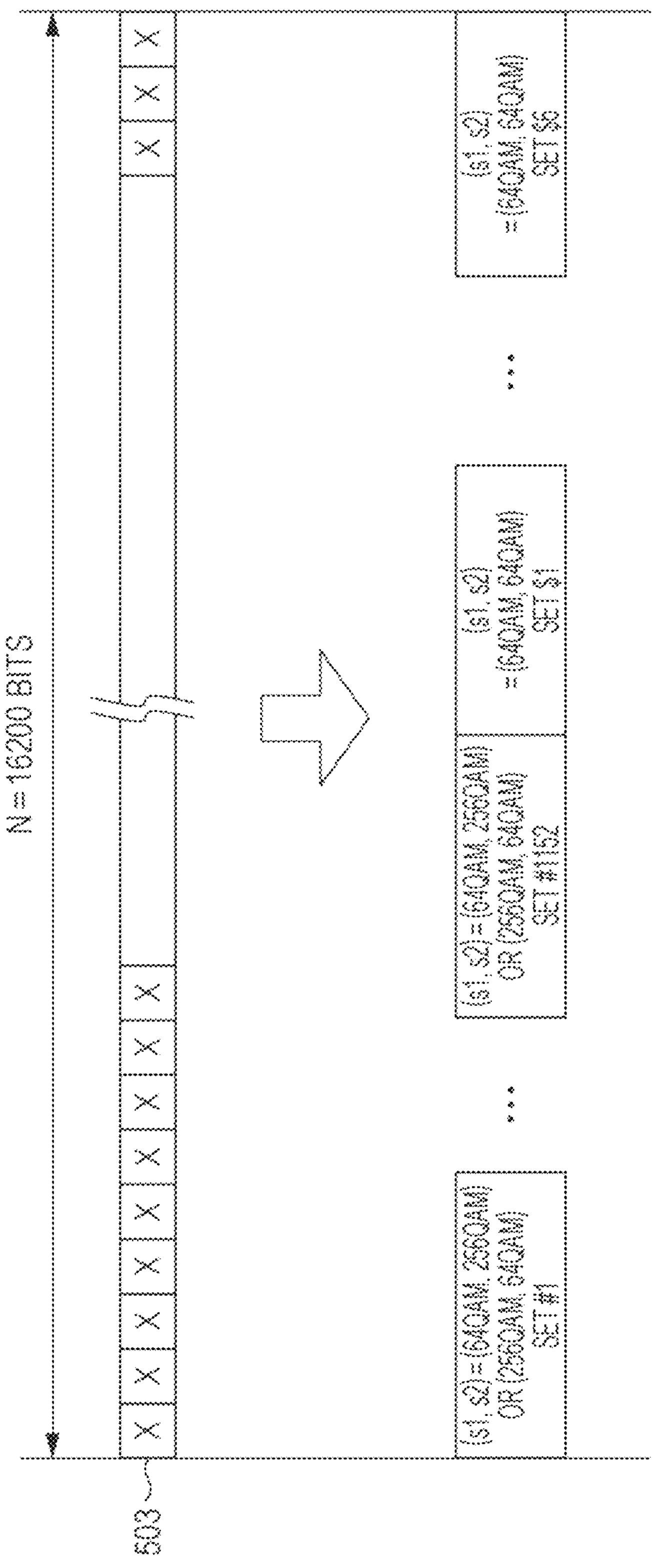
Figure 140:
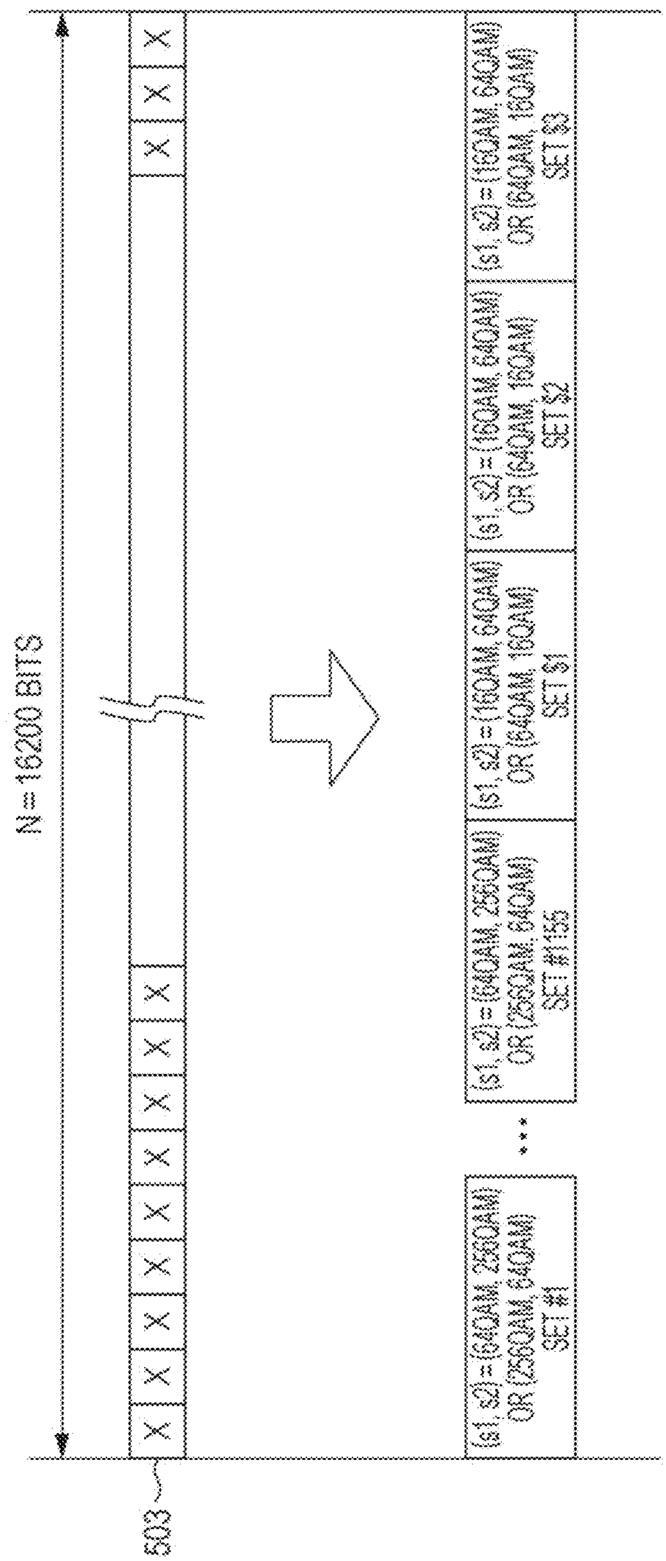
Figure 141:
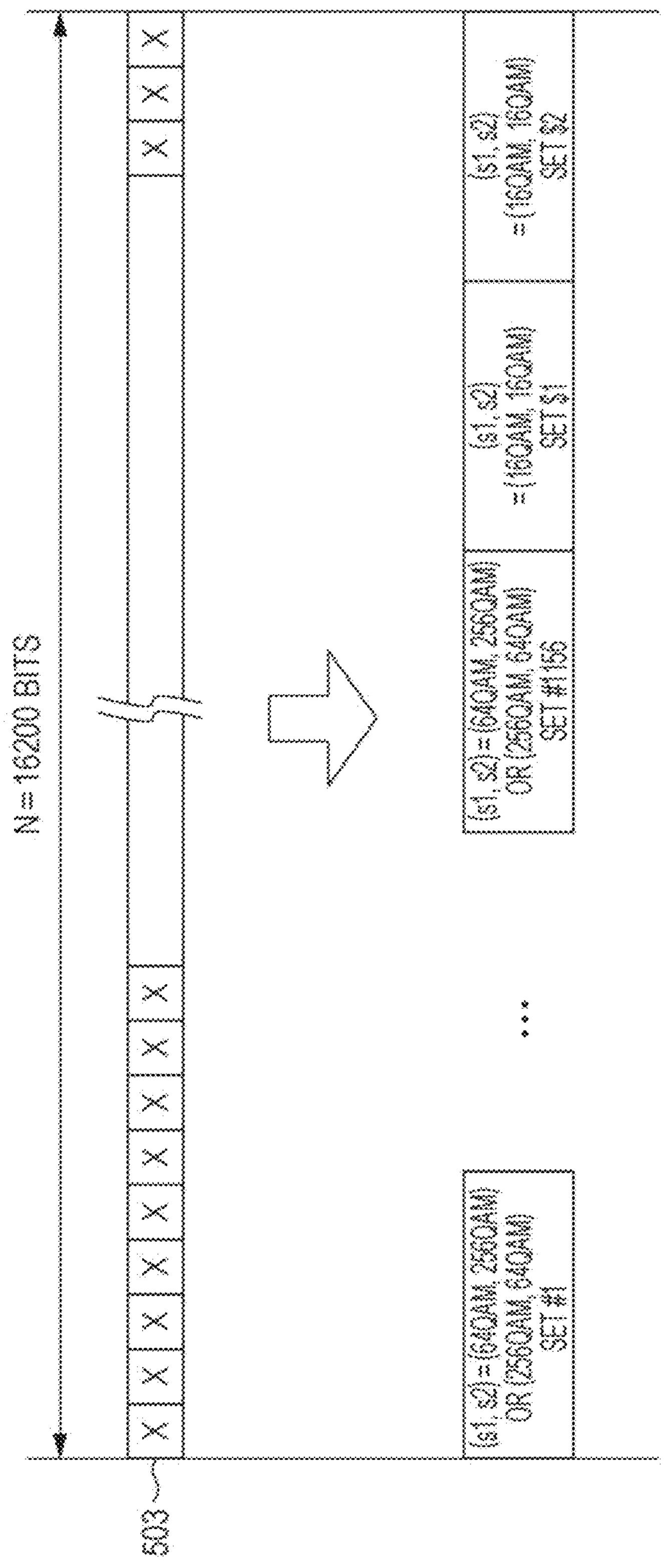
Figure 142:
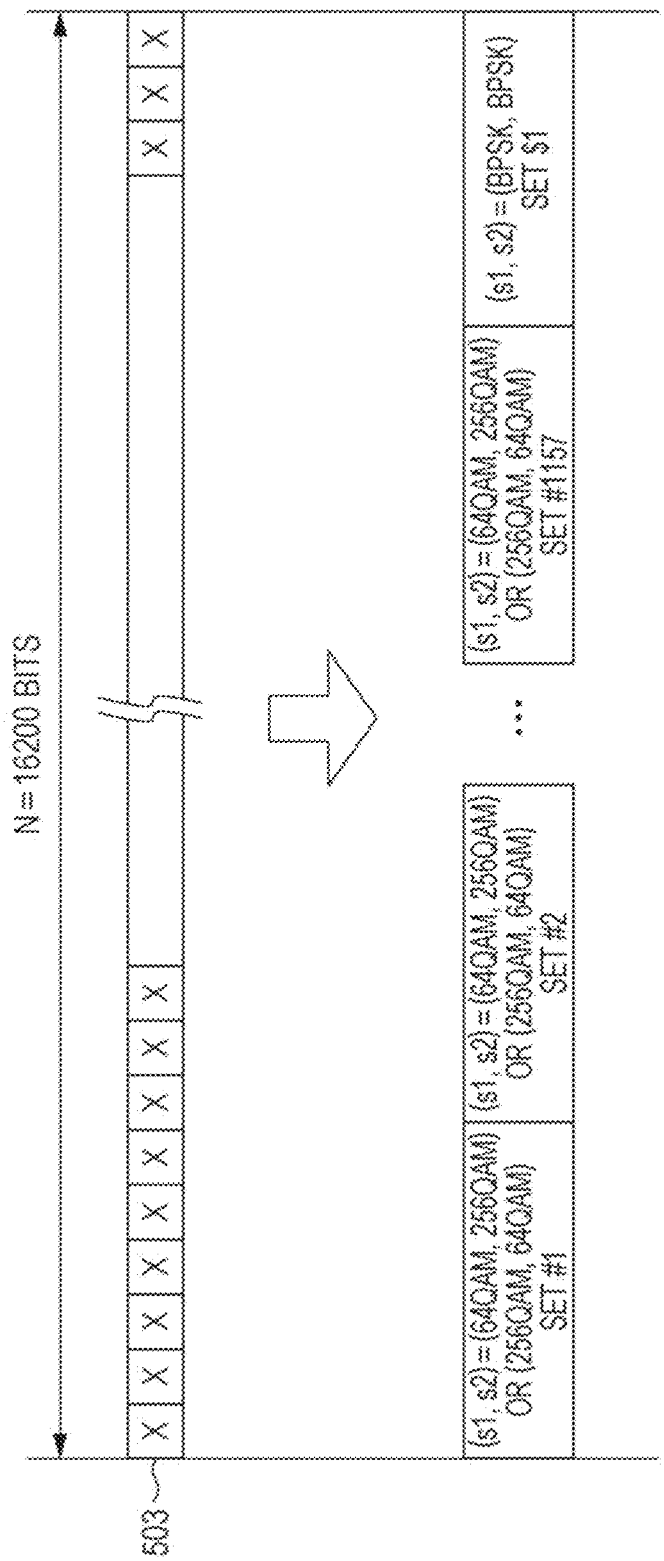
Figure 143:
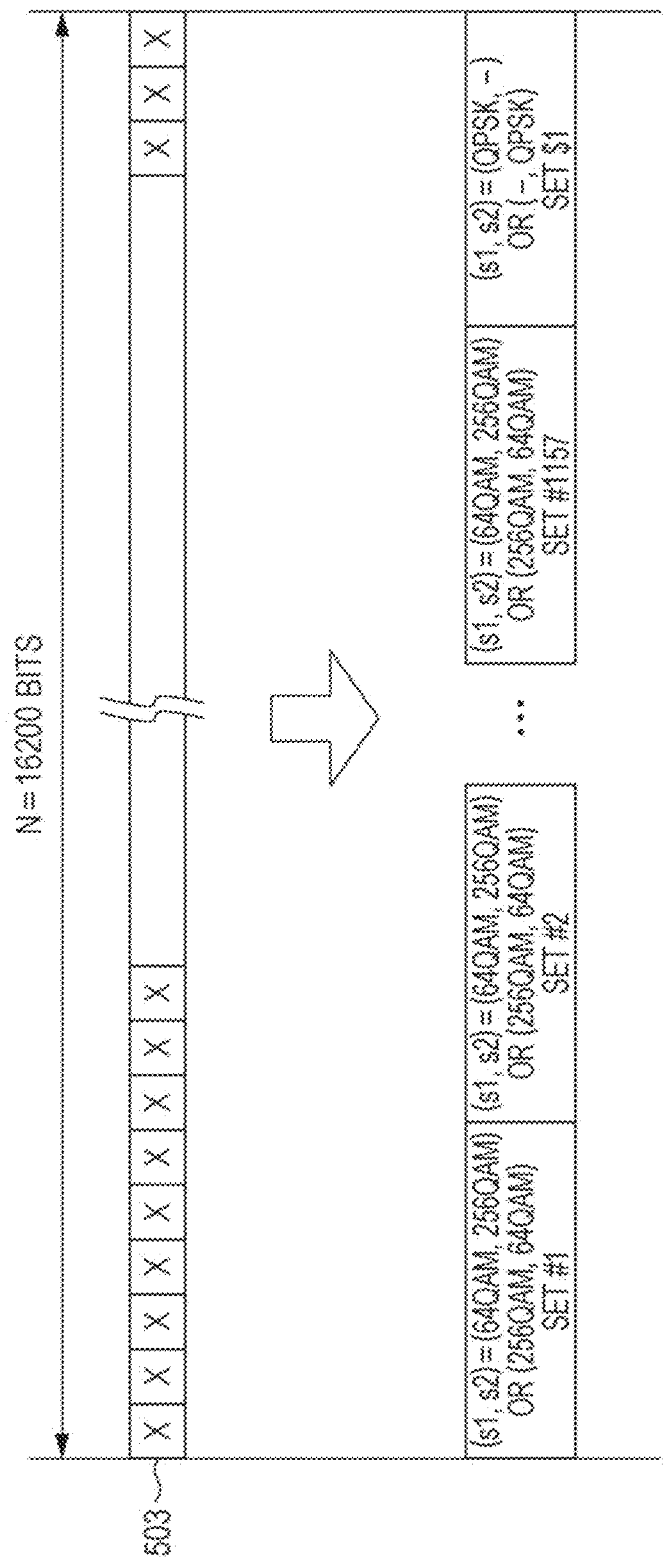
Figure 144:
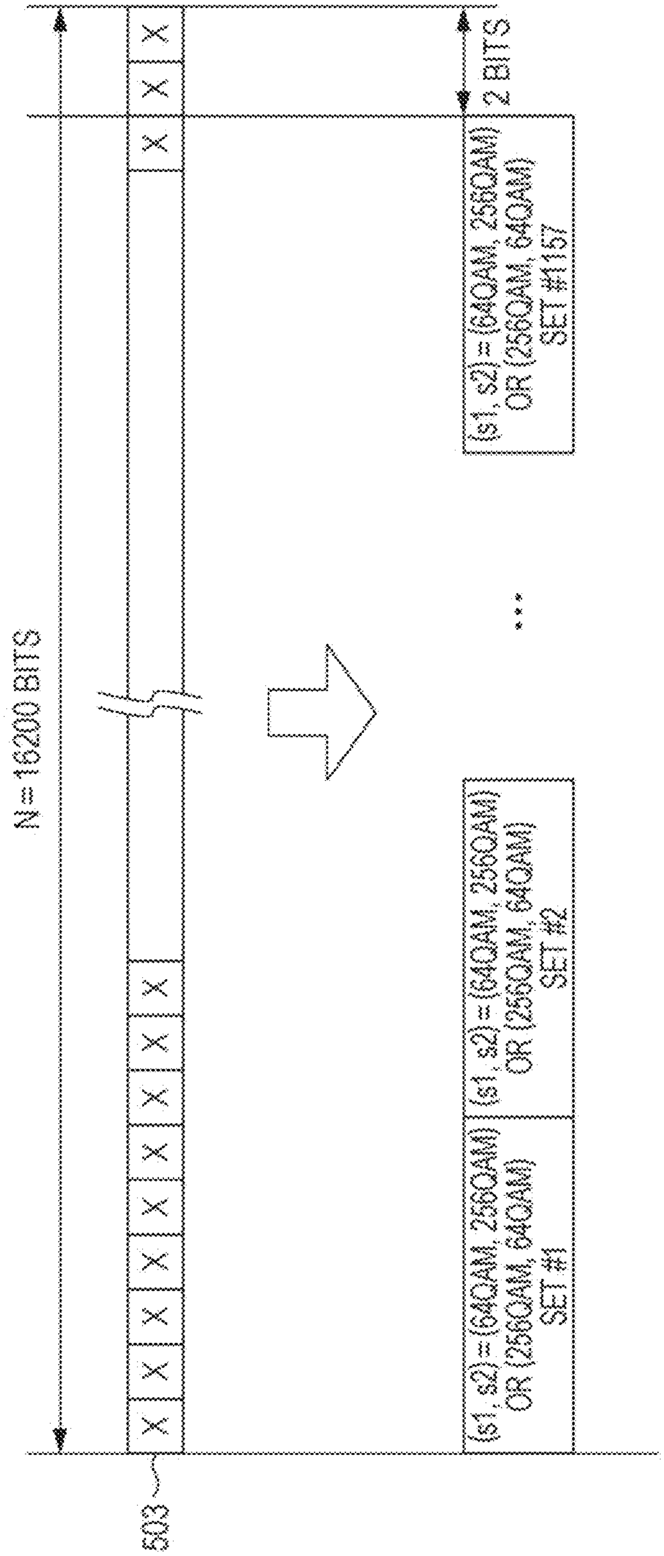
Figure 145:
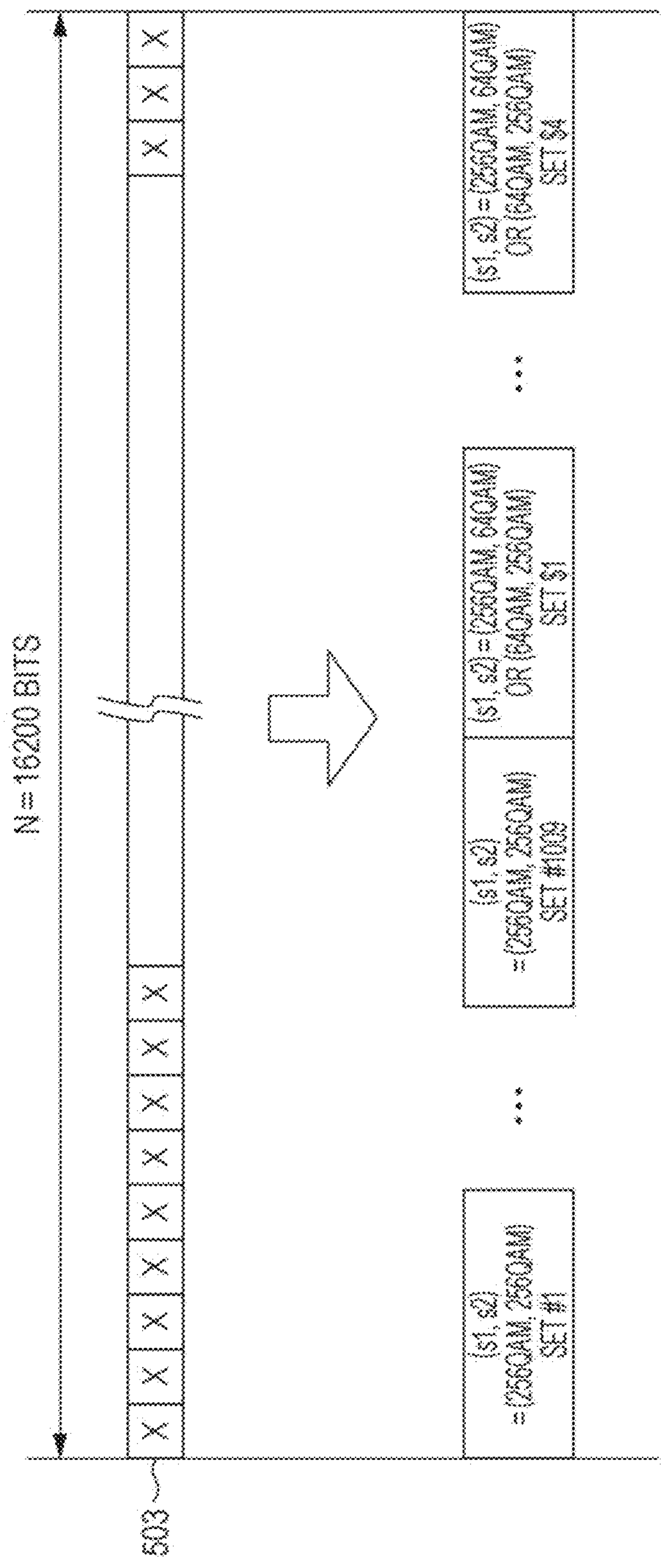
Figure 146:
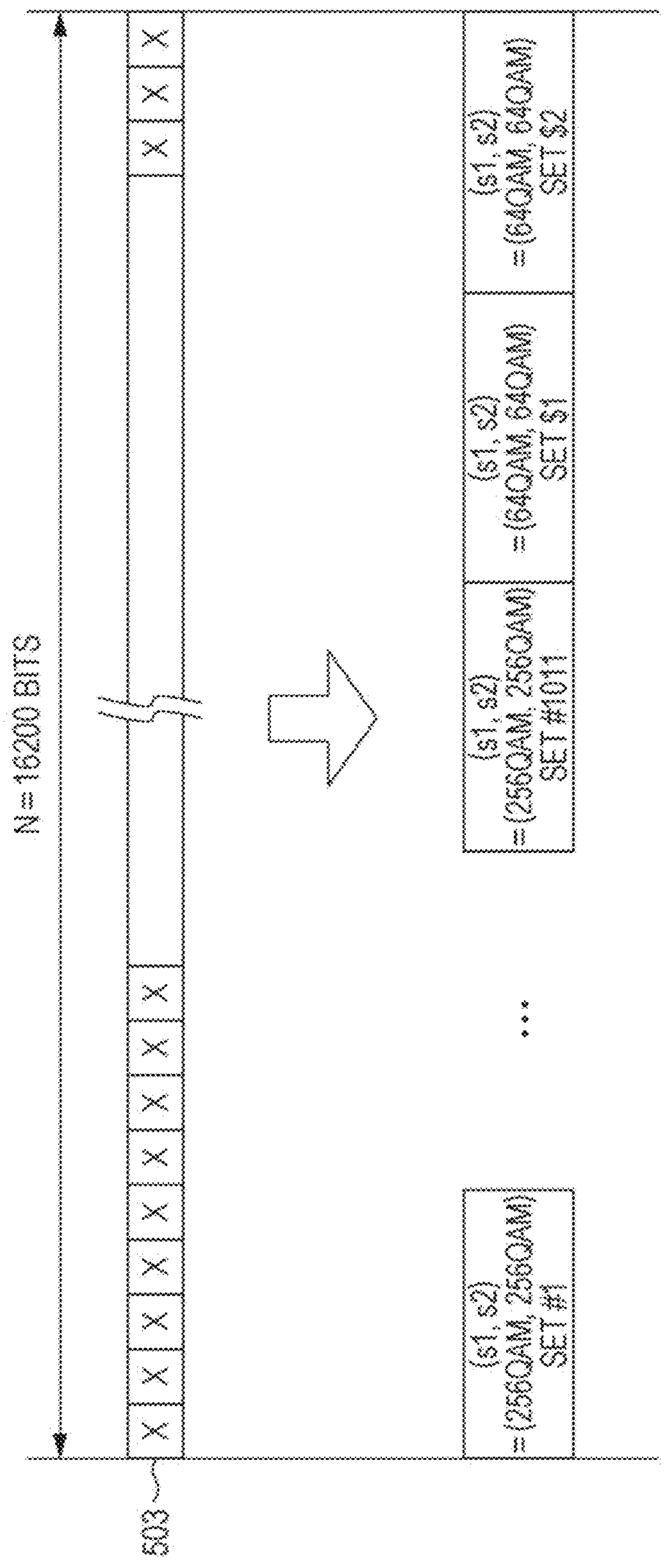
Figure 147:
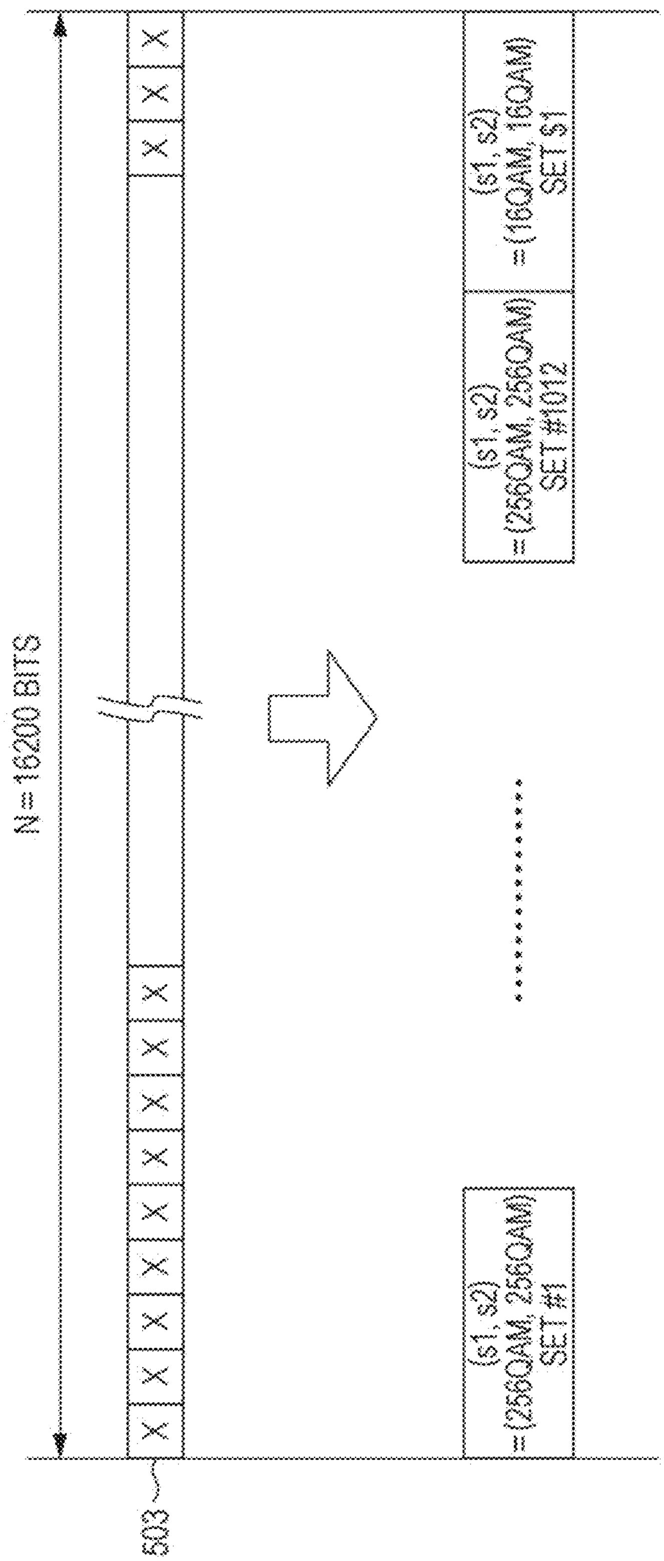
Figure 148:
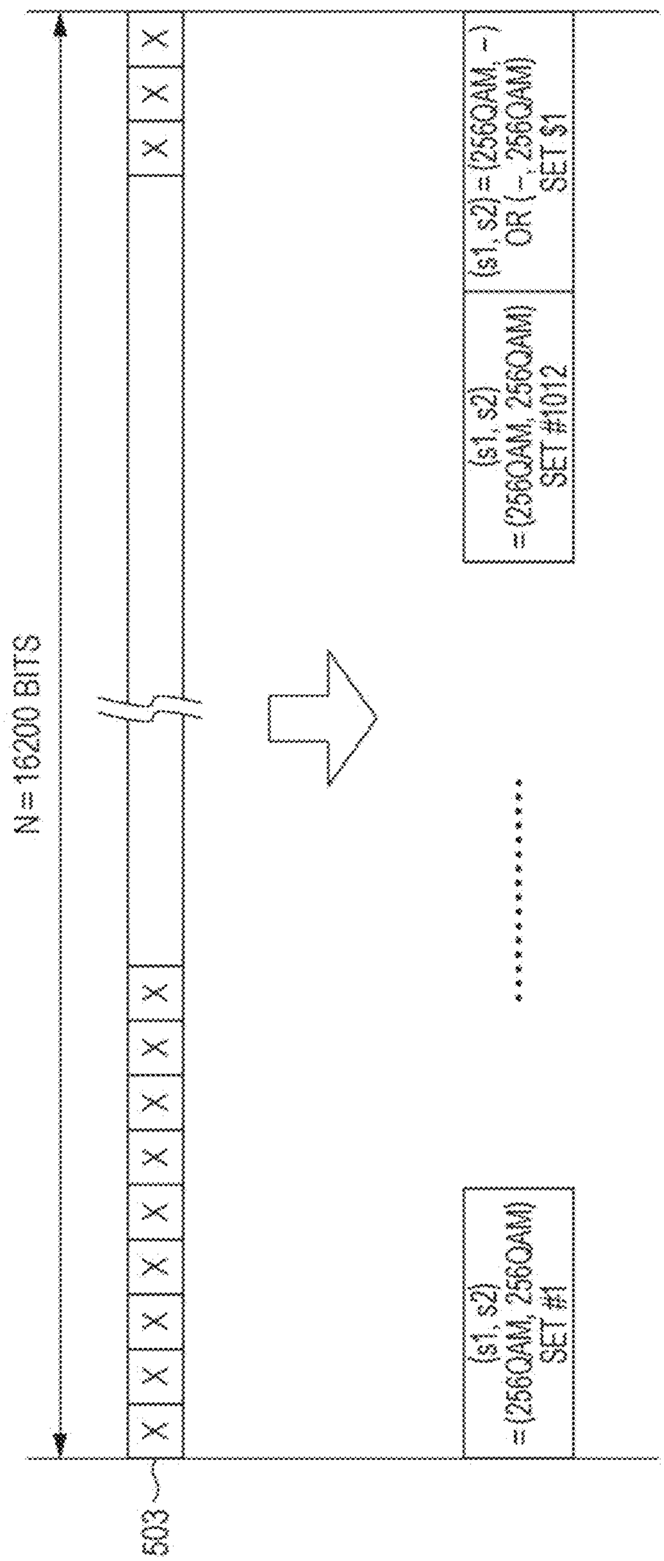
Figure 149:
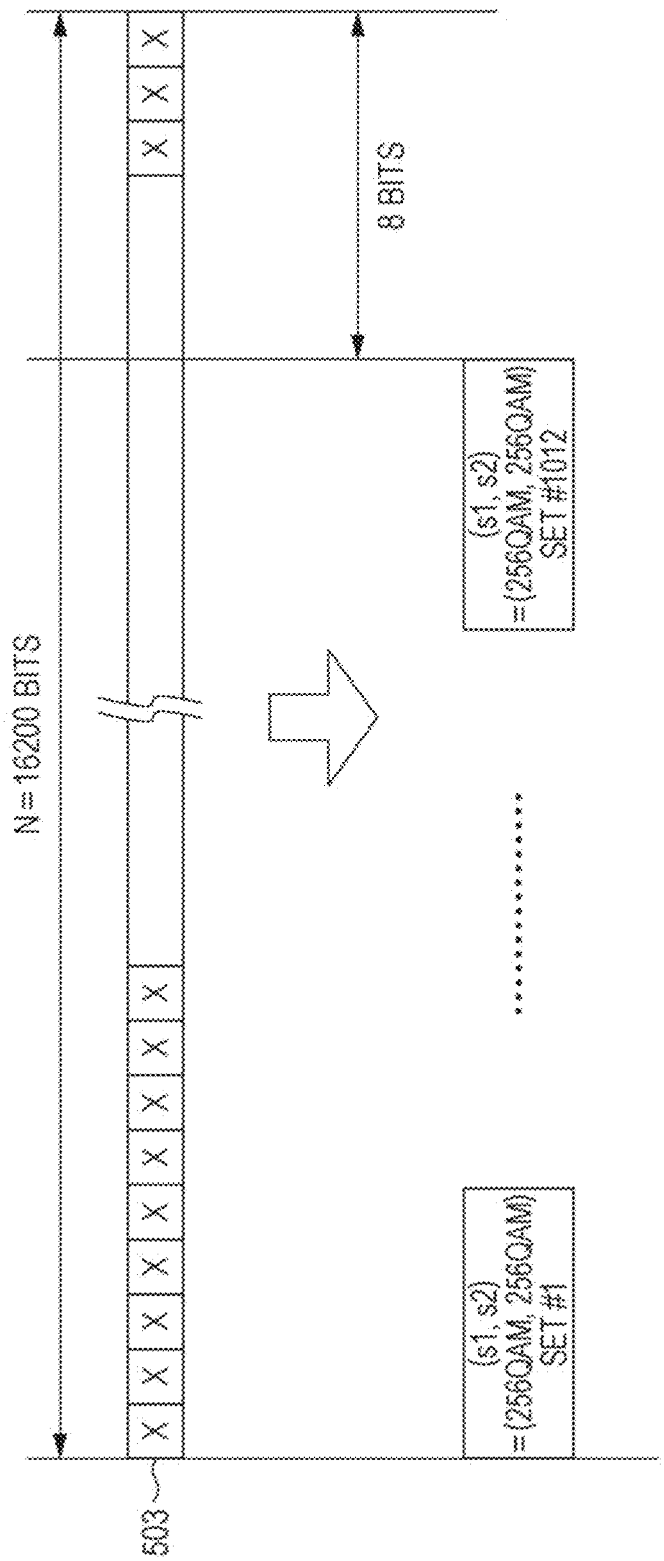
Figure 150:
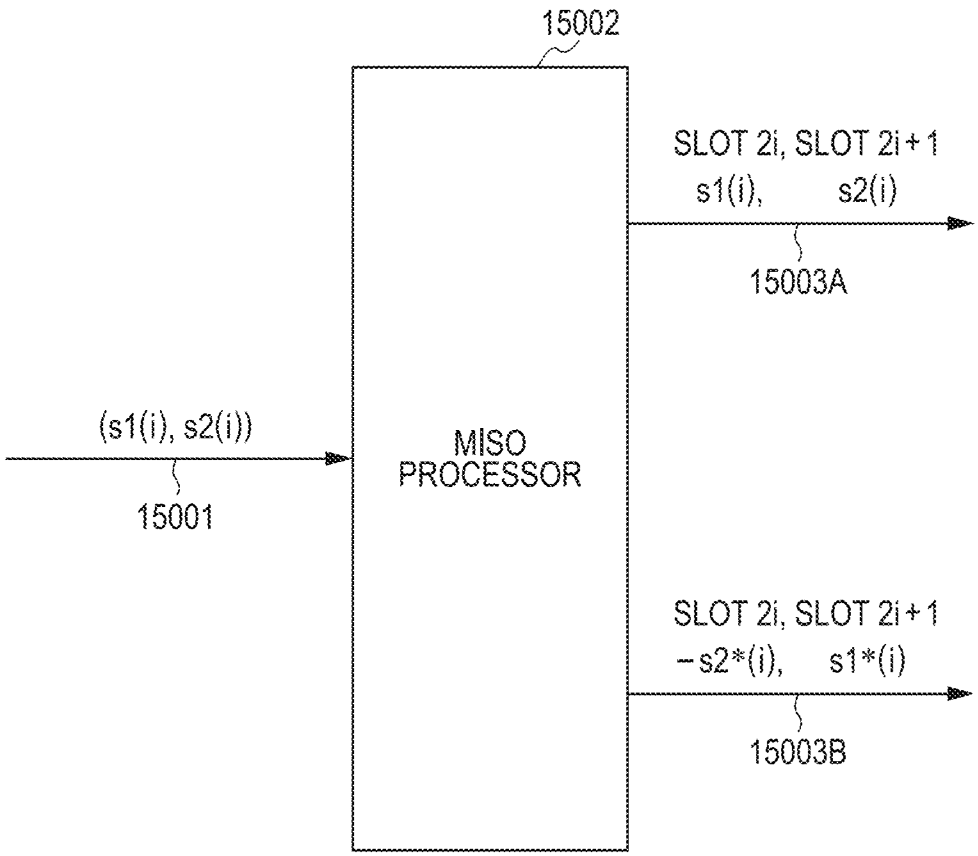
Figure 151:
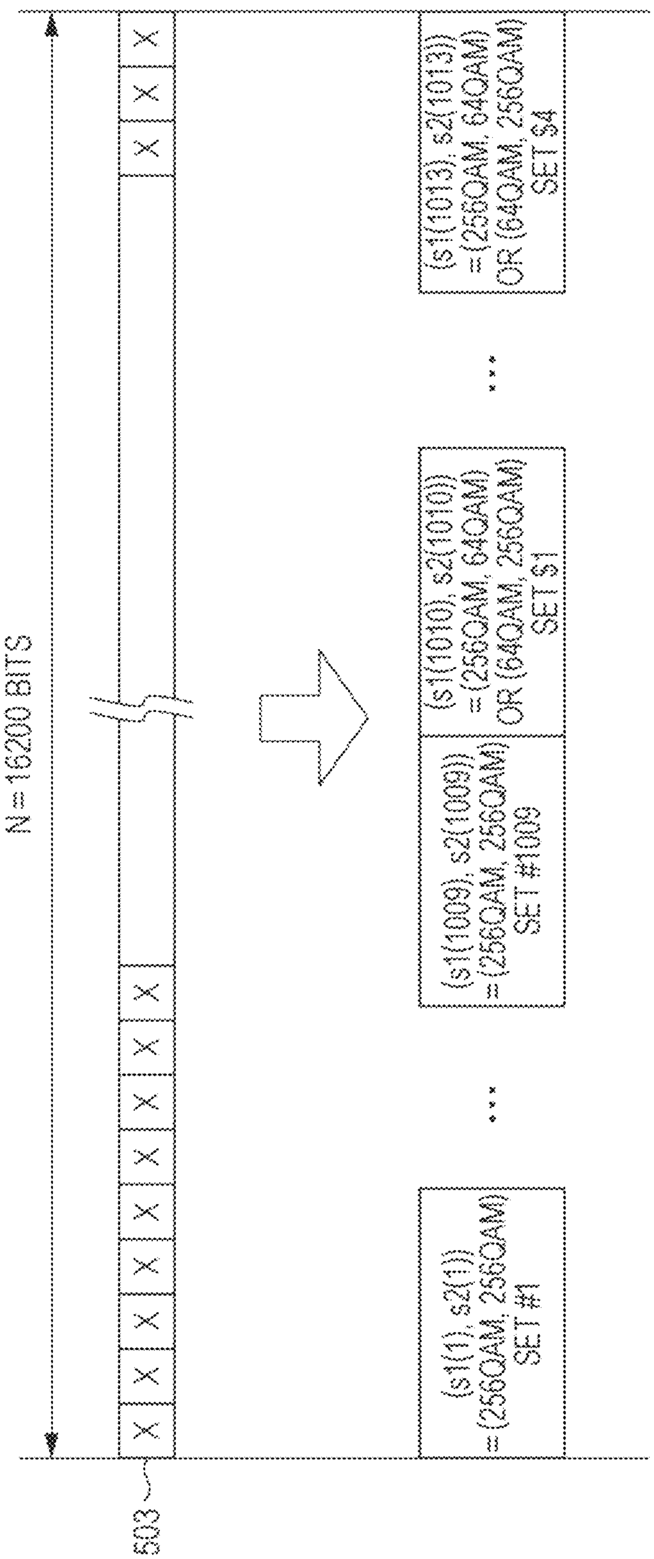
Figure 152:
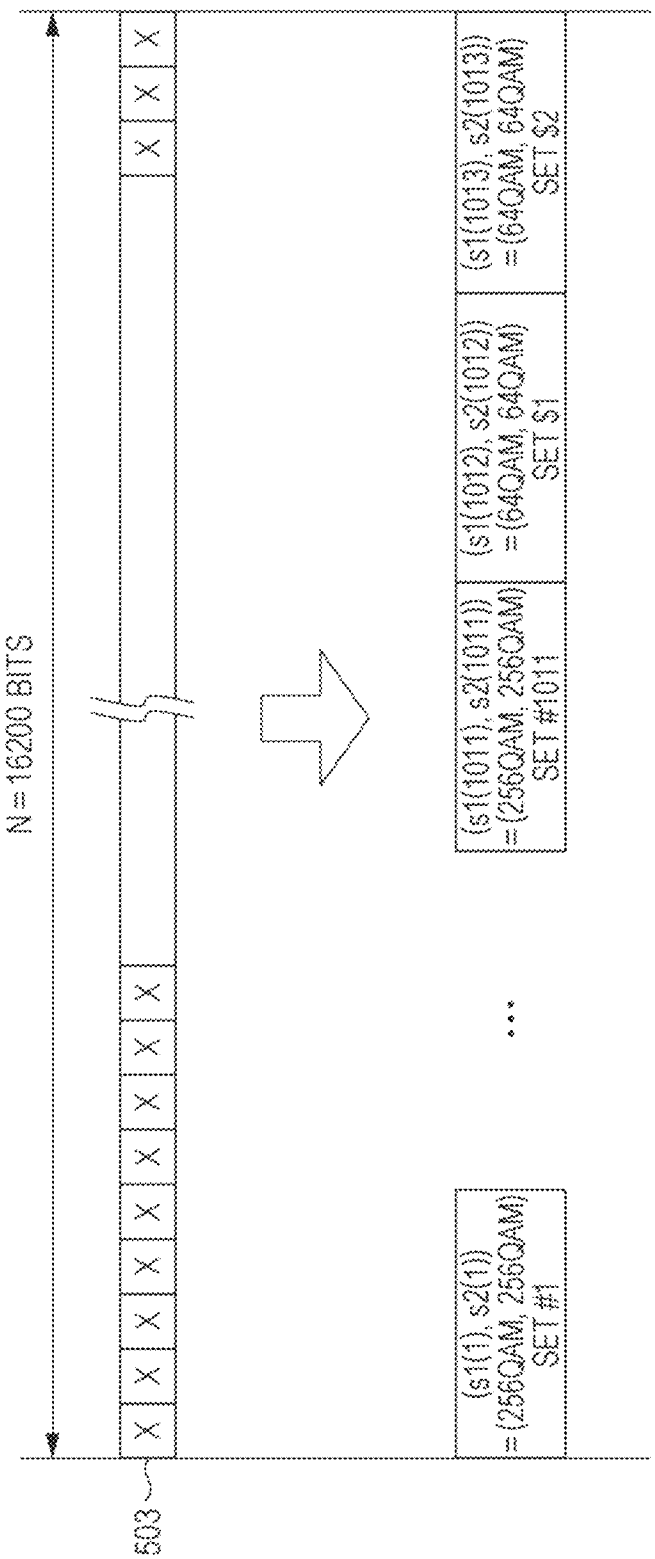
Figure 153:
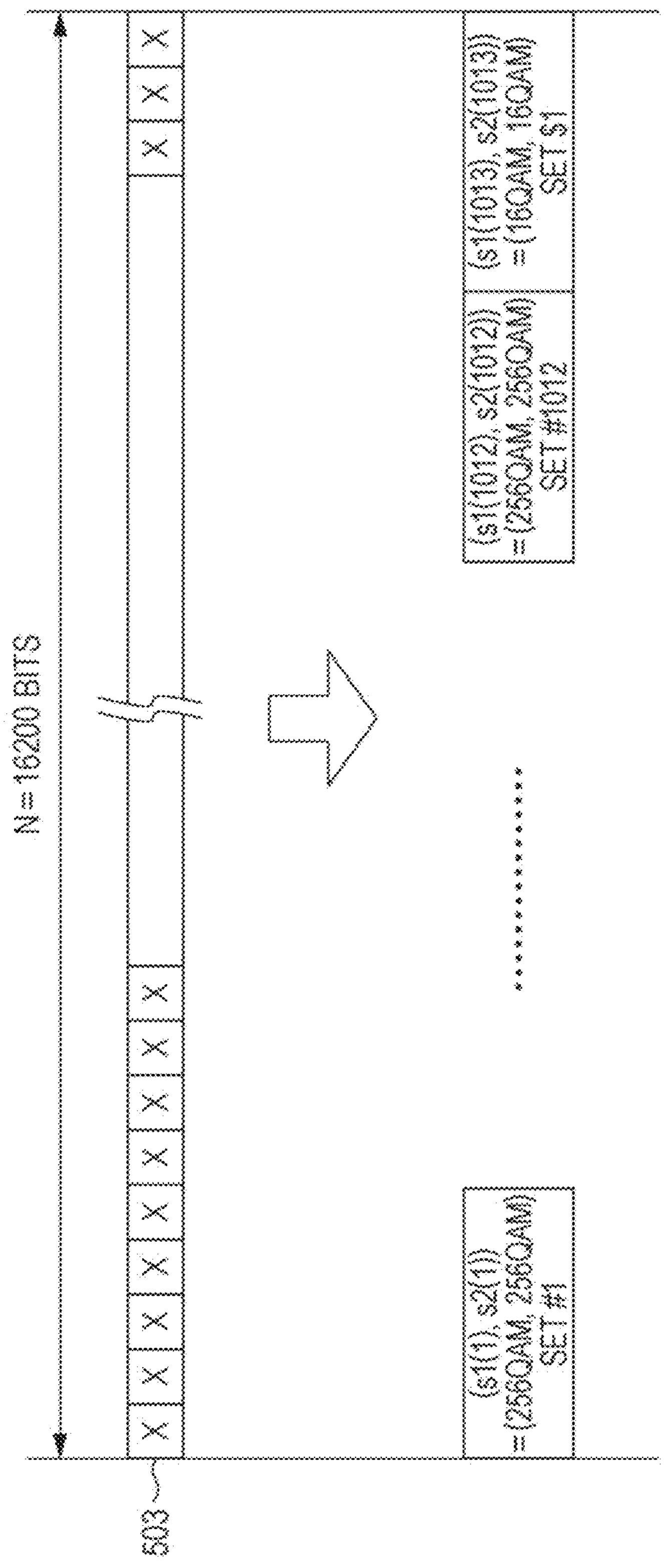
Figure 154:
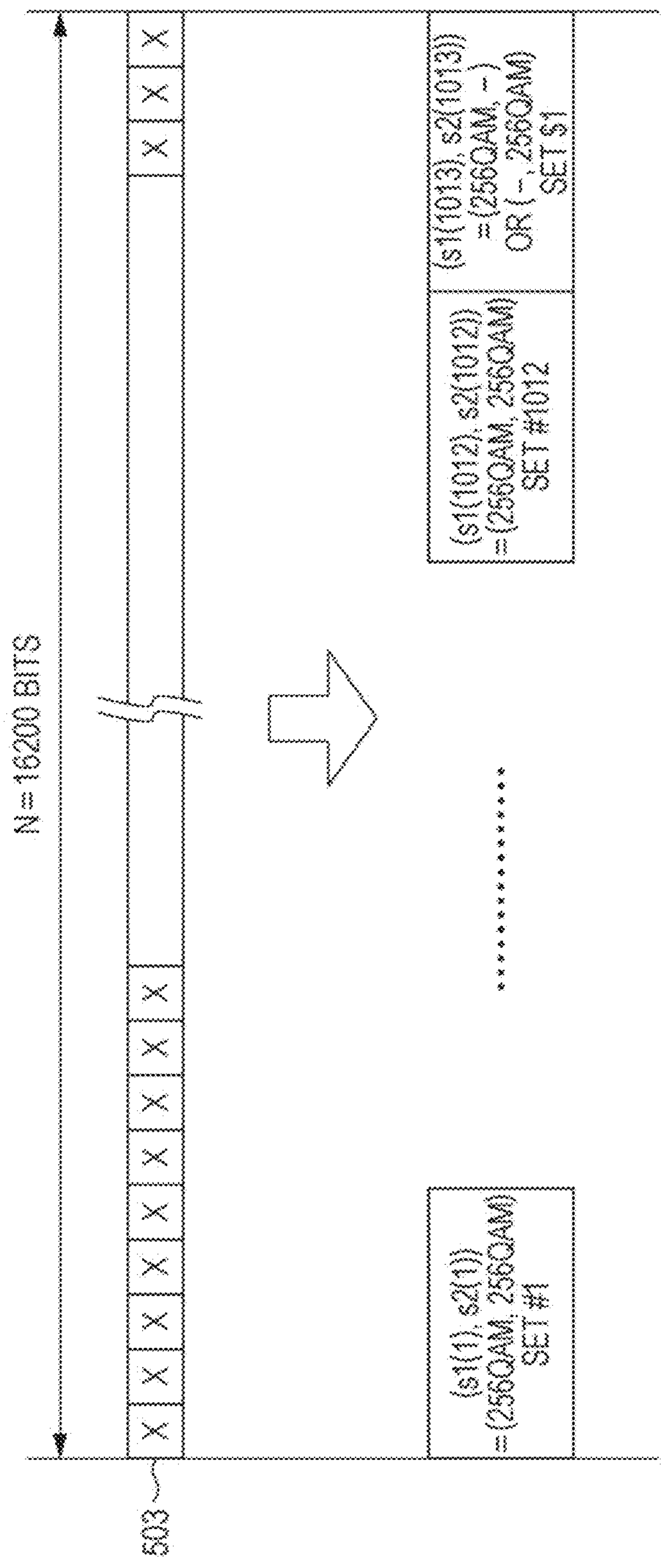
Figure 155:
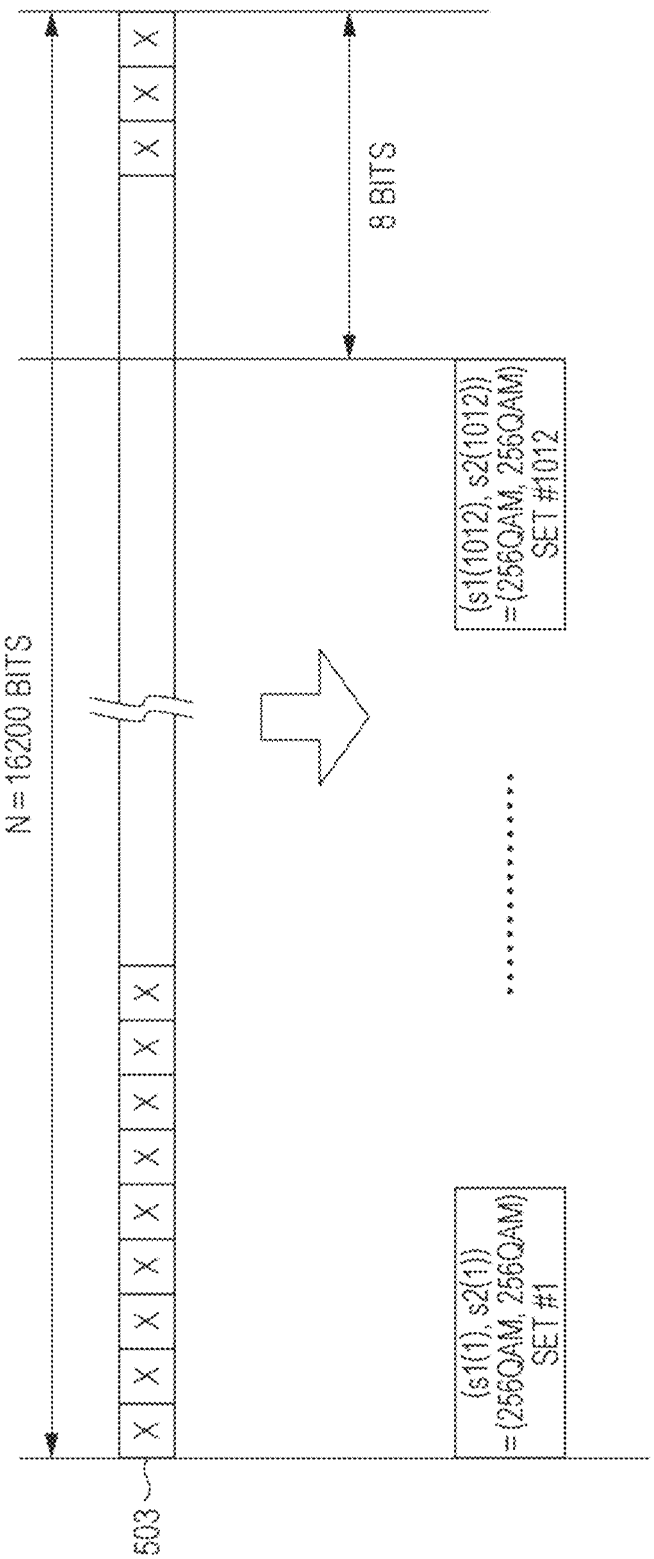
Figure 156:
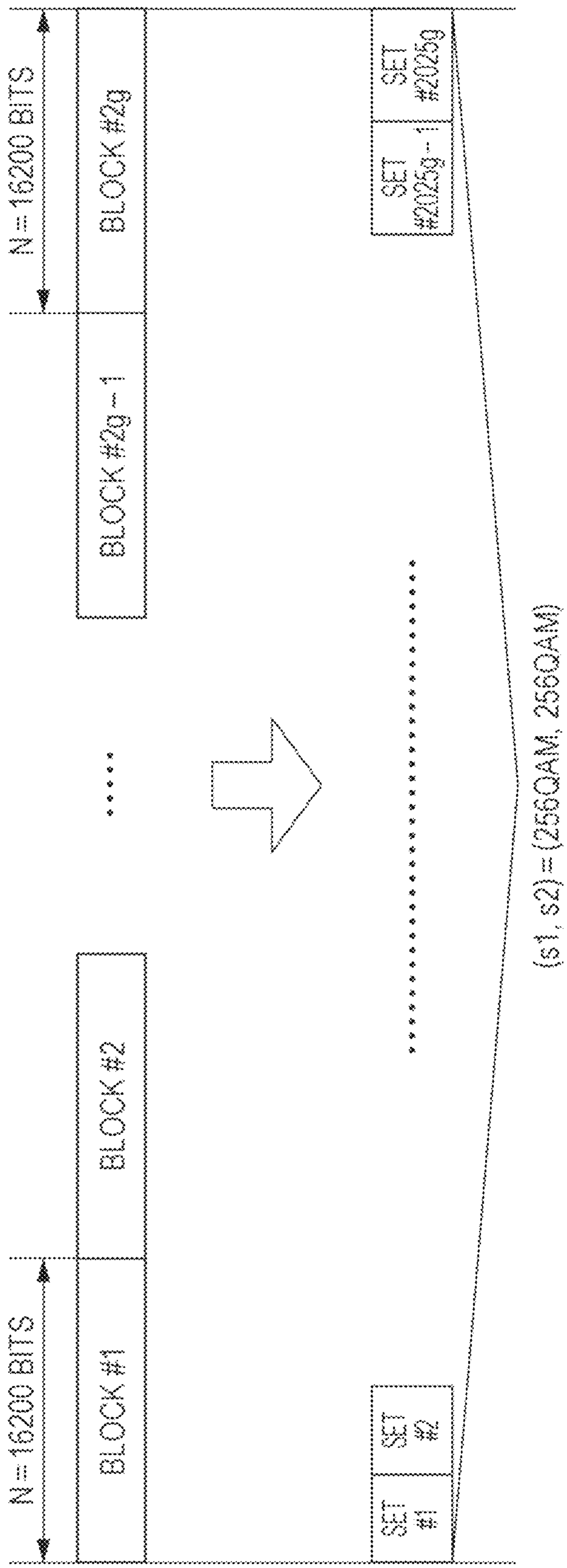
Figure 157:
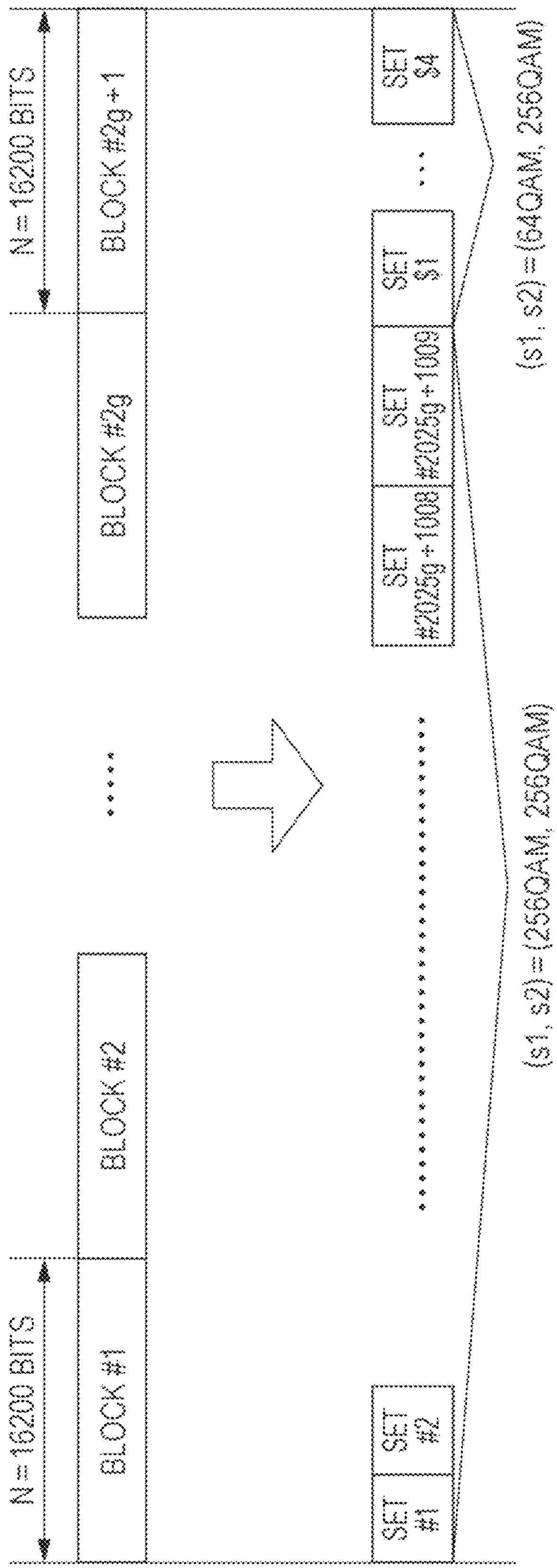
Figure 158:
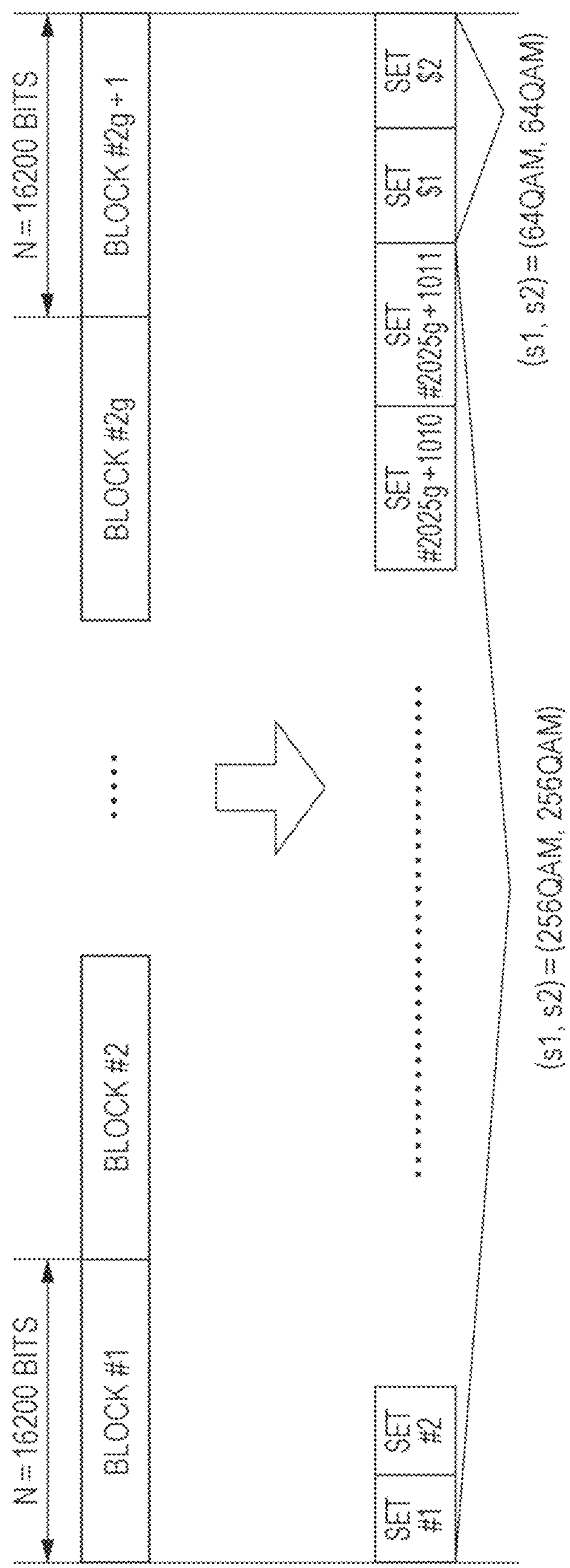
Figure 159:
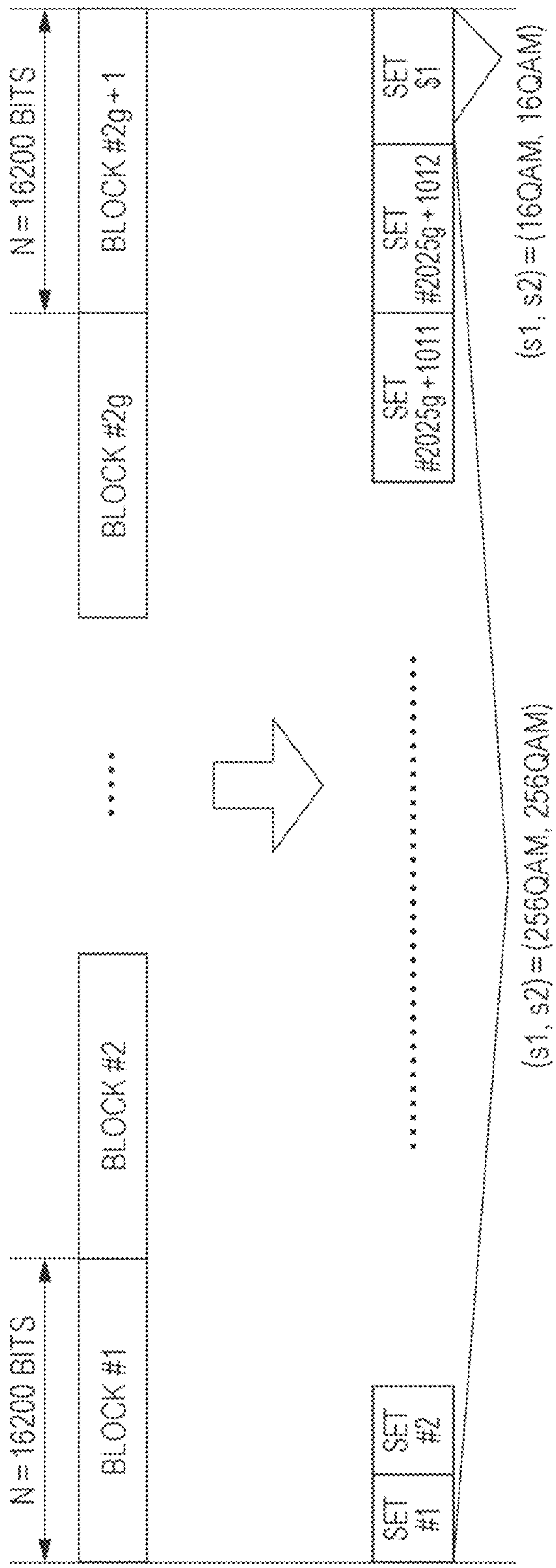
Figure 160:
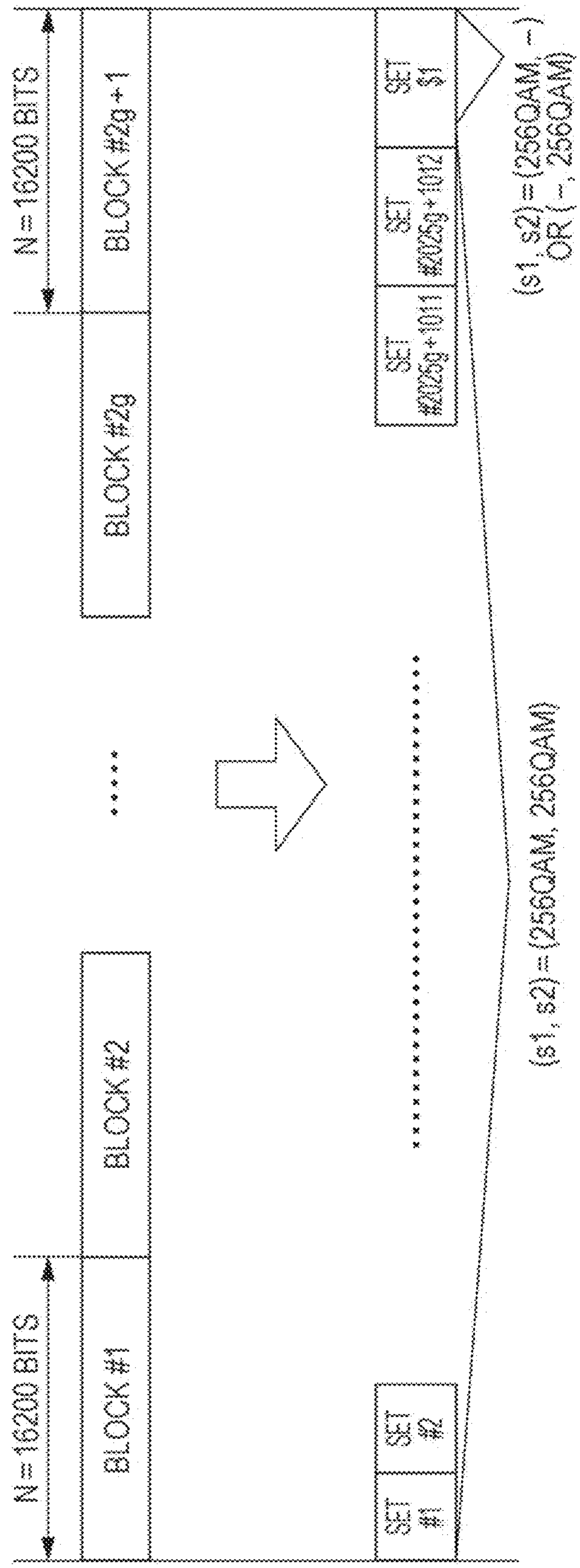

FIG. 127 is a view illustrating a configuration example of the receiver;

FIG. 128 is a view illustrating a transmission method in which a space-time block code is used;

FIG. 129 is a view illustrating a configuration example of the transmitter;

FIG. 130 is a view illustrating a configuration example of the transmitter;

FIG. 131 is a view illustrating a configuration example of the transmitter;

FIG. 132 is a view illustrating a configuration example of the transmitter;

FIG. 133 is a view illustrating the transmission method in which the space-time block code is used;

FIG. 134 is a view illustrating a configuration example of the transmitter;

FIG. 135 is a view illustrating an example of mapping processing;

FIG. 136 is a view illustrating an example of the mapping processing;

FIG. 137 is a view illustrating an example of the mapping processing;

FIG. 138 is a view illustrating an example of the mapping processing;

FIG. 139 is a view illustrating an example of the mapping processing;

FIG. 140 is a view illustrating an example of the mapping processing;

FIG. 141 is a view illustrating an example of the mapping processing;

FIG. 142 is a view illustrating an example of the mapping processing;

FIG. 143 is a view illustrating an example of the mapping processing;

FIG. 144 is a view illustrating an example of the mapping processing;

FIG. 145 is a view illustrating an example of the mapping processing;

FIG. 146 is a view illustrating an example of the mapping processing;

FIG. 147 is a view illustrating an example of the mapping processing;

FIG. 148 is a view illustrating an example of the mapping processing;

FIG. 149 is a view illustrating an example of the mapping processing;

FIG. 150 is a view illustrating the transmission method in which the space-time block code is used;

FIG. 151 is a view illustrating an example of the mapping processing;

FIG. 152 is a view illustrating an example of the mapping processing;

FIG. 153 is a view illustrating an example of the mapping processing;

FIG. 154 is a view illustrating an example of the mapping processing;

FIG. 155 is a view illustrating an example of the mapping processing;

FIG. 156 is a view illustrating an example of the mapping processing;

FIG. 157 is a view illustrating an example of the mapping processing;

FIG. 158 is a view illustrating an example of the mapping processing;

FIG. 159 is a view illustrating an example of the mapping processing;

FIG. 160 is a view illustrating an example of the mapping processing; and

Figure 161:
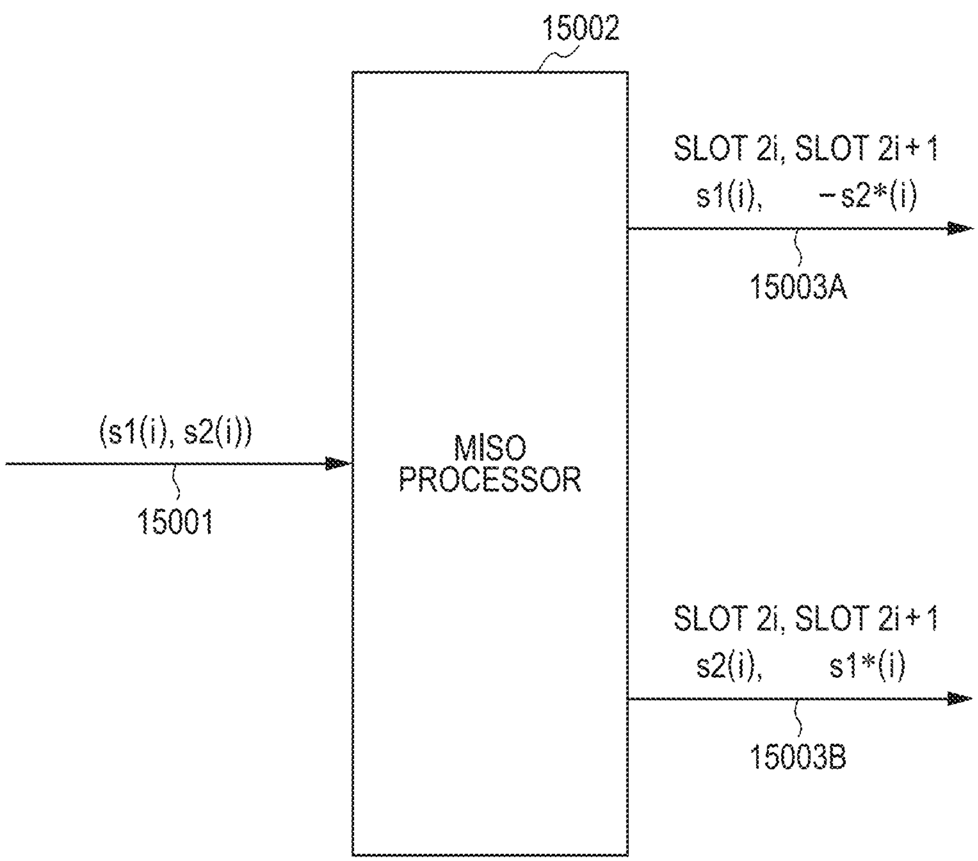

FIG. 161 is a view illustrating the transmission method in which the space-time block code is used.

DETAILED DESCRIPTION

A transmission method and a reception method, to which the exemplary embodiments of the present disclosure can be applied, and configuration examples of a transmitter and a receiver, in which the transmission method and reception method are used, will be described below in advance of the description of exemplary embodiments of the present disclosure.

Configuration Example R1

Figure 5:
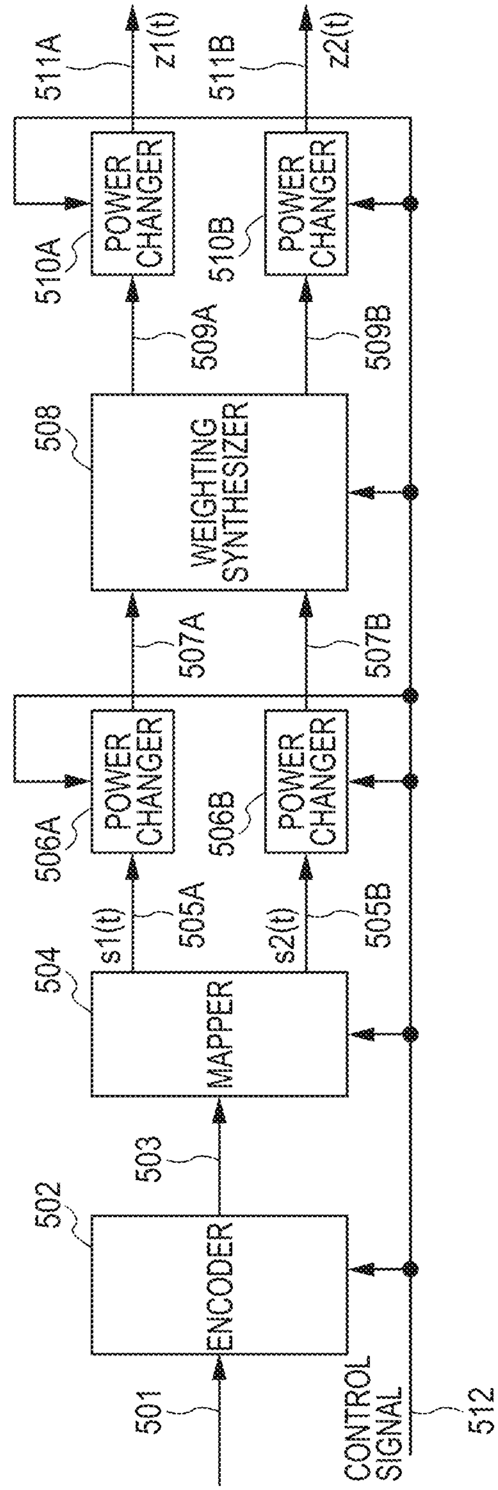
FIG. 5 is a view illustrating a configuration example of a transmitter.

FIG. 5 illustrates a configuration example of a portion that generates a modulated signal when the transmitter of a base station (such as a broadcasting station and an access point) can change a transmission scheme.

In the configuration example of FIG. 5, there is a transmission method for transmitting two streams (MIMO (Multiple Input Multiple Output) scheme) as one of changeable transmission schemes.

The transmission method in the case that the transmitter of the base station (such as the broadcasting station and the access point) transmits two streams will be described with reference to FIG. 5.

In FIG. 5, information 501 and control signal 512 are input to encoder 502, and encoder 502 performs coding based on information about a coding rate and a code length (block length) included in control signal 512, and outputs coded data 503.

Coded data 503 and control signal 512 are input to mapper 504. It is assumed that control signal 512 assigns the transmission of the two streams as a transmission scheme. Additionally, it is assumed that control signal 512 assigns modulation scheme $\alpha$ and modulation scheme $\beta$ as respective modulation schemes of the two streams. It is assumed that modulation scheme $\alpha$ is a modulation scheme for modulating x-bit data, and that modulation scheme $\beta$ is a modulation scheme for modulating y-bit data (for example, a modulation scheme for modulating 4-bit data for 16QAM (16 Quadrature Amplitude Modulation), and a modulation scheme for modulating 6-bit data for 64QAM (64 Quadrature Amplitude Modulation)).

Mapper 504 modulates the x-bit data in (x+y)-bit data using modulation scheme $\alpha$ to generate and output baseband signal $s_1(t)$ (505A), and modulates the remaining y-bit data using modulation scheme $\beta$ to output baseband signal $s_2(t)$ (505B). (One mapper is provided in FIG. 5. Alternatively, a mapper that generates baseband signal $s_1(t)$ and a mapper that generates baseband signal $s_2(t)$ may separately be provided. At this point, coded data 503 is divided in the mapper that generates baseband signal $s_1(t)$ and the mapper that generates baseband signal $s_2(t)$.)

Each of $s_1(t)$ and $s_2(t)$ is represented as a complex number (however, may be one of a complex number and a real number), and t is time. For the transmission scheme in which multi-carrier such as OFDM (Orthogonal Frequency Division Multiplexing) is used, it can also be considered that $s_1$ and $s_2$ are a function of frequency f like $s_1(f)$ and $s_2(f)$ or that $s_1$ and $s_2$ are a function of time t and frequency f like $s_1(t,f)$ and $s_2(t,f)$.

Hereinafter, the baseband signal, a precoding matrix, a phase change, and the like are described as the function of time t. Alternatively, the baseband signal, the precoding matrix, the phase change, and the like may be considered to be the function of frequency f or the function of time t and frequency f.

Accordingly, sometimes the baseband signal, the precoding matrix, the phase change, and the like are described as a function of symbol number i. In this case, the baseband signal, the precoding matrix, the phase change, and the like may be considered to be the function of time t, the function of frequency f, or the function of time t and frequency f. That is, the symbol and the baseband signal may be generated and disposed in either a time-axis direction or a frequency-axis direction. The symbol and the baseband signal may be generated and disposed in the time-axis direction and the frequency-axis direction.

Baseband signal $s_1(t)$ (505A) and control signal 512 are input to power changer 506A (power adjuster 506A), and power changer 506A (power adjuster 506A) sets real number $P_1$ based on control signal 512, and outputs $(P_1 \times s_1(t))$ as power-changed signal 507A ($P_1$ may be a complex number).

Similarly, baseband signal $s_2(t)$ (505B) and control signal 512 are input to power changer 506B (power adjuster 506B), and power changer 506B (power adjuster 506B) sets real number $P_2$, and outputs $P_2 \times s_2(t)$ as power-changed signal 507B ($P_2$ may be a complex number).

Power-changed signal 507A, power-changed signal 507B, and control signal 512 are input to weighting synthesizer 508, and weighting synthesizer 508 sets precoding matrix F (or F(i)) based on control signal 512. Assuming that i is a slot number (symbol number), weighting synthesizer 508 performs the following calculation.

[Mathematical formula 1]

$$\begin{pmatrix} u_1(i) \\ u_2(i) \end{pmatrix} = F\begin{pmatrix} P_1 \times s_1(i) \\ P_2 \times s_2(i) \end{pmatrix} = \begin{pmatrix} a(i) & b(i) \\ c(i) & d(i) \end{pmatrix}\begin{pmatrix} P_1 \times s_1(i) \\ P_2 \times s_2(i) \end{pmatrix} = \begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{(R1)}$$

In the formula, each of a(i), b(i), c(i), and d(i) is represented as a complex number (may be represented as a real number), and at least three of a(i), b(i), c(i), and d(i) must not be 0 (zero). The precoding matrix may be a function of i or does not need to be the function of i. When the precoding matrix is the function of i, the precoding matrix is switched by a slot number (symbol number).

Weighting synthesizer 508 outputs $u_1(i)$ in equation (R1) as weighting-synthesized signal 509A, and outputs $u_2(i)$ in equation (R1) as weighting-synthesized signal 509B.

Weighting-synthesized signal 509A ($u_1(i)$) and control signal 512 are input to power changer 510A, and power changer 510A sets real number $Q_1$ based on control signal 512, and outputs ($Q_1$ ($Q_1$ is a real number)$\times u_1(t)$) as power-changed signal 511A ($z_1(i)$) (alternatively, $Q_1$ may be a complex number).

Similarly, weighting-synthesized signal 509B ($u_2(i)$) and control signal 512 are input to power changer 510B, and power changer 510B sets real number $Q_2$ based on control signal 512, and outputs ($Q_2$ ($Q_2$ is a real number)$\times u_2(t)$) as power-changed signal 511A ($z_2(i)$) (alternatively, $Q_2$ may be a complex number).

Accordingly, the following equation holds.

[Mathematical formula 2]

$$\begin{pmatrix} z_1(i) \\ z_2(i) \end{pmatrix} = \begin{pmatrix} Q_1 & 0 \\ 0 & Q_2 \end{pmatrix} F\begin{pmatrix} P_1 \times s_1(i) \\ P_2 \times s_2(i) \end{pmatrix} = \begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 \times s_1(i) \\ P_2 \times s_2(i) \end{pmatrix} = \begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{(R2)}$$

Figure 6:
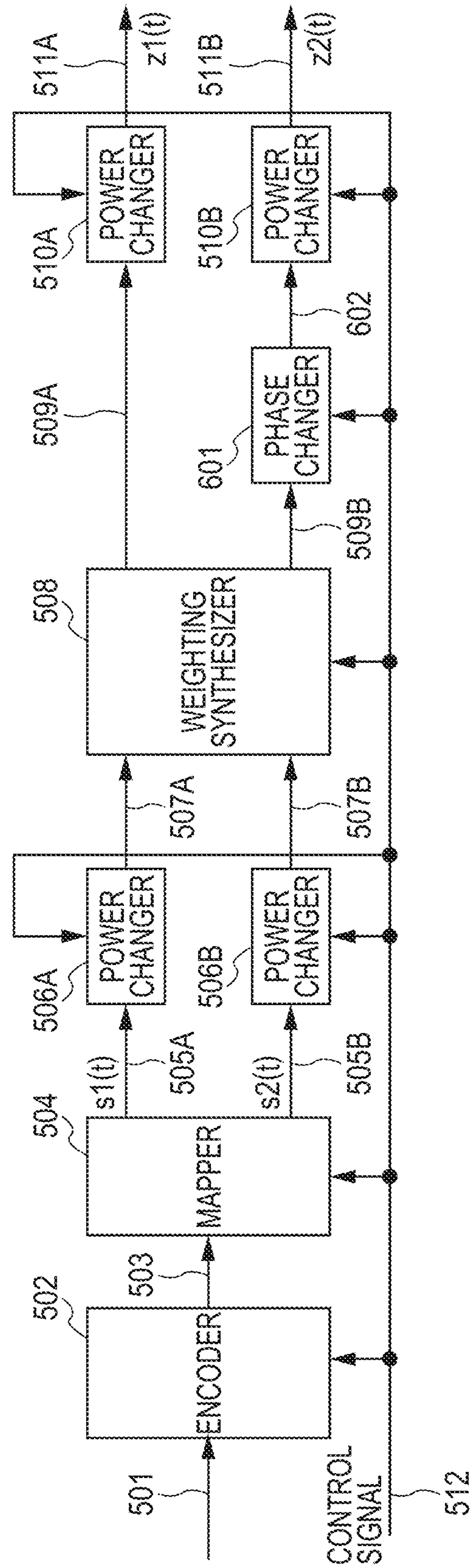
FIG. 6 is a view illustrating a configuration example of the transmitter.

The transmission method in the case that two streams different from those in FIG. 5 will be described with reference to FIG. 6. In FIG. 6, the component similar to that in FIG. 5 is designated by the identical reference mark.

Signal 509B in which $u_2(i)$ in equation (R1) is weighting-synthesized and control signal 512 are input to phase changer 601, and phase changer 601 changes a phase of signal 509B in which $u_2(i)$ in equation (R1) is weighting-synthesized based on control signal 512. Accordingly, the signal in which the phase of signal 509B in which $u_2(i)$ in equation (R1) is weighting-synthesized is represented as $(e^{j\theta(i)} \times u_2(i))$, and phase changer 601 outputs $(e^{j\theta(i)} \times u_2(i))$ as phase-changed signal 602 (j is an imaginary unit). The changed phase constitutes a characteristic portion that the changed phase is the function of i like θ(i).

Each of power changers 510A and 510B in FIG. 6 changes power of the input signal. Accordingly, outputs $z_1(i)$ and $z_2(i)$ of power changers 510A and 510B in FIG. 6 are given by the following equation.

[Mathematical formula 3]

$$\begin{pmatrix} z_1(i) \\ z_2(i) \end{pmatrix} = \begin{pmatrix} Q_1 & 0 \\ 0 & Q_2 \end{pmatrix}\begin{pmatrix} 1 & 0 \\ 0 & e^{j\theta(i)} \end{pmatrix} F\begin{pmatrix} P_1 \times s_1(i) \\ P_2 \times s_2(i) \end{pmatrix} = \begin{pmatrix} Q_1 & 0 \\ 0 & Q_2 \end{pmatrix}\begin{pmatrix} 1 & 0 \\ 0 & e^{j\theta(i)} \end{pmatrix}\begin{pmatrix} a(i) & b(i) \\ c(i) & d(i) \end{pmatrix}\begin{pmatrix} P_1 \times s_1(i) \\ P_2 \times s_2(i) \end{pmatrix} = \begin{pmatrix} Q_1 & 0 \\ 0 & Q_2 \end{pmatrix}\begin{pmatrix} 1 & 0 \\ 0 & e^{j\theta(i)} \end{pmatrix}\begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{(R3)}$$

Figure 7:
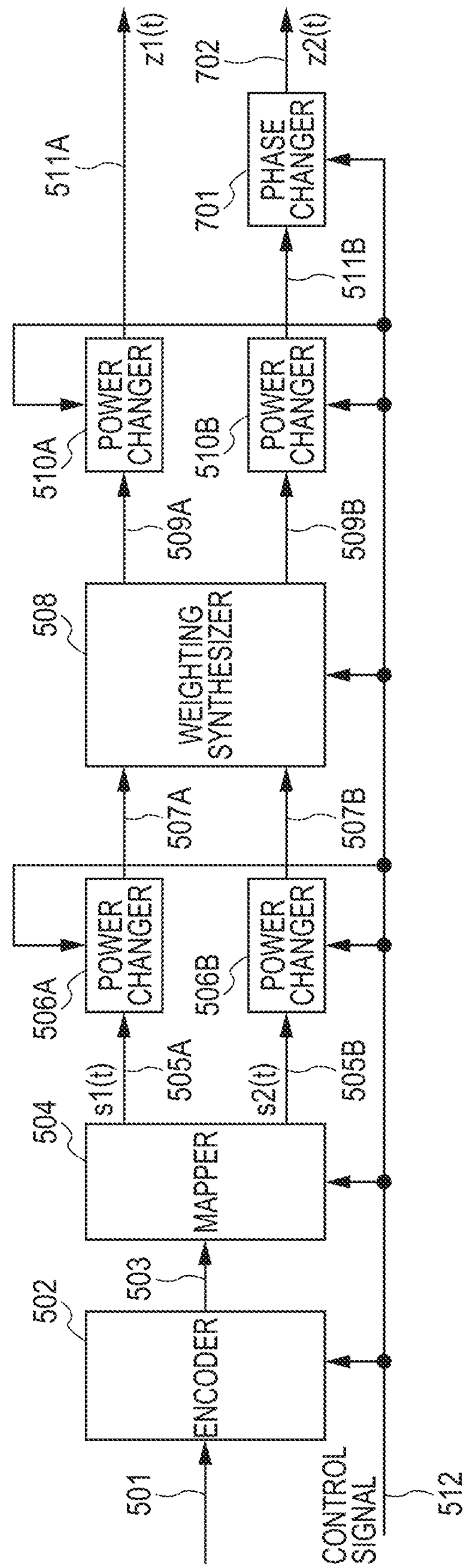
FIG. 7 is a view illustrating a configuration example of the transmitter.

FIG. 7 illustrates a configuration different from that in FIG. 6 as a method for performing equation (R3). A difference between the configurations in FIGS. 6 and 7 is that the positions of the power changer and phase changer are exchanged (the function of changing the power and the function of changing the phase are not changed). At this point, $z_1(i)$ and $z_2(i)$ are given by the following equation.

[Mathematical formula 4]

$$\begin{pmatrix} z_1(i) \\ z_2(i) \end{pmatrix} = \begin{pmatrix} 1 & 0 \\ 0 & e^{j\theta(i)} \end{pmatrix}\begin{pmatrix} Q_1 & 0 \\ 0 & Q_2 \end{pmatrix} F\begin{pmatrix} P_1 \times s_1(i) \\ P_2 \times s_2(i) \end{pmatrix} = \begin{pmatrix} 1 & 0 \\ 0 & e^{j\theta(i)} \end{pmatrix}\begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 \times s_1(i) \\ P_2 \times s_2(i) \end{pmatrix} = \begin{pmatrix} 1 & 0 \\ 0 & e^{j\theta(i)} \end{pmatrix}\begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{(R4)}$$

$z_1(i)$ in equation (R3) is equal to $z_1(i)$ in equation (R4), and $z_2(i)$ in equation (R3) is equal to $z_2(i)$ in equation (R4).

As to phase value θ(i) to be changed in equations (R3) and (R4), assuming that θ(i+1)-θ(i) is set to a fixed value, there is a high possibility that the receiver obtains the good data reception quality in a radio wave propagation environment where a direct wave is dominant. However, a method for providing phase value θ(i) to be changed is not limited to the above example.

Figure 8:
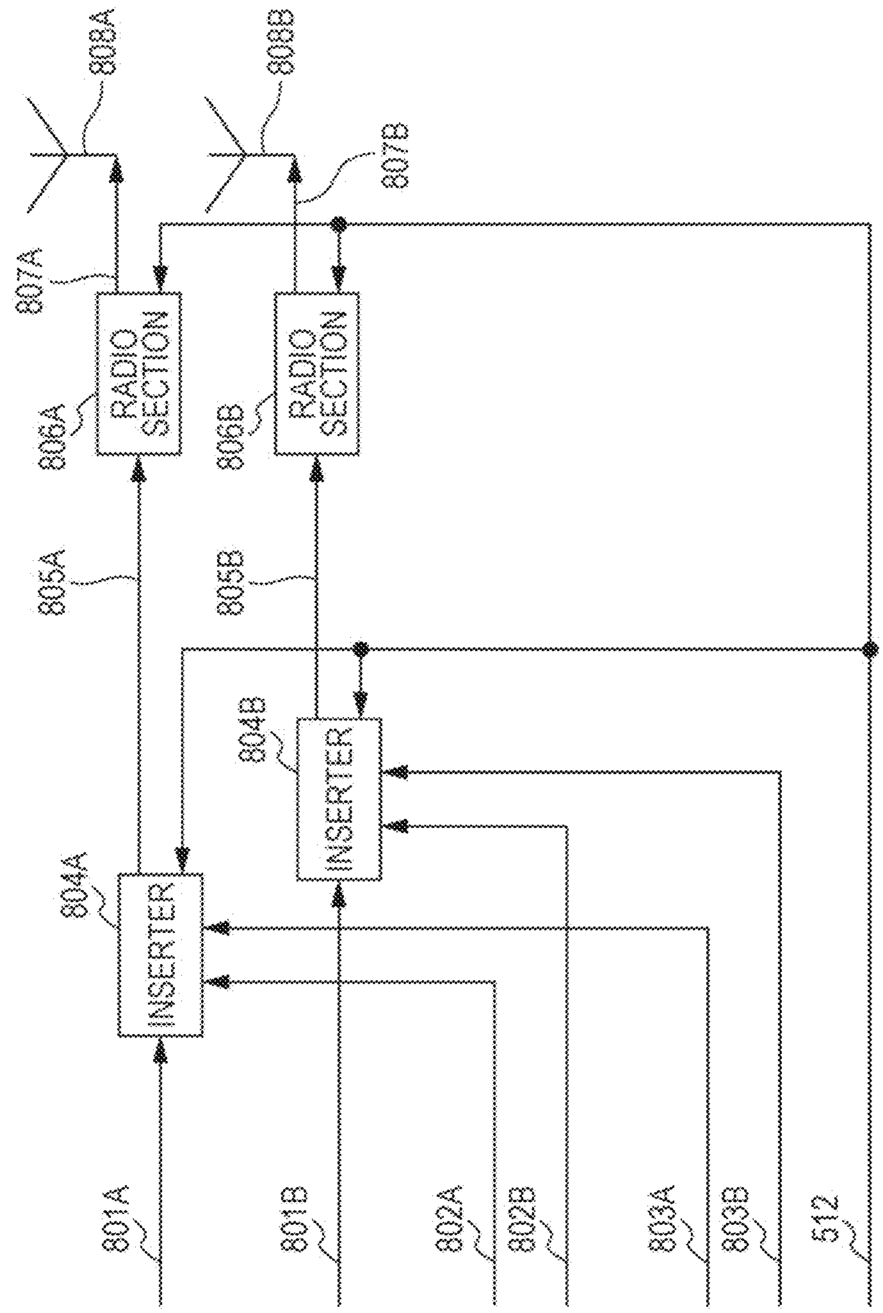
FIG. 8 is a view illustrating a configuration example of a signal processor.

FIG. 8 illustrates a configuration example of a signal processor that processes signals $z_1(i)$ and $z_2(i)$ obtained in FIGS. 5 to 7.

Signal $z_1(i)$ (801A), pilot symbol 802A, control information symbol 803A, and control signal 512 are input to inserter 804A, and inserter 804A inserts pilot symbol 802A and control information symbol 803A in signal (symbol) $z_1(i)$ (801A) according to a frame configuration included in control signal 512, and outputs modulated signal 805A according to the frame configuration.

Pilot symbol 802A and control information symbol 803A are a symbol modulated using BPSK (Binary Phase Shift Keying), QPSK (Quadrature Phase Shift Keying), and the like (other modulation schemes may be used).

Modulated signal 805A and control signal 512 are input to radio section 806A, and radio section 806A performs pieces of processing such as frequency conversion and amplification on modulated signal 805A based on control signal 512 (performs inverse Fourier transform when the OFDM scheme is used), and outputs transmitted signal 807A as a radio wave from antenna 808A.

Signal $z_2(i)$ (801B), pilot symbol 802B, control information symbol 803B, and control signal 512 are input to inserter 804B, and inserter 804B inserts pilot symbol 802B and control information symbol 803B in signal (symbol) $z_2(i)$ (801B) according to the frame configuration included in control signal 512, and outputs modulated signal 805B according to the frame configuration.

Pilot symbol 802B and control information symbol 803B are a symbol modulated using BPSK (Binary Phase Shift Keying), QPSK (Quadrature Phase Shift Keying), and the like (other modulation schemes may be used).

Modulated signal 805B and control signal 512 are input to radio section 806B, and radio section 806B performs the pieces of processing such as the frequency conversion and the amplification on modulated signal 805B based on control signal 512 (performs the inverse Fourier transform when the OFDM scheme is used), and outputs transmitted signal 807B as a radio wave from antenna 808B.

Signals $z_1(i)$ (801A) and $z_2(i)$ (801B) having the identical number of i are transmitted from different antennas at the identical time and the identical (common) frequency (that is, the transmission method in which the MIMO scheme is used).

Pilot symbols 802A and 802B are a symbol that is used when the receiver performs the signal detection, the estimation of the frequency offset, gain control, the channel estimation, and the like. Although the symbol is named the pilot symbol in this case, the symbol may be named other names such as a reference symbol.

Control information symbols 803A and 803B are a symbol that transmits the information about the modulation scheme used in the transmitter, the information about the transmission scheme, the information about the precoding scheme, the information about an error correction code scheme, the information about the coding rate of an error correction code, and the information about a block length (code length) of the error correction code to the receiver. The control information symbol may be transmitted using only one of control information symbols 803A and 803B.

Figure 9:
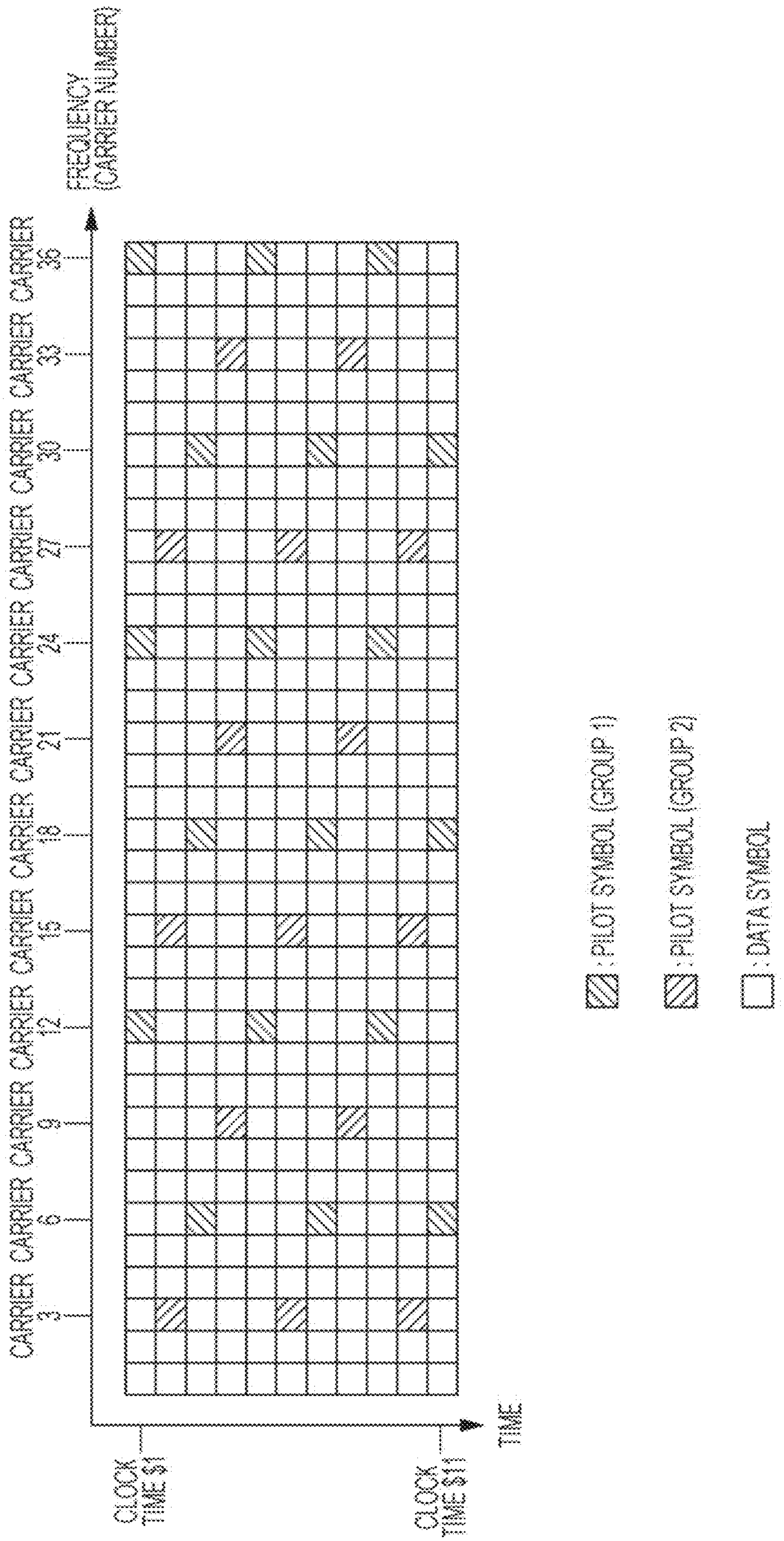
FIG. 9 is a view illustrating an example of a frame configuration.

FIG. 9 illustrates an example of the frame configuration at time-frequency when the two streams are transmitted. In FIG. 9, a horizontal axis indicates a frequency, a vertical axis indicates time. FIG. 9 illustrates a configuration of the symbol from carriers 1 to 38 from clock time $1 to clock time $11.

FIG. 9 simultaneously illustrates the frame configuration of the transmitted signal transmitted from antenna 808A in FIG. 8 and the frame of the transmitted signal transmitted from antenna 808B in FIG. 8.

In FIG. 9, a data symbol corresponds to signal (symbol) $z_1(i)$ for the frame of the transmitted signal transmitted from antenna 808A in FIG. 8. The pilot symbol corresponds to pilot symbol 802A.

In FIG. 9, a data symbol corresponds to signal (symbol) $z_2(i)$ for the frame of the transmitted signal transmitted from antenna 808B in FIG. 8. The pilot symbol corresponds to pilot symbol 802B.

Accordingly, as described above, signals $z_1(i)$ (801A) and $z_2(i)$ (801B) having the identical number of i are transmitted from different antennas at the identical time and the identical (common) frequency. The configuration of the pilot symbol is not limited to that in FIG. 9. For example, a time interval and a frequency interval of the pilot symbol are not limited to those in FIG. 9. In FIG. 9, the pilot symbols are transmitted at the identical clock time and the identical frequency (identical (sub-) carrier) from antennas 808A and 808B in FIG. 8. Alternatively, for example, the pilot symbol may be disposed in not antenna 808B in FIG. 8 but antenna 808A in FIG. 8 at time A and frequency a ((sub-) carrier a), and the pilot symbol may be disposed in not antenna 808A in FIG. 8 but antenna 808B in FIG. 8 at time B and frequency b ((sub-) carrier b).

Although only the data symbol and the pilot symbol are illustrated in FIG. 9, other symbols such as a control information symbol may be included in the frame.

Although the case that a part (or whole) of the power changer exists is described with reference to FIGS. 5 to 7, it is also considered that a part of the power changer is missing.

For example, in the case that power changer 506A (power adjuster 506A) and power changer 506B (power adjuster 506B) do not exist in FIG. 5, $z_1(i)$ and $z_2(i)$ are given as follows.

[Mathematical formula 5]

$$\begin{pmatrix} z_1(i) \\ z_2(i) \end{pmatrix} = \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(R5)}$$

In the case that power changer 510A (power adjuster 510A) and power changer 510B (power adjuster 510B) do not exist in FIG. 5, $z_1(i)$ and $z_2(i)$ are given as follows.

[Mathematical formula 6]

$$\begin{pmatrix} z_1(i) \\ z_2(i) \end{pmatrix} = \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(R6)}$$

In the case that power changer 506A (power adjuster 506A), power changer 506B (power adjuster 506B), power changer 510A (power adjuster 510A), and power changer 510B (power adjuster 510B) do not exist in FIG. 5, $z_1(i)$ and $z_2(i)$ are given as follows.

[Mathematical formula 7]

$$\begin{pmatrix} z_1(i) \\ z_2(i) \end{pmatrix} = \begin{pmatrix} a(i) & b(i) \\ c(i) & d(i) \end{pmatrix} \begin{pmatrix} s_1(i) \\ s_2(i) \end{pmatrix} \quad \text{(R7)}$$

In the case that power changer 506A (power adjuster 506A) and power changer 15506B (power adjuster 506B) do not exist in FIG. 6 or 7, $z_1(i)$ and $z_2(i)$ are given as follows.

[Mathematical formula 8]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(R8)}$$

In the case that power changer 510A (power adjuster 510A) and power changer 510B (power adjuster 510B) do not exist in FIG. 6 or 7, $z_1(i)$ and $z_2(i)$ are given as follows.

[Mathematical formula 9]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(R9)}$$

In the case that power changer 506A (power adjuster 506A), power changer 506B (power adjuster 506B), power changer 510A (power adjuster 510A), and power changer 510B (power adjuster 510B) do not exist in FIG. 6 or 7, $z_1(i)$ and $z_2(i)$ are given as follows.

[Mathematical formula 10]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(R10)}$$

QPSK, 16QAM, 64QAM, and 256QAM mapping methods will be described below as an example of the mapping method of a modulation scheme for generating baseband signal $s_1(t)$ (505A) and baseband signal $s_2(t)$ (505B).

Figure 1:
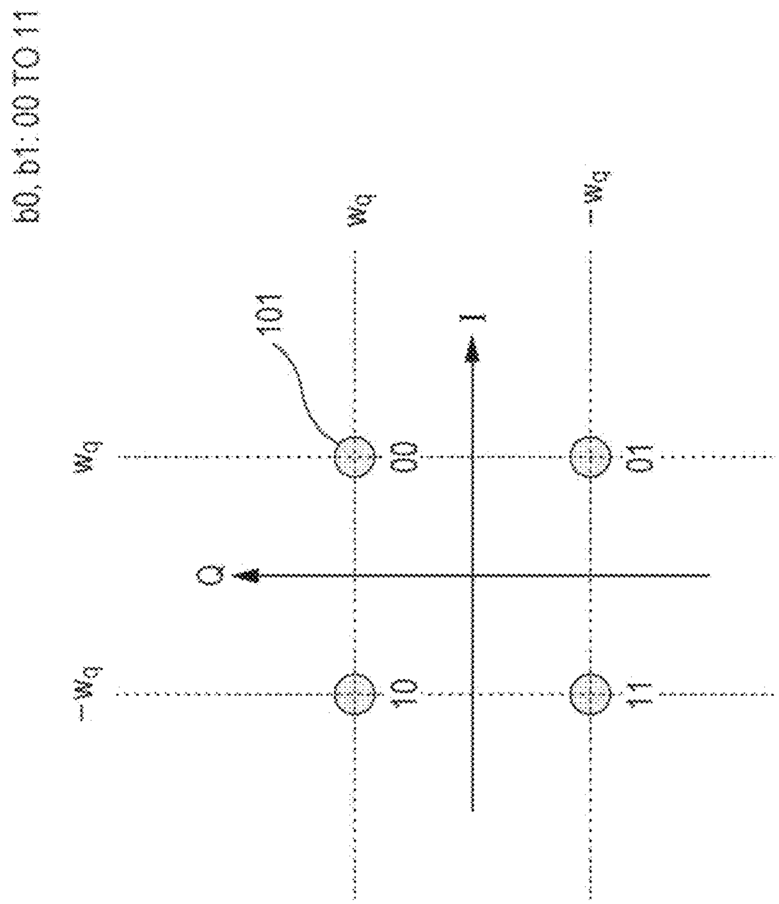
FIG. 1 is a view illustrating an arrangement example of QPSK signal points in an I-Q plane.

The QPSK mapping method will be described below. FIG. 1 illustrates an example of signal point arrangement of QPSK signal points in an in-phase-quadrature-phase plane (I-Q plane). In FIG. 1, 4 marks "○" indicate QPSK signal points, a horizontal axis indicates I, and a vertical axis indicates Q.

In the I-Q plane, 4 signal points included in QPSK (indicated by the marks "○" in FIG. 1) are $(w_q,w_q)$, $(-w_q,w_q)$, $(w_q,-w_q)$, and $(-w_q,-w_q)$ ($w_q$ is a real number larger than 0).

At this point, bits to be transmitted (input bits) are set to b0 and b1. For example, for the bits to be transmitted (b0, b1)=(0,0), the bits are mapped at signal point 101 in FIG. 1, and $(I,Q)=(w_q,w_q)$ is obtained when I is an in-phase component while Q is a quadrature component of the mapped baseband signal.

Based on the bits to be transmitted (b0, b1), in-phase component I and quadrature component Q of the mapped baseband signal are decided (during QPSK modulation). FIG. 1 illustrates an example of a relationship between the set of b0 and b1 (00 to 11) and the signal point coordinates. Values 00 to 11 of the set of b0 and b1 are indicated immediately below 4 signal points included in QPSK (indicated by the marks "○" in FIG. 1) $(w_q,w_q)$, $(-w_q,w_q)$, $(w_q,-w_q)$, and $(-w_q,-w_q)$. Respective coordinates of the signal points ("○") immediately above the values 00 to 11 of the set of b0 and b1 in the I-Q plane serve as in-phase component I and quadrature component Q of the mapped baseband signal. The relationship between the set of b0 and b1 (00 to 11) and the signal point coordinates during QPSK is not limited to that in FIG. 1. A complex value of in-phase component I and quadrature component Q of the mapped baseband signal (during QPSK modulation) serves as a baseband signal ($s_1(t)$ or $s_2(t)$).

Figure 2:
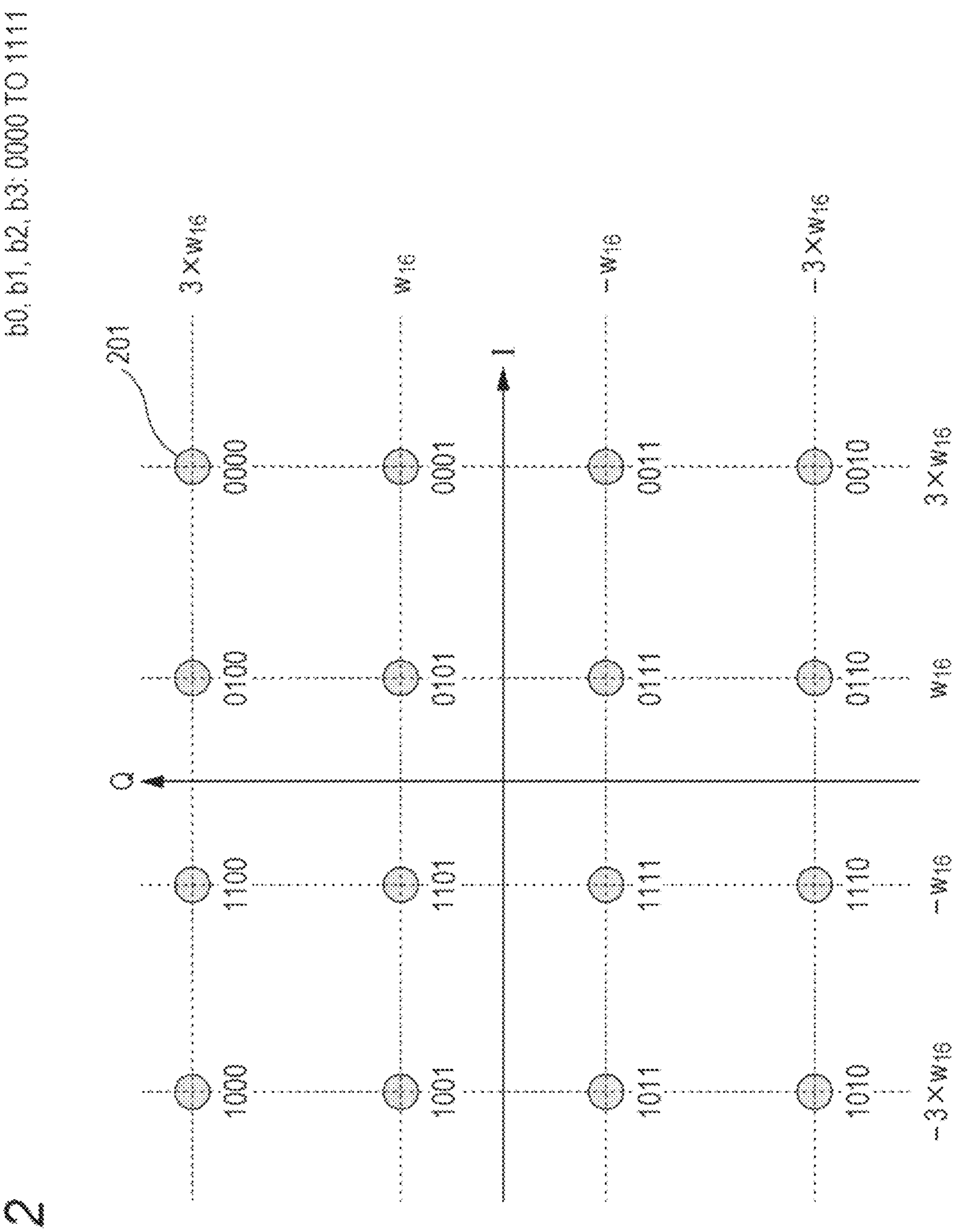
FIG. 2 is a view illustrating an arrangement example of 16QAM signal points in the I-Q plane.

The 16QAM mapping method will be described below. FIG. 2 illustrates an arrangement example of 16QAM signal points in the I-Q plane. In FIG. 2, 16 marks "○" indicate 16QAM signal points, a horizontal axis indicates I, and a vertical axis indicates Q.

In the I-Q plane, 16 signal points included in 16QAM (indicated by the marks "○" in FIG. 2) the I-Q are obtained as follows. ($w_{16}$ is a real number larger than 0.) $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$ At this point, the bits to be transmitted (input bits) are set to b0, b1, b2, and b3. For example, for the bits to be transmitted (b0, b1, b2, b3)=(0, 0, 0, 0), the bits are mapped at signal point 201 in FIG. 2, and $(I,Q)=(3w_{16},3w_{16})$ is obtained when I is an in-phase component while Q is a quadrature component of the mapped baseband signal.

Based on the bits to be transmitted (b0, b1, b2, b3), in-phase component I and quadrature component Q of the mapped baseband signal are decided (during 16QAM modulation). FIG. 2 illustrates an example of a relationship between the set of b0, b1, b2, and b3 (0000 to 1111) and the signal point coordinates. Values 0000 to 1111 of the set of b0, b1, b2, and b3 are indicated immediately below 16 signal points included in 16QAM (the marks "○" in FIG. 2) $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$. Respective coordinates of the signal points ("○") immediately above the values 0000 to 1111 of the set of b0, b1, b2, and b3 in the I-Q plane serve as in-phase component I and quadrature component Q of the mapped baseband signal. The relationship between the set of b0, b1, b2, and b3 (0000 to 1111) and the signal point coordinates during 16QAM modulation is not limited to that in FIG. 2. A complex value of in-phase component I and quadrature component Q of the mapped baseband signal (during 16QAM modulation) serves as a baseband signal ($s_1(t)$ or $s_2(t)$).

Figure 3:
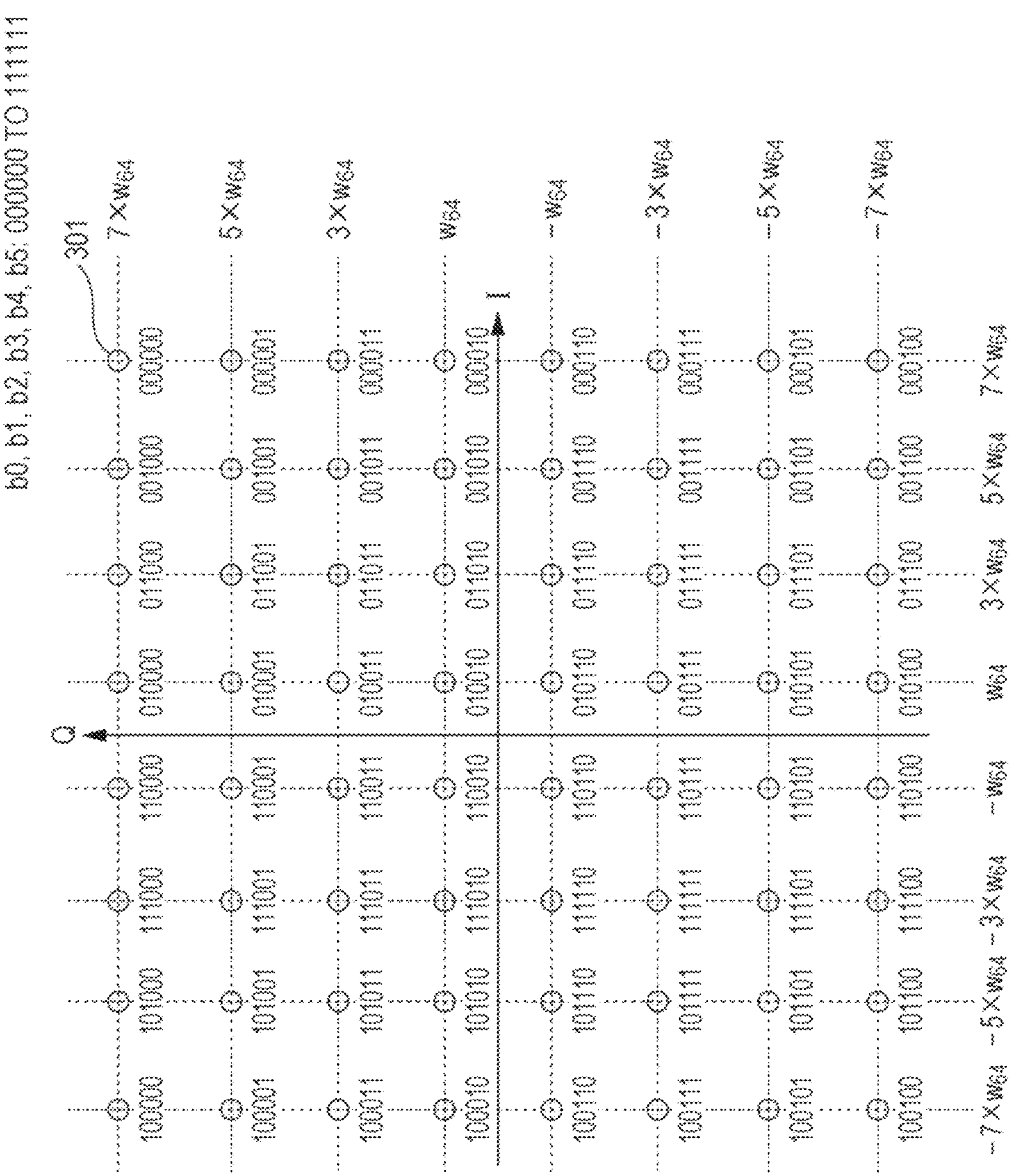
FIG. 3 is a view illustrating an arrangement example of 64QAM signal points in the I-Q plane.

The 64QAM mapping method will be described below. FIG. 3 illustrates an arrangement example of 64QAM signal points in the I-Q plane. In FIG. 3, 64 marks "○" indicate 64QAM signal points, a horizontal axis indicates I, and a vertical axis indicates Q.

In the I-Q plane, 64 signal points included in 64QAM (indicated by the marks "○" in FIG. 3) the I-Q are obtained as follows. ($w_{64}$ is a real number larger than 0)

$(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64}-7w_{64})$
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$

At this point, the bits to be transmitted (input bits) are set to b0, b1, b2, b3, b4, and b5. For example, for the bits to be transmitted (b0, b1, b2, b3, b4, b5)=(0, 0, 0, 0, 0, 0), the bits are mapped at signal point 301 in FIG. 3, and $(I,Q)=(7w_{64}, 7w_{64})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 3 illustrates an example of a relationship between the set of b0, b1, b2, b3, b4, and b5 (000000 to 111111) and the signal point coordinates. Values 000000 to 111111 of the set of b0, b1, b2, b3, b4, and b5 are indicated immediately below 64 signal points included in 64QAM (the marks "○" in FIG. 3) $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$. Respective coordinates of the signal points ("○") immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 3. A complex value of in-phase component I and quadrature component Q of the mapped baseband signal (during 64QAM modulation) serves as a baseband signal ($s_1(t)$ or $s_2(t)$).

Figure 4:
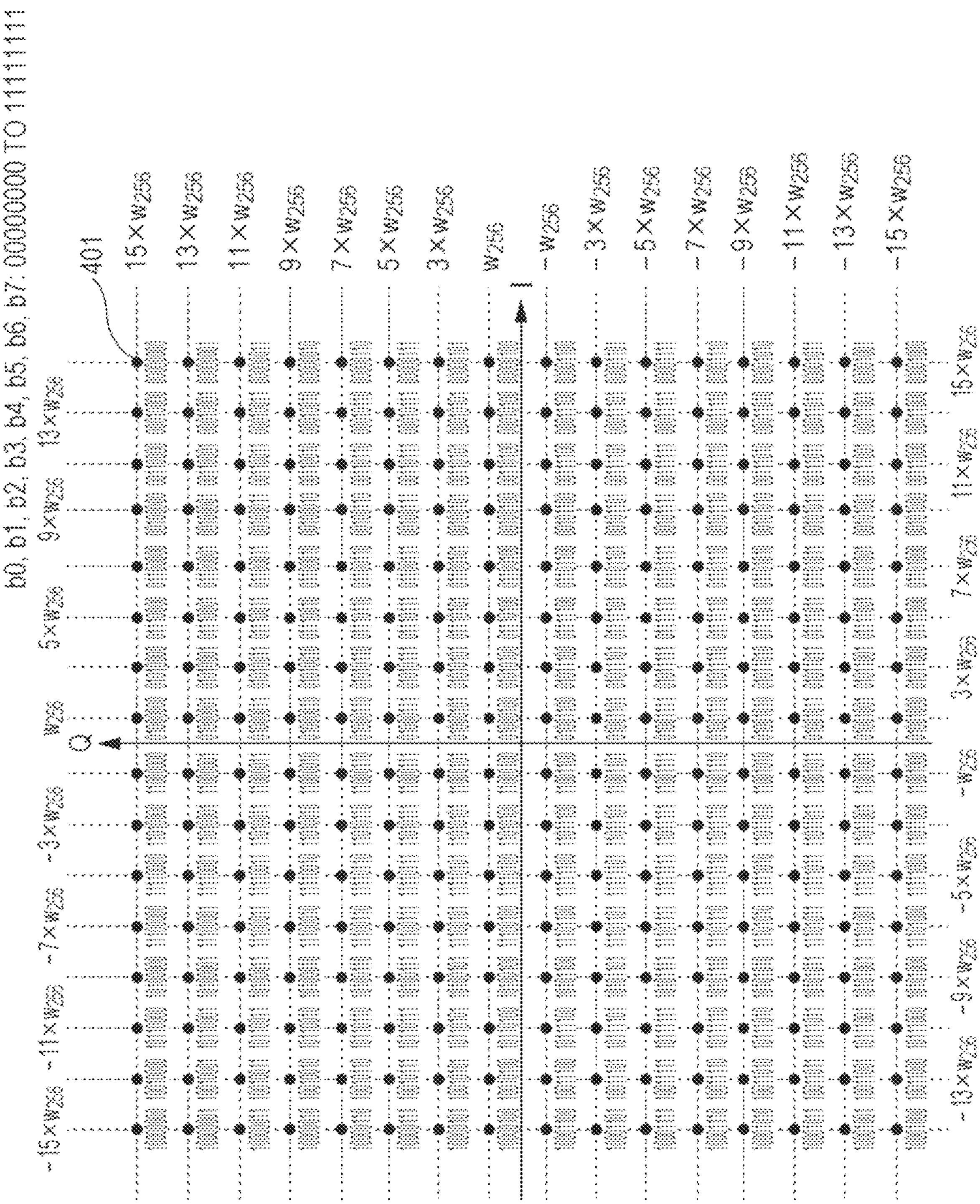
FIG. 4 is a view illustrating an arrangement example of 256QAM signal points in the I-Q plane.

The 256QAM mapping method will be described below. FIG. 4 illustrates an arrangement example of 256QAM signal points in the I-Q plane. In FIG. 4, 256 marks "○" indicate the 256QAM signal points.

In the I-Q plane, 256 signal points included in 256QAM (indicated by the marks "○" in FIG. 4) are obtained as follows. ($w_{256}$ is a real number larger than 0).

$(15w_{256},15w_{256})$, $(15w_{256},13w_{256})$, $(15w_{256},11w_{256})$, $(15w_{256},9w_{256})$, $(15w_{256},7w_{256})$, $(15w_{256},5w_{256})$, $(15w_{256},3w_{256})$, $(15w_{256},w_{256})$, $(15w_{256},-15w_{256})$, $(15w_{256},-13w_{256})$, $(15w_{256},-11w_{256})$, $(15w_{256},-9w_{256})$, $(15w_{256},-7w_{256})$, $(15w_{256},-5w_{256})$, $(15w_{256},-3w_{256})$, $(15w_{256},-w_{256})$,
$(13w_{256},15w_{256})$, $(13w_{256},13w_{256})$, $(13w_{256},11w_{256})$, $(13w_{256},9w_{256})$, $(13w_{256},7w_{256})$, $(13w_{256},5w_{256})$, $(13w_{256},3w_{256})$, $(13w_{256},w_{256})$, $(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$,
$(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$, $(11w_{256},-15w_{256})$, $(11w_{256},-13w_{256})$, $(11w_{256},-11w_{256})$, $(11w_{256},-9w_{256})$, $(11w_{256},-7w_{256})$, $(11w_{256},-5w_{256})$, $(11w_{256},-3w_{256})$, $(11w_{256},-w_{256})$,
$(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256})$, $(9w_{256},-15w_{256})$, $(9w_{256},-13w_{256})$, $(9w_{256},-11w_{256})$, $(9w_{256},-9w_{256})$, $(9w_{256},-7w_{256})$, $(9w_{256},-5w_{256})$, $(9w_{256},-3w_{256})$, $(9w_{256},-w_{256})$,
$(7w_{256},15w_{256})$, $(7w_{256},13w_{256})$, $(7w_{256},11w_{256})$, $(7w_{256},9w_{256})$, $(7w_{256},7w_{256})$, $(7w_{256},5w_{256})$, $(7w_{256},3w_{256})$, $(7w_{256},w_{256})$, $(7w_{256},-15w_{256})$, $(7w_{256},-13w_{256})$, $(7w_{256},-11w_{256})$, $(7w_{256},-9w_{256})$, $(7w_{256},-7w_{256})$, $(7w_{256},-5w_{256})$, $(7w_{256},-3w_{256})$, $(7w_{256},-w_{256})$,
$(5w_{256},15w_{256})$, $(5w_{256},13w_{256})$, $(5w_{256},11w_{256})$, $(5w_{256},9w_{256})$, $(5w_{256},7w_{256})$, $(5w_{256},5w_{256})$, $(5w_{256},3w_{256})$, $(5w_{256},w_{256})$, $(5w_{256},-15w_{256})$, $(5w_{256},-13w_{256})$, $(5w_{256},-11w_{256})$, $(5w_{256},-9w_{256})$, $(5w_{256},-7w_{256})$, $(5w_{256},-5w_{256})$, $(5w_{256},-3w_{256})$, $(5w_{256},-w_{256})$,
$(3w_{256},15w_{256})$, $(3w_{256},13w_{256})$, $(3w_{256},11w_{256})$, $(3w_{256},9w_{256})$, $(3w_{256},7w_{256})$, $(3w_{256},5w_{256})$, $(3w_{256},3w_{256})$, $(3w_{256},w_{256})$, $(3w_{256},-15w_{256})$, $(3w_{256},-13w_{256})$, $(3w_{256},-11w_{256})$, $(3w_{256},-9w_{256})$, $(3w_{256},-7w_{256})$, $(3w_{256},-5w_{256})$, $(3w_{256},-3w_{256})$, $(3w_{256},-w_{256})$,
$(w_{256},15w_{256})$, $(w_{256},13w_{256})$, $(w_{256},11w_{256})$, $(w_{256},9w_{256})$, $(w_{256},7w_{256})$, $(w_{256},5w_{256})$, $(w_{256},3w_{256})$, $(w_{256},w_{256})$, $(w_{256},-15w_{256})$, $(w_{256},-13w_{256})$, $(w_{256},-11w_{256})$, $(w_{256},-9w_{256})$, $(w_{256},-7w_{256})$, $(w_{256},-5w_{256})$, $(w_{256},-3w_{256})$, $(w_{256},-w_{256})$,
$(-15w_{256},15w_{256})$, $(-15w_{256},13w_{256})$, $(-15w_{256},11w_{256})$, $(-15w_{256},9w_{256})$, $(-15w_{256},7w_{256})$, $(-15w_{256},5w_{256})$, $(-15w_{256},3w_{256})$, $(-15w_{256},w_{256})$, $(-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$,
$(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$, $(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$,
$(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$, $(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$,
$(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$, $(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256},-w_{256})$, $(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$, $(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$, $(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$, $(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-5w_{256},-w_{256})$, $(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$, $(-3w_{256},-15w_{256})$, $(-3w_{256},-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$, $(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$, $(-w_{256},-15w_{256})$, $(-w_{256},-w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, $(-w_{256},-w_{256})$

At this point, the bits to be transmitted (input bits) are set to b0, b1, b2, b3, b4, b5, b6, and b7. For example, for the bits to be transmitted (b0, b1, b2, b3, b4, b5, b6, b7)=(0,0,0,0, 0,0,0,0), the bits are mapped at signal point 401 in FIG. 4, and $(I,Q)=(15w_{256},15w_{256})$ is obtained when I is an in-phase component while Q is a quadrature component of the mapped baseband signal.

Based on the bits to be transmitted (b0, b1, b2, b3, b4, b5, b6, b7), in-phase component I and quadrature component Q of the mapped baseband signal are decided (during 256QAM modulation). FIG. 4 illustrates an example of a relationship between the set of b0, b1, b2, b3, b4, b5, b6, and b7 (00000000 to 11111111) and the signal point coordinates. Values 00000000 to 11111111 of the set of b0, b1, b2, b3, b4, b5, b6, and b7 are indicated immediately below 256 signal points included in 256QAM (the marks "○" in FIG. 4)

$(15w_{256},15w_{256})$, $(15w_{256},13w_{256})$, $(15w_{256},11w_{256})$, $(15w_{256},9w_{256})$, $(15w_{256},7w_{256})$, $(15w_{256},5w_{256})$, $(15w_{256},3w_{256})$, $(15w_{256},w_{256})$, $(15w_{256},-15w_{256})$, $(15w_{256},-13w_{256})$, $(15w_{256},-11w_{256})$, $(15w_{256},-9w_{256})$, $(15w_{256},-7w_{256})$, $(15w_{256},-5w_{256})$, $(15w_{256},-3w_{256})$, $(15w_{256},-w_{256})$, $(13w_{256},15w_{256})$, $(13w_{256},13w_{256})$, $(13w_{256},11w_{256})$, $(13w_{256},9w_{256})$, $(13w_{256},7w_{256})$, $(13w_{256},5w_{256})$, $(13w_{256},3w_{256})$, $(13w_{256},w_{256})$, $(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$, $(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$, $(11w_{256},-15w_{256})$, $(11w_{256},-13w_{256})$, $(11w_{256},-11w_{256})$, $(11w_{256},-9w_{256})$, $(11w_{256},-7w_{256})$, $(11w_{256},-5w_{256})$, $(11w_{256},-3w_{256})$, $(11w_{256},-w_{256})$, $(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256})$, $(9w_{256},-15w_{256})$, $(9w_{256},-13w_{256})$, $(9w_{256},-11w_{256})$, $(9w_{256},-9w_{256})$, $(9w_{256},-7w_{256})$, $(9w_{256},-5w_{256})$, $(9w_{256},-3w_{256})$, $(9w_{256},-w_{256})$, $(7w_{256},15w_{256})$, $(7w_{256},13w_{256})$, $(7w_{256},11w_{256})$, $(7w_{256},9w_{256})$, $(7w_{256},7w_{256})$, $(7w_{256},5w_{256})$, $(7w_{256},3w_{256})$, $(7w_{256},w_{256})$, $(7w_{256},-15w_{256})$, $(7w_{256},-13w_{256})$, $(7w_{256},-11w_{256})$, $(7w_{256},-9w_{256})$, $(7w_{256},-7w_{256})$, $(7w_{256},-5w_{256})$, $(7w_{256},-3w_{256})$, $(7w_{256},-w_{256})$, $(5w_{256},15w_{256})$, $(5w_{256},13w_{256})$, $(5w_{256},11w_{256})$, $(5w_{256},9w_{256})$, $(5w_{256},7w_{256})$, $(5w_{256},5w_{256})$, $(5w_{256},3w_{256})$, $(5w_{256},w_{256})$, $(5w_{256},-15w_{256})$, $(5w_{256},-13w_{256})$, $(5w_{256},-11w_{256})$, $(5w_{256},-9w_{256})$, $(5w_{256},-7w_{256})$, $(5w_{256},-5w_{256})$, $(5w_{256},-3w_{256})$, $(5w_{256},-w_{256})$, $(3w_{256},15w_{256})$, $(3w_{256},13w_{256})$, $(3w_{256},11w_{256})$, $(3w_{256},9w_{256})$, $(3w_{256},7w_{256})$, $(3w_{256},5w_{256})$, $(3w_{256},3w_{256})$, $(3w_{256},w_{256})$, $(3w_{256},-15w_{256})$, $(3w_{256},-13w_{256})$, $(3w_{256},-11w_{256})$, $(3w_{256},-9w_{256})$, $(3w_{256},-7w_{256})$, $(3w_{256},-5w_{256})$, $(3w_{256},-3w_{256})$, $(3w_{256},-w_{256})$, $(w_{256},15w_{256})$, $(w_{256},13w_{256})$, $(w_{256},11w_{256})$, $(w_{256},9w_{256})$, $(w_{256},7w_{256})$, $(w_{256},5w_{256})$, $(w_{256},3w_{256})$, $(w_{256},w_{256})$, $(w_{256},-15w_{256})$, $(w_{256},-13w_{256})$, $(w_{256},-11w_{256})$, $(w_{256},-9w_{256})$, $(w_{256},-7w_{256})$, $(w_{256},-5w_{256})$, $(w_{256},-3w_{256})$, $(w_{256},-w_{256})$, $(-15w_{256},15w_{256})$, $(-15w_{256},13w_{256})$, $(-15w_{256},11w_{256})$, $(-15w_{256},9w_{256})$, $(-15w_{256},7w_{256})$, $(-15w_{256},5w_{256})$, $(-15w_{256},3w_{256})$, $(-15w_{256},w_{256})$, $(-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$, $(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$, $(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$, $(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$, $(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$, $(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$, $(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256},-w_{256})$, $(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$, $(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$, $(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$, $(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-5w_{256},-w_{256})$, $(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$, $(-3w_{256},-15w_{256})$, $(-3w_{256},-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$, $(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$, $(-w_{256},-15w_{256})$, $(-w_{256},-w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, $(-w_{256},-w_{256})$. Respective coordinates of the signal points ("○") immediately above the values 00000000 to 11111111 of the set of b0, b1, b2, b3, b4, b5, b6, and b7 in the I-Q plane serve as in-phase component I and quadrature component Q of the mapped baseband signal. The relationship between the set of b0, b1, b2, b3, b4, b5, b6, and b7 (00000000 to 11111111) and the signal point coordinates during 256QAM modulation is not limited to that in FIG. 4. A complex value of in-phase component I and quadrature component Q of the mapped baseband signal (during 256QAM modulation) serves as a baseband signal ($s_1(t)$ or $s_2(t)$).

At this point, generally average power of baseband signal 505A ($s_1(t)$ and ($s_1(i)$)) and average power of baseband signal 505B ($s_2(t)$ and ($s_2(i)$)), which are of the output of mapper 504 in FIGS. 5 to 7, are equalized to each other. Accordingly, the following relational expressions hold with respect to coefficient $w_q$ described in the QPSK mapping method, coefficient $w_{16}$ described in the 16QAM mapping method, coefficient $w_{64}$ described in the 64QAM mapping method, and coefficient $w_{256}$ described in the 256QAM mapping method.

[Mathematical formula 11]

$$w_q = \frac{z}{\sqrt{2}} \quad \text{(R11)}$$

[Mathematical formula 12]

$$w_{16} = \frac{z}{\sqrt{10}} \quad \text{(R12)}$$

[Mathematical formula 13]

$$w_{64} = \frac{z}{\sqrt{42}} \quad \text{(R13)}$$

[Mathematical formula 14]

$$w_{256} = \frac{z}{\sqrt{170}} \quad \text{(R14)}$$

In the DVB (Digital Video Broadcasting) standard, when modulated signals #1 and #2 are transmitted from the two antennas in the MIMO transmission scheme, sometimes transmission average power of modulated signal #1 and transmission average power of modulated signal #2 are set so as to be different from each other. For example, $Q_1 \neq Q_2$ holds in equations (R2), (R3), (R4), (R5), and (R8).

A more specific example is considered as follows.

<1> The case that precoding matrix F (or F(i)) is given by any one of the following equations in equation (R2)

[Mathematical formula 15]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (R15)}$$

or

[Mathematical formula 16]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (R16)}$$

or

[Mathematical formula 17]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (R17)}$$

or

-continued

[Mathematical formula 18]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{Formula (R18)}$$

or

[Mathematical formula 19]

$$F = \begin{pmatrix} \beta \times \alpha \times e^{j0} & \beta \times e^{j\pi} \\ \beta \times e^{j0} & \beta \times \alpha \times e^{j0} \end{pmatrix} \quad \text{Formula (R19)}$$

or

[Mathematical formula 20]

$$F = \frac{1}{\sqrt{\alpha^2 + 1}} \begin{pmatrix} \alpha \times e^{j0} & e^{j\pi} \\ e^{j0} & \alpha \times e^{j0} \end{pmatrix} \quad \text{Formula (R20)}$$

or

[Mathematical formula 21]

$$F = \begin{pmatrix} \beta \times \alpha \times e^{j0} & \beta \times e^{j0} \\ \beta \times e^{j0} & \beta \times \alpha \times e^{j\pi} \end{pmatrix} \quad \text{Formula (R21)}$$

or

[Mathematical formula 22]

$$F = \frac{1}{\sqrt{\alpha^2 + 1}} \begin{pmatrix} \alpha \times e^{j0} & e^{j0} \\ e^{j0} & \alpha \times e^{j\pi} \end{pmatrix} \quad \text{Formula (R22)}$$

In equations (R15), (R16), (R17), (R18), (R19), (R20), (R21), and (R22), α may be either a real number or an imaginary number, and β may be either a real number or an imaginary number. However, α is not 0 (zero). Also β is not 0 (zero).

or

[Mathematical formula 23]

$$F = \begin{pmatrix} \beta \times \cos\theta & \beta \times \sin\theta \\ \beta \times \sin\theta & -\beta \times \cos\theta \end{pmatrix} \quad \text{Formula (R23)}$$

or

[Mathematical formula 24]

$$F = \begin{pmatrix} \cos\theta & \sin\theta \\ \sin\theta & -\cos\theta \end{pmatrix} \quad \text{Formula (R24)}$$

or

[Mathematical formula 25]

$$F = \begin{pmatrix} \beta \times \cos\theta & -\beta \times \sin\theta \\ \beta \times \sin\theta & \beta \times \cos\theta \end{pmatrix} \quad \text{Formula (R25)}$$

or

[Mathematical formula 26]

$$F = \begin{pmatrix} \cos\theta & -\sin\theta \\ \sin\theta & \cos\theta \end{pmatrix} \quad \text{Formula (R26)}$$

or

-continued

[Mathematical formula 27]

$$F = \begin{pmatrix} \beta\times\sin\theta & -\beta\times\cos\theta \\ \beta\times\cos\theta & \beta\times\sin\theta \end{pmatrix} \quad \text{Formula (R27)}$$

or

[Mathematical formula 28]

$$F = \begin{pmatrix} \sin\theta & -\cos\theta \\ \cos\theta & \sin\theta \end{pmatrix} \quad \text{Formula (R28)}$$

or

[Mathematical formula 29]

$$F = \begin{pmatrix} \beta\times\sin\theta & \beta\times\cos\theta \\ \beta\times\cos\theta & -\beta\times\sin\theta \end{pmatrix} \quad \text{Formula (R29)}$$

or

[Mathematical formula 30]

$$F = \begin{pmatrix} \sin\theta & \cos\theta \\ \cos\theta & -\sin\theta \end{pmatrix} \quad \text{Formula (R30)}$$

In equations (R23), (R25), (R27), and (R29), β may be either a real number or an imaginary number. However, β is not 0 (zero).

or

[Mathematical formula 30]

$$F(i) = \begin{pmatrix} \beta\times e^{j\theta_{11}(i)} & \beta\times\alpha\times e^{j(\theta_{11}(i)+\lambda} \\ \beta\times\alpha\times e^{j\theta_{21}(i)} & \beta\times e^{j(\theta_{21}(i)+\lambda+\pi)} \end{pmatrix} \quad \text{Formula (R31)}$$

or

[Mathematical formula 30]

$$F(i) = \frac{1}{\sqrt{\alpha^2+1}}\begin{pmatrix} e^{j\theta_{11}(i)} & \alpha\times e^{j(\theta_{11}(i)+\lambda} \\ \alpha\times e^{j\theta_{21}(i)} & e^{j(\theta_{21}(i)+\lambda+\pi)} \end{pmatrix} \quad \text{Formula (R32)}$$

or

[Mathematical formula 30]

$$F(i) = \begin{pmatrix} \beta\times\alpha\times e^{j\theta_{21}(i)} & \beta\times e^{j(\theta_{21}(i)+\lambda+\pi)} \\ \beta\times e^{j\theta_{11}(i)} & \beta\times\alpha\times e^{j(\theta_{11}(i)+\lambda)} \end{pmatrix} \quad \text{Formula (R33)}$$

or

[Mathematical formula 30]

$$F(i) = \frac{1}{\sqrt{\alpha^2+1}}\begin{pmatrix} \alpha\times e^{j\theta_{21}(i)} & e^{j(\theta_{21}(i)+\lambda+\pi)} \\ e^{j\theta_{11}(i)} & \alpha\times e^{j(\theta_{11}(i)+\lambda)} \end{pmatrix} \quad \text{Formula (R34)}$$

In the formula, $\theta_{11}(i)$ and $\theta_{21}(i)$ are a function of i (time or frequency), λ is a fixed value, α may be either a real number or an imaginary number, and β may be either a real number or an imaginary number. However, α is not 0 (zero). Also β is not 0 (zero).

<2> The case that precoding matrix F (or F(i)) is given by any one of equations (15) to (30) in equation (R3)

<3> The case that precoding matrix F (or F(i)) is given by any one of equations (15) to (30) in equation (R4)

<4> The case that precoding matrix F (or F(i)) is given by any one of equations (15) to (34) in equation (R5)

<5> The case that precoding matrix F (or F(i)) is given by any one of equations (15) to (30) in equation (R8)

In <1> to <5>, it is assumed that a modulation scheme for $s_1(t)$ differs from a modulation scheme for $s_2(t)$ (a modulation scheme for $s_1(i)$ differs from a modulation scheme for $s_2(i)$).

Necessary points of the configuration example will be described below. The following points are necessary for the precoding methods in <1> to <5>, and can also be performed when a precoding matrix except for equations (15) to (34) is used in the precoding methods in <1> to <5>.

It is assumed that $2^g$ (g is an integer of 1 or more) is a modulation multi-level number (a number of signal points in the I-Q plane, for example, the modulation multi-level number is 16 for 16QAM) in the modulation scheme of $s_1(t)$ ($s_1(i)$) (that is, baseband signal 505A) in <1> to <5>, and that $2^h$ (h is an integer of 1 or more) is a modulation multi-level number (a number of signal points in the I-Q plane, for example, the modulation multi-level number is 64 for 64QAM) in the modulation scheme of $s_2(t)$ ($s_2(i)$) (that is, baseband signal 505B) in <1> to <5> (g≠h).

The g-bit data is transmitted by one symbol of $s_1(t)$ ($s_1(i)$), and the h-bit data is transmitted by one symbol of $s_2(t)$ ($s_2(i)$). Therefore, the (g+h) bits are transmitted in one slot constructed with one symbol of $s_1(t)$ ($s_1(i)$) and one symbol of $s_2(t)$ ($s_2(i)$). At this point, the following condition is required to obtain a high spatial diversity gain.

<Condition R-1>

In the case that the precoding is performed on any one of equations (R2), (R3), (R4), (R5), and (R8) (however, processing except for the precoding is also included), the number of signal points that serve as the candidates is $2^{g+h}$ in the I-Q plane for one symbol of post-precoding signal $z_1(t)$ ($z_1(i)$). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

Additionally, the number of signal points that serve as the candidates is $2^{g+h}$ in the I-Q plane for one symbol of post-precoding signal $z_2(t)$ ($z_2(i)$). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

An additional condition will be described in each of equations (R2), (R3), (R4), (R5), and (R8) while <Condition R-1> is represented in another way.

(Case 1)

The case that the processing of equation (R2) is performed using the fixed precoding matrix:

The following equation is considered as an equation in a middle stage of a calculation of equation (R2).

[Mathematical formula 35]

$$\begin{pmatrix} u_1(i) \\ u_2(i) \end{pmatrix} = F\begin{pmatrix} P_1\times s_1(i) \\ P_2\times s_2(i) \end{pmatrix} = \begin{pmatrix} a(i) & b(i) \\ c(i) & d(i) \end{pmatrix}\begin{pmatrix} P_1\times s_1(i) \\ P_2\times s_2(i) \end{pmatrix} = \begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{Formula (R35)}$$

(For Case 1, precoding matrix F is set to a fixed precoding matrix (however, the precoding matrix may be switched in the case that the modulation scheme in $s_1(t)$ ($s_1(i)$) and/or the modulation scheme in $s_2(t)$ ($s_2(i)$) are switched).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when the following condition holds.

<Condition R-2>

The number of signal points that serve as the candidates is $2^{g+h}$ in the I-Q plane for one symbol of signal $u_1(t)$ ($u_1(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

Additionally, the number of signal points that serve as the candidates is $2^{g+h}$ in the I-Q plane for one symbol of signal $u_2$t) ($u_2(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

For $|Q_1|>|Q_2|$ (an absolute value of $Q_1$ is larger than an absolute value of $Q_2$) in equation (R2), the following condition is considered.

<Condition R-3>

The number of signal points that serve as the candidates is $2^{g+h}$ in the I-Q plane for one symbol of signal $u_1(t)$ ($u_1(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ ($u_1(i)$) is set to $D_1$ in the I-Q plane. ($D_1$ is a real number of 0 (zero) or more ($D_1 \geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ ($u_2(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ ($u_2(i)$) is set to $D_2$ in the I-Q plane. ($D_2$ is a real number of 0 (zero) or more ($D_2 \geq 0$). In the $2^{g+h}$ signal points, signal points located at the identical position exist in the I-Q plane when $D_2$ is 0 (zero).)

At this point, $D_1>D_2$ ($D_1$ is larger than $D_2$) holds.

Figure 53:
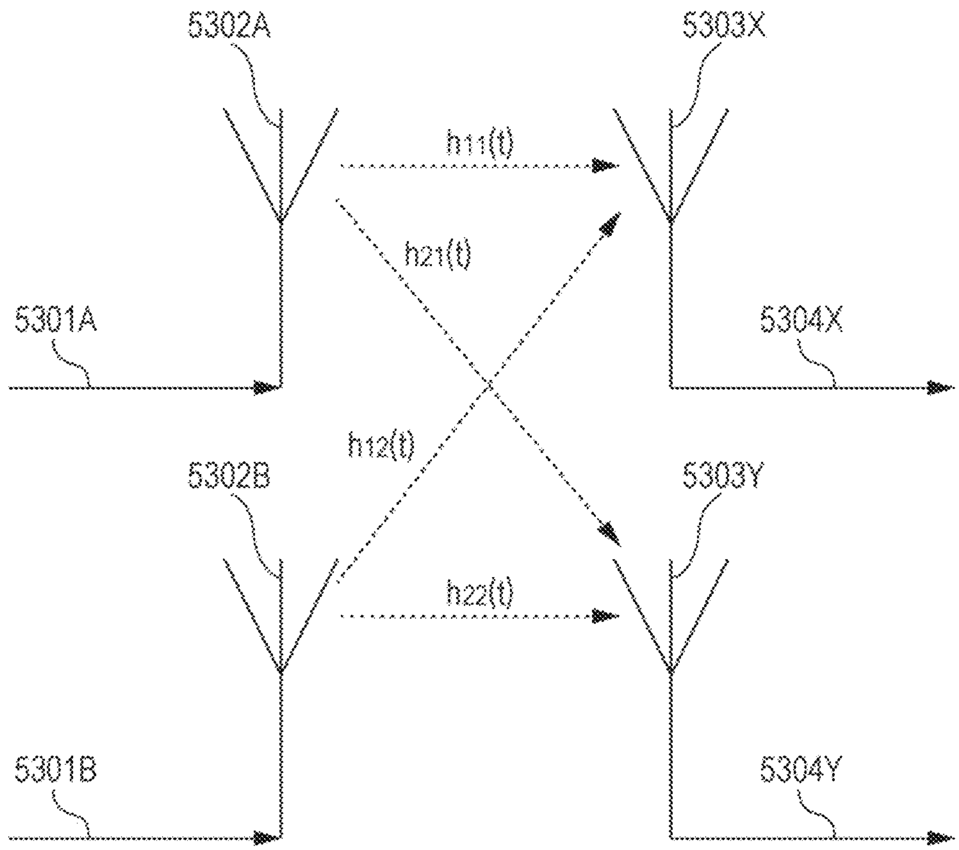
FIG. 53 is a view illustrating a relationship between a transmitting antenna and a receiving antenna.

FIG. 53 illustrates a relationship between the transmitting antenna and the receiving antenna. It is assumed that modulated signal #1 (5301A) is transmitted from transmitting antenna #1 (5302A) of the transmitter, and that modulated signal #2 (5301B) is transmitted from transmitting antenna #2 (5302B). At this point, it is assumed that $z_1(t)$ ($z_1(i)$) (that is, $u_1(t)$ ($u_1(i)$)) is transmitted from transmitting antenna #1 (5302A), and that $z_2(t)$ ($z_2(i)$) (that is, $u_2(t)$ ($u_2(i)$)) is transmitted from transmitting antenna #2 (5302B).

Receiving antenna #1 (5303X) and receiving antenna #2 (5303Y) of the receiver receive the modulated signal transmitted from the transmitter (obtain received signal 530X and received signal 5304Y). At this point, it is assumed that $h_{11}(t)$ is a propagation coefficient from transmitting antenna #1 (5302A) to receiving antenna #1 (5303X), that $h_{21}(t)$ is a propagation coefficient from transmitting antenna #1 (5302A) to receiving antenna #2 (5303Y), that $h_{12}(t)$ is a propagation coefficient from transmitting antenna #2 (5302B) to receiving antenna #1 (5303X), and that $h_{22}(t)$ is a propagation coefficient from transmitting antenna #2 (5302B) to receiving antenna #2 (5303Y) (t is time).

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-3> is satisfied, the receiver has a higher possibility of being able to obtain the high data reception quality.

For the similar reason, <Condition R-3'> preferably holds for $|Q_1|<|Q_2|$.

<Condition R-3'>

The number of signal points that serve as the candidates is $2^{g+h}$ in the I-Q plane for one symbol of signal $u_1(t)$ ($u_1(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ ($u_1(i)$) is set to $D_1$ in the I-Q plane. ($D_1$ is a real number of 0 (zero) or more ($D_1 \geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ ($u_2(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ ($u_2(i)$) is set to $D_2$ in the I-Q plane. ($D_2$ is a real number of 0 (zero) or more ($D_2 \geq 0$). In the $2^{g+h}$ signal points, signal points located at the identical position exist in the I-Q plane when $D_2$ is 0 (zero).)

At this point, $D_1<D_2$ ($D_1$ is smaller than $D_2$) holds.

In Case 1, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

(Case 2)

The case that the processing of equation (R2) is performed using any one of the pre-coding matrices of equations (R15) to (R30):

Equation (R35) is considered as an equation in the middle stage of the calculation of equation (R2). For Case 2, it is assumed that precoding matrix F is set to a fixed precoding matrix, and that precoding matrix F is given by one of equations (R15) to (R30) (however, the precoding matrix may be switched in the case that the modulation scheme in $s_1(t)$ ($s_1(i)$) and/or the modulation scheme in $s_2(t)$ ($s_2(i)$) are switched).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when <Condition R-2> holds.

For $|Q_1|>|Q_2|$ (an absolute value of $Q_1$ is larger than an absolute value of $Q_2$) in equation (R2), it is considered that <Condition R-3> holds similarly to Case 1.

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-3> is satisfied, the receiver has a higher possibility of being able to obtain the high data reception quality.

Accordingly, when the following condition holds, the receiver has a higher possibility of being able to obtain the high data reception quality.

<Condition R-3">

$P_1=P_2$ holds in equation (R2) while <Condition R-3> holds.

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-3"> is satisfied, the receiver has a higher possibility of being able to obtain the high data reception quality.

For the similar reason, <Condition R-3'> preferably holds for $|Q_1|<|Q_2|$.

For the similar reason, when the following condition holds for $|Q_1|<|Q_2|$, the receiver also has a higher possibility of being able to obtain the high data reception quality.

<Condition R-3'">

$P_1=P_2$ holds in equation (R2) while <Condition R-3'> holds.

In Case 2, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

(Case 3)

The case that the processing of equation (R2) is performed using any one of the pre-coding matrices of equations (R31) to (R34):

Equation (R35) is considered as an equation in the middle stage of the calculation of equation (R2). For Case 3, it is assumed that precoding matrix F is switched depending on the time (or frequency). It is assumed that precoding matrix F (F(i)) is given by any one of equations (R31) to (R34).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when <Condition R-4> holds.

<Condition R-4>

When symbol number i is greater than or equal to N and less than or equal to M (N is an integer, M is an integer, and N<M (M is smaller than N)), it is assumed that the modulation scheme of $s_1(t)$ ($s_1(i)$) (that is, baseband signal 505A) is fixed (not switched), and that the modulation scheme of $s_2(t)$ ($s_2(i)$) (that is, baseband signal 505B) is fixed (not switched).

When symbol number i is greater than or equal to N and less than or equal to M, the number of candidate signal points is $2^{g+h}$ in the I-Q plane for one symbol of signal $u_1(t)$ ($u_1(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

Additionally, when symbol number i is greater than or equal to N and less than or equal to M, the number of candidate signal points is $2^{g+h}$ in the I-Q plane for one symbol of signal $u_2(t)$ ($u_2(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

For $|Q_1|>|Q_2|$ (an absolute value of $Q_1$ is larger than an absolute value of $Q_2$) in equation (R2), it is considered that <Condition R-5> holds.

<Condition R-5>

When symbol number i is greater than or equal to N and less than or equal to M (N is an integer, M is an integer, and N<M (M is smaller than N)), it is assumed that the modulation scheme of $s_1(t)$ ($s_1(i)$) (that is, baseband signal 505A) is fixed (not switched), and that the modulation scheme of $s_2(t)$ ($s_2(i)$) (that is, baseband signal 505B) is fixed (not switched).

When symbol number i is greater than or equal to N and less than or equal to M, the number of candidate signal points is $2^{g+h}$ in the I-Q plane for one symbol of signal $u_1(t)$ ($u_1(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

In symbol number i, a minimum Euclidean distance between signal points that serve as $2^{g+h}$ candidates of $u_1(t)$ ($u_1(i)$) is set to $D_1(i)$ in the I-Q plane. ($D_1(i)$ is a real number of 0 (zero) or more ($D_1(i)\geq 0$). In the $2^{g+h}$ signal points, signal points located at the identical position exist in the I-Q plane when $D_1(i)$ is 0 (zero).)

When symbol number i is greater than or equal to N and less than or equal to M, the number of candidate signal points is $2^{g+h}$ in the I-Q plane for one symbol of signal $u_2(t)$ ($u_2(i)$) of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

In symbol number i, a minimum Euclidean distance between signal points that serve as $2^{g+h}$ candidates of $u_2(t)$ ($u_2(i)$) is set to $D_2(i)$ in the I-Q plane. ($D_2(i)$ is a real number of 0 (zero) or more ($D_2(i)\geq 0$). In the $2^{g+h}$ signal points, signal points located at the identical position exist in the I-Q plane when $D_2(i)$ is 0 (zero).)

At this point, $D_1(i)>D_2(i)$ ($D_1(i)$ is larger than $D_2(i)$) holds when symbol number i is greater than or equal to N and less than or equal to M.

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-5> is satisfied, the receiver has a higher possibility of being able to obtain the high data reception quality.

Accordingly, when the following condition holds, the receiver has a higher possibility of being able to obtain the high data reception quality.

<Condition R-5'>

$P_1=P_2$ holds in equation (R2) while <Condition R-5> holds.

At this point, because $|Q_1|>|Q_2|$ holds, there is a possibility that a reception state of the modulated signal of $z_1(t)$ $(z_1(i))$ (that is, $u_1(t)$ $(u_1(i))$) is a dominant factor of reception quality of the received data. Accordingly, when <Condition R-5'> is satisfied, the receiver has a higher possibility of being able to obtain the high data reception quality.

For the similar reason, <Condition R-5"> preferably holds for $|Q_1|<|Q_2|$.

<Condition R-5">

When symbol number i is greater than or equal to N and less than or equal to M (N is an integer, M is an integer, and N<M (M is smaller than N)), it is assumed that the modulation scheme of $s_1(t)$ $(s_1(i))$ (that is, baseband signal 505A) is fixed (not switched), and that the modulation scheme of $s_2(t)$ $(s_2(i))$ (that is, baseband signal 505B) is fixed (not switched).

When symbol number i is greater than or equal to N and less than or equal to M, the number of candidate signal points is $2^{g+h}$ in the I-Q plane for one symbol of signal $u_1(t)$ $(u_1(i))$ of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

In symbol number i, a minimum Euclidean distance between signal points that serve as $2^{g+h}$ candidates of $u_1(t)$ $(u_1(i))$ is set to $D_1(i)$ in the I-Q plane. ($D_1(i)$ is a real number of 0 (zero) or more ($D_1(i)\geq 0$). In the $2^{g+h}$ signal points, signal points located at the identical position exist in the I-Q plane when $D_1(i)$ is 0 (zero).)

When symbol number i is greater than or equal to N and less than or equal to M, the number of candidate signal points is $2^{g+h}$ in the I-Q plane for one symbol of signal $u_2(t)$ $(u_2(i))$ of equation (R35). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

In symbol number i, a minimum Euclidean distance between signal points that serve as $2^{g+h}$ candidates of $u_2(t)$ $(u_2(i))$ is set to $D_2(i)$ in the I-Q plane. ($D_2(i)$ is a real number of 0 (zero) or more ($D_2(i)\geq 0$). In the $2^{g+h}$ signal points, signal points located at the identical position exist in the I-Q plane when $D_2(i)$ is 0 (zero).)

At this point, $D_1(i)<D_2(i)$ ($D_1$ (i) is smaller than $D_2(i)$) holds when symbol number i is greater than or equal to N and less than or equal to M.

For the similar reason, when the following condition holds for $|Q_1|<|Q_2|$, the receiver also has a higher possibility of being able to obtain the high data reception quality.

<Condition R-5'">

$P_1=P_2$ holds in equation (R2) while <Condition R-5"> holds.

In Case 3, for example, QPSK, 16QAM, 64QAM, and 256QAM are applied as the modulation scheme in $s_1(t)$ $(s_1(i))$ and the modulation scheme in $s_2(t)$ $(s_2(i))$ as described above. At this point, the specific mapping method is described in the above configuration example. Alternatively, a modulation scheme except for QPSK, 16QAM, 64QAM, and 256QAM may be used.

(Case 4)

The case that the processing of equation (R3) is performed using the fixed pre-coding matrix:

The following equation is considered as an equation in a middle stage of a calculation of equation (R3).

[Mathematical formula 36]

$$\begin{pmatrix} u_1(i) \\ u_2(i) \end{pmatrix} = F\begin{pmatrix} P_1 \times s_1(i) \\ P_2 \times s_2(i) \end{pmatrix} = \begin{pmatrix} a(i) & b(i) \\ c(i) & d(i) \end{pmatrix}\begin{pmatrix} P_1 \times s_1(i) \\ P_2 \times s_2(i) \end{pmatrix} = \begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{Formula (R36)}$$

(For Case 4, precoding matrix F is set to a fixed precoding matrix (however, the precoding matrix may be switched in the case that the modulation scheme in $s_1(t)$ $(s_1(i))$ and/or the modulation scheme in $s_2(t)$ $(s_2(i))$ are switched).

It is assumed that $2^g$ (g is an integer of 1 or more) is a modulation multi-level number of the modulation scheme in $s_1(t)$ $(s_1(i))$ (that is, baseband signal 505A), that $2^h$ (h is an integer of 1 or more) is a modulation multi-level number of the modulation scheme in $s_2(t)$ $(s_2(i))$ (that is, baseband signal 505B), and that g is not equal to h.

At this point, the high spatial diversity gain can be obtained when the following condition holds.

<Condition R-6>

The number of signal points that serve as the candidates is $2^{g+h}$ in the I-Q plane for one symbol of signal $u_1(t)$ $(u_1(i))$ of equation (R36). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

Additionally, the number of signal points that serve as the candidates is $2^{g+h}$ in the I-Q plane for one symbol of signal $u_2(t)$ $(u_2(i))$ of equation (R36). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

For $|Q_1|>|Q_2|$ (an absolute value of $Q_1$ is larger than an absolute value of $Q_2$) in equation (R3), the following condition is considered.

<Condition R-7>

The number of signal points that serve as the candidates is $2^{g+h}$ in the I-Q plane for one symbol of signal $u_1(t)$ $(u_1(i))$ of equation (R36). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ $(u_1(i))$ is set to $D_1$ in the I-Q plane. ($D_1$ is a real number of 0 (zero) or more ($D_1\geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ $(u_2(i))$ of equation (R36). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ $(u_2(i))$ is set to $D_2$ in the I-Q plane. ($D_2$ is a real number of 0 (zero) or more ($D_2\geq 0$). In the $2^{g+h}$ signal points, signal points located at the identical position exist in the I-Q plane when $D_2$ is 0 (zero).)

At this point, $D_1>D_2$ ($D_1$ is larger than $D_2$) holds.

FIG. 53 illustrates a relationship between the transmitting antenna and the receiving antenna. It is assumed that modulated signal #1 (5301A) is transmitted from transmitting antenna #1 (5302A) of the transmitter, and that modulated signal #2 (5301B) is transmitted from transmitting antenna #2 (5302B). At this point, it is assumed that $z_1(t)$ ($z_1(i)$) (that is, $u_1(t)$ ($u_1(i)$)) is transmitted from transmitting antenna #1 (5302A), and that $z_2(t)$ ($z_2(i)$) (that is, $u_2(t)$ ($u_2(i)$)) is transmitted from transmitting antenna #2 (5302B).

Receiving antenna #1 (5303X) and receiving antenna #2 (5303Y) of the receiver receive the modulated signal transmitted from the transmitter (obtain received signal 530X and received signal 5304Y). At this point, it is assumed that $h_{11}(t)$ is a propagation coefficient from transmitting antenna #1 (5302A) to receiving antenna #1 (5303X), that $h_{21}(t)$ is a propagation coefficient from transmitting antenna #1 (5302A) to receiving antenna #2 (5303Y), that $h_{12}(t)$ is a propagation coefficient from transmitting antenna #2 (5302B) to receiving antenna #1 (5303X), and that $h_{22}(t)$ is a propagation coefficient from transmitting antenna #2 (5302B) to receiving antenna #2 (5303Y) (t is time).

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-7> is satisfied, the receiver has a higher possibility of being able to obtain the high data reception quality.

For the similar reason, <Condition R-7'> preferably holds for $|Q_1|<|Q_2|$.

<Condition R-7'>

The number of signal points that serve as the candidates is $2^{g+h}$ in the I-Q plane for one symbol of signal $u_1(t)$ ($u_1(i)$) of equation (R36). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ ($u_1(i)$) is set to $D_1$ in the I-Q plane. ($D_1$ is a real number of 0 (zero) or more ($D_1 \geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ ($u_2(i)$) of equation (R36). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ ($u_2(i)$) is set to $D_2$ in the I-Q plane. ($D_2$ is a real number of 0 (zero) or more ($D_2 \geq 0$). In the $2^{g+h}$ signal points, signal points located at the identical position exist in the I-Q plane when $D_2$ is 0 (zero).)

At this point, $D_1<D_2$ ($D_1$ is smaller than $D_2$) holds.

In Case 4, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

(Case 5)

The case that the processing of equation (R3) is performed using any one of the precoding matrices of equations (R15) to (R30):

Equation (R36) is considered as an equation in the middle stage of the calculation of equation (R3). For Case 5, it is assumed that precoding matrix F is set to a fixed precoding matrix, and that precoding matrix F is given by one of equations (R15) to (R30) (however, the precoding matrix may be switched in the case that the modulation scheme in $s_1(t)$ ($s_1(i)$) and/or the modulation scheme in $s_2(t)$ ($s_2(i)$) are switched).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when <Condition R-6> holds.

For $|Q_1|>|Q_2|$ (an absolute value of $Q_1$ is larger than an absolute value of $Q_2$) in equation (R3), it is considered that <Condition R-7> holds similarly to Case 4.

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-7> is satisfied, the receiver has a higher possibility of being able to obtain the high data reception quality.

Accordingly, when the following condition holds, the receiver has a higher possibility of being able to obtain the high data reception quality.

<Condition R-7">

$P_1=P_2$ holds in equation (R3) while <Condition R-7> holds.

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-7"> is satisfied, the receiver has a higher possibility of being able to obtain the high data reception quality.

For the similar reason, <Condition R-7'> preferably holds for $|Q_1|<|Q_2|$.

For the similar reason, when the following condition holds for $|Q_1|<|Q_2|$, the receiver also has a higher possibility of being able to obtain the high data reception quality.

<Condition R-7'">

$P_1=P_2$ holds in equation (R3) while <Condition R-7'> holds.

In Case 5, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

(Case 6)

The case that the processing of equation (R4) is performed using the fixed pre-coding matrix:

The following equation is considered as an equation in a middle stage of a calculation of equation (R4).

[Mathematical formula 37]

$$\begin{pmatrix} u_1(i) \\ u_2(i) \end{pmatrix} = \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} = \begin{pmatrix} a(i) & b(i) \\ c(i) & d(i) \end{pmatrix} \begin{pmatrix} P_1 \times s_1(i) \\ P_2 \times s_2(i) \end{pmatrix} = \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(R 37)}$$

(For Case 6, precoding matrix F is set to a fixed precoding matrix (however, the precoding matrix may be switched in the case that the modulation scheme in $s_1(t)$ ($s_1(i)$) and/or the modulation scheme in $s_2(t)$ ($s_2(i)$) are switched).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when the following condition holds.

<Condition R-8>

The number of signal points that serve as the candidates is $2^{g+h}$ in the I-Q plane for one symbol of signal $u_1(t)$ ($u_1(i)$) of equation (R37). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

Additionally, the number of signal points that serve as the candidates is $2^{g+h}$ in the I-Q plane for one symbol of signal $u_2(t)$ ($u_2(i)$) of equation (R37). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

For $|Q_1|>|Q_2|$ (an absolute value of $Q_1$ is larger than an absolute value of $Q_2$) in equation (R4), the following condition is considered.

<Condition R-9>

The number of signal points that serve as the candidates is $2^{g+h}$ in the I-Q plane for one symbol of signal $u_1(t)$ ($u_1(i)$) of equation (R37). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ ($u_1(i)$) is set to $D_1$ in the I-Q plane. ($D_1$ is a real number of 0 (zero) or more ($D_1 \geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ ($u_2(i)$) of equation (R37). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ ($u_2(i)$) is set to $D_2$ in the I-Q plane. ($D_2$ is a real number of 0 (zero) or more ($D_2 \geq 0$). In the $2^{g+h}$ signal points, signal points located at the identical position exist in the I-Q plane when $D_2$ is 0 (zero).)

At this point, $D_1>D_2$ ($D_1$ is larger than $D_2$) holds.

FIG. 53 illustrates a relationship between the transmitting antenna and the receiving antenna. It is assumed that modulated signal #1 (5301A) is transmitted from transmitting antenna #1 (5302A) of the transmitter, and that modulated signal #2 (5301B) is transmitted from transmitting antenna #2 (5302B). At this point, it is assumed that $z_1(t)$ ($z_1(i)$) (that is, $u_1(t)$ ($u_1(i)$)) is transmitted from transmitting antenna #1 (5302A), and that $z_2(t)$ ($z_2(i)$) (that is, $u_2(t)$ ($u_2(i)$)) is transmitted from transmitting antenna #2 (5302B).

Receiving antenna #1 (5303X) and receiving antenna #2 (5303Y) of the receiver receive the modulated signal transmitted from the transmitter (obtain received signal 530X and received signal 5304Y). At this point, it is assumed that $h_{11}(t)$ is a propagation coefficient from transmitting antenna #1 (5302A) to receiving antenna #1 (5303X), that $h_{21}(t)$ is a propagation coefficient from transmitting antenna #1 (5302A) to receiving antenna #2 (5303Y), that $h_{12}(t)$ is a propagation coefficient from transmitting antenna #2 (5302B) to receiving antenna #1 (5303X), and that $h_{22}(t)$ is a propagation coefficient from transmitting antenna #2 (5302B) to receiving antenna #2 (5303Y) (t is time).

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-9> is satisfied, the receiver has a higher possibility of being able to obtain the high data reception quality.

For the similar reason, <Condition R-9'> preferably holds for $|Q_1|<|Q_2|$.

<Condition R-9'>

The number of signal points that serve as the candidates is $2^{g+h}$ in the I-Q plane for one symbol of signal $u_1(t)$ ($u_1(i)$) of equation (R37). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ ($u_1(i)$) is set to $D_1$ in the I-Q plane. ($D_1$ is a real number of 0 (zero) or more ($D_1 \geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ ($u_2(i)$) of equation (R37). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ ($u_2(i)$) is set to $D_2$ in the I-Q plane. ($D_2$ is a real number of 0 (zero) or more ($D_2 \geq 0$). In the $2^{g+h}$ signal points, signal points located at the identical position exist in the I-Q plane when $D_2$ is 0 (zero).)

At this point, $D_1<D_2$ ($D_1$ is smaller than $D_2$) holds.

In Case 6, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

(Case 7)

The case that the processing of equation (R4) is performed using any one of the precoding matrices of equations (R15) to (R30):

Equation (R37) is considered as an equation in the middle stage of the calculation of equation (R4). For Case 7, it is assumed that precoding matrix F is set to a fixed precoding matrix, and that precoding matrix F is given by one of equations (R15) to (R30) (however, the precoding matrix may be switched in the case that the modulation scheme in $s_1(t)$ ($s_1(i)$) and/or the modulation scheme in $s_2(t)$ ($s_2(i)$) are switched).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when <Condition R-8> holds.

For $|Q_1|>|Q_2|$ (an absolute value of $Q_1$ is larger than an absolute value of $Q_2$) in equation (R4), it is considered that <Condition R-9> holds similarly to Case 6.

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-9> is satisfied, the receiver has a higher possibility of being able to obtain the high data reception quality.

Accordingly, when the following condition holds, the receiver has a higher possibility of being able to obtain the high data reception quality.

<Condition R-9">

$P_1=P_2$ holds in equation (R4) while <Condition R-9> holds.

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-9"> is satisfied, the receiver has a higher possibility of being able to obtain the high data reception quality.

For the similar reason, <Condition R-9'> preferably holds for $|Q_1|<|Q_2|$.

For the similar reason, when the following condition holds for $|Q_1|<|Q_2|$, the receiver also has a higher possibility of being able to obtain the high data reception quality.

<Condition R-9'">

$P_1=P_2$ holds in equation (R4) while <Condition R-9'> holds.

In Case 7, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

(Case 8)

The case that the processing of equation (R5) is performed using the fixed pre-coding matrix:

The following equation is considered as an equation in a middle stage of a calculation of equation (R5).

[Mathematical formula 38]

$$\begin{pmatrix} u_1(i) \\ u_2(i) \end{pmatrix} = F\begin{pmatrix} s_1(i) \\ s_2(i) \end{pmatrix} = \begin{pmatrix} a(i) & b(i) \\ c(i) & d(i) \end{pmatrix}\begin{pmatrix} s_1(i) \\ s_2(i) \end{pmatrix} \quad \text{Formula (R38)}$$

(For Case 8, precoding matrix F is set to a fixed precoding matrix (however, the precoding matrix may be switched in the case that the modulation scheme in $s_1(t)$ ($s_1(i)$) and/or the modulation scheme in $s_2(t)$ ($s_2(i)$) are switched).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when the following condition holds.

<Condition R-10>

The number of signal points that serve as the candidates is $2^{g+h}$ in the I-Q plane for one symbol of signal $u_1(t)$ ($u_1(i)$) of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

Additionally, the number of signal points that serve as the candidates is $2^{g+h}$ in the I-Q plane for one symbol of signal $u_2(t)$ ($u_2(i)$) of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

For $|Q_1|>|Q_2|$ (an absolute value of $Q_1$ is larger than an absolute value of $Q_2$) in equation (R5), the following condition is considered.

<Condition R-11>

The number of signal points that serve as the candidates is $2^{g+h}$ in the I-Q plane for one symbol of signal $u_1(t)$ ($u_1(i)$) of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ ($u_1(i)$) is set to $D_1$ in the I-Q plane. ($D_1$ is a real number of 0 (zero) or more ($D_1\geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ ($u_2(i)$) of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ ($u_2(i)$) is set to $D_2$ in the I-Q plane. ($D_2$ is a real number of 0 (zero) or more ($D_2\geq 0$). In the $2^{g+h}$ signal points, signal points located at the identical position exist in the I-Q plane when $D_2$ is 0 (zero).)

At this point, $D_1> D_2$ ($D_1$ is larger than $D_2$) holds.

FIG. 53 illustrates a relationship between the transmitting antenna and the receiving antenna. It is assumed that modulated signal #1 (5301A) is transmitted from transmitting antenna #1 (5302A) of the transmitter, and that modulated signal #2 (5301B) is transmitted from transmitting antenna #2 (5302B). At this point, it is assumed that $z_1(t)$ ($z_1(i)$) (that is, $u_1(t)$ ($u_1(i)$)) is transmitted from transmitting antenna #1 (5302A), and that $z_2(t)$ ($z_2(i)$) (that is, $u_2(t)$ ($u_2(i)$)) is transmitted from transmitting antenna #2 (5302B).

Receiving antenna #1 (5303X) and receiving antenna #2 (5303Y) of the receiver receive the modulated signal transmitted from the transmitter (obtain received signal 530X and received signal 5304Y). At this point, it is assumed that $h_{11}(t)$ is a propagation coefficient from transmitting antenna #1 (5302A) to receiving antenna #1 (5303X), that $h_{21}(t)$ is a propagation coefficient from transmitting antenna #1 (5302A) to receiving antenna #2 (5303Y), that $h_{12}(t)$ is a propagation coefficient from transmitting antenna #2 (5302B) to receiving antenna #1 (5303X), and that $h_{22}(t)$ is a propagation coefficient from transmitting antenna #2 (5302B) to receiving antenna #2 (5303Y) (t is time).

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-11> is satisfied, the receiver has a higher possibility of being able to obtain the high data reception quality.

For the similar reason, <Condition R-11> preferably holds for $|Q_1|<|Q_2|$.

<Condition R-11'>

The number of signal points that serve as the candidates is $2^{g+h}$ in the I-Q plane for one symbol of signal $u_1(t)$ $(u_1(i))$ of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ $(u_1(i))$ is set to $D_1$ in the I-Q plane. ($D_1$ is a real number of 0 (zero) or more ($D_1 \geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ $(u_2(i))$ of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ $(u_2(i))$ is set to $D_2$ in the I-Q plane. ($D_2$ is a real number of 0 (zero) or more ($D_2 \geq 0$). In the $2^{g+h}$ signal points, signal points located at the identical position exist in the I-Q plane when $D_2$ is 0 (zero).)

At this point, $D_1<D_2$ ($D_1$ is smaller than $D_2$) holds.

In Case 8, for example, QPSK, 16QAM, 64QAM, and 256QAM are applied as the modulation scheme in $s_1(t)$ $(s_1(i))$ and the modulation scheme in $s_2(t)$ $(s_2(i))$ as described above. At this point, the specific mapping method is described in the above configuration example. Alternatively, a modulation scheme except for QPSK, 16QAM, 64QAM, and 256QAM may be used.

(Case 9)

The case that the processing of equation (R5) is performed using any one of the pre-coding matrices of equations (R15) to (R30):

Equation (R38) is considered as an equation in the middle stage of the calculation of equation (R5). For Case 9, it is assumed that precoding matrix F is set to a fixed precoding matrix, and that precoding matrix F is given by one of equations (R15) to (R30) (however, the precoding matrix may be switched in the case that the modulation scheme in $s_1(t)$ $(s_1(i))$ and/or the modulation scheme in $s_2(t)$ $(s_2(i))$ are switched).

It is assumed that $2^g$ (g is an integer of 1 or more) is a modulation multi-level number of the modulation scheme in $s_1(t)$ $(s_1(i))$ (that is, baseband signal 505A), that $2^h$ (h is an integer of 1 or more) is a modulation multi-level number of the modulation scheme in $s_2(t)$ $(s_2(i))$ (that is, baseband signal 505B), and that g is not equal to h.

At this point, the high spatial diversity gain can be obtained when <Condition R-10> holds.

For $|Q_1|>|Q_2|$ (an absolute value of $Q_1$ is larger than an absolute value of $Q_2$) in equation (R5), it is considered that <Condition R-11> holds similarly to Case 8.

At this point, because $|Q_1|>|Q_2|$ holds, there is a possibility that a reception state of the modulated signal of $z_1(t)$ $(z_1(i))$ (that is, $u_1(t)$ $(u_1(i))$) is a dominant factor of reception quality of the received data. Accordingly, when <Condition R-11> is satisfied, the receiver has a higher possibility of being able to obtain the high data reception quality.

For the similar reason, <Condition R-11'> preferably holds for $|Q_1|<|Q_2|$.

In Case 9, for example, QPSK, 16QAM, 64QAM, and 256QAM are applied as the modulation scheme in $s_1(t)$ $(s_1(i))$ and the modulation scheme in $s_2(t)$ $(s_2(i))$ as described above. At this point, the specific mapping method is described in the above configuration example. Alternatively, a modulation scheme except for QPSK, 16QAM, 64QAM, and 256QAM may be used.

(Case 10)

The case that the processing of equation (R5) is performed using any one of the pre-coding matrices of equations (R31) to (R34):

Equation (R38) is considered as an equation in the middle stage of the calculation of equation (R5). For Case 10, it is assumed that precoding matrix F is switched depending on the time (or frequency). It is assumed that precoding matrix F (F(i)) is given by any one of equations (R31) to (R34).

It is assumed that $2^g$ (g is an integer of 1 or more) is a modulation multi-level number of the modulation scheme in $s_1(t)$ $(s_1(i))$ (that is, baseband signal 505A), that $2^h$ (h is an integer of 1 or more) is a modulation multi-level number of the modulation scheme in $s_2(t)$ $(s_2(i))$ (that is, baseband signal 505B), and that g is not equal to h.

At this point, the high spatial diversity gain can be obtained when <Condition R-12> holds.

<Condition R-12>

When symbol number i is greater than or equal to N and less than or equal to M (N is an integer, M is an integer, and N<M (M is smaller than N)), it is assumed that the modulation scheme of $s_1(t)$ $(s_1(i))$ (that is, baseband signal 505A) is fixed (not switched), and that the modulation scheme of $s_2(t)$ $(s_2(i))$ (that is, baseband signal 505B) is fixed (not switched).

When symbol number i is greater than or equal to N and less than or equal to M, the number of candidate signal points is $2^{g+h}$ in the I-Q plane for one symbol of signal $u_1(t)$ $(u_1(i))$ of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

Additionally, when symbol number i is greater than or equal to N and less than or equal to M, the number of candidate signal points is $2^{g+h}$ in the I-Q plane for one symbol of signal $u_2(t)$ $(u_2(i))$ of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

For $|Q_1|>|Q_2|$ (an absolute value of $Q_1$ is larger than an absolute value of $Q_2$) in equation (R5), it is considered that <Condition R-13> holds.

<Condition R-13>

When symbol number i is greater than or equal to N and less than or equal to M (N is an integer, M is an integer, and N<M (M is smaller than N)), it is assumed that the modulation scheme of $s_1(t)$ $(s_1(i))$ (that is, baseband signal 505A) is fixed (not switched), and that the modulation scheme of $s_2(t)$ $(s_2(i))$ (that is, baseband signal 505B) is fixed (not switched).

When symbol number i is greater than or equal to N and less than or equal to M, the number of candidate signal points is $2^{g+h}$ in the I-Q plane for one symbol of signal $u_1(t)$ $(u_1(i))$ of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

In symbol number i, a minimum Euclidean distance between signal points that serve as $2^{g+h}$ candidates of $u_1(t)$ ($u_1(i)$) is set to $D_1(i)$ in the I-Q plane. ($D_1(i)$ is a real number of 0 (zero) or more ($D_1(i) \geq 0$). In the $2^{g+h}$ signal points, signal points located at the identical position exist in the I-Q plane when $D_1(i)$ is 0 (zero).)

When symbol number i is greater than or equal to N and less than or equal to M, the number of candidate signal points is $2^{g+h}$ in the I-Q plane for one symbol of signal $u_2(t)$ ($u_2(i)$) of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

In symbol number i, a minimum Euclidean distance between signal points that serve as $2^{g+h}$ candidates of $u_2(t)$ ($u_2(i)$) is set to $D_2(i)$ in the I-Q plane. ($D_2(i)$ is a real number of 0 (zero) or more ($D_2(i) \geq 0$). In the $2^{g+h}$ signal points, signal points located at the identical position exist in the I-Q plane when $D_2(i)$ is 0 (zero).)

At this point, $D_1(i) > D_2(i)$ ($D_1(i)$ is larger than $D_2(i)$) holds when symbol number i is greater than or equal to N and less than or equal to M.

At this point, because $|Q_1| > |Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-13> is satisfied, the receiver has a higher possibility of being able to obtain the high data reception quality.

Accordingly, when the following condition holds, the receiver has a higher possibility of being able to obtain the high data reception quality.

For the similar reason, <Condition R-13"> preferably holds for $|Q_1| < |Q_2|$.

<Condition R-13">

When symbol number i is greater than or equal to N and less than or equal to M (N is an integer, M is an integer, and N<M (M is smaller than N)), it is assumed that the modulation scheme of $s_1(t)$ ($s_1(i)$) (that is, baseband signal 505A) is fixed (not switched), and that the modulation scheme of $s_2(t)$ ($s_2(i)$) (that is, baseband signal 505B) is fixed (not switched).

When symbol number i is greater than or equal to N and less than or equal to M, the number of candidate signal points is $2^{g+h}$ in the I-Q plane for one symbol of signal $u_1(t)$ ($u_1(i)$) of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

In symbol number i, a minimum Euclidean distance between signal points that serve as $2^{g+h}$ candidates of $u_1(t)$ ($u_1(i)$) is set to $D_1(i)$ in the I-Q plane. ($D_1(i)$ is a real number of 0 (zero) or more ($D_1(i) \geq 0$). In the $2^{g+h}$ signal points, signal points located at the identical position exist in the I-Q plane when $D_1(i)$ is 0 (zero).)

When symbol number i is greater than or equal to N and less than or equal to M, the number of candidate signal points is $2^{g+h}$ in the I-Q plane for one symbol of signal $u_2(t)$ ($u_2(i)$) of equation (R38). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

In symbol number i, a minimum Euclidean distance between signal points that serve as $2^{g+h}$ candidates of $u_2(t)$ ($u_2(i)$) is set to $D_2(i)$ in the I-Q plane. ($D_2(i)$ is a real number of 0 (zero) or more ($D_2(i) \geq 0$). In the $2^{g+h}$ signal points, signal points located at the identical position exist in the I-Q plane when $D_2(i)$ is 0 (zero).)

At this point, $D_1(i) < D_2(i)$ ($D_1(i)$ is smaller than $D_2(i)$) holds when symbol number i is greater than or equal to N and less than or equal to M.

In Case 10, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

(Case 11)

The case that the processing of equation (R8) is performed using the fixed pre-coding matrix:

The following equation is considered as an equation in a middle stage of a calculation of equation (R8).

[Mathematical formula 39]

$$\begin{pmatrix} u_1(i) \\ u_2(i) \end{pmatrix} = F\begin{pmatrix} s_1(i) \\ s_2(i) \end{pmatrix} = \begin{pmatrix} a(i) & b(i) \\ c(i) & d(i) \end{pmatrix}\begin{pmatrix} s_1(i) \\ s_2(i) \end{pmatrix} \quad \text{Formula (R39)}$$

(For Case 11, precoding matrix F is set to a fixed precoding matrix (however, the precoding matrix may be switched in the case that the modulation scheme in $s_1(t)$ ($s_1(i)$) and/or the modulation scheme in $s_2(t)$ ($s_2(i)$) are switched).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when the following condition holds.

<Condition R-14>

The number of signal points that serve as the candidates is $2^{g+h}$ in the I-Q plane for one symbol of signal $u_1(t)$ ($u_1(i)$) of equation (R39). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

Additionally, the number of signal points that serve as the candidates is $2^{g+h}$ in the I-Q plane for one symbol of signal $u_2(t)$ ($u_2(i)$) of equation (R39). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.)

For $|Q_1| > |Q_2|$ (an absolute value of $Q_1$ is larger than an absolute value of $Q_2$) in equation (R8), the following condition is considered.

<Condition R-15>

The number of signal points that serve as the candidates is $2^{g+h}$ in the I-Q plane for one symbol of signal $u_1(t)$ ($u_1(i)$) of equation (R39). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ ($u_1(i)$) is set to $D_1$ in the I-Q plane. ($D_1$ is a real number of 0 (zero) or more ($D_1 \geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ ($u_2(i)$) of equation (R39). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ ($u_2(i)$) is set to $D_2$ in the I-Q plane. ($D_2$ is a real number of 0 (zero) or more ($D_2 \geq 0$). In the $2^{g+h}$ signal points, signal points located at the identical position exist in the I-Q plane when $D_2$ is 0 (zero).)

At this point, $D_1 > D_2$ ($D_1$ is larger than $D_2$) holds.

FIG. 53 illustrates a relationship between the transmitting antenna and the receiving antenna. It is assumed that modulated signal #1 (5301A) is transmitted from transmitting antenna #1 (5302A) of the transmitter, and that modulated signal #2 (5301B) is transmitted from transmitting antenna #2 (5302B). At this point, it is assumed that $z_1(t)$ ($z_1(i)$) (that is, $u_1(t)$ ($u_1(i)$)) is transmitted from transmitting antenna #1 (5302A), and that $z_2(t)$ ($z_2(i)$) (that is, $u_2(t)$ ($u_2(i)$)) is transmitted from transmitting antenna #2 (5302B).

Receiving antenna #1 (5303X) and receiving antenna #2 (5303Y) of the receiver receive the modulated signal transmitted from the transmitter (obtain received signal 530X and received signal 5304Y). At this point, it is assumed that $h_{11}(t)$ is a propagation coefficient from transmitting antenna #1 (5302A) to receiving antenna #1 (5303X), that $h_{21}(t)$ is a propagation coefficient from transmitting antenna #1 (5302A) to receiving antenna #2 (5303Y), that $h_{12}(t)$ is a propagation coefficient from transmitting antenna #2 (5302B) to receiving antenna #1 (5303X), and that $h_{22}(t)$ is a propagation coefficient from transmitting antenna #2 (5302B) to receiving antenna #2 (5303Y) (t is time).

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-15> is satisfied, the receiver has a higher possibility of being able to obtain the high data reception quality.

For the similar reason, <Condition R-15'> preferably holds for $|Q_1|<|Q_2|$.

<Condition R-15'>

The number of signal points that serve as the candidates is $2^{g+h}$ in the I-Q plane for one symbol of signal $u_1(t)$ ($u_1(i)$) of equation (R39). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_1(t)$ ($u_1(i)$) is set to $D_1$ in the I-Q plane. ($D_1$ is a real number of 0 (zero) or more ($D_1 \geq 0$). In the $2^{g+h}$ signal points, signal points located at the identical position exist in the I-Q plane when $D_1$ is 0 (zero).)

The number of signal points that serve as the candidates is $2^{g+h}$ in the I-Q plane for one symbol of signal $u_2(t)$ ($u_2(i)$) of equation (R39). (When the signal point is produced in the I-Q plane with respect to all values that can be taken by the (g+h)-bit data for one symbol, the $2^{g+h}$ signal points can be produced. The number $2^{g+h}$ is the number of signal points that serve as the candidates.) A minimum Euclidean distance between signal points that serve as $2^{g+h}$ candidates of $u_2(t)$ ($u_2(i)$) is set to $D_2$ in the I-Q plane. ($D_2$ is a real number of 0 (zero) or more ($D_2 \geq 0$). In the $2^{g+h}$ signal points, signal points located at the identical position exist in the I-Q plane when $D_2$ is 0 (zero).)

At this point, $D_1 < D_2$ ($D_1$ is smaller than $D_2$) holds.

In Case 11, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

(Case 12)

The case that the processing of equation (R8) is performed using any one of the pre-coding matrices of equations (R15) to (R30):

Equation (R39) is considered as an equation in the middle stage of the calculation of equation (R8). For Case 12, it is assumed that precoding matrix F is set to a fixed precoding matrix, and that precoding matrix F is given by one of equations (R15) to (R30) (however, the precoding matrix may be switched in the case that the modulation scheme in $s_1(t)$ ($s_1(i)$) and/or the modulation scheme in $s_2(t)$ ($s_2(i)$) are switched).

It is assumed that $2^g$ (g is an integer of 1 or more) is a modulation multi-level number of the modulation scheme in $s_1(t)$ ($s_1(i)$) (that is, baseband signal 505A), that $2^h$ (h is an integer of 1 or more) is a modulation multi-level number of the modulation scheme in $s_2(t)$ ($s_2(i)$) (that is, baseband signal 505B), and that g is not equal to h.

At this point, the high spatial diversity gain can be obtained when <Condition R-14> holds.

For $|Q_1|>|Q_2|$ (an absolute value of $Q_1$ is larger than an absolute value of $Q_2$) in equation (R8), it is considered that <Condition R-15> holds similarly to Case 11.

At this point, because $|Q_1|>|Q_2|$ holds, there is a possibility that a reception state of the modulated signal of $z_1(t)$ ($z_1(i)$) (that is, $u_1(t)$ ($u_1(i)$)) is a dominant factor of reception quality of the received data. Accordingly, when <Condition R-15> is satisfied, the receiver has a higher possibility of being able to obtain the high data reception quality.

For the similar reason, <Condition R-15'> preferably holds for $|Q_1|<|Q_2|$.

In Case 12, for example, QPSK, 16QAM, 64QAM, and 256QAM are applied as the modulation scheme in $s_1(t)$ ($s_1(i)$) and the modulation scheme in $s_2(t)$ ($s_2(i)$) as described above. At this point, the specific mapping method is described in the above configuration example. Alternatively, a modulation scheme except for QPSK, 16QAM, 64QAM, and 256QAM may be used.

As described above in the configuration examples, in the transmission method for transmitting the two post-precoding modulated signals from the different antennas, the minimum Euclidean distance between the signal points of the modulated signal having the larger average transmission power is increased in the I-Q plane, which allows the receiver to have the high possibility of being able to obtain the high data reception quality.

Each of the transmitting antenna and receiving antenna in the configuration examples may be constructed with a plurality of antennas. The different antennas that transmit the two post-precoding modulated signals may be used so as to simultaneously transmit one modulated signal at different times.

The above precoding method can also be performed when the single-carrier scheme, the OFDM scheme, the multi-carrier scheme such as the OFDM scheme in which a wavelet transformation is used, and a spread spectrum scheme are applied.

Specific examples of exemplary embodiments are described later in detail, and operation of the receiver is also described later.

Configuration Example S1

In configuration example S1, a more specific example of the precoding method in the case that the two transmitted signals of configuration example R1 differ from each other in the transmission average powers will be described below.

FIG. 5 illustrates a configuration example of a portion that generates a modulated signal when the transmitter of a base station (such as a broadcasting station and an access point) can change a transmission scheme.

The transmitter of the base station (such as the broadcasting station and the access point) will be described below with reference to FIG. 5.

In FIG. 5, information 501 and control signal 512 are input to encoder 502, and encoder 502 performs coding based on information about a coding rate and a code length (block length) included in control signal 512, and outputs coded data 503.

Coded data 503 and control signal 512 are input to mapper 504. It is assumed that control signal 512 assigns the transmission of the two streams as a transmission scheme. Additionally, it is assumed that control signal 512 assigns modulation scheme α and modulation scheme β as respective modulation schemes of the two streams. It is assumed that modulation scheme α is a modulation scheme for modulating x-bit data, and that modulation scheme β is a modulation scheme for modulating y-bit data (for example, a modulation scheme for modulating 4-bit data for 16QAM (16 Quadrature Amplitude Modulation), and a modulation scheme for modulating 6-bit data for 64QAM (64 Quadrature Amplitude Modulation)).

Mapper 504 modulates the x-bit data in (x+y)-bit data using modulation scheme α to generate and output baseband signal $s_1(t)$ (505A), and modulates the remaining y-bit data using modulation scheme β to output baseband signal $s_2(t)$ (505B). (One mapper is provided in FIG. 5. Alternatively, a mapper that generates baseband signal $s_1(t)$ and a mapper that generates baseband signal $s_2(t)$ may separately be provided. At this point, coded data 503 is divided in the mapper that generates baseband signal $s_1(t)$ and the mapper that generates baseband signal $s_2(t)$.)

Each of $s_1(t)$ and $s_2(t)$ is represented as a complex number (however, may be one of a complex number and a real number), and t is time. For the transmission scheme in which multi-carrier such as OFDM (Orthogonal Frequency Division Multiplexing) is used, it can also be considered that $s_1$ and $s_2$ are a function of frequency f like $s_1(f)$ and $s_2(f)$ or that $s_1$ and $s_2$ are a function of time t and frequency f like $s_1(t,f)$ and $s_2(t,f)$.

Hereinafter, the baseband signal, a precoding matrix, a phase change, and the like are described as the function of time t. Alternatively, the baseband signal, the precoding matrix, the phase change, and the like may be considered to be the function of frequency f or the function of time t and frequency f.

Accordingly, sometimes the baseband signal, the precoding matrix, the phase change, and the like are described as a function of symbol number i. In this case, the baseband signal, the precoding matrix, the phase change, and the like may be considered to be the function of time t, the function of frequency f, or the function of time t and frequency f. That is, the symbol and the baseband signal may be generated and disposed in either a time-axis direction or a frequency-axis direction. The symbol and the baseband signal may be generated and disposed in the time-axis direction and the frequency-axis direction.

Baseband signal $s_1(t)$ (505A) and control signal 512 are input to power changer 506A (power adjuster 506A), and power changer 506A (power adjuster 506A) sets real number $P_1$ based on control signal 512, and outputs $(P_1 \times s_1(t))$ as power-changed signal 507A ($P_1$ may be a complex number).

Similarly, baseband signal $s_2(t)$ (505B) and control signal 512 are input to power changer 506B (power adjuster 506B), and power changer 506B (power adjuster 506B) sets real number $P_2$, and outputs $(P_2 \times s_2(t))$ as power-changed signal 507B ($P_2$ may be a complex number).

Power-changed signal 507A, power-changed signal 507B, and control signal 512 are input to weighting synthesizer 508, and weighting synthesizer 508 sets precoding matrix F (or F(i)) based on control signal 512. Assuming that i is a slot number (symbol number), weighting synthesizer 508 performs the following calculation.

[Mathematical formula 40]

$$\begin{pmatrix} u_1(i) \\ u_2(i) \end{pmatrix} = F\begin{pmatrix} P_1 \times s_1(i) \\ P_2 \times s_2(i) \end{pmatrix} = \begin{pmatrix} a(i) & b(i) \\ c(i) & d(i) \end{pmatrix}\begin{pmatrix} P_1 \times s_1(i) \\ P_2 \times s_2(i) \end{pmatrix} = \begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{(S 1)}$$

In the formula, each of a(i), b(i), c(i), and d(i) is represented as a complex number (may be represented as a real number), and at least three of a(i), b(i), c(i), and d(i) must not be 0 (zero). The precoding matrix may be a function of i or does not need to be the function of i. When the precoding matrix is the function of i, the precoding matrix is switched by a slot number (symbol number).

Weighting synthesizer 508 outputs $u_1(i)$ in equation (S1) as weighting-synthesized signal 509A, and outputs $u_2(i)$ in equation (S1) as weighting-synthesized signal 509B.

Weighting-synthesized signal 509A ($u_1(i)$) and control signal 512 are input to power changer 510A, and power changer 510A sets real number $Q_1$ based on control signal 512, and outputs ($Q_1$($Q_1$ is a real number)$\times u_1(t)$) as power-changed signal 511A ($z_1(i)$) (alternatively, $Q_1$ may be a complex number).

Similarly, weighting-synthesized signal 509B ($u_2(i)$) and control signal 512 are input to power changer 510B, and power changer 510B sets real number $Q_2$ based on control signal 512, and outputs ($Q_2$ ($Q_2$ is a real number)$\times u_2(t)$) as power-changed signal 511A ($z_2(i)$) (alternatively, $Q_2$ may be a complex number).

Accordingly, the following equation holds.

[Mathematical formula 41]

$$\begin{pmatrix} z_1(i) \\ z_2(i) \end{pmatrix} = \begin{pmatrix} Q_1 & 0 \\ 0 & Q_2 \end{pmatrix}F\begin{pmatrix} P_1 \times s_1(i) \\ P_2 \times s_2(i) \end{pmatrix} = \begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 \times s_1(i) \\ P_2 \times s_s(i) \end{pmatrix} = \begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{(S 2)}$$

The transmission method in the case that two streams different from those in FIG. 5 will be described with reference to FIG. 6. In FIG. 6, the component similar to that in FIG. 5 is designated by the identical reference mark.

Signal 509B in which $u_2(i)$ in equation (S1) is weighting-synthesized and control signal 512 are input to phase changer 601, and phase changer 601 changes a phase of signal 509B in which $u_2(i)$ in equation (S1) is weighting-synthesized based on control signal 512. Accordingly, the signal in which the phase of signal 509B in which $u_2(i)$ in equation (S1) is weighting-synthesized is represented as $(e^{j\theta(i)} \times u_2(i))$, and phase changer 601 outputs $(e^{j\theta(i)} \times u_2(i))$ as phase-changed signal 602 (j is an imaginary unit). The changed phase constitutes a characteristic portion that the changed phase is the function of i like $\theta(i)$.

Each of power changers 510A and 510B in FIG. 6 changes power of the input signal. Accordingly, outputs $z_1(i)$ and $z_2(i)$ of power changers 510A and 510B in FIG. 6 are given by the following equation.

[Mathematical formula 42]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 \times s_1(i) \\ P_2 \times s_s(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \tag{S 3}$$

FIG. 7 illustrates the configuration different from that in FIG. 6 as the method for performing equation (S3). A difference between the configurations in FIGS. 6 and 7 is that the positions of the power changer and phase changer are exchanged (the function of changing the power and the function of changing the phase are not changed). At this point, $z_1(i)$ and $z_2(i)$ are given by the following equation.

[Mathematical formula 43]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 \times s_1(i) \\ P_2 \times s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 \times s_1(i) \\ P_2 \times s_s(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \tag{S 4}$$

$z_1(i)$ in equation (S3) is equal to $z_1(i)$ in equation (S4), and $z_2(i)$ in equation (S3) is equal to $z_2(i)$ in equation (S4).

As to phase value $\theta(i)$ to be changed in equations (S3) and (S4), assuming that $(\theta(i+1)-\theta(i))$ is set to a fixed value, there is a high possibility that the receiver obtains the good data reception quality in a radio wave propagation environment where a direct wave is dominant. However, a method for providing phase value $\theta(i)$ to be changed is not limited to the above example.

FIG. 8 illustrates a configuration example of a signal processor that processes signals $z_1(i)$ and $z_2(i)$ obtained in FIGS. 5 to 7.

Signal $z_1(i)$ (801A), pilot symbol 802A, control information symbol 803A, and control signal 512 are input to inserter 804A, and inserter 804A inserts pilot symbol 802A and control information symbol 803A in signal (symbol) $z_1(i)$ (801A) according to a frame configuration included in control signal 512, and outputs modulated signal 805A according to the frame configuration.

Pilot symbol 802A and control information symbol 803A are a symbol modulated using BPSK (Binary Phase Shift Keying), QPSK (Quadrature Phase Shift Keying), and the like (other modulation schemes may be used).

Modulated signal 805A and control signal 512 are input to radio section 806A, and radio section 806A performs pieces of processing such as frequency conversion and amplification on modulated signal 805A based on control signal 512 (performs inverse Fourier transform when the OFDM scheme is used), and outputs transmitted signal 807A as a radio wave from antenna 808A.

Signal $z_2(i)$ (801B), pilot symbol 802B, control information symbol 803B, and control signal 512 are input to inserter 804B, and inserter 804B inserts pilot symbol 802B and control information symbol 803B in signal (symbol) $z_2(i)$ (801B) according to the frame configuration included in control signal 512, and outputs modulated signal 805B according to the frame configuration.

Pilot symbol 802B and control information symbol 803B are a symbol modulated using BPSK (Binary Phase Shift Keying), QPSK (Quadrature Phase Shift Keying), and the like (other modulation schemes may be used).

Modulated signal 805B and control signal 512 are input to radio section 806B, and radio section 806B performs the pieces of processing such as the frequency conversion and the amplification on modulated signal 805B based on control signal 512 (performs the inverse Fourier transform when the OFDM scheme is used), and outputs transmitted signal 807B as a radio wave from antenna 808B.

Signals $z_1(i)$ (801A) and $z_2(i)$ (801B) having the identical number of i are transmitted from different antennas at the identical time and the identical (common) frequency (that is, the transmission method in which the MIMO scheme is used).

Pilot symbols 802A and 802B are a symbol that is used when the receiver performs the signal detection, the estimation of the frequency offset, gain control, the channel estimation, and the like. Although the symbol is named the pilot symbol in this case, the symbol may be named other names such as a reference symbol.

Control information symbols 803A and 803B are a symbol that transmits the information about the modulation scheme used in the transmitter, the information about the transmission scheme, the information about the precoding scheme, the information about an error correction code scheme, the information about the coding rate of an error correction code, and the information about a block length (code length) of the error correction code to the receiver. The control information symbol may be transmitted using only one of control information symbols 803A and 803B.

FIG. 9 illustrates an example of the frame configuration at time-frequency when the two streams are transmitted. In FIG. 9, a horizontal axis indicates a frequency, a vertical axis indicates time. FIG. 9 illustrates a configuration of the symbol from carriers 1 to 38 from clock time \$1 to clock time \$11.

FIG. 9 simultaneously illustrates the frame configuration of the transmitted signal transmitted from antenna 808A in FIG. 8 and the frame of the transmitted signal transmitted from antenna 808B in FIG. 8.

In FIG. 9, a data symbol corresponds to signal (symbol) $z_1(i)$ for the frame of the transmitted signal transmitted from antenna 808A in FIG. 8. The pilot symbol corresponds to pilot symbol 802A.

In FIG. 9, a data symbol corresponds to signal (symbol) $z_2(i)$ for the frame of the transmitted signal transmitted from antenna 808B in FIG. 8. The pilot symbol corresponds to pilot symbol 802B.

Accordingly, as described above, signals $z_1(i)$ (801A) and $z_2(i)$ (801B) having the identical number of i are transmitted from different antennas at the identical time and the identical (common) frequency. The configuration of the pilot symbol is not limited to that in FIG. 9. For example, a time interval and a frequency interval of the pilot symbol are not limited to those in FIG. 9. In FIG. 9, the pilot symbols are transmitted at the identical clock time and the identical frequency (identical (sub-) carrier) from antennas 808A and 808B in FIG. 8. Alternatively, for example, the pilot symbol may be disposed in not antenna 808B in FIG. 8 but antenna 808A in FIG. 8 at time A and frequency a ((sub-) carrier a), and the pilot symbol may be disposed in not antenna 808A in FIG. 8 but antenna 808B in FIG. 8 at time B and frequency b ((sub-) carrier b).

Although only the data symbol and the pilot symbol are illustrated in FIG. 9, other symbols such as a control information symbol may be included in the frame.

Although the case that a part (or whole) of the power changer exists is described with reference to FIGS. 5 to 7, it is also considered that a part of the power changer is missing.

For example, in the case that power changer 506A (power adjuster 506A) and power changer 506B (power adjuster 506B) do not exist in FIG. 5, $z_1(i)$ and $z_2(i)$ are given as follows.

[Mathematical formula 44]

$$\begin{pmatrix} z_1(i) \\ z_2(i) \end{pmatrix} = \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(S 5)}$$

In the case that power changer 510A (power adjuster 510A) and power changer 510B (power adjuster 510B) do not exist in FIG. 5, $z_1(i)$ and $z_2(i)$ are given as follows.

[Mathematical formula 45]

$$\begin{pmatrix} z_1(i) \\ z_2(i) \end{pmatrix} = \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(S 6)}$$

In the case that power changer 506A (power adjuster 506A), power changer 506B (power adjuster 506B), power changer 510A (power adjuster 510A), and power changer 510B (power adjuster 510B) do not exist in FIG. 5, $z_1(i)$ and $z_2(i)$ are given as follows.

[Mathematical formula 46]

$$\begin{pmatrix} z_1(i) \\ z_2(i) \end{pmatrix} = \begin{pmatrix} a(i) & b(i) \\ c(i) & d(i) \end{pmatrix} \begin{pmatrix} s_1(i) \\ s_2(i) \end{pmatrix} \quad \text{(S 7)}$$

In the case that power changer 506A (power adjuster 506A) and power changer 506B (power adjuster 506B) do not exist in FIG. 6 or 7, $z_1(i)$ and $z_2(i)$ are given as follows.

[Mathematical formula 47]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(S 8)}$$

In the case that power changer 510A (power adjuster 510A) and power changer 510B (power adjuster 510B) do not exist in FIG. 6 or 7, $z_1(i)$ and $z_2(i)$ are given as follows.

[Mathematical formula 48]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(S 9)}$$

In the case that power changer 506A (power adjuster 506A), power changer 506B (power adjuster 506B), power changer 510A (power adjuster 510A), and power changer 510B (power adjuster 510B) do not exist in FIG. 6 or 7, $z_1(i)$ and $z_2(i)$ are given as follows.

[Mathematical formula 49]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(S 10)}$$

A more specific example of the precoding method in the case that the two transmitted signals of configuration example R1 differ from each other in the transmission average powers during the adoption of the (MIMO (Multiple Input Multiple Output) scheme) transmission method for transmitting the two streams will be described below.

Example 1

In mapper 504 of FIGS. 5 to 7, the modulation scheme for obtaining $s_1(t)$ ($s_1(i)$) is set to 16QAM while the modulation scheme for obtaining $s_2(t)$ ($s_2(i)$) is set to 64QAM. An example of conditions associated with the configuration and power change of precoding matrix (F) when the precoding and/or the power change is performed on, for example, one of equations (s2), (S3), (S4), (S5), and (S8) will be described below.

Figure 10:
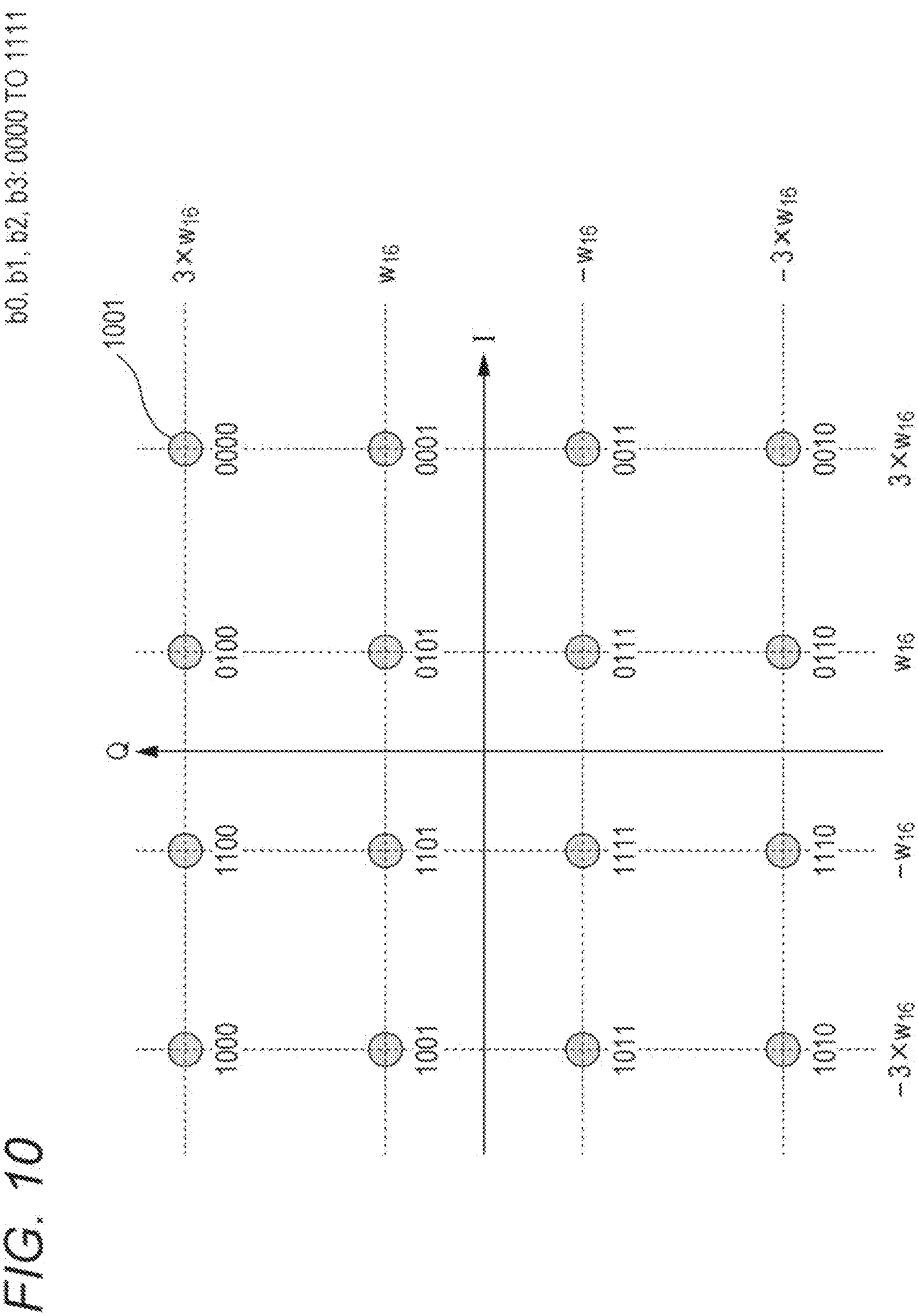
FIG. 10 is a view illustrating an arrangement example of the signal points of 16QAM in the I-Q plane.

The 16QAM mapping method will be described below. FIG. 10 illustrates an arrangement example of 16QAM signal points in the I-Q plane. In FIG. 10, 16 marks "○" indicate 16QAM signal points, a horizontal axis indicates I, and a vertical axis indicates Q.

In the I-Q plane, 16 signal points included in 16QAM (indicated by the marks "○" in FIG. 10) are obtained as follows. ($w_{16}$ is a real number larger than 0)

$(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$

At this point, the bits to be transmitted (input bits) are set to b0, b1, b2, and b3. For example, in the case that the bits to be transmitted is (b0, b1, b2, b3)=(0, 0, 0, 0), the bits are mapped at signal point 1001 in FIG. 10, and $(I,Q)=(3w_{16},$ $3w_{16}$) is obtained when I is an in-phase component while Q is a quadrature component of the mapped baseband signal.

Based on the bits to be transmitted (b0, b1, b2, b3), in-phase component I and quadrature component Q of the mapped baseband signal are decided (during 16QAM modulation). FIG. 10 illustrates an example of the relationship between the set of b0, b1, b2, and b3 (0000 to 1111) and the signal point coordinates. Values 0000 to 1111 of the set of b0, b1, b2, and b3 are indicated immediately below 16 signal points included in 16QAM (the marks "○" in FIG. 10) $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$. Respective coordinates of the signal points ("○") immediately above the values 0000 to 1111 of the set of b0, b1, b2, and b3 in the I-Q plane serve as in-phase component I and quadrature component Q of the mapped baseband signal. The relationship between the set of b0, b1, b2, and b3 (0000 to 1111) and the signal point coordinates during 16QAM modulation is not limited to that in FIG. 10. A complex value of in-phase component I and quadrature component Q of the mapped baseband signal (during 16QAM modulation) serves as a baseband signal ($s_1(t)$ or $s_2(t)$ in FIGS. 5 to 7).

Figure 11:
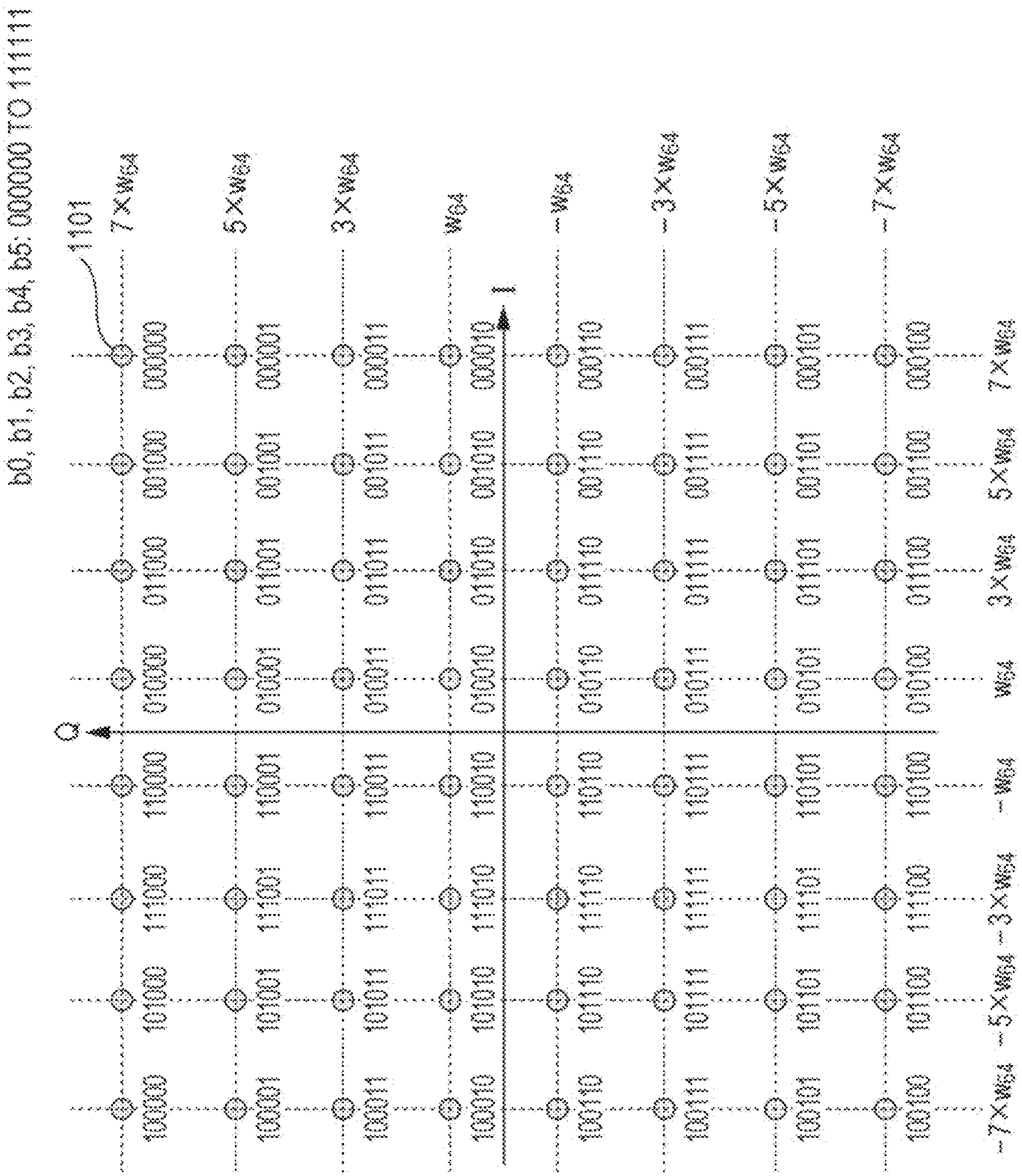
FIG. 11 is a view illustrating an arrangement example of the signal points of 64QAM in the I-Q plane.

The 64QAM mapping method will be described below. FIG. 11 illustrates an arrangement example of 64QAM signal points in the I-Q plane. In FIG. 11, 64 marks "○" indicate 64QAM signal points, a horizontal axis indicates I, and a vertical axis indicates Q.

In the I-Q plane, 64 signal points included in 64QAM (indicated by the marks "○" in FIG. 11) the I-Q are obtained as follows. ($w_{64}$ is a real number larger than 0)

$(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64}-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$

At this point, the bits to be transmitted (input bits) are set to b0, b1, b2, b3, b4, and b5. For example, in the case that the bits to be transmitted is (b0, b1, b2, b3, b4, b5)=(0,0,0, 0,0,0), the bits are mapped at signal point 1101 in FIG. 11, and $(I,Q)=(7w_{64},7w_{64})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 11 illustrates an example of a relationship between the set of b0, b1, b2, b3, b4, and b5 (000000 to 111111) and the signal point coordinates. Values 000000 to of the set of b0, b1, b2, b3, b4, and b5 are indicated immediately below 64 signal points included in 64QAM (the marks "○" in FIG. 11) $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$. Respective coordinates of the signal points ("○") immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 11. A complex value of in-phase component I and quadrature component Q of the mapped baseband signal (during 64QAM modulation) serves as a baseband signal ($s_1(t)$ or $s_2(t)$ in FIGS. 5 to 7).

In this case, the modulation scheme of baseband signal 505A ($s_1(t)$ ($s_1(i)$)) is set to 16QAM while modulation scheme of baseband signal 505B ($s_2(t)$ ($s_2(i)$)) is set to 64QAM in FIG. 5 to FIG. 7. The configuration of the precoding matrix will be described below.

At this point, generally average power of baseband signal 505A ($s_1(t)$ and ($s_1(i)$)) and average power of baseband signal 505B ($s_2(t)$ and ($s_2(i)$)), which are of the output of mapper 504 in FIGS. 5 to 7, are equalized to each other. Accordingly, the following relational expression holds with respect to coefficient $w_{16}$ of the 16QAM mapping method and coefficient $w_{64}$ of the 64QAM mapping method.

[Mathematical formula 50]

$$w_{16} = \frac{z}{\sqrt{10}} \tag{S 11}$$

[Mathematical formula 51]

$$w_{64} = \frac{z}{\sqrt{42}} \tag{S 12}$$

In equations (S11) and (S12), it is assumed that z is a real number larger than 0. When the calculations are performed in <1> to <5>, <1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

the configuration of precoding matrix F

[Mathematical formula 52]

$$F = \begin{pmatrix} a(i) & b(i) \\ c(i) & d(i) \end{pmatrix} \quad (S13)$$

and a relationship between $Q_1$ and $Q_2$ will be described in detail below ((Example 1-1) to (Example 1-8)).

Example 1-1

For one of <1> to <5>, precoding matrix F is set to one of the following equations.

[Mathematical formula 53]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S14)}$$

or

[Mathematical formula 54]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (S15)}$$

or

[Mathematical formula 55]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S16)}$$

or

[Mathematical formula 56]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{Formula (S17)}$$

In equations (S14), (S15), (S16), and (S17), α may be either a real number or an imaginary number, and β may be either a real number or an imaginary number. However, α is not 0 (zero). Also β is not 0 (zero).

In the configuration example (common to the description), "radian" is used as a phase unit such as an argument in a complex plane (the unit is indicated when "degree" is exceptionally used).

The use of the complex plane can display a polar coordinate of the complex number in terms of a polar form. Assuming that point (a, b) on the complex plane is represented as [r,θ] in terms of the polar coordinate when complex number z=a+jb (a and b are a real number and j is an imaginary unit) corresponds to point (a, b), the following equation holds, $a = r \times \cos\theta$, and $$b = r \times \sin\theta \quad \text{equation (49)}$$

In the equation, r is an absolute value of z (r=|z|) and θ is an argument, z=a+jb is represented as $re^{j\theta}$. For example, in $e^{j\pi}$ in equations (S14) to (S17), the unit of argument π is "radian".

At this point, value α with which the receiver obtains the good data reception quality is considered.

With respect to signal $z_1(t)$ ($z_1(i)$) in equations (s2), (S3), (S4), (S5), and (S8), the following equations are considered as value α with which the receiver obtains the good data reception quality.

When α is a real number:

[Mathematical formula 57]

$$\alpha = \frac{\sqrt{42}}{\sqrt{10}} \times \frac{5}{4} \quad \text{Formula (S18)}$$

or

[Mathematical formula 58]

$$\alpha = -\frac{\sqrt{42}}{\sqrt{10}} \times \frac{5}{4} \quad \text{Formula (S19)}$$

When α is an imaginary number:

[Mathematical formula 59]

$$\alpha = \frac{\sqrt{42}}{\sqrt{10}} \times \frac{5}{4} \times e^{j\frac{\pi}{2}} \quad \text{Formula S20)}$$

or

[Mathematical formula 60]

$$\alpha = \frac{\sqrt{42}}{\sqrt{10}} \times \frac{5}{4} \times e^{j\frac{3\pi}{2}} \quad \text{Formula (S21)}$$

The modulation scheme of baseband signal 505A ($s_1(t)$ ($s_1(i)$)) is set to 16QAM while modulation scheme of baseband signal 505B ($s_2(t)$ ($s_2(i)$)) is set to 64QAM. Accordingly, the precoding (and the phase change and the power change) is performed to transmit the modulated signal from each antenna as described above, the total number of bits transmitted using symbols transmitted from antennas 808A and 808B in FIG. 8 at the (unit) time of time u and frequency (carrier) v is 10 bits that are of a sum of 4 bits (for the use of 16QAM) and 6 bits (for the use of 64QAM).

Assuming that $b_{0,16}$, $b_{1,16}$, $b_{2,16}$, and $b_{3,16}$ are input bits for the purpose of the 16QAM mapping, and that $b_{0,64}$, $b_{1,64}$, $b_{2,64}$, $b_{3,64}$, $b_{4,64}$ and $b_{5,64}$ are input bits for the purpose of the 64QAM mapping, even if value α in any one of equations (S18), (S19), (S20), and (S21) is used, in signal $z_1(t)$ ($z_1(i)$), the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) exist in the I-Q plane, similarly, in signal $z_2(t)$ ($z_2(i)$), the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) exist in the I-Q plane.

In the above description, with respect to signal $z_1(t)$ ($z_1(i)$) in equations (s2), (S3), (S4), (S5), and (S8), equations (S18) to (S21) are considered as value α with which the receiver obtains the good data reception quality. This point will be described below.

In signal $z_1(t)$ ($z_1(i)$), the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) exist in the I-Q plane, and it is desirable that $2^{10}=1024$ signal points exist in the I-Q plane while not overlapping one another.

This is attributed to the following fact. That is, the receiver performs the detection and the error correction decoding using signal $z_1(t)$ ($z_1(i)$) in the case that a modulated signal transmitted from the antenna for transmitting signal $z_2(t)$ ($z_2(i)$) does not reach the receiver, and it is necessary at that time that the 1024 signal points exist in the I-Q plane while not overlapping one another in order that the receiver obtains the high data reception quality.

Figure 12:
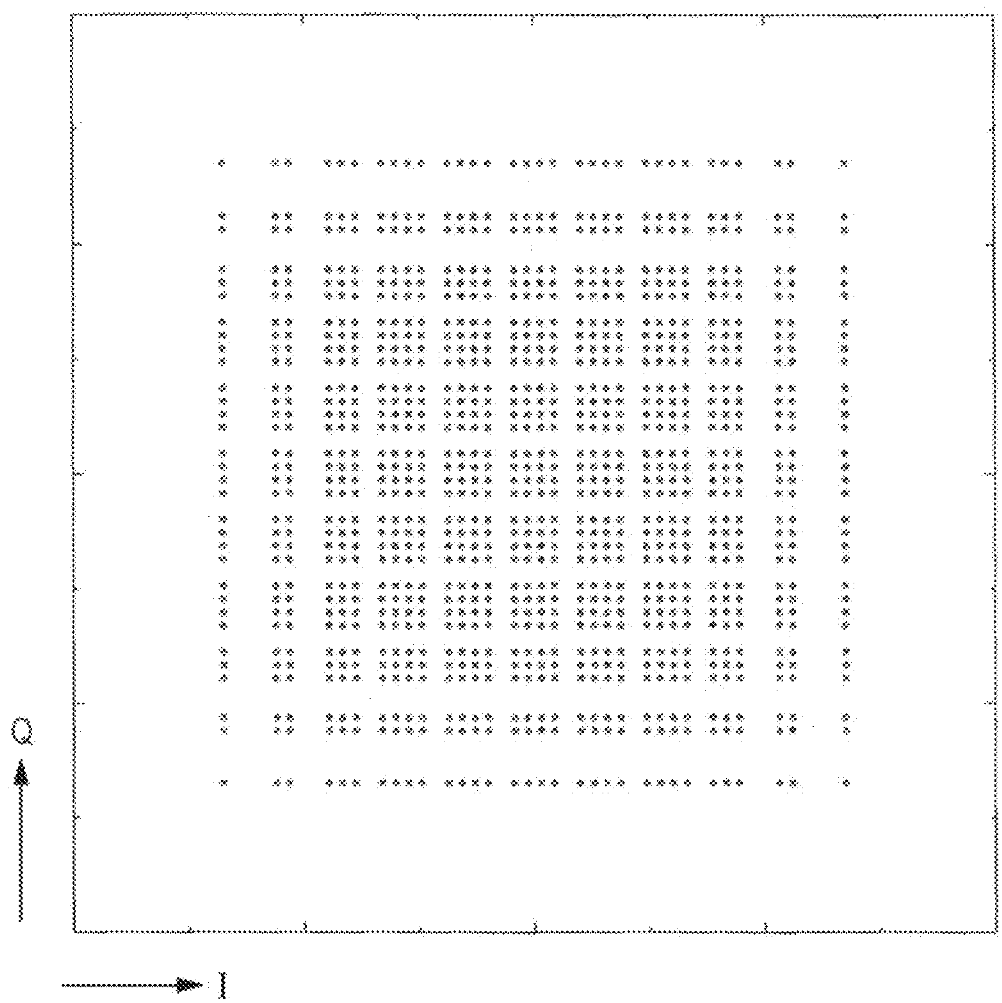
FIG. 12 is a view illustrating an arrangement example of the signal points in the I-Q plane.

In the case that precoding matrix F is set to one of equations (S14), (S15), (S16), and (S17), and that α is set to one of equations (S18), (S19), (S20), and (S21), the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 12 in signal $u_1(t)$ ($u_1(i)$) of configuration example R1 on the I-Q plane. In FIG. 12, a horizontal axis indicates I, and a vertical axis indicates Q, and a mark "●" indicates a signal point.

As can be seen from FIG. 12, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

Figure 13:
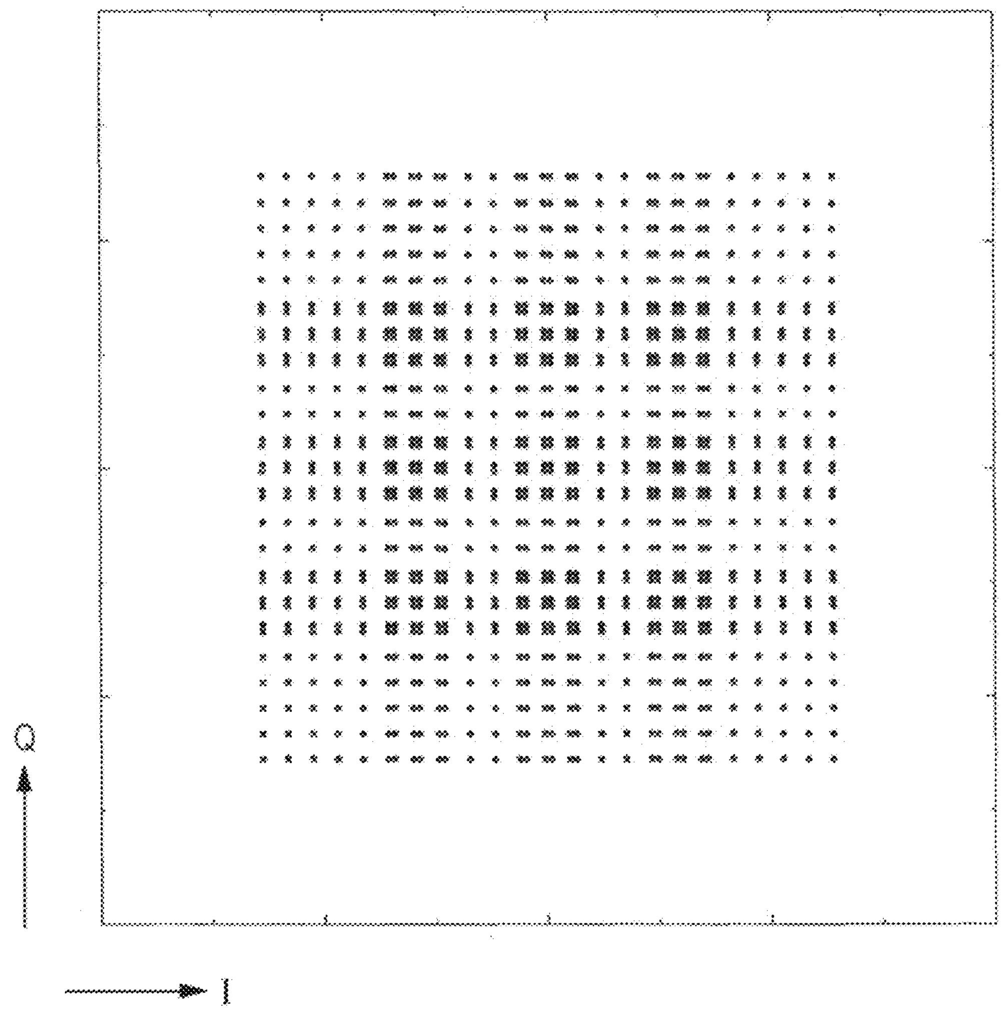
FIG. 13 is a view illustrating an arrangement example of the signal points in the I-Q plane.

In the case that precoding matrix F is set to one of equations (S14), (S15), (S16), and (S17), and that α is set to one of equations (S18), (S19), (S20), and (S21), the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 13 in signal $u_2(t)$ ($u_2(i)$) of configuration example R1 on the I-Q plane. In FIG. 13, a horizontal axis indicates I, and a vertical axis indicates Q, and a mark "●" indicates a signal point.

As can be seen from FIG. 13, the 1024 signal points exist while not overlapping one another. Therefore, the receiver has a high possibility of obtaining the high reception quality.

It is assumed that $D_1$ is a minimum Euclidean distance at the 1024 signal points in FIG. 12, and that $D_2$ is a minimum Euclidean distance at the 1024 signal points in FIG. 13. $D_1>D_2$ holds. Accordingly, from configuration example R1, it is necessary that $Q_1>Q_2$ holds for $Q_1 \neq Q_2$ in equations (s2), (S3), (S4), (S5), and (S8).

Example 1-2

Then, equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 61]

$$F = \begin{pmatrix} \beta\times\cos\theta & \beta\times\sin\theta \\ \beta\times\sin\theta & -\beta\times\cos\theta \end{pmatrix} \quad \text{Formula (S22)}$$

or

[Mathematical formula 62]

$$F = \begin{pmatrix} \cos\theta & \sin\theta \\ \sin\theta & -\cos\theta \end{pmatrix} \quad \text{Formula (S23)}$$

or

[Mathematical formula 63]

$$F = \begin{pmatrix} \beta\times\cos\theta & -\beta\times\sin\theta \\ \beta\times\sin\theta & \beta\times\cos\theta \end{pmatrix} \quad \text{Formula (S24)}$$

or

[Mathematical formula 64]

$$F = \begin{pmatrix} \cos\theta & -\sin\theta \\ \sin\theta & \cos\theta \end{pmatrix} \quad \text{Formula (S25)}$$

In equations (S22) and (S24), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 65]

$$\theta = \tan^{-1}\left(\frac{\sqrt{42}}{\sqrt{10}}\times\frac{5}{4}\right) \text{ or } \tan^{-1}\left(\frac{\sqrt{42}}{\sqrt{10}}\times\frac{5}{4}\right)+2n\pi(\text{radian}) \quad \text{Formula (S26)}$$

or

[Mathematical formula 66]

$$\theta = \pi+\tan^{-1}\left(\frac{\sqrt{42}}{\sqrt{10}}\times\frac{5}{4}\right) \text{ or } \pi+\tan^{-1}\left(\frac{\sqrt{42}}{\sqrt{10}}\times\frac{5}{4}\right)+2n\pi(\text{radian}) \quad \text{Formula (S27)}$$

or

[Mathematical formula 67]

$$\theta = \tan^{-1}\left(-\frac{\sqrt{42}}{\sqrt{10}}\times\frac{5}{4}\right) \text{ or } \tan^{-1}\left(-\frac{\sqrt{42}}{\sqrt{10}}\times\frac{5}{4}\right)+2n\pi(\text{radian}) \quad \text{Formula (S28)}$$

or

[Mathematical formula 68]

$$\theta = \pi+\tan^{-1}\left(-\frac{\sqrt{42}}{\sqrt{10}}\times\frac{5}{4}\right) \text{ or } \pi+\tan^{-1}\left(-\frac{\sqrt{42}}{\sqrt{10}}\times\frac{5}{4}\right)+2n\pi(\text{radian}) \quad \text{Formula (S29)}$$

In equations (S26), (S27), (S28), and (S29), $\tan^{-1}(x)$ is an inverse trigonometric function) (an inverse function of a trigonometric function in which a domain is properly restricted), and $\tan^{-1}(x)$ is given as follows.

[Mathematical formula 69]

$$-\frac{\pi}{2}(\text{radian}) < \tan^{-1}(x) < \frac{\pi}{2}(\text{radian}) \quad \text{Formula (S30)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S22), (S23), (S24), and (S25), and that θ is set to one of equations (S26), (S27), (S28), and (S29), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 12 in signal $u_1(t)$ ($u_1(i)$) of configuration example R1 on the I-Q plane. In FIG. 12, a horizontal axis indicates I, and a vertical axis indicates Q, and a mark "●" indicates a signal point.

As can be seen from FIG. 12, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S22), (S23), (S24), and (S25), and that θ is set to one of equations (S26), (S27), (S28), and (S29), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 13 in signal $u_2(t)$ ($u_2(i)$) of configuration example R1 on the I-Q plane. In FIG. 13, a horizontal axis indicates I, and a vertical axis indicates Q, and a mark "●" indicates a signal point.

As can be seen from FIG. 13, the 1024 signal points exist while not overlapping one another. Therefore, the receiver has a high possibility of obtaining the high reception quality.

It is assumed that $D_1$ is a minimum Euclidean distance at the 1024 signal points in FIG. 12, and that $D_2$ is a minimum Euclidean distance at the 1024 signal points in FIG. 13. $D_1 > D_2$ holds. Accordingly, from configuration example R1, it is necessary that $Q_1 > Q_2$ holds for $Q_1 \neq Q_2$ in equations (s2), (S3), (S4), (S5), and (S8).

Example 1-3

Equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2 = P_2^2$ in equation (s2)

<2> For $P_1^2 = P_2^2$ in equation (S3)

<3> For $P_1^2 = P_2^2$ in equation (S4)

<4> For equation (S5)

<5> For equation (S8)

[Mathematical formula 70]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S31)}$$

or

[Mathematical formula 71]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (S32)}$$

or

[Mathematical formula 72]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S33)}$$

or

[Mathematical formula 73]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{Formula (S34)}$$

In equations (S31), (S32), (S33), and (S34), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_1(t)$ ($z_1(i)$) in equations (s2), (S3), (S4), (S5), and (S8), the following equations are considered as value α with which the receiver obtains the good data reception quality.

When α is a real number:

[Mathematical formula 74]

$$\alpha = \frac{\sqrt{42}}{\sqrt{10}} \times \frac{4}{5} \quad \text{Formula (S35)}$$

or

[Mathematical formula 75]

$$\alpha = -\frac{\sqrt{42}}{\sqrt{10}} \times \frac{4}{5} \quad \text{Formula (S36)}$$

When α is an imaginary number:

[Mathematical formula 76]

$$\alpha = \frac{\sqrt{42}}{\sqrt{10}} \times \frac{4}{5} \times e^{j\frac{\pi}{2}} \quad \text{Formula S37)}$$

or

[Mathematical formula 77]

$$\alpha = \frac{\sqrt{42}}{\sqrt{10}} \times \frac{4}{5} \times e^{j\frac{3\pi}{2}} \quad \text{Formula (S38)}$$

Figure 14:
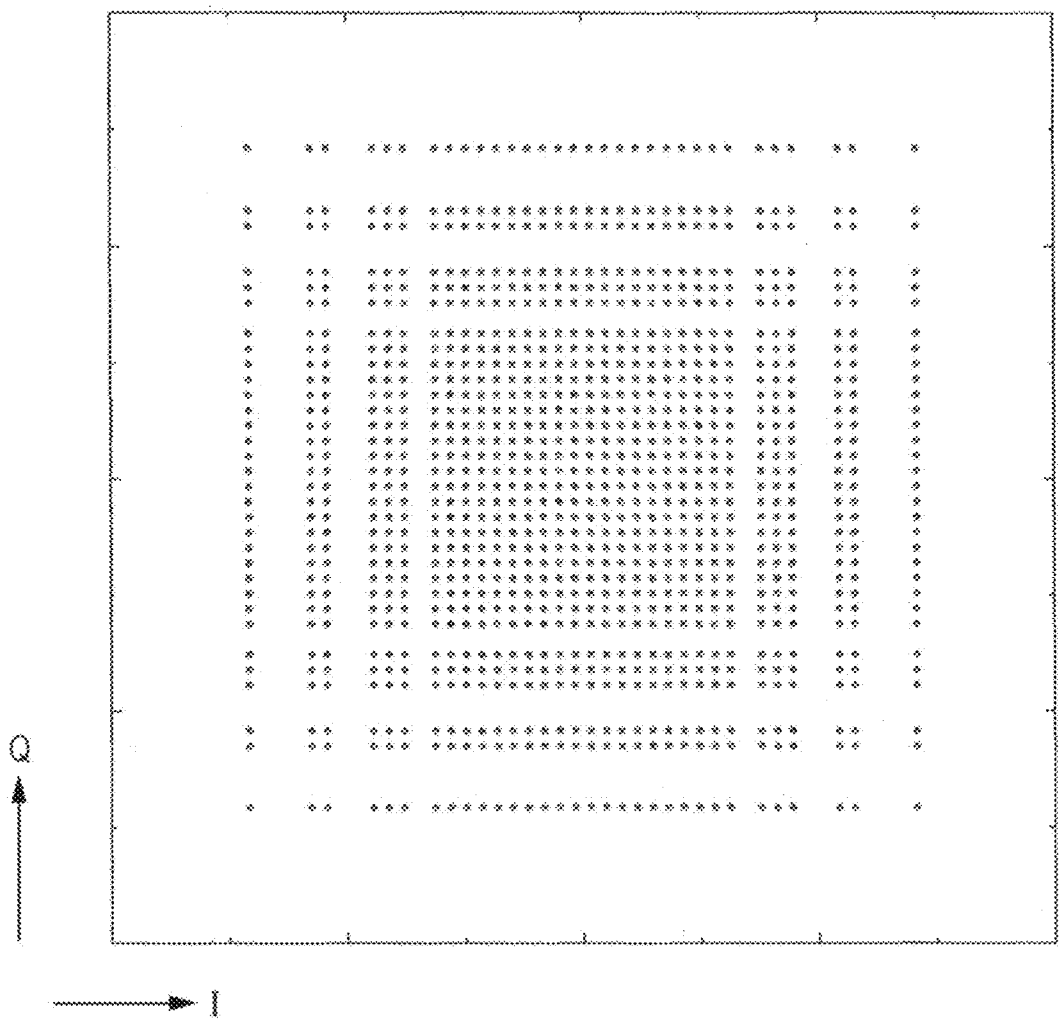
FIG. 14 is a view illustrating an arrangement example of the signal points in the I-Q plane.

In the case that precoding matrix F is set to one of equations (S31), (S32), (S33), and (S34), and that α is set to one of equations (S35), (S36), (S37), and (S38), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 14 in signal $u_1(t)$ ($u_1(i)$) of configuration example R1 on the I-Q plane. In FIG. 14, a horizontal axis indicates I, and a vertical axis indicates Q, and a mark "●" indicates a signal point.

As can be seen from FIG. 14, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

Figure 15:
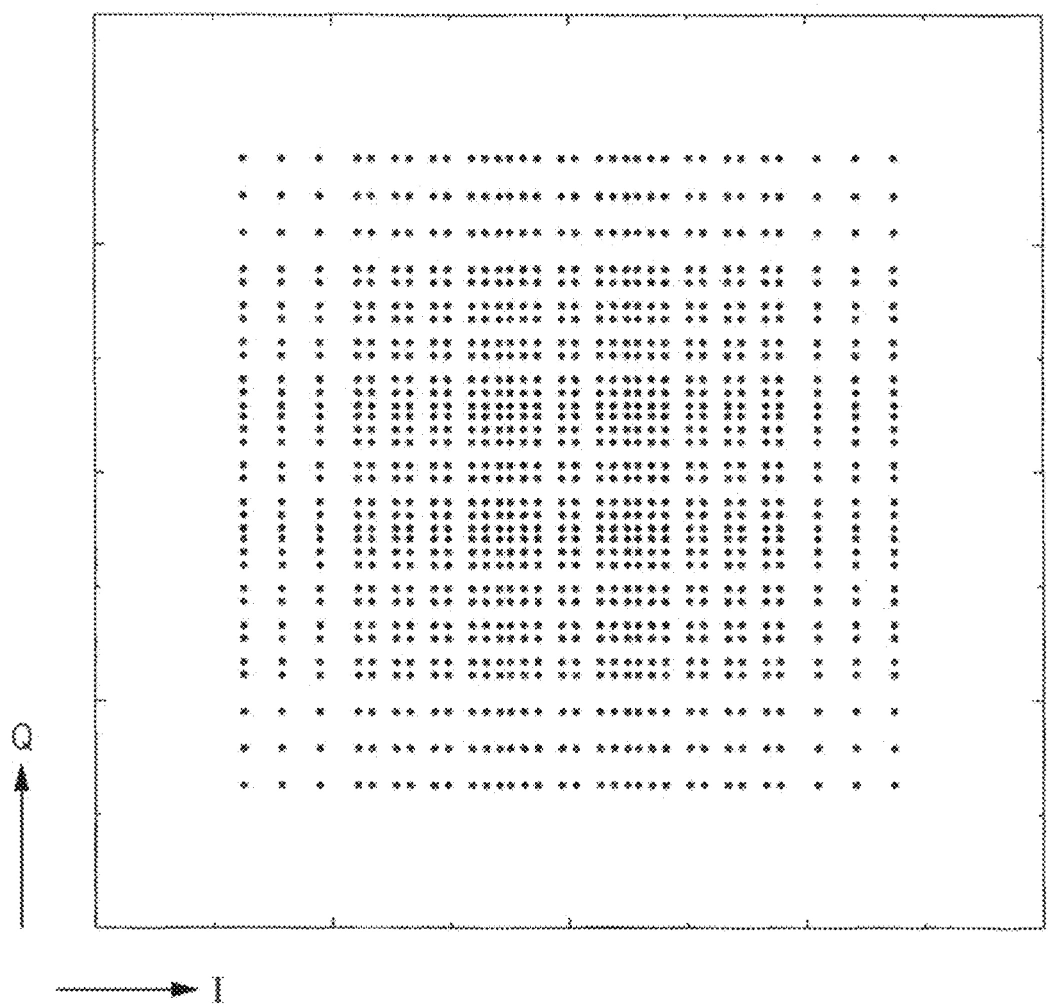
FIG. 15 is a view illustrating an arrangement example of the signal points in the I-Q plane.

In the case that precoding matrix F is set to one of equations (S31), (S32), (S33), and (S34), and that α is set to one of equations (S35), (S36), (S37), and (S38), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 15 in signal $u_2(t)$ ($u_2(i)$) of configuration example R1 on the I-Q plane. In FIG. 15, a horizontal axis indicates I, and a vertical axis indicates Q, and a mark "●" indicates a signal point.

As can be seen from FIG. 15, the 1024 signal points exist while not overlapping one another. Therefore, the receiver has a high possibility of obtaining the high reception quality.

It is assumed that $D_1$ is a minimum Euclidean distance at the 1024 signal points in FIG. 14, and that $D_2$ is a minimum Euclidean distance at the 1024 signal points in FIG. 15. $D_1>D_2$ holds. Accordingly, from configuration example R1, it is necessary that $Q_1>Q_2$ holds for $Q_1\neq Q_2$ in equations (s2), (S3), (S4), (S5), and (S8).

Example 1-4

Then, equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

[Mathematical formula 78]

$$F=\begin{pmatrix}\beta\times\cos\theta & \beta\times\sin\theta\\ \beta\times\sin\theta & -\beta\times\cos\theta\end{pmatrix}\quad\text{Formula (S39)}$$

or

[Mathematical formula 79]

$$F=\begin{pmatrix}\cos\theta & \sin\theta\\ \sin\theta & -\cos\theta\end{pmatrix}\quad\text{Formula (S40)}$$

-continued or

[Mathematical formula 80]

$$F=\begin{pmatrix}\beta\times\cos\theta & -\beta\times\sin\theta\\ \beta\times\sin\theta & \beta\times\cos\theta\end{pmatrix}\quad\text{Formula (S41)}$$

or

[Mathematical formula 81]

$$F=\begin{pmatrix}\cos\theta & -\sin\theta\\ \sin\theta & \cos\theta\end{pmatrix}\quad\text{Formula (S42)}$$

In equations (S39) and (S41), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 82]

$$\theta=\tan^{-1}\left(\frac{\sqrt{42}}{\sqrt{10}}\times\frac{4}{5}\right)\text{ or }\tan^{-1}\left(\frac{\sqrt{42}}{\sqrt{10}}\times\frac{4}{5}\right)+2n\pi(\text{radian})\quad\text{Formula (S43)}$$

or

[Mathematical formula 83]

$$\theta=\pi+\tan^{-1}\left(\frac{\sqrt{42}}{\sqrt{10}}\times\frac{4}{5}\right)\text{ or }\pi+\tan^{-1}\left(\frac{\sqrt{42}}{\sqrt{10}}\times\frac{4}{5}\right)+2n\pi(\text{radian})\quad\text{Formula (S44)}$$

or

[Mathematical formula 84]

$$\theta=\tan^{-1}\left(-\frac{\sqrt{42}}{\sqrt{10}}\times\frac{4}{5}\right)\text{ or }\tan^{-1}\left(-\frac{\sqrt{42}}{\sqrt{10}}\times\frac{4}{5}\right)+2n\pi(\text{radian})\quad\text{Formula (S45)}$$

or

[Mathematical formula 85]

$$\theta=\pi+\tan^{-1}\left(-\frac{\sqrt{42}}{\sqrt{10}}\times\frac{4}{5}\right)\text{ or }\pi+\tan^{-1}\left(-\frac{\sqrt{42}}{\sqrt{10}}\times\frac{4}{5}\right)+2n\pi(\text{radian})\quad\text{Formula (S46)}$$

In equations (S43), (S44), (S45), and (S46), $\tan^{-1}(x)$ is an inverse trigonometric function) (an inverse function of a trigonometric function in which a domain is properly restricted), and $\tan^{-1}(x)$ is given as follows.

[Mathematical formula 86]

$$-\frac{\pi}{2}(\text{radian})<\tan^{-1}(x)<\frac{\pi}{2}(\text{radian})\quad\text{Formula (S47)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S39), (S40), (S41), and (S42), and that θ is set to one of equations (S43), (S44), (S45), and (S46), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 14 in signal $u_1(t)$ ($u_1(i)$) of configuration example R1 on the I-Q plane. In FIG. 14, a horizontal axis indicates I, and a vertical axis indicates Q, and a mark "●" indicates a signal point.

As can be seen from FIG. 14, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S39), (S40), (S41), and (S42), and that θ is set to one of equations (S43), (S44), (S45), and (S46), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 15 in signal $u_2(t)$ ($u_2(i)$) of configuration example R1 on the I-Q plane. In FIG. 15, a horizontal axis indicates I, and a vertical axis indicates Q, and a mark "●" indicates a signal point.

As can be seen from FIG. 15, the 1024 signal points exist while not overlapping one another. Therefore, the receiver has a high possibility of obtaining the high reception quality.

It is assumed that $D_1$ is a minimum Euclidean distance at the 1024 signal points in FIG. 14, and that $D_2$ is a minimum Euclidean distance at the 1024 signal points in FIG. 15. $D_1>D_2$ holds. Accordingly, from configuration example R1, it is necessary that $Q_1>Q_2$ holds for $Q_1\neq Q_2$ in equations (s2), (S3), (S4), (S5), and (S8).

Example 1-5

Equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 87]

$$F=\begin{pmatrix}\beta\times e^{j0} & \beta\times\alpha\times e^{j0}\\ \beta\times\alpha\times e^{j0} & \beta\times e^{j\pi}\end{pmatrix}\quad\text{Formula (S48)}$$

or

-continued

[Mathematical formula 88]

$$F=\frac{1}{\sqrt{\alpha^2+1}}\begin{pmatrix}e^{j0} & \alpha\times e^{j0}\\ \alpha\times e^{j0} & e^{j\pi}\end{pmatrix}\quad\text{Formula (S49)}$$

or

[Mathematical formula 89]

$$F=\begin{pmatrix}\beta\times e^{j0} & \beta\times\alpha\times e^{j\pi}\\ \beta\times\alpha\times e^{j0} & \beta\times e^{j0}\end{pmatrix}\quad\text{Formula (S50)}$$

or

[Mathematical formula 90]

$$F=\frac{1}{\sqrt{\alpha^2+1}}\begin{pmatrix}e^{j0} & \alpha\times e^{j\pi}\\ \alpha\times e^{j0} & e^{j0}\end{pmatrix}\quad\text{Formula (S51)}$$

In equations (S48), (S49), (S50), and (S51), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_2(t)$ ($z_2(i)$) in equations (s2), (S3), (S4), (S5), and (S8), the following equations are considered as value α with which the receiver obtains the good data reception quality.

When α is a real number:

[Mathematical formula 91]

$$\alpha=\frac{\sqrt{10}}{\sqrt{42}}\times\frac{5}{4}\quad\text{Formula (S52)}$$

or

[Mathematical formula 92]

$$\alpha=-\frac{\sqrt{10}}{\sqrt{42}}\times\frac{5}{4}\quad\text{Formula (S53)}$$

When α is an imaginary number:

[Mathematical formula 93]

$$\alpha=\frac{\sqrt{10}}{\sqrt{42}}\times\frac{5}{4}\times e^{j\frac{\pi}{2}}\quad\text{Formula (S54)}$$

or

[Mathematical formula 94]

$$\alpha=\frac{\sqrt{10}}{\sqrt{42}}\times\frac{5}{4}\times e^{j\frac{3\pi}{2}}\quad\text{Formula (S55)}$$

Figure 16:
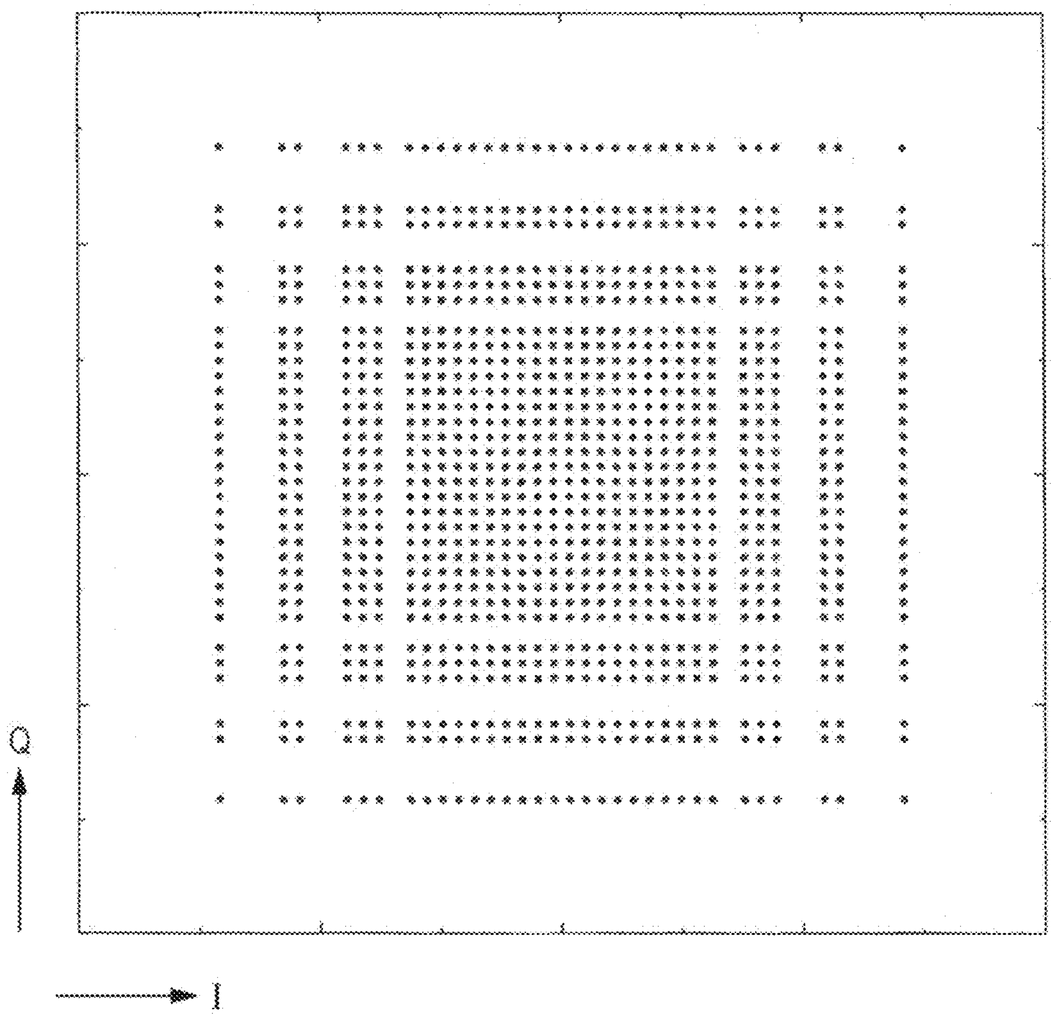
FIG. 16 is a view illustrating an arrangement example of the signal points in the I-Q plane.

In the case that precoding matrix F is set to one of equations (S48), (S49), (S50), and (S51), and that α is set to one of equations (S52), (S53), (S54), and (S55), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 16 in signal $u_2(t)$ ($u_2(i)$) of configuration example R1 on the I-Q plane. In FIG. 16, a horizontal axis indicates I, and a vertical axis indicates Q, and a mark "●" indicates a signal point.

As can be seen from FIG. 16, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

Figure 17:
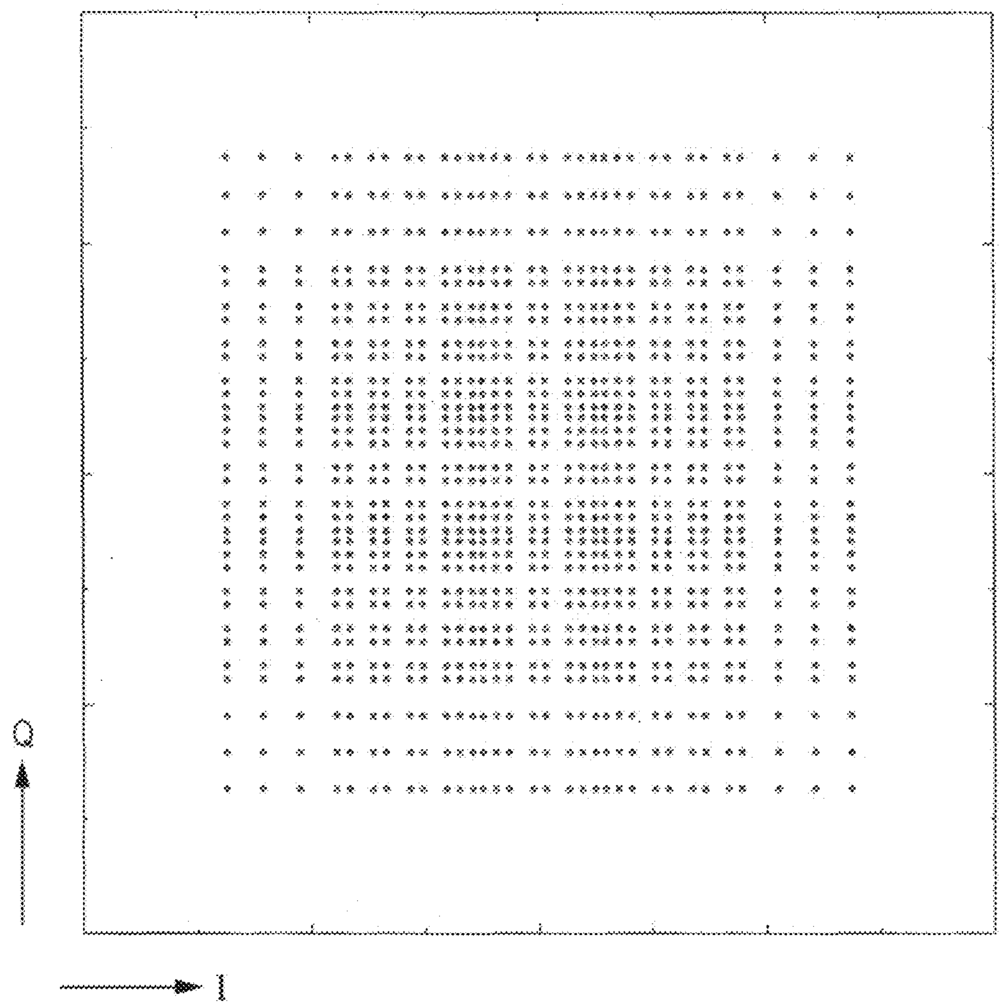
FIG. 17 is a view illustrating an arrangement example of the signal points in the I-Q plane.

In the case that precoding matrix F is set to one of equations (S48), (S49), (S50), and (S51), and that α is set to one of equations (S52), (S53), (S54), and (S55), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 17 in signal $u_1(t)$ ($u_1(i)$) of configuration example R1 on the I-Q plane. In FIG. 17, a horizontal axis indicates I, and a vertical axis indicates Q, and a mark "●" indicates a signal point.

As can be seen from FIG. 17, the 1024 signal points exist while not overlapping one another. Therefore, the receiver has a high possibility of obtaining the high reception quality.

It is assumed that $D_2$ is a minimum Euclidean distance at the 1024 signal points in FIG. 16, and that $D_1$ is a minimum Euclidean distance at the 1024 signal points in FIG. 17. $D_1<D_2$ holds. Accordingly, from configuration example R1, it is necessary that $Q_1<Q_2$ holds for $Q_1\neq Q_2$ in equations (s2), (S3), (S4), (S5), and (S8).

Example 1-6

Then, equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 95]

$$F=\begin{pmatrix}\beta\times\cos\theta & \beta\times\sin\theta\\ \beta\times\sin\theta & -\beta\times\cos\theta\end{pmatrix}\qquad\text{Formula (S56)}$$

or

[Mathematical formula 96]

$$F=\begin{pmatrix}\cos\theta & \sin\theta\\ \sin\theta & -\cos\theta\end{pmatrix}\qquad\text{Formula (S57)}$$

or

[Mathematical formula 97]

$$F=\begin{pmatrix}\beta\times\cos\theta & -\beta\times\sin\theta\\ \beta\times\sin\theta & \beta\times\cos\theta\end{pmatrix}\qquad\text{Formula (S58)}$$

or

-continued

[Mathematical formula 98]

$$F=\begin{pmatrix}\cos\theta & -\sin\theta\\ \sin\theta & \cos\theta\end{pmatrix}\qquad\text{Formula (S59)}$$

In equations (S56) and (S58), β may be either a real number or an imaginary number. However, β is not 0 (zero).

At this point, value θ with which the receiver obtains the good data reception quality is considered.

With respect to signal $z_2(t)$ ($z_2(i)$) in equations (s2), (S3), (S4), (S5), and (S8), the following equations are considered as value θ with which the receiver obtains the good data reception quality.

[Mathematical formula 99]

$$\theta=\tan^{-1}\left(\frac{\sqrt{10}}{\sqrt{42}}\times\frac{5}{4}\right)\text{ or }\tan^{-1}\left(\frac{\sqrt{10}}{\sqrt{42}}\times\frac{5}{4}\right)+2n\pi\text{ (radian)}\qquad\text{Formula (S60)}$$

or

[Mathematical formula 100]

$$\theta=\pi+\tan^{-1}\left(\frac{\sqrt{10}}{\sqrt{42}}\times\frac{5}{4}\right)\text{ or }\pi+\tan^{-1}\left(\frac{\sqrt{10}}{\sqrt{42}}\times\frac{5}{4}\right)+2n\pi\text{ (radian)}\qquad\text{Formula (S61)}$$

or

[Mathematical formula 101]

$$\theta=\tan^{-1}\left(-\frac{\sqrt{10}}{\sqrt{42}}\times\frac{5}{4}\right)\text{ or }\tan^{-1}\left(-\frac{\sqrt{10}}{\sqrt{42}}\times\frac{5}{4}\right)+2n\pi\text{ (radian)}\qquad\text{Formula (S62)}$$

or

[Mathematical formula 102]

$$\theta=\pi+\tan^{-1}\left(-\frac{\sqrt{10}}{\sqrt{42}}\times\frac{5}{4}\right)\text{ or }\pi+\tan^{-1}\left(-\frac{\sqrt{10}}{\sqrt{42}}\times\frac{5}{4}\right)+2n\pi\text{ (radian)}\qquad\text{Formula (S63)}$$

In equations (S60), (S61), (S62), and (S63), $\tan^{-1}(x)$ is an inverse trigonometric function) (an inverse function of a trigonometric function in which a domain is properly restricted), and $\tan^{-1}(x)$ is given as follows.

[Mathematical formula 103]

$$-\frac{\pi}{2}\text{ (radian)}<\tan^{-1}(x)<\frac{\pi}{2}\text{ (radian)}\qquad\text{Formula (S64)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S56), (S57), (S58), and (S59), and that θ is set to one of equations (S60), (S61), (S62), and (S63), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 16 in signal $u_2(t)$ ($u_2(i)$) of configuration example R1 on the I-Q plane. In FIG. 16, a horizontal axis indicates I, and a vertical axis indicates Q, and a mark "●" indicates a signal point.

As can be seen from FIG. 16, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S56), (S57), (S58), and (S59), and that θ is set to one of equations (S60), (S61), (S62), and (S63), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 17 in signal $u_1(t)$ ($u_1(i)$) of configuration example R1 on the I-Q plane. In FIG. 17, a horizontal axis indicates I, and a vertical axis indicates Q, and a mark "●" indicates a signal point.

As can be seen from FIG. 17, the 1024 signal points exist while not overlapping one another. Therefore, the receiver has a high possibility of obtaining the high reception quality.

It is assumed that $D_2$ is a minimum Euclidean distance at the 1024 signal points in FIG. 16, and that $D_1$ is a minimum Euclidean distance at the 1024 signal points in FIG. 17. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 1-7

Equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 104]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S65)}$$

or

[Mathematical formula 105]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{Formula (S66)}$$

or

-continued

[Mathematical formula 106]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S67)}$$

or

[Mathematical formula 107]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{Formula (S68)}$$

In equations (S65), (S66), (S67), and (S68), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_2(t)$ ($z_2(i)$) in equations (s2), (S3), (S4), (S5), and (S8), the following equations are considered as value α with which the receiver obtains the good data reception quality.

When α is a real number:

[Mathematical formula 108]

$$\alpha = \frac{\sqrt{10}}{\sqrt{42}} \times \frac{4}{5} \quad \text{Formula (S69)}$$

or

[Mathematical formula 109]

$$\alpha = \frac{\sqrt{10}}{\sqrt{42}} \times \frac{4}{5} \quad \text{Formula (S70)}$$

When α is an imaginary number:

[Mathematical formula 110]

$$\alpha = \frac{\sqrt{10}}{\sqrt{42}} \times \frac{4}{5} \times e^{j\frac{\pi}{2}} \quad \text{Formula (S71)}$$

or

[Mathematical formula 111]

$$\alpha = \frac{\sqrt{10}}{\sqrt{42}} \times \frac{4}{5} \times e^{j\frac{3\pi}{2}} \quad \text{Formula (S72)}$$

Figure 18:
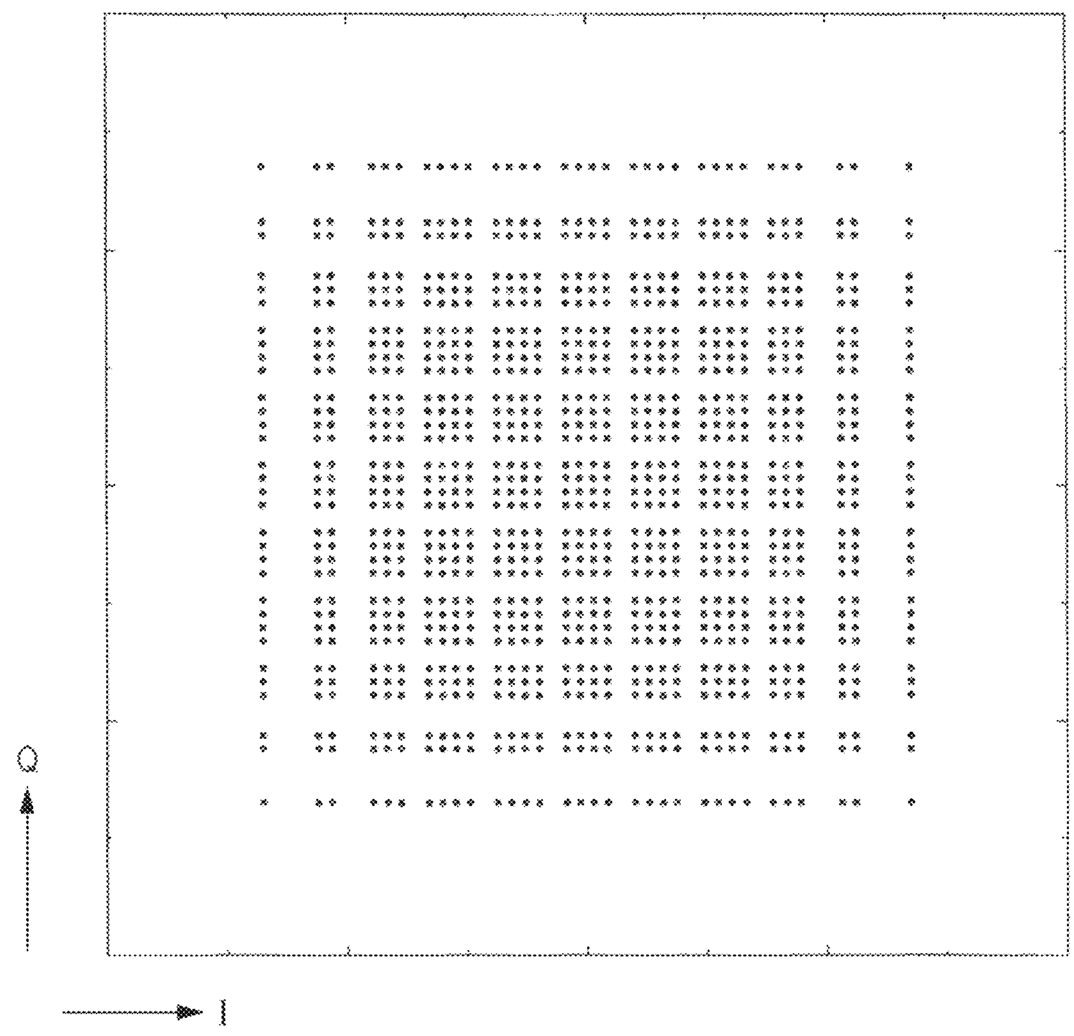
FIG. 18 is a view illustrating an arrangement example of the signal points in the I-Q plane.

In the case that precoding matrix F is set to one of equations (S65), (S66), (S67), and (S68), and that α is set to one of equations (S69), (S70), (S71), and (S72), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 18 in signal $u_2(t)$ ($u_2(i)$) of configuration example R1 on the I-Q plane. In FIG. 18, a horizontal axis indicates I, and a vertical axis indicates Q, and a mark "●" indicates a signal point.

As can be seen from FIG. 18, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

Figure 19:
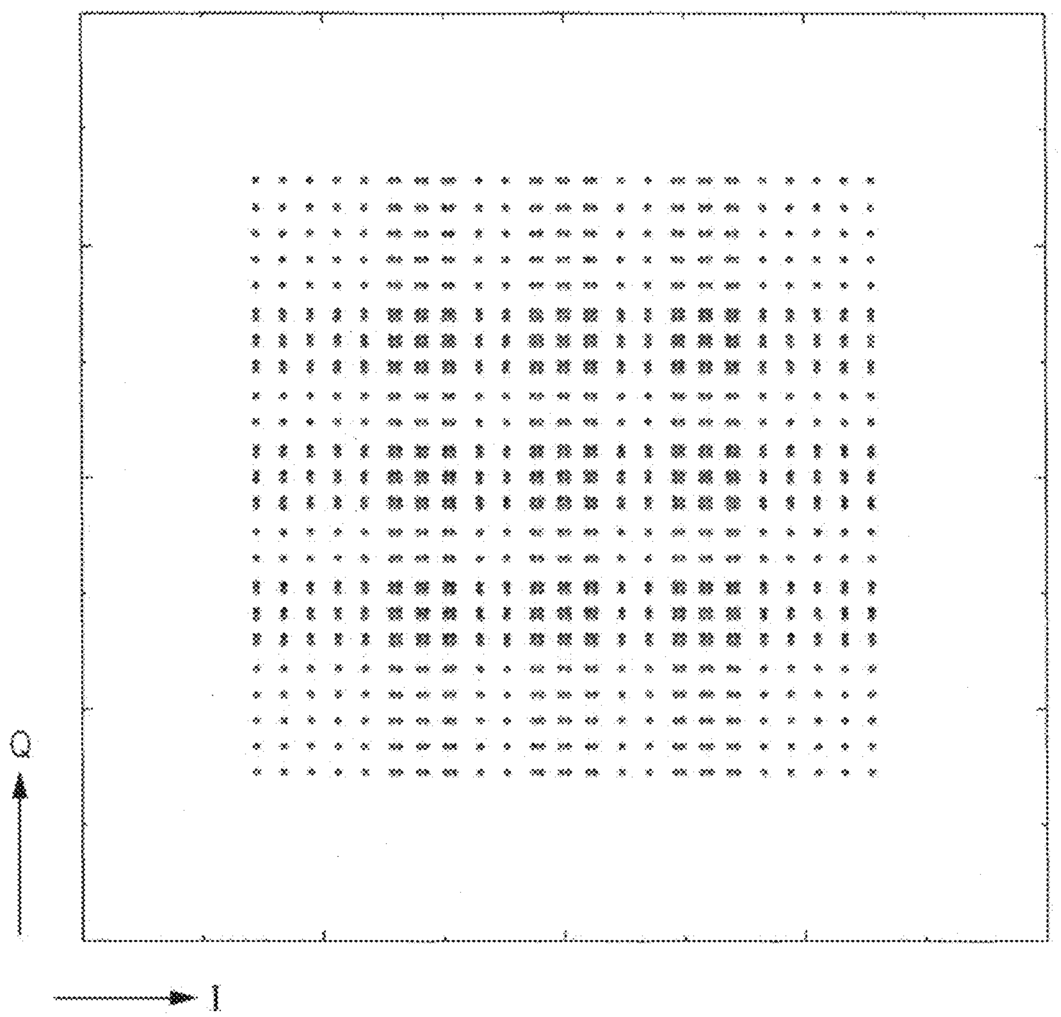
FIG. 19 is a view illustrating an arrangement example of the signal points in the I-Q plane.

In the case that precoding matrix F is set to one of equations (S65), (S66), (S67), and (S68), and that α is set to one of equations (S69), (S70), (S71), and (S72), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 19 in signal $u_1(t)$ ($u_1(i)$) of configuration example R1 on the I-Q plane. In FIG. 19, a horizontal axis indicates I, and a vertical axis indicates Q, and a mark "●" indicates a signal point.

As can be seen from FIG. 19, the 1024 signal points exist while not overlapping one another. Therefore, the receiver has a high possibility of obtaining the high reception quality.

It is assumed that $D_2$ is a minimum Euclidean distance at the 1024 signal points in FIG. 18, and that $D_1$ is a minimum Euclidean distance at the 1024 signal points in FIG. 19. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 1-8

Then, equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

[Mathematical formula 112]

$$F=\begin{pmatrix}\beta\times\cos\theta & \beta\times\sin\theta\\ \beta\times\sin\theta & -\beta\times\cos\theta\end{pmatrix}\qquad \text{Formula (S73)}$$

or

[Mathematical formula 113]

$$F=\begin{pmatrix}\cos\theta & \sin\theta\\ \sin\theta & -\cos\theta\end{pmatrix}\qquad \text{Formula (S74)}$$

or

[Mathematical formula 114]

$$F=\begin{pmatrix}\beta\times\cos\theta & -\beta\times\sin\theta\\ \beta\times\sin\theta & \beta\times\cos\theta\end{pmatrix}\qquad \text{Formula (S75)}$$

or

[Mathematical formula 115]

$$F=\begin{pmatrix}\cos\theta & -\sin\theta\\ \sin\theta & \cos\theta\end{pmatrix}\qquad \text{Formula (S76)}$$

In equations (S73) and (S75), β may be either a real number or an imaginary number. However, β is not 0 (zero).

At this point, value θ with which the receiver obtains the good data reception quality is considered.

With respect to signal $z_2(t)$ ($z_2(i)$) in equations (s2), (S3), (S4), (S5), and (S8), the following equations are considered as value θ with which the receiver obtains the good data reception quality.

[Mathematical formula 116]

$$\theta=\tan^{-1}\left(\frac{\sqrt{10}}{\sqrt{42}}\times\frac{4}{5}\right)\text{ or }\tan^{-1}\left(\frac{\sqrt{10}}{\sqrt{42}}\times\frac{4}{5}\right)+2n\pi\text{ (radian) or}\qquad \text{Formula (S77)}$$

[Mathematical formula 117]

$$\theta=\pi+\tan^{-1}\left(\frac{\sqrt{10}}{\sqrt{42}}\times\frac{4}{5}\right)\text{ or }\pi+\tan^{-1}\left(\frac{\sqrt{10}}{\sqrt{42}}\times\frac{4}{5}\right)+2n\pi\text{ (radian) or}\qquad \text{Formula (S78)}$$

[Mathematical formula 118]

$$\theta=\tan^{-1}\left(-\frac{\sqrt{10}}{\sqrt{42}}\times\frac{4}{5}\right)\text{ or }\tan^{-1}\left(-\frac{\sqrt{10}}{\sqrt{42}}\times\frac{4}{5}\right)+2n\pi\text{ (radian) or}\qquad \text{Formula (S79)}$$

[Mathematical formula 119]

$$\theta=\pi+\tan^{-1}\left(-\frac{\sqrt{10}}{\sqrt{42}}\times\frac{4}{5}\right)\text{ or }\pi+\tan^{-1}\left(-\frac{\sqrt{10}}{\sqrt{42}}\times\frac{4}{5}\right)+2n\pi\text{ (radian)}\qquad \text{Formula (S80)}$$

In equations (S77), (S78), (S79), and (S80), $\tan^{-1}(x)$ is an inverse trigonometric function) (an inverse function of a trigonometric function in which a domain is properly restricted), and $\tan^{-1}(x)$ is given as follows.

[Mathematical formula 120]

$$-\frac{\pi}{2}\text{ (radian)}<\tan^{-1}(x)<\frac{\pi}{2}\text{ (radian)}\qquad \text{Formula (S81)}$$

"$\tan^{-1}(x)$" may also be referred to as "$\text{Tan}^{-1}(x)$", "arctan (x)", or "Arctan(x)", and n is an integer.

In the case that precoding matrix F is set to one of equations (S73), (S74), (S75), and (S76), and that θ is set to one of equations (S77), (S78), (S79), and (S80), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 18 in signal $u_2(t)$ ($u_2(i)$) of configuration example R1 on the I-Q plane. In FIG. 18, a horizontal axis indicates I, and a vertical axis indicates Q, and a mark "●" indicates a signal point.

As can be seen from FIG. 18, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S73), (S74), (S75), and (S76), and that θ is set to one of equations (S77), (S78), (S79), and (S80), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 19 in signal $u_1(t)$ ($u_1(i)$) of configuration example R1 on the I-Q plane. In FIG. 19, a horizontal axis indicates I, and a vertical axis indicates Q, and a mark "●" indicates a signal point.

As can be seen from FIG. 19, the 1024 signal points exist while not overlapping one another. Therefore, the receiver has a high possibility of obtaining the high reception quality.

It is assumed that $D_2$ is a minimum Euclidean distance at the 1024 signal points in FIG. 18, and that $D_1$ is a minimum Euclidean distance at the 1024 signal points in FIG. 19. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 1-Supplement

Values α and θ having the possibility of achieving the high data reception quality are illustrated in (Example 1-1) to (Example 1-8). However, even if values α and θ are not those in (Example 1-1) to (Example 1-8), sometimes the high data reception quality is obtained by satisfying the condition of configuration example R1.

Example 2

In mapper 504 of FIGS. 5 to 7, the modulation scheme for obtaining $s_1(t)$ ($s_1(i)$) is set to 64QAM while the modulation scheme for obtaining $s_2(t)$ ($s_2(i)$) is set to 16QAM. An example of conditions associated with the configuration and power change of precoding matrix (F) when the precoding and/or the power change is performed on, for example, one of equations (s2), (S3), (S4), (S5), and (S8) will be described below.

The 16QAM mapping method will be described below. FIG. 10 illustrates an arrangement example of 16QAM signal points in the I-Q plane. In FIG. 10, 16 marks "○" indicate 16QAM signal points, a horizontal axis indicates I, and a vertical axis indicates Q.

In the I-Q plane, 16 signal points included in 16QAM (indicated by the marks "○" in FIG. 10) in the I-Q are obtained as follows. ($w_{16}$ is a real number larger than 0) $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16}, -3w_{16})$, $(-3w_{16},3w_{16})$, $(-3w_{16},w_{16})$, $(-3w_{16},-w_{16})$, $(-3w_{16},-3w_{16})$ At this point, the bits to be transmitted (input bits) are set to b0, b1, b2, and b3. For example, in the case that the bits to be transmitted is (b0, b1, b2, b3)=(0,0,0,0), the bits are mapped at signal point 1001 in FIG. 10, and $(I,Q)=(3w_{16}, 3w_{16})$ is obtained when I is an in-phase component while Q is a quadrature component of the mapped baseband signal.

Based on the bits to be transmitted (b0, b1, b2, b3), in-phase component I and quadrature component Q of the mapped baseband signal are decided (during 16QAM modulation). FIG. 10 illustrates an example of the relationship between the set of b0, b1, b2, and b3 (0000 to 1111) and the signal point coordinates. Values 0000 to 1111 of the set of b0, b1, b2, and b3 are indicated immediately below 16 signal points included in 16QAM (the marks "○" in FIG. 10) $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$. Respective coordinates of the signal points ("○") immediately above the values 0000 to 1111 of the set of b0, b1, b2, and b3 in the I-Q plane serve as in-phase component I and quadrature component Q of the mapped baseband signal. The relationship between the set of b0, b1, b2, and b3 (0000 to 1111) and the signal point coordinates during 16QAM modulation is not limited to that in FIG. 10. A complex value of in-phase component I and quadrature component Q of the mapped baseband signal (during 16QAM modulation) serves as a baseband signal ($s_1(t)$ or $s_2(t)$ in FIGS. 5 to 7).

The 64QAM mapping method will be described below. FIG. 11 illustrates an arrangement example of 64QAM signal points in the I-Q plane. In FIG. 11, 64 marks "○" indicate 64QAM signal points, a horizontal axis indicates I, and a vertical axis indicates Q.

In the I-Q plane, 64 signal points include in 64QAM (indicated by the marks "○" in FIG. 11) in the I-Q are obtained as follows. ($w_{64}$ is a real number larger than 0)

$(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64}-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$

At this point, the bits to be transmitted (input bits) are set to b0, b1, b2, b3, b4, and b5. For example, in the case that the bits to be transmitted is (b0, b1, b2, b3, b4, b5)=(0,0,0,0,0,0), the bits are mapped at signal point 1101 in FIG. 11, and $(I,Q)=(7w_{64},7w_{64})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 11 illustrates an example of a relationship between the set of b0, b1, b2, b3, b4, and b5 (000000 to 111111) and the signal point coordinates. Values 000000 to of the set of b0, b1, b2, b3, b4, and b5 are indicated immediately below 64 signal points included in 64QAM (the marks "○" in FIG. 11) $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{647}w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$. Respective coordinates of the signal points ("○") immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 11. A complex value of in-phase component I and quadrature component Q of the mapped baseband signal (during 64QAM modulation) serves as a baseband signal ($s_1(t)$ or $s_2(t)$ in FIGS. 5 to 7).

In this case, the modulation scheme of baseband signal 505A ($s_1(t)$ ($s_1(i)$)) is set to 64QAM while modulation scheme of baseband signal 505B ($s_2(t)$ ($s_2(i)$)) is set to 16QAM in FIG. 5 to FIG. 7. The configuration of the precoding matrix will be described below.

At this point, generally average power of baseband signal 505A ($s_1(t)$ and ($s_1(i)$)) and average power of baseband signal 505B ($s_2(t)$ and ($s_2(i)$)), which are of the output of mapper 504 in FIGS. 5 to 7, are equalized to each other. Accordingly, the following relational expression holds with respect to coefficient $w_{16}$ of the 16QAM mapping method and coefficient $w_{64}$ of the 64QAM mapping method.

[Mathematical formula 121]

$$w_{16} = \frac{z}{\sqrt{10}} \quad \text{(S82)}$$

[Mathematical formula 122]

$$w_{64} = \frac{z}{\sqrt{42}} \quad \text{(S83)}$$

In equations (S82) and (S83), it is assumed that z is a real number larger than 0. When the calculations are performed in <1> to <5>,
<1> For $P_1^2=P_2^2$ in equation (S2)
<2> For $P_1^2=P_2^2$ in equation (S3)
<3> For $P_1^2=P_2^2$ in equation (S4)
<4> For equation (S5)
<5> For equation (S8)
the configuration of precoding matrix F

[Mathematical formula 123]

$$F = \begin{pmatrix} a(i) & b(i) \\ c(i) & d(i) \end{pmatrix} \quad \text{(S84)}$$

and a relationship between $Q_1$ and $Q_2$ will be described in detail below ((Example 2-1) to (Example 2-8)).

Example 2-1

For one of <1> to <5>, precoding matrix F is set to one of the following equations.

[Mathematical formula 124]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S85)}$$

or

[Mathematical formula 125]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{Formula (S86)}$$

or

[Mathematical formula 126]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S87)}$$

or

[Mathematical formula 127]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{Formula (S88)}$$

In equations (S85), (S86), (S87), and (S88), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_2(t)$ ($z_2(i)$) in equations (s2), (S3), (S4), (S5), and (S8), the following equations are considered as value α with which the receiver obtains the good data reception quality.

When α is a real number:

[Mathematical formula 128]

$$\alpha = \frac{\sqrt{42}}{\sqrt{10}} \times \frac{5}{4} \quad \text{Formula (S89)}$$

or

[Mathematical formula 129]

$$\alpha = -\frac{\sqrt{42}}{\sqrt{10}} \times \frac{5}{4} \quad \text{Formula (S90)}$$

When α is an imaginary number:

[Mathematical formula 130]

$$\alpha = \frac{\sqrt{42}}{\sqrt{10}} \times \frac{5}{4} \times e^{j\frac{\pi}{2}} \quad \text{Formula (S91)}$$

or

[Mathematical formula 131]

$$\alpha = \frac{\sqrt{42}}{\sqrt{10}} \times \frac{5}{4} \times e^{j\frac{3\pi}{2}} \quad \text{Formula (S92)}$$

The modulation scheme of baseband signal 505A ($s_1(t)$ ($s_1(i)$)) is set to 64QAM while modulation scheme of baseband signal 505B ($s_2(t)$ ($s_2(i)$)) is set to 16QAM. Accordingly, the precoding (and the phase change and the power change) is performed to transmit the modulated signal from each antenna as described above, the total number of bits transmitted using symbols transmitted from antenna 808A and 808B in FIG. 8 at the (unit) time of time u and frequency (carrier) v is 10 bits that are of a sum of 4 bits (for the use of 16QAM) and 6 bits (for the use of 64QAM).

Assuming that $b_{0,16}$, $b_{1,16}$, $b_{2,16}$, and $b_{3,16}$ are input bits for the purpose of the 16QAM mapping, and that $b_{0,64}$, $b_{1,64}$, $b_{2,64}$, $b_{3,64}$, $b_{4,64}$ and $b_{5,64}$ are input bits for the purpose of the 64QAM mapping, even if value α in any one of equations (S89), (S90), (S91), and (S92) is used,
in signal $z_1(t)$ ($z_1(i)$),
the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) exist in the I-Q plane, similarly, in signal $z_2(t)$ ($z_2(i)$), the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) exist in the I-Q plane.

In the above description, with respect to signal $z_2(t)$ ($z_2(i)$) in equations (s2), (S3), (S4), (S5), and (S8), equations (S89) to (S92) are considered as value α with which the receiver obtains the good data reception quality. This point will be described below. In signal $z_2(t)$ ($z_2(i)$), the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) exist in the I-Q plane, and it is desirable that $2^{10}$=1024 signal points exist in the I-Q plane while not overlapping one another.

This is attributed to the following fact. That is, the receiver performs the detection and the error correction decoding using signal $z_2(t)$ ($z_2(i)$) in the case that a modulated signal transmitted from the antenna for transmitting signal $z_1(t)$ ($z_1(i)$) does not reach the receiver, and it is necessary at that time that the 1024 signal points exist in the I-Q plane while not overlapping one another in order that the receiver obtains the high data reception quality.

In the case that precoding matrix F is set to one of equations (S85), (S86), (S87), and (S88), and that α is set to one of equations (S89), (S90), (S91), and (S92), the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 16 in signal $u_2(t)$ ($u_2(i)$) of configuration example R1 on the I-Q plane. In FIG. 16, a horizontal axis indicates I, and a vertical axis indicates Q, and a mark "●" indicates a signal point.

As can be seen from FIG. 16, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S85), (S86), (S87), and (S88), and that α is set to one of equations (S89), (S90), (S91), and (S92), the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 17 in signal $u_1(t)$ ($u_1(i)$) of configuration example R1 on the I-Q plane. In FIG. 17, a horizontal axis indicates I, and a vertical axis indicates Q, and a mark "●" indicates a signal point.

As can be seen from FIG. 17, the 1024 signal points exist while not overlapping one another. Therefore, the receiver has a high possibility of obtaining the high reception quality.

It is assumed that $D_2$ is a minimum Euclidean distance at the 1024 signal points in FIG. 16, and that $D_1$ is a minimum Euclidean distance at the 1024 signal points in FIG. 17. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 2-2

Then, equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

[Mathematical formula 132]

$$F = \begin{pmatrix} \beta\times\cos\theta & \beta\times\sin\theta \\ \beta\times\sin\theta & -\beta\times\cos\theta \end{pmatrix} \quad \text{Formula (S93)}$$

or

[Mathematical formula 133]

$$F = \begin{pmatrix} \cos\theta & \sin\theta \\ \sin\theta & -\cos\theta \end{pmatrix} \quad \text{Formula (S94)}$$

or

[Mathematical formula 134]

$$F = \begin{pmatrix} \beta\times\cos\theta & -\beta\times\sin\theta \\ \beta\times\sin\theta & \beta\times\cos\theta \end{pmatrix} \quad \text{Formula (S95)}$$

or

[Mathematical formula 135]

$$F = \begin{pmatrix} \cos\theta & -\sin\theta \\ \sin\theta & \cos\theta \end{pmatrix} \quad \text{Formula (S96)}$$

In equations (S93) and (S95), β may be either a real number or an imaginary number. However, β is not 0 (zero).

At this point, value θ with which the receiver obtains the good data reception quality is considered.

With respect to signal $z_2(t)$ ($z_2(i)$) in equations (s2), (S3), (S4), (S5), and (S8), the following equations are considered as value θ with which the receiver obtains the good data reception quality.

[Mathematical formula 136]

$$\theta = \tan^{-1}\left(\frac{\sqrt{42}}{\sqrt{10}} \times \frac{5}{4}\right) \text{ or } \tan^{-1}\left(\frac{\sqrt{42}}{\sqrt{10}} \times \frac{5}{4}\right) + 2\pi(radian) \quad \text{Formula (S97)}$$

or

[Mathematical formula 137]

$$\theta = \pi + \tan^{-1}\left(\frac{\sqrt{42}}{\sqrt{10}} \times \frac{5}{4}\right) \text{ or } \pi + \tan^{-1}\left(\frac{\sqrt{42}}{\sqrt{10}} \times \frac{5}{4}\right) + 2\pi(radian) \quad \text{Formula (S98)}$$

or

[Mathematical formula 138]

$$\theta = \tan^{-1}\left(-\frac{\sqrt{42}}{\sqrt{10}} \times \frac{5}{4}\right) \text{ or } \tan^{-1}\left(-\frac{\sqrt{42}}{\sqrt{10}} \times \frac{5}{4}\right) + 2\pi(radian) \quad \text{Formula (S99)}$$

or

[Mathematical formula 139]

$$\theta = \pi + \tan^{-1}\left(-\frac{\sqrt{42}}{\sqrt{10}} \times \frac{5}{4}\right) \text{ or } \pi + \tan^{-1}\left(-\frac{\sqrt{42}}{\sqrt{10}} \times \frac{5}{4}\right) + 2\pi(radian) \quad \text{Formula (S100)}$$

In equations (S97), (S98), (S99), and (S100), $\tan^{-1}(x)$ is an inverse trigonometric function) (an inverse function of a trigonometric function in which a domain is properly restricted), and $\tan^{-1}(x)$ is given as follows.

[Mathematical formula 140]

$$-\frac{\pi}{2}(\text{radian}) < \tan^{-1}(x) < \frac{\pi}{2}(\text{radian}) \quad \text{Formula (S101)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S93), (S94), (S95), and (S96), and that θ is set to one of equations (S97), (S98), (S99), and (S100), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$ $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 16 in signal $u_2(t)$ ($u_2(i)$) of configuration example R1 on the I-Q plane. In FIG. 16, a horizontal axis indicates I, and a vertical axis indicates Q, and a mark "●" indicates a signal point.

As can be seen from FIG. 16, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S93), (S94), (S95), and (S96), and that θ is set to one of equations (S97), (S98), (S99), and (S100), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 17 in signal $u_1(t)$ ($u_1(i)$) of configuration example R1 on the I-Q plane. In FIG. 17, a horizontal axis indicates I, and a vertical axis indicates Q, and a mark "●" indicates a signal point.

As can be seen from FIG. 17, the 1024 signal points exist while not overlapping one another. Therefore, the receiver has a high possibility of obtaining the high reception quality.

It is assumed that $D_2$ is a minimum Euclidean distance at the 1024 signal points in FIG. 16, and that $D_1$ is a minimum Euclidean distance at the 1024 signal points in FIG. 17. $D_1 < D_2$ holds. Accordingly, from configuration example R1, it is necessary that $Q_1 < Q_2$ holds for $Q_1 \neq Q_2$ in equations (s2), (S3), (S4), (S5), and (S8).

Example 2-3

Equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2 = P_2^2$ in equation (s2)
<2> For $P_1^2 = P_2^2$ in equation (S3)
<3> For $P_1^2 = P_2^2$ in equation (S4)
<4> For equation (S5)
<5> For equation (S8)

[Mathematical formula 141]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S102)}$$

or

[Mathematical formula 142]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (S103)}$$

or

[Mathematical formula 143]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S104)}$$

or

[Mathematical formula 144]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{Formula (S105)}$$

In equations (S102), (S103), (S104), and (S105), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_2(t)$ ($z_2(i)$) in equations (s2), (S3), (S4), (S5), and (S8), the following equations are considered as value α with which the receiver obtains the good data reception quality.

When $\alpha$ is a real number:

[Mathematical formula 145]

$$\alpha = \frac{\sqrt{42}}{\sqrt{10}} \times \frac{4}{5} \quad \text{Formula (S106)}$$

or

[Mathematical formula 146]

$$\alpha = -\frac{\sqrt{42}}{\sqrt{10}} \times \frac{4}{5} \quad \text{Formula (S107)}$$

When $\alpha$ is an imaginary number:

[Mathematical formula 147]

$$\alpha = \frac{\sqrt{42}}{\sqrt{10}} \times \frac{4}{5} \times e^{j\frac{\pi}{2}} \quad \text{Formula (S108)}$$

or

[Mathematical formula 148]

$$\alpha = \frac{\sqrt{42}}{\sqrt{10}} \times \frac{4}{5} \times e^{j\frac{3\pi}{2}} \quad \text{Formula (S109)}$$

In the case that precoding matrix F is set to one of equations (S102), (S103), (S104), and (S105), and that $\alpha$ is set to one of equations (S106), (S107), (S108), and (S109), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 18 in signal $u_2(t)$ ($u_2(i)$) of configuration example R1 on the I-Q plane. In FIG. 18, a horizontal axis indicates I, and a vertical axis indicates Q, and a mark "●" indicates a signal point.

As can be seen from FIG. 18, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S102), (S103), (S104), and (S105), and that $\alpha$ is set to one of equations (S106), (S107), (S108), and (S109), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 19 in signal $u_1(t)$ ($u_1(i)$) of configuration example R1 on the I-Q plane. In FIG. 19, a horizontal axis indicates I, and a vertical axis indicates Q, and a mark "●" indicates a signal point.

As can be seen from FIG. 19, the 1024 signal points exist while not overlapping one another. Therefore, the receiver has a high possibility of obtaining the high reception quality.

It is assumed that $D_2$ is a minimum Euclidean distance at the 1024 signal points in FIG. 18, and that $D_1$ is a minimum Euclidean distance at the 1024 signal points in FIG. 19. $D_1 < D_2$ holds. Accordingly, from configuration example R1, it is necessary that $Q_1 < Q_2$ holds for $Q_1 \neq Q_2$ in equations (s2), (S3), (S4), (S5), and (S8).

Example 2-4

Then, equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2 = P_2^2$ in equation (s2)

<2> For $P_1^2 = P_2^2$ in equation (S3)

<3> For $P_1^2 = P_2^2$ in equation (S4)

<4> For equation (S5)

<5> For equation (S8)

[Mathematical formula 149]

$$F = \begin{pmatrix} \beta \times \cos\theta & \beta \times \sin\theta \\ \beta \times \sin\theta & -\beta \times \cos\theta \end{pmatrix} \quad \text{Formula (S110)}$$

or

[Mathematical formula 150]

$$F = \begin{pmatrix} \cos\theta & \sin\theta \\ \sin\theta & -\cos\theta \end{pmatrix} \quad \text{Formula (S111)}$$

or

[Mathematical formula 151]

$$F = \begin{pmatrix} \beta \times \cos\theta & -\beta \times \sin\theta \\ \beta \times \sin\theta & \beta \times \cos\theta \end{pmatrix} \quad \text{Formula (S112)}$$

or

[Mathematical formula 152]

$$F = \begin{pmatrix} \cos\theta & -\sin\theta \\ \sin\theta & \cos\theta \end{pmatrix} \quad \text{Formula (S113)}$$

In equations (S110) and (S112), $\beta$ may be either a real number or an imaginary number. However, $\beta$ is not 0 (zero).

At this point, value $\theta$ with which the receiver obtains the good data reception quality is considered.

With respect to signal $z_2(t)$ ($z_2(i)$) in equations (s2), (S3), (S4), (S5), and (S8), the following equations are considered as value $\theta$ with which the receiver obtains the good data reception quality.

[Mathematical formula 153]

$$\theta = \tan^{-1}\left(\frac{\sqrt{42}}{\sqrt{10}} \times \frac{4}{5}\right) \text{ or } \tan^{-1}\left(\frac{\sqrt{42}}{\sqrt{10}} \times \frac{4}{5}\right) + 2n\pi \text{(radian)} \quad \text{Formula (S114)}$$

or

[Mathematical formula 154]

$$\theta = \pi + \tan^{-1}\left(\frac{\sqrt{42}}{\sqrt{10}} \times \frac{4}{5}\right) \text{ or } \pi + \tan^{-1}\left(\frac{\sqrt{42}}{\sqrt{10}} \times \frac{4}{5}\right) + 2n\pi \text{(radian)} \quad \text{Formula (S115)}$$

or

-continued

[Mathematical formula 155]

$$\theta = \tan^{-1}\left(-\frac{\sqrt{42}}{\sqrt{10}} \times \frac{4}{5}\right) \text{ or } \tan^{-1}\left(-\frac{\sqrt{42}}{\sqrt{10}} \times \frac{4}{5}\right) + 2n\pi(\text{radian}) \qquad \text{Formula (S116)}$$

or

[Mathematical formula 156]

$$\theta = \pi + \tan^{-1}\left(-\frac{\sqrt{42}}{\sqrt{10}} \times \frac{4}{5}\right) \text{ or } \pi + \tan^{-1}\left(-\frac{\sqrt{42}}{\sqrt{10}} \times \frac{4}{5}\right) + 2n\pi(\text{radian}) \qquad \text{Formula (S117)}$$

In equations (S114), (S115), (S116), and (S117), $\tan^{-1}(x)$ is an inverse trigonometric function) (an inverse function of a trigonometric function in which a domain is properly restricted), and $\tan^{-1}(x)$ is given as follows.

[Mathematical formula 157]

$$-\frac{\pi}{2}(\text{radian}) < \tan^{-1}(x) < \frac{\pi}{2}(\text{radian}) \qquad \text{Formula (S118)}$$

"$\tan^{-1}(x)$" may also be referred to as "$\text{Tan}^{-1}(x)$", "arctan (x)", or "Arctan(x)", and n is an integer.

In the case that precoding matrix F is set to one of equations (S110), (S111), (S112), and (S113), and that θ is set to one of equations (S114), (S115), (S116), and (S117), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 18 in signal $u_2(t)$ ($u_2(i)$) of configuration example R1 on the I-Q plane. In FIG. 18, a horizontal axis indicates I, and a vertical axis indicates Q, and a mark "●" indicates a signal point.

As can be seen from FIG. 18, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S110), (S111), (S112), and (S113), and that θ is set to one of equations (S114), (S115), (S116), and (S117), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 19 in signal $u_1(t)$ ($u_1(i)$) of configuration example R1 on the I-Q plane. In FIG. 19, a horizontal axis indicates I, and a vertical axis indicates Q, and a mark "●" indicates a signal point.

As can be seen from FIG. 19, the 1024 signal points exist while not overlapping one another. Therefore, the receiver has a high possibility of obtaining the high reception quality.

It is assumed that $D_2$ is a minimum Euclidean distance at the 1024 signal points in FIG. 18, and that $D_1$ is a minimum Euclidean distance at the 1024 signal points in FIG. 19. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 2-5

Equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

[Mathematical formula 158]

$$F = \begin{pmatrix} \beta \times e^{j0} & \beta \times \alpha \times e^{j0} \\ \beta \times \alpha \times e^{j0} & \beta \times e^{j\pi} \end{pmatrix} \qquad \text{Formula (S119)}$$

or

[Mathematical formula 159]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \qquad \text{Formula (S120)}$$

or

[Mathematical formula 160]

$$F = \begin{pmatrix} \beta \times e^{j0} & \beta \times \alpha \times e^{j\pi} \\ \beta \times \alpha \times e^{j0} & \beta \times e^{j0} \end{pmatrix} \qquad \text{Formula (S121)}$$

or

[Mathematical formula 161]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \qquad \text{Formula (S122)}$$

In equations (S119), (S120), (S121), (S122), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_1(t)$ ($z_1(i)$) in equations (s2), (S3), (S4), (S5), and (S8), the following equations are considered as value α with which the receiver obtains the good data reception quality.

When α is a real number:

[Mathematical formula 162]

$$\alpha = \frac{\sqrt{10}}{\sqrt{42}} \times \frac{5}{4} \qquad \text{Formula (S123)}$$

or

-continued

[Mathematical formula 163]

$$\alpha = -\frac{\sqrt{10}}{\sqrt{42}} \times \frac{5}{4} \quad \text{Formula (S124)}$$

When α is an imaginary number:

[Mathematical formula 164]

$$\alpha = \frac{\sqrt{10}}{\sqrt{42}} \times \frac{5}{4} \times e^{j\frac{\pi}{2}} \quad \text{Formula (S125)}$$

or

[Mathematical formula 165]

$$\alpha = \frac{\sqrt{10}}{\sqrt{42}} \times \frac{5}{4} \times e^{j\frac{3\pi}{2}} \quad \text{Formula (S126)}$$

In the case that precoding matrix F is set to one of equations (S119), (S120), (S121), and (S122), and that α is set to one of equations (S123), (S124), (S125), and (S126), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 12 in signal $u_1(t)$ ($u_1(i)$) of configuration example R1 on the I-Q plane. In FIG. 12, a horizontal axis indicates I, and a vertical axis indicates Q, and a mark "●" indicates a signal point.

As can be seen from FIG. 12, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S119), (S120), (S121), and (S122), and that α is set to one of equations (S123), (S124), (S125), and (S126), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 13 in signal $u_2(t)$ ($u_2(i)$) of configuration example R1 on the I-Q plane. In FIG. 13, a horizontal axis indicates I, and a vertical axis indicates Q, and a mark "●" indicates a signal point.

As can be seen from FIG. 13, the 1024 signal points exist while not overlapping one another. Therefore, the receiver has a high possibility of obtaining the high reception quality.

It is assumed that $D_1$ is a minimum Euclidean distance at the 1024 signal points in FIG. 12, and that $D_2$ is a minimum Euclidean distance at the 1024 signal points in FIG. 13. $D_1>D_2$ holds. Accordingly, from configuration example R1, it is necessary that $Q_1>Q_2$ holds for $Q_1\neq Q_2$ in equations (s2), (S3), (S4), (S5), and (S8).

Example 2-6

Then, equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 166]

$$F = \begin{pmatrix} \beta\times\cos\theta & \beta\times\sin\theta \\ \beta\times\sin\theta & -\beta\times\cos\theta \end{pmatrix} \quad \text{Formula (S127)}$$

or

[Mathematical formula 167]

$$F = \begin{pmatrix} \cos\theta & \sin\theta \\ \sin\theta & -\cos\theta \end{pmatrix} \quad \text{Formula (S128)}$$

or

[Mathematical formula 168]

$$F = \begin{pmatrix} \beta\times\cos\theta & -\beta\times\sin\theta \\ \beta\times\sin\theta & \beta\times\cos\theta \end{pmatrix} \quad \text{Formula (S129)}$$

or

[Mathematical formula 169]

$$F = \begin{pmatrix} \cos\theta & -\sin\theta \\ \sin\theta & \cos\theta \end{pmatrix} \quad \text{Formula (S130)}$$

In equations (S127) and (S129), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 170]

$$\theta = \tan^{-1}\left(\frac{\sqrt{10}}{\sqrt{42}} \times \frac{5}{4}\right) \text{ or } \tan^{-1}\left(\frac{\sqrt{10}}{\sqrt{42}} \times \frac{5}{4}\right) + 2\pi(\text{radian}) \quad \text{Formula (S131)}$$

or

[Mathematical formula 171]

$$\theta = \pi + \tan^{-1}\left(\frac{\sqrt{10}}{\sqrt{42}} \times \frac{5}{4}\right) \text{ or } \pi + \tan^{-1}\left(\frac{\sqrt{10}}{\sqrt{42}} \times \frac{5}{4}\right) + 2\pi(\text{radian}) \quad \text{Formula (S132)}$$

or

[Mathematical formula 172]

$$\theta = \tan^{-1}\left(-\frac{\sqrt{10}}{\sqrt{42}} \times \frac{5}{4}\right) \text{ or } \tan^{-1}\left(-\frac{\sqrt{10}}{\sqrt{42}} \times \frac{5}{4}\right) + 2\pi(\text{radian}) \quad \text{Formula (S133)}$$

or

-continued

[Mathematical formula 173]

$$\theta = \pi + \tan^{-1}\left(-\frac{\sqrt{10}}{\sqrt{42}} \times \frac{5}{4}\right) \text{ or } \pi + \tan^{-1}\left(-\frac{\sqrt{10}}{\sqrt{42}} \times \frac{5}{4}\right) + 2\pi (\text{radian}) \quad \text{Formula (S134)}$$

In equations (S131), (S132), (S133), and (S134), $\tan^{-1}(x)$ is an inverse trigonometric function) (an inverse function of a trigonometric function in which a domain is properly restricted), and $\tan^{-1}(x)$ is given as follows.

[Mathematical formula 174]

$$-\frac{\pi}{2}(\text{radian}) < \tan^{-1}(x) < \frac{\pi}{2}(\text{radian}) \quad \text{Formula (S135)}$$

"$\tan^{-1}(x)$" may also be referred to as "$\text{Tan}^{-1}(x)$", "arctan (x)", or "Arctan(x)", and n is an integer.

In the case that precoding matrix F is set to one of equations (S127), (S128), (S129), and (S130), and that θ is set to one of equations (S131), (S132), (S133), and (S134), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 12 in signal $u_1(t)$ ($u_1(i)$) of configuration example R1 on the I-Q plane. In FIG. 12, a horizontal axis indicates I, and a vertical axis indicates Q, and a mark "●" indicates a signal point.

As can be seen from FIG. 12, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S127), (S128), (S129), and (S130), and that θ is set to one of equations (S131), (S132), (S133), and (S134), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 13 in signal $u_2(t)$ ($u_2(i)$) of configuration example R1 on the I-Q plane. In FIG. 13, a horizontal axis indicates I, and a vertical axis indicates Q, and a mark "●" indicates a signal point.

As can be seen from FIG. 13, the 1024 signal points exist while not overlapping one another. Therefore, the receiver has a high possibility of obtaining the high reception quality.

It is assumed that $D_1$ is a minimum Euclidean distance at the 1024 signal points in FIG. 12, and that $D_2$ is a minimum Euclidean distance at the 1024 signal points in FIG. 13. $D_1 > D_2$ holds. Accordingly, from configuration example R1, it is necessary that $Q_1 > Q_2$ holds for $Q_1 \neq Q_2$ in equations (s2), (S3), (S4), (S5), and (S8).

Example 2-7

Equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2 = P_2^2$ in equation (s2)

<2> For $P_1^2 = P_2^2$ in equation (S3)

<3> For $P_1^2 = P_2^2$ in equation (S4)

<4> For equation (S5)

<5> For equation (S8)

[Mathematical formula 175]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S136)}$$

or

[Mathematical formula 176]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (S137)}$$

or

[Mathematical formula 177]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S138)}$$

or

[Mathematical formula 178]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{Formula (S139)}$$

In equations (S136), (S137), (S138), and (S139), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_1(t)$ ($z_1(i)$) in equations (s2), (S3), (S4), (S5), and (S8), the following equations are considered as value α with which the receiver obtains the good data reception quality.

When α is a real number:

[Mathematical formula 179]

$$\alpha = \frac{\sqrt{10}}{\sqrt{42}} \times \frac{4}{5} \quad \text{Formula (S140)}$$

or

[Mathematical formula 180]

$$\alpha = -\frac{\sqrt{10}}{\sqrt{42}} \times \frac{4}{5} \quad \text{Formula (S141)}$$

When α is an imaginary number:

[Mathematical formula 181]

$$\alpha = \frac{\sqrt{10}}{\sqrt{42}} \times \frac{4}{5} \times e^{j\frac{\pi}{2}} \quad \text{Formula (S142)}$$

-continued or

[Mathematical formula 182]

$$\alpha = \frac{\sqrt{10}}{\sqrt{42}} \times \frac{4}{5} \times e^{j\frac{3\pi}{2}} \quad \text{Formula (S143)}$$

In the case that precoding matrix F is set to one of equations (S136), (S137), (S138), and (S139), and that α is set to one of equations (S140), (S141), (S142), and (S143), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 14 in signal $u_1(t)$ ($u_1(i)$) of configuration example R1 on the I-Q plane. In FIG. 14, a horizontal axis indicates I, and a vertical axis indicates Q, and a mark "●" indicates a signal point.

As can be seen from FIG. 14, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S136), (S137), (S138), and (S139), and that α is set to one of equations (S140), (S141), (S142), and (S143), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 15 in signal $u_2(t)$ ($u_2(i)$) of configuration example R1 on the I-Q plane. In FIG. 15, a horizontal axis indicates I, and a vertical axis indicates Q, and a mark "●" indicates a signal point.

As can be seen from FIG. 15, the 1024 signal points exist while not overlapping one another. Therefore, the receiver has a high possibility of obtaining the high reception quality.

It is assumed that $D_1$ is a minimum Euclidean distance at the 1024 signal points in FIG. 14, and that $D_2$ is a minimum Euclidean distance at the 1024 signal points in FIG. 15. $D_1 > D_2$ holds. Accordingly, from configuration example R1, it is necessary that $Q_1 > Q_2$ holds for $Q_1 \neq Q_2$ in equations (s2), (S3), (S4), (S5), and (S8).

Example 2-8

Then, equations (S11) and (S12) hold with respect to coefficient $w_{16}$ of the 16QAM mapping method and coefficient $w_{64}$ of the 64QAM mapping method, and precoding matrix F is set to one of equations (S22), (S23), (S24), and (S25) when the calculations are performed in <1> to <5>.

<1> For $P_1^2 = P_2^2$ in equation (s2)
<2> For $P_1^2 = P_2^2$ in equation (S3)
<3> For $P_1^2 = P_2^2$ in equation (S4)
<4> For equation (S5)
<5> For equation (S8)

[Mathematical formula 183]

$$F = \begin{pmatrix} \beta \times \cos\theta & \beta \times \sin\theta \\ \beta \times \sin\theta & -\beta \times \cos\theta \end{pmatrix} \quad \text{Formula (S144)}$$

or

-continued

[Mathematical formula 184]

$$F = \begin{pmatrix} \cos\theta & \sin\theta \\ \sin\theta & -\cos\theta \end{pmatrix} \quad \text{Formula (S145)}$$

or

[Mathematical formula 185]

$$F = \begin{pmatrix} \beta \times \cos\theta & -\beta \times \sin\theta \\ \beta \times \sin\theta & \beta \times \cos\theta \end{pmatrix} \quad \text{Formula (S146)}$$

or

[Mathematical formula 186]

$$F = \begin{pmatrix} \cos\theta & -\sin\theta \\ \sin\theta & \cos\theta \end{pmatrix} \quad \text{Formula (S147)}$$

In equations (S144) and (S146), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 187]

$$\theta = \tan^{-1}\left(\frac{\sqrt{10}}{\sqrt{42}} \times \frac{4}{5}\right) \quad \text{Formula (S148)}$$

or $$\tan^{-1}\left(\frac{\sqrt{10}}{\sqrt{42}} \times \frac{4}{5}\right) + 2n\pi(\text{radian})$$

or

[Mathematical formula 188]

$$\theta = \pi + \tan^{-1}\left(\frac{\sqrt{10}}{\sqrt{42}} \times \frac{4}{5}\right) \quad \text{Formula (S149)}$$

or $$\pi + \tan^{-1}\left(\frac{\sqrt{10}}{\sqrt{42}} \times \frac{4}{5}\right) + 2n\pi(\text{radian})$$

or

[Mathematical formula 189]

$$\theta = \tan^{-1}\left(-\frac{\sqrt{10}}{\sqrt{42}} \times \frac{4}{5}\right) \quad \text{Formula (S150)}$$

or $$\tan^{-1}\left(-\frac{\sqrt{10}}{\sqrt{42}} \times \frac{4}{5}\right) + 2n\pi(\text{radian})$$

or

[Mathematical formula 190]

$$\theta = \pi + \tan^{-1}\left(-\frac{\sqrt{10}}{\sqrt{42}} \times \frac{4}{5}\right) \quad \text{Formula (S151)}$$

or $$\pi + \tan^{-1}\left(-\frac{\sqrt{10}}{\sqrt{42}} \times \frac{4}{5}\right) + 2n\pi(\text{radian})$$

In equations (S148), (S149), (S150), and (S151), $\tan^{-1}(x)$ is an inverse trigonometric function) (an inverse function of a trigonometric function in which a domain is properly restricted), and $\tan^{-1}(x)$ is given as follows.

[Mathematical formula 191]

$$-\frac{\pi}{2}(\text{radian}) < \tan^{-1}(x) < \frac{\pi}{2}(\text{radian}) \quad \text{Formula (S152)}$$

"$\tan^{-1}(x)$" may also be referred to as "$\text{Tan}^{-1}(x)$", "arctan (x)", or "Arctan(x)", and n is an integer.

In the case that precoding matrix F is set to one of equations (S144), (S145), (S146), and (S147), and that θ is set to one of equations (S148), (S149), (S150), and (S151), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 14 in signal $u_1(t)$ ($u_1(i)$) of configuration example R1 on the I-Q plane. In FIG. 14, a horizontal axis indicates I, and a vertical axis indicates Q, and a mark "●" indicates a signal point.

As can be seen from FIG. 14, the 1024 signal points exist while not overlapping one another. On the I-Q plane, Euclidean distances between closest signal points are equal in the 1020 signal points of the 1024 signal points except for a rightmost and uppermost point, a rightmost and lowermost point, a leftmost and uppermost point, and a leftmost and lowermost point. Therefore, the receiver has a high possibility of obtaining the high reception quality.

In the case that precoding matrix F is set to one of equations (S144), (S145), (S146), and (S147), and that θ is set to one of equations (S148), (S149), (S150), and (S151), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 15 in signal $u_2(t)$ ($u_2(i)$) of configuration example R1 on the I-Q plane. In FIG. 15, a horizontal axis indicates I, and a vertical axis indicates Q, and a mark "●" indicates a signal point.

As can be seen from FIG. 15, the 1024 signal points exist while not overlapping one another. Therefore, the receiver has a high possibility of obtaining the high reception quality.

It is assumed that $D_1$ is a minimum Euclidean distance at the 1024 signal points in FIG. 14, and that $D_2$ is a minimum Euclidean distance at the 1024 signal points in FIG. 15. $D_1 > D_2$ holds. Accordingly, from configuration example R1, it is necessary that $Q_1 > Q_2$ holds for $Q_1 \neq Q_2$ in equations (s2), (S3), (S4), (S5), and (S8).

Example 2—Supplement

Values α and θ having the possibility of achieving the high data reception quality are illustrated in (Example 2-1) to (Example 2-8). However, even if values α and θ are not those in (Example 2-1) to (Example 2-8), sometimes the high data reception quality is obtained by satisfying the condition of configuration example R1.

Example 3

In mapper 504 of FIGS. 5 to 7, the modulation scheme for obtaining $s_1(t)$ ($s_1(i)$) is set to 64QAM while the modulation scheme for obtaining $s_2(t)$ ($s_2(i)$) is set to 256QAM. An example of conditions associated with the configuration and power change of precoding matrix (F) when the precoding and/or the power change is performed on, for example, one of equations (s2), (S3), (S4), (S5), and (S8) will be described below.

The 64QAM mapping method will be described below. FIG. 11 illustrates an arrangement example of 64QAM signal points in the I-Q plane. In FIG. 11, 64 marks "○" indicate 64QAM signal points, a horizontal axis indicates I, and a vertical axis indicates Q.

In the I-Q plane, 64 signal points included in 64QAM (indicated by the marks "○" in FIG. 11) are obtained as follows. ($w_{64}$ is a real number larger than 0)

$(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64}-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$

At this point, the bits to be transmitted (input bits) are set to b0, b1, b2, b3, b4, and b5. For example, in the case that the bits to be transmitted is (b0, b1, b2, b3, b4, b5)=(0,0,0, 0,0,0), the bits are mapped at signal point 1101 in FIG. 11, and $(I,Q)=(7w_{64},7w_{64})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 11 illustrates an example of a relationship between the set of b0, b1, b2, b3, b4, and b5 (000000 to 111111) and the signal point coordinates. Values 000000 to of the set of b0, b1, b2, b3, b4, and b5 are indicated immediately below 64 signal points included in 64QAM (the marks "○" in FIG. 11) $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64}-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$. Respective coordinates of the signal points ("○")

immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 11. A complex value of in-phase component I and quadrature component Q of the mapped baseband signal (during 64QAM modulation) serves as a baseband signal ($s_1(t)$ or $s_2(t)$ in FIGS. 5 to 7).

Figure 20:
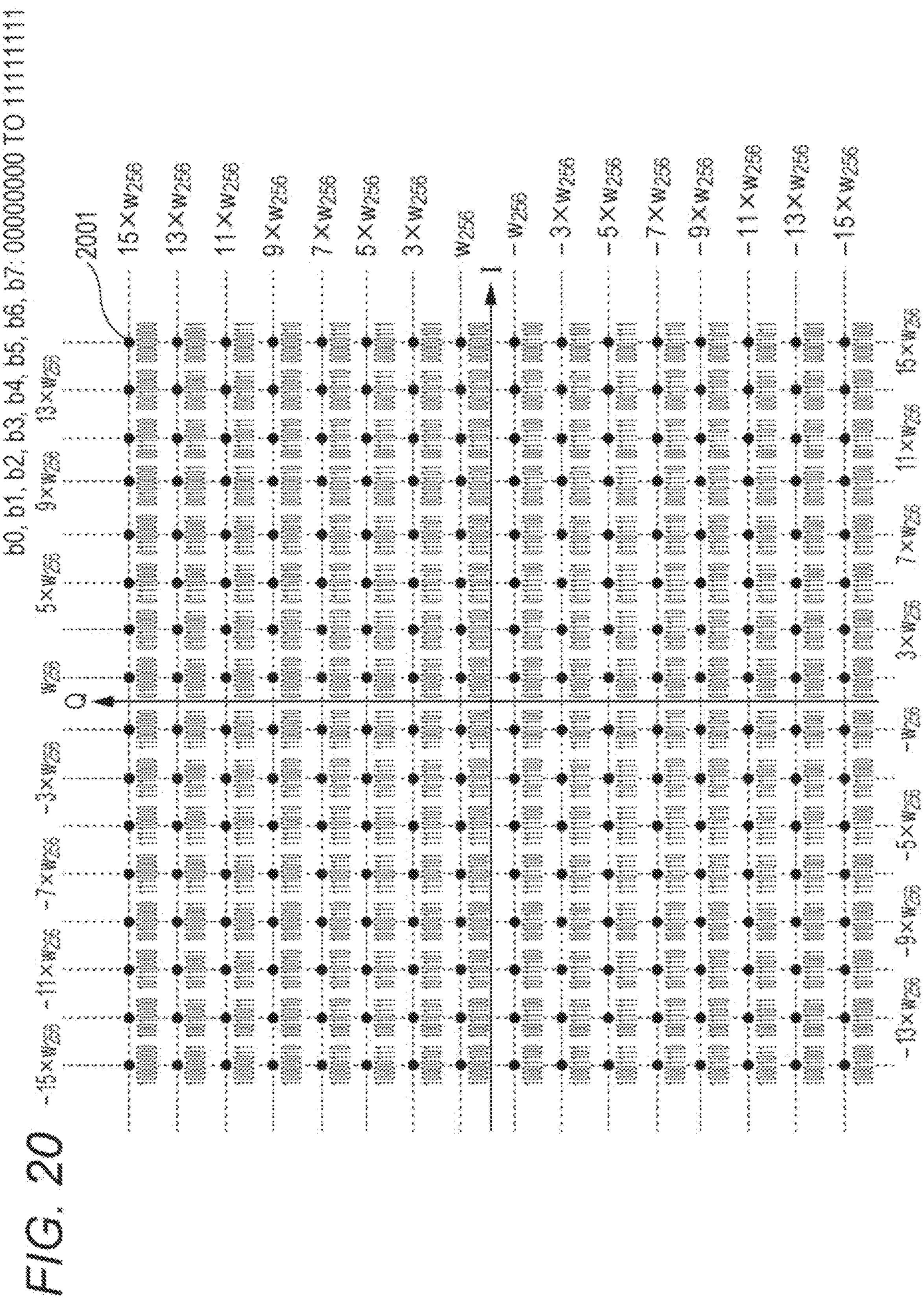
FIG. 20 is a view illustrating an arrangement example of the signal points in the I-Q plane.

The 256QAM mapping method will be described below. FIG. 20 illustrates an arrangement example of 256QAM signal points in the I-Q plane. In FIG. 20, 256 marks "◯" indicate the 256QAM signal points.

In the I-Q plane, 256 signal points included in 256QAM (indicated by the marks "◯" in FIG. 20) are obtained as follows. ($w_{256}$ is a real number larger than 0)

$(15w_{256},15w_{256}), (15w_{256},13w_{256}), (15w_{256},11w_{256}), (15w_{256},9w_{256}), (15w_{256},7w_{256}), (15w_{256},5w_{256}), (15w_{256},3w_{256}), (15w_{256},w_{256})$, $(15w_{256},-15w_{256}), (15w_{256},-13w_{256}), (15w_{256},-11w_{256}), (15w_{256},-9w_{256}), (15w_{256},-7w_{256}), (15w_{256},-5w_{256}), (15w_{256},-3w_{256}), (15w_{256},-w_{256})$, $(13w_{256},15w_{256}), (13w_{256},13w_{256}), (13w_{256},11w_{256}), (13w_{256},9w_{256}), (13w_{256},7w_{256}), (13w_{256},5w_{256}), (13w_{256},3w_{256}), (13w_{256},w_{256})$, $(13w_{256},-15w_{256}), (13w_{256},-13w_{256}), (13w_{256},-11w_{256}), (13w_{256},-9w_{256}), (13w_{256},-7w_{256}), (13w_{256},-5w_{256}), (13w_{256},-3w_{256}), (13w_{256},-w_{256})$, $(11w_{256},15w_{256}), (11w_{256},13w_{256}), (11w_{256},11w_{256}), (11w_{256},9w_{256}), (11w_{256},7w_{256}), (11w_{256},5w_{256}), (11w_{256},3w_{256}), (11w_{256},w_{256})$, $(11w_{256},-15w_{256}), (11w_{256},-13w_{256}), (11w_{256},-11w_{256}), (11w_{256},-9w_{256}), (11w_{256},-7w_{256}), (11w_{256},-5w_{256}), (11w_{256},-3w_{256}), (11w_{256},-w_{256})$, $(9w_{256},15w_{256}), (9w_{256},13w_{256}), (9w_{256},11w_{256}), (9w_{256},9w_{256}), (9w_{256},7w_{256}), (9w_{256},5w_{256}), (9w_{256},3w_{256}), (9w_{256},w_{256})$, $(9w_{256},-15w_{256}), (9w_{256},-13w_{256}), (9w_{256},-11w_{256}), (9w_{256},-9w_{256}), (9w_{256},-7w_{256}), (9w_{256},-5w_{256}), (9w_{256},-3w_{256}), (9w_{256},-w_{256})$, $(7w_{256},15w_{256}), (7w_{256},13w_{256}), (7w_{256},11w_{256}), (7w_{256},9w_{256}), (7w_{256},7w_{256}), (7w_{256},5w_{256}), (7w_{256},3w_{256}), (7w_{256},w_{256})$, $(7w_{256},-15w_{256}), (7w_{256},-13w_{256}), (7w_{256},-11w_{256}), (7w_{256},-9w_{256}), (7w_{256},-7w_{256}), (7w_{256},-5w_{256}), (7w_{256},-3w_{256}), (7w_{256},-w_{256})$, $(5w_{256},15w_{256}), (5w_{256},13w_{256}), (5w_{256},11w_{256}), (5w_{256},9w_{256}), (5w_{256},7w_{256}), (5w_{256},5w_{256}), (5w_{256},3w_{256}), (5w_{256},w_{256})$, $(5w_{256},-15w_{256}), (5w_{256},-13w_{256}), (5w_{256},-11w_{256}), (5w_{256},-9w_{256}), (5w_{256},-7w_{256}), (5w_{256},-5w_{256}), (5w_{256},-3w_{256}), (5w_{256},-w_{256})$, $(3w_{256},15w_{256}), (3w_{256},13w_{256}), (3w_{256},11w_{256}), (3w_{256},9w_{256}), (3w_{256},7w_{256}), (3w_{256},5w_{256}), (3w_{256},3w_{256}), (3w_{256},w_{256})$, $(3w_{256},-15w_{256}), (3w_{256},-13w_{256}), (3w_{256},-11w_{256}), (3w_{256},-9w_{256}), (3w_{256},-7w_{256}), (3w_{256},-5w_{256}), (3w_{256},-3w_{256}), (3w_{256},-w_{256})$, $(w_{256},15w_{256}), (w_{256},13w_{256}), (w_{256},11w_{256}), (w_{256},9w_{256}), (w_{256},7w_{256}), (w_{256},5w_{256}), (w_{256},3w_{256}), (w_{256},w_{256})$, $(w_{256},-15w_{256}), (w_{256},-13w_{256}), (w_{256},-11w_{256}), (w_{256},-9w_{256}), (w_{256},-7w_{256}), (w_{256},-5w_{256}), (w_{256},-3w_{256}), (w_{256},-w_{256})$, $(-15w_{256},15w_{256}), (-15w_{256},13w_{256}), (-15w_{256},11w_{256}), (-15w_{256},9w_{256}), (-15w_{256},7w_{256}), (-15w_{256},5w_{256}), (-15w_{256},3w_{256}), (-15w_{256},w_{256})$, $(-15w_{256},-15w_{256}), (-15w_{256},-13w_{256}), (-15w_{256},-11w_{256}), (-15w_{256},-9w_{256}), (-15w_{256},-7w_{256}), (-15w_{256},-5w_{256}), (-15w_{256},-3w_{256}), (-15w_{256},-w_{256})$, $(-13w_{256},15w_{256}), (-13w_{256},13w_{256}), (-13w_{256},11w_{256}), (-13w_{256},9w_{256}), (-13w_{256},7w_{256}), (-13w_{256},5w_{256}), (-13w_{256},3w_{256}), (-13w_{256},w_{256})$, $(-13w_{256},-15w_{256}), (-13w_{256},-13w_{256}), (-13w_{256},-11w_{256}), (-13w_{256},-9w_{256}), (-13w_{256},-7w_{256}), (-13w_{256},-5w_{256}), (-13w_{256},-3w_{256}), (-13w_{256},-w_{256})$, $(-11w_{256},15w_{256}), (-11w_{256},13w_{256}), (-11w_{256},11w_{256}), (-11w_{256},9w_{256}), (-11w_{256},7w_{256}), (-11w_{256},5w_{256}), (-11w_{256},3w_{256}), (-11w_{256},w_{256})$, $(-11w_{256},-15w_{256}), (-11w_{256},-13w_{256}), (-11w_{256},-11w_{256}), (-11w_{256},-9w_{256}), (-11w_{256},-7w_{256}), (-11w_{256},-5w_{256}), (-11w_{256},-3w_{256}), (-11w_{256},-w_{256})$, $(-9w_{256},15w_{256}), (-9w_{256},13w_{256}), (-9w_{256},11w_{256}), (-9w_{256},9w_{256}), (-9w_{256},7w_{256}), (-9w_{256},5w_{256}), (-9w_{256},3w_{256}), (-9w_{256},w_{256})$, $(-9w_{256},-15w_{256}), (-9w_{256},-13w_{256}), (-9w_{256},-11w_{256}), (-9w_{256},-9w_{256}), (-9w_{256},-7w_{256}), (-9w_{256},-5w_{256}), (-9w_{256},-3w_{256}), (-9w_{256},-w_{256})$, $(-7w_{256},15w_{256}), (-7w_{256},13w_{256}), (-7w_{256},11w_{256}), (-7w_{256},9w_{256}), (-7w_{256},7w_{256}), (-7w_{256},5w_{256}), (-7w_{256},3w_{256}), (-7w_{256},w_{256})$, $(-7w_{256},-15w_{256}), (-7w_{256},-13w_{256}), (-7w_{256},-11w_{256}), (-7w_{256},-9w_{256}), (-7w_{256},-7w_{256}), (-7w_{256},-5w_{256}), (-7w_{256},-3w_{256}), (-7w_{256},-w_{256})$, $(-5w_{256},15w_{256}), (-5w_{256},13w_{256}), (-5w_{256},11w_{256}), (-5w_{256},9w_{256}), (-5w_{256},7w_{256}), (-5w_{256},5w_{256}), (-5w_{256},3w_{256}), (-5w_{256},w_{256})$, $(-5w_{256},-15w_{256}), (-5w_{256},-13w_{256}), (-5w_{256},-11w_{256}), (-5w_{256},-9w_{256}), (-5w_{256},-7w_{256}), (-5w_{256},-5w_{256}), (-5w_{256},-3w_{256}), (-5w_{256},-w_{256})$, $(-3w_{256},15w_{256}), (-3w_{256},13w_{256}), (-3w_{256},11w_{256}), (-3w_{256},9w_{256}), (-3w_{256},7w_{256}), (-3w_{256},5w_{256}), (-3w_{256},3w_{256}), (-3w_{256},w_{256})$, $(-3w_{256},-15w_{256}), (-3w_{256},-13w_{256}), (-3w_{256},-11w_{256}), (-3w_{256},-9w_{256}), (-3w_{256},-7w_{256}), (-3w_{256},-5w_{256}), (-3w_{256},-3w_{256}), (-3w_{256},-w_{256})$, $(-w_{256},15w_{256}), (-w_{256},13w_{256}), (-w_{256},11w_{256}), (-w_{256},9w_{256}), (-w_{256},7w_{256}), (-w_{256},5w_{256}), (-w_{256},3w_{256}), (-w_{256},w_{256})$, $(-w_{256},-15w_{256}), (-w_{256},-w_{256}), (-w_{256},-11w_{256}), (-w_{256},-9w_{256}), (-w_{256},-7w_{256}), (-w_{256},-5w_{256}), (-w_{256},-3w_{256}), (-w_{256},-w_{256})$

At this point, the bits to be transmitted (input bits) are set to b0, b1, b2, b3, b4, b5, b6, and b7. For example, in the case that the bits to be transmitted is (b0, b1, b2, b3, b4, b5, b6, b7)=(0,0,0,0,0,0,0,0), the bits are mapped at signal point 2001 in FIG. 20, and $(I,Q)=(15w_{256},15w_{256})$ is obtained when I is an in-phase component while Q is a quadrature component of the mapped baseband signal.

Based on the bits to be transmitted (b0, b1, b2, b3, b4, b5, b6, b7), in-phase component I and quadrature component Q of the mapped baseband signal are decided (during 256QAM modulation). FIG. 20 illustrates an example of a relationship between the set of b0, b1, b2, b3, b4, b5, b6, and b7 (00000000 to 11111111) and the signal point coordinates. Values 00000000 to 11111111 of the set of b0, b1, b2, b3, b4, b5, b6, and b7 are indicated immediately below 256 signal points included in 256QAM (the marks "◯" in FIG. 20)

$(15w_{256},15w_{256}), (15w_{256},13w_{256}), (15w_{256},11w_{256}), (15w_{256},9w_{256}), (15w_{256},7w_{256}), (15w_{256},5w_{256}), (15w_{256},3w_{256}), (15w_{256},w_{256})$, $(15w_{256},-15w_{256}), (15w_{256},-13w_{256}), (15w_{256},-11w_{256}), (15w_{256},-9w_{256}), (15w_{256},-7w_{256}), (15w_{256},-5w_{256}), (15w_{256},-3w_{256}), (15w_{256},-w_{256})$, $(13w_{256},15w_{256})$, $(13w_{256},13w_{256})$, $(13w_{256},11w_{256})$, $(13w_{256},9w_{256})$, $(13w_{256},7w_{256})$, $(13w_{256},5w_{256})$, $(13w_{256},3w_{256})$, $(13w_{256},w_{256})$,
$(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$,
$(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$,
$(11w_{256},-15w_{256})$, $(11w_{256},-13w_{256})$, $(11w_{256},-11w_{256})$, $(11w_{256},-9w_{256})$, $(11w_{256},-7w_{256})$, $(11w_{256},-5w_{256})$, $(11w_{256},-3w_{256})$, $(11w_{256},-w_{256})$,
$(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256})$,
$(9w_{256},-15w_{256})$, $(9w_{256},-13w_{256})$, $(9w_{256},-11w_{256})$, $(9w_{256},-9w_{256})$, $(9w_{256},-7w_{256})$, $(9w_{256},-5w_{256})$, $(9w_{256},-3w_{256})$, $(9w_{256},-w_{256})$,
$(7w_{256},15w_{256})$, $(7w_{256},13w_{256})$, $(7w_{256},11w_{256})$, $(7w_{256},9w_{256})$, $(7w_{256},7w_{256})$, $(7w_{256},5w_{256})$, $(7w_{256},3w_{256})$, $(7w_{256},w_{256})$,
$(7w_{256},-15w_{256})$, $(7w_{256},-13w_{256})$, $(7w_{256},-11w_{256})$, $(7w_{256},-9w_{256})$, $(7w_{256},-7w_{256})$, $(7w_{256},-5w_{256})$, $(7w_{256},-3w_{256})$, $(7w_{256},-w_{256})$,
$(5w_{256},15w_{256})$, $(5w_{256},13w_{256})$, $(5w_{256},11w_{256})$, $(5w_{256},9w_{256})$, $(5w_{256},7w_{256})$, $(5w_{256},5w_{256})$, $(5w_{256},3w_{256})$, $(5w_{256},w_{256})$,
$(5w_{256},-15w_{256})$, $(5w_{256},-13w_{256})$, $(5w_{256},-11w_{256})$, $(5w_{256},-9w_{256})$, $(5w_{256},-7w_{256})$, $(5w_{256},-5w_{256})$, $(5w_{256},-3w_{256})$, $(5w_{256},-w_{256})$,
$(3w_{256},15w_{256})$, $(3w_{256},13w_{256})$, $(3w_{256},11w_{256})$, $(3w_{256},9w_{256})$, $(3w_{256},7w_{256})$, $(3w_{256},5w_{256})$, $(3w_{256},3w_{256})$, $(3w_{256},w_{256})$,
$(3w_{256},-15w_{256})$, $(3w_{256},-13w_{256})$, $(3w_{256},-11w_{256})$, $(3w_{256},-9w_{256})$, $(3w_{256},-7w_{256})$, $(3w_{256},-5w_{256})$, $(3w_{256},-3w_{256})$, $(3w_{256},-w_{256})$,
$(w_{256},15w_{256})$, $(w_{256},13w_{256})$, $(w_{256},11w_{256})$, $(w_{256},9w_{256})$, $(w_{256},7w_{256})$, $(w_{256},5w_{256})$, $(w_{256},3w_{256})$, $(w_{256},w_{256})$,
$(w_{256},-15w_{256})$, $(w_{256},-13w_{256})$, $(w_{256},-11w_{256})$, $(w_{256},-9w_{256})$, $(w_{256},-7w_{256})$, $(w_{256},-5w_{256})$, $(w_{256},-3w_{256})$, $(w_{256},-w_{256})$,
$(-15w_{256},15w_{256})$, $(-15w_{256},13w_{256})$, $(-15w_{256},11w_{256})$, $(-15w_{256},9w_{256})$, $(-15w_{256},7w_{256})$, $(-15w_{256},5w_{256})$, $(-15w_{256},3w_{256})$, $(-15w_{256},w_{256})$,
$(-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$,
$(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$,
$(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$,
$(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$,
$(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$,
$(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$,
$(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256},-w_{256})$,
$(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$,
$(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$,
$(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$,
$(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-5w_{256},-w_{256})$,
$(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$,
$(-3w_{256},-15w_{256})$, $(-3w_{256},-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$,
$(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$,
$(-w_{256},-15w_{256})$, $(-w_{256},-w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, $(-w_{256},-w_{256})$. Respective coordinates of the signal points ("○") immediately above the values 00000000 to 11111111 of the set of b0, b1, b2, b3, b4, b5, b6, and b7 in the I-Q plane serve as in-phase component I and quadrature component Q of the mapped baseband signal. The relationship between the set of b0, b1, b2, b3, b4, b5, b6, and b7 (00000000 to 11111111) and the signal point coordinates during 256QAM modulation is not limited to that in FIG. 20. A complex value of in-phase component I and quadrature component Q of the mapped baseband signal (during 256QAM modulation) serves as a baseband signal ($s_1(t)$ or $s_2(t)$ in FIGS. 5 to 7).

In this case, the modulation scheme of baseband signal 505A ($s_1(t)$ ($s_1(i)$)) is set to 64QAM while modulation scheme of baseband signal 505B ($s_2(t)$ ($s_2(i)$)) is set to 256QAM in FIG. 5 to FIG. 7. The configuration of the precoding matrix will be described below.

At this point, generally average power of baseband signal 505A ($s_1(t)$ and ($s_1(i)$)) and average power of baseband signal 505B ($s_2(t)$ and ($s_2(i)$)), which are of the output of mapper 504 in FIGS. 5 to 7, are equalized to each other. Accordingly, the following relational expression holds with respect to coefficient $w_{64}$ of the 64QAM mapping method and coefficient $w_{256}$ of the 256QAM mapping method.

[Mathematical formula 192]

$$w_{64} = \frac{z}{\sqrt{42}} \tag{S153}$$

[Mathematical formula 193]

$$w_{256} = \frac{z}{\sqrt{170}} \tag{S154}$$

In equations (S153) and (S154), it is assumed that z is a real number larger than 0. When the calculations are performed in <1> to <5>, <1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

the configuration of precoding matrix F

[Mathematical formula 194]

$$F = \begin{pmatrix} a(i) & b(i) \\ c(i) & d(i) \end{pmatrix} \quad \text{(S155)}$$

will be described in detail below ((Example 3-1) to (Example 3-8)).

Example 3-1

For one of <1> to <5>, precoding matrix F is set to one of the following equations.

[Mathematical formula 195]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S156)}$$

or

[Mathematical formula 196]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (S157)}$$

or

[Mathematical formula 197]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S158)}$$

or

[Mathematical formula 198]

$$F = \frac{1}{\sqrt{\alpha^2 + 1}} \begin{pmatrix} e^{j0} & \alpha \times e^{j\pi} \\ \alpha \times e^{j0} & e^{j\pi 0} \end{pmatrix} \quad \text{Formula (S159)}$$

In equations (S156), (S157), (S158), and (S159), $\alpha$ may be either a real number or an imaginary number, and $\beta$ may be either a real number or an imaginary number. However, $\alpha$ is not 0 (zero). Also $\beta$ is not 0 (zero).

At this point, value $\alpha$ with which the receiver obtains the good data reception quality is considered.

With respect to signal $z_1(t)$ $(z_1(i))$ in equations (s2), (S3), (S4), (S5), and (S8), the following equations are considered as value $\alpha$ with which the receiver obtains the good data reception quality.

When $\alpha$ is a real number:

[Mathematical formula 199]

$$\alpha = \frac{\sqrt{170}}{\sqrt{42}} \times \frac{9}{8} \quad \text{Formula (S160)}$$

or

[Mathematical formula 200]

$$\alpha = -\frac{\sqrt{170}}{\sqrt{42}} \times \frac{9}{8} \quad \text{Formula (S161)}$$

When $\alpha$ is an imaginary number:

[Mathematical formula 201]

$$\alpha = \frac{\sqrt{170}}{\sqrt{42}} \times \frac{9}{8} \times e^{j\frac{\pi}{2}} \quad \text{Formula (S162)}$$

or

[Mathematical formula 202]

$$\alpha = \frac{\sqrt{170}}{\sqrt{42}} \times \frac{9}{8} \times e^{j\frac{3\pi}{2}} \quad \text{Formula (S163)}$$

The modulation scheme of baseband signal 505A ($s_1(t)$ $(s_1(i))$) is set to 64QAM while modulation scheme of baseband signal 505B ($s_2(t)$ $(s_2(i))$) is set to 256QAM. Accordingly, the precoding (and the phase change and the power change) is performed to transmit the modulated signal from each antenna as described above, the total number of bits transmitted using symbols transmitted from antenna 808A and 808B in FIG. 8 at the (unit) time of time u and frequency (carrier) v is 14 bits that are of a sum of 6 bits (for the use of 64QAM) and 8 bits (for the use of 256QAM).

Assuming that $b_{0,64}$, $b_{1,64}$, $b_{2,64}$, $b_{3,64}$, $b_{4,64}$ and $b_{5,64}$ are input bits for the purpose of the 64QAM mapping, and that $b_{0,256}$, $b_{1,256}$, $b_{2,256}$, $b_{3,256}$, $b_{4,256}$, $b_{5,256}$, $b_{6,256}$, and $b_{7,256}$ are input bits for the purpose of the 256QAM mapping, even if value $\alpha$ in any one of equations (S160), (S161), (S162), and (S163) is used, in signal $z_1(t)$ $(z_1(i))$, the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (0,0,0,0,0,0,0,0,0,0,0,0,0,0) to the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (1,1,1,1,1,1,1,1,1,1,1,1,1,1) exist in the I-Q plane, similarly, in signal $z_2(t)$ $(z_2(i))$, the Signal point at Which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (0,0,0,0,0,0,0,0,0,0,0,0,0,0) to the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (1,1,1,1,1,1,1,1,1,1,1,1,1,1) exist in the I-Q plane.

In the above description, with respect to signal $z_1(t)$ $(z_1(i))$ in equations (s2), (S3), (S4), (S5), and (S8), equations (S160) to (S163) are considered as value $\alpha$ with which the receiver obtains the good data reception quality. This point will be described below.

In signal $z_1(t)$ $(z_1(i))$, the Signal point at Which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (0,0,0,0,0,0,0,0,0,0,0,0,0,0) to the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (1,1,1,1,1,1,1,1,1,1,1,1,1,1) exist in the I-Q plane, and it is desirable that $2^{14}$=16384 signal points exist in the I-Q plane while not overlapping one another.

This is attributed to the following fact. That is, the receiver performs the detection and the error correction decoding using signal $z_1(t)$ $(z_1(i))$ in the case that a modulated signal transmitted from the antenna for transmitting signal $z_2(t)$ $(z_2(i))$ does not reach the receiver, and it is necessary at that time that the 16384 signal points exist in the I-Q plane while not overlapping one another in order that the receiver obtains the high data reception quality.

Figure 21:
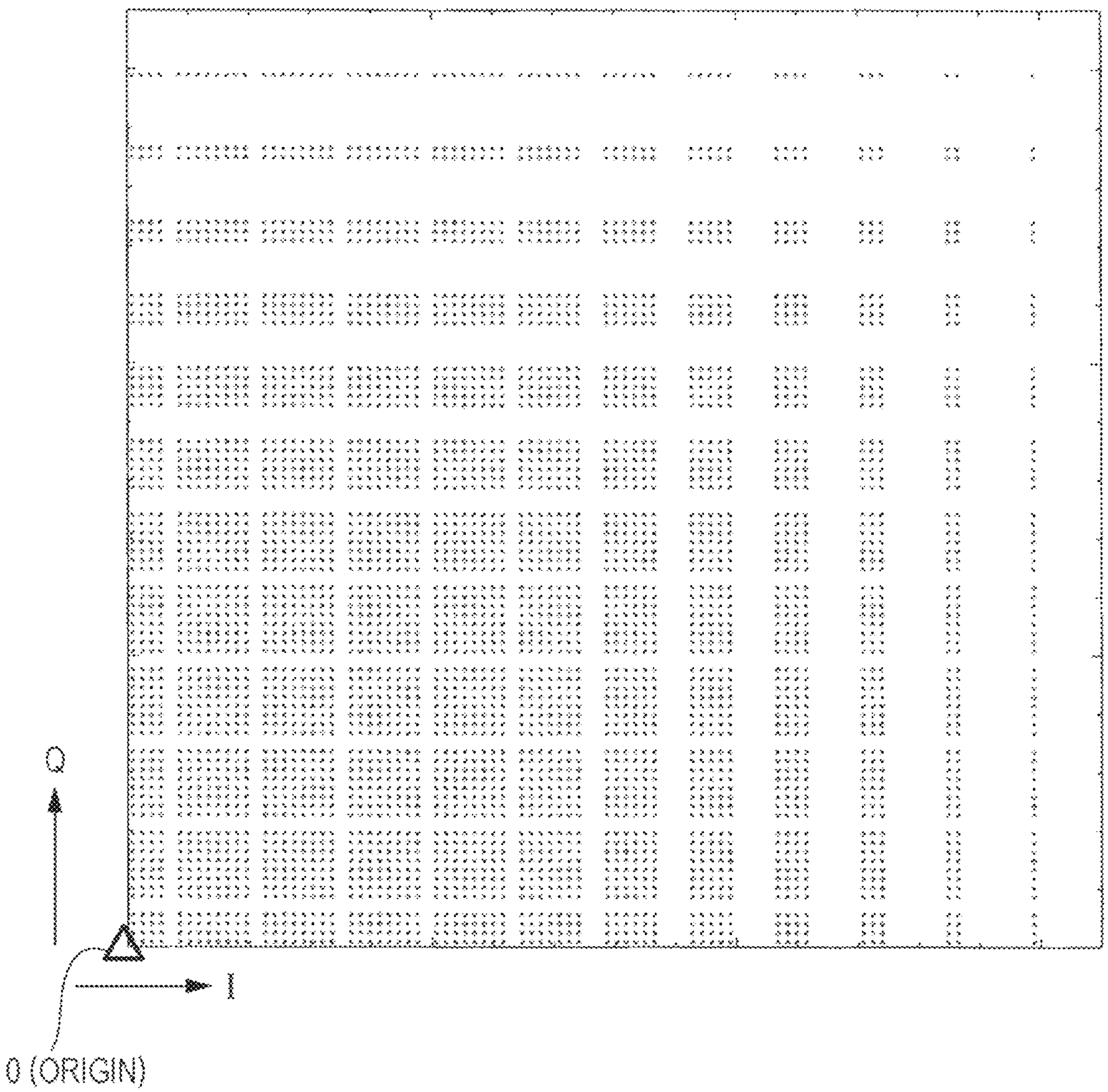
FIG. 21 is a view illustrating an arrangement example of the signal points in a first quadrant of the I-Q plane.
Figure 22:
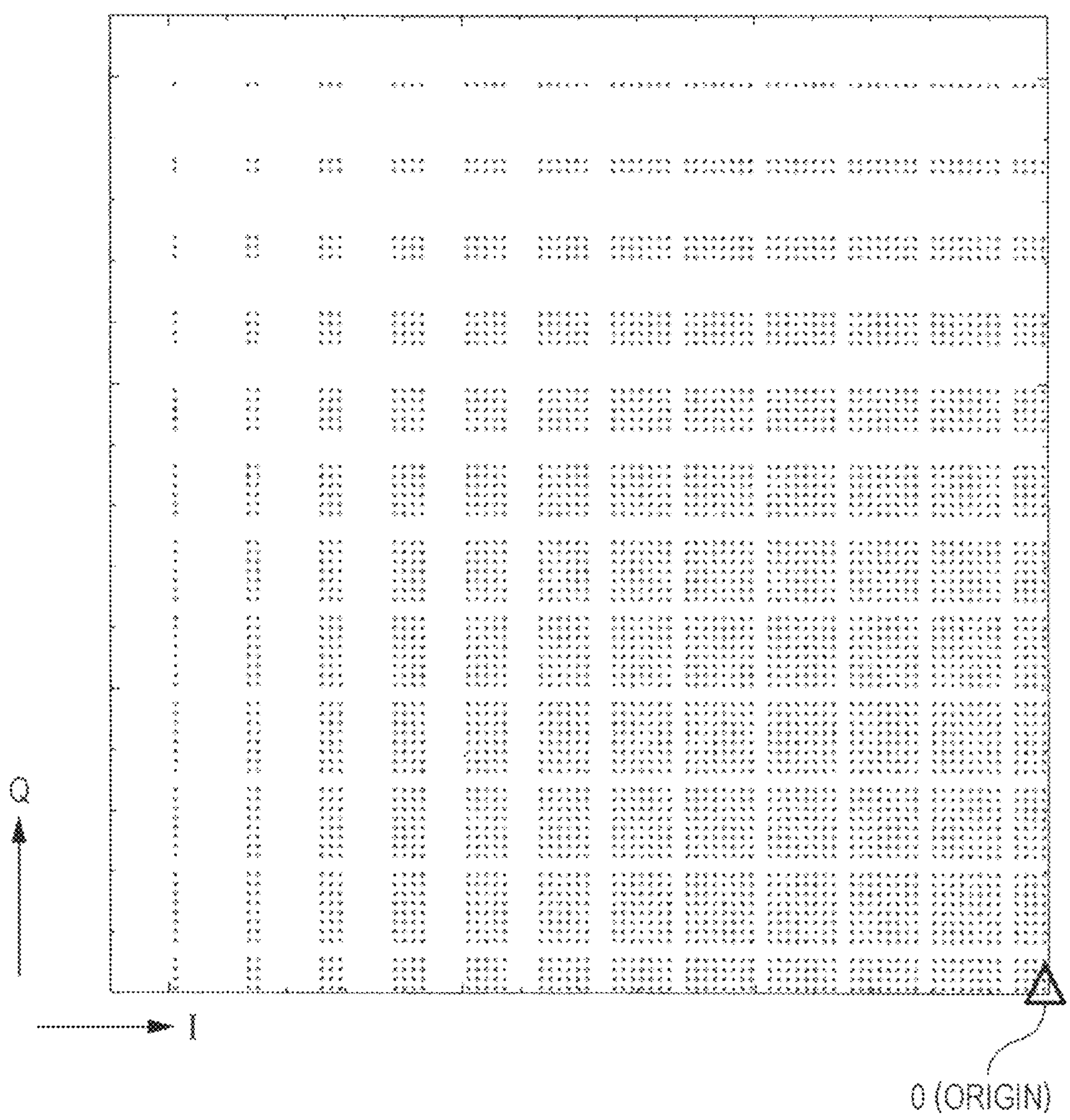
FIG. 22 is a view illustrating an arrangement example of the signal points in a second quadrant of the I-Q plane.
Figure 23:
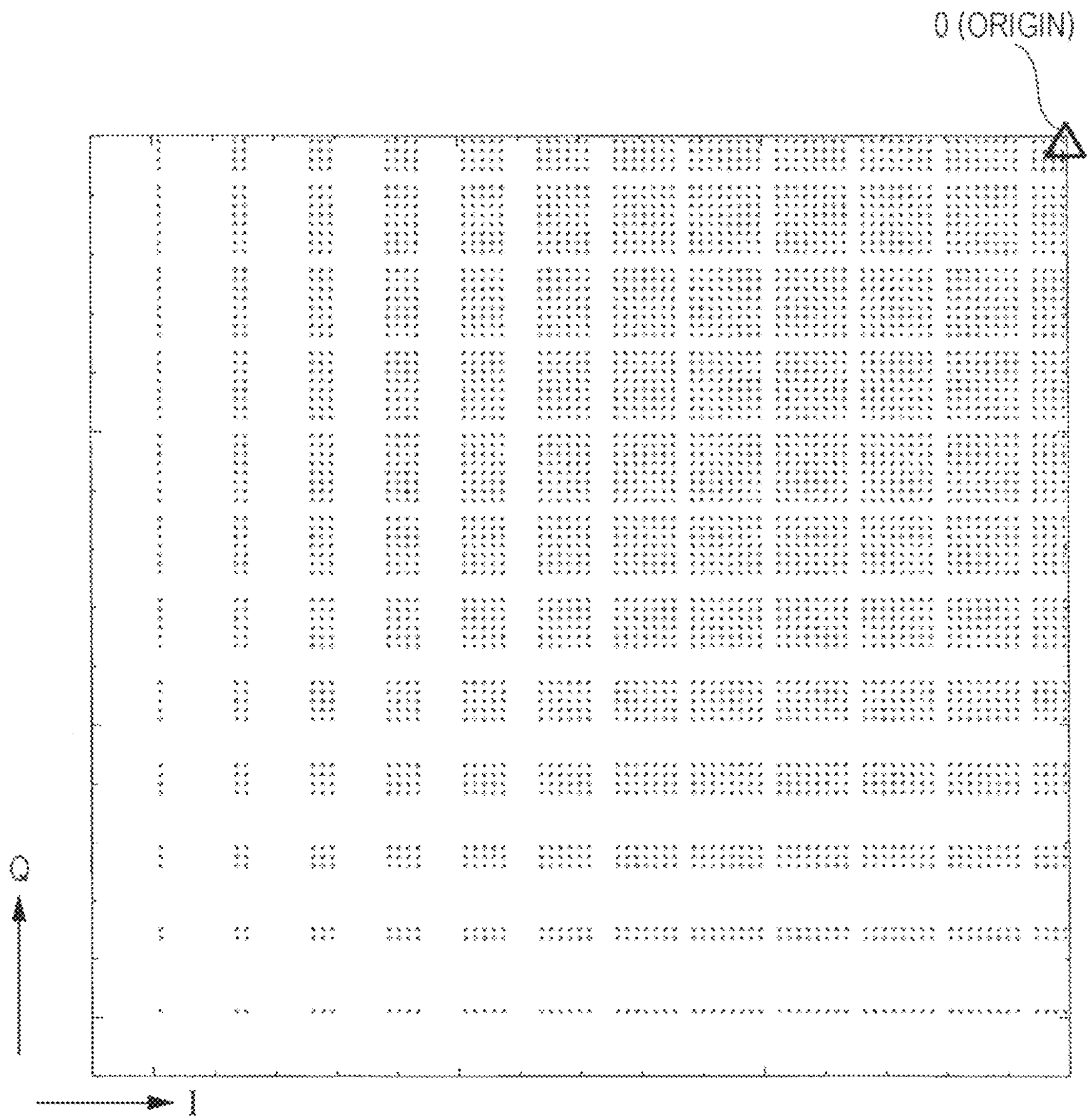
FIG. 23 is a view illustrating an arrangement example of the signal points in a third quadrant of the I-Q plane.
Figure 24:
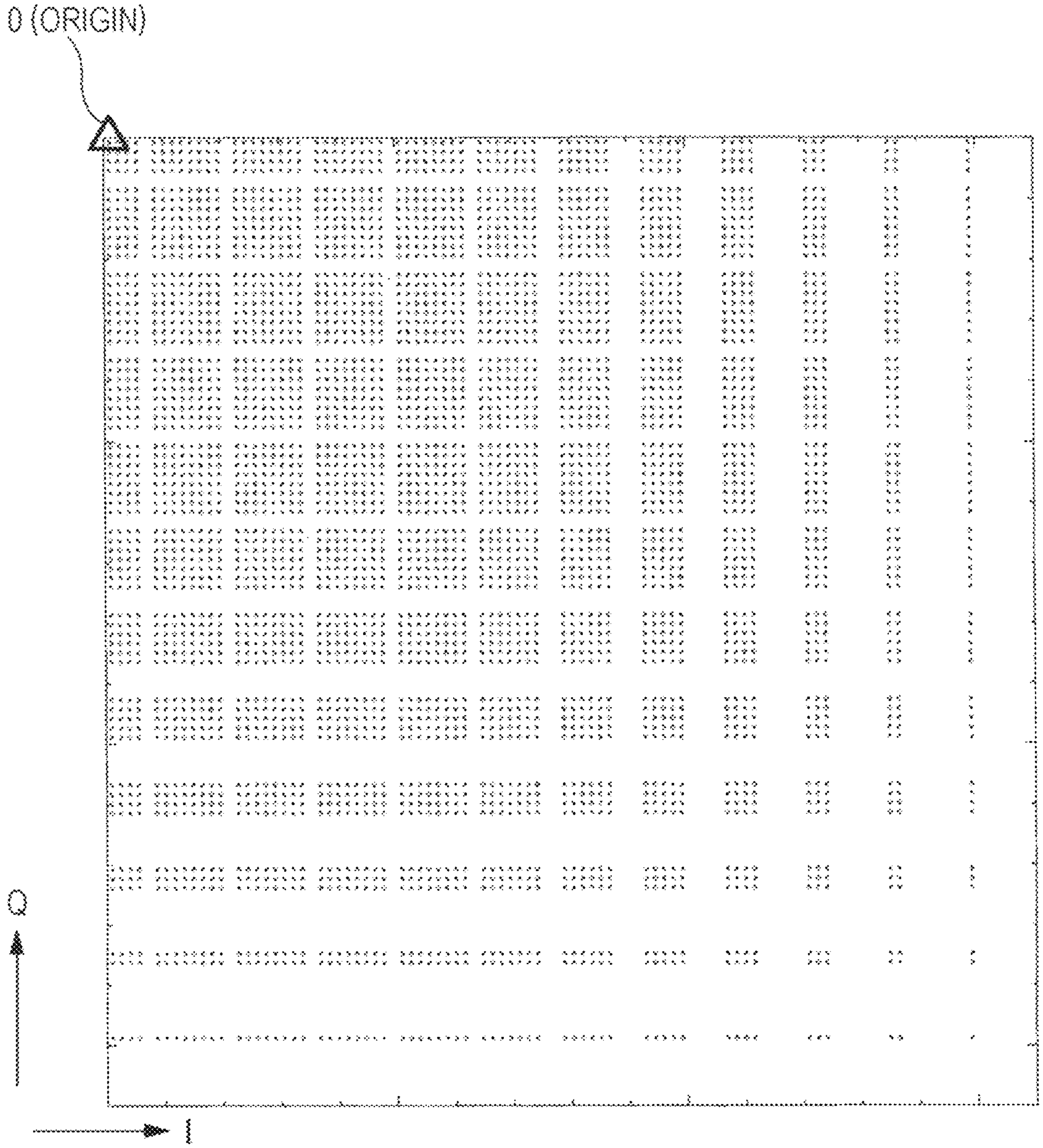
FIG. 24 is a view illustrating an arrangement example of the signal points in a fourth quadrant of the I-Q plane.

In the case that precoding matrix F is set to one of equations (S156), (S157), (S158), and (S159), and that $\alpha$ is set to one of equations (S160), (S161), (S162), and (S163), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, the arrangement of the signal points existing in a first quadrant is obtained as illustrated in FIG. 21, the arrangement of the signal points existing in a second quadrant is obtained as illustrated in FIG. 22, the arrangement of the signal points existing in a third quadrant is obtained as illustrated in FIG. 23, and the arrangement of the signal points existing in a fourth quadrant is obtained as illustrated in FIG. 24. In FIGS. 21, 22, 23, and 24, a horizontal axis indicates I, and a vertical axis indicates Q, a mark "●" indicates a signal point, and a mark "Δ" indicates origin (0).

As can be seen from FIGS. 21, 22, 23, and 24, the 16384 signal points exist while not overlapping one another in the I-Q plane. On the I-Q plane, Euclidean distances between closest signal points are equal in the 16380 signal points of the 16384 signal points except for the rightmost and uppermost point in FIG. 21, the rightmost and lowermost point in FIG. 24, the leftmost and uppermost point in FIG. 22, and the leftmost and lowermost point in FIG. 23. Therefore, the receiver has a high possibility of obtaining the high reception quality.

Figure 25:
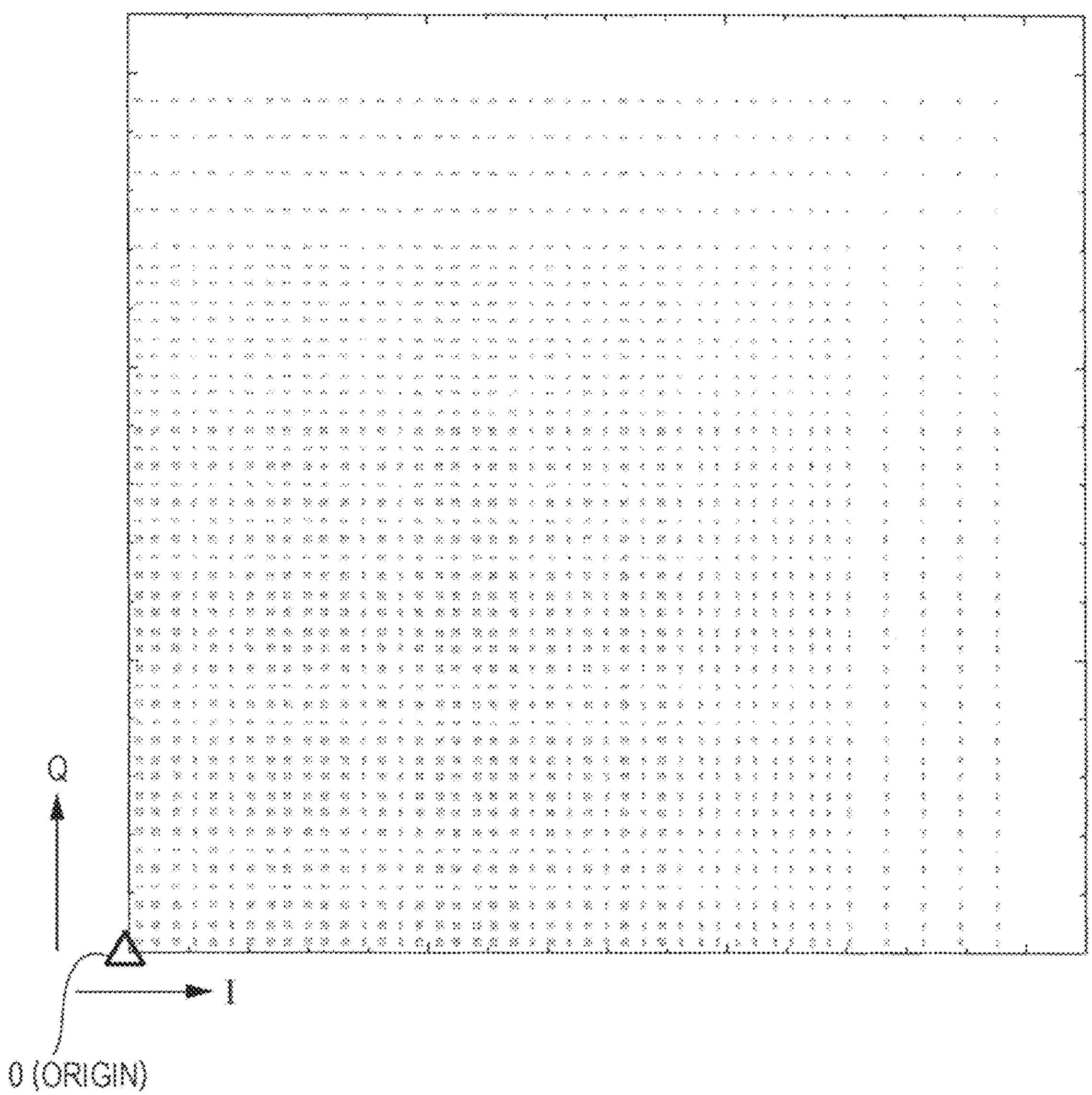
FIG. 25 is a view illustrating an arrangement example of the signal points in the first quadrant of the I-Q plane.
Figure 26:
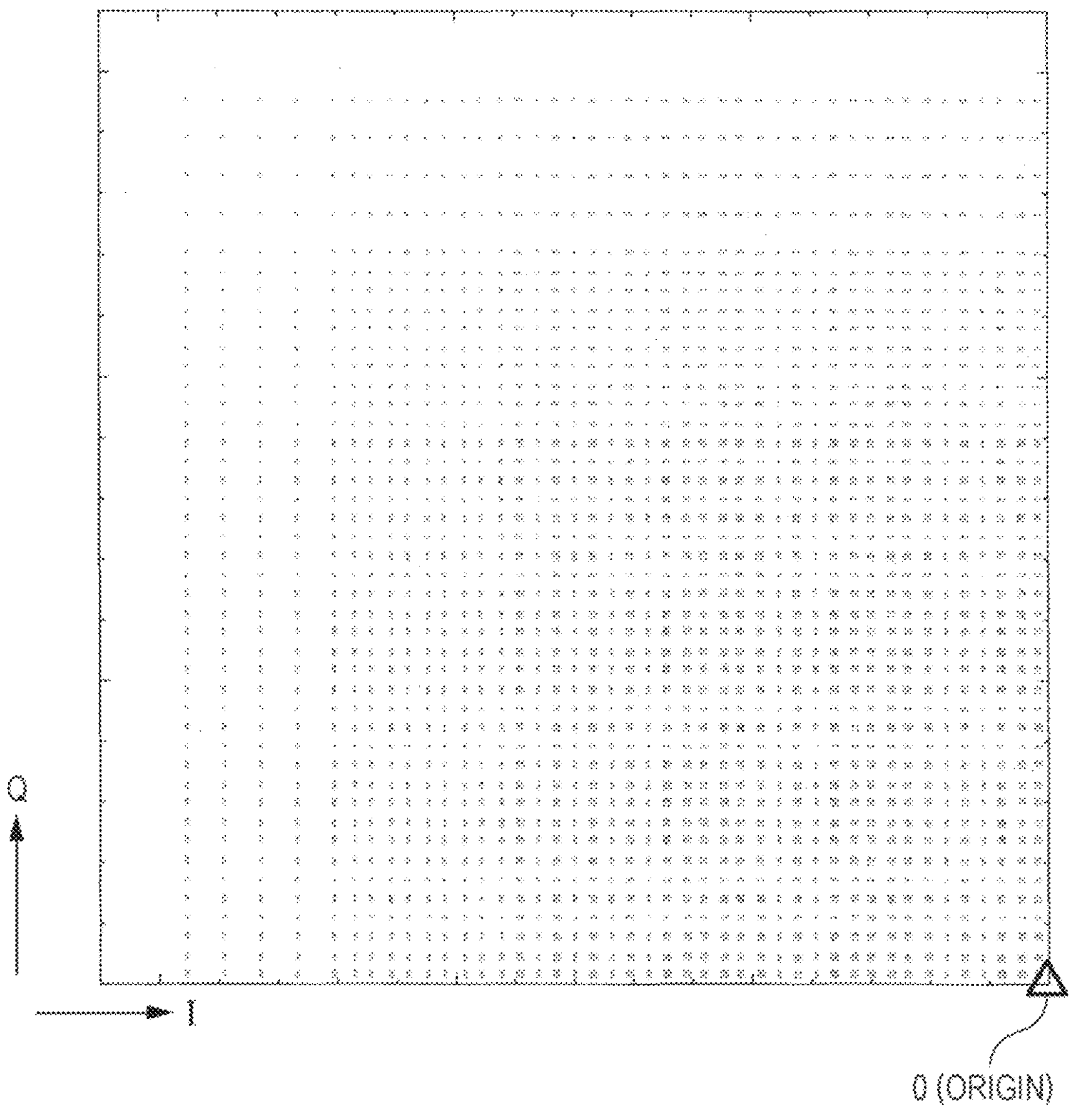
FIG. 26 is a view illustrating an arrangement example of the signal points in the second quadrant of the I-Q plane.
Figure 27:
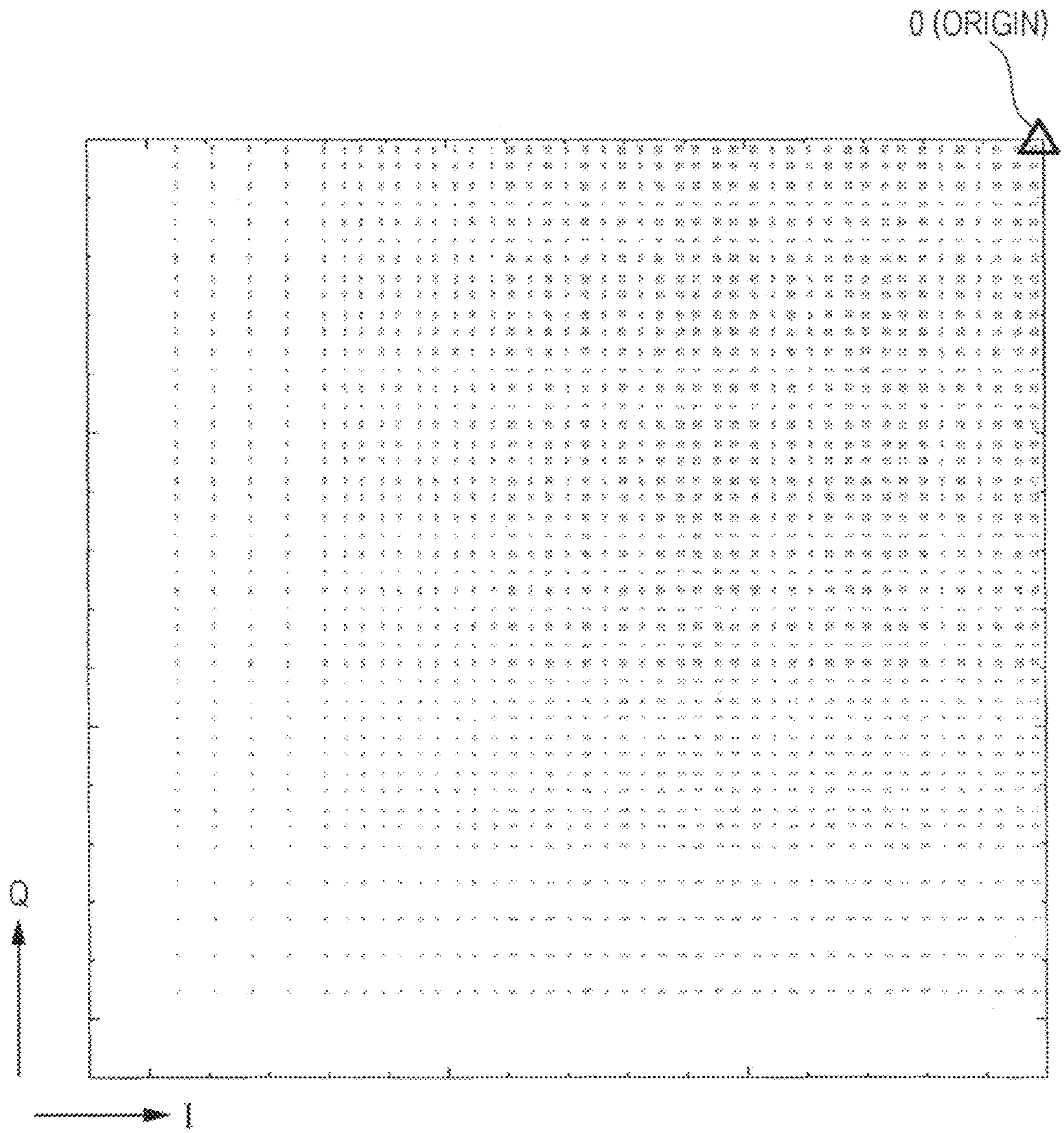
FIG. 27 is a view illustrating an arrangement example of the signal points in the third quadrant of the I-Q plane.
Figure 28:
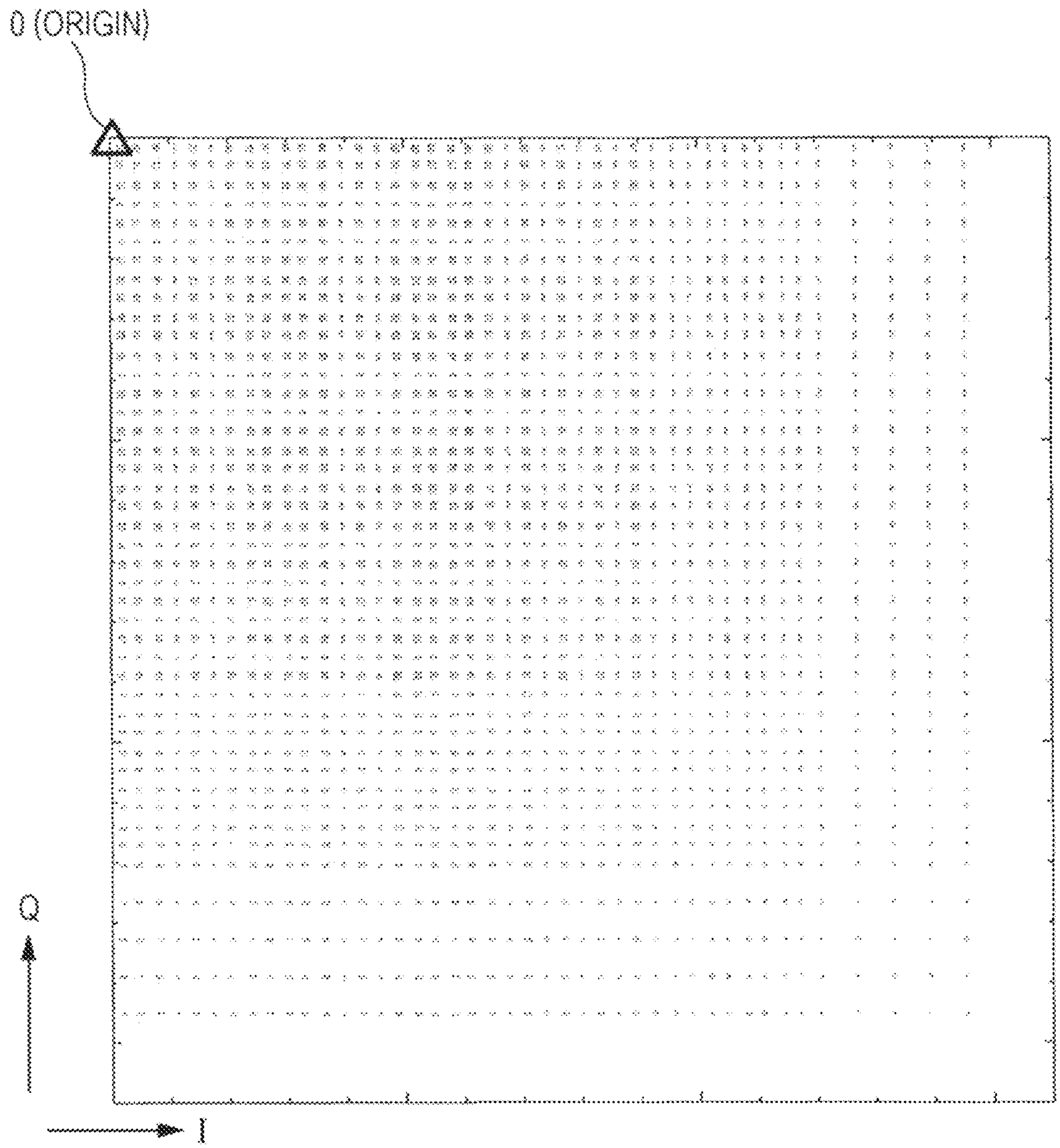
FIG. 28 is a view illustrating an arrangement example of the signal points in the fourth quadrant of the I-Q plane.

In the case that precoding matrix F is set to one of equations (S156), (S157), (S158), and (S159), and that α is set to one of equations (S160), (S161), (S162), and (S163), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, the arrangement of the signal points existing in the first quadrant is obtained as illustrated in FIG. 25, the arrangement of the signal points existing in the second quadrant is obtained as illustrated in FIG. 26, the arrangement of the signal points existing in the third quadrant is obtained as illustrated in FIG. 27, and the arrangement of the signal points existing in the fourth quadrant is obtained as illustrated in FIG. 28. In FIGS. 25, 26, 27, and 28, a horizontal axis indicates I, and a vertical axis indicates Q, a mark "●" indicates a signal point, and a mark "Δ" indicates origin (0).

As can be seen from FIGS. 25, 26, 27, and 28, the 16384 signal points exist while not overlapping one another. Therefore, the receiver has a high possibility of obtaining the high reception quality.

It is assumed that $D_1$ is a minimum Euclidean distance at the 16384 signal points in FIGS. 21, 22, 23, and 24, and that $D_2$ is a minimum Euclidean distance at the 16384 signal points in FIGS. 25, 26, 27, and 28. $D_1>D_2$ holds. Accordingly, from configuration example R1, it is necessary that $|Q_1|>|Q_2|$ holds for $Q_1 \neq Q_2$ in equations (s2), (S3), (S4), (S5), and (S8).

Example 3-2

Then, equations (S153) and (S154) hold with respect to coefficient $w_{64}$ of the 64QAM mapping method and coefficient $w_{256}$ of the 256QAM mapping method, and precoding matrix F is set to one of equations (S22), (S23), (S24), and (S25) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

[Mathematical formula 203]

$$F=\begin{pmatrix}\beta\times\cos\theta & \beta\times\sin\theta\\ \beta\times\sin\theta & -\beta\times\cos\theta\end{pmatrix}\quad\text{Formula (S164)}$$

or

[Mathematical formula 204]

$$F=\begin{pmatrix}\cos\theta & \sin\theta\\ \sin\theta & -\cos\theta\end{pmatrix}\quad\text{Formula (S165)}$$

or

[Mathematical formula 205]

$$F=\begin{pmatrix}\beta\times\cos\theta & -\beta\times\sin\theta\\ \beta\times\sin\theta & \beta\times\cos\theta\end{pmatrix}\quad\text{Formula (S166)}$$

or

[Mathematical formula 206]

$$F=\begin{pmatrix}\cos\theta & -\sin\theta\\ \sin\theta & \cos\theta\end{pmatrix}\quad\text{Formula (S167)}$$

In equations (S164) and (S166), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 207]

$$\theta=\tan^{-1}\left(\frac{\sqrt{170}}{\sqrt{42}}\times\frac{9}{8}\right)\quad\text{Formula (S168)}$$

or $$\tan^{-1}\left(\frac{\sqrt{170}}{\sqrt{42}}\times\frac{9}{8}\right)+2n\pi(\text{radian})$$

or

[Mathematical formula 208]

$$\theta=\pi+\tan^{-1}\left(\frac{\sqrt{170}}{\sqrt{42}}\times\frac{9}{8}\right)\quad\text{Formula (S169)}$$

or $$\pi+\tan^{-1}\left(\frac{\sqrt{170}}{\sqrt{42}}\times\frac{9}{8}\right)+2n\pi(\text{radian})$$

or

[Mathematical formula 209]

$$\theta=\tan^{-1}\left(-\frac{\sqrt{170}}{\sqrt{42}}\times\frac{9}{8}\right)\quad\text{Formula (S170)}$$

or $$\tan^{-1}\left(-\frac{\sqrt{170}}{\sqrt{42}}\times\frac{9}{8}\right)+2n\pi(\text{radian})$$

or

-continued

[Mathematical formula 210]

$$\theta = \pi + \tan^{-1}\left(-\frac{\sqrt{170}}{\sqrt{42}} \times \frac{9}{8}\right) \quad \text{Formula (S171)}$$

or $$\pi + \tan^{-1}\left(-\frac{\sqrt{170}}{\sqrt{42}} \times \frac{9}{8}\right) + 2n\pi(\text{radian})$$

In equations (S168), (S169), (S170), and (S171), $\tan^{-1}(x)$ is an inverse trigonometric function) (an inverse function of a trigonometric function in which a domain is properly restricted), and $\tan^{-1}(x)$ is given as follows.

[Mathematical formula 2111]

$$-\frac{\pi}{2}(\text{radian}) < \tan^{-1}(x) < \frac{\pi}{2}(\text{radian}) \quad \text{Formula (S172)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S164), (S165), (S166), and (S167), and that θ is set to one of equations (S168), (S169), (S170), and (S171), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 21, the arrangement of the signal points existing in the second quadrant is obtained as illustrated in FIG. 22, the arrangement of the signal points existing in the third quadrant is obtained as illustrated in FIG. 23, and the arrangement of the signal points existing in the fourth quadrant is obtained as illustrated in FIG. 24. In FIGS. 21,22, 23, and 24, a horizontal axis indicates I, and a vertical axis indicates Q, a mark "●" indicates a signal point, and a mark "Δ" indicates origin (0).

As can be seen from FIGS. 21, 22, 23, and 24, the 16384 signal points exist while not overlapping one another in the I-Q plane. On the I-Q plane, Euclidean distances between closest signal points are equal in the 16380 signal points of the 16384 signal points except for the rightmost and uppermost point in FIG. 21, the rightmost and lowermost point in FIG. 24, the leftmost and uppermost point in FIG. 22, and the leftmost and lowermost point in FIG. 23. Therefore, the receiver has a high possibility of obtaining the high reception quality.

In the case that precoding matrix F is set to one of equations (S164), (S165), (S166), and (S167), and that θ is set to one of equations (S168), (S169), (S170), and (S171), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 25, the arrangement of the signal points existing in the second quadrant is obtained as illustrated in FIG. 26, the arrangement of the signal points existing in the third quadrant is obtained as illustrated in FIG. 27, and the arrangement of the signal points existing in the fourth quadrant is obtained as illustrated in FIG. 28. In FIGS. 25, 26, 27, and 28, a horizontal axis indicates I, and a vertical axis indicates Q, a mark "●" indicates a signal point, and a mark "Δ" indicates origin (0).

As can be seen from FIGS. 25, 26, 27, and 28, the 16384 signal points exist while not overlapping one another. Therefore, the receiver has a high possibility of obtaining the high reception quality.

It is assumed that $D_1$ is a minimum Euclidean distance at the 16384 signal points in FIGS. 21, 22, 23, and 24, and that $D_2$ is a minimum Euclidean distance at the 16384 signal points in FIGS. 25, 26, 27, and 28. $D_1 > D_2$ holds. Accordingly, from configuration example R1, it is necessary that $|Q_1|>|Q_2|$ holds for $Q_1 \neq Q_2$ in equations (s2), (S3), (S4), (S5), and (S8).

Example 3-3

Equations (S153) and (S154) hold with respect to coefficient $w_{64}$ of the 64QAM mapping method and coefficient $w_{256}$ of the 256QAM mapping method, and precoding matrix F is set to one of equations (S173), (S174), (S175), and (S176) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

[Mathematical formula 212]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S173)}$$

or

[Mathematical formula 213]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{Formula (S174)}$$

or

[Mathematical formula 214]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S175)}$$

or

[Mathematical formula 215]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{Formula (S176)}$$

In equations (S173), (S174), (S175), and (S176), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_1(t)$ ($z_1(i)$) in equations (s2), (S3), (S4), (S5), and (S8), the following equations are considered as value α with which the receiver obtains the good data reception quality.

When α is a real number:

[Mathematical formula 216]

$$\alpha = \frac{\sqrt{170}}{\sqrt{42}} \times \frac{8}{9} \quad \text{Formula (S177)}$$

or

[Mathematical formula 217]

$$\alpha = -\frac{\sqrt{170}}{\sqrt{42}} \times \frac{8}{9} \quad \text{Formula (S178)}$$

When α is an imaginary number:

[Mathematical formula 218]

$$\alpha = \frac{\sqrt{170}}{\sqrt{42}} \times \frac{8}{9} \times e^{j\frac{\pi}{2}} \quad \text{Formula (S179)}$$

or

[Mathematical formula 219]

$$\alpha = \frac{\sqrt{170}}{\sqrt{42}} \times \frac{8}{9} \times e^{j\frac{3\pi}{2}} \quad \text{Formula (S180)}$$

Figure 29:
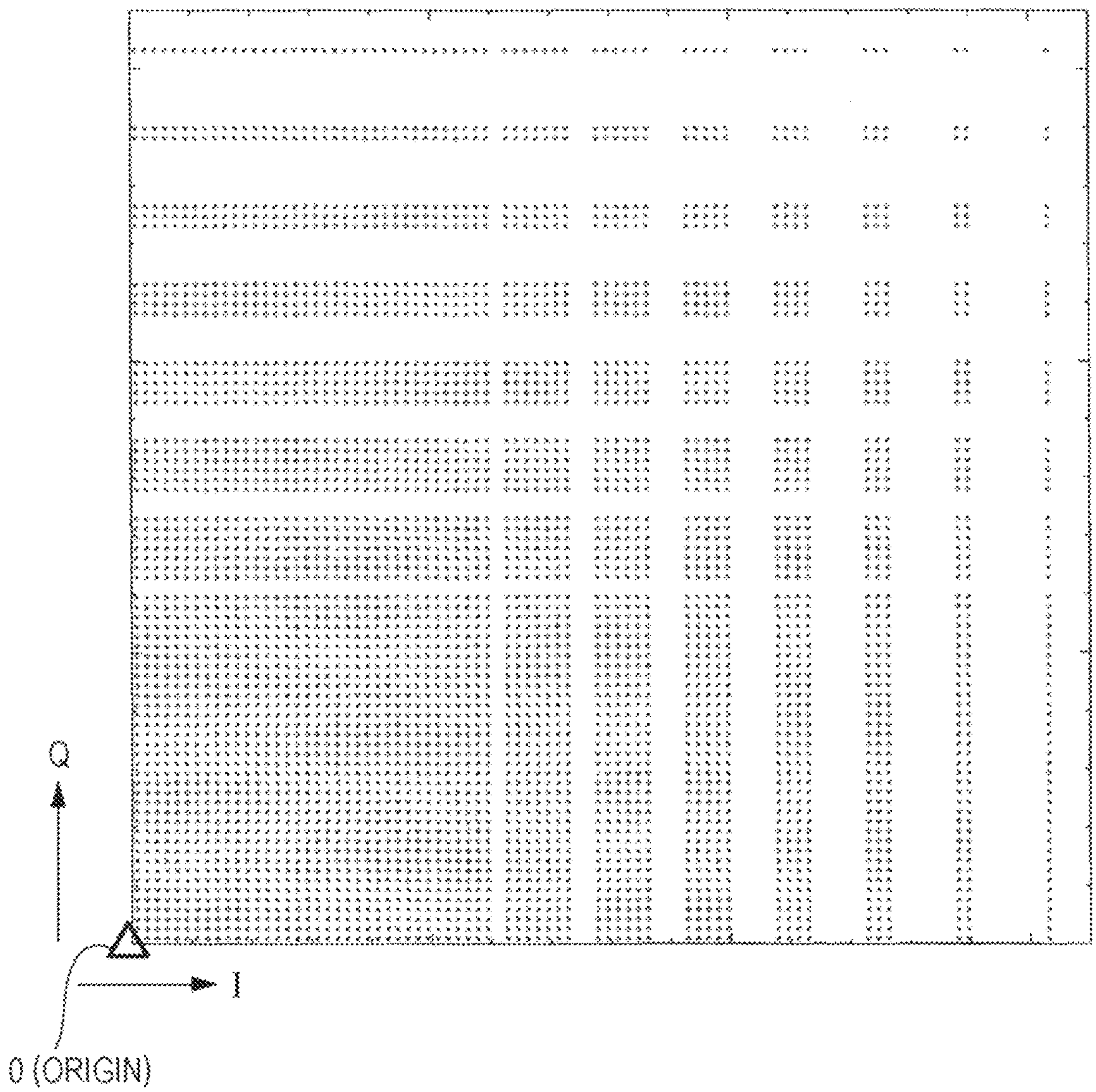
FIG. 29 is a view illustrating an arrangement example of the signal points in the first quadrant of the I-Q plane.
Figure 30:
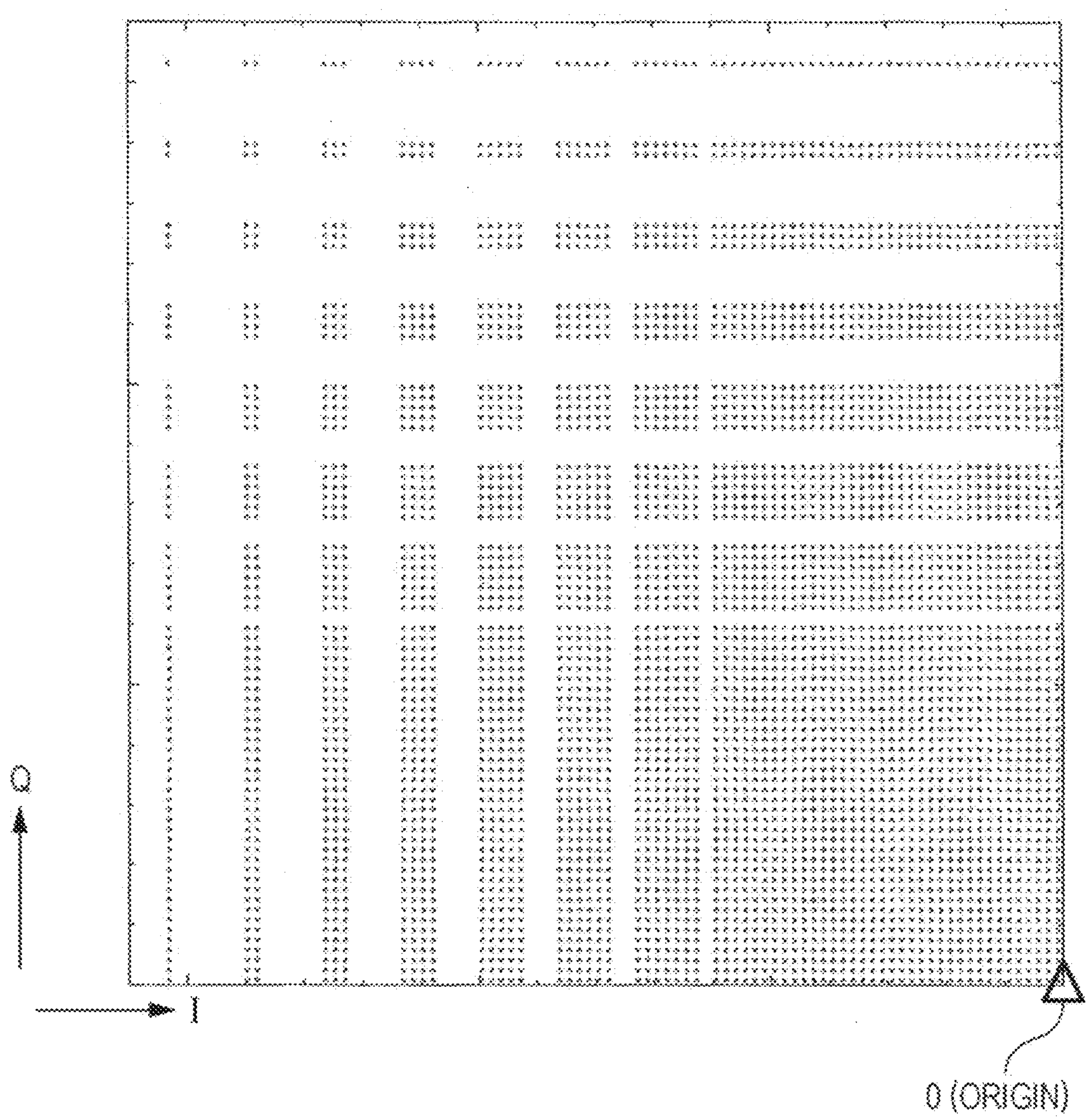
FIG. 30 is a view illustrating an arrangement example of the signal points in the second quadrant of the I-Q plane.
Figure 31:
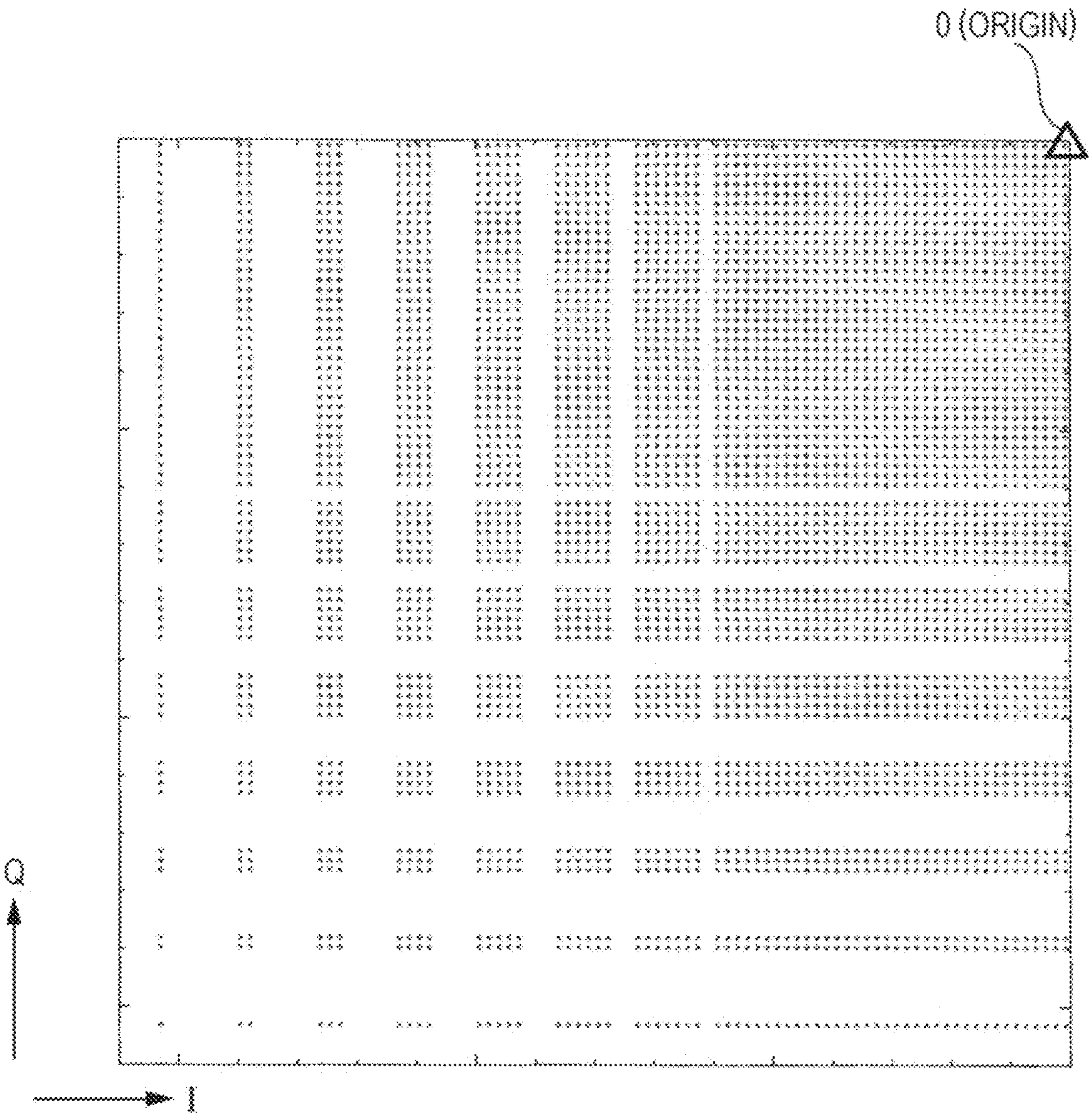
FIG. 31 is a view illustrating an arrangement example of the signal points in the third quadrant of the I-Q plane.
Figure 32:
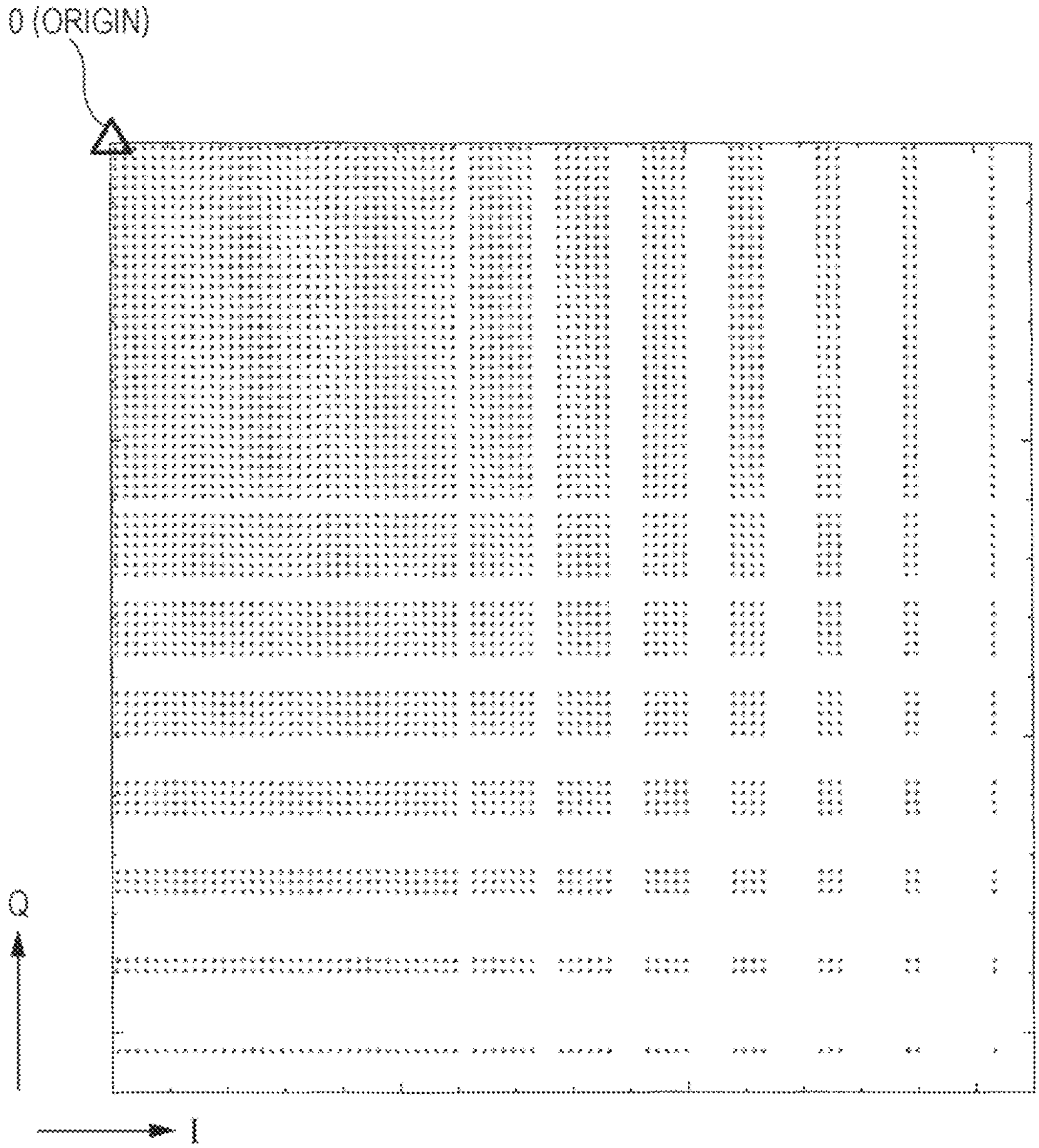
FIG. 32 is a view illustrating an arrangement example of the signal points in the fourth quadrant of the I-Q plane.

In the case that precoding matrix F is set to one of equations (S173), (S174), (S175), and (S176), and that α is set to one of equations (S177), (S178), (S179), and (S180), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 29, the arrangement of the signal points existing in the second quadrant is obtained as illustrated in FIG. 30, the arrangement of the signal points existing in the third quadrant is obtained as illustrated in FIG. 31, and the arrangement of the signal points existing in the fourth quadrant is obtained as illustrated in FIG. 32. In FIGS. 29, 30, 31, and 32, a horizontal axis indicates I, and a vertical axis indicates Q, a mark "●" indicates a signal point, and a mark "Δ" indicates origin (0).

As can be seen from FIGS. 29, 30, 31, and 32, the 16384 signal points exist while not overlapping one another. On the I-Q plane, Euclidean distances between closest signal points are equal in the 16380 signal points of the 16384 signal points except for the rightmost and uppermost point in FIG. 29, the rightmost and lowermost point in FIG. 32, the leftmost and uppermost point in FIG. 30, and the leftmost and lowermost point in FIG. 31. Therefore, the receiver has a high possibility of obtaining the high reception quality.

Figure 33:
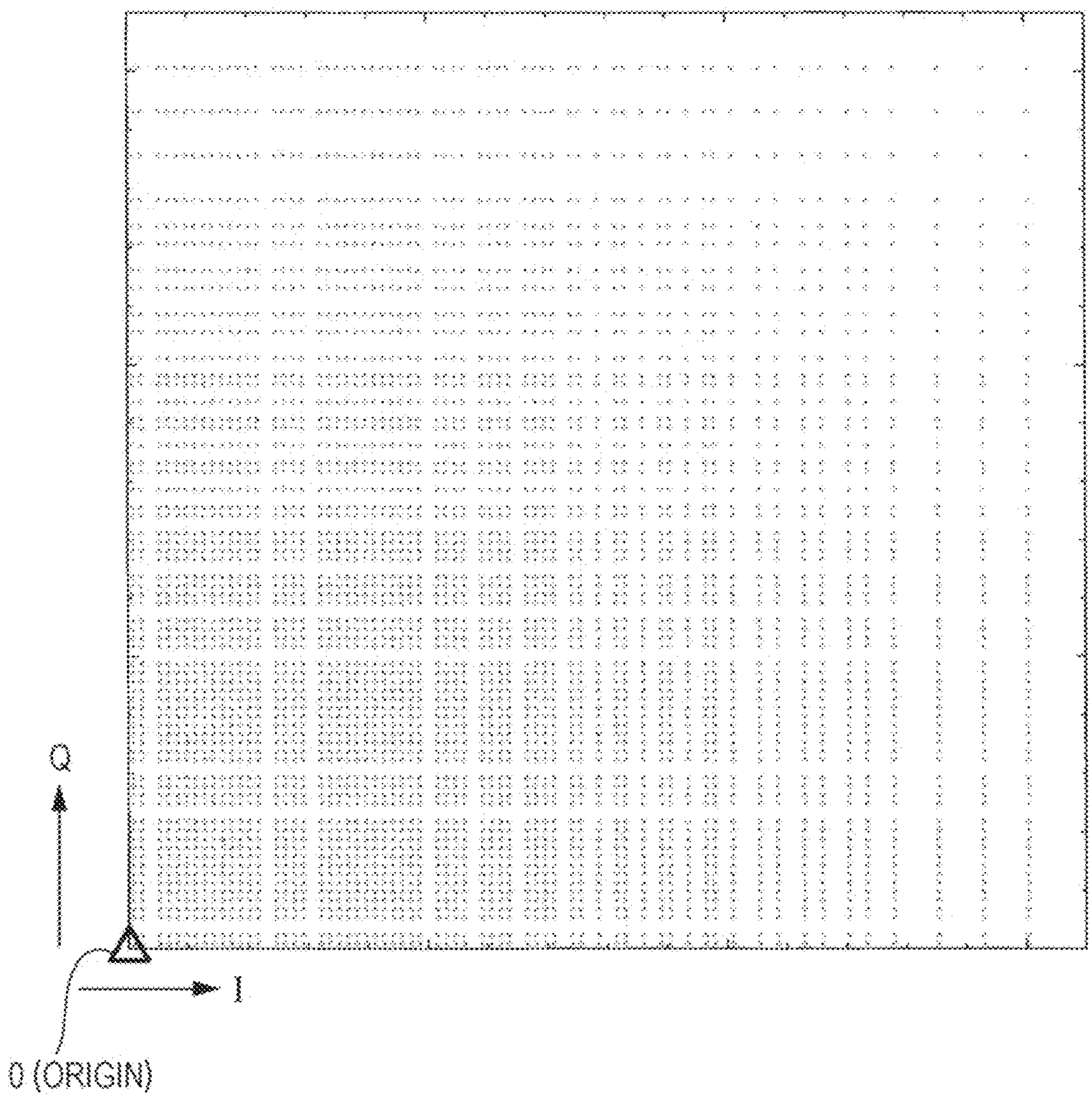
FIG. 33 is a view illustrating an arrangement example of the signal points in the first quadrant of the I-Q plane.
Figure 34:
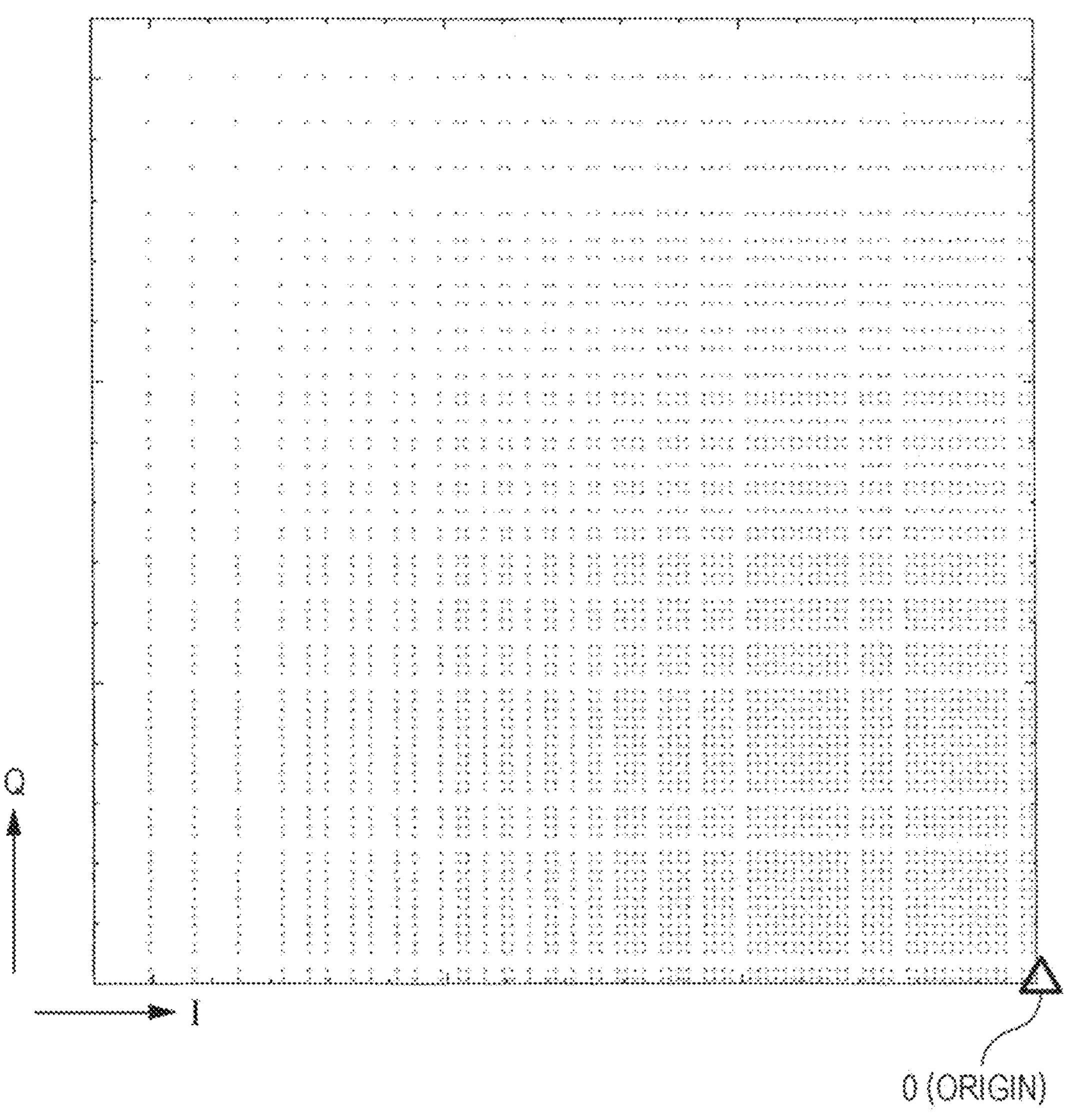
FIG. 34 is a view illustrating an arrangement example of the signal points in the second quadrant of the I-Q plane.
Figure 35:
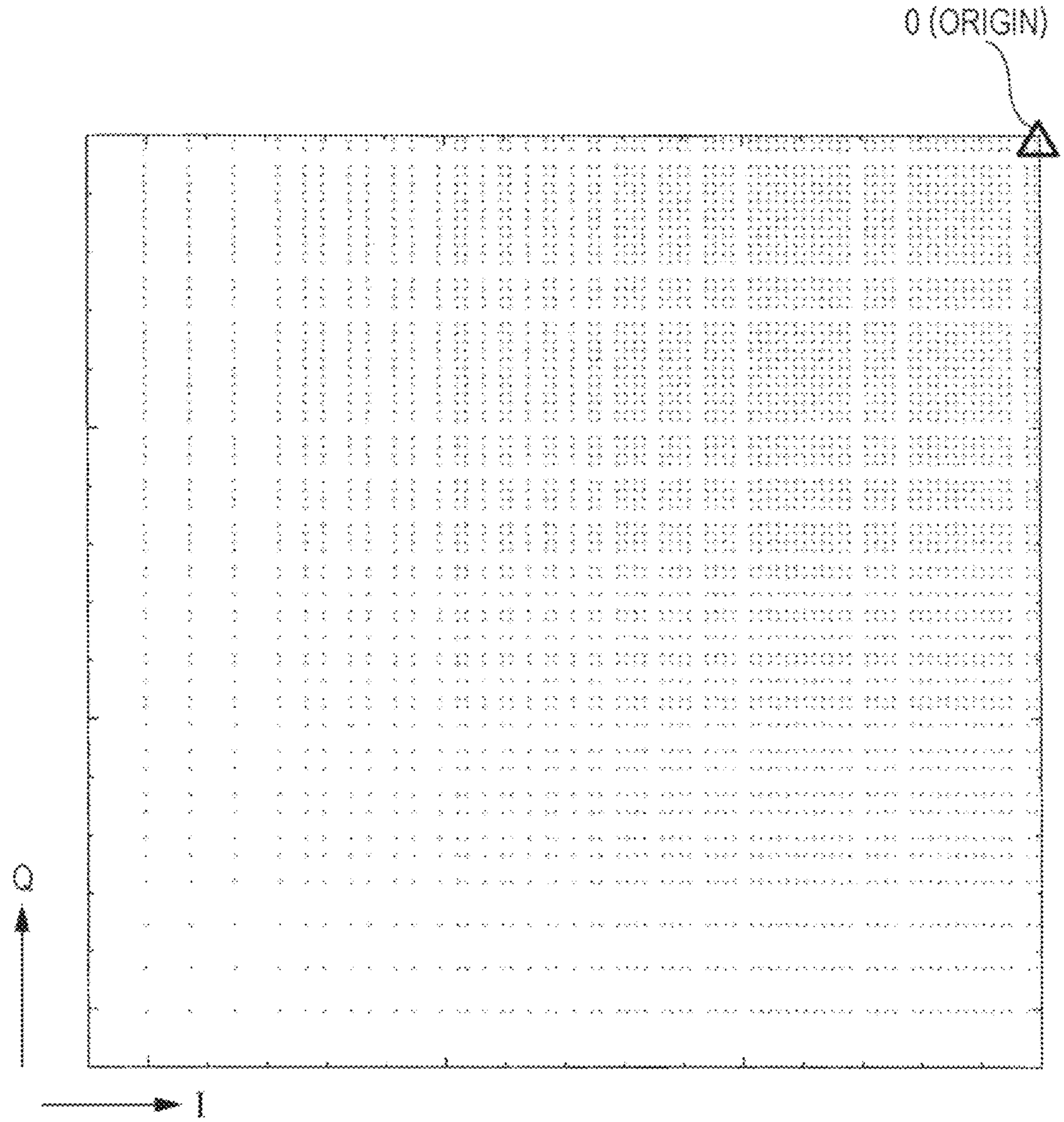
FIG. 35 is a view illustrating an arrangement example of the signal points in the third quadrant of the I-Q plane.
Figure 36:
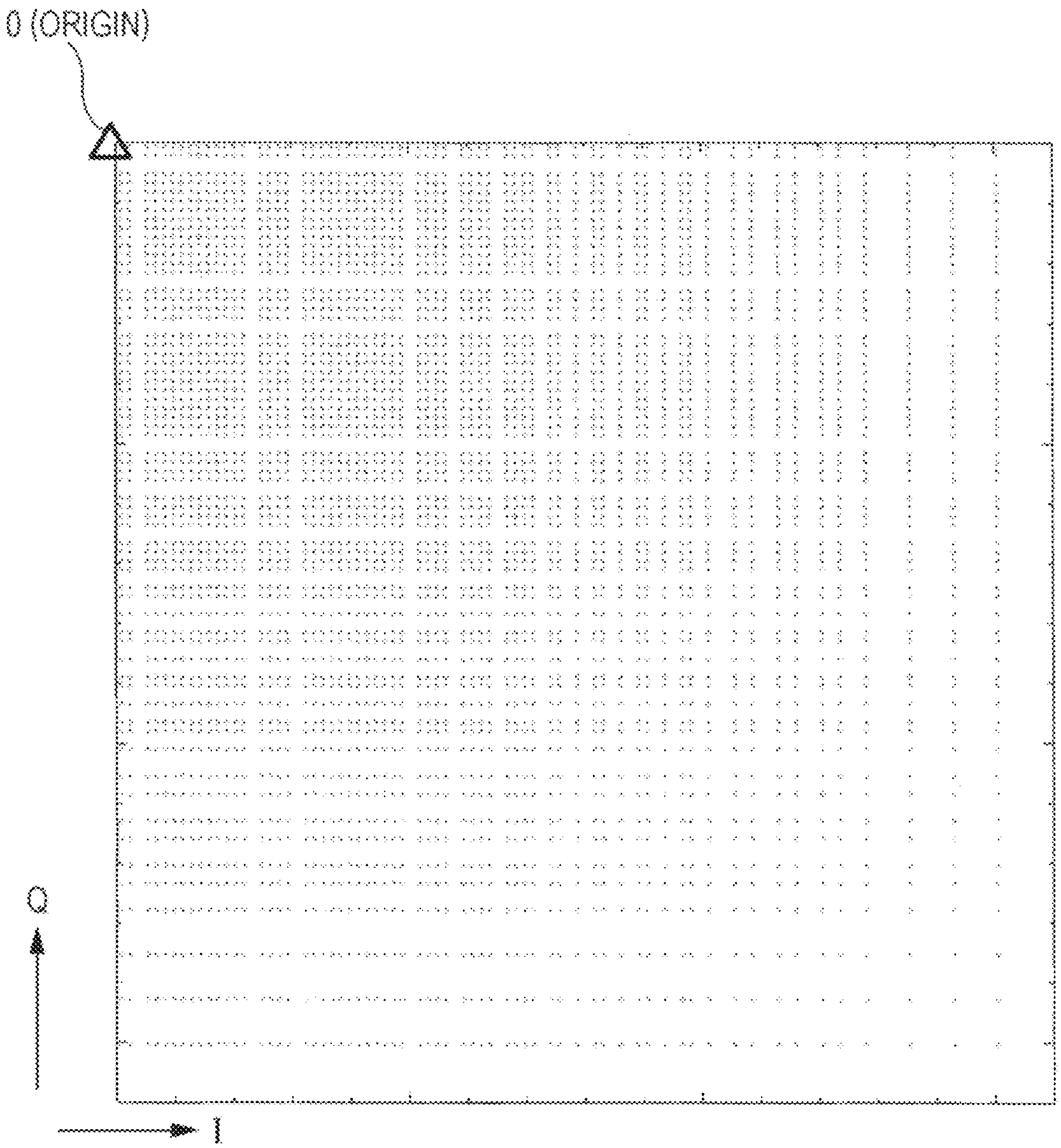
FIG. 36 is a view illustrating an arrangement example of the signal points in the fourth quadrant of the I-Q plane.

In the case that precoding matrix F is set to one of equations (S173), (S174), (S175), and (S176), and that α is set to one of equations (S177), (S178), (S179), and (S180), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 33, the arrangement of the signal points existing in the second quadrant is obtained as illustrated in FIG. 34, the arrangement of the signal points existing in the third quadrant is obtained as illustrated in FIG. 35, and the arrangement of the signal points existing in the fourth quadrant is obtained as illustrated in FIG. 36. In FIGS. 33, 34, 35, and 36, a horizontal axis indicates I, and a vertical axis indicates Q, a mark "●" indicates a signal point, and a mark "Δ" indicates origin (0).

As can be seen from FIGS. 33, 34, 35, and 36, the 1024 signal points exist while not overlapping one another. Therefore, the receiver has a high possibility of obtaining the high reception quality.

It is assumed that $D_1$ is a minimum Euclidean distance at the 16384 signal points in FIGS. 29, 30, 31, and 32, and that $D_2$ is a minimum Euclidean distance at the 16384 signal points in FIGS. 33, 34, 35, and 36. $D_1>D_2$ holds. Accordingly, from configuration example R1, it is necessary that $|Q_1|>|Q_2|$ holds for $Q_1 \neq Q_2$ in equations (s2), (S3), (S4), (S5), and (S8).

Example 3-4

Then, equations (S153) and (S154) hold with respect to coefficient $w_{64}$ of the 64QAM mapping method and coefficient $w_{256}$ of the 256QAM mapping method, and precoding matrix F is set to one of equations (S22), (S23), (S24), and (S25) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

[Mathematical formula 220]

$$F = \begin{pmatrix} \beta \times \cos\theta & \beta \times \sin\theta \\ \beta \times \sin\theta & -\beta \times \cos\theta \end{pmatrix} \quad \text{Formula (S181)}$$

or

[Mathematical formula 221]

$$F = \begin{pmatrix} \cos\theta & \sin\theta \\ \sin\theta & -\cos\theta \end{pmatrix} \quad \text{Formula (S182)}$$

or

[Mathematical formula 222]

$$F = \begin{pmatrix} \beta \times \cos\theta & -\beta \times \sin\theta \\ \beta \times \sin\theta & \beta \times \cos\theta \end{pmatrix} \quad \text{Formula (S183)}$$

or

[Mathematical formula 223]

$$F = \begin{pmatrix} \cos\theta & -\sin\theta \\ \sin\theta & \cos\theta \end{pmatrix} \quad \text{Formula (S184)}$$

In equations (S181) and (S183), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 224]

$$\theta = \tan^{-1}\left(\frac{\sqrt{170}}{\sqrt{42}} \times \frac{8}{9}\right) \text{ or } \tan^{-1}\left(\frac{\sqrt{170}}{42} \times \frac{8}{9}\right) + 2n\pi \text{ (radian)} \quad \text{Formula (S185)}$$

or

[Mathematical formula 225]

$$\theta = \pi + \tan^{-1}\left(\frac{\sqrt{170}}{\sqrt{42}} \times \frac{8}{9}\right) \text{ or } \pi + \tan^{-1}\left(\frac{\sqrt{170}}{42} \times \frac{8}{9}\right) + 2n\pi \text{ (radian)} \quad \text{Formula (S186)}$$

or

[Mathematical formula 226]

$$\theta = \tan^{-1}\left(-\frac{\sqrt{170}}{\sqrt{42}} \times \frac{8}{9}\right) \text{ or } \tan^{-1}\left(-\frac{\sqrt{170}}{42} \times \frac{8}{9}\right) + 2n\pi \text{ (radian)} \quad \text{Formula (S187)}$$

or

[Mathematical formula 227]

$$\theta = \pi + \tan^{-1}\left(-\frac{\sqrt{170}}{\sqrt{42}} \times \frac{8}{9}\right) \text{ or } \pi + \tan^{-1}\left(-\frac{\sqrt{170}}{42} \times \frac{8}{9}\right) + 2n\pi \text{ (radian)} \quad \text{Formula (S188)}$$

In equations (S185), (S186), (S187), and (S188), $\tan^{-1}(x)$ is an inverse trigonometric function) (an inverse function of a trigonometric function in which a domain is properly restricted), and $\tan^{-1}(x)$ is given as follows.

[Mathematical formula 228]

$$-\frac{\pi}{2} \text{ (radian)} < \tan^{-1}(x) < \frac{\pi}{2} \text{ (radian)} \quad \text{Formula (S189)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S181), (S182), (S183), and (S184), and that θ is set to one of equations (S185), (S186), (S187), and (S188), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 29, the arrangement of the signal points existing in the second quadrant is obtained as illustrated in FIG. 30, the arrangement of the signal points existing in the third quadrant is obtained as illustrated in FIG. 31, and the arrangement of the signal points existing in the fourth quadrant is obtained as illustrated in FIG. 32. In FIGS. 29, 30, 31, and 32, a horizontal axis indicates I, and a vertical axis indicates Q, a mark "●" indicates a signal point, and a mark "Δ" indicates origin (0).

As can be seen from FIGS. 29, 30, 31, and 32, the 16384 signal points exist while not overlapping one another in the I-Q plane. On the I-Q plane, Euclidean distances between closest signal points are equal in the 16380 signal points of the 16384 signal points except for the rightmost and uppermost point in FIG. 29, the rightmost and lowermost point in FIG. 32, the leftmost and uppermost point in FIG. 30, and the leftmost and lowermost point in FIG. 31. Therefore, the receiver has a high possibility of obtaining the high reception quality.

In the case that precoding matrix F is set to one of equations (S181), (S182), (S183), and (S184), and that θ is set to one of equations (S185), (S186), (S187), and (S188), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 33, the arrangement of the signal points existing in the second quadrant is obtained as illustrated in FIG. 34, the arrangement of the signal points existing in the third quadrant is obtained as illustrated in FIG. 35, and the arrangement of the signal points existing in the fourth quadrant is obtained as illustrated in FIG. 36. In FIGS. 33, 34, 35, and 36, a horizontal axis indicates I, and a vertical axis indicates Q, a mark "●" indicates a signal point, and a mark "Δ" indicates origin (0).

As can be seen from FIGS. 33, 34, 35, and 36, the 16384 signal points exist while not overlapping one another. Therefore, the receiver has a high possibility of obtaining the high reception quality.

It is assumed that $D_1$ is a minimum Euclidean distance at the 16384 signal points in FIGS. 29, 30, 31, and 32, and that $D_2$ is a minimum Euclidean distance at the 16384 signal points in FIGS. 33, 34, 35, and 36. $D_1 > D_2$ holds. Accordingly, from configuration example R1, it is necessary that $Q_1 > Q_2$ holds for $Q_1 \neq Q_2$ in equations (s2), (S3), (S4), (S5), and (S8).

Example 3-5

Equations (S153) and (S154) hold with respect to coefficient $w_{64}$ of the 64QAM mapping method and coefficient $w_{256}$ of the 256QAM mapping method, and precoding matrix F is set to one of equations (S173), (S174), (S175), and (S176) when the calculations are performed in <1> to <5>.

<1> For $P_1^2 = P_2^2$ in equation (s2)
<2> For $P_1^2 = P_2^2$ in equation (S3)
<3> For $P_1^2 = P_2^2$ in equation (S4)
<4> For equation (S5)
<5> For equation (S8)

[Mathematical formula 229]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S190)}$$

or

[Mathematical formula 230]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (S191)}$$

or

[Mathematical formula 231]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S192)}$$

or

-continued

[Mathematical formula 232]

$$F = \frac{1}{\sqrt{\alpha^2+1}}\begin{pmatrix} e^{j0} & \alpha\times e^{j\pi} \\ \alpha\times e^{j0} & e^{j0} \end{pmatrix} \quad \text{Formula (S193)}$$

In equations (S190), (S191), (S192), and (S193), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_2(t)$ ($z_2(i)$) in equations (s2), (S3), (S4), (S5), and (S8), the following equations are considered as value α with which the receiver obtains the good data reception quality.

When α is a real number:

[Mathematical formula 233]

$$\alpha = \frac{\sqrt{42}}{170}\times\frac{9}{8} \quad \text{Formula (S194)}$$

or

[Mathematical formula 234]

$$\alpha = -\frac{\sqrt{42}}{\sqrt{170}}\times\frac{9}{8} \quad \text{Formula (S195)}$$

When α is an imaginary number:

[Mathematical formula 235]

$$\alpha = \frac{\sqrt{42}}{\sqrt{170}}\times\frac{9}{8}\times e^{j\frac{\pi}{2}} \quad \text{Formula (S196)}$$

or

[Mathematical formula 236]

$$\alpha = \frac{\sqrt{42}}{\sqrt{170}}\times\frac{9}{8}\times e^{j\frac{3\pi}{2}} \quad \text{Formula (S197)}$$

Figure 37:
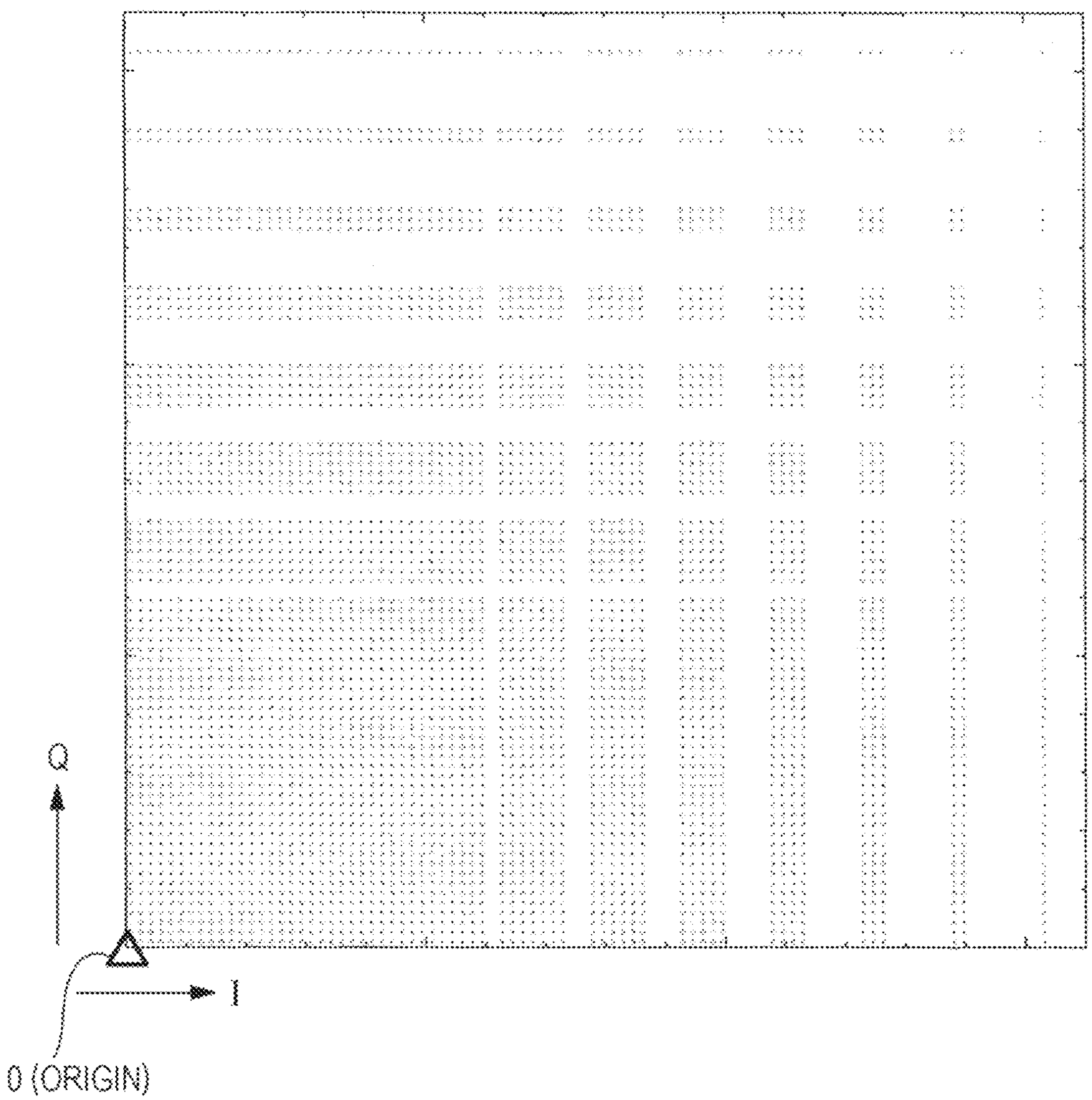
FIG. 37 is a view illustrating an arrangement example of the signal points in the first quadrant of the I-Q plane.
Figure 38:
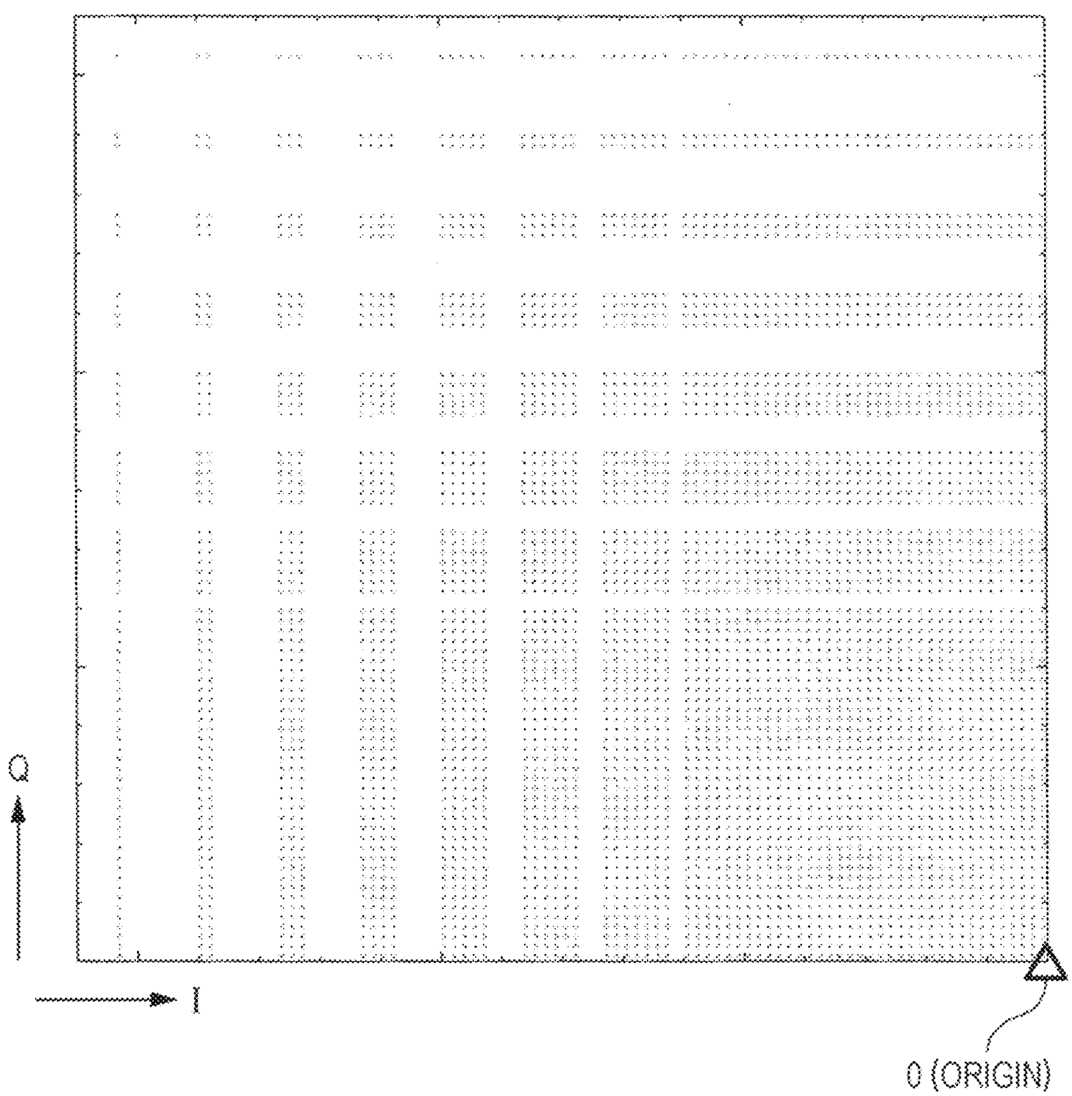
FIG. 38 is a view illustrating an arrangement example of the signal points in the second quadrant of the I-Q plane.
Figure 39:
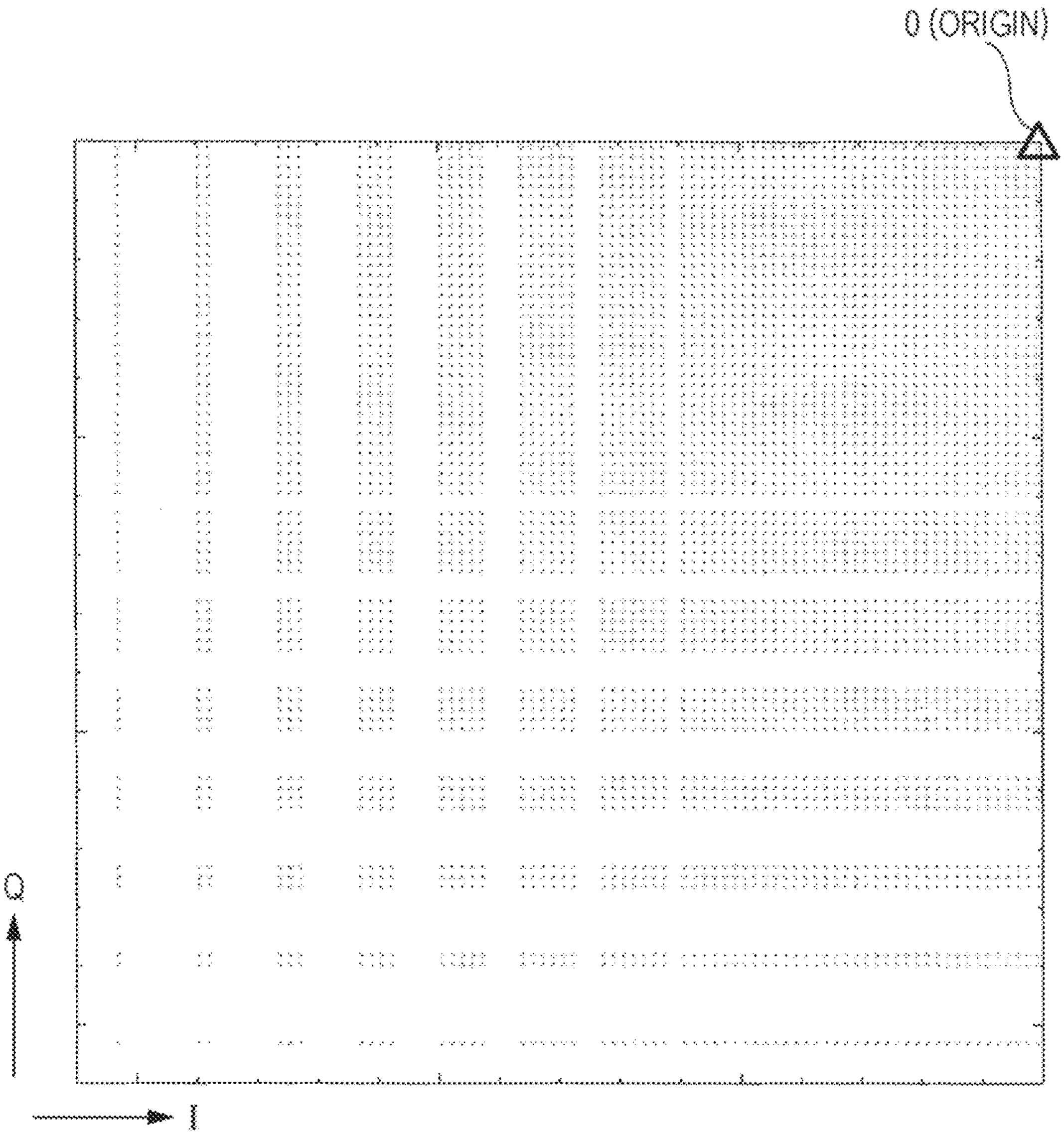
FIG. 39 is a view illustrating an arrangement example of the signal points in the third quadrant of the I-Q plane.
Figure 40:
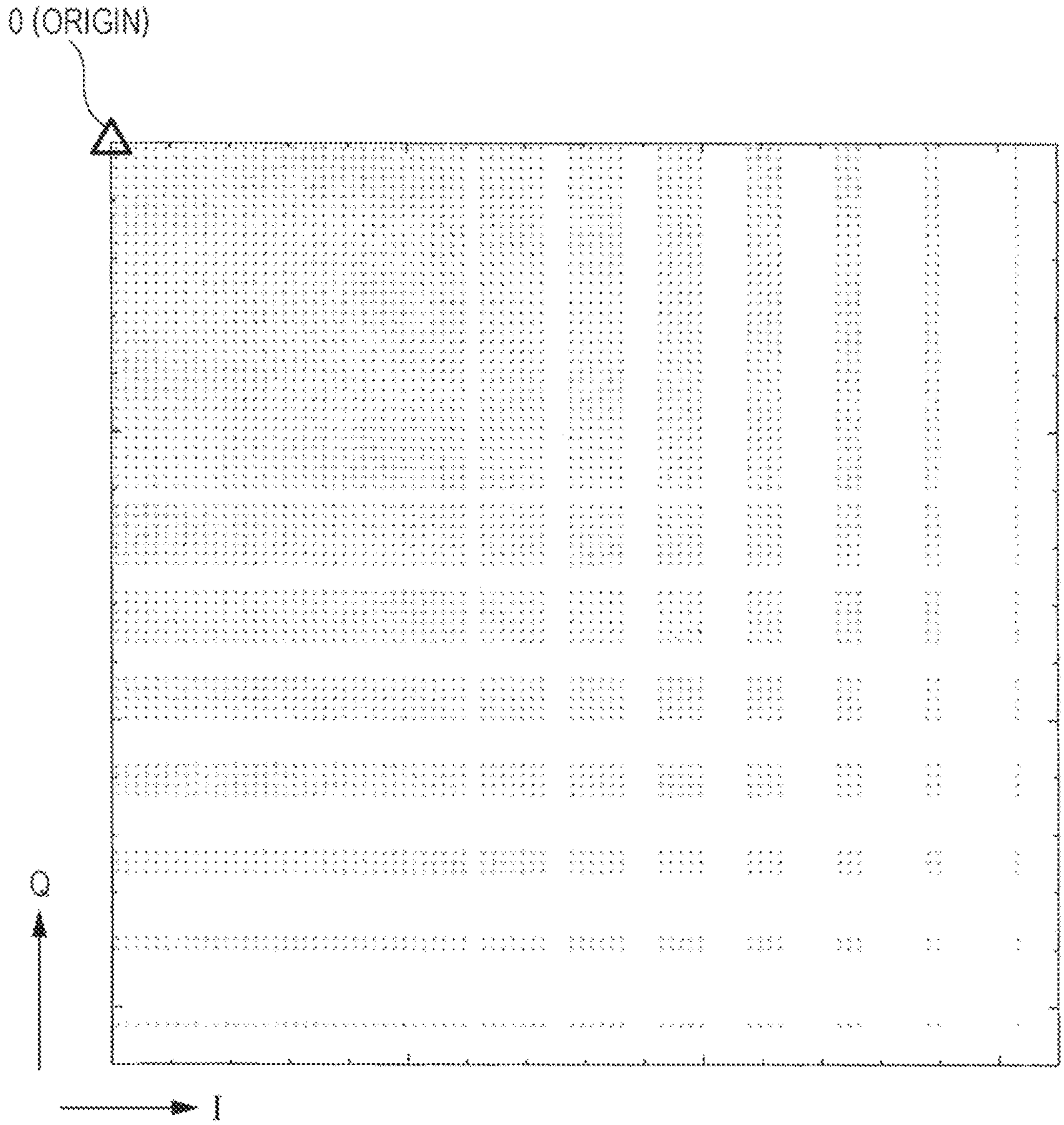
FIG. 40 is a view illustrating an arrangement example of the signal points in the fourth quadrant of the I-Q plane.

In the case that precoding matrix F is set to one of equations (S190), (S191), (S192), and (S193), and that α is set to one of equations (S194), (S195), (S196), and (S197), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q the I-Q plane, similarly the arrangement of the signal points existing in the first quadrant is obtained as illustrated in FIG. 37, the arrangement of the signal points existing in the second quadrant is obtained as illustrated in FIG. 38, the arrangement of the signal points existing in the third quadrant is obtained as illustrated in FIG. 39, and the arrangement of the signal points existing in the fourth quadrant is obtained as illustrated in FIG. 40. In FIGS. 37, 38, 39, and 40, a horizontal axis indicates I, and a vertical axis indicates Q, a mark "●" indicates a signal point, and a mark "Δ" indicates origin (0).

As can be seen from FIGS. 37, 38, 39, and 40, the 16384 signal points exist while not overlapping one another. On the I-Q plane, Euclidean distances between closest signal points are equal in the 16380 signal points of the 16384 signal points except for the rightmost and uppermost point in FIG. 37, the rightmost and lowermost point in FIG. 40, the leftmost and uppermost point in FIG. 38, and the leftmost and lowermost point in FIG. 39. Therefore, the receiver has a high possibility of obtaining the high reception quality.

Figure 41:
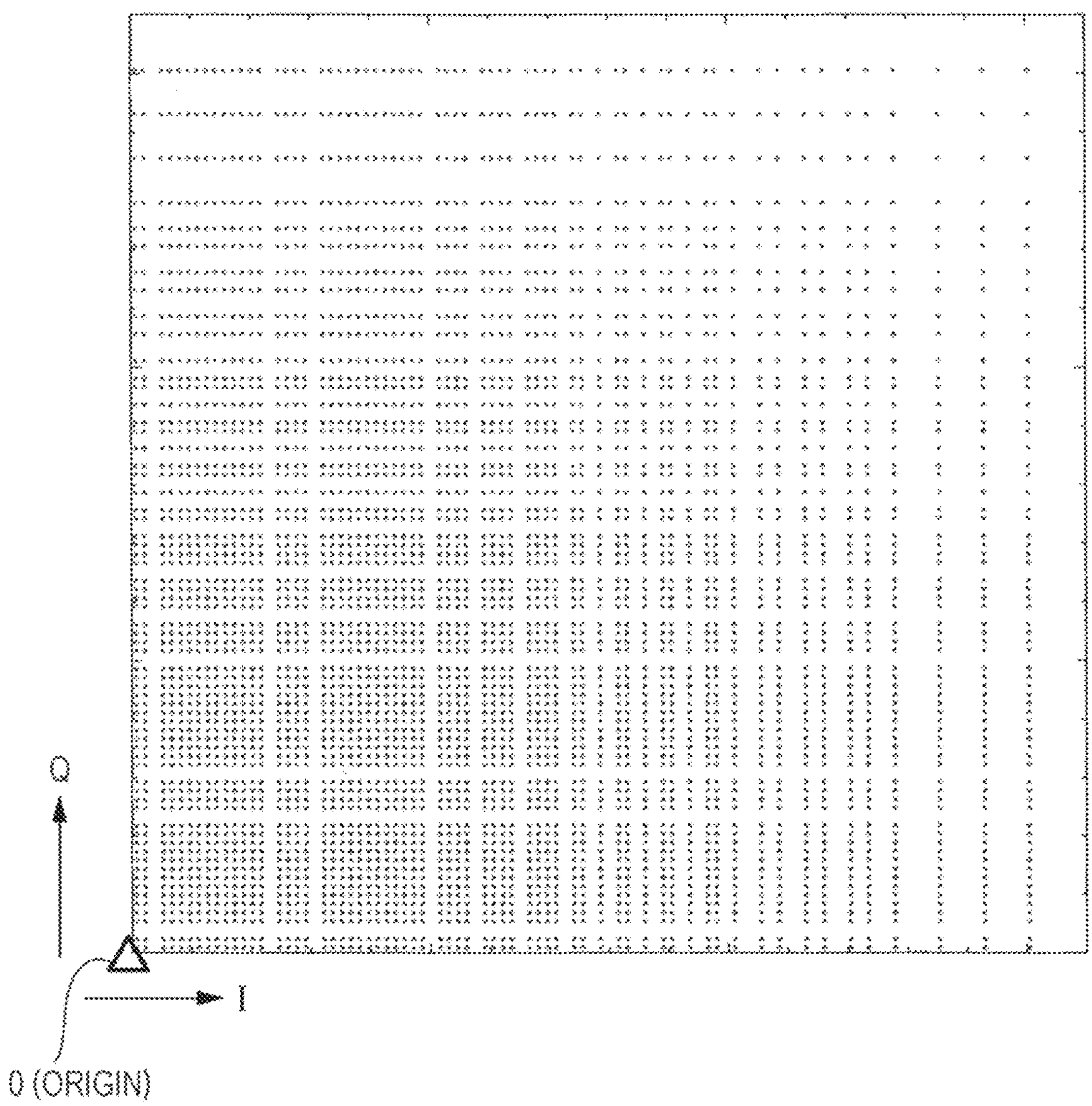
FIG. 41 is a view illustrating an arrangement example of the signal points in the first quadrant of the I-Q plane.
Figure 42:
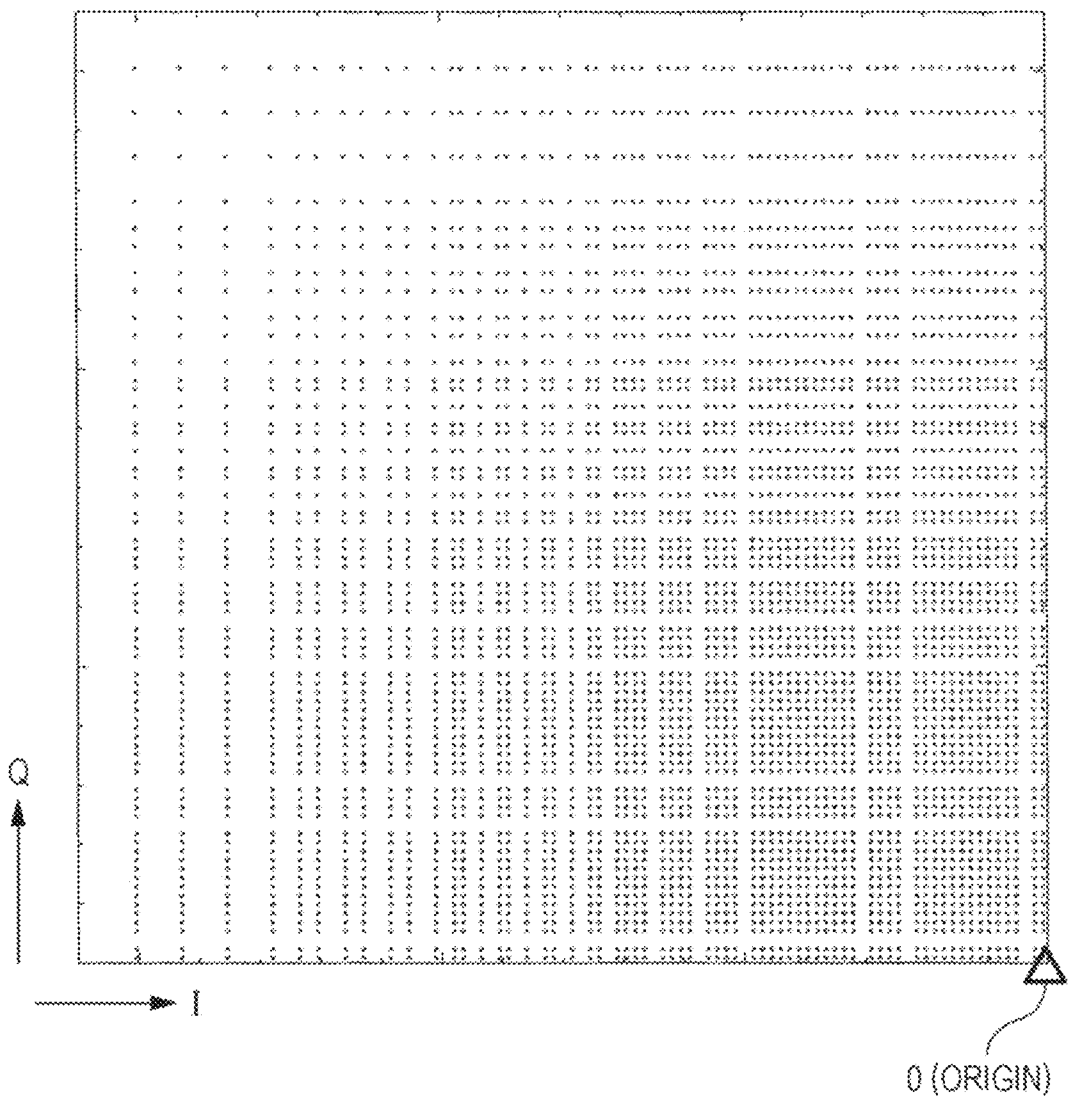
FIG. 42 is a view illustrating an arrangement example of the signal points in the second quadrant of the I-Q plane.
Figure 43:
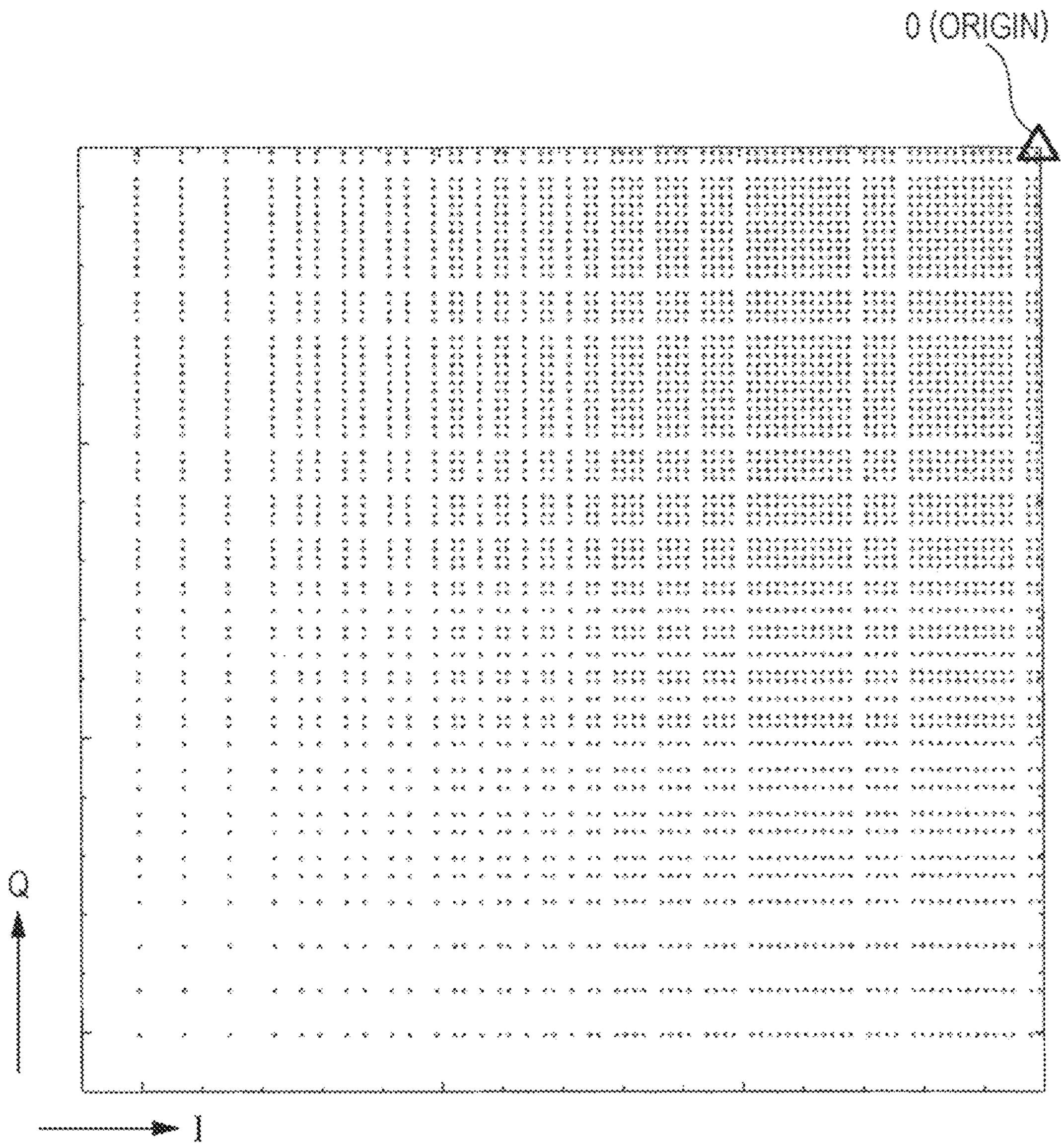
FIG. 43 is a view illustrating an arrangement example of the signal points in the third quadrant of the I-Q plane.
Figure 44:
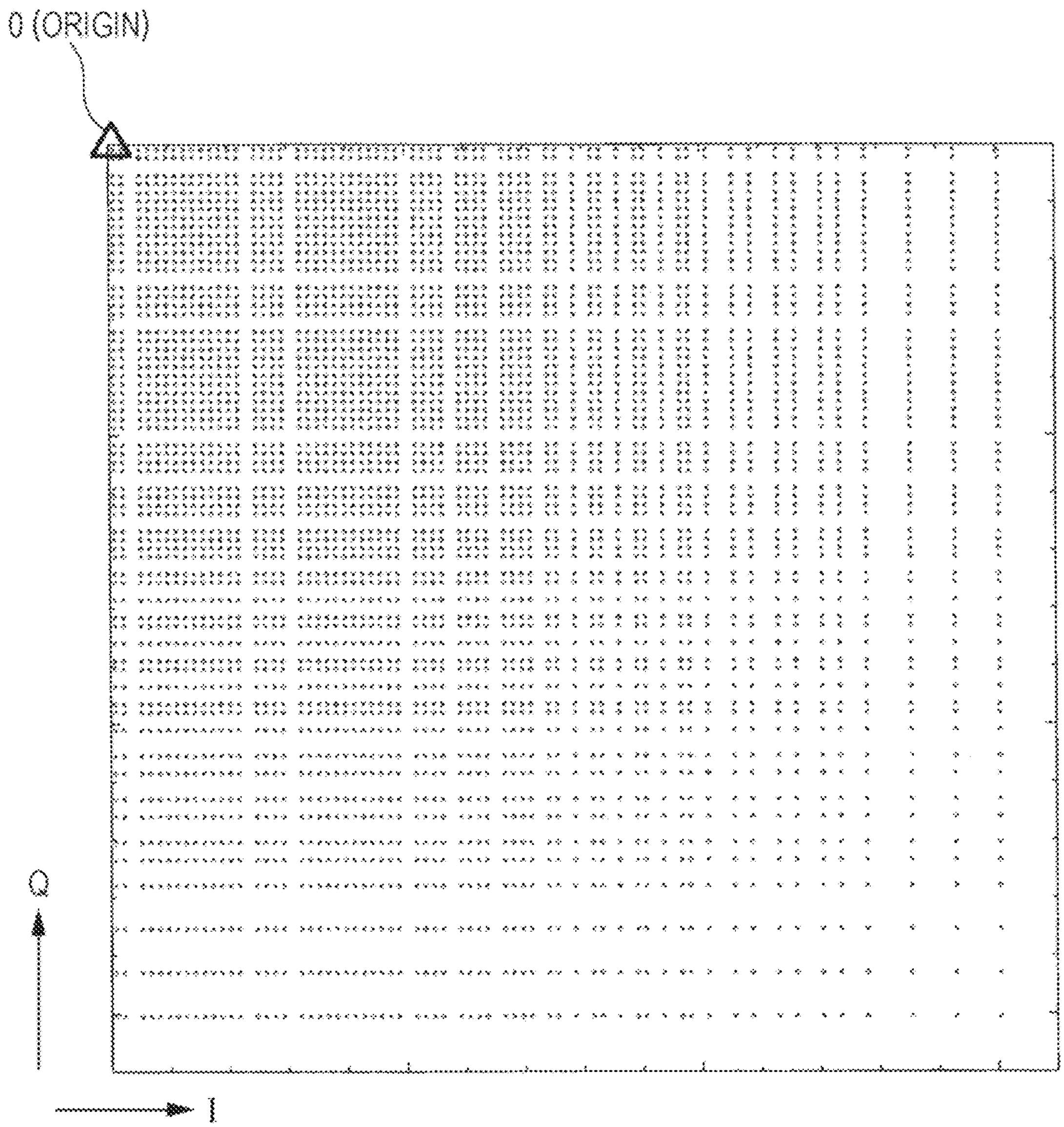
FIG. 44 is a view illustrating an arrangement example of the signal points in the fourth quadrant of the I-Q plane.

In the case that precoding matrix F is set to one of equations (S190), (S191), (S192), and (S193), and that α is set to one of equations (S194), (S195), (S196), and (S197), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 41, the arrangement of the signal points existing in the second quadrant is obtained as illustrated in FIG. 42, the arrangement of the signal points existing in the third quadrant is obtained as illustrated in FIG. 43, and the arrangement of the signal points existing in the fourth quadrant is obtained as illustrated in FIG. 44. In FIGS. 41,42, 43, and 44, a horizontal axis indicates I, and a vertical axis indicates Q, a mark "●" indicates a signal point, and a mark "Δ" indicates origin (0).

As can be seen from FIGS. 41,42, 43, and 44, the 1024 signal points exist while not overlapping one another. Therefore, the receiver has a high possibility of obtaining the high reception quality.

It is assumed that $D_2$ is a minimum Euclidean distance at the 16384 signal points in FIGS. 37, 38, 39, and 40, and that $D_1$ is a minimum Euclidean distance at the 16384 signal points in FIGS. 41, 42, 43, and 44. $D_1<D_2$ holds. Accordingly, from configuration example R1, it is necessary that $Q_1<Q_2$ holds for $Q_1\neq Q_2$ in equations (s2), (S3), (S4), (S5), and (S8).

Example 3-6

Then, equations (S153) and (S154) hold with respect to coefficient $w_{64}$ of the 64QAM mapping method and coefficient $w_{256}$ of the 256QAM mapping method, and precoding matrix F is set to one of equations (S22), (S23), (S24), and (S25) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 237]

$$F = \begin{pmatrix} \beta\times\cos\theta & \beta\times\sin\theta \\ \beta\times\sin\theta & -\beta\times\cos\theta \end{pmatrix} \quad \text{Formula (S198)}$$

or

[Mathematical formula 238]

$$F = \begin{pmatrix} \cos\theta & \sin\theta \\ \sin\theta & -\cos\theta \end{pmatrix} \quad \text{Formula (S199)}$$

or

[Mathematical formula 239]

$$F = \begin{pmatrix} \beta\times\cos\theta & -\beta\times\sin\theta \\ \beta\times\sin\theta & -\beta\times\cos\theta \end{pmatrix} \quad \text{Formula (S200)}$$

or

-continued

[Mathematical formula 240]

$$F = \begin{pmatrix} \cos\theta & -\sin\theta \\ \sin\theta & \cos\theta \end{pmatrix} \quad \text{Formula (S201)}$$

In equations (S198) and equation (S200), β may be either a real number or an imaginary number. However, β is not 0 (zero).

At this point, value θ with which the receiver obtains the good data reception quality is considered.

With respect to signal $z_2(t)$ ($z_2(i)$) in equations (s2), (S3), (S4), (S5), and (S8), the following equations are considered as value θ with which the receiver obtains the good data reception quality.

[Mathematical formula 241]

$$\theta = \tan^{-1}\left(\frac{\sqrt{42}}{\sqrt{170}} \times \frac{9}{8}\right) \text{ or } \tan^{-1}\left(\frac{\sqrt{42}}{170} \times \frac{9}{8}\right) + 2n\pi \text{ (radian)} \quad \text{Formula (S202)}$$

or

[Mathematical formula 242]

$$\theta = \pi + \tan^{-1}\left(\frac{\sqrt{42}}{\sqrt{170}} \times \frac{9}{8}\right) \text{ or } \pi + \tan^{-1}\left(\frac{\sqrt{42}}{\sqrt{170}} \times \frac{9}{8}\right) + 2n\pi \text{ (radian)} \quad \text{Formula (S203)}$$

or

[Mathematical formula 243]

$$\theta = \tan^{-1}\left(-\frac{\sqrt{42}}{\sqrt{170}} \times \frac{9}{8}\right) \text{ or } \tan^{-1}\left(-\frac{\sqrt{42}}{\sqrt{170}} \times \frac{9}{8}\right) + 2n\pi \text{ (radian)} \quad \text{Formula (S204)}$$

or

[Mathematical formula 244]

$$\theta = \pi + \tan^{-1}\left(-\frac{\sqrt{42}}{\sqrt{170}} \times \frac{9}{8}\right) \text{ or } \pi + \tan^{-1}\left(-\frac{\sqrt{42}}{\sqrt{170}} \times \frac{9}{8}\right) + 2n\pi \text{ (radian)} \quad \text{Formula (S205)}$$

In equations (S202), (S203), (S204), and (S205), $\tan^{-1}(x)$ is an inverse trigonometric function) (an inverse function of a trigonometric function in which a domain is properly restricted), and $\tan^{-1}(x)$ is given as follows.

[Mathematical formula 245]

$$-\frac{\pi}{2} \text{ (radian)} < \tan^{-1}(x) < \frac{\pi}{2} \text{ (radian)} \quad \text{Formula (S206)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S198), (S199), (S200), and (S201), and that θ is set to one of equations (S202), (S203), (S204), and (S205), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 37, the arrangement of the signal points existing in the second quadrant is obtained as illustrated in FIG. 38, the arrangement of the signal points existing in the third quadrant is obtained as illustrated in FIG. 39, and the arrangement of the signal points existing in the fourth quadrant is obtained as illustrated in FIG. 40. In FIGS. 37, 38, 39, and 40, a horizontal axis indicates I, and a vertical axis indicates Q, a mark "●" indicates a signal point, and a mark "Δ" indicates origin (0).

As can be seen from FIGS. 37, 38, 39, and 40, the 16384 signal points exist while not overlapping one another. On the I-Q plane, Euclidean distances between closest signal points are equal in the 16380 signal points of the 16384 signal points except for the rightmost and uppermost point in FIG. 37, the rightmost and lowermost point in FIG. 40, the leftmost and uppermost point in FIG. 38, and the leftmost and lowermost point in FIG. 39. Therefore, the receiver has a high possibility of obtaining the high reception quality.

In the case that precoding matrix F is set to one of equations (S198), (S199), (S200), and (S201), and that θ is set to one of equations (S202), (S203), (S204), and (S205), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 41, the arrangement of the signal points existing in the second quadrant is obtained as illustrated in FIG. 42, the arrangement of the signal points existing in the third quadrant is obtained as illustrated in FIG. 43, and the arrangement of the signal points existing in the fourth quadrant is obtained as illustrated in FIG. 44. In FIGS. 41,42, 43, and 44, a horizontal axis indicates I, and a vertical axis indicates Q, a mark "●" indicates a signal point, and a mark "Δ" indicates origin (0).

As can be seen from FIGS. 41,42, 43, and 44, the 1024 signal points exist while not overlapping one another. Therefore, the receiver has a high possibility of obtaining the high reception quality.

It is assumed that $D_2$ is a minimum Euclidean distance at the 16384 signal points in FIGS. 37, 38, 39, and 40, and that $D_1$ is a minimum Euclidean distance at the 16384 signal points in FIGS. 41, 42, 43, and 44. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 3-7

Equations (S153) and (S154) hold with respect to coefficient $w_{64}$ of the 64QAM mapping method and coefficient $w_{256}$ of the 256QAM mapping method, and precoding matrix F is set to one of equations (S173), (S174), (S175), and (S176) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)
<5> For equation (S8)

[Mathematical formula 246]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S207)}$$

or

[Mathematical formula 247]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (S208)}$$

or

[Mathematical formula 248]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S209)}$$

or

[Mathematical formula 249]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{Formula (S210)}$$

In equations (S207), (S208), (S209), and (S210), $\alpha$ may be either a real number or an imaginary number, and $\beta$ may be either a real number or an imaginary number. However, $\alpha$ is not 0 (zero). Also $\beta$ is not 0 (zero).

At this point, value $\alpha$ with which the receiver obtains the good data reception quality is considered.

With respect to signal $z_2(t)$ ($z_2(i)$) in equations (s2), (S3), (S4), (S5), and (S8), the following equations are considered as value $\alpha$ with which the receiver obtains the good data reception quality.

When $\alpha$ is a real number:

[Mathematical formula 250]

$$\alpha = \frac{\sqrt{42}}{\sqrt{170}} \times \frac{8}{9} \quad \text{Formula (S211)}$$

or

[Mathematical formula 251]

$$\alpha = -\frac{\sqrt{42}}{170} \times \frac{8}{9} \quad \text{Formula (S212)}$$

When $\alpha$ is an imaginary number:

[Mathematical formula 252]

$$\alpha = \frac{\sqrt{42}}{170} \times \frac{8}{9} \times e^{j\frac{\pi}{2}} \quad \text{Formula (S213)}$$

or

[Mathematical formula 253]

$$\alpha = \frac{\sqrt{42}}{170} \times \frac{8}{9} \times e^{j\frac{3\pi}{2}} \quad \text{Formula (S214)}$$

Figure 45:
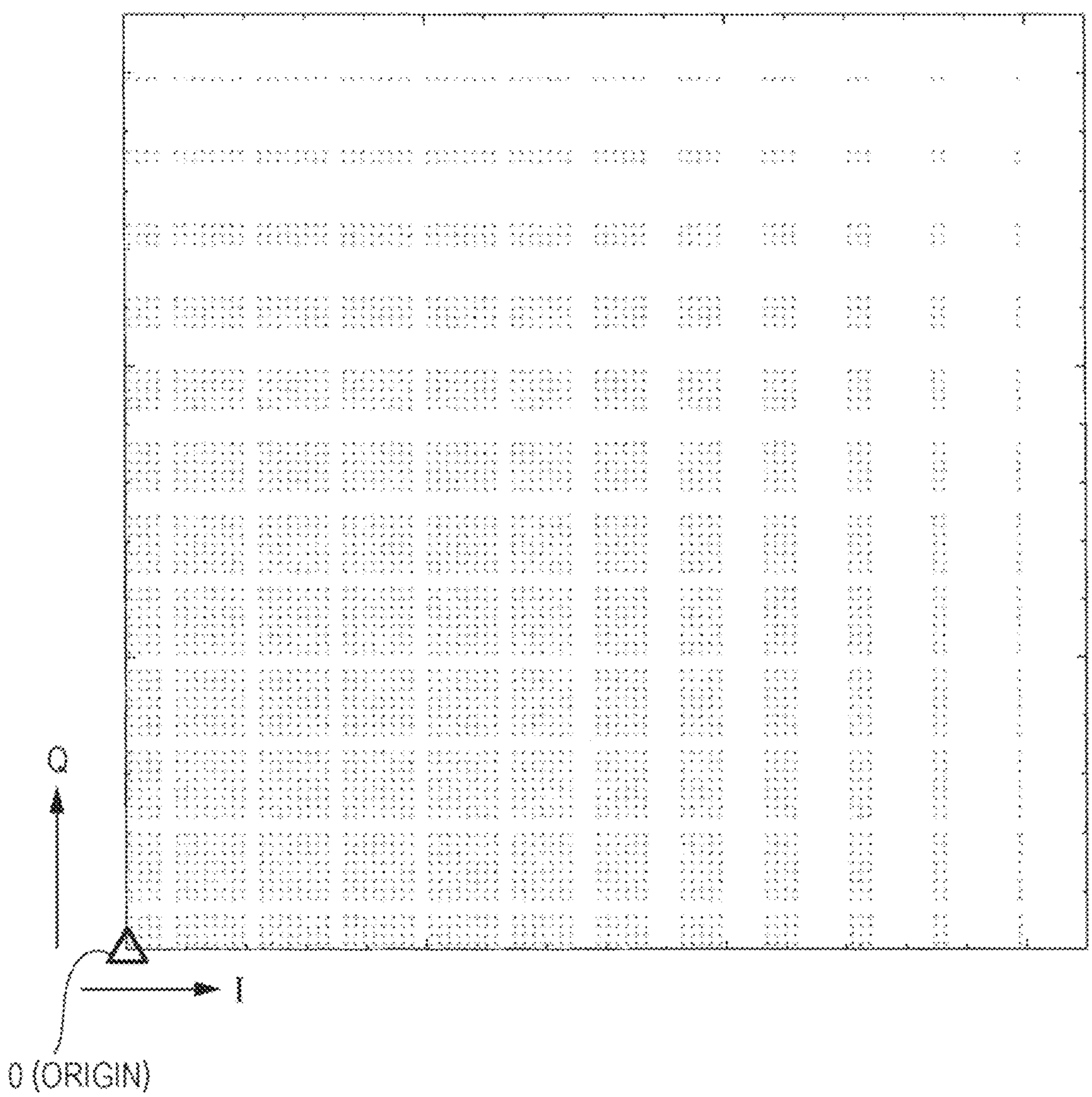
FIG. 45 is a view illustrating an arrangement example of the signal points in the first quadrant of the I-Q plane.
Figure 46:
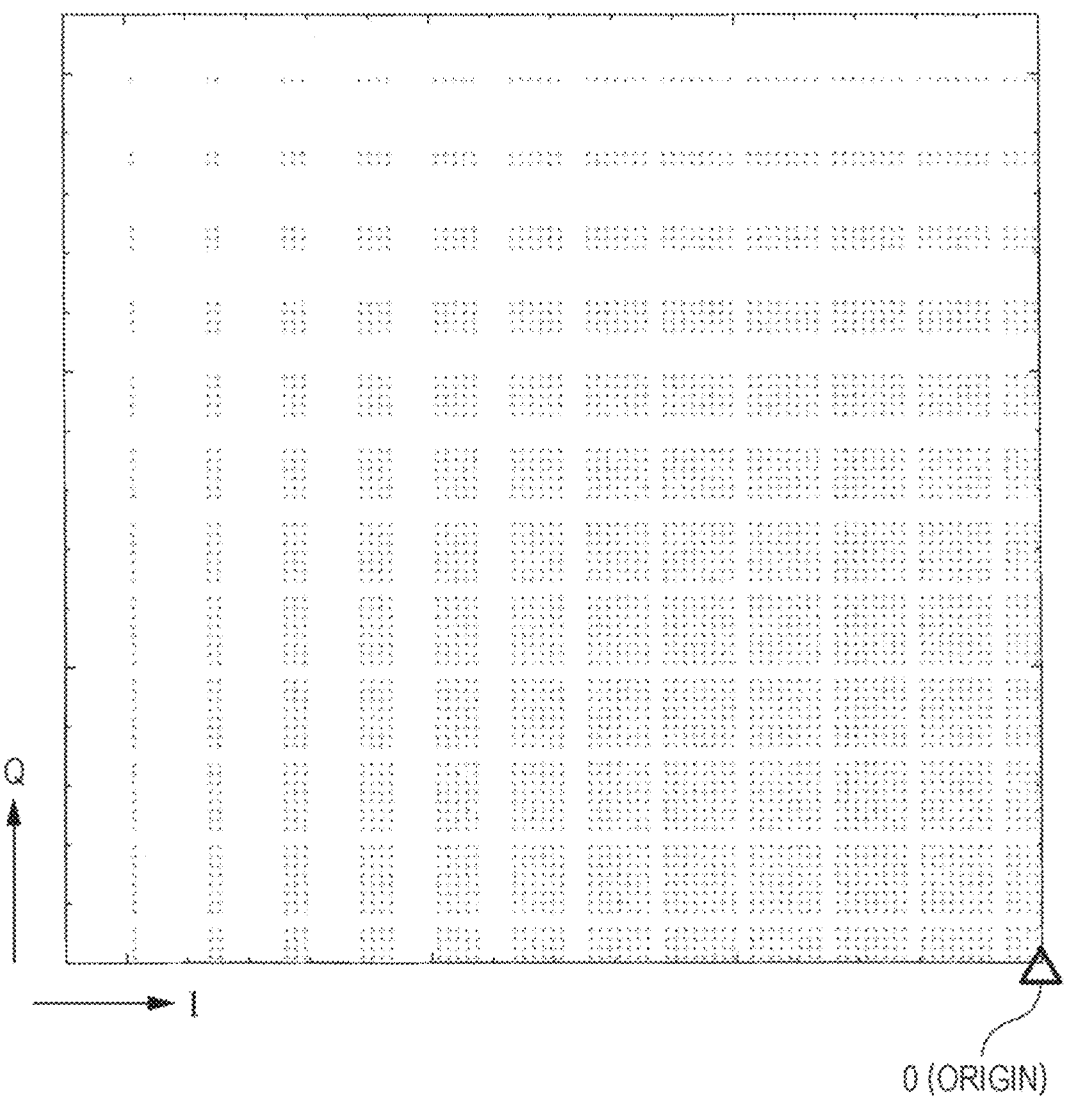
FIG. 46 is a view illustrating an arrangement example of the signal points in the second quadrant of the I-Q plane.
Figure 47:
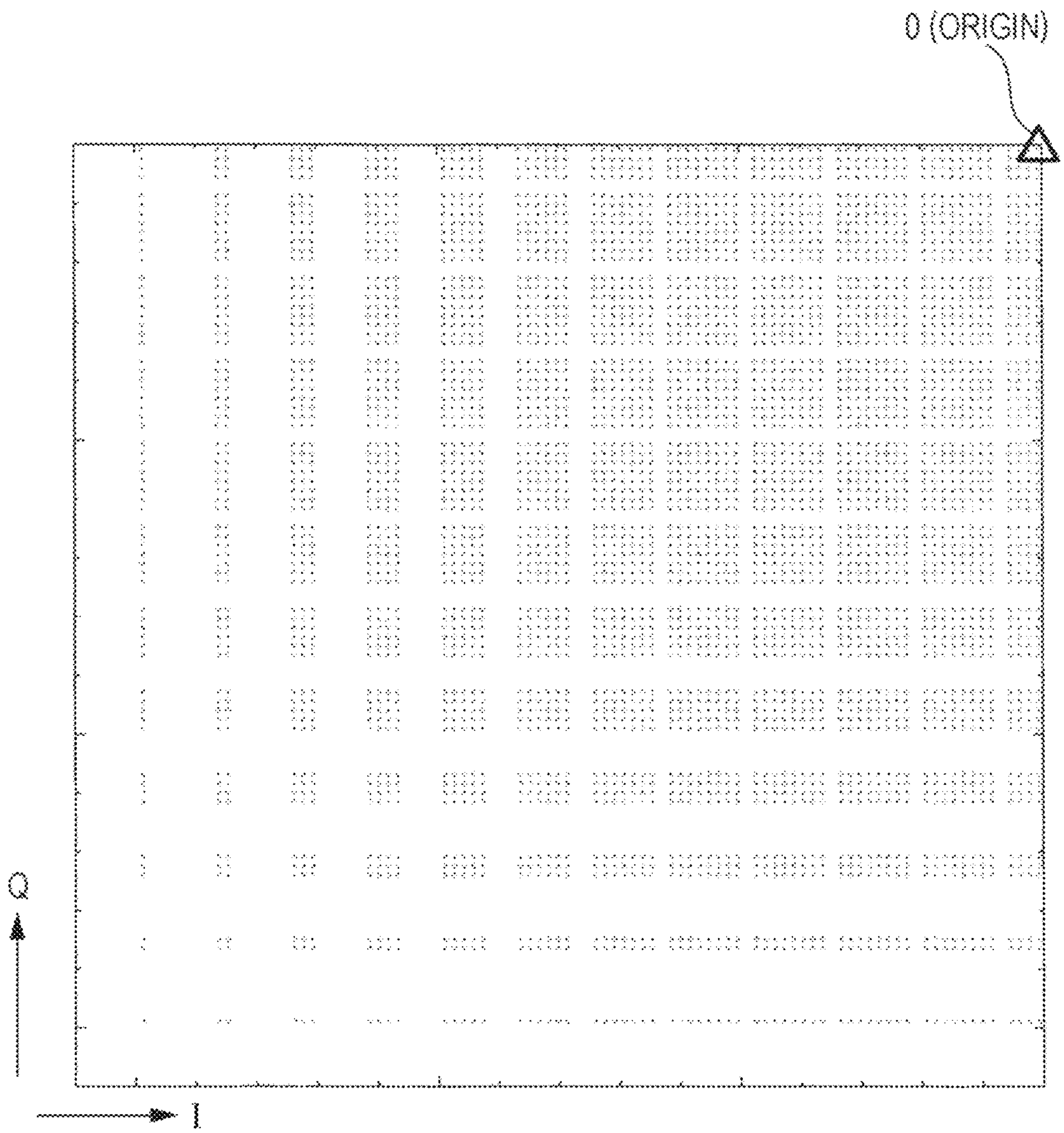
FIG. 47 is a view illustrating an arrangement example of the signal points in the third quadrant of the I-Q plane.
Figure 48:
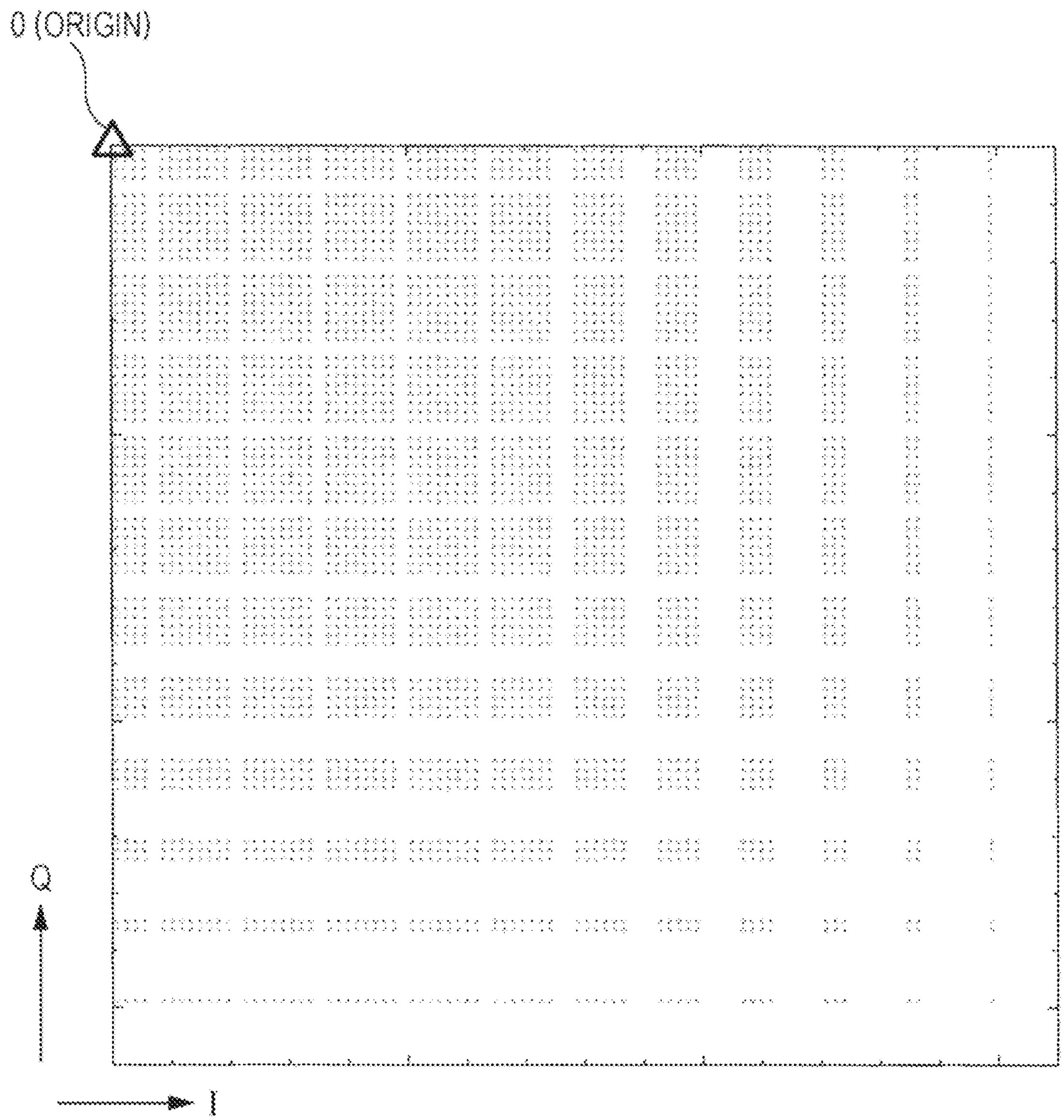
FIG. 48 is a view illustrating an arrangement example of the signal points in the fourth quadrant of the I-Q plane.

In the case that precoding matrix F is set to one of equations (S207), (S208), (S209), and (S210), and that $\alpha$ is set to one of equations (S211), (S212), (S213), and (S214), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 45, the arrangement of the signal points existing in the second quadrant is obtained as illustrated in FIG. 46, the arrangement of the signal points existing in the third quadrant is obtained as illustrated in FIG. 47, and the arrangement of the signal points existing in the fourth quadrant is obtained as illustrated in FIG. 48. In FIGS. 45, 46, 47, and 48, a horizontal axis indicates I, and a vertical axis indicates Q, a mark "●" indicates a signal point, and a mark "Δ" indicates origin (0).

As can be seen from FIGS. 45, 46, 47, and 48, the 16384 signal points exist while not overlapping one another. On the I-Q plane, Euclidean distances between closest signal points are equal in the 16380 signal points of the 16384 signal points except for the rightmost and uppermost point in FIG. 45, the rightmost and lowermost point in FIG. 48, the leftmost and uppermost point in FIG. 46, and the leftmost and lowermost point in FIG. 47. Therefore, the receiver has a high possibility of obtaining the high reception quality.

Figure 49:
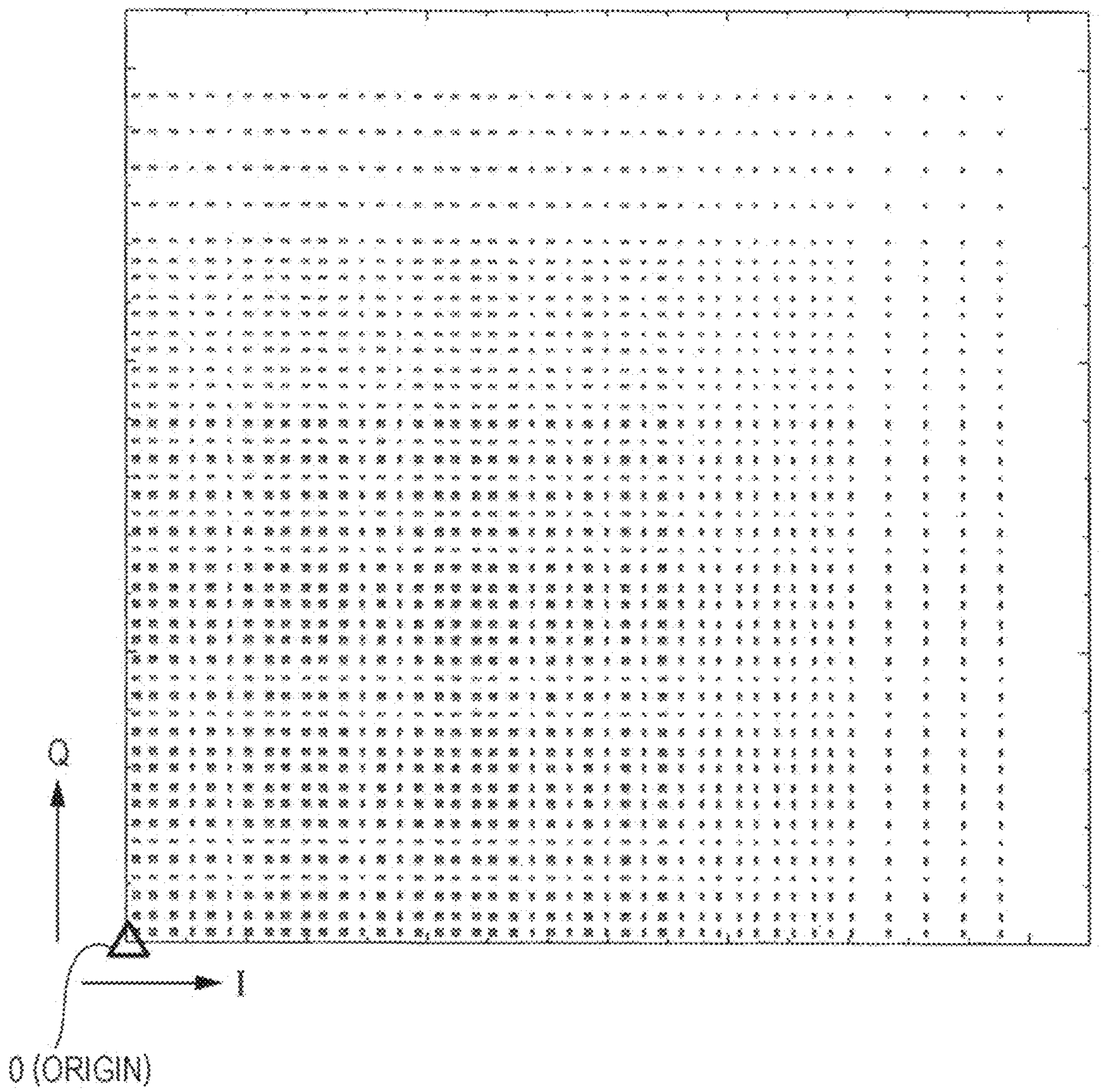
FIG. 49 is a view illustrating an arrangement example of the signal points in the first quadrant of the I-Q plane.
Figure 50:
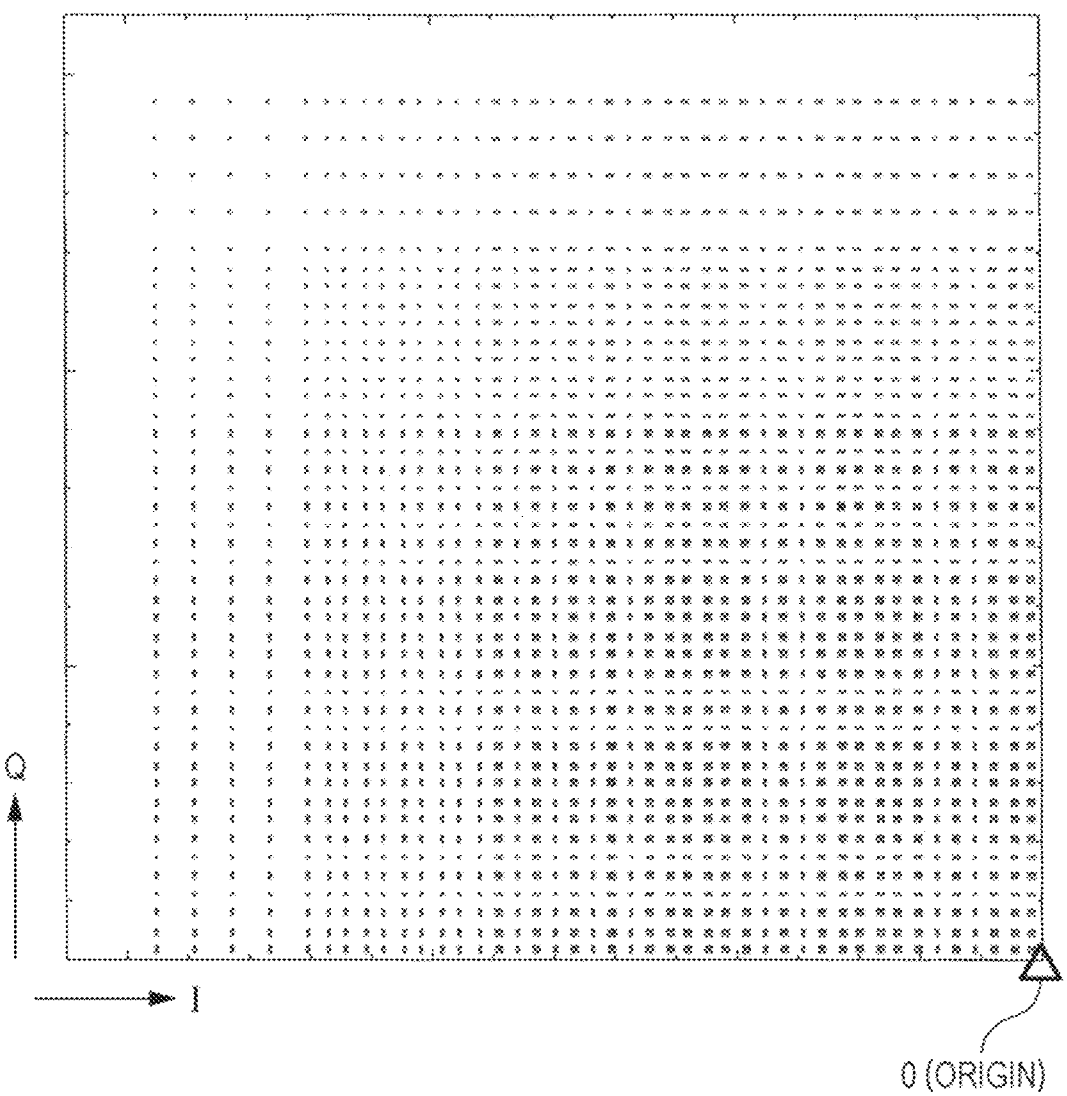
FIG. 50 is a view illustrating an arrangement example of the signal points in the second quadrant of the I-Q plane.
Figure 51:
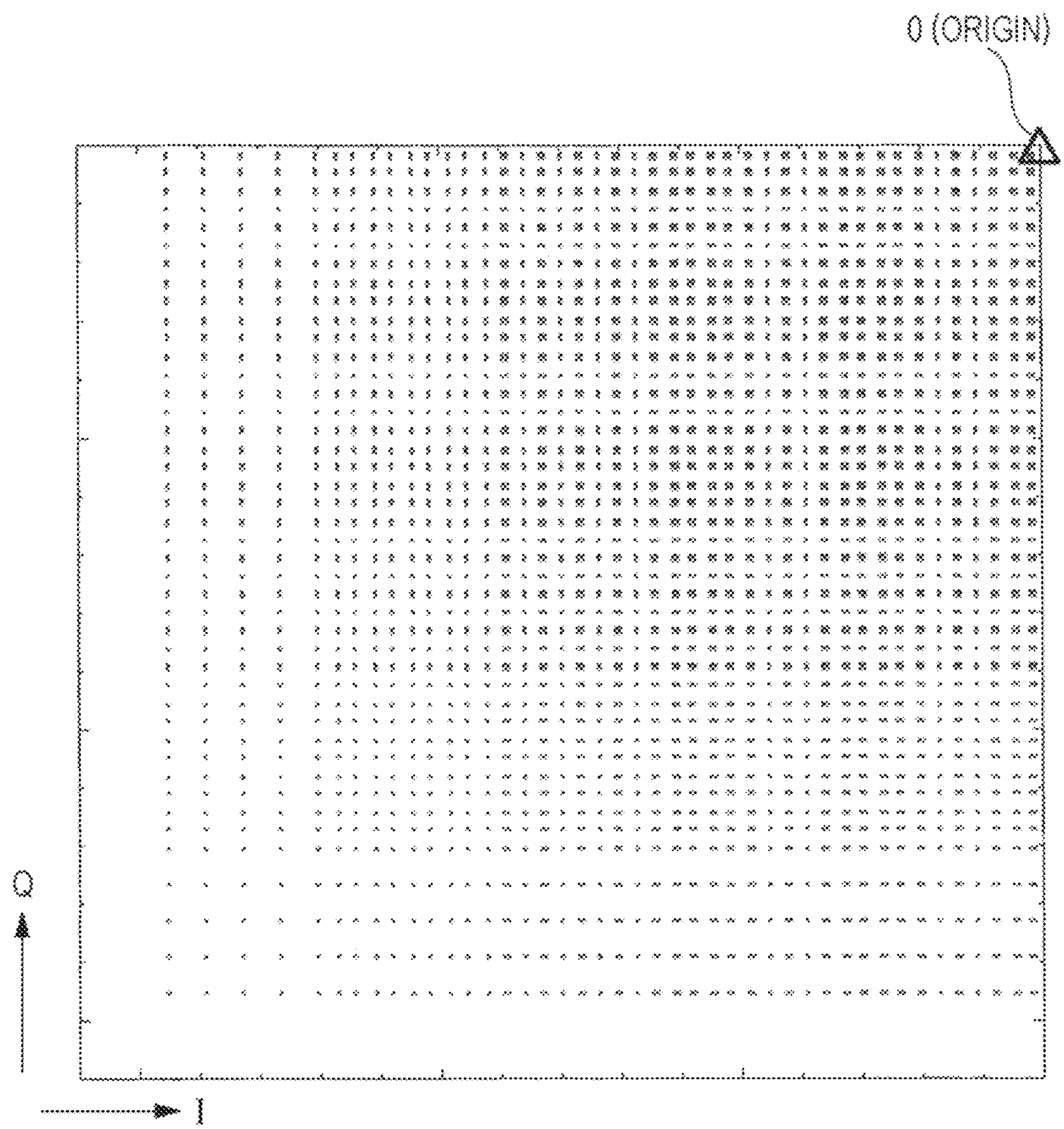
FIG. 51 is a view illustrating an arrangement example of the signal points in the third quadrant of the I-Q plane.
Figure 52:
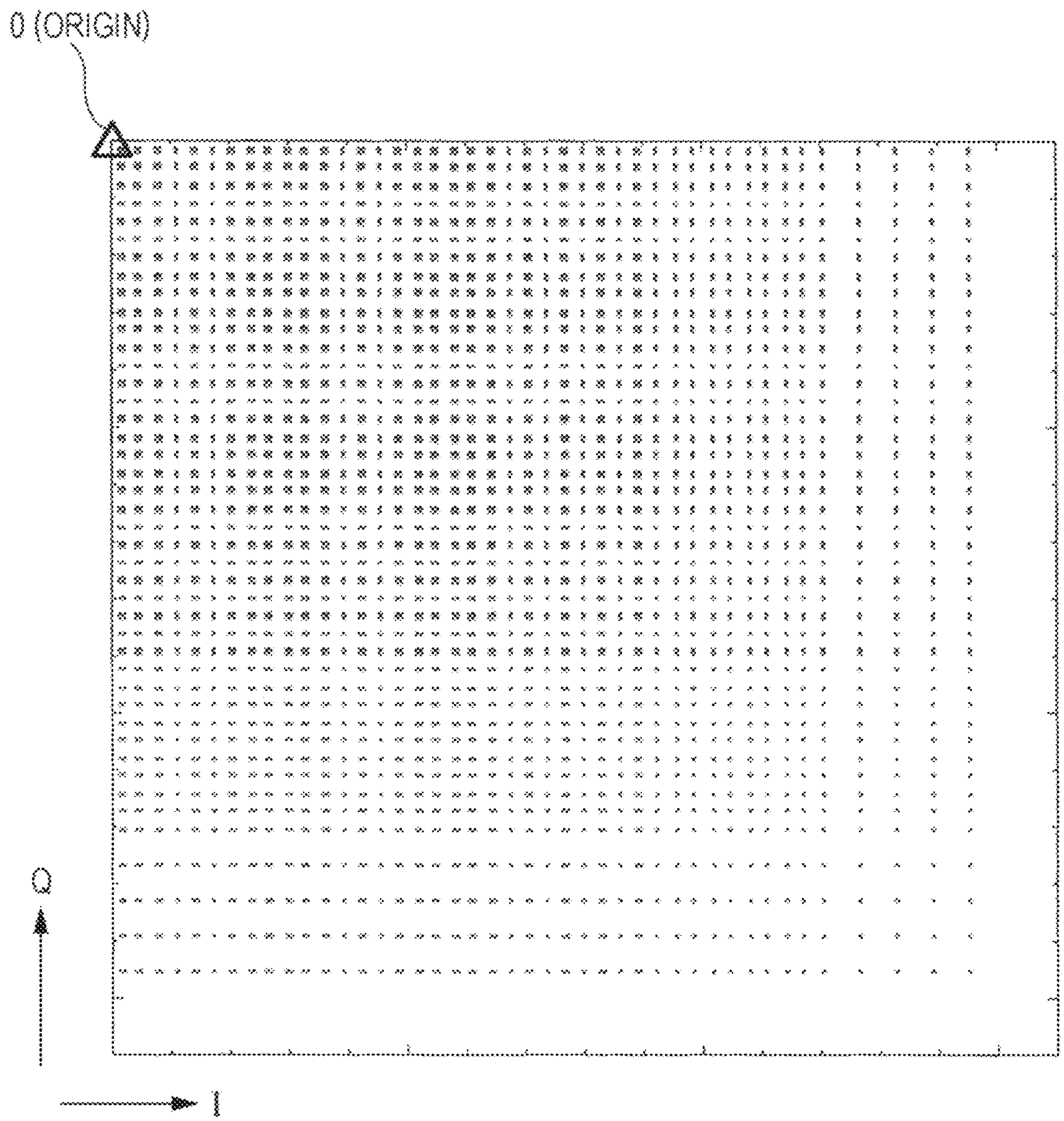
FIG. 52 is a view illustrating an arrangement example of the signal points in the fourth quadrant of the I-Q plane.

In the case that precoding matrix F is set to one of equations (S207), (S208), (S209), and (S210), and that $\alpha$ is set to one of equations (S211), (S212), (S213), and (S214), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 49, the arrangement of the signal points existing in the second quadrant is obtained as illustrated in FIG. 50, the arrangement of the signal points existing in the third quadrant is obtained as illustrated in FIG. 51, and the arrangement of the signal points existing in the fourth quadrant is obtained as illustrated in FIG. 52. In FIGS. 49, 50, 51, and 52, a horizontal axis indicates I, and a vertical axis indicates Q, a mark "●" indicates a signal point, and a mark "Δ" indicates origin (0).

As can be seen from FIGS. 49, 50, 51, and 52, the 1024 signal points exist while not overlapping one another. Therefore, the receiver has a high possibility of obtaining the high reception quality.

It is assumed that $D_2$ is a minimum Euclidean distance at the 16384 signal points in FIGS. 45, 46, 47, and 48, and that $D_1$ is a minimum Euclidean distance at the 16384 signal points in FIGS. 49, 50, 51, and 52. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 3-8

Equations (S153) and (S154) hold with respect to coefficient $w_{64}$ of the 64QAM mapping method and coefficient $w_{256}$ of the 256QAM mapping method, and precoding matrix F is set to one of equations (S173), (S174), (S175), and (S176) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)

<4> For equation (S5)
<5> For equation (S8)

[Mathematical formula 254]

$$F = \begin{pmatrix} \beta \times \cos\theta & \beta \times \sin\theta \\ \beta \times \sin\theta & -\beta \times \cos\theta \end{pmatrix} \quad \text{Formula (S215)}$$

or

[Mathematical formula 255]

$$F = \begin{pmatrix} \cos\theta & \sin\theta \\ \sin\theta & -\cos\theta \end{pmatrix} \quad \text{Formula (S216)}$$

or

[Mathematical formula 256]

$$F = \begin{pmatrix} \beta \times \cos\theta & -\beta \times \sin\theta \\ \beta \times \sin\theta & \beta \times \cos\theta \end{pmatrix} \quad \text{Formula (S217)}$$

or

[Mathematical formula 257]

$$F = \begin{pmatrix} \cos\theta & -\sin\theta \\ \sin\theta & \cos\theta \end{pmatrix} \quad \text{Formula (S218)}$$

In equations (S215) and (S217), β may be either a real number or an imaginary number. However, β is not 0 (zero).

At this point, value θ with which the receiver obtains the good data reception quality is considered.

With respect to signal $z_2(t)$ ($z_2(i)$) in equations (s2), (S3), (S4), (S5), and (S8), the following equations are considered as value θ with which the receiver obtains the good data reception quality.

[Mathematical formula 258]

$$\theta = \tan^{-1}\left(\frac{\sqrt{42}}{170} \times \frac{8}{9}\right) \text{ or } \tan^{-1}\left(\frac{\sqrt{42}}{170} \times \frac{8}{9}\right) + 2n\pi \text{ (radian)} \quad \text{Formula S219)}$$

or

[Mathematical formula 259]

$$\theta = \pi + \tan^{-1}\left(\frac{\sqrt{42}}{\sqrt{170}} \times \frac{8}{9}\right) \text{ or } \pi + \tan^{-1}\left(\frac{\sqrt{42}}{\sqrt{170}} \times \frac{8}{9}\right) + 2n\pi \text{ (radian)} \quad \text{Formula (S220)}$$

or

[Mathematical formula 260]

$$\theta = \tan^{-1}\left(\frac{\sqrt{42}}{170} \times \frac{8}{9}\right) \text{ or } \tan^{-1}\left(\frac{\sqrt{42}}{170} \times \frac{8}{9}\right) + 2n\pi \text{ (radian)} \quad \text{Formula (S221)}$$

or

[Mathematical formula 261]

$$\theta = \pi + \tan^{-1}\left(-\frac{\sqrt{42}}{170} \times \frac{8}{9}\right) \text{ or } \pi + \tan^{-1}\left(-\frac{\sqrt{42}}{170} \times \frac{8}{9}\right) + 2n\pi \text{ (radian)} \quad \text{Formula (S222)}$$

In equations (S219), (S220), (S221), and (S222), $\tan^{-1}(x)$ is an inverse trigonometric function) (an inverse function of a trigonometric function in which a domain is properly restricted), and $\tan^{-1}(x)$ is given as follows.

[Mathematical formula 262]

$$-\frac{\pi}{2} \text{ (radian)} < \tan^{-1}(x) < \frac{\pi}{2} \text{ (radian)} \quad \text{Formula (S223)}$$

"$\tan^{-1}(x)$" may also be referred to as "$Tan^{1}(x)$", "arctan (x)", or "Arctan(x)", and n is an integer.

In the case that precoding matrix F is set to one of equations (S215), (S216), (S217), and (S218), and that θ is set to one of equations (S219), (S220), (S221), and (S222), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 45, the arrangement of the signal points existing in the second quadrant is obtained as illustrated in FIG. 46, the arrangement of the signal points existing in the third quadrant is obtained as illustrated in FIG. 47, and the arrangement of the signal points existing in the fourth quadrant is obtained as illustrated in FIG. 48. In FIGS. 45, 46, 47, and 48, a horizontal axis indicates I, and a vertical axis indicates Q, a mark "●" indicates a signal point, and a mark "Δ" indicates origin (0).

As can be seen from FIGS. 45, 46, 47, and 48, the 16384 signal points exist while not overlapping one another. On the I-Q plane, Euclidean distances between closest signal points are equal in the 16380 signal points of the 16384 signal points except for the rightmost and uppermost point in FIG. 45, the rightmost and lowermost point in FIG. 48, the leftmost and uppermost point in FIG. 46, and the leftmost and lowermost point in FIG. 47. Therefore, the receiver has a high possibility of obtaining the high reception quality.

In the case that precoding matrix F is set to one of equations (S215), (S216), (S217), and (S218), and that θ is set to one of equations (S219), (S220), (S221), and (S222), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 49, the arrangement of the signal points existing in the second quadrant is obtained as illustrated in FIG. 50, the arrangement of the signal points existing in the third quadrant is obtained as illustrated in FIG. 51, and the arrangement of the signal points existing in the fourth quadrant is obtained as illustrated in FIG. 52. In FIGS. 49, 50, 51, and 52, a horizontal axis indicates I, and a vertical axis indicates Q, a mark "●" indicates a signal point, and a mark "Δ" indicates origin (0).

As can be seen from FIGS. 49, 50, 51, and 52, the 1024 signal points exist while not overlapping one another. Therefore, the receiver has a high possibility of obtaining the high reception quality.

It is assumed that $D_2$ is a minimum Euclidean distance at the 16384 signal points in FIGS. 45, 46, 47, and 48, and that $D_1$ is a minimum Euclidean distance at the 16384 signal points in FIGS. 49, 50, 51, and 52. $D_1 < D_2$ holds. Accordingly, from configuration example R1, it is necessary that $Q_1 < Q_2$ holds for $Q_1 \neq Q_2$ in equations (s2), (S3), (S4), (S5), and (S8).

Example 3-Supplement

Values α and θ having the possibility of achieving the high data reception quality are illustrated in (Example 3-1)

to (Example 3-8). However, even if values α and θ are not those in (Example 3-1) to (Example 3-8), sometimes the high data reception quality is obtained by satisfying the condition of configuration example R1.

Example 4

In mapper 504 of FIGS. 5 to 7, the modulation scheme for obtaining $s_1(t)$ ($s_1(i)$) is set to 256QAM while the modulation scheme for obtaining $s_2(t)$ ($s_2(i)$) is set to 64QAM. An example of conditions associated with the configuration and power change of precoding matrix (F) when the precoding and/or the power change is performed on, for example, one of equations (s2), (S3), (S4), (S5), and (S8) will be described below.

The 64QAM mapping method will be described below. FIG. 11 illustrates an arrangement example of 64QAM signal points in the I-Q plane. In FIG. 11, 64 marks "○" indicate 64QAM signal points, a horizontal axis indicates I, and a vertical axis indicates Q.

64 64QAM 0069signal points (indicated by the marks "○" in FIG. 11) in the I-Q plane are obtained as follows. ($w_{64}$ is a real number larger than 0)

$(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$

At this point, the bits to be transmitted (input bits) are set to b0, b1, b2, b3, b4, and b5. For example, in the case that the bits to be transmitted is (b0, b1, b2, b3, b4, b5)=(0,0,0, 0,0,0), the bits are mapped at signal point 1101 in FIG. 11, and $(I,Q)=(7w_{64},7w_{64})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 11 illustrates an example of a relationship between the set of b0, b1, b2, b3, b4, and b5 (000000 to 111111) and the signal point coordinates. Values 000000 to 111111 of the set of b0, b1, b2, b3, b4, and b5 are indicated immediately below 64 signal points included in 64QAM (the marks "○" in FIG. 11) $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$. Respective coordinates of the signal points ("○") immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 11. A complex value of in-phase component I and quadrature component Q of the mapped baseband signal (during 64QAM modulation) serves as a baseband signal ($s_1(t)$ or $s_2(t)$ in FIGS. 5 to 7).

The 256QAM mapping method will be described below. FIG. 20 illustrates an arrangement example of 256QAM signal points in the I-Q plane. In FIG. 20, 256 marks "○" indicate the 256QAM signal points.

In the I-Q plane, 256 signal points included in 256QAM (indicated by the marks "○" in FIG. 20) are obtained as follows. ($w_{256}$ is a real number larger than 0)

$(15w_{256},15w_{256})$, $(15w_{256},13w_{256})$, $(15w_{256},11w_{256})$, $(15w_{256},9w_{256})$, $(15w_{256},7w_{256})$, $(15w_{256},5w_{256})$, $(15w_{256},3w_{256})$, $(15w_{256},w_{256})$, $(15w_{256},-15w_{256})$, $(15w_{256},-13w_{256})$, $(15w_{256},-11w_{256})$, $(15w_{256},-9w_{256})$, $(15w_{256},-7w_{256})$, $(15w_{256},-5w_{256})$, $(15w_{256},-3w_{256})$, $(15w_{256},-w_{256})$, $(13w_{256},15w_{256})$, $(13w_{256},13w_{256})$, $(13w_{256},11w_{256})$, $(13w_{256},9w_{256})$, $(13w_{256},7w_{256})$, $(13w_{256},5w_{256})$, $(13w_{256},3w_{256})$, $(13w_{256},w_{256})$, $(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$, $(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$, $(11w_{256},-15w_{256})$, $(11w_{256},-13w_{256})$, $(11w_{256},-11w_{256})$, $(11w_{256},-9w_{256})$, $(11w_{256},-7w_{256})$, $(11w_{256},-5w_{256})$, $(11w_{256},-3w_{256})$, $(11w_{256},-w_{256})$, $(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256})$, $(9w_{256},-15w_{256})$, $(9w_{256},-13w_{256})$, $(9w_{256},-11w_{256})$, $(9w_{256},-9w_{256})$, $(9w_{256},-7w_{256})$, $(9w_{256},-5w_{256})$, $(9w_{256},-3w_{256})$, $(9w_{256},-w_{256})$, $(7w_{256},15w_{256})$, $(7w_{256},13w_{256})$, $(7w_{256},11w_{256})$, $(7w_{256},9w_{256})$, $(7w_{256},7w_{256})$, $(7w_{256},5w_{256})$, $(7w_{256},3w_{256})$, $(7w_{256},w_{256})$, $(7w_{256},-15w_{256})$, $(7w_{256},-13w_{256})$, $(7w_{256},-11w_{256})$, $(7w_{256},-9w_{256})$, $(7w_{256},-7w_{256})$, $(7w_{256},-5w_{256})$, $(7w_{256},-3w_{256})$, $(7w_{256},-w_{256})$, $(5w_{256},15w_{256})$, $(5w_{256},13w_{256})$, $(5w_{256},11w_{256})$, $(5w_{256},9w_{256})$, $(5w_{256},7w_{256})$, $(5w_{256},5w_{256})$, $(5w_{256},3w_{256})$, $(5w_{256},w_{256})$, $(5w_{256},-15w_{256})$, $(5w_{256},-13w_{256})$, $(5w_{256},-11w_{256})$, $(5w_{256},-9w_{256})$, $(5w_{256},-7w_{256})$, $(5w_{256},-5w_{256})$, $(5w_{256},-3w_{256})$, $(5w_{256},-w_{256})$, $(3w_{256},15w_{256})$, $(3w_{256},13w_{256})$, $(3w_{256},11w_{256})$, $(3w_{256},9w_{256})$, $(3w_{256},7w_{256})$, $(3w_{256},5w_{256})$, $(3w_{256},3w_{256})$, $(3w_{256},w_{256})$, $(3w_{256},-15w_{256})$, $(3w_{256},-13w_{256})$, $(3w_{256},-11w_{256})$, $(3w_{256},-9w_{256})$, $(3w_{256},-7w_{256})$, $(3w_{256},-5w_{256})$, $(3w_{256},-3w_{256})$, $(3w_{256},-w_{256})$, $(w_{256},15w_{256})$, $(w_{256},13w_{256})$, $(w_{256},11w_{256})$, $(w_{256},9w_{256})$, $(w_{256},7w_{256})$, $(w_{256},5w_{256})$, $(w_{256},3w_{256})$, $(w_{256},w_{256})$, $(w_{256},-15w_{256})$, $(w_{256},-13w_{256})$, $(w_{256},-11w_{256})$, $(w_{256},-9w_{256})$, $(w_{256},-7w_{256})$, $(w_{256},-5w_{256})$, $(w_{256},-3w_{256})$, $(w_{256},-w_{256})$, $(-15w_{256},15w_{256})$, $(-15w_{256},13w_{256})$, $(-15w_{256},11w_{256})$, $(-15w_{256},9w_{256})$, $(-15w_{256},7w_{256})$, $(-15w_{256},5w_{256})$, $(-15w_{256},3w_{256})$, $(-15w_{256},w_{256})$, $(-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$, $(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$, $(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$, $(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$, $(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$, $(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$, $(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256},-w_{256})$, $(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$, $(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$, $(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$, $(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-5w_{256},-w_{256})$, $(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$, $(-3w_{256},-15w_{256})$, $(-3w_{256},-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$, $(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$, $(-w_{256},-15w_{256})$, $(-w_{256},-w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, $(-w_{256},-w_{256})$

At this point, the bits to be transmitted (input bits) are set to b0, b1, b2, b3, b4, b5, b6, and b7. For example, in the case that the bits to be transmitted is (b0, b1, b2, b3, b4, b5, b6, b7)=(0,0,0,0,0,0,0,0), the bits are mapped at signal point 2001 in FIG. 20, and $(I,Q)=(15w_{256},15w_{256})$ is obtained when I is an in-phase component while Q is a quadrature component of the mapped baseband signal.

Based on the bits to be transmitted (b0, b1, b2, b3, b4, b5, b6, b7), in-phase component I and quadrature component Q of the mapped baseband signal are decided (during 256QAM modulation). FIG. 20 illustrates an example of a relationship between the set of b0, b1, b2, b3, b4, b5, b6, and b7 (00000000 to 11111111) and the signal point coordinates. Values 00000000 to 11111111 of the set of b0, b1, b2, b3, b4, b5, b6, and b7 are indicated immediately below 256 signal points included in 256QAM (the marks "○" in FIG. 20)

$(15w_{256},15w_{256})$, $(15w_{256},13w_{256})$, $(15w_{256},11w_{256})$, $(15w_{256},9w_{256})$, $(15w_{256},7w_{256})$, $(15w_{256},5w_{256})$, $(15w_{256},3w_{256})$, $(15w_{256},w_{256})$, $(15w_{256},-15w_{256})$, $(15w_{256},-13w_{256})$, $(15w_{256},-11w_{256})$, $(15w_{256},-9w_{256})$, $(15w_{256},-7w_{256})$, $(15w_{256},-5w_{256})$, $(15w_{256},-3w_{256})$, $(15w_{256},-w_{256})$, $(13w_{256},15w_{256})$, $(13w_{256},13w_{256})$, $(13w_{256},11w_{256})$, $(13w_{256},9w_{256})$, $(13w_{256},7w_{256})$, $(13w_{256},5w_{256})$, $(13w_{256},3w_{256})$, $(13w_{256},w_{256})$, $(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$, $(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$, $(11w_{256},-15w_{256})$, $(11w_{256},-13w_{256})$, $(11w_{256},-11w_{256})$, $(11w_{256},-9w_{256})$, $(11w_{256},-7w_{256})$, $(11w_{256},-5w_{256})$, $(11w_{256},-3w_{256})$, $(11w_{256},-w_{256})$, $(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256})$, $(9w_{256},-15w_{256})$, $(9w_{256},-13w_{256})$, $(9w_{256},-11w_{256})$, $(9w_{256},-9w_{256})$, $(9w_{256},-7w_{256})$, $(9w_{256},-5w_{256})$, $(9w_{256},-3w_{256})$, $(9w_{256},-w_{256})$, $(7w_{256},15w_{256})$, $(7w_{256},13w_{256})$, $(7w_{256},11w_{256})$, $(7w_{256},9w_{256})$, $(7w_{256},7w_{256})$, $(7w_{256},5w_{256})$, $(7w_{256},3w_{256})$, $(7w_{256},w_{256})$, $(7w_{256},-15w_{256})$, $(7w_{256},-13w_{256})$, $(7w_{256},-11w_{256})$, $(7w_{256},-9w_{256})$, $(7w_{256},-7w_{256})$, $(7w_{256},-5w_{256})$, $(7w_{256},-3w_{256})$, $(7w_{256},-w_{256})$, $(5w_{256},15w_{256})$, $(5w_{256},13w_{256})$, $(5w_{256},11w_{256})$, $(5w_{256},9w_{256})$, $(5w_{256},7w_{256})$, $(5w_{256},5w_{256})$, $(5w_{256},3w_{256})$, $(5w_{256},w_{256})$, $(5w_{256},-15w_{256})$, $(5w_{256},-13w_{256})$, $(5w_{256},-11w_{256})$, $(5w_{256},-9w_{256})$, $(5w_{256},-7w_{256})$, $(5w_{256},-5w_{256})$, $(5w_{256},-3w_{256})$, $(5w_{256},-w_{256})$, $(3w_{256},15w_{256})$, $(3w_{256},13w_{256})$, $(3w_{256},11w_{256})$, $(3w_{256},9w_{256})$, $(3w_{256},7w_{256})$, $(3w_{256},5w_{256})$, $(3w_{256},3w_{256})$, $(3w_{256},w_{256})$, $(3w_{256},-15w_{256})$, $(3w_{256},-13w_{256})$, $(3w_{256},-11w_{256})$, $(3w_{256},-9w_{256})$, $(3w_{256},-7w_{256})$, $(3w_{256},-5w_{256})$, $(3w_{256},-3w_{256})$, $(3w_{256},-w_{256})$, $(w_{256},15w_{256})$, $(w_{256},13w_{256})$, $(w_{256},11w_{256})$, $(w_{256},9w_{256})$, $(w_{256},7w_{256})$, $(w_{256},5w_{256})$, $(w_{256},3w_{256})$, $(w_{256},w_{256})$, $(w_{256},-15w_{256})$, $(w_{256},-13w_{256})$, $(w_{256},-11w_{256})$, $(w_{256},-9w_{256})$, $(w_{256},-7w_{256})$, $(w_{256},-5w_{256})$, $(w_{256},-3w_{256})$, $(w_{256},-w_{256})$, $(-15w_{256},15w_{256})$, $(-15w_{256},13w_{256})$, $(-15w_{256},11w_{256})$, $(-15w_{256},9w_{256})$, $(-15w_{256},7w_{256})$, $(-15w_{256},5w_{256})$, $(-15w_{256},3w_{256})$, $(-15w_{256},w_{256})$, $(-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$, $(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$, $(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$, $(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$, $(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$, $(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$, $(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256},-w_{256})$, $(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$, $(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$, $(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$, $(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-5w_{256},-w_{256})$, $(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$, $(-3w_{256},-15w_{256})$, $(-3w_{256},-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$, $(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$, $(-w_{256},-15w_{256})$, $(-w_{256},-w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, $(-w_{256},-w_{256})$. Respective coordinates of the signal points ("○") immediately above the values 00000000 to 11111111 of the set of b0, b1, b2, b3, b4, b5, b6, and b7 in the I-Q plane serve as in-phase component I and quadrature component Q of the mapped baseband signal.

The relationship between the set of b0, b1, b2, b3, b4, b5, b6, and b7 (00000000 to 11111111) and the signal point coordinates during 256QAM modulation is not limited to that in FIG. 20. A complex value of in-phase component I and quadrature component Q of the mapped baseband signal (during 256QAM modulation) serves as a baseband signal ($s_1(t)$ or $s_2(t)$ in FIGS. 5 to 7).

In this case, the modulation scheme of baseband signal 505A ($s_1(t)$ ($s_1(i)$)) is set to 256QAM while modulation scheme of baseband signal 505B ($s_2(t)$ ($s_2(i)$)) is set to 64QAM in FIG. 5 to FIG. 7. The configuration of the precoding matrix will be described below.

At this point, generally average power of baseband signal 505A ($s_1(t)$ and ($s_1(i)$)) and average power of baseband signal 505B ($s_2(t)$ and ($s_2(i)$)), which are of the output of mapper 504 in FIGS. 5 to 7, are equalized to each other. Accordingly, the following relational expression holds with respect to coefficient $w_{64}$ of the 64QAM mapping method and coefficient $w_{256}$ of the 256QAM mapping method.

[Mathematical formula 263]

$$w_{64} = \frac{z}{\sqrt{42}} \quad \text{Formula (S224)}$$

-continued

[Mathematical formula 264]

$$w_{256} = \frac{z}{\sqrt{170}} \quad \text{Formula (S225)}$$

In equations (S224) and (S225), it is assumed that z is a real number larger than 0. When the calculations are performed in <1> to <5>, <1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

the configuration of precoding matrix F

[Mathematical formula 265]

$$F = \begin{pmatrix} a(i) & b(i) \\ c(i) & d(i) \end{pmatrix} \quad \text{(S226)}$$

will be described in detail below ((Example 4-1) to (Example 4-8)).

Example 4-1

For one of <1> to <5>, precoding matrix F is set to one of the following equations.

[Mathematical formula 266]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S227)}$$

or

[Mathematical formula 267]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{Formula (S228)}$$

or

[Mathematical formula 268]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S229)}$$

or

[Mathematical formula 269]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{Formula (S230)}$$

In equations (S227), (S228), (S229), and (S230), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_2(t)$ ($z_2(i)$) in equations (s2), (S3), (S4), (S5), and (S8), the following equations are considered as value α with which the receiver obtains the good data reception quality.

When $\alpha$ is a real number:

[Mathematical formula 270]

$$\alpha = \frac{\sqrt{170}}{\sqrt{42}} \times \frac{9}{8} \quad \text{Formula (S231)}$$

or

[Mathematical formula 271]

$$\alpha = -\frac{\sqrt{170}}{\sqrt{42}} \times \frac{9}{8} \quad \text{Formula (S232)}$$

When $\alpha$ is an imaginary number:

[Mathematical formula 272]

$$\alpha = \frac{\sqrt{170}}{\sqrt{42}} \times \frac{9}{8} \times e^{j\frac{\pi}{2}} \quad \text{Formula (S233)}$$

or

[Mathematical formula 273]

$$\alpha = \frac{\sqrt{170}}{\sqrt{42}} \times \frac{9}{8} \times e^{j\frac{3\pi}{2}} \quad \text{Formula (S234)}$$

The modulation scheme of baseband signal 505A ($s_1(t)$ ($s_1(i)$)) is set to 256QAM while modulation scheme of baseband signal 505B ($s_2(t)$ ($s_2(i)$)) is set to 64QAM. Accordingly, the precoding (and the phase change and the power change) is performed to transmit the modulated signal from each antenna as described above, the total number of bits transmitted using symbols transmitted from antenna 808A and 808B in FIG. 8 at the (unit) time of time u and frequency (carrier) v is 14 bits that are of a sum of 6 bits (for the use of 64QAM) and 8 bits (for the use of 256QAM).

Assuming that $b_{0,64}$, $b_{1,64}$, $b_{2,64}$, $b_{3,64}$, $b_{4,64}$ and $b_{5,64}$ are input bits for the purpose of the 64QAM mapping, and that $b_{0,256}$, $b_{1,256}$, $b_{2,256}$, $b_{3,256}$, $b_{4,256}$, $b_{5,256}$, $b_{6,256}$, and $b_{7,256}$ are input bits for the purpose of the 256QAM mapping, even if value $\alpha$ in any one of equations (S231), (S232), (S233), and (S234) is used, in signal $z_1(t)$ ($z_1(i)$), the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (0,0,0,0,0,0,0,0,0,0,0,0,0,0) to the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (1,1,1,1,1,1,1,1,1,1,1,1,1,1) exist in the I-Q plane, similarly, in signal $z_2(t)$ ($z_2(i)$), the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (0,0,0,0,0,0,0,0,0,0,0,0,0,0) to the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (1,1,1,1,1,1,1,1,1,1,1,1,1,1) exist in the I-Q plane.

In the above description, with respect to signal $z_2(t)$ ($z_2(i)$) in equations (s2), (S3), (S4), (S5), and (S8), equations (S231) to (S243) are considered as value $\alpha$ with which the receiver obtains the good data reception quality. This point will be described below. In signal $z_2(t)$ ($z_2(i)$), the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (0,0,0,0,0,0,0,0,0,0,0,0,0,0) to the signal point at which ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) corresponds to (1,1,1,1,1,1,1,1,1,1,1,1,1,1) exists in the I-Q plane, and it is desirable that $2^{14}$=16384 signal points exist in the I-Q plane while not overlapping one another.

This is attributed to the following fact. That is, the receiver performs the detection and the error correction decoding using signal $z_2(t)$ ($z_2(i)$) in the case that a modulated signal transmitted from the antenna for transmitting signal $z_1(t)$ ($z_1(i)$) does not reach the receiver, and it is necessary at that time that the 16384 signal points exist in the I-Q plane while not overlapping one another in order that the receiver obtains the high data reception quality.

In the case that precoding matrix F is set to one of equations (S227), (S228), (S229), and (S230), and that $\alpha$ is set to one of equations (S231), (S232), (S233), and (S234), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, the arrangement of the signal points existing in a first quadrant is obtained as illustrated in FIG. 37, the arrangement of the signal points existing in a second quadrant is obtained as illustrated in FIG. 38, the arrangement of the signal points existing in a third quadrant is obtained as illustrated in FIG. 39, and the arrangement of the signal points existing in a fourth quadrant is obtained as illustrated in FIG. 40. In FIGS. 37, 38, 39, and 40, a horizontal axis indicates I, and a vertical axis indicates Q, a mark "●" indicates a signal point, and a mark "Δ" indicates origin (0).

As can be seen from FIGS. 37, 38, 39, and 40, the 16384 signal points exist while not overlapping one another in the I-Q plane. On the I-Q plane, Euclidean distances between closest signal points are equal in the 16380 signal points of the 16384 signal points except for the rightmost and uppermost point in FIG. 37, the rightmost and lowermost point in FIG. 40, the leftmost and uppermost point in FIG. 38, and the leftmost and lowermost point in FIG. 39. Therefore, the receiver has a high possibility of obtaining the high reception quality.

In the case that precoding matrix F is set to one of equations (S227), (S228), (S229), and (S230), and that $\alpha$ is set to one of equations (S231), (S232), (S233), and (S234), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, the arrangement of the signal points existing in the first quadrant is obtained as illustrated in FIG. 41, the arrangement of the signal points existing in the second quadrant is obtained as illustrated in FIG. 42, the arrangement of the signal points existing in the third quadrant is obtained as illustrated in FIG. 43, and the arrangement of the signal points existing in the fourth quadrant is obtained as illustrated in FIG. 44. In FIGS. 41, 42, 43, and 44, a horizontal axis indicates I, and a vertical axis indicates Q, a mark "●" indicates a signal point, and a mark "Δ" indicates origin (0).

As can be seen from FIGS. 41, 42, 43, and 44, the 16384 signal points exist while not overlapping one another. Therefore, the receiver has a high possibility of obtaining the high reception quality.

It is assumed that $D_2$ is a minimum Euclidean distance at the 16384 signal points in FIGS. 37, 38, 39, and 40, and that $D_1$ is a minimum Euclidean distance at the 16384 signal points in FIGS. 41, 42, 43, and 44. $D_1 < D_2$ holds. Accordingly, from configuration example R1, it is necessary that $Q_1<Q_2$ holds for $Q_1\neq Q_2$ in equations (s2), (S3), (S4), (S5), and (S8).

Example 4-2

Then, equations (S224) and (S225) hold with respect to coefficient $w_{64}$ of the 64QAM mapping method and coefficient $w_{256}$ of the 256QAM mapping method, and precoding matrix F is set to one of equations (S235), (S236), (S237), and (S238) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 274]

$$F=\begin{pmatrix}\beta\times\cos\theta & \beta\times\sin\theta\\ \beta\times\sin\theta & -\beta\times\cos\theta\end{pmatrix} \quad \text{Formula (S235)}$$

or

[Mathematical formula 275]

$$F=\begin{pmatrix}\cos\theta & \sin\theta\\ \sin\theta & -\cos\theta\end{pmatrix} \quad \text{Formula (S236)}$$

or

[Mathematical formula 276]

$$F=\begin{pmatrix}\beta\times\cos\theta & -\beta\times\sin\theta\\ \beta\times\sin\theta & \beta\times\cos\theta\end{pmatrix} \quad \text{Formula (S237)}$$

or

[Mathematical formula 277]

$$F=\begin{pmatrix}\cos\theta & -\sin\theta\\ \sin\theta & \cos\theta\end{pmatrix} \quad \text{Formula (S238)}$$

In equations (S235) and (S237), β may be either a real number or an imaginary number. However, β is not 0 (zero).

At this point, value θ with which the receiver obtains the good data reception quality is considered.

With respect to signal $z_2(t)$ ($z_2(i)$) in equations (s2), (S3), (S4), (S5), and (S8), the following equations are considered as value θ with which the receiver obtains the good data reception quality.

[Mathematical formula 278]

$$\theta=\tan^{-1}\left(\frac{\sqrt{170}}{\sqrt{42}}\times\frac{9}{8}\right)\text{ or }\tan^{-1}\left(\frac{\sqrt{170}}{\sqrt{42}}\times\frac{9}{8}\right)+2n\pi\text{(radian)} \quad \text{Formula (S239)}$$

or

[Mathematical formula 279]

$$\theta=\pi+\tan^{-1}\left(\frac{\sqrt{170}}{\sqrt{42}}\times\frac{9}{8}\right)\text{ or }\pi+\tan^{-1}\left(\frac{\sqrt{170}}{\sqrt{42}}\times\frac{9}{8}\right)+2n\pi\text{(radian)} \quad \text{Formula (S240)}$$

-continued or

[Mathematical formula 280]

$$\theta=\tan^{-1}\left(-\frac{\sqrt{170}}{\sqrt{42}}\times\frac{9}{8}\right)\text{ or }\tan^{-1}\left(-\frac{\sqrt{170}}{\sqrt{42}}\times\frac{9}{8}\right)+2n\pi\text{(radian)} \quad \text{Formula (S241)}$$

or

[Mathematical formula 281]

$$\theta=\pi+\tan^{-1}\left(-\frac{\sqrt{170}}{\sqrt{42}}\times\frac{9}{8}\right)\text{ or }\pi+\tan^{-1}\left(-\frac{\sqrt{170}}{\sqrt{42}}\times\frac{9}{8}\right)+2n\pi\text{(radian)} \quad \text{Formula (S242)}$$

In equations (S239), (S240), (S241), and (S242), $\tan^{-1}(x)$ is an inverse trigonometric function) (an inverse function of a trigonometric function in which a domain is properly restricted), and $\tan^{-1}(x)$ is given as follows.

[Mathematical formula 282]

$$-\frac{\pi}{2}\text{(radian)}<\tan^{-1}(x)<\frac{\pi}{2}\text{(radian)} \quad \text{Formula (S243)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S235), (S236), (S237), and (S238), and that θ is set to one of equations (S239), (S240), (S241), and (S242), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 37, the arrangement of the signal points existing in the second quadrant is obtained as illustrated in FIG. 38, the arrangement of the signal points existing in the third quadrant is obtained as illustrated in FIG. 39, and the arrangement of the signal points existing in the fourth quadrant is obtained as illustrated in FIG. 40. In FIGS. 37, 38, 39, and 2540, a horizontal axis indicates I, and a vertical axis indicates Q, a mark "●" indicates a signal point, and a mark "Δ" indicates origin (0).

As can be seen from FIGS. 37, 38, 39, and 40, the 16384 signal points exist while not overlapping one another in the I-Q plane. On the I-Q plane, Euclidean distances between closest signal points are equal in the 16380 signal points of the 16384 signal points except for the rightmost and uppermost point in FIG. 37, the rightmost and lowermost point in FIG. 40, the leftmost and uppermost point in FIG. 38, and the leftmost and lowermost point in FIG. 39. Therefore, the receiver has a high possibility of obtaining the high reception quality.

In the case that precoding matrix F is set to one of equations (S235), (S236), (S237), and (S238), and that θ is set to one of equations (S239), (S240), (S241), and (S242), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG.

41, the arrangement of the signal points existing in the second quadrant is obtained as illustrated in FIG. 42, the arrangement of the signal points existing in the third quadrant is obtained as illustrated in FIG. 43, and the arrangement of the signal points existing in the fourth quadrant is obtained as illustrated in FIG. 44. In FIGS. 41,42, 43, and 44, a horizontal axis indicates I, and a vertical axis indicates Q, a mark "●" indicates a signal point, and a mark "Δ" indicates origin (0).

As can be seen from FIGS. 41, 42, 43, and 44, the 16384 signal points exist while not overlapping one another. Therefore, the receiver has a high possibility of obtaining the high reception quality.

It is assumed that $D_2$ is a minimum Euclidean distance at the 16384 signal points in FIGS. 37, 38, 39, and 40, and that $D_1$ is a minimum Euclidean distance at the 16384 signal points in FIGS. 41, 42, 43, and 44. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 4-3

Equations (S224) and (S225) hold with respect to coefficient $w_{64}$ of the 64QAM mapping method and coefficient $w_{256}$ of the 256QAM mapping method, and precoding matrix F is set to one of equations (S173), (S174), (S175), and (S176) when the calculations are performed in <1> to <5>.

<1> For $P_1^2=P_2^2$ in equation (S2)

<2> For $P_1^2=P_2^2$ in equation (S3)

<3> For $P_1^2=P_2^2$ in equation (S4)

<4> For equation (S5)

<5> For equation (S8)

[Mathematical formula 283]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (S244)}$$

or

[Mathematical formula 284]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{Formula (S245)}$$

or

[Mathematical formula 285]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (S246)}$$

or

[Mathematical formula 286]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{Formula (S247)}$$

In equations (S244), (S245), (S246), and (S247), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_2(t)$ ($z_2(i)$) in equations (s2), (S3), (S4), (S5), and (S8), the following equations are considered as value α with which the receiver obtains the good data reception quality.

When α is a real number:

[Mathematical formula 287]

$$\alpha = \frac{\sqrt{170}}{\sqrt{42}} \times \frac{8}{9} \quad \text{Formula (S248)}$$

or

[Mathematical formula 288]

$$\alpha = -\frac{\sqrt{170}}{\sqrt{42}} \times \frac{8}{9} \quad \text{Formula (S249)}$$

When α is an imaginary number:

[Mathematical formula 289]

$$\alpha = \frac{\sqrt{170}}{\sqrt{42}} \times \frac{8}{9} \times e^{j\frac{\pi}{2}} \quad \text{Formula (S250)}$$

or

[Mathematical formula 290]

$$\alpha = \frac{\sqrt{170}}{\sqrt{42}} \times \frac{8}{9} \times e^{j\frac{3\pi}{2}} \quad \text{Formula (S251)}$$

In the case that precoding matrix F is set to one of equations (S244), (S245), (S246), and (S247), and that α is set to one of equations (S248), (S249), (S250), and (S251), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 45, the arrangement of the signal points existing in the second quadrant is obtained as illustrated in FIG. 46, the arrangement of the signal points existing in the third quadrant is obtained as illustrated in FIG. 47, and the arrangement of the signal points existing in the fourth quadrant is obtained as illustrated in FIG. 48. In FIGS. 45, 46, 47, and 48, a horizontal axis indicates I, and a vertical axis indicates Q, a mark "●" indicates a signal point, and a mark "Δ" indicates origin (0).

As can be seen from FIGS. 45, 46, 47, and 48, the 16384 signal points exist while not overlapping one another in the I-Q plane. On the I-Q plane, Euclidean distances between closest signal points are equal in the 16380 signal points of the 16384 signal points except for the rightmost and uppermost point in FIG. 45, the rightmost and lowermost point in FIG. 48, the leftmost and uppermost point in FIG. 46, and the leftmost and lowermost point in FIG. 47. Therefore, the receiver has a high possibility of obtaining the high reception quality.

In the case that precoding matrix F is set to one of equations (S244), (S245), (S246), and (S247), and that α is set to one of equations (S248), (S249), (S250), and (S251), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 49, the arrangement of the signal points existing in the second quadrant is obtained as illustrated in FIG. 50, the arrangement of the signal points existing in the third quadrant is obtained as illustrated in FIG. 51, and the arrangement of the signal points existing in the fourth quadrant is obtained as illustrated in FIG. 52. In FIGS. 49, 50, 51, and 52, a horizontal axis indicates I, and a vertical axis indicates Q, a mark "●" indicates a signal point, and a mark "Δ" indicates origin (0).

As can be seen from FIGS. 49, 50, 51, and 52, the 1024 signal points exist while not overlapping one another. Therefore, the receiver has a high possibility of obtaining the high reception quality.

It is assumed that $D_2$ is a minimum Euclidean distance at the 16384 signal points in FIGS. 45, 46, 47, and 48, and that $D_1$ is a minimum Euclidean distance at the 16384 signal points in FIGS. 49, 50, 51, and 52. $D_1<D_2$ holds. Accordingly, from configuration example R1, it is necessary that $Q_1<Q_2$ holds for $Q_1\neq Q_2$ in equations (s2), (S3), (S4), (S5), and (S8).

Example 4-4

Then, equations (S224) and (S225) hold with respect to coefficient $w_{64}$ of the 64QAM mapping method and coefficient $w_{256}$ of the 256QAM mapping method, and precoding matrix F is set to one of equations (S235), (S236), (S237), and (S238) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 291]

$$F=\begin{pmatrix}\beta\times\cos\theta & \beta\times\sin\theta\\ \beta\times\sin\theta & -\beta\times\cos\theta\end{pmatrix} \qquad \text{Formula (S252)}$$

or

[Mathematical formula 292]

$$F=\begin{pmatrix}\cos\theta & \sin\theta\\ \sin\theta & -\cos\theta\end{pmatrix} \qquad \text{Formula (S253)}$$

or

[Mathematical formula 293]

$$F=\begin{pmatrix}\beta\times\cos\theta & -\beta\times\sin\theta\\ \beta\times\sin\theta & \beta\times\cos\theta\end{pmatrix} \qquad \text{Formula (S254)}$$

or

[Mathematical formula 294]

$$F=\begin{pmatrix}\cos\theta & -\sin\theta\\ \sin\theta & \cos\theta\end{pmatrix} \qquad \text{Formula (S255)}$$

In equations (S252) and (S254), β may be either a real number or an imaginary number. However, β is not 0 (zero).

At this point, value θ with which the receiver obtains the good data reception quality is considered.

With respect to signal $z_2(t)$ ($z_2(i)$) in equations (s2), (S3), (S4), (S5), and (S8), the following equations are considered as value θ with which the receiver obtains the good data reception quality.

[Mathematical formula 295]

$$\theta=\tan^{-1}\left(\frac{\sqrt{170}}{\sqrt{42}}\times\frac{8}{9}\right)\ or\ \tan^{-1}\left(\frac{\sqrt{170}}{\sqrt{42}}\times\frac{8}{9}\right)+2n\pi(\text{radian}) \qquad \text{Formula (S256)}$$

or

[Mathematical formula 296]

$$\theta=\pi+\tan^{-1}\left(\frac{\sqrt{170}}{\sqrt{42}}\times\frac{8}{9}\right)\ or\ \pi+\tan^{-1}\left(\frac{\sqrt{170}}{\sqrt{42}}\times\frac{8}{9}\right)+2n\pi(\text{radian}) \qquad \text{Formula (S257)}$$

or

[Mathematical formula 297]

$$\theta=\tan^{-1}\left(-\frac{\sqrt{170}}{\sqrt{42}}\times\frac{8}{9}\right)\ or\ \tan^{-1}\left(-\frac{\sqrt{170}}{\sqrt{42}}\times\frac{8}{9}\right)+2n\pi(\text{radian}) \qquad \text{Formula (S258)}$$

or

[Mathematical formula 298]

$$\theta=\pi+\tan^{-1}\left(-\frac{\sqrt{170}}{\sqrt{42}}\times\frac{8}{9}\right)\ or\ \pi+\tan^{-1}\left(-\frac{\sqrt{170}}{\sqrt{42}}\times\frac{8}{9}\right)+2n\pi(\text{radian}) \qquad \text{Formula (S259)}$$

In equations (S256), (S257), (S258), and (S259), $\tan^{-1}(x)$ is an inverse trigonometric function) (an inverse function of a trigonometric function in which a domain is properly restricted), and $\tan^{-1}(x)$ is given as follows.

[Mathematical formula 299]

$$-\frac{\pi}{2}(\text{radian})<\tan^{-1}(x)<\frac{\pi}{2}(\text{radian}) \qquad \text{Formula (S260)}$$

"$\tan^{-1}(x)$" may also be referred to as "$\text{Tan}^{-1}(x)$", "arctan (x)", or "Arctan(x)", and n is an integer.

In the case that precoding matrix F is set to one of equations (S252), (S253), (S254), and (S255), and that θ is set to one of equations (S256), (S257), (S258), and (S259), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 45, the arrangement of the signal points existing in the second quadrant is obtained as illustrated in FIG. 46, the arrangement of the signal points existing in the third quadrant is obtained as illustrated in FIG. 47, and the arrangement of the signal points existing in the fourth quadrant is obtained as illustrated in FIG. 48. In FIGS. 45, 46, 47, and 48, a horizontal axis indicates I, and a vertical axis indicates Q, a mark "●" indicates a signal point, and a mark "Δ" indicates origin (0).

As can be seen from FIGS. 45, 46, 47, and 48, the 16384 signal points exist while not overlapping one another in the I-Q plane. On the I-Q plane, Euclidean distances between closest signal points are equal in the 16380 signal points of the 16384 signal points except for the rightmost and uppermost point in FIG. 45, the rightmost and lowermost point in FIG. 48, the leftmost and uppermost point in FIG. 46, and the leftmost and lowermost point in FIG. 47. Therefore, the receiver has a high possibility of obtaining the high reception quality.

In the case that precoding matrix F is set to one of equations (S252), (S253), (S254), and (S255), and that θ is set to one of equations (S256), (S257), (S258), and (S259), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 49, the arrangement of the signal points existing in the second quadrant is obtained as illustrated in FIG. 50, the arrangement of the signal points existing in the third quadrant is obtained as illustrated in FIG. 51, and the arrangement of the signal points existing in the fourth quadrant is obtained as illustrated in FIG. 52. In FIGS. 49, 50, 51, and 52, a horizontal axis indicates I, and a vertical axis indicates Q, a mark "●" indicates a signal point, and a mark "Δ" indicates origin (0).

As can be seen from FIGS. 49, 50, 51, and 52, the 1024 signal points exist while not overlapping one another. Therefore, the receiver has a high possibility of obtaining the high reception quality.

It is assumed that $D_2$ is a minimum Euclidean distance at the 16384 signal points in FIGS. 45, 46, 47, and 48, and that $D_1$ is a minimum Euclidean distance at the 16384 signal points in FIGS. 49, 50, 51, and 52. $D_1<D_2$ holds. Accordingly, from configuration example R1, it is necessary that $Q_1<Q_2$ holds for $Q_1\neq Q_2$ in equations (s2), (S3), (S4), (S5), and (S8).

Example 4-5

Equations (S224) and (S225) hold with respect to coefficient $w_{64}$ of the 64QAM mapping method and coefficient $w_{256}$ of the 256QAM mapping method, and precoding matrix F is set to one of equations (S173), (S174), (S175), and (S176) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 300]

$$F=\begin{pmatrix}\beta\times e^{j0} & \beta\times\alpha\times e^{j0}\\ \beta\times\alpha\times e^{j0} & \beta\times e^{j\pi}\end{pmatrix}\quad\text{Formula (S261)}$$

or

[Mathematical formula 301]

$$F=\frac{1}{\sqrt{\alpha^2+1}}\begin{pmatrix}e^{j0} & \alpha\times e^{j0}\\ \alpha\times e^{j0} & e^{j\pi}\end{pmatrix}\quad\text{Formula (S262)}$$

or

-continued

[Mathematical formula 302]

$$F=\begin{pmatrix}\beta\times e^{j0} & \beta\times\alpha\times e^{j\pi}\\ \beta\times\alpha\times e^{j0} & \beta\times e^{j0}\end{pmatrix}\quad\text{Formula (S263}$$

or

[Mathematical formula 303]

$$F=\frac{1}{\sqrt{\alpha^2+1}}\begin{pmatrix}\beta\times e^{j0} & \beta\times\alpha\times e^{j\pi}\\ \beta\times\alpha\times e^{j0} & \beta\times e^{j0}\end{pmatrix}\quad\text{Formula (S264)}$$

In equations (S261), (S262), (S263), and (S264), α may be either a real number or an imaginary number, and β may be either a real number or an imaginary number. However, a is not 0 (zero). Also β is not 0 (zero).

At this point, value α with which the receiver obtains the good data reception quality is considered.

With respect to signal $z_1(t)$ ($z_1(i)$) in equations (s2), (S3), (S4), (S5), and (S8), the following equations are considered as value α with which the receiver obtains the good data reception quality.

When α is a real number:

[Mathematical formula 304]

$$\alpha=\frac{\sqrt{42}}{\sqrt{170}}\times\frac{9}{8}\quad\text{Formula (S265)}$$

*or*

[Mathematical formula 305]

$$\alpha=-\frac{\sqrt{42}}{\sqrt{170}}\times\frac{9}{8}\quad\text{Formula (S266)}$$

When α is an imaginary number:

[Mathematical formula 306]

$$\alpha=\frac{\sqrt{42}}{\sqrt{170}}\times\frac{9}{8}\times e^{j\frac{\pi}{2}}\quad\text{Formula (S267)}$$

or

[Mathematical formula 307]

$$\alpha=\frac{\sqrt{42}}{\sqrt{170}}\times\frac{9}{8}\times e^{j\frac{3\pi}{2}}\quad\text{Formula (S268)}$$

In the case that precoding matrix F is set to one of equations (S261), (S262), (S263), and (S264), and that α is set to one of equations (S265), (S266), (S267), and (S268), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 21, the arrangement of the signal points existing in the second quadrant is obtained as illustrated in FIG. 22, the arrangement of the signal points existing in the third quadrant is obtained as illustrated in FIG. 23, and the arrangement of the signal points existing in the fourth quadrant is obtained as illustrated in FIG. 24. In FIGS. 21,22, 23, and 24, a horizontal axis indicates I, and a vertical axis indicates Q, a mark "●" indicates a signal point, and a mark "Δ" indicates origin (0).

As can be seen from FIGS. 21, 22, 23, and 24, the 16384 signal points exist while not overlapping one another. On the I-Q plane, Euclidean distances between closest signal points are equal in the 16380 signal points of the 16384 signal points except for the rightmost and uppermost point in FIG. 21, the rightmost and lowermost point in FIG. 24, the leftmost and uppermost point in FIG. 22, and the leftmost and lowermost point in FIG. 23. Therefore, the receiver has a high possibility of obtaining the high reception quality.

In the case that precoding matrix F is set to one of equations (S261), (S262), (S263), and (S264), and that α is set to one of equations (S265), (S266), (S267), and (S268), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 25, the arrangement of the signal points existing in the second quadrant is obtained as illustrated in FIG. 26, the arrangement of the signal points existing in the third quadrant is obtained as illustrated in FIG. 27, and the arrangement of the signal points existing in the fourth quadrant is obtained as illustrated in FIG. 28. In FIGS. 25, 26, 27, and 28, a horizontal axis indicates I, and a vertical axis indicates Q, a mark "●" indicates a signal point, and a mark "Δ" indicates origin (0).

As can be seen from FIGS. 25, 26, 27, and 28, the 1024 signal points exist while not overlapping one another. Therefore, the receiver has a high possibility of obtaining the high reception quality.

It is assumed that $D_1$ is a minimum Euclidean distance at the 16384 signal points in FIGS. 21, 22, 23, and 24, and that $D_2$ is a minimum Euclidean distance at the 16384 signal points in FIGS. 25, 26, 27, and 28. $D_1>D_2$ holds. Accordingly, from configuration example R1, it is necessary that $Q_1>Q_2$ holds for $Q_1 \neq Q_2$ in equations (s2), (S3), (S4), (S5), and (S8).

Example 4-6

Then, equations (S224) and (S225) hold with respect to coefficient $w_{64}$ of the 64QAM mapping method and coefficient $w_{256}$ of the 256QAM mapping method, and precoding matrix F is set to one of equations (S235), (S236), (S237), and (S238) when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

[Mathematical formula 308]

$$F = \begin{pmatrix} \beta \times \cos\theta & \beta \times \sin\theta \\ \beta \times \sin\theta & -\beta \times \cos\theta \end{pmatrix} \quad \text{Formula (S269)}$$

or

[Mathematical formula 309]

$$F = \begin{pmatrix} \cos\theta & \sin\theta \\ \sin\theta & -\cos\theta \end{pmatrix} \quad \text{Formula (S270)}$$

or

-continued

[Mathematical formula 310]

$$F = \begin{pmatrix} \beta \times \cos\theta & -\beta \times \sin\theta \\ \beta \times \sin\theta & \beta \times \cos\theta \end{pmatrix} \quad \text{Formula (S271)}$$

or

[Mathematical formula 311]

$$F = \begin{pmatrix} \cos\theta & -\sin\theta \\ \sin\theta & \cos\theta \end{pmatrix} \quad \text{Formula (S272)}$$

In equations (S269) and (S271), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 312]

$$\theta = \tan^{-1}\left(\frac{\sqrt{42}}{\sqrt{170}} \times \frac{9}{8}\right) \text{ or } \tan^{-1}\left(\frac{\sqrt{42}}{\sqrt{170}} \times \frac{9}{8}\right) + 2n\pi \text{ (radian) or} \quad \text{Formula (S273)}$$

[Mathematical formula 313]

$$\theta = \pi + \tan^{-1}\left(\frac{\sqrt{42}}{\sqrt{170}} \times \frac{9}{8}\right) \text{ or } \pi + \tan^{-1}\left(\frac{\sqrt{42}}{\sqrt{170}} \times \frac{9}{8}\right) + 2n\pi \text{ (radian) or} \quad \text{Formula (S274)}$$

[Mathematical formula 314]

$$\theta = \tan^{-1}\left(-\frac{\sqrt{42}}{\sqrt{170}} \times \frac{9}{8}\right) \text{ or } \tan^{-1}\left(-\frac{\sqrt{42}}{\sqrt{170}} \times \frac{9}{8}\right) + 2n\pi \text{ (radian) or} \quad \text{Formula (S275)}$$

[Mathematical formula 315]

$$\theta = \pi + \tan^{-1}\left(-\frac{\sqrt{42}}{\sqrt{170}} \times \frac{9}{8}\right) \text{ or } \pi + \tan^{-1}\left(-\frac{\sqrt{42}}{\sqrt{170}} \times \frac{9}{8}\right) + 2n\pi \text{ (radian)} \quad \text{Formula (S276)}$$

In equations (S273), (S274), (S275), and (S276), $\tan^{-1}(x)$ is an inverse trigonometric function) (an inverse function of a trigonometric function in which a domain is properly restricted), and $\tan^{-1}(x)$ is given as follows.

[Mathematical formula 316]

$$-\frac{\pi}{2} \text{ (radian)} < \tan^{-1}(x) < \frac{\pi}{2} \text{ (radian)} \quad \text{Formula (S277)}$$

"$\tan^{-1}(x)$" may also be referred to as "$\text{Tan}^{-1}(x)$", "arctan (x)", or "Arctan(x)", and n is an integer.

In the case that precoding matrix F is set to one of equations (S269), (S270), (S271), and (S272), and that θ is set to one of equations (S273), (S274), (S275), and (S276), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 21, the arrangement of the signal points existing in the second quadrant is obtained as illustrated in FIG. 22, the arrangement of the signal points existing in the third quadrant is obtained as illustrated in FIG. 23, and the arrangement of the signal points existing in the fourth quadrant is obtained as illustrated in FIG. 24. In FIGS. 21,22, 23, and 24, a horizontal axis indicates I, and a vertical axis indicates Q, a mark "●" indicates a signal point, and a mark "Δ" indicates origin (0).

As can be seen from FIGS. 21, 22, 23, and 24, the 16384 signal points exist while not overlapping one another. On the I-Q plane, Euclidean distances between closest signal points are equal in the 16380 signal points of the 16384 signal points except for the rightmost and uppermost point in FIG. 21, the rightmost and lowermost point in FIG. 24, the leftmost and uppermost point in FIG. 22, and the leftmost and lowermost point in FIG. 23. Therefore, the receiver has a high possibility of obtaining the high reception quality.

In the case that precoding matrix F is set to one of equations (S269), (S270), (S271), and (S272), and that θ is set to one of equations (S273), (S274), (S275), and (S276), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 25, the arrangement of the signal points existing in the second quadrant is obtained as illustrated in FIG. 26, the arrangement of the signal points existing in the third quadrant is obtained as illustrated in FIG. 27, and the arrangement of the signal points existing in the fourth quadrant is obtained as illustrated in FIG. 28. In FIGS. 25, 26, 27, and 28, a horizontal axis indicates I, and a vertical axis indicates Q, a mark "●" indicates a signal point, and a mark "Δ" indicates origin (0).

As can be seen from FIGS. 25, 26, 27, and 28, the 1024 signal points exist while not overlapping one another. Therefore, the receiver has a high possibility of obtaining the high reception quality.

It is assumed that $D_1$ is a minimum Euclidean distance at the 16384 signal points in FIGS. 21, 22, 23, and 24, and that $D_2$ is a minimum Euclidean distance at the 16384 signal points in FIGS. 25, 26, 27, and 28. $D_1>D_2$ holds. Accordingly, from configuration example R1, it is necessary that $Q_1>Q_2$ holds for $Q_1\neq Q_2$ in equations (s2), (S3), (S4), (S5), and (S8).

Example 4-7

Equations (S224) and (S225) hold with respect to coefficient $w_{64}$ of the 64QAM mapping method and coefficient $w_{256}$ of the 256QAM mapping method, and precoding matrix F is set to one of equations (S173), (S174), (S175), and (S176) when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

[Mathematical formula 317]

$$F=\begin{pmatrix}\beta\times e^{j0} & \beta\times\alpha\times e^{j0}\\ \beta\times\alpha\times e^{j0} & \beta\times e^{j\pi}\end{pmatrix}\quad\text{Formula (S278)}$$

or

-continued

[Mathematical formula 319]

$$F=\frac{1}{\sqrt{\alpha^2+1}}\begin{pmatrix}e^{j0} & \alpha\times e^{j0}\\ \alpha\times e^{j0} & e^{j\pi}\end{pmatrix}\quad\text{Formula (S279)}$$

or

[Mathematical formula 321]

$$F=\begin{pmatrix}\beta\times e^{j0} & \beta\times\alpha\times e^{j\pi}\\ \beta\times\alpha\times e^{j0} & \beta\times e^{j0}\end{pmatrix}\quad\text{Formula (S280)}$$

or

[Mathematical formula 321]

$$F=\frac{1}{\sqrt{\alpha^2+1}}\begin{pmatrix}e^{j0} & \alpha\times e^{j\pi}\\ \alpha\times e^{j0} & e^{j0}\end{pmatrix}\quad\text{Formula (S281)}$$

In equations (S278), (S279), (S280), and (S281), α may be either a real number or an imaginary number, and β may be either a real number or an imaginary number. However, α is not 0 (zero). Also β is not 0 (zero).

At this point, value α with which the receiver obtains the good data reception quality is considered.

With respect to signal $z_1(t)$ ($z_1(i)$) in equations (s2), (S3), (S4), (S5), and (S8), the following equations are considered as value α with which the receiver obtains the good data reception quality.

When α is a real number:

[Mathematical formula 321]

$$\alpha=\frac{\sqrt{42}}{\sqrt{170}}\times\frac{8}{9}\quad\text{Formula (S282)}$$

or

[Mathematical formula 322]

$$\alpha=-\frac{\sqrt{42}}{\sqrt{170}}\times\frac{8}{9}\quad\text{Formula (S283)}$$

When α is an imaginary number:

[Mathematical formula 323]

$$\alpha=\frac{\sqrt{42}}{\sqrt{170}}\times\frac{8}{9}\times e^{j\frac{\pi}{2}}\quad\text{Formula (S284)}$$

or

[Mathematical formula 324]

$$\alpha=-\frac{\sqrt{42}}{\sqrt{170}}\times\frac{8}{9}\times e^{j\frac{3\pi}{2}}\quad\text{Formula (S285)}$$

In the case that precoding matrix F is set to one of equations (S278), (S279), (S280), and (S281), and that α is set to one of equations (S282), (S283), (S284), and (S285), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 29, the arrangement of the signal points existing in the second quadrant is obtained as illustrated in FIG. 30, the arrangement of the signal points existing in the third quadrant is obtained as illustrated in FIG. 31, and the arrangement of the signal points existing in the fourth quadrant is obtained as illustrated in FIG. 32. In FIGS. 29, 30, 31, and 32, a horizontal axis indicates I, and a vertical axis indicates Q, a mark "●" indicates a signal point, and a mark "Δ" indicates origin (0).

As can be seen from FIGS. 29, 30, 31, and 32, the 16384 signal points exist while not overlapping one another. On the I-Q plane, Euclidean distances between closest signal points are equal in the 16380 signal points of the 16384 signal points except for the rightmost and uppermost point in FIG. 29, the rightmost and lowermost point in FIG. 32, the leftmost and uppermost point in FIG. 30, and the leftmost and lowermost point in FIG. 31. Therefore, the receiver has a high possibility of obtaining the high reception quality.

In the case that precoding matrix F is set to one of equations (S278), (S279), (S280), and (S281), and that α is set to one of equations (S282), (S283), (S284), and (S285), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 33, the arrangement of the signal points existing in the second quadrant is obtained as illustrated in FIG. 34, the arrangement of the signal points existing in the third quadrant is obtained as illustrated in FIG. 35, and the arrangement of the signal points existing in the fourth quadrant is obtained as illustrated in FIG. 36. In FIGS. 33, 34, 35, and 36, a horizontal axis indicates I, and a vertical axis indicates Q, a mark "●" indicates a signal point, and a mark "Δ" indicates origin (0).

As can be seen from FIGS. 33, 34, 35, and 36, the 1024 signal points exist while not overlapping one another. Therefore, the receiver has a high possibility of obtaining the high reception quality.

It is assumed that $D_1$ is a minimum Euclidean distance at the 16384 signal points in FIGS. 29, 30, 31, and 32, and that $D_2$ is a minimum Euclidean distance at the 16384 signal points in FIGS. 33, 34, 35, and 36. $D_1>D_2$ holds. Accordingly, from configuration example R1, it is necessary that $|Q_1|>|Q_2|$ holds for $Q_1 \neq Q_2$ in equations (s2), (S3), (S4), (S5), and (S8).

Example 4-8

Equations (S224) and (S225) hold with respect to coefficient $w_{64}$ of the 64QAM mapping method and coefficient $w_{256}$ of the 256QAM mapping method, and precoding matrix F is set to one of equations (S173), (S174), (S175), and (S176) when the calculations are performed in <1> to <5>.

<1> For $P_1^2=P_2^2$ in equation (S2)
<2> For $P_1^2=P_2^2$ in equation (S3)
<3> For $P_1^2=P_2^2$ in equation (S4)
<4> For equation (S5)
<5> For equation (S8)

[Mathematical formula 325]

$$F=\begin{pmatrix}\beta\times\cos\theta & \beta\times\sin\theta\\ \beta\times\sin\theta & -\beta\times\cos\theta\end{pmatrix} \quad \text{Formula (S286)}$$

or

-continued

[Mathematical formula 326]

$$F=\begin{pmatrix}\cos\theta & \sin\theta\\ \sin\theta & -\cos\theta\end{pmatrix} \quad \text{Formula (S287)}$$

or

[Mathematical formula 327]

$$F=\begin{pmatrix}\beta\times\cos\theta & -\beta\times\sin\theta\\ \beta\times\sin\theta & \beta\times\cos\theta\end{pmatrix} \quad \text{Formula (S288)}$$

or

[Mathematical formula 328]

$$F=\begin{pmatrix}\cos\theta & -\sin\theta\\ \sin\theta & \cos\theta\end{pmatrix} \quad \text{Formula (S289)}$$

In equations (S286) and (S288), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 329]

$$\theta=\tan^{-1}\left(\frac{\sqrt{42}}{\sqrt{170}}\times\frac{8}{9}\right)\text{ or }\tan^{-1}\left(\frac{\sqrt{42}}{\sqrt{170}}\times\frac{8}{9}\right)+2n\pi\text{ (radian) or} \quad \text{Formula (S290)}$$

[Mathematical formula 330]

$$\theta=\pi+\tan^{-1}\left(\frac{\sqrt{42}}{\sqrt{170}}\times\frac{8}{9}\right)\text{ or }\pi+\tan^{-1}\left(\frac{\sqrt{42}}{\sqrt{170}}\times\frac{8}{9}\right)+2n\pi\text{ (radian) or} \quad \text{Formula (S291)}$$

[Mathematical formula 331]

$$\theta=\tan^{-1}\left(-\frac{\sqrt{42}}{\sqrt{170}}\times\frac{8}{9}\right)\text{ or }\tan^{-1}\left(-\frac{\sqrt{42}}{\sqrt{170}}\times\frac{8}{9}\right)+2n\pi\text{ (radian) or} \quad \text{Formula (S292)}$$

[Mathematical formula 332]

$$\theta=\pi+\tan^{-1}\left(-\frac{\sqrt{42}}{\sqrt{170}}\times\frac{8}{9}\right)\text{ or }\pi+\tan^{-1}\left(-\frac{\sqrt{42}}{\sqrt{170}}\times\frac{8}{9}\right)+2n\pi\text{ (radian)} \quad \text{Formula (S293)}$$

In equations (S290), (S291), (S292), and (S293), $\tan^{-1}(x)$ is an inverse trigonometric function) (an inverse function of a trigonometric function in which a domain is properly restricted), and $\tan^{-1}(x)$ is given as follows.

[Mathematical formula 333]

$$-\frac{\pi}{2}\text{ (radian)}<\tan^{-1}(x)<\frac{\pi}{2}\text{ (radian)} \quad \text{Formula (S294)}$$

"$\tan^{-1}(x)$" may also be referred to as "$\mathrm{Tan}^{-1}(x)$", "arctan (x)", or "Arctan(x)", and n is an integer.

In the case that precoding matrix F is set to one of equations (S286), (S287), (S288), and (S289), and that θ is set to one of equations (S290), (S291), (S292), and (S293), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_1(t)$ ($u_1(i)$) of configuration example R1 on the I-Q plane, similarly the arrangement of the signal points existing in the first quadrant is obtained as illustrated in FIG. 29, the arrangement of the signal points existing in the second quadrant is obtained as illustrated in FIG. 30, the arrangement of the signal points existing in the third quadrant is obtained as illustrated in FIG. 31, and the arrangement of the signal points existing in the fourth quadrant is obtained as illustrated in FIG. 32. In FIGS. 29, 30, 31, and 2532, a horizontal axis indicates I, and a vertical axis indicates Q, a mark "●" indicates a signal point, and a mark "Δ" indicates origin (0).

As can be seen from FIGS. 29, 30, 31, and 32, the 16384 signal points exist while not overlapping one another. On the I-Q plane, Euclidean distances between closest signal points are equal in the 16380 signal points of the 16384 signal points except for the rightmost and uppermost point in FIG. 29, the rightmost and lowermost point in FIG. 32, the leftmost and uppermost point in FIG. 30, and the leftmost and lowermost point in FIG. 31. Therefore, the receiver has a high possibility of obtaining the high reception quality.

In the case that precoding matrix F is set to one of equations (S286), (S287), (S288), and (S289), and that θ is set to one of equations (S290), (S291), (S292), and (S293), in the signal points corresponding to ($b_{0,64}$, $b_{1,64}$, $b_{2,64}$, $b_{3,64}$, $b_{4,64}$ $b_{5,64}$, $b_{0,256}$, $b_{1,256}$, $b_{2,256}$, $b_{3,256}$, $b_{4,256}$, $b_{5,256}$, $b_{6,256}$, $b_{7,256}$) in signal $u_2(t)$ ($u_2(i)$) of configuration example R1 on the I-Q plane, similarly the arrangement of the signal points existing in the first quadrant is obtained as illustrated in FIG. 33, the arrangement of the signal points existing in the second quadrant is obtained as illustrated in FIG. 34, the arrangement of the signal points existing in the third quadrant is obtained as illustrated in FIG. 35, and the arrangement of the signal points existing in the fourth quadrant is obtained as illustrated in FIG. 36. In FIGS. 33, 34, 35, and 36, a horizontal axis indicates I, and a vertical axis indicates Q, a mark "●" indicates a signal point, and a mark "Δ" indicates origin (0).

As can be seen from FIGS. 33, 34, 35, and 36, the 1024 signal points exist while not overlapping one another. Therefore, the receiver has a high possibility of obtaining the high reception quality.

It is assumed that $D_1$ is a minimum Euclidean distance at the 16384 signal points in FIGS. 29, 30, 31, and 32, and that $D_2$ is a minimum Euclidean distance at the 16384 signal points in FIGS. 33, 34, 35, and 36. $D_1>D_2$ holds. Accordingly, from configuration example R1, it is necessary that $Q_1>Q_2$ holds for $Q_1\neq Q_2$ in equations (s2), (S3), (S4), (S5), and (S8).

Example 4-Supplement

Values α and θ having the possibility of achieving the high data reception quality are illustrated in (Example 4-1) to (Example 4-8). However, even if values α and θ are not those in (Example 4-1) to (Example 4-8), sometimes the high data reception quality is obtained by satisfying the condition of configuration example R1.

Modification

A precoding method according to a modification of each of (Example 1) to (Example 4) will be described below. In FIG. 5, it is considered that baseband signal 511A ($z_1(t)$ ($z_1(i)$)) and baseband signal 511B ($z_2(t)$ ($z_2(i)$)) are given by one of the following equations.

[Mathematical formula 334]

$$\begin{pmatrix} z_1(i) \\ z_2(i) \end{pmatrix} = \begin{pmatrix} Q_1 & 0 \\ 0 & Q_2 \end{pmatrix} \begin{pmatrix} \beta\times e^{j\theta_{11}(i)} & \beta\times\alpha\times e^{j(\theta_{11}(i)+\lambda)} \\ \beta\times\alpha\times e^{j\theta_{21}(i)} & \beta\times e^{j(\theta_{21}(i)+\lambda+\pi)} \end{pmatrix} \begin{pmatrix} P_1 & 0 \\ 0 & P_2 \end{pmatrix} \begin{pmatrix} s_1(i) \\ s_2(i) \end{pmatrix} \quad \text{Formula (S295)}$$

[Mathematical formula 335]

$$\begin{pmatrix} z_1(i) \\ z_2(i) \end{pmatrix} = \begin{pmatrix} Q_1 & 0 \\ 0 & Q_2 \end{pmatrix} \frac{1}{\sqrt{\alpha^2+1}} \begin{pmatrix} e^{j\theta_{11}(i)} & \alpha\times e^{j(\theta_{11}(i)+\lambda)} \\ \alpha\times e^{j\theta_{21}(i)} & e^{j(\theta_{21}(i)+\lambda+\pi)} \end{pmatrix} \begin{pmatrix} P_1 & 0 \\ 0 & P_2 \end{pmatrix} \begin{pmatrix} s_1(i) \\ s_2(i) \end{pmatrix} \quad \text{Formula (S296)}$$

In the formulas, $\theta_{11}(i)$ and $\theta_{21}(i)$ are a function of i (time or frequency), λ is a fixed value, α may be either a real number or an imaginary number, and β may be either a real number or an imaginary number. However, α is not 0 (zero). Also β is not 0 (zero).

In the modification of (Example 1), it is assumed that the modulation scheme of baseband signal 505A ($s_1(t)$ ($s_1(i)$)) is set to 16QAM while the modulation scheme of baseband signal 505B ($s_2(t)$ ($s_2(i)$)) is set to 64QAM, and that equations (S11) and (S12) hold with respect to coefficient $w_{16}$ of the 16QAM mapping method and coefficient $w_{64}$ of the 64QAM mapping method.

Even if one of equations (S18), (S19), (S20), and (S21) is used in α of equations (S295) and (S296), and even if $Q_1>Q_2$ holds, or even if one of equations (S35), (S36), (S37), and (S38) is used in α of equations (S295) and (S296), and even if $Q_1>Q_2$ holds, or even if one of equations (S52), (S53), (S54), and (S55) is used in α of equations (S295) and (S296), and even if $Q_1<Q_2$ holds, or even if one of equations (S69), (S70), (S71), and (S72) is used in α of equations (S295) and (S296), and even if $Q_1<Q_2$ holds, the effect similar to (Example 1) can be obtained.

In the modification of (Example 2), it is assumed that the modulation scheme of baseband signal 505A ($s_1(t)$ ($s_1(i)$)) is set to 64QAM while the modulation scheme of baseband signal 505B ($s_2(t)$ ($s_2(i)$)) is set to 16QAM, and that equations (S82) and (S83) hold with respect to coefficient $w_{16}$ of the 16QAM mapping method and coefficient $w_{64}$ of the 64QAM mapping method.

even if one of equations (S89), (S90), (S91), and (S92) is used in α of equations (S295) and (S296), and even if $Q_1<Q_2$ holds, or even if one of equations (S106), (S107), (S108), and (S109) is used in α of equations (S295) and (S296), and even if $Q_1<Q_2$ holds, or even if one of equations (S123), (S124), (S125), and (S126) is used in $\alpha$ of equations (S295) and (S296), and even if $Q_1<Q_2$ holds, or even if one of equations (S140), (S141), (S142), and (S143) is used in $\alpha$ of equations (S295) and (S296), and even if $Q_1<Q_2$ holds, the effect similar to (Example 2) can be obtained.

In the modification of (Example 3), it is assumed that the modulation scheme of baseband signal 505A ($s_1(t)$ ($s_1(i)$)) is set to 64QAM while the modulation scheme of baseband signal 505B ($s_2(t)$ ($s_2(i)$)) is set to 256QAM, and that equations (S153) and (S154) hold with respect to coefficient $w_{64}$ of the 64QAM mapping method and coefficient $w_{256}$ of the 256QAM mapping method even if one of equations (S160), (S161), (S162), and (S163) is used in $\alpha$ of equations (S295) and (S296), and even if $Q_1<Q_2$ holds, or even if one of equations (S177), (S178), (S179), and (S180) is used in $\alpha$ of equations (S295) and (S296), and even if $Q_1<Q_2$ holds, or even if one of equations (S194), (S195), (S196), and (S197) is used in $\alpha$ of equations (S295) and (S296), and even if $Q_1<Q_2$ holds, or even if one of equations (S211), (S212), (S213), and (S214) is used in $\alpha$ of equations (S295) and (S296), and even if $Q_1<Q_2$ holds, the effect similar to (Example 3) can be obtained.

In the modification of (Example 4), it is assumed that the modulation scheme of baseband signal 505A ($s_1(t)$ ($s_1(i)$)) is set to 256QAM while the modulation scheme of baseband signal 505B ($s_2(t)$ ($s_2(i)$)) is set to 64QAM, and that equations (S224) and (S225) hold with respect to coefficient $w_{64}$ of the 64QAM mapping method and coefficient $w_{256}$ of the 256QAM mapping method.

even if one of equations (S231), (S232), (S233), and (S234) is used in $\alpha$ of equations (S295) and (S296), and even if $Q_1<Q_2$ holds, or even if one of equations (S248), (S249), (S250), and (S251) is used in $\alpha$ of equations (S295) and (S296), and even if $Q_1<Q_2$ holds, or even if one of equations (S265), (S266), (S267), and (S268) is used in $\alpha$ of equations (S295) and (S296), and even if $Q_1>Q_2$ holds, or even if one of equations (S282), (S283), (S284), and (S285) is used in $\alpha$ of equations (S295) and (S296), and even if $Q_1>Q_2$ holds, the effect similar to (Example 4) can be obtained.

In the above modifications, values $\alpha$ and $\theta$ having the possibility of achieving the high data reception quality are illustrated. However, even if values $\alpha$ and $\theta$ are not those in the modifications, sometimes the high data reception quality is obtained by satisfying the condition of configuration example R1.

An example different from (Example 1) to (Example 4) and the modification thereof will be described below.

Example 5

In mapper 504 of FIGS. 5 to 7, the modulation scheme for obtaining $s_1(t)$ ($s_1(i)$) is set to 16QAM while the modulation scheme for obtaining $s_2(t)$ ($s_2(i)$) is set to 64QAM. An example of conditions associated with the configuration and power change of precoding matrix (F) when the precoding and/or the power change is performed on, for example, one of equations (s2), (S3), (S4), (S5), and (S8) will be described below.

The 16QAM mapping method will be described below. FIG. 10 illustrates an arrangement example of 16QAM signal points in the I-Q plane. In FIG. 10, 16 marks "○" indicate 16QAM signal points, a horizontal axis indicates I, and a vertical axis indicates Q.

In the I-Q plane, 16 signal points included in 16QAM (indicated by the marks "○" in FIG. 10) are obtained as follows. ($w_{16}$ is a real number larger than 0)

$(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$

At this point, the bits to be transmitted (input bits) are set to b0, b1, b2, and b3. For example, in the case that the bits to be transmitted is (b0, b1, b2, b3)=(0,0,0,0), the bits are mapped at signal point 1001 in FIG. 10, and $(I,Q)=(3w_{16},3w_{16})$ is obtained when I is an in-phase component while Q is a quadrature component of the mapped baseband signal.

Based on the bits to be transmitted (b0, b1, b2, b3), in-phase component I and quadrature component Q of the mapped baseband signal are decided (during 16QAM modulation). FIG. 10 illustrates an example of the relationship between the set of b0, b1, b2, and b3 (0000 to 1111) and the signal point coordinates. Values 0000 to 1111 of the set of b0, b1, b2, and b3 are indicated immediately below 16 signal points included in 16QAM (the marks "○" in FIG. 10) $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$. Respective coordinates of the signal points ("○") immediately above the values 0000 to 1111 of the set of b0, b1, b2, and b3 in the I-Q plane serve as in-phase component I and quadrature component Q of the mapped baseband signal. The relationship between the set of b0, b1, b2, and b3 (0000 to 1111) and the signal point coordinates during 16QAM modulation is not limited to that in FIG. 10. A complex value of in-phase component I and quadrature component Q of the mapped baseband signal (during 16QAM modulation) serves as a baseband signal ($s_1(t)$ or $s_2(t)$ in FIGS. 5 to 7).

The 64QAM mapping method will be described below. FIG. 11 illustrates an arrangement example of 64QAM signal points in the I-Q plane. In FIG. 11, 64 marks "○" indicate 64QAM signal points, a horizontal axis indicates I, and a vertical axis indicates Q.

In the I-Q plane, 64 signal points included in 64QAM (indicated by the marks "○" in FIG. 11) are obtained as follows. ($w_{64}$ is a real number larger than 0)

$(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64}-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$

At this point, the bits to be transmitted (input bits) are set to b0, b1, b2, b3, b4, and b5. For example, in the case that the bits to be transmitted is (b0, b1, b2, b3, b4, b5)=(0,0,0, 0,0,0), the bits are mapped at signal point 1101 in FIG. 11, and $(I,Q)=(7w_{64},7w_{64})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 11 illustrates an example of a relationship between the set of b0, b1, b2, b3, b4, and b5 (000000 to 111111) and the signal point coordinates. Values 000000 to of the set of b0, b1, b2, b3, b4, and b5 are indicated immediately below 64 signal points included in 64QAM (the marks "○" in FIG. 11) $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64}-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$. Respective coordinates of the signal points ("○") immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 11. A complex value of in-phase component I and quadrature component Q of the mapped baseband signal (during 64QAM modulation) serves as a baseband signal ($s_1(t)$ or $s_2(t)$ in FIGS. 5 to 7).

In this case, the modulation scheme of baseband signal 505A ($s_1(t)$ ($s_1(i)$)) is set to 16QAM while modulation scheme of baseband signal 505B ($s_2(t)$ ($s_2(i)$)) is set to 64QAM in FIG. 5 to FIG. 7. The configuration of the precoding matrix will be described below.

At this point, generally average power of baseband signal 505A ($s_1(t)$ and ($s_1(i)$)) and average power of baseband signal 505B ($s_2(t)$ and ($s_2(i)$)), which are of the output of mapper 504 in FIGS. 5 to 7, are equalized to each other. Accordingly, equations (S11) and (S12) hold with respect to coefficient $w_{16}$ of the 16QAM mapping method and coefficient $w_{64}$ of the 64QAM mapping method. In equations (S11) and (S12), it is assumed that z is a real number larger than 0. When the calculations are performed in <1> to <5>, <1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

the configuration of precoding matrix F and a relationship between $Q_1$ and $Q_2$ will be described below.

Equations (S11) and (S12) hold with respect to coefficient $w_{16}$ of the 16QAM mapping method and coefficient $w_{64}$ of the 64QAM mapping method, and one of equations (S22), (S23), (S24), and (S25) is considered as precoding matrix F when the calculations are performed in <1> to <5>.

<1> For $P_1^2=P_2^2$ in equation (s2)

<2> For $P_1^2=P_2^2$ in equation (S3)

<3> For $P_1^2=P_2^2$ in equation (S4)

<4> For equation (S5)

<5> For equation (S8)

In equations (S22) and (S24), β may be either a real number or an imaginary number. However, β is not 0 (zero).

At this point, value θ with which the receiver obtains the good data reception quality is considered.

With respect to signal $z_1(t)$ ($z_1(i)$) in equations (s2), (S3), (S4), (S5), and (S8), the following equations are considered as value θ with which the receiver obtains the good data reception quality.

[Mathematical formula 336]

$$\theta = 15 \text{ or } 15 + 360\times n \text{ (degree)} \qquad \text{Formula (S297)}$$

or

[Mathematical formula 337]

$$\theta = 180 + 15 = 195 \text{ or } 195 + 360\times n \text{ (degree)} \qquad \text{Formula (S298)}$$

or

[Mathematical formula 338]

$$\theta = -15 \text{ or } -15 + 360\times n \text{ (degree)} \qquad \text{Formula (S299)}$$

or

[Mathematical formula 338]

$$\theta = 180 - 15 = 165 \text{ or } 165 + 360\times n \text{ (degree)} \qquad \text{Formula (S300)}$$

In the formulas, n is an integer.

Figure 55:
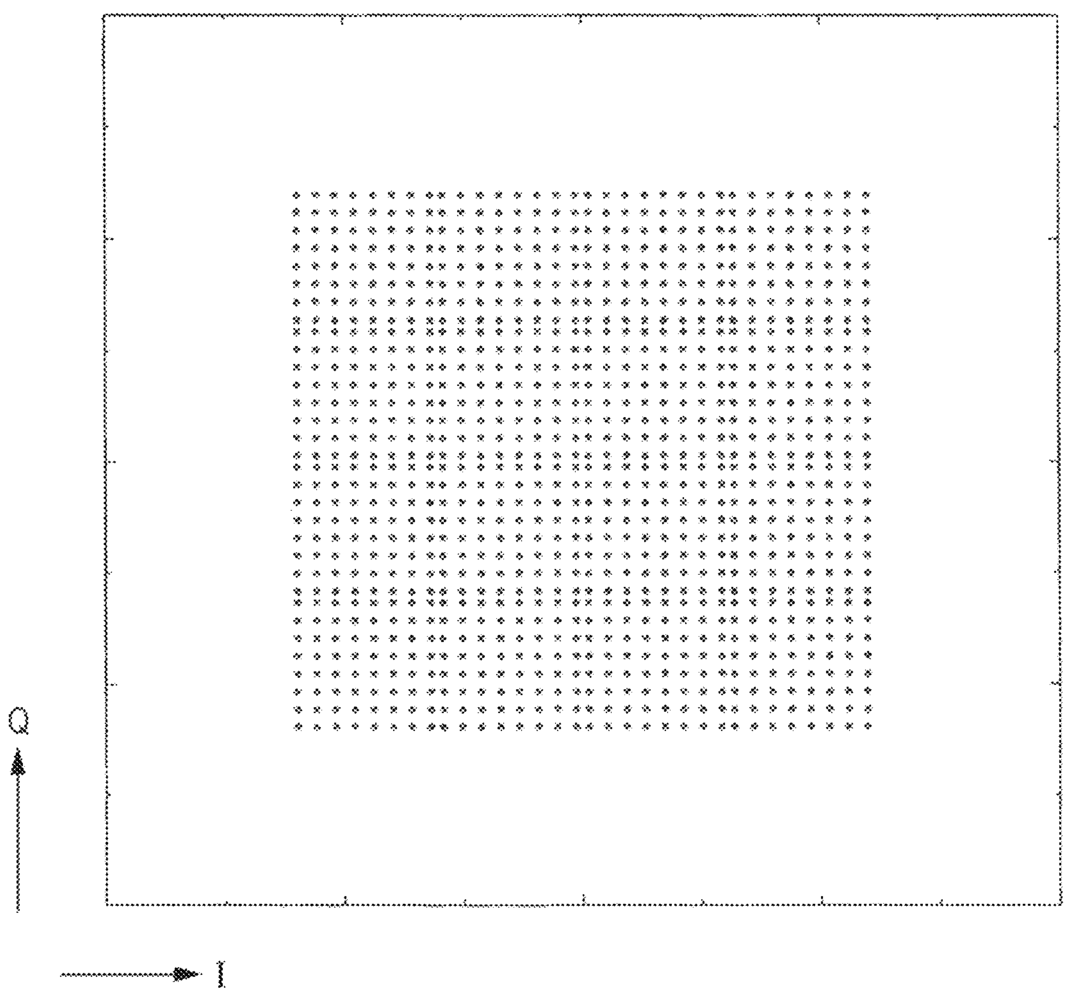
FIG. 55 is a view illustrating an arrangement example of the signal points in the I-Q plane.

In the case that precoding matrix F is set to one of equations (S22), (S23), (S24), and (S25), and that θ is set to one of equations (S297), (S298), (S299), and (S300), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 55 in signal $u_1(t)$ ($u_1(i)$) of configuration example R1 on the I-Q plane. In FIG. 55, a horizontal axis indicates I, and a vertical axis indicates Q, and a mark "●" indicates a signal point.

As can be seen from FIG. 55, the 1024 signal points exist while not overlapping one another. Therefore, the receiver has a high possibility of obtaining the high reception quality.

Figure 56:
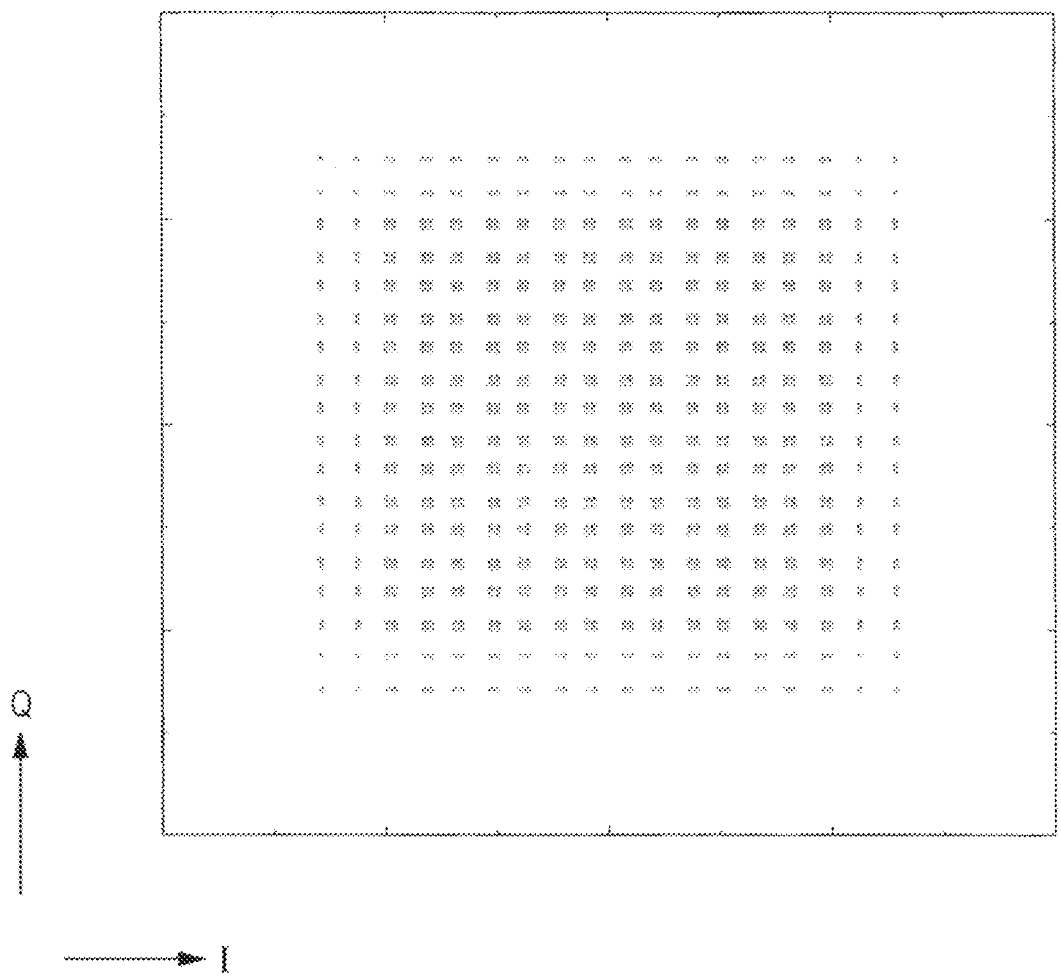
FIG. 56 is a view illustrating an arrangement example of the signal points in the I-Q plane.

In the case that precoding matrix F is set to one of equations (S22), (S23), (S24), and (S25), and that θ is set to one of equations (S297), (S298), (S299), and (S300), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 56 in signal $u_2(t)$ ($u_2(i)$) of configuration example R1 on the I-Q plane. In FIG. 56, a horizontal axis indicates I, and a vertical axis indicates Q, and a mark "●" indicates a signal point.

As can be seen from FIG. 56, the 1024 signal points exist while not overlapping one another. Therefore, the receiver has a high possibility of obtaining the high reception quality.

It is assumed that $D_1$ is a minimum Euclidean distance at the 1024 signal points in FIG. 55, and that $D_2$ is a minimum Euclidean distance at the 1024 signal points in FIG. 56. $D_1>D_2$ holds. Accordingly, from configuration example R1, it is necessary that $Q_1>Q_2$ holds for $Q_1\neq Q_2$ in equations (s2), (S3), (S4), (S5), and (S8).

Example 5-Supplement

Value θ having the possibility of achieving the high data reception quality are illustrated in (Example 5). However, even if value θ is not one in (Example 5), sometimes the high data reception quality is obtained by satisfying the condition of configuration example R1.

Example 6

In mapper 504 of FIGS. 5 to 7, the modulation scheme for obtaining $s_1(t)$ ($s_1(i)$) is set to 64QAM while the modulation scheme for obtaining $s_2(t)$ ($s_2(i)$) is set to 16QAM. An example of conditions associated with the configuration and power change of precoding matrix (F) when the precoding and/or the power change is performed on, for example, one of equations (s2), (S3), (S4), (S5), and (S8) will be described below.

The 16QAM mapping method will be described below. FIG. 10 illustrates an arrangement example of 16QAM signal points in the I-Q plane. In FIG. 10, 16 marks "○" indicate 16QAM signal points, a horizontal axis indicates I, and a vertical axis indicates Q.

In the I-Q plane, 16 signal points included in 16QAM (indicated by the marks "○" in FIG. 10) are obtained as follows. ($w_{16}$ is a real number larger than 0)

$(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$

At this point, the bits to be transmitted (input bits) are set to b0, b1, b2, and b3. For example, in the case that the bits to be transmitted is (b0, b1, b2, b3)=(0,0,0,0), the bits are mapped at signal point 1001 in FIG. 10, and $(I,Q)=(3w_{16},3w_{16})$ is obtained when I is an in-phase component while Q is a quadrature component of the mapped baseband signal.

Based on the bits to be transmitted (b0, b1, b2, b3), in-phase component I and quadrature component Q of the mapped baseband signal are decided (during 16QAM modulation). FIG. 10 illustrates an example of the relationship between the set of b0, b1, b2, and b3 (0000 to 1111) and the signal point coordinates. Values 0000 to 1111 of the set of b0, b1, b2, and b3 are indicated immediately below 16 signal points included in 16QAM (the marks "○" in FIG. 10) $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, $(-3w_{16},-3w_{16})$. Respective coordinates of the signal points ("○") immediately above the values 0000 to 1111 of the set of b0, b1, b2, and b3 in the I-Q plane serve as in-phase component I and quadrature component Q of the mapped baseband signal. The relationship between the set of b0, b1, b2, and b3 (0000 to 1111) and the signal point coordinates during 16QAM modulation is not limited to that in FIG. 10. A complex value of in-phase component I and quadrature component Q of the mapped baseband signal (during 16QAM modulation) serves as a baseband signal ($s_1(t)$ or $s_2(t)$ in FIGS. 5 to 7).

The 64QAM mapping method will be described below. FIG. 11 illustrates an arrangement example of 64QAM signal points in the I-Q plane. In FIG. 11, 64 marks "○" indicate 64QAM signal points, a horizontal axis indicates I, and a vertical axis indicates Q.

In the I-Q plane, 64 signal points included in 64QAM (indicated by the marks "○" in FIG. 11) are obtained as follows. ($w_{64}$ is a real number larger than 0)

$(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$

At this point, the bits to be transmitted (input bits) are set to b0, b1, b2, b3, b4, and b5. For example, in the case that the bits to be transmitted is (b0, b1, b2, b3, b4, b5)=(0,0,0,0,0,0), the bits are mapped at signal point 1101 in FIG. 11, and $(I,Q)=(7w_{64},7w_{64})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 11 illustrates an example of a relationship between the set of b0, b1, b2, b3, b4, and b5 (000000 to 111111) and the signal point coordinates. Values 000000 to 111111 of the set of b0, b1, b2, b3, b4, and b5 are indicated immediately below 64 signal points included in 64QAM (the marks "○" in FIG. 11) $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$ $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$ $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$ $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$ $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$ $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-3w_{64})$, $(-3w_{64},-5w_{64})$, $(-3w_{64},-7w_{64})$ $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$ $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, $(-7w_{64},-7w_{64})$. Respective coordinates of the signal points ("○") immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 11. A complex value of in-phase component I and quadrature component Q of the mapped baseband signal (during 64QAM modulation) serves as a baseband signal ($s_1(t)$ or $s_2(t)$ in FIGS. 5 to 7).

In this case, the modulation scheme of baseband signal 505A ($s_1(t)$ ($s_1(i)$)) is set to 64QAM while modulation scheme of baseband signal 505B ($s_2(t)$ ($s_2(i)$)) is set to 16QAM in FIG. 5 to FIG. 7. The configuration of the precoding matrix will be described below.

At this point, generally average power of baseband signal 505A ($s_1(t)$ and ($s_1(i)$)) and average power of baseband signal 505B ($s_2(t)$ and ($s_2(i)$)), which are of the output of mapper 504 in FIGS. 5 to 7, are equalized to each other. Accordingly, equations (S82) and (S83) hold with respect to coefficient $w_{16}$ of the 16QAM mapping method and coefficient $w_{64}$ of the 64QAM mapping method. In equations (S82) and (S83), it is assumed that z is a real number larger than 0. When the calculations are performed in <1> to <5>, <1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

the configuration of precoding matrix F and a relationship between $Q_1$ and $Q_2$ will be described below.

Equations (S11) and (S12) hold with respect to coefficient $w_{16}$ of the 16QAM mapping method and coefficient $w_{64}$ of the 64QAM mapping method, and one of equations (S93), (S94), (S95), and (S96) is considered as precoding matrix F when the calculations are performed in <1> to <5>.

<1> For $P_1^2=P_2^2$ in equation (s2)
<2> For $P_1^2=P_2^2$ in equation (S3)
<3> For $P_1^2=P_2^2$ in equation (S4)
<4> For equation (S5)
<5> For equation (S8)

In equations (S93) and (S95), β may be either a real number or an imaginary number. However, β is not 0 (zero).

At this point, value θ with which the receiver obtains the good data reception quality is considered.

With respect to signal $z_2(t)$ ($z_2(i)$) in equations (s2), (S3), (S4), (S5), and (S8), the following equations are considered as value θ with which the receiver obtains the good data reception quality.

[Mathematical formula 340]

$$\theta = 15 \text{ or } 15 + 360 \times n \text{ (degree)} \quad \text{Formula (S301)}$$

or

[Mathematical formula 341]

$$\theta = 180 + 15 \text{ or } 195 + 360 \times n \text{ (degree)} \quad \text{Formula (S302)}$$
$$= 195$$

or

[Mathematical formula 342]

$$\theta = -15 \text{ or } -15 + 360 \times n \text{ (degree)} \quad \text{Formula (S303)}$$

or

-continued

[Mathematical formula 343]

$$\theta = 180 - 15 \text{ or } 165 + 360 \times n \text{ (degree)} \quad \text{Formula (S304)}$$
$$= 165$$

In the formulas, n is an integer.

In the case that precoding matrix F is set to one of equations (S93), (S94), (S95), and (S96), and that θ is set to one of equations (S301), (S302), (S303), and (S304), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 55 in signal $u_2(t)$ ($u_2(i)$) of configuration example R1 on the I-Q plane. In FIG. 55, a horizontal axis indicates I, and a vertical axis indicates Q, and a mark "●" indicates a signal point.

As can be seen from FIG. 55, the 1024 signal points exist while not overlapping one another. Therefore, the receiver has a high possibility of obtaining the high reception quality.

In the case that precoding matrix F is set to one of equations (S93), (S94), (S95), and (S96), and that θ is set to one of equations (S301), (S302), (S303), and (S304), similarly the arrangement of the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (0,0,0,0,0,0,0,0,0,0) to the signal point at which ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$) corresponds to (1,1,1,1,1,1,1,1,1,1) is obtained as illustrated in FIG. 56 in signal $u_1(t)$ ($u_1(i)$) of configuration example R1 on the I-Q plane. In FIG. 56, a horizontal axis indicates I, and a vertical axis indicates Q, and a mark "●" indicates a signal point.

As can be seen from FIG. 56, the 1024 signal points exist while not overlapping one another. Therefore, the receiver has a high possibility of obtaining the high reception quality.

It is assumed that $D_2$ is a minimum Euclidean distance at the 1024 signal points in FIG. 55, and that $D_1$ is a minimum Euclidean distance at the 1024 signal points in FIG. 56. $D_1<D_2$ holds. Accordingly, from configuration example R1, it is necessary that $Q_1<Q_2$ holds for $Q_1 \neq Q_2$ in equations (s2), (S3), (S4), (S5), and (S8).

Example 6-Supplement

Value θ having the possibility of achieving the high data reception quality are illustrated in (Example 6). However, even if value θ is not one in (Example 6), sometimes the high data reception quality is obtained by satisfying the condition of configuration example R1.

The operation of the receiver in the case that the transmitter transmits the modulated signal using (Example 1) to (Example 4) and the modulations thereof, (Example 5), and (Example 6) will be described below.

FIG. 53 illustrates the relationship between the transmitting antenna and the receiving antenna. It is assumed that modulated signal #1 (S4901A) is transmitted from transmitting antenna #1 (S4902A) of the transmitter, and that modulated signal #2 (S4901B) is transmitted from antenna #2 (S4902B).

Receiving antenna #1 (S4903X) and receiving antenna #2 (S4903Y) of the receiver receive the modulated signals transmitted from the transmitter (obtain received signal S490X and received signal S4904Y). At this point, it is assumed that $h_{11}(t)$ is a propagation coefficient from transmitting antenna #1 (S4902A) from receiving antenna #1 (S4903X), that $h_{21}(t)$ is a propagation coefficient from transmitting antenna #1 (4902A) to receiving antenna #2 (4903Y), that $h_{12}(t)$ is a propagation coefficient from transmitting antenna #2 (S4902B) to receiving antenna #1 (S4903X), and that $h_{22}(t)$ is a propagation coefficient from transmitting antenna #2 (S4902B) to receiving antenna #2 (S4903Y) (t is time).

Figure 54:
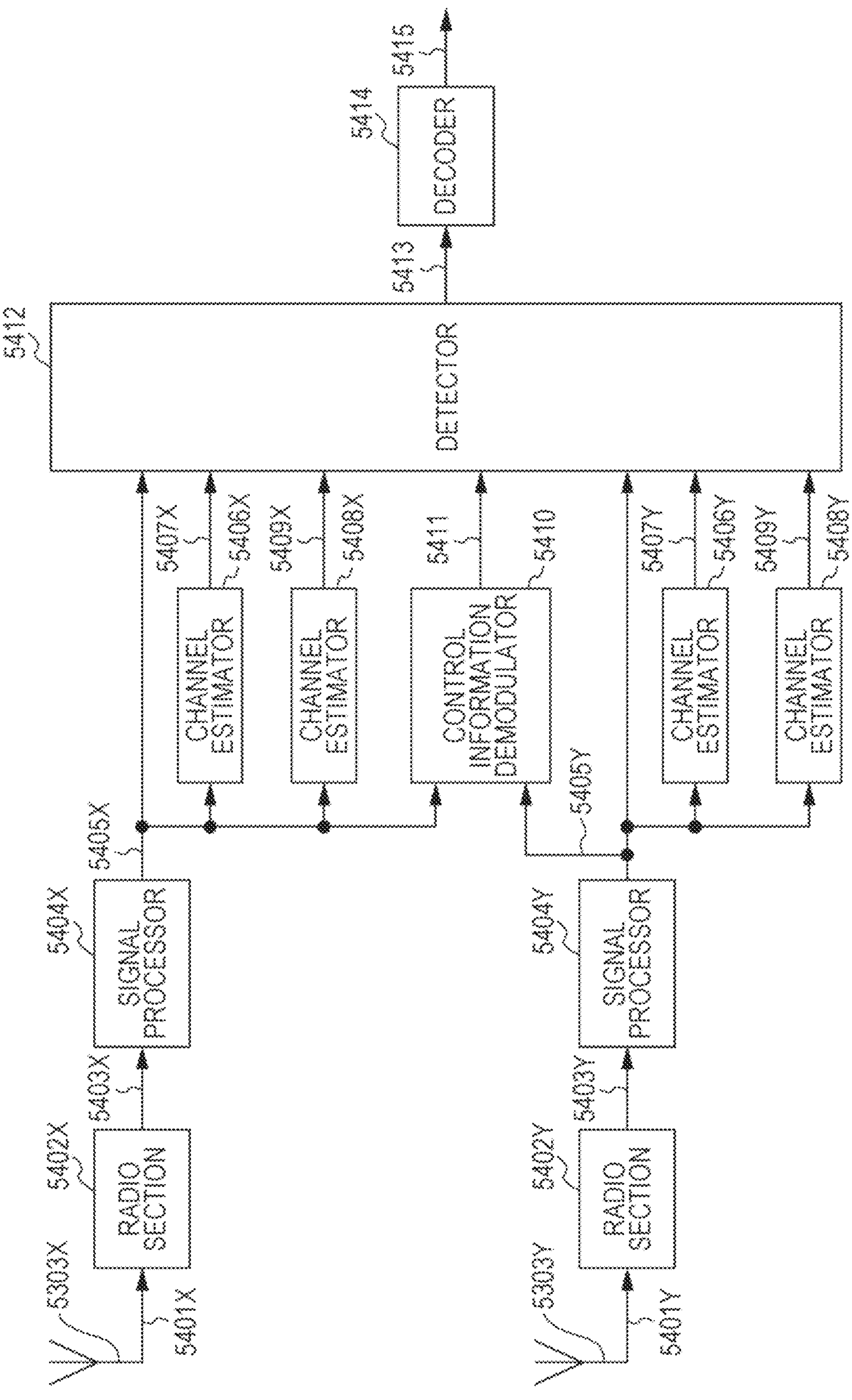
FIG. 54 is a view illustrating a configuration example of a receiver.

FIG. 54 illustrates a configuration example of the receiver. Received signal 5401X received by receiving antenna #1 (S4903X) is input to radio section 5402X, and radio section 5402X performs the pieces of processing such as the amplification and the frequency conversion to output signal 5403X.

For example, when the OFDM scheme is used, signal processor 5404X performs the pieces of processing such as a Fourier transform and a parallel-serial conversion to obtain baseband signal 5405X. At this point, baseband signal 5405X is represented as $r'_1(t)$.

Received signal 5401Y received by receiving antenna #2 (S4903Y) is input to radio section 5402Y, and radio section 5402Y performs the pieces of processing such as the amplification and the frequency conversion to output signal 5403Y.

For example, when the OFDM scheme is used, signal processor 5404Y performs the pieces of processing such as a Fourier transform and a parallel-serial conversion to obtain baseband signal 5405Y. At this point, baseband signal 5405Y is represented as $r'_2(t)$.

Baseband signal 5405X is input to channel estimator 5406X, and channel estimator 5406X performs the channel estimation (estimation of the propagation coefficient) from, for example, the pilot symbol of the frame configuration in FIG. 9 to output channel estimation signal 5407X. It is assumed that channel estimation signal 5407X is an estimated signal of $h_{11}(t)$ and represented as $h'_{11}(t)$.

Baseband signal 5405X is input to channel estimator 5408X, and channel estimator 5408X performs the channel estimation (estimation of the propagation coefficient) from, for example, the pilot symbol of the frame configuration in FIG. 9 to output channel estimation signal 5409X. It is assumed that channel estimation signal 5409X is an estimated signal of $h_{12}(t)$ and represented as $h'_{12}(t)$.

Baseband signal 5405Y is input to channel estimator 5406Y, and channel estimator 5406Y performs the channel estimation (estimation of the propagation coefficient) from, for example, the pilot symbol of the frame configuration in FIG. 9 to output channel estimation signal 5407Y. It is assumed that channel estimation signal 5407Y is an estimated signal of $h_{21}(t)$ and represented as $h'_{21}(t)$.

Baseband signal 5405Y is input to channel estimator 5408Y, and channel estimator 5408Y performs the channel estimation (estimation of the propagation coefficient) from, for example, the pilot symbol of the frame configuration in FIG. 9 to output channel estimation signal 5409Y. It is assumed that channel estimation signal 5409Y is an estimated signal of $h_{22}(t)$ and represented as $h'_{22}(t)$.

Baseband signal 5005X and baseband signal 540Y are input to control information demodulator 5410, and control information demodulator 5410 demodulates (detects and decodes) the symbol that transmits control information including the transmission method, modulation scheme, and information about the transmission power, which are transmitted from the transmitter together with the data (symbol), and control information demodulator 5410 outputs control information 5411.

The transmitter transmits the modulated signal by one of the above transmission methods. Accordingly, the transmission method for transmitting the modulated signal is one of the following methods.

<1> Transmission method for equation (s2)
<2> Transmission method for equation (S3)
<3> Transmission method for equation (S4)
<4> Transmission method for equation (S5)
<5> Transmission method for equation (S6)
<6> Transmission method for equation (S7)
<7> Transmission method for equation (S8)
<8> Transmission method for equation (S9)
<9> Transmission method for equation (S10)
<10> Transmission method for equation (S295)
<11> Transmission method for equation (S296)

The following relationship holds in the case that the transmission method for equation (s2) is used.

[Mathematical formula 344]

$$\begin{aligned}\begin{pmatrix} r'_1(i) \\ r'_2(i) \end{pmatrix} &= \begin{pmatrix} h'_{11}(i) & h'_{12}(i) \\ h'_{21}(i) & h'_{22}(i) \end{pmatrix}\begin{pmatrix} z_1(i) \\ z_2(i) \end{pmatrix} \\ &= \begin{pmatrix} h'_{11}(i) & h'_{12}(i) \\ h'_{21}(i) & h'_{22}(i) \end{pmatrix}\begin{pmatrix} Q_1 & 0 \\ 0 & Q_2 \end{pmatrix} F \begin{pmatrix} P_1 \times s_1(i) \\ P_2 \times s_2(i) \end{pmatrix} \\ &= \begin{pmatrix} h'_{11}(i) & h'_{12}(i) \\ h'_{21}(i) & h'_{22}(i) \end{pmatrix}\begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix}\end{aligned} \tag{S305}$$

The following relationship holds in the case that the transmission method for equation (S3) is used.

[Mathematical formula 345]

$$\begin{aligned}\begin{pmatrix} r'_1(i) \\ r'_2(i) \end{pmatrix} &= \begin{pmatrix} h'_{11}(i) & h'_{12}(i) \\ h'_{21}(i) & h'_{22}(i) \end{pmatrix}\begin{pmatrix} z_1(i) \\ z_2(i) \end{pmatrix} \\ &= \begin{pmatrix} h'_{11}(i) & h'_{12}(i) \\ h'_{21}(i) & h'_{22}(i) \end{pmatrix}\begin{pmatrix} Q_1 & 0 \\ 0 & Q_2 \end{pmatrix}\begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} \\ &= \begin{pmatrix} h'_{11}(i) & h'_{12}(i) \\ h'_{21}(i) & h'_{22}(i) \end{pmatrix}\begin{pmatrix} Q_1 & 0 \\ 0 & Q_2 \end{pmatrix}\begin{pmatrix} 1 & 0 \\ 0 & e^{j\theta(i)} \end{pmatrix}\begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix}\end{aligned} \tag{S306}$$

The following relationship holds in the case that the transmission method for equation (S4) is used.

[Mathematical formula 346]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 \times s_1(i) \\ P_2 \times s_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \tag{S307}$$

The following relationship holds in the case that the transmission method for equation (S5) is used.

[Mathematical formula 347]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \tag{S308}$$

The following relationship holds in the case that the transmission method for equation (S6) is used.

[Mathematical formula 348]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \tag{S309}$$

The following relationship holds in the case that the transmission method for equation (S7) is used.

[Mathematical formula 349]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} a(i) & b(i) \\ c(i) & d(i) \end{pmatrix} \begin{pmatrix} s_1(i) \\ s_2(i) \end{pmatrix} \tag{S310}$$

The following relationship holds in the case that the transmission method for equation (S8) is used.

[Mathematical formula 350]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \tag{S311}$$

The following relationship holds in the case that the transmission method for equation (S9) is used.

[Mathematical formula 351]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \tag{S312}$$

The following relationship holds in the case that the transmission method for equation (S10) is used.

[Mathematical formula 352]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} \tag{S313}$$

The following relationship holds in the case that the transmission method for equation (S295) is used.

[Mathematical formula 353]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} Q_1 & 0 \\ 0 & Q_2 \end{pmatrix} \begin{pmatrix} \beta \times e^{j\theta_{11}(i)} & \beta \times \alpha \times e^{j(\theta_{11}(i)+\lambda)} \\ \beta \times \alpha \times e^{j\theta_{21}(i)} & \beta \times e^{j(\theta_{21}(i)+\lambda+\pi)} \end{pmatrix} \begin{pmatrix} P_1 & 0 \\ 0 & P_2 \end{pmatrix} \begin{pmatrix} s_1(i) \\ s_2(i) \end{pmatrix} \tag{Formula (S314)}$$

The following relationship holds in the case that the transmission method for equation (S296) is used.

[Mathematical formula 354]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} Q_1 & 0 \\ 0 & Q_2 \end{pmatrix} \frac{1}{\sqrt{\alpha^2+1}} \begin{pmatrix} e^{j\theta_{11}(i)} & \alpha \times e^{j(\theta_{11}(i)+\lambda)} \\ \alpha \times e^{j\theta_{21}(i)} & e^{j(\theta_{21}(i)+\lambda+\pi)} \end{pmatrix} \begin{pmatrix} P_1 & 0 \\ 0 & P_2 \end{pmatrix} \begin{pmatrix} s_1(i) \\ s_2(i) \end{pmatrix} \tag{Formula (S315)}$$

Baseband signals 5405X and 5405Y, channel estimation signals 5407X, 5409X, 5407Y, and 5409Y, and control information 5411 are input to detector 5412. Based on control information 5411, detector 5412 recognizes which one of the relational expressions of equations (S305), (S306), (S307), (S308), (S309), (S310), (S311), (S312), (S313), (S314), and (S315) holds.

Based on one of the relational expressions of equations (S305), (S306), (S307), (S308), (S309), (S310), (S311), (S312), (S313), (S314), and (S315), detector 5412 detects each bit of the data transmitted by $s_1(t)$ ($s_1(i)$) and $s_2(t)$ ($s_2(i)$) (the log-likelihood of each bit or the log-likelihood ratio of each bit), and outputs detection result 5413.

Detection result 5413 is input to decoder 5414, and decoder 5414 decodes the error correction code to output received data 5415.

In the configuration example, the precoding method in the MIMO transmission scheme and the configurations of the transmitter and receiver in which the precoding method is adopted are described above. When the precoding method is adopted, the receiver can obtain the high data reception quality.

Each of the transmitting antenna and receiving antenna in the configuration examples may be one antenna unit constructed with the plurality of antennas. The plurality of antennas that transmit the two post-precoding modulated signals may be used so as to simultaneously transmit one modulated signal at different times.

The receiver including the two receiving antennas is described above. Alternatively, the received data can be obtained even if the receiver includes at least three receiving antennas.

The precoding method of the configuration example can also be performed when the single-carrier scheme, the OFDM scheme, the multi-carrier scheme such as the OFDM scheme in which a wavelet transformation is used, and a spread spectrum scheme are applied.

The above transmission method, reception method, transmitter, and receiver of each configuration example are only an example of the configuration to which the disclosure described in each of the following exemplary embodiments is applicable. The disclosure described in each of the following exemplary embodiments is also applicable to a transmission method, a reception method, a transmitter, and a receiver, which are different from the above transmission method, reception method, transmitter, and receiver of each configuration example.

First to Fourth Exemplary Embodiments

In the following exemplary embodiments, modifications of the processing performed in and/or before and after the encoder and mapper of (configuration example R1) or (configuration example S1) will be described. Sometimes the configuration including the encoder and the mapper is also referred to as a BICM (Bit Interleaved Coded Modulation).

First complex signal s1 ($s_1(t)$, s1(f), or s1(t,f) (t is time and f is a frequency)) is a baseband signal represented by in-phase component I and quadrature component Q based on the mapping of a certain modulation scheme such as BPSK (Binary Phase Shift Keying), QPSK (Quadrature Phase Shift Keying), 16QAM (16 Quadrature Amplitude Modulation), 64QAM (64 Quadrature Amplitude Modulation), and 256QAM (256 Quadrature Amplitude Modulation). Similarly, second complex signal s2 ($s_2(t)$, s2(f), or s2(t,f)) is a baseband signal represented by in-phase component I and quadrature component Q based on the mapping of a certain modulation scheme such as BPSK (Binary Phase Shift Keying), QPSK (Quadrature Phase Shift Keying), 16QAM (16 Quadrature Amplitude Modulation), 64QAM (64 Quadrature Amplitude Modulation), and 256QAM (256 Quadrature Amplitude Modulation).

The second bit string is input to mapper 504. (X+Y) bit strings are input to mapper 504. Using a number of first bits X in the (X+Y) bit strings, mapper 504 generates first complex signal $s_1$ based on the mapping of a first modulation scheme. Similarly, using a number of second bits Y in the (X+Y) bit strings, mapper 504 generates second complex signal s2 based on the mapping of a second modulation scheme.

In the following exemplary embodiments, after the stage of mapper 504, the specific precoding described in (configuration example R1) and (configuration example S1) may be performed, or the precoding given by one of equations (R2), (R3), (R4), (R5), (R6), (R7), (R8), (R9), (R10), (s2), (S3), (S4), (S5), (S6), (S7), (S8), (S9), and (S10) may be performed.

Encoder 502 performs the coding (of the error correction code) from a K-bit information bit string, and outputs first bit string (503) that is of an N-bit code word. Accordingly, in this case, it is assumed that an N-bit code word, namely, a block code having an N-bit block length (code length) is used. Examples of the block code include an LDPC (block) code described in NPLs 1 and 6, a turbo code in which tail-biting is used, a Duo-Binary Turbo code described in NPLs 3 and 4 in which the tail-biting is used, and a code described in NPL 5 in which the LDPC (block) code and BCH code (Bose-Chaudhuri-Hocquenghem code) are coupled.

K and N are a natural number, and a relationship of N>K holds. In a systematic code used in the LDPC code, the K-bit information bit string is included in the first bit string.

Depending on the value of the number of bits (X+Y), sometimes the code word length (N bits) that is of the output of the encoder is not a multiple of the number of bits (X+Y) used to generate two complex signals s1 and s2.

For example, it is assumed that code word length N has 64800 bits, 64QAM is used as the modulation scheme, and X=6 holds, or 256QAM is used as the modulation scheme and Y=8 and X+Y=14 hold. Alternatively, for example, it is assumed that code word length N has 16200 bits, 256QAM is used as the modulation scheme, and X=8 holds, or 256QAM is used as the modulation scheme and Y=8 and X+Y=16 hold.

In both the cases, the code word length (N bits) that is of the output of the encoder is not a multiple of the number of bits (X+Y) used to generate two complex signals s1 and s2.

In following exemplary embodiments, even if the code word output from the encoder has any length (N bits), the adjustment is performed such that the mapper performs processing without leaving the number of bits.

An advantage of the case that the code word length (N bits) that is of the output of the encoder is a multiple of the number of bits (X+Y) used to generate two complex signals s1 and s2 will be described as supplement.

A method in which the transmitter efficiently transmits one block of the error correction code having the N-bit code word length used in the coding is considered. There is a higher possibility of being able to reduce a memory of the transmitter and/or receiver in the case where the number of bits (X+Y) transmitted by first and second complex signals s1 and s2 at the identical frequency and the identical time is not constructed with the bits of the plurality of blocks.

For (modulation scheme of first complex signal s1, modulation scheme of second complex signal s2)=(16QAM, 16QAM), the number of bits (X+Y) of 8 bits can be transmitted by first and second complex signals s1 and s2 at the identical frequency and the identical time, and the 8 bits preferably do not include data of the plurality of blocks (of the error correction code). That is, in the modulation scheme selected by the transmitter, the number of bits (X+Y) transmitted by first and second complex signals s1 and s2 at the identical frequency and the identical time preferably does not include data of the plurality of blocks (of the error correction code).

Accordingly, the code word length (N bits) that is of the output of the encoder is preferably a multiple of the number of bits (X+Y) used to generate two complex signals $s_1$ and s2.

In the transmitter, there is a high possibility of being able to switch the plurality of modulation schemes in both the modulation schemes of first and second complex signals s1 and s2. Accordingly, the number of bits (X+Y) has a high possibility of taking a plurality of values.

At this point, "the code word length (N bits) that is of the output of the encoder is a multiple of the number of bits (X+Y) used to generate two complex signals s1 and s2" is not always satisfied in all the values that can be taken by the number of bits (X+Y). Accordingly, processing methods of the following exemplary embodiments are required. The processing methods will be described below.

First Exemplary Embodiment

Figure 57:
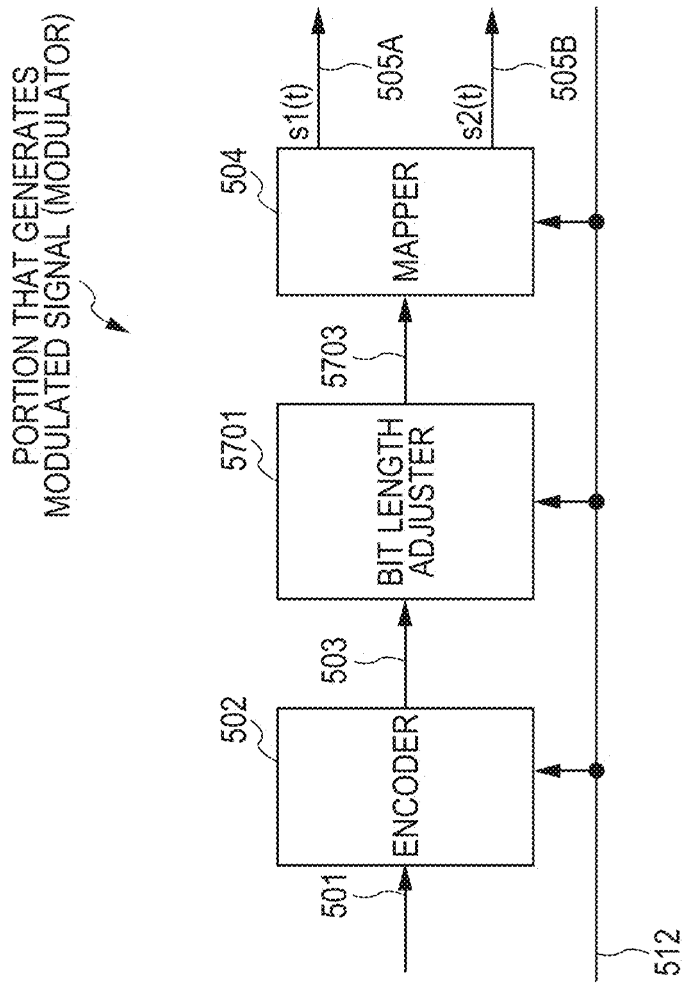
FIG. 57 is a configuration diagram illustrating a section that generates a modulated signal in a transmitter according to a first exemplary embodiment.

FIG. 57 illustrates a section that generates the modulated signal in a transmitter (hereinafter, the section is referred to as a modulator) according to a first exemplary embodiment. In FIG. 57, the function and signal identical to those of "the section that generates the modulated signal" described in configuration example R1 are designated by the identical reference marks.

The modulator of the first exemplary embodiment includes bit length adjuster 5701 disposed between encoder 502 and mapper 504.

Encoder 502 outputs first bit string (503) that is of an N-bit code word (block length (code length)) from a K-bit information bit string according to control signal 512.

Mapper 504 selects the first modulation scheme that is of the modulation scheme used to generate complex signal $s_1(t)$ and the second modulation scheme that is of the modulation scheme used to generate complex signal $s_2(t)$ according to control signal 512. First and second complex signals $s_1(t)$ and $s_2(t)$ are generated using the bit string of the number of bits (X+Y), which is obtained from the number of first bits X used to generate first complex signal s1 and the number of second bits Y used to generate second complex signal s2 in input second bit string 5703 (as described above in detail).

Bit length adjuster 5701 is located at a subsequent stage of encoder 502 and a preceding stage of mapper 504. First bit string 503 is input to bit length adjuster 5701, and bit length adjuster 5701 adjusts the bit length (in this case, the code word length (block length (code length)) of the code word (block) of the error correction code) of first bit string 503 to generate second bit string 5703.

Figure 58:
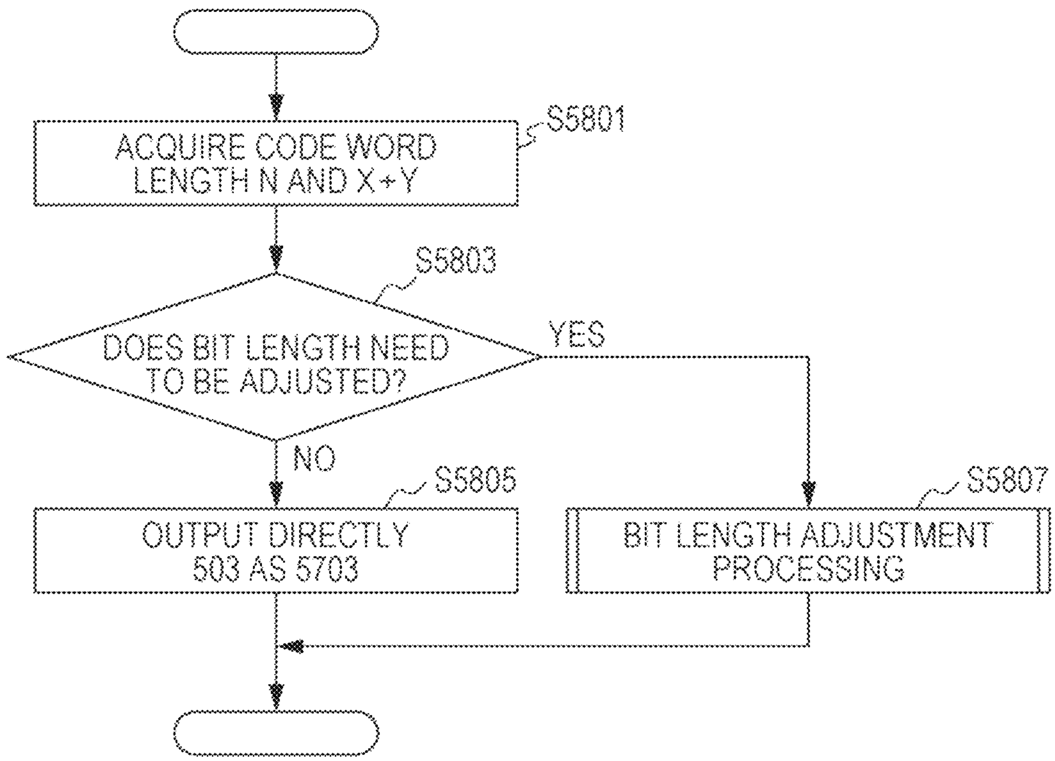
FIG. 58 is a flowchart illustrating a modulated signal generating method.

FIG. 58 is a flowchart illustrating bit length adjustment processing in a modulation processing method of the first exemplary embodiment.

A controller (not illustrated) acquires the number of bits (X+Y) which is obtained from the number of first bits X used to generate first complex signal s1 and the number of second bits Y used to generate second complex signal s2 (step S5801).

The controller determines whether the code word length (block length (code length)) of the code word (block) of the error correction code needs to be adjusted (S5803). Whether N bits of the code word length (block length (code length)) of the error correction code are a multiple of the value of (X+Y) can be used as a criterion. Alternatively, the determination may be made using an association table between the value of (X+Y) and the number of bits X. The information about (X+Y) may be information about the first modulation scheme that is of the modulation scheme used to generate complex signal $s_1(t)$ and the second modulation scheme that is of the modulation scheme used to generate complex signal $s_2(t)$.

If the code word length (block length (code length)) N of the error correction code is 64800 bits and the value of (X+Y) is 16, the code word length N bits of the error correction code are a multiple of the value of (X+Y). The controller determines that the bit length does not need to be adjusted (NO in S5803).

When determining that the necessity of the adjustment of the bit length is eliminated (NO in S5803), the controller sets bit length adjuster 5701 such that bit length adjuster 5701 directly outputs input first bit string 503 as second bit string 5703 (S5805). That is, in bit length adjuster 5701, the 64800-bit code word of the error correction code serves as the input, and the 64800-bit code word of the error correction code serves as the output (bit length adjuster 5701 directly outputs input bit string 503 to the mapper as second bit string 5703).

If the code word length (block length (code length)) N of the error correction code is 64800 bits and the value of (X+Y) is 14, the code word length N bits of the error correction code are not a multiple of the value of (X+Y). In this case, the controller determines that the bit length needs to be adjusted (YES in S5803).

When determining that the bit length needs to be adjusted, the controller sets bit length adjuster 5701 such that bit length adjuster 5701 performs bit length adjustment processing on input first bit string 503 (S5805).

Figure 59:
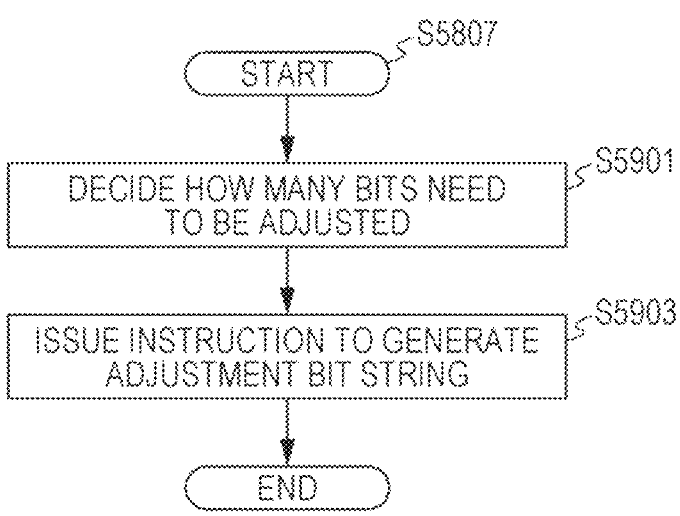
FIG. 59 is a flowchart illustrating bit length adjustment processing of the first exemplary embodiment.

FIG. 59 is a flowchart illustrating the bit length adjustment processing of the first exemplary embodiment.

The controller decides value PadNum corresponding to how many bits needs to be adjusted for first bit string 503 (S5901). That is, the number of bits to be added to the N bits of the code word length of the error correction code constitutes PadNum.

In the first exemplary embodiment, a number equal to a value derived from the following numerical expression (shortage) is decided as the value of PadNum (bits).

$$PadNum=ceil(N/(X+Y))\times(X+Y)-N$$

In the expression, the ceil function is one that returns an integer in which figures after a decimal point are rounded up.

The decision processing may be performed by either the calculation or the use of a value stored in a table as long as a result equal to the value of the above equation is obtained.

For example, the number of bits (the value of PadNum) in which the adjustment is required may be previously stored with respect to the control signal (the code word length (block length (code length) of the error correction code), a set of the information about the modulation scheme used to generate s1 and the information about the modulation scheme used to generate s2), and the value of PadNum corresponding to the current value of (X+Y) may be decided as the number of bits in which the adjustment is required. Any index value such as a coding rate and a value of power imbalance may be used in the table as long as the number of bits to be adjusted is obtained according to the relationship between code word length (block length (code length)) N of the error correction code and the value of (X+Y).

The above control is particularly required in a communication system in which the modulation scheme used to generate s1 and the modulation scheme used to generate s2 are switched.

Then, the controller issues an instruction to bit length adjuster 5701 to generate an adjustment bit string, which is constructed with the PadNum bits to adjust the bit length (S5903).

For example, the adjustment bit string used to adjust the bit length may be constructed with "0 (zero)" of the PadNum bits or "1" of the PadNum bits. It is only necessary that the information about the adjustment bit string that is constructed with the PadNum bits to adjust the bit length be shared by the transmitter including the modulator in FIG. 57 and the receiver that receives the modulated signal transmitted from the transmitter. Accordingly, it is necessary that the adjustment bit string that is constructed with the PadNum bits to adjust the bit length be generated according to a specific rule, and that the specific rule be shared by the transmitter and the receiver. Accordingly, the adjustment bit string, which is constructed with the PadNum bits to adjust the bit length, is not limited to the above example.

First bit string 503 is input to bit length adjuster 5701, and bit length adjuster 5701 adds the adjustment bit string (that is, the adjustment bit string that is constructed with the PadNum bits to adjust the bit length) to a rear end or a leading end of the code word of the error correction code having code word length (block length (code length)) N, and outputs the second bit string for the mapper, the number of bits constituting the second bit string being a multiple of the number of bits (X+Y).

Effect of First Exemplary Embodiment

When the encoder outputs the code word of the error correction code having code word length (block length (code length)) N, the number of bits (X+Y) that can be transmitted at the identical frequency and the identical time using first and second complex signals s1 and s2 does not include the data of the plurality of blocks (of the error correction code) irrespective of the value of N with respect to a set of complex signals based on any combination of the modulation schemes. Therefore, there is a high possibility of reducing the memory of the transmitter and/or receiver.

Bit length adjuster 5701 may be included in one of functions of encoder 502 or mapper 504.

Second Exemplary Embodiment

Figure 60:
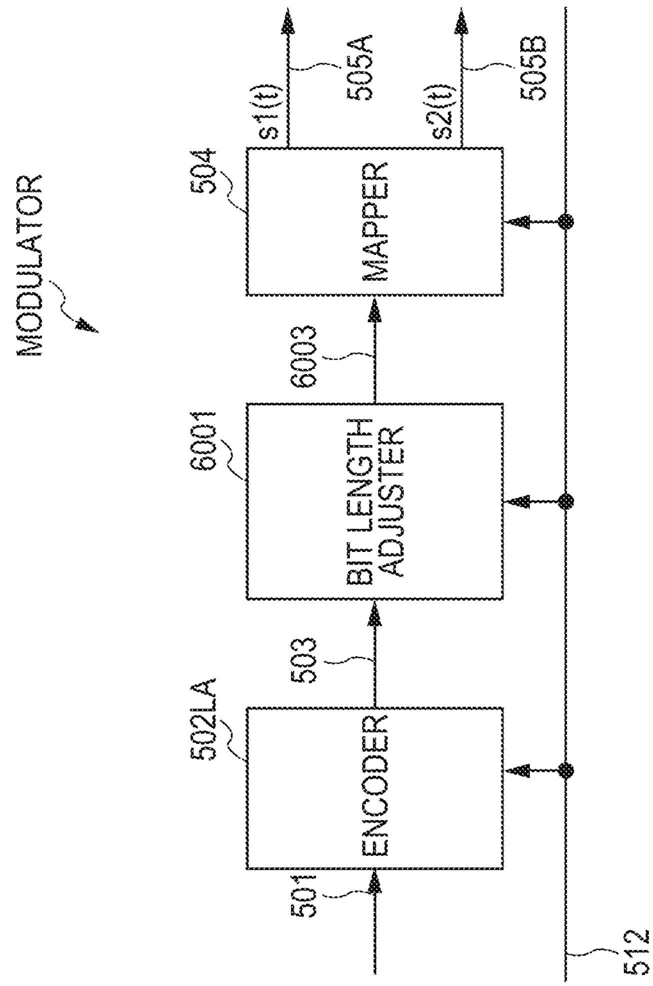
FIG. 60 is a view illustrating a configuration of a modulator according to a second exemplary embodiment.

FIG. 60 illustrates a configuration of a modulator according to a second exemplary embodiment.

The modulator of the second exemplary embodiment includes encoder 502LA, bit length adjuster 6001, and mapper 504. Because of the identical processing of mapper 504, the description is omitted.

<Encoder502LA>

A K-bit (K is a natural number) information bit is input to encoder 502LA, and encoder 502LA obtains and outputs the code word of the LDPC code of the systematic code constructed with N bits (N is a natural number), where N>K. It is assumed that a parity check matrix of the LDPC code has an accumulate structure in order to obtain the bit string of an (N−K)-bit parity portion except for the information portion.

Information about an 0 block that is of input for LDPC coding is represented as $X_{i,j}$ (i is an integer, and j is an integer from 1 to N). The parity obtained after the coding is represented as $P_{i,k}$ (k is an integer from N+1 to K). A vector of the code word of the LDPC code in the ith block is represented as $u=(X_1,X_2,X_3, \ldots ,X_{K-2},X_{K-1},X_K,P_{K+1},P_{K+2},P_{K+3}, \ldots ,P_{N-2},P_{N-1},P_N)^T$, and the parity check matrix of the LDPC code is represented as H. Therefore, Hu=0 holds (in this case, "0 (zero) of Hu=0" means a vector in which all elements are 0).

Figure 61:
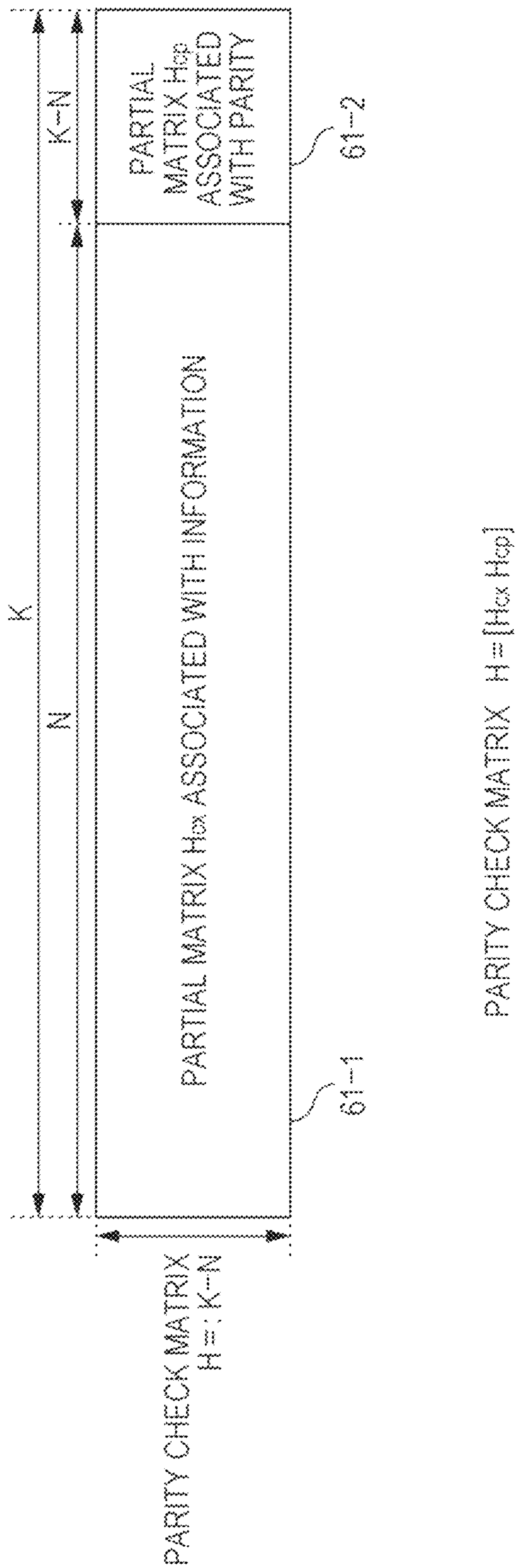
FIG. 61 is a view illustrating an example of a parity check matrix.

At this point, parity check matrix H is illustrated in FIG. 61. As illustrated in FIG. 61, in parity check matrix H, the number of rows is (N−K) (first to (N−K)th rows exist), and the number of columns is N (first to Nth columns exist). The number of rows of partial matrix (61-1) (Hcx) associated with the information is (N−K) (first to (N−K)th rows exist), and the number of columns is K (first to Kth columns exist). The number of rows of parity-associated partial matrix (61-2) (Hcp) is (N−K) (first to (N−K)th rows exist), and the number of columns is (N−K) (first to (N−K)th columns exist). Therefore, parity check matrix H=[HcxHcp] is obtained.

Figure 62:
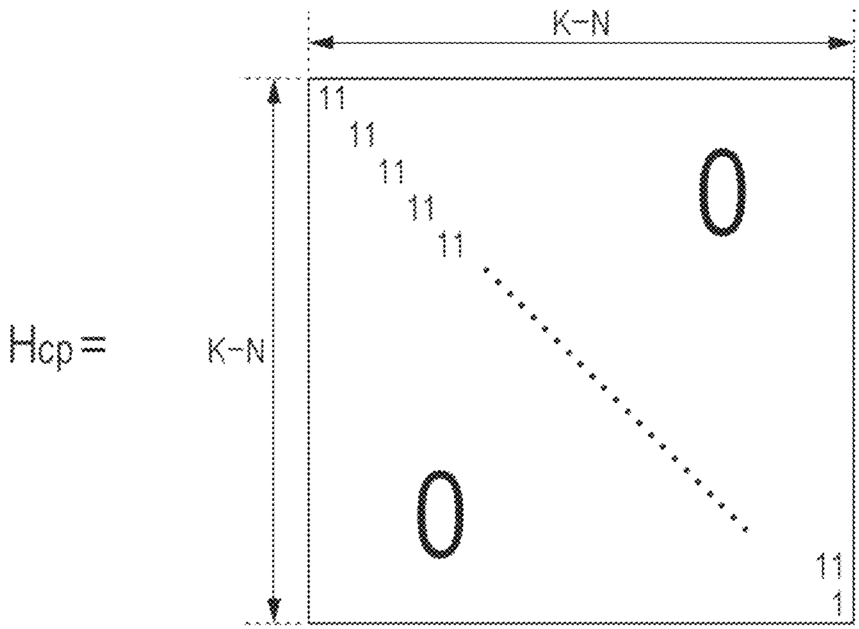
FIG. 62 is a view illustrating a configuration example of a partial matrix.

FIG. 62 illustrates a configuration of parity-associated partial matrix Hcp in LDPC-code parity check matrix H having the accumulate structure in the second exemplary embodiment. As illustrated in FIG. 62, assuming that $H_{cp,comp}[i][j]$ (i and j are an integer from 1 to (N−K) (i and j=1, 2, 3, . . . , N−K−1, and N−K)) is an element of parity-associated partial matrix Hcp in the ith row and the ith column, the following equation holds.

[Mathematical Formula 355]

For i=1

$$H_{cp,comp}[1][1]=1 \tag{1-1}$$

$$H_{cp,comp}[1][j]=0 \text{ for } \forall j;\ j=2,3, \ldots ,N-K-1,N-K \tag{1-2}$$

(j is an integer from 2 to (K−N) (j=2, 3, . . . , N−K−1, and N−K), and equation (1-2) holds in all values of j)

[Mathematical Formula 356]

For i≠1 (i is an integer from 2 to (N−K), namely, i=2, 3, . . . , N−K−1, and N−K):

$$H_{cp,comp}[i][i]=1 \text{ for } \forall i;\ i=2,3, \ldots ,N-K-1,N-K \tag{2-1}$$

(i is an integer from 2 to (N−K) (i=2, 3, . . . , N−K−1, and N−K), and equation (2-1) holds in all values of i)

$$H_{cp,comp}[i][i-1]=1 \text{ for } \forall i;i=2,3, \ldots ,N-K-1,N-K \tag{2-2}$$

(i is an integer from 2 to (N−K) (i=2, 3, . . . , N−K−1, and N−K), and equation (2-2) holds in all values of i)

$$H_{cp,comp}[i][j]=0 \text{ for } \forall i \forall j;\ i\neq j;\ i-1\neq j;\ i-1\neq j;\ i=2,3, \ldots ,N-K-1,N-K;\ j=1,2,3, \ldots ,N-K-1,N-K \tag{2-3}$$

(i is an integer from 2 to (N−K) (i=2, 3, . . . , N−K−1, and N−K), j is an integer from 1 to (N−K) (j=1, 2, 3, . . . , N−K−1, and N−K), and {i≠j or i−1≠j}, and equation (2-3) holds in all the values of i and j satisfying {i≠j or i−1≠j})

Figure 63:
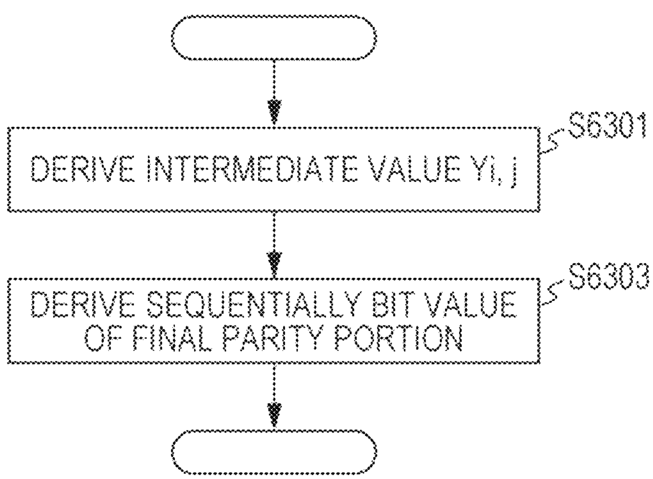
FIG. 63 is a flowchart illustrating LDPC coding processing performed with encoder 502LA.

FIG. 63 is a flowchart illustrating LDPC coding processing performed with encoder 502LA.

Encoder 502LA performs the calculation associated with the information portion in the code word of the LDPC code. The jth (j is an integer from 1 to (N−K)) row of parity check matrix H will be described by way of example.

The calculation is performed using the jth vector of partial matrix (61-1) (Hex) associated with the information about parity check matrix H and information $X_{i,j}$ about the ith block to obtain intermediate value $Y_{i,j}$ (S6301).

Encoder 502LA performs the following calculation to obtain the parity because parity-associated partial matrix (61-2) (Hcp) has the accumulate structure.

$$P_{i,N+j}=Y_{i,j}\text{ EXOR }P_{i,N+j-1}$$

(EXOR is an addition in which 2 is used as a modulus.) However, the following calculation is performed for j=1.

$$P_{i,N+1}=Y_{i,j}\text{ EXOR }0$$

Figure 64:
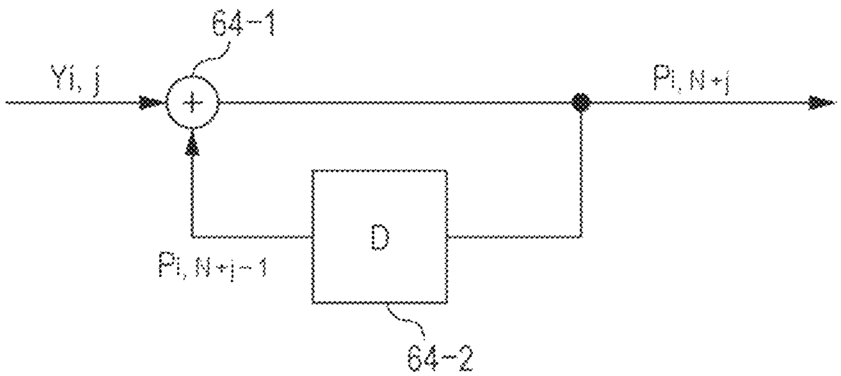
FIG. 64 is a view illustrating a configuration example performing accumulate processing.

FIG. 64 illustrates a configuration example performing the accumulate processing. In FIG. 64, reference mark 64-1 designates exclusive OR, reference mark 64-2 designates a register, and an initial value of register 64-2 is "0 (zero)".

<Bit Length Adjuster 6001>

Similarly to the bit length adjuster of the first exemplary embodiment, first bit string 503 that is of the N-bit code word (block length (code length)) is input to bit length adjuster 6001, and bit length adjuster 6001 adjusts the bit length to output second bit string 6003.

One of the characteristic points of the second exemplary embodiment is that the bit value in a predetermined portion of the N-bit code word (of the ith block) obtained through the coding processing is repeatedly used at least once (repetition).

Figure 65:
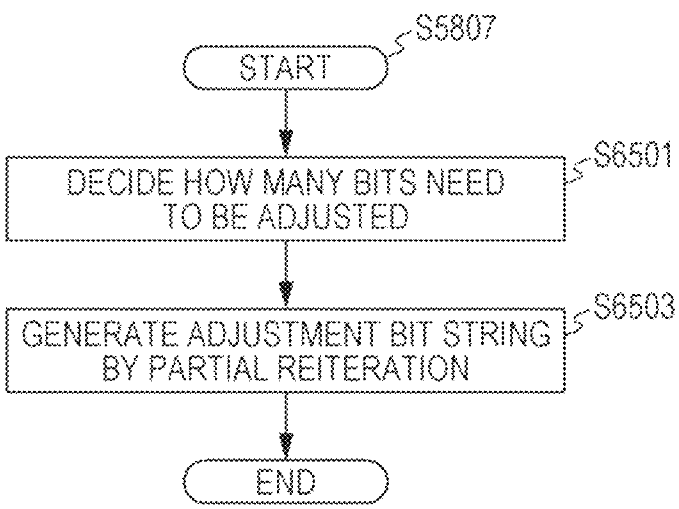
FIG. 65 is a flowchart illustrating bit length adjustment processing of the second exemplary embodiment.

FIG. 65 is a flowchart illustrating the bit length adjustment processing of the second exemplary embodiment.

The bit length adjustment processing is started on the condition corresponding to the start of step S5807 in FIG. 58 of the first exemplary embodiment.

Flow many bits needs to be adjusted is decided similarly to FIG. 58 (step S6501). The processing in step S6501 corresponds to step S5901 in FIG. 59 of the first exemplary embodiment.

Then, the controller issues an instruction to bit length adjuster 6001 to repeat the bit value in the predetermined portion of the N-bit code word to generate a bit string for adjustment (hereinafter, referred to as an "adjustment bit string") (S6503).

An example of an adjustment bit string generating method will be described below with reference to FIGS. 66, 67, and 68.

As described above, the vector of the code word of the LDPC code in the ith block is represented as $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$.

Figure 66:
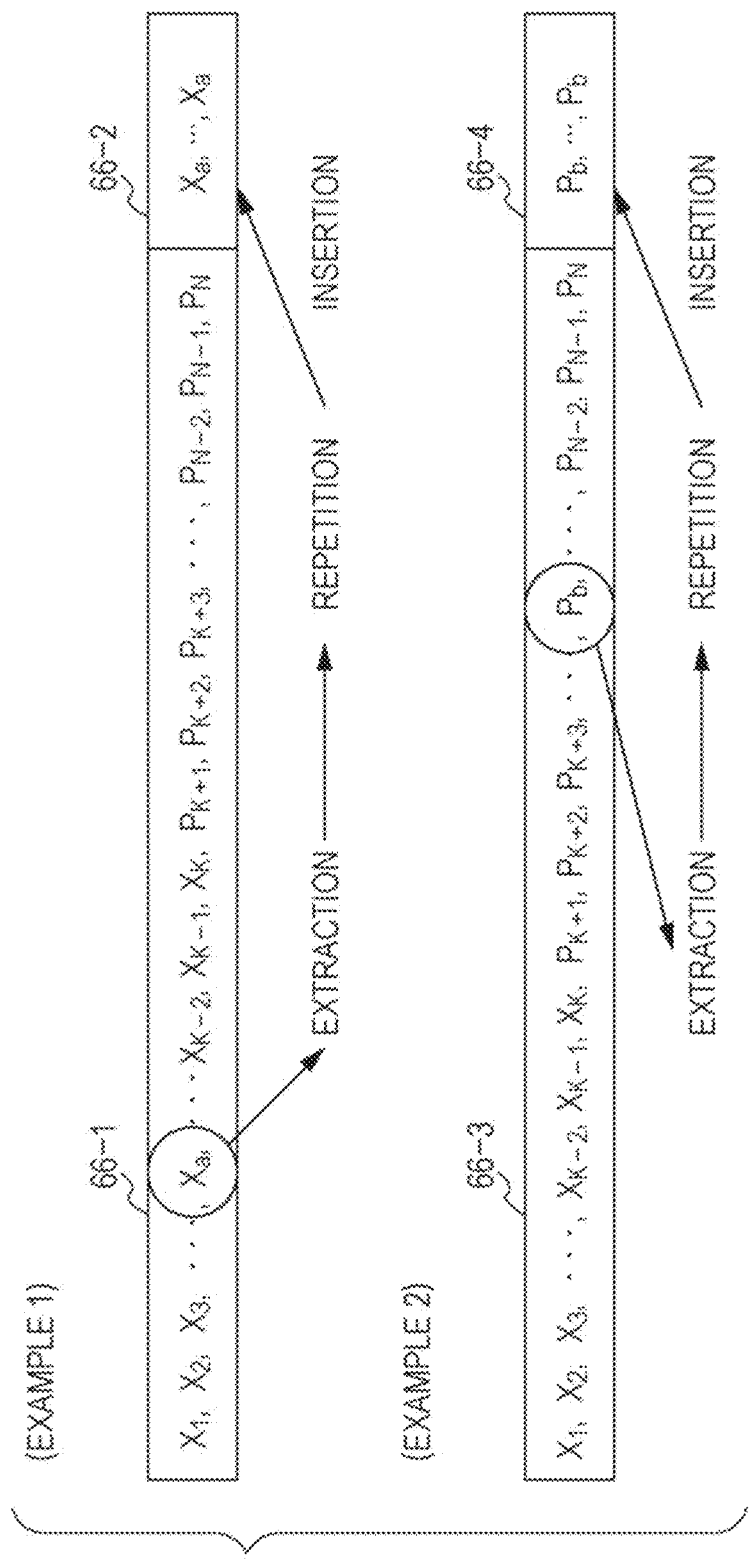
FIG. 66 is a view illustrating an example of a method for generating a bit string for adjustment.

<"Adjustment Bit String" Generating Method of (Example 1) in FIG. 66>

In (Example 1) of FIG. 66, information $X_a$ of the information bits is extracted from the vector of the code word of the LDPC code in the ith block $u=(X_1,X_2,X_3, \ldots ,X_{K-2}, X_{K-1},X_K,P_{K+1},P_{K+2},P_{K+3}, \ldots ,P_{N-2},P_{N-1},P_N)^T$ (66-1). Information $X_a$ is repeated to generate the plurality of reiteration bits, and Information $X_a$ as the plurality of reiteration bits are added to the code word of the LDPC code of the ith block as adjustment bit string 66-2 (66-1 and 66-2 in FIG. 66). Accordingly, in bit length adjuster 6001 of FIG. 60, first bit string (503) that is of the input of bit length adjuster 6001 in FIG. 60 constitutes the code word of the LDPC code in the ith block, and second bit string (6003) that is of the output of bit length adjuster 6001 in FIG. 60 constitutes code word 66-1 of the LDPC code in the ith block and adjustment bit string 66-2.

In (Example 1) of FIG. 66, the adjustment bit string is inserted in (added to) the tail end. Alternatively, the adjustment bit string may be inserted in any position of the code word of the LDPC code in the ith block. Alternatively, the plurality of blocks constructed with at least one bit may be generated from the adjustment bit string, and each block may be inserted in any position of the code word of the LDPC code in the ith block.

<"Adjustment Bit String" Generating Method of (Example 2) in FIG. 66>

In (Example 2) of FIG. 66, bit $P_b$ in the parity bit is extracted from the vector of the code word of the LDPC code in the ith block $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ (66-3). Bit $P_b$ is repeated to generate reiteration of the plurality of bits $P_b$, and the plurality of bits $P_b$ are added to the code word of the LDPC code of the ith block as adjustment bit string 66-2 (66-3 and 66-4 in FIG. 66). Accordingly, in bit length adjuster 6001 of FIG. 60, first bit string (503) that is of the input of bit length adjuster 6001 in FIG. 60 constitutes the code word of the LDPC code in the ith block, and second bit string (6003) that is of the output of bit length adjuster 6001 in FIG. 60 constitutes code word 66-3 of the LDPC code in the ith block and adjustment bit string 66-4.

In (Example 2) of FIG. 66, the adjustment bit string is inserted in (added to) the tail end. Alternatively, the adjustment bit string may be inserted in any position of the code word of the LDPC code in the ith block. Alternatively, the plurality of blocks constructed with at least one bit may be generated from the adjustment bit string, and each block may be inserted in any position of the code word of the LDPC code in the ith block.

Figure 67:
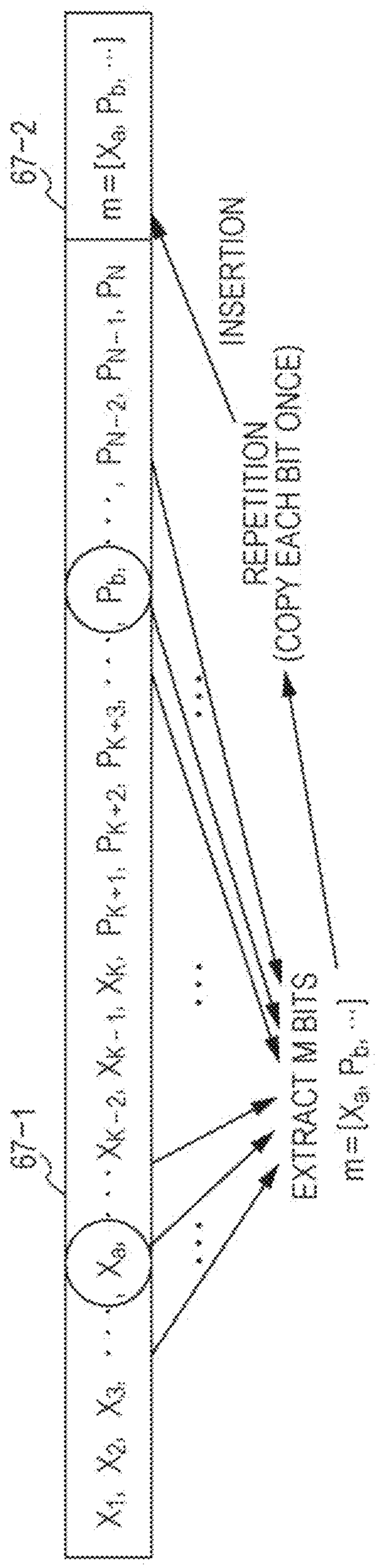
FIG. 67 is a view illustrating an example of the method for generating the bit string for adjustment.

<"Adjustment Bit String" Generating Method in FIG. 67>

In FIG. 67, M bits of the vector of the code word of the LDPC code in the ith block are selected from $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ (67-1). For example, the selected bits include $X_a$ and $P_b$, and each of the selected M bits is copied once. At this point, it is assumed that vector m constructed with the M bits is represented as $m=[X_a, P_b, \ldots]$. Vector $m=[X_a, P_b, \ldots]$ is added to the code word of the LDPC code of the ith block as adjustment bit string 67-2 (67-1 and 67-2 in FIG. 67). Accordingly, in bit length adjuster 6001 of FIG. 60, first bit string (503) that is of the input of bit length adjuster 6001 in FIG. 60 constitutes the code word of the LDPC code in the ith block, and second bit string (6003) that is of the output of bit length adjuster 6001 in FIG. 60 constitutes code word 67-1 of the LDPC code in the ith block and adjustment bit string 67-2.

In FIG. 67, the adjustment bit string is inserted in (added to) the tail end. Alternatively, the adjustment bit string may be inserted in any position of the code word of the LDPC code in the ith block. Alternatively, the plurality of blocks constructed with at least one bit may be generated from the adjustment bit string, and each block may be inserted in any position of the code word of the LDPC code in the ith block.

The adjustment bit string may be generated from only the information bit, only the parity bit, or both the information bit and the parity bit.

Figure 68:
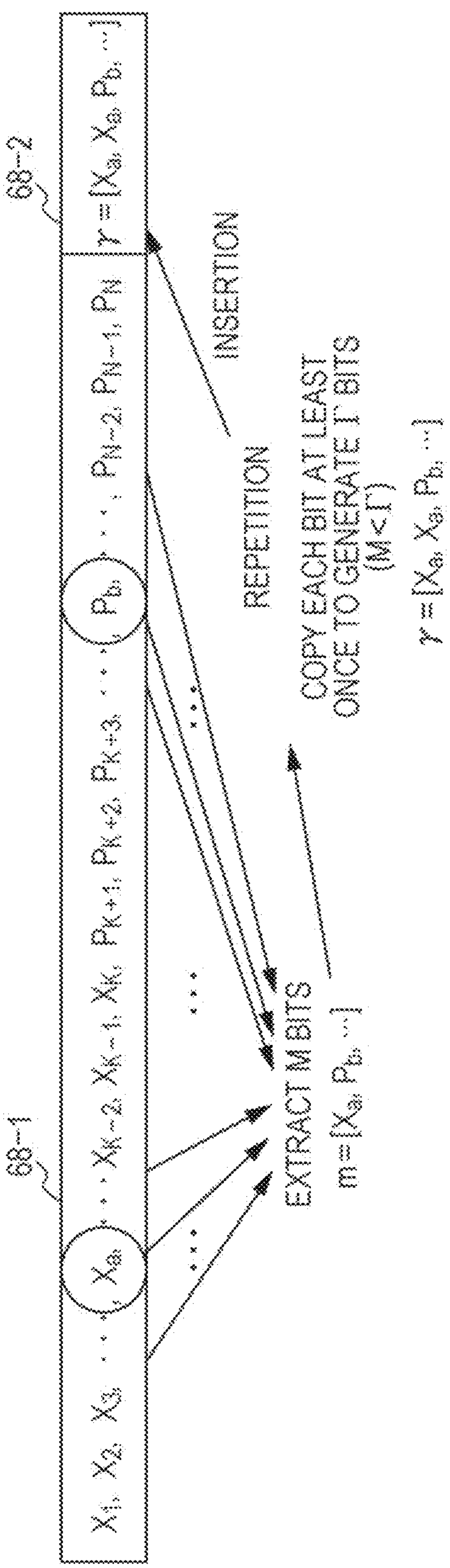
FIG. 68 is a view illustrating an example of the method for generating the bit string for adjustment.

<"Adjustment Bit String" Generating Method in FIG. 68>

In FIG. 68, M bits of the vector of the code word of the LDPC code in the ith block are selected from $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ (68-1). For example, the selected bits include $X_a$ and $P_b$, and each of the selected M bits is copied once. At this point, it is assumed that vector m constructed with the M bits is represented as $m=[X_a, P_b, \ldots]$.

Each bit of vector $m=[X_a, P_b, \ldots]$ constructed with M bits is copied at least once, and vector γ constructed with T bits is represented as $\gamma=[X_a,X_a, P_b, \ldots]$ (M<Γ). Vector $\gamma=[X_a, X_a, P_b, \ldots]$ is set to the "adjustment bit string"

(68-2), and the "adjustment bit string" (68-2) is added to the code word of the LDPC code of the ith block (68-1 and 68-2 in FIG. 68).

Accordingly, in bit length adjuster 6001 of FIG. 60, first bit string (503) that is of the input of bit length adjuster 6001 in FIG. 60 constitutes the code word of the LDPC code in the ith block, and second bit string (6003) that is of the output of bit length adjuster 6001 in FIG. 60 constitutes code word 68-1 of the LDPC code in the ith block and adjustment bit string 68-2.

In FIG. 68, the adjustment bit string is inserted in (added to) the tail end. Alternatively, the adjustment bit string may be inserted in any position of the code word of the LDPC code in the ith block. Alternatively, the plurality of blocks constructed with at least one bit may be generated from the adjustment bit string, and each block may be inserted in any position of the code word of the LDPC code in the ith block.

The adjustment bit string may be generated from only the information bit, only the parity bit, or both the information bit and the parity bit.

<The Number of Adjustment Bit Strings Generated with Bit Length Adjuster 6001>

The number of adjustment bit strings generated with bit length adjuster 6001 can be decided similarly to the first exemplary embodiment. This point will be described below with reference to FIG. 60.

In FIG. 60, first complex signal s1 (s1(t), s1 (f), or s1(t,f) (where t is the time and f is the frequency)) is a baseband signal that can be expressed by in-phase component I and quadrature component Q based on the mapping of a certain modulation scheme such as BPSK, QPSK, 16QAM, 64QAM, and 256QAM. Similarly, second complex signal s2 (s2(t), s2(f), or s2(t,f)) is a baseband signal that can be expressed by in-phase component I and quadrature component Q based on the mapping of a certain modulation scheme such as BPSK, QPSK, 16QAM, 64QAM, and 256QAM.

The second bit string is input to mapper 504. (X+Y) bit strings are input to mapper 504. Using a number of first bits X in the (X+Y) bit strings, mapper 504 generates first complex signal s1 based on the mapping of a first modulation scheme. Similarly, using a number of second bits Y in the (X+Y) bit strings, mapper 504 generates second complex signal s2 based on the mapping of a second modulation scheme.

Encoder 502 performs the coding (of the error correction code) from a K-bit information bit string, and outputs first bit string (503) that is of an N-bit code word.

Depending on the number of values (X+Y), sometimes the code word length (N bits) that is of the output of the encoder is not a multiple of the number of bits (X+Y) used to generate two complex signals s1 and s2.

For example, it is assumed that code word length N has 64800 bits, 64QAM is used as the modulation scheme, and X=6 holds, or 256QAM is used as the modulation scheme and Y=8 and X+Y=14 hold. Alternatively, for example, it is assumed that code word length N has 16200 bits, 256QAM is used as the modulation scheme, and X=8 holds, or 256QAM is used as the modulation scheme and Y=8 and X+Y=16 hold.

In both the cases, the code word length (N bits) that is of the output of the encoder is not a multiple of the number of bits (X+Y) used to generate two complex signals s1 and s2.

Therefore, in the second exemplary embodiment, even if the code word output from the encoder has any length (N bits), bit length adjuster 6001 performs the adjustment such that the mapper performs processing without leaving the number of bits.

An advantage of the case that the code word length (N bits) that is of the output of the encoder is a multiple of the number of bits (X+Y) used to generate two complex signals s1 and s2 will be described as supplement.

A method in which the transmitter efficiently transmits one block of the error correction code having the N-bit code word length used in the coding is considered. There is a higher possibility of being able to reduce a memory of the transmitter and/or receiver, in the case where the number of bits (X+Y) transmitted by first and second complex signals s1 and s2 at the identical frequency and the identical time is constructed with the bits of the plurality of blocks.

For (modulation scheme of first complex signal s1, modulation scheme of second complex signal s2)=(16QAM, 16QAM), the number of bits (X+Y) of 8 bits can be transmitted by first and second complex signals s1 and s2 at the identical frequency and the identical time, and the 8 bits preferably do not include data of the plurality of blocks (of the error correction code). That is, in the modulation scheme selected by the transmitter, the number of bits (X+Y) transmitted by first and second complex signals s1 and s2 at the identical frequency and the identical time preferably does not include data of the plurality of blocks (of the error correction code).

Accordingly, the code word length (N bits) that is of the output of the encoder is preferably a multiple of the number of bits (X+Y) used to generate two complex signals s1 and s2.

In the transmitter, there is a high possibility of being able to switch the plurality of modulation schemes in both the modulation schemes of first and second complex signals s1 and s2. Accordingly, the number of bits (X+Y) has a high possibility of taking a plurality of values.

At this point, "the code word length (N bits) that is of the output of the encoder is a multiple of the number of bits (X+Y) used to generate two complex signals s1 and s2" is not always satisfied in all the values that can be taken by the number of bits (X+Y). Accordingly, processing methods of the following exemplary embodiments are required.

Mapper 504 selects the first modulation scheme that is of the modulation scheme used to generate complex signal $s_1(t)$ and the second modulation scheme that is of the modulation scheme used to generate complex signal $s_2(t)$ according to control signal 512. First and second complex signals $s_1(t)$ and $s_2(t)$ are generated using the bit string of the number of bits (X+Y), which is obtained from the number of first bits X used to generate first complex signal s1 and the number of second bits Y used to generate second complex signal s2 in input second bit string 6003.

First bit string 503 is input to bit length adjuster 6001, and bit length adjuster 6001 adjusts the bit length (in this case, the code word length (block length (code length)) of the code word (block) of the error correction code) of first bit string 503 to generate second bit string 5703.

FIG. 58 is a flowchart illustrating bit length adjustment processing in a modulation processing method of the second exemplary embodiment.

A controller (not illustrated) acquires the number of bits (X+Y) which is obtained from the number of first bits X used to generate first complex signal s1 and the number of second bits Y used to generate second complex signal s2 (step S5801).

The controller determines whether the code word length (block length (code length)) of the code word (block) of the error correction code needs to be adjusted (S5803). Whether N bits of the code word length (block length (code length)) of the error correction code are a multiple of the value of (X+Y) can be used as a criterion. Alternatively, the determination may be made using an association table between the value of (X+Y) and the number of bits X. The information about (X+Y) may be information about the first modulation scheme that is of the modulation scheme used to generate complex signal $s_1(t)$ and the second modulation scheme that is of the modulation scheme used to generate complex signal $s_2(t)$.

If the code word length (block length (code length)) N of the error correction code is 64800 bits and the value of (X+Y) is 16, the code word length N bits of the error correction code are a multiple of the value of (X+Y). The controller determines that the bit length does not need to be adjusted (NO in S5803).

When determining that the necessity of the adjustment of the bit length is eliminated (NO in S5803), the controller sets bit length adjuster 5701 such that bit length adjuster 5701 directly outputs input first bit string 503 as second bit string 5703 (S5805). That is, in bit length adjuster 5701, the 64800-bit code word of the error correction code serves as the input, and the 64800-bit code word of the error correction code serves as the output (bit length adjuster 5701 directly outputs input bit string 503 to the mapper as second bit string 5703).

If the code word length (block length (code length)) N of the error correction code is 64800 bits and the value of (X+Y) is 14, the code word length N bits of the error correction code are not a multiple of the value of (X+Y). In this case, the controller determines that the bit length needs to be adjusted (YES in S5803).

When determining that the bit length needs to be adjusted, the controller sets bit length adjuster 5701 such that bit length adjuster 5701 performs bit length adjustment processing on input first bit string 503 (S5805). That is, in the second exemplary embodiment, as described above, the adjustment bit string is generated through the bit length adjustment processing, and added to the vector of the code word of the LDPC code in the ith block (for example, see FIGS. 66, 67, and 68).

For example, in the case that the value of (X+Y), namely, the set of the first and second modulation schemes is switched (or in the case that the setting of the set of the first and second modulation schemes can be changed) while the vector of the code word of the LDPC code in the ith block has fixed code word length (block length (code length)) N of 64800 bits, the number of bits of the adjustment bit string is properly changed (sometimes the necessity of the adjustment bit string is eliminated depending on the value of (X+Y) (the set of the first and second modulation schemes)).

One of the necessary points is that the code word of the LDPC code in the ith block and the number of bits of second bit string (6003) constructed with the adjustment bit string are a multiple of the number of bits (X+Y) decided by the set of the first and second modulation schemes.

An example of the characteristic adjustment bit string generating method will be described below.

Figure 69:
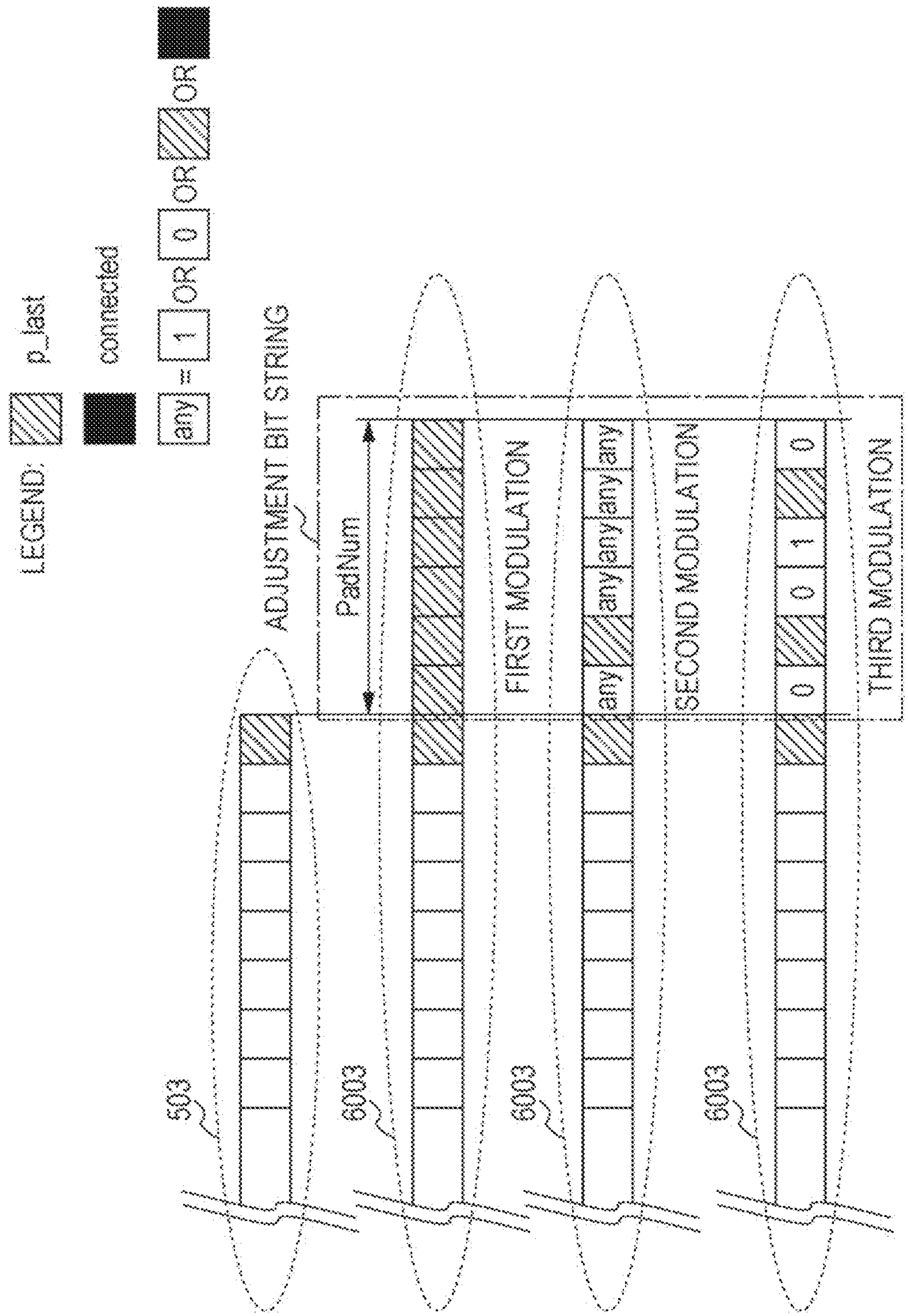
FIG. 69 is a view illustrating a modification of an adjustment bit string generated with a bit length adjuster.
Figure 70:
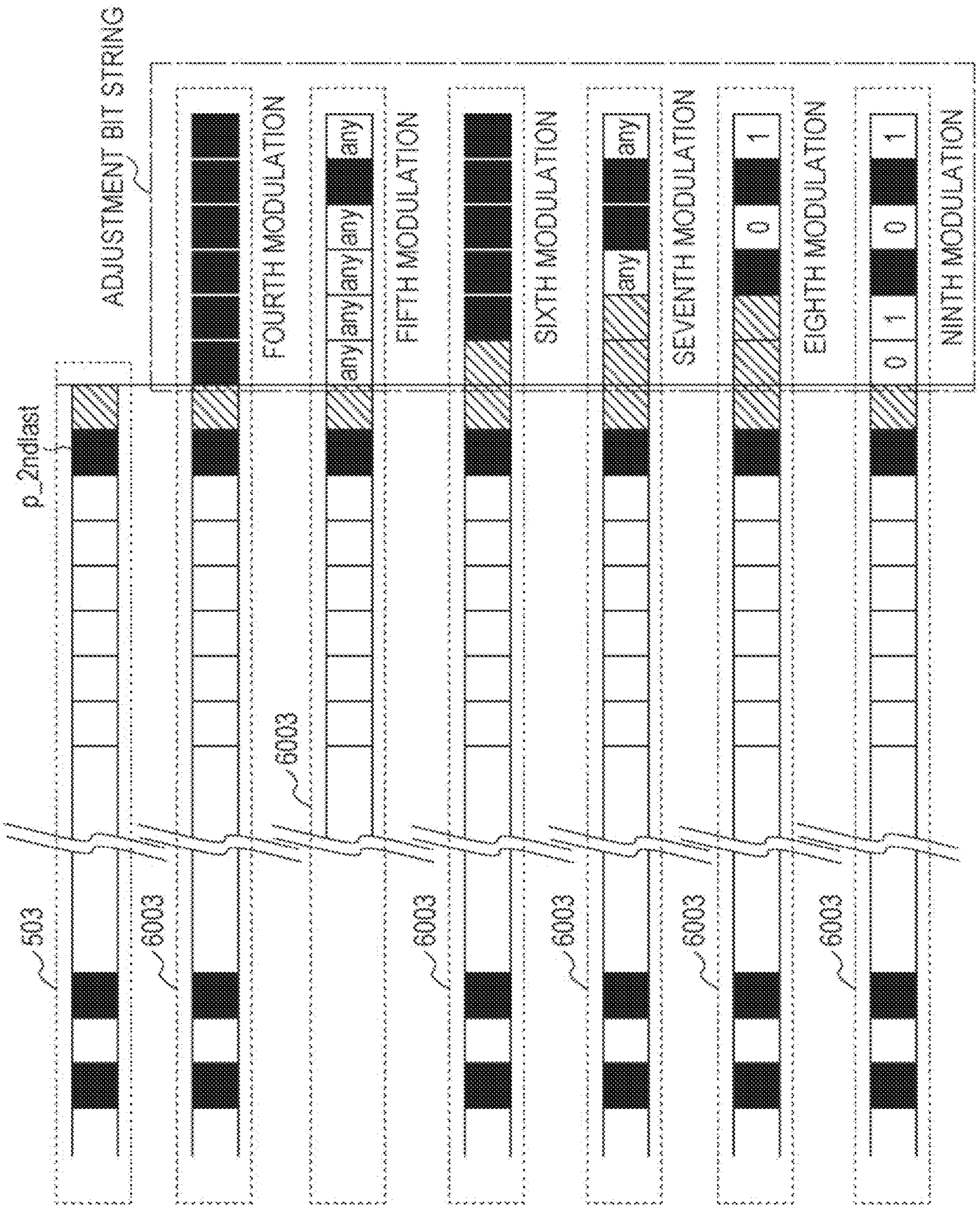
FIG. 70 is a view illustrating a modification of the adjustment bit string generated with the bit length adjuster.

FIGS. 69 and 70 illustrate a modification of the adjustment bit string generated with the bit length adjuster. In FIGS. 69 and 70, first bit string 503 constitutes the input of bit length adjuster 6001 in FIG. 60. Bit length adjuster 6001 outputs second bit string 6003. In FIGS. 69 and 70, for convenience, second bit string 6003 has a configuration in which the adjustment bit string is added to the rear end of first bit string 503 (however, the position to which the adjustment bit string is added is not limited to the position in FIGS. 69 and 70).

<Legend>

Square frames indicate individual bits of first bit string 503 or second bit string 6003.

In FIGS. 69 and 70, a square frame surrounding "0" indicates a bit having the value of "0".

In FIGS. 69 and 70, a square frame surrounding "1" indicates a bit having the value of "1".

In FIGS. 69 and 70, p_last that is of a hatched square frame indicates a value of the bit of the position corresponding to a final output bit of the accumulate processing. In the LDPC code in which the parity-associated partial matrix has the accumulate structure for the above parity check matrix, p_last constitutes $P_N$ in the case that the vector of the code word of the LDPC code in the ith block is set to $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ (in the parity check matrix, p_last constitutes the bit associated with the final column of the partial matrix associated with the parity of the accumulate structure in the LDPC code in which the parity-associated partial matrix has the accumulate structure).

A blackened square frame (connected) indicates one of the bits that are used to derive the value of p_last when encoder 502 performs the processing in FIG. 63.

One of the connected bits is the value of the bit corresponding to next-to-last bit p_2ndlast used to derive p_last in accumulate processing of step S6303. In the case that the vector of the code word of the LDPC code in the ith block is set to $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$, the connected bit in p_2ndlast constitutes $P_{N-1}$ in the LDPC code in which the parity-associated partial matrix has the accumulate structure.

The vector constituting an (N−K)th row is set to $h_{N-K}$ in parity check matrix H (a matrix having the order of (N−K) rows and N columns) in which the parity-associated partial matrix in which the vector of the code word of the LDPC code in the ith block is set to $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ has the accumulate structure. At this point, $h_{N-K}$ is a vector having the order of one row and N columns.

In vector $h_{N-K}$, a column that becomes "1" is set to g. g is an integer from 1 to K. At this point, $X_g$ also serves as a candidate as the connected bit.

In FIGS. 69 and 70, a square frame surrounding "any" is a bit of one of "0" and "1".

A length of an arrow indicated by PadNum is the number of adjustment bits in the case that the bit length is adjusted (by a method for supplying a shortage).

An example will be described below. The hatched p_last constitutes $P_N$.

Bit length adjuster 6001 in FIG. 60 generates one of the adjustment bit strings of the following modifications (as described above, the adjustment bit string arranging method is not limited to that in FIG. 60).

First Modification in FIG. 69

Bit length adjuster 6001 generates the adjustment bit string by repeating the value of p_last at least once.

Second Modification in FIG. 69

Bit length adjuster 6001 generates a part of the adjustment bit string by repeating the value of p_last at least once. For "any", the vector of the code word of the LDPC code in the ith block is generated from one of bits of $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$.

Third Modification in FIG. 69

Bit length adjuster 6001 generates a part of the adjustment bit string by repeating the value of p_last at least once. The part of the adjustment bit string is constructed with a predetermined bit.

Fourth Modification in FIG. 70

Bit length adjuster 6001 generates the adjustment bit string by repeating the value of the connected bit at least once.

Fifth Modification in FIG. 70

Bit length adjuster 6001 generates a part of the adjustment bit string by repeating the value of the connected bit at least once. For "any", the vector of the code word of the LDPC code in the ith block is generated from one of bits of $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$.

Sixth Modification in FIG. 70

Bit length adjuster 6001 generates the adjustment bit string from the values of p_last and the connected bit.

Seventh Modification in FIG. 70

Bit length adjuster 6001 generates a part of the adjustment bit string from the values of p_last and the connected bit. For "any", the vector of the code word of the LDPC code in the ith block is generated from one of bits of $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$.

Eighth Modification in FIG. 70

Bit length adjuster 6001 generates a part of the adjustment bit string from the values of p_last and the connected bit. The part of the adjustment bit string is constructed with a predetermined bit.

Ninth Modification in FIG. 70

Bit length adjuster 6001 generates a part of the adjustment bit string from the value of the connected bit. The part of the adjustment bit string is constructed with a predetermined bit.

Effect of Second Exemplary Embodiment

Figure 71:
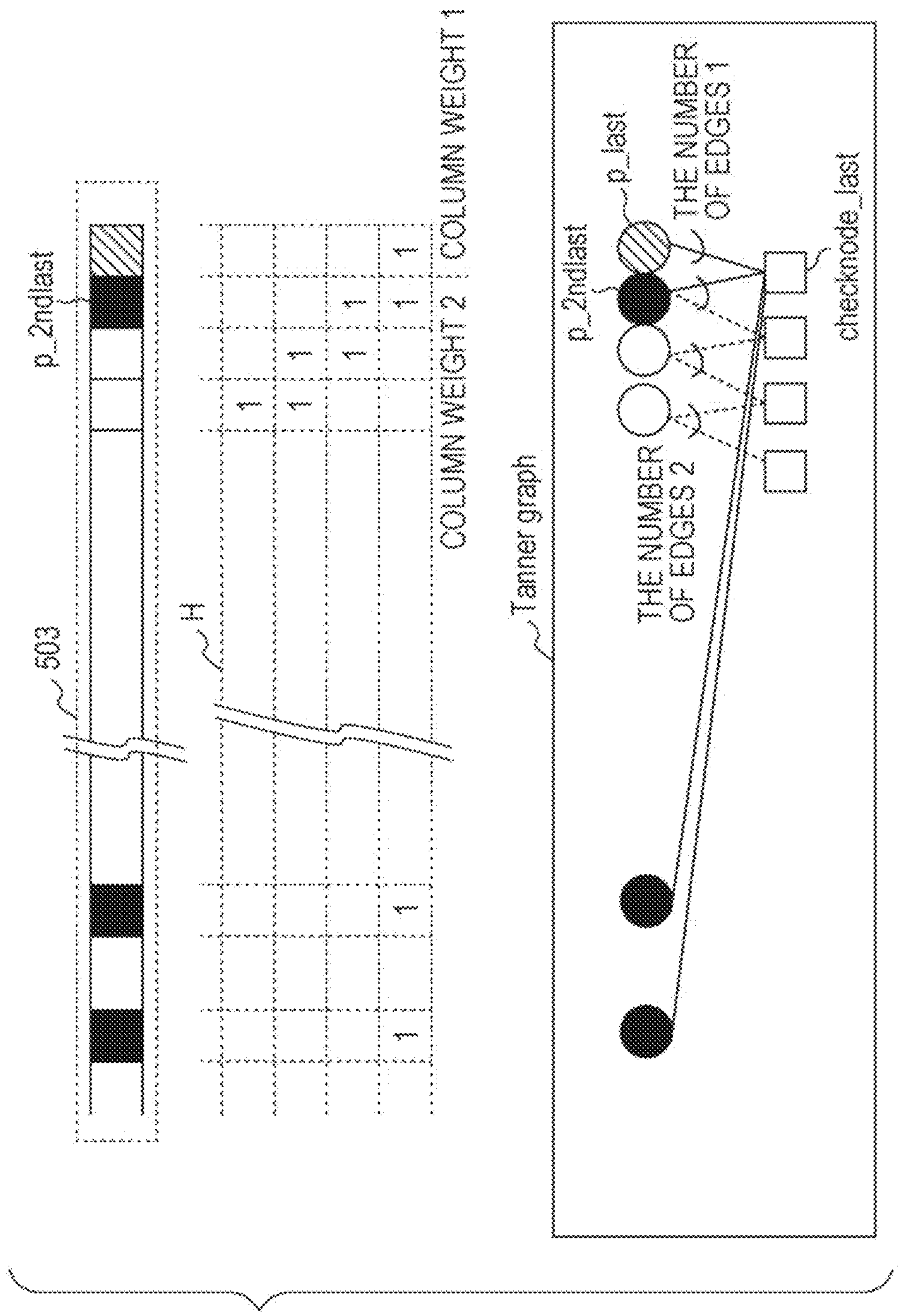
FIG. 71 is a view illustrating one of perceptions according to the disclosure associated with the second exemplary embodiment.
Figure 72:
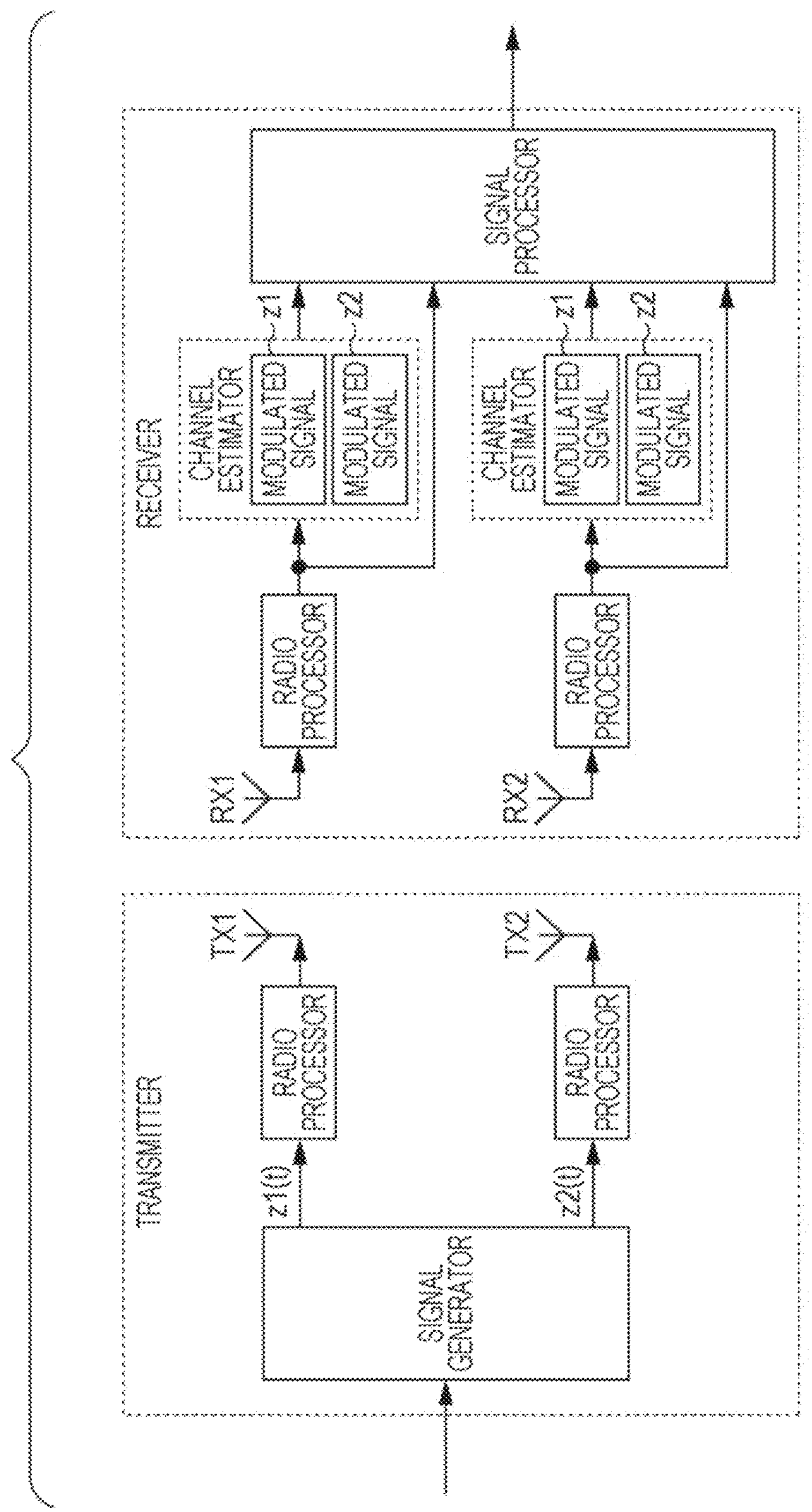
FIG. 72 is a view illustrating an outline of an MIMO system.

FIG. 71 is a view illustrating one of perceptions according to the disclosure associated with the second exemplary embodiment.

An upper stage in FIG. 71 is a reproduction diagram illustrating the first bit string (the code word of the LDPC code in the ith block) 503 in FIGS. 69 and 70.

A middle stage in FIG. 71 is a conceptual view illustrating parity check matrix H of the LDPC code conceived through LDPC coding processing associated with the accumulate processing (in step S6303).

"1" in FIG. 71 forms an edge when a Tanner graph is drawn in the conceptual parity check matrix of the LDPC code. As described in step S6303, the value of p_last is calculated using the value of p_2ndlast. However, the value of p_last is a final bit in the order of the accumulate processing, but does not have the association with the next bit value. Accordingly, in conceptual parity check matrix H, a column weight of p_last (or the bit corresponding to p_last) is less than column weight 2 of the bit of another parity portion, and becomes column weight 1 (as used herein, the column weight means a number having an element of "1" in column vector of each column of the parity check matrix).

A lower stage in FIG. 71 illustrates a Tanner graph of conceptual parity check matrix H.

A round (○) indicates a variable (bit) node. The hatched round indicates a variable (bit) node giving an abstract of p_last. The blackened round indicates a bit node giving an abstract of the connected bit. At the lower stage in FIG. 71, a square (□) indicates a check node where the variable (bit) nodes are coupled to each other. Particularly, the check node indicated by checknode_last is one to which the bit node giving the abstract of p_last is connected (edge 1 is set). A solid line at the lower stage in FIG. 71 indicates a variable (bit) node having checknode_last and an edge.

The connected bit is a bit group that is directly connected to checknode_last including p_2ndlast. At the lower stage in FIG. 71, a sold line indicates the edge that is directly connected to the bit node connected to checknode_last. At the lower stage in FIG. 71, a broken line indicates the edge of conceptual parity check matrix FI of another check node.

It is considered that BP (Belief Propagation) decoding such as sum-product decoding is performed in the LDPC code in which parity-associated partial matrix has the accumulate structure.

The Tanner graph at the lower stage in FIG. 71 is focused on. Particularly, the graph formed by the variable (bit) node and check node of the parity is focused on.

At this point, the variable (bit) node giving the abstract of the bit of the parity portion, such as p_2ndlast, which is different from p_last, is connected to two check nodes (the number of edges is 2 in FIG. 71).

With respect to the graph formed by the variable (bit) node and check node of the parity, an external value can be obtained from (the check nodes of) two directions in the case that the number of parity edges is 2. Because repetitive decoding is performed, belief propagates from the distant check node and variable (bit) node.

On the other hand, with respect to the graph formed by the variable (bit) node and check node of the parity, the variable (bit) node giving the abstract of p_last shares the edge only with one check node (checknode_last) (the line in which the number of edges is 1 in FIG. 71).

Therefore, the variable (bit) node of p_last means that the external value is obtained only from one direction. The belief propagates from the distant check node and variable (bit) node because the repetitive decoding is performed, and the external value is obtained only from one direction in the variable (bit) node of p_last. Therefore, because many reliabilities are hardly obtained, the belief of p_last is lower than the belief of another parity bit.

Accordingly, because of the low belief of p_last, an error propagation is generated to another bit.

When the belief of p_last is improved, the generation of an error propagation can be suppressed to improve the belief of another bit. In the second exemplary embodiment, this point is focused on and repetitive transmission of p_last is proposed.

The bit in which the belief is lowered because of the low belief of p_last is the connected bit (this point can be derived from the above relationship of "Hu=0"). Because of the low belief of the connected bit, the error propagation is generated to another bit.

Therefore, when the belief of the connected bit is improved, the generation of an error propagation can be suppressed to improve the belief of another bit. In the second exemplary embodiment, this point is focused on and repetitive transmission of the connected bit is proposed.

The plurality of exemplary embodiments may be combined.

Third Exemplary Embodiment

Figure 73:
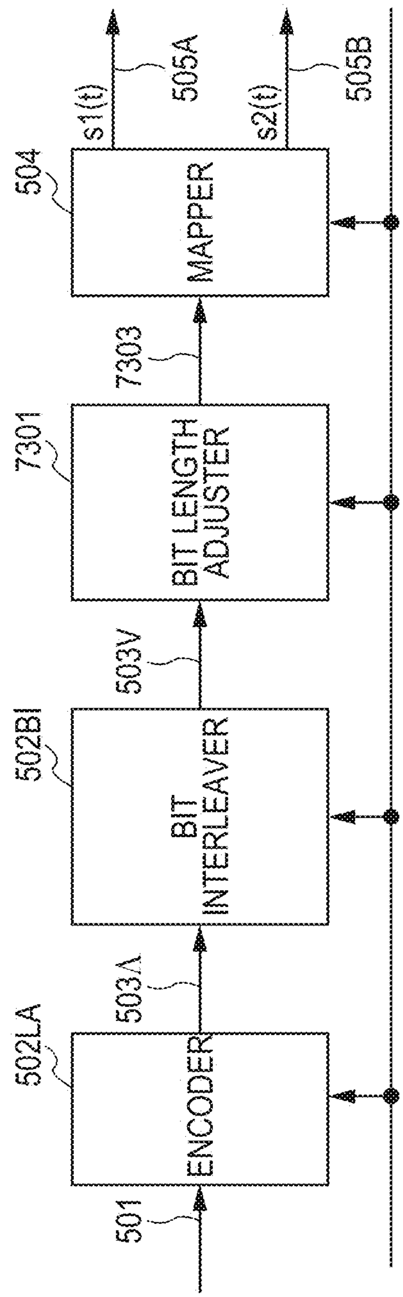
FIG. 73 is a view illustrating a configuration of a modulator according to a third exemplary embodiment.

FIG. 73 illustrates a configuration of a modulator according to a third exemplary embodiment.

Referring to FIG. 73, the modulator includes encoder 502LA, bit interleaver 502BI, bit length adjuster 7301, and mapper 504.

Because the operation of mapper 504 is similar to that of the exemplary embodiments, the description is omitted.

K-bit information about the ith block is input to encoder 502LA, and encoder 502LA outputs N-bit code word 503Λ of the ith block. At this point, it is assumed that N-bit bit string 5 has a specific number of bits such as 4320 bits, 16800 bits, and 64800 bits.

For example, N-bit bit string 503Λ constituting the ith block is input to bit interleaver 502BI, and bit interleaver 502BI performs bit interleaving processing to output N-bit (interleaved) bit string 503V. In the interleaving processing, the order of the input bits of bit interleaver 502BI is changed to output the bit string in which the order is changed. For example, in the case that the column of the input bit of the bit interleaver 502BI has the column in which b1, b2, b3, b4, and b5 are sequentially arranged, the output bit string of the bit interleaver 502BI has the column in which b2, b4, b5, b1, and b3 through the interleaving processing (however, there is not limited to the order).

For example, N-bit (bit-interleaved) bit string 503V is input to bit length adjuster 7301, and bit length adjuster 7301 adjusts the bit length, and outputs the bit-length-adjusted bit string 7303.

Figure 74:
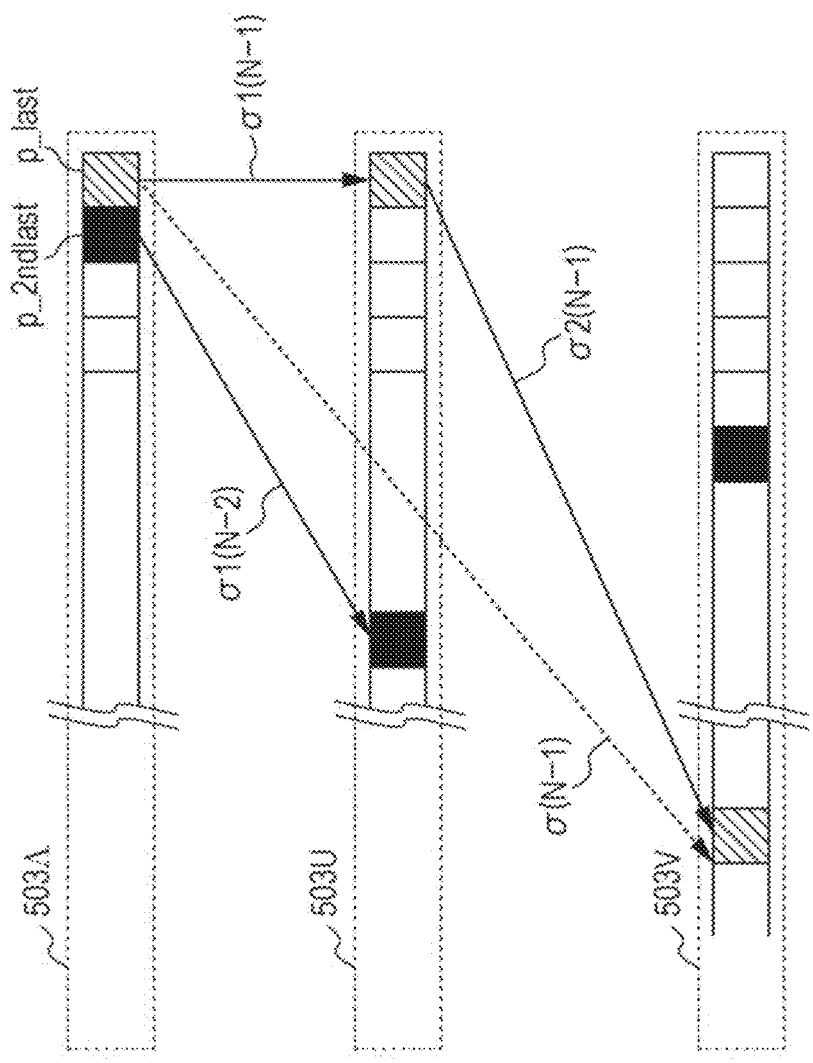
FIG. 74 is a view illustrating operation of bit interleaver 502BI using an output bit string.

FIG. 74 is a view illustrating the operation of bit interleaver 502BI in FIG. 73 using the output bit string. FIG. 74 illustrates an example of the bit interleaving method, and another bit interleaving method may be adopted.

In FIG. 74, a hatched square frame and a blackened square frame are similar to those in FIG. 69 of the second exemplary embodiment.

In FIG. 74, reference mark 503Λ designates the order of the bit string before the bit interleaving processing.

Reference mark 503U designates the order of the bit string after the first-time bit interleaving processing (σ1).

Reference mark 503V designates the order of the bit string after the second-time bit interleaving processing (σ2).

A solid-line arrow means that the bit at the position (order) of an arrow source moves to the position (order) of an arrow destination through the first-time bit interleaving processing. For example, σ1 (N−1) indicates a movement state of (Nth) p_last at a position of N−1 that is of the final bit value of the parity portion through the first-time bit interleaving processing. In the example of FIG. 74, σ1 (N−1) is N−1 in which the position is not changed. σ1 (N−2) indicates the movement state of the position of p_2ndlast.

The bit interleaver is processing in which robustness against a burst error in a communication path is strengthened by lengthening a distance between two adjacent bit positions in the code word generated by the coding of the LDPC code, particularly the parity. Between p_last and p_2ndlast adjacent to each other in 503Λ immediately after the coding processing, a position space indicated by 503U is generated through interleaving processing σ1.

A broken-line arrow means that the bit at the position (order) of the arrow source moves to the position (order) of the arrow destination through pieces of bit interleaving processing (σ1, σ2, . . . ). σ(N−1) is multiple syntheses and substitutions for σ1 and σ2. In the example of FIG. 74 in which two substitutions are used, σ(N−1) is equivalent to σ2(σ1(N−1)).

Thus, bit interleaver 502BI is the processing in which the order of the input bits of bit interleaver 502BI is changed to output the bit string in which the order is changed.

Figure 75:
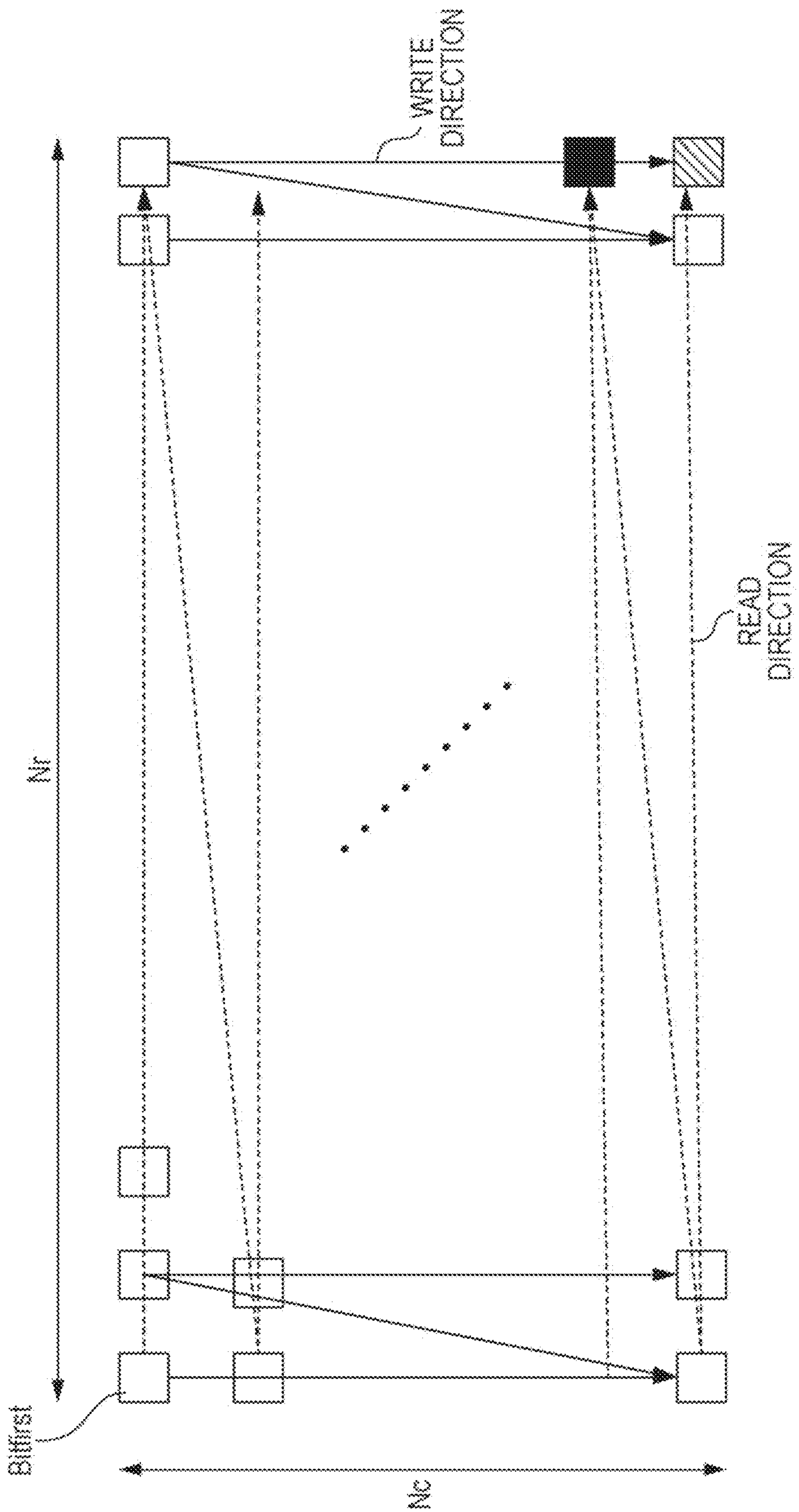
FIG. 75 is a view illustrating an example of mounting bit interleaver 502.

FIG. 75 illustrates an example of mounting bit interleaver 502.

The bit string of an interleaving object is stored in a memory having a size of Nr and No that are of a divisor of the number of bits of the bit string, and the write order of the bit string in the memory and the read order are changed, thereby performing the bit interleaving processing.

First, the bit interleaver ensures the memory of the number of bits N of the bit interleaving processing object, where N=Nr×Nc.

Nr and No can be changed according to a coding rate of an error correction code and/or the set modulation scheme (or the set of the modulation schemes).

In FIG. 75, each of (Nr×Nc) squares indicates a storage in which the value of the corresponding bit is written (the value of 0 or 1 is accumulated).

A longitudinally-repeated solid-line arrow (WRITE direction) means that the bit string is written in the memory from arrow source toward the arrow destination. In FIG. 75, Bitfirst indicates the position where the initial bit is written. In each column, the leading write position may be changed.

A crosswise-repeated broken-line arrow (READ direction) indicates a read direction.

The example in FIG. 75 illustrates the processing of rearranging the bit string of the parity portion in 503Λ (what is called parity interleaving processing). The space between p_2ndlast and p_last, which are written in the memories in which addresses are continuous in the WRITE direction, is increased.

Figure 76:
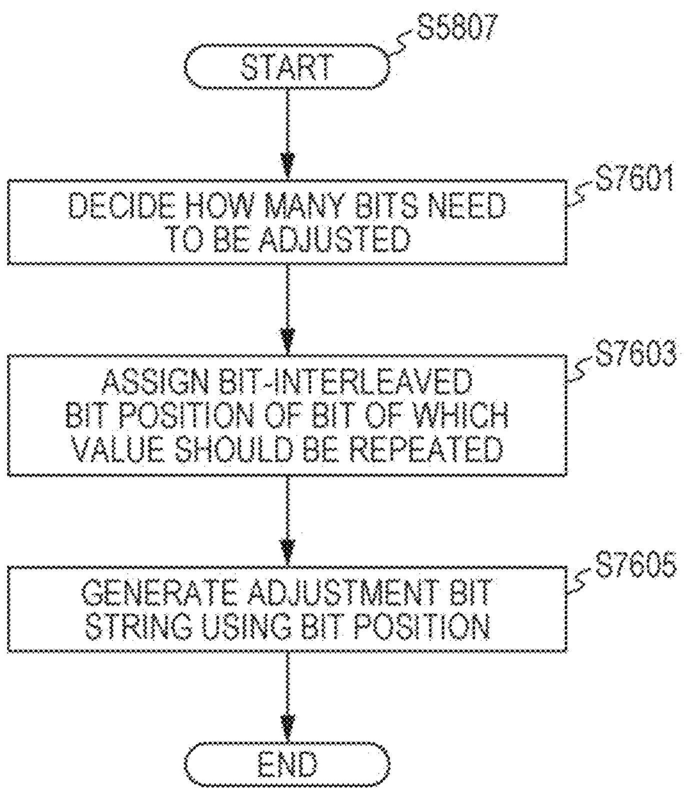
FIG. 76 is a view illustrating an example of the bit length adjustment processing.

FIG. 76 illustrates the bit length adjustment processing of the third exemplary embodiment.

The controller (not illustrated in FIG. 73) decides how many bits needs to be adjusted (step S7601). The processing in step S7601 corresponds to step S5901 of the first exemplary embodiment.

Then the controller issues an instruction to bit length adjuster 7301 in FIG. 73 to assign the position where the bit string (for example, the added bit described in the first exemplary embodiment and the adjustment bit string described in the second exemplary embodiment) is added to the N-bit code word in the ith block after the bit interleaving (S7603).

Figure 77:
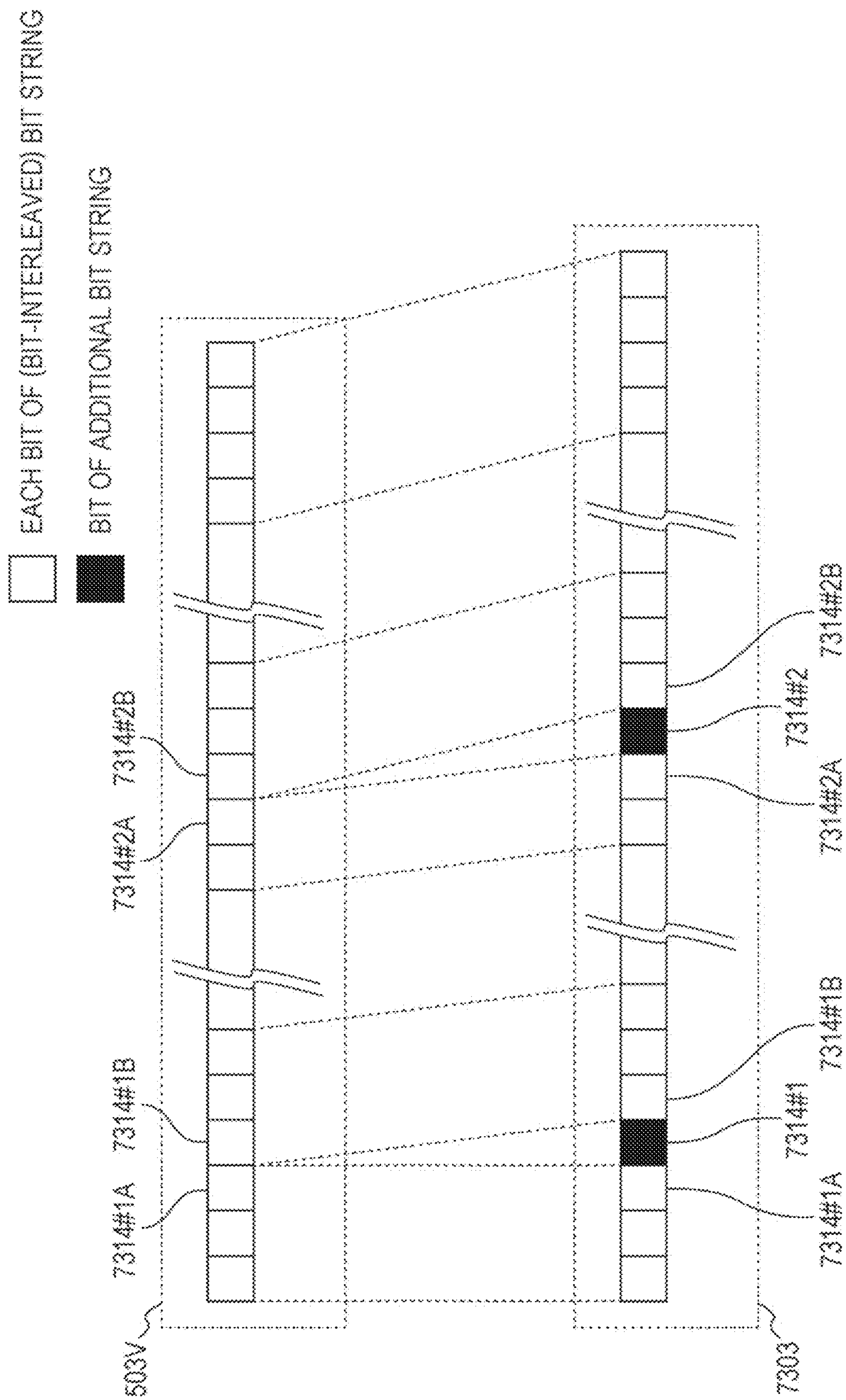
FIG. 77 is a view illustrating an example of the added bit string.

An example will be described below with reference to FIG. 77. In FIG. 77, reference mark 503V designates the interleaved bit string in FIG. 73. For example, interleaved bit string 503V is the interleaved N-bit code word in the ith block. Reference mark 7303 designates the bit-length-adjusted bit string in FIG. 73. In bit-length-adjusted bit string 7303, it is assumed that the added bit string is added to the interleaved N-bit code word in the ith block.

In FIG. 77, a square frame (□) indicates each bit of the interleaved N-bit code word in the ith block, and a blackened square frame (■) indicates the bit of the added bit string.

In the example of FIG. 77, bit (■) 7314 #1 of the added bit string is inserted between square frames (□) 7314 #1A and 7314 #1B, and bit (■) 7314 #2 of the added bit string is inserted between square frames (□) 7314 #2A and 7314 #2B, thereby forming bit-length-adjusted bit string 7303. That is, the added bit string is inserted in and added to the interleaved N-bit code word in the ith block to generate bit-length-adjusted bit string 7303 (S7605).

As described above in the first and second exemplary embodiments, in the case that the value of (X+Y), namely, the set of the first and second modulation schemes of s1 (t) and s2(t) is switched (or in the case that the setting of the set of the first and second modulation schemes of s1(t) and s2(t) can be changed) while the vector of the code word (of the LDPC code) in the ith block has fixed code word length (block length (code length)) N of 64800 bits, the number of bits of the added bit string is properly changed (sometimes the necessity of the added bit string is eliminated depending on the value of (X+Y) (the set of the first and second modulation schemes of s1(t) and s2(t))).

One of the necessary points is that the number of bits of bit-length-adjusted bit string (7303) constructed with the code word of the LDPC code in the ith block and the added bit string is a multiple of the number of bits (X+Y) decided by the set of the first and second modulation schemes of s1(t) and s2(t).

As described above, for example, N-bit (bit-interleaved) bit string 503V is input to bit length adjuster 7301, and bit length adjuster 7301 adjusts the bit length, and outputs the bit-length-adjusted bit string 7303. Alternatively, for example, (N×z)-bit (bit-interleaved) bit string 503V may be input to bit length adjuster 7301, and bit length adjuster 7301 may adjust the bit length, and output bit-length-adjusted bit string 7303 (z is an integer of 1 or more).

FIG. 75 illustrates an example of mounting bit interleaver 502.

The bit string of an interleaving object is stored in a memory having a size of Nr and Nc that are of a divisor of the number of bits of the bit string, and the write order of the bit string in the memory and the read order are changed, thereby performing the bit interleaving processing.

First, the bit interleaver ensures the memory of the number of bits (N×z) of the bit interleaving processing object, where N×z=Nr×Nc.

Nr and Nc can be changed according to a coding rate of an error correction code and/or the set modulation scheme (or the set of the modulation schemes).

In FIG. 75, each of (Nr×Nc) squares indicates a storage in which the value of the corresponding bit is written (the value of 0 or 1 is accumulated).

A longitudinally-repeated solid-line arrow (WRITE direction) means that the bit string is written in the memory from the arrow source toward the arrow destination. In FIG. 75, Bitfirst indicates the position where the initial bit is written. In each column, the leading write position may be changed.

A crosswise-repeated broken-line arrow (READ direction) indicates a read direction.

The example in FIG. 75 illustrates the processing of rearranging the bit string of the parity portion in 503Λ (what is called parity interleaving processing). The space between p_2ndlast and p_last, which are written in the memories in which addresses are continuous in the WRITE direction, is increased.

FIG. 76 illustrates the bit length adjustment processing of the third exemplary embodiment.

The controller (not illustrated in FIG. 73) decides how many bits needs to be adjusted (step S7601). The processing in step S7601 corresponds to step S5901 of the first exemplary embodiment.

Then the controller issues an instruction to bit length adjuster 7301 in FIG. 73 to assign the position where the bit string (for example, the added bit described in the first exemplary embodiment and the adjustment bit string described in the second exemplary embodiment) is added to z blocks each of which is constructed with the N-bit code word after the bit interleaving (S7603).

An example will be described below with reference to FIG. 77. In FIG. 77, reference mark 503V designates the interleaved bit string in FIG. 73. For example, interleaved bit string 503V is the z blocks each of which is constructed with the interleaved N-bit code word.

Reference mark 7303 designates the bit-length-adjusted bit string in FIG. 73. In bit-length-adjusted bit string 7303, it is assumed that the added bit string is added to the z blocks each of which is constructed with the interleaved N-bit code word.

In FIG. 77, a square frame (□) indicates each bit of the z blocks each of which is constructed with the N-bit code word, and a blackened square frame (■) indicates the bit of the added bit string.

In the example of FIG. 77, bit (■) 7314 #1 of the added bit string is inserted between square frames (□) 7314 #1A and 7314 #1B, and bit (■) 7314 #2 of the added bit string is inserted between square frames (□) 7314 #2A and 7314 #2B, thereby forming bit-length-adjusted bit string 7303. That is, the added bit string is inserted in and added to the z blocks each of which is constructed with the interleaved N-bit code word to generate bit-length-adjusted bit string 7303 (S7605).

Similarly to the first and second exemplary embodiments, in the case that the value of (X+Y), namely, the set of the first and second modulation schemes of s1(t) and s2(t) is switched (or in the case that the setting of the set of the first and second modulation schemes of s1 (t) and s2(t) can be changed) while the vector of the code word (of the LDPC code) in the ith block has fixed code word length (block length (code length)) N of 64800 bits, the number of bits of the added bit string is properly changed (sometimes the necessity of the added bit string is eliminated depending on the value of (X+Y) (the set of the first and second modulation schemes of s1(t) and s2(t))).

One of the necessary points is that the number of bits of bit-length-adjusted bit string (7303) constructed with "the bit strings of the z code words of the LDPC code in the ith block, namely, the (N×z)-bit bit string" and "the added bit string" is a multiple of the number of bits (X+Y) decided by the set of the first and second modulation schemes of s1(t) and s2(t).

Viewpoint of Third Exemplary Embodiment (1) Measures against change of modulation scheme As described in the first and second exemplary embodiments, one of issues of the present disclosure is that measures are taken against the lack of bit in switching the set of the modulation schemes of complex signals s1 (t) and s2(t).

(For Interleaving Size of N Bits)

(Effect 1)

As described above, the number of bits of bit-length-adjusted bit string (7303) constructed with the code word of the LDPC code in the ith block and the added bit string is the multiple of the number of bits (X+Y) decided by the set of the first and second modulation schemes of s1(t) and s2(t).

Therefore, when the encoder outputs the code word of the error correction code having the N-bit code word length (block length (code length)), the number of bits (X+Y) that can be transmitted at the identical frequency and the identical time using first and second complex signals s1 and s2 does not include the data of the plurality of blocks (of the error correction code) irrespective of the value of N with respect to a set of complex signals based on any combination of the modulation schemes. Therefore, there is a high possibility of reducing the memory of the transmitter and/or receiver.

(Effect 2)

In the case that the value of (X+Y), namely, the set of the first modulation schemes of s1(t) and the second modulation scheme of s2(t) is switched (or in the case that the setting of the set of the first modulation schemes of s1(t) and the second modulation scheme of s2(t) can be changed), bit length adjuster 7301 is disposed at the stage subsequent to bit interleaver 502BI as illustrated in FIG. 73, which allows the memory size of the bit interleaver to be kept constant irrespective of the set of the first modulation schemes of s1(t) and the second modulation scheme of s2(t). Therefore, the increase in memory size of the bit interleaver can be prevented. (When the order of bit length adjuster 7301 and bit interleaver 502BI becomes reversed, it is necessary to change the memory size due to the set of the first modulation schemes of s1(t) and the second modulation scheme of s2(t). For this reason, it is necessary to dispose bit length adjuster 7301 at the stage subsequent to bit interleaver 502BI. In FIG. 73, bit length adjuster 7301 is disposed just behind bit interleaver 502BI. Alternatively, an interleaver that performs another piece of interleaving or another processor may be inserted between bit interleaver 502BI and bit length adjuster 7301.

A plurality of code word lengths (block lengths (code lengths)) of the error correction code may be prepared. For example, it is assumed that Na bits and Nb bits are prepared as the code word length (block length (code length)) of the error correction code. When the error correction code of the Na-bit code word length (block length (code length)) is used, the memory size of the bit interleaver is set to the Na bits, the bit interleaving is performed, and bit length adjuster 7301 in FIG. 73 adds the added bit string as needed. Similarly, when the error correction code of the Nb-bit code word length (block length (code length)) is used, the memory size of the bit interleaver is set to the Nb bits, the bit interleaving is performed, and bit length adjuster 7301 in FIG. 73 adds the added bit string as needed.

(For (N×z)-bit interleaving)

(Effect 3)

As described above, the number of bits of bit-length-adjusted bit string (7303) constructed with "the bit strings of the z code words of the LDPC code in the ith block, namely, the (N×z)-bit bit string" and "the added bit string" is the multiple of the number of bits (X+Y) decided by the set of the first and second modulation schemes of s1 (t) and s2(t).

Therefore, when the encoder outputs the code word of the error correction code having the N-bit code word length (block length (code length)), the number of bits (X+Y) that can be transmitted at the identical frequency and the identical time using first and second complex signals s1 and s2 does not include the data of the plurality of blocks except for the z code words irrespective of the value of N with respect to a set of complex signals based on any combination of the modulation schemes. Therefore, there is a high possibility of reducing the memory of the transmitter and/or receiver.

(Effect 4)

In the case that the value of (X+Y), namely, the set of the first modulation schemes of s1(t) and the second modulation scheme of s2(t) is switched (or in the case that the setting of the set of the first modulation schemes of s1(t) and the second modulation scheme of s2(t) can be changed), bit length adjuster 7301 is disposed at the stage subsequent to bit interleaver 502BI as illustrated in FIG. 73, which allows the memory size of the bit interleaver to be kept constant irrespective of the set of the first modulation schemes of s1(t) and the second modulation scheme of s2(t). Therefore, the increase in memory size of the bit interleaver can be prevented. (When the order of bit length adjuster 7301 and bit interleaver 502BI becomes reversed, it is necessary to change the memory size due to the set of the first modulation schemes of s1(t) and the second modulation scheme of s2(t). For this reason, it is necessary to dispose bit length adjuster 7301 at the stage subsequent to bit interleaver 502BI. In FIG. 73, bit length adjuster 7301 is disposed just behind bit interleaver 502BI. Alternatively, an interleaver that performs another piece of interleaving or another processor may be inserted between bit interleaver 502BI and bit length adjuster 7301.

A plurality of code word lengths (block lengths (code lengths)) of the error correction code may be prepared. For example, it is assumed that Na bits and Nb bits are prepared as the code word length (block length (code length)) of the error correction code. When the error correction code of the Na-bit code word length (block length (code length)) is used, the memory size of the bit interleaver is set to the (Na×z) bits, the bit interleaving is performed, and bit length adjuster 7301 in FIG. 73 adds the added bit string as needed. Similarly, when the error correction code of the Nb-bit code word length (block length (code length)) is used, the memory size of the bit interleaver is set to the (Nb×z) bits, the bit interleaving is performed, and bit length adjuster 7301 in FIG. 73 adds the added bit string as needed.

A plurality of bit interleaving sizes may be prepared with respect to the code length (block length (code length)) of each error correction code. For example, when the error correction code has the N-bit code word length, (N×a) bits and (N×b) bits are prepared as the bit interleaving size (a and b are an integer of 1 or more). When the (N×a) bits are used as the bit interleaving size, the bit interleaving is performed, and bit length adjuster 7301 in FIG. 73 adds the added bit string as needed. Similarly, when the (N×b) bits are used as the bit interleaving size, the bit interleaving is performed, and bit length adjuster 7301 in FIG. 73 adds the added bit string as needed.

Supplement of Third Exemplary Embodiment (Method 1) Measures Against Change in Code Word Length N of Error Correction Code Code word length N of the error correction code is decided to be a value including factor (X+Y), thereby obtaining a basic solution.

However, there is a limit in making code word length N of the error correction code have a number constructed with factor (X+Y) in any pattern of the new set of the modulation schemes. For example, in order to deal with the case of X+Y=6+8=14, it is necessary to set code word length N of the error correction code to a number that includes 7 as the factor. Then, in order to deal with the case that a total value of 22 of X=10 and Y=12 as the set of the modulation schemes, it is necessary to set code word length N of the error correction code to a new number also including the factor of 11.

(Method 2) Backward Compatibility with (Nr×Nc) Memory of Past Bit Interleaver

As illustrated in FIG. 75, some of the bit interleavers are constructed using a difference between a write address and a read address of a predetermined number of (Nr×Nc) memories with respect to a predetermined number of bits. In a specification (standard) at a first stage, for example, when the selectable modulation scheme becomes a number in which (X+Y) is less than or equal to 12, it is assumed that the bit interleaving processing is properly performed on code word N of the error correction code. In a specification (standard) at a second stage, for example, it is assumed that a new number of 14 is added as (X+Y). For X+Y=14, it is difficult to perform the control including the proper bit interleaving in the specification (standard) at the first stage. This point will be described below with "the bit of which value should be repeated" as p_last.

Figure 78:
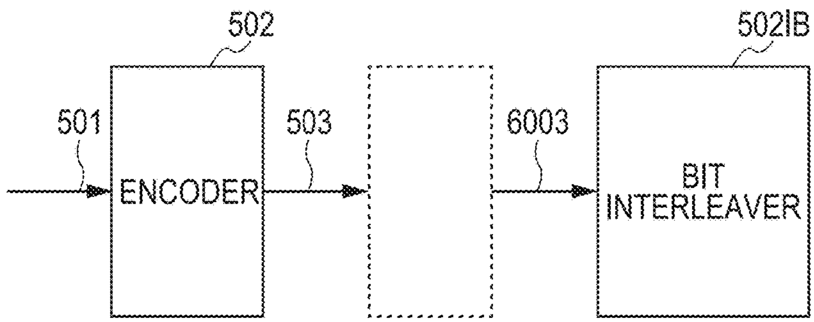
FIG. 78 is a view illustrating an example of insertion of the bit string adjuster.

In FIG. 78, the bit string adjuster is inserted at the front stage (not the rear stage) of bit interleaver 502BI. A broken-line square frame indicates the tentatively-inserted bit length adjuster.

When the bit string adjuster is inserted at the front stage (not the rear stage) of bit interleaver 502BI, the bit position of p_last is the final bit of bit string 503A.

In this case, second bit string 6003 in which the 6-bit adjustment bit is added to N-bit bit string 503 is output to the subsequent stage. It is necessary for the interleaver that receives the 6-bit adjustment bit to perform the interleaving processing on the bit string having a new factor (for example, 7 or 11) that is not a multiple of the (Nr×Nc) bits defined by the specification (standard) at the first stage. Accordingly, in the case that the bit string adjuster is inserted in the front stage (not the rear stage) of bit interleaver 502BI, there is a low affinity to the bit interleaver in the specification (standard) at the first stage.

On the other hand, in the configuration of the third exemplary embodiment in FIG. 73, bit length adjuster 7301 is located at the rear stage (not the front stage) of bit interleaver 502BI.

In the configuration, the N-bit code word of the error correction code in the specification (standard) at the first stage is input to bit interleaver 502BI, and bit interleaver 502BI can perform the bit interleaving processing suitable for the predetermined number of bits in code word length or code word 503.

Similarly to other exemplary embodiments, measures can be taken against the lack of bit corresponding to the number of bits (X+Y) used to generate the set of complex signals s1(t) and s2(t).

Another Example

Figure 79:
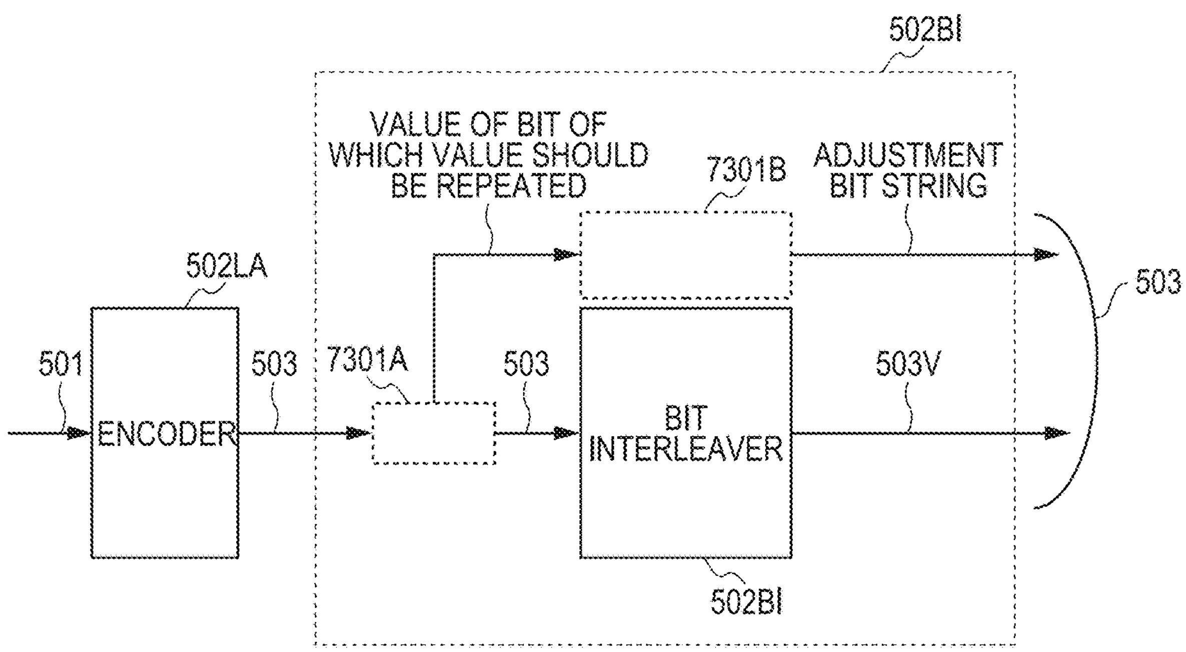
FIG. 79 is a view illustrating a modification of a configuration of the modulator.

FIG. 79 illustrates a modulator according to a modification of the third exemplary embodiment.

The modulator includes bit value holder 7301A and adjustment bit string generator 7301B, which constitute bit length adjuster 7301, at the rear stage of encoder 502LA.

Bit value holder 7301A directly supplies input N-bit bit string 503 to bit interleaver 502BI. Then, bit interleaver 502BI performs the bit interleaving processing on bit string 503 having the N-bit bit length (the code length of the error correction code), and output bit string 503V.

Bit value holder 7301A holds the bit value of "the bit position where the value should be repeated" in first bit string 503 output from the encoder, and supplies the bit value to adjustment bit string generator 7301B.

Adjustment bit string generator 7301B generates one of the adjustment bit strings of the second exemplary embodiment using the acquired "bit position where the value should be repeated", and outputs the adjustment bit string included in first bit string 503 together with N-bit bit string 503V.

In the modification, (1) the position of "the bit of which value should be repeated" can easily be obtained without being influenced by the bit interleaving pattern that is changed according to the coding rate of the error correction code. For example, in the case that "the bit of which value should be repeated" is p_last, the position of p_last can easily be acquired. Therefore, the bit length adjuster can generate the bit string from the reiteration of the finally-input bit that is of the fixed position.

(2) The modulator of the modification is suitable from the viewpoint of the affinity to the processing of the bit interleaver that is designed for a predetermined code word length of the error correction code.

As indicated by the broken-line frame in FIG. 79, the functions of bit value holder 7301A and adjustment bit string generator 7301B may be included in the function of bit interleaver 502BI.

Fourth Exemplary Embodiment

In the first to third exemplary embodiments, the shortage (PadNum bits) of the bit length of bit string 503 to the multiple of the value of (X+Y) is supplied by the adjustment bit string.

A method in which the excess bit length is shortened so as to be a multiple of the value of (X+Y) will be described in a fourth exemplary embodiment. In the method of the fourth exemplary embodiment, particularly, known information is inserted at the front stage of the coding of the error correction code, and the coding is performed on the information including the known information, and the known information is deleted to adjust a bit series length. TmpPadNum is the number of bits of the inserted known information, and is also the number of bits deleted after that.

Figure 80:
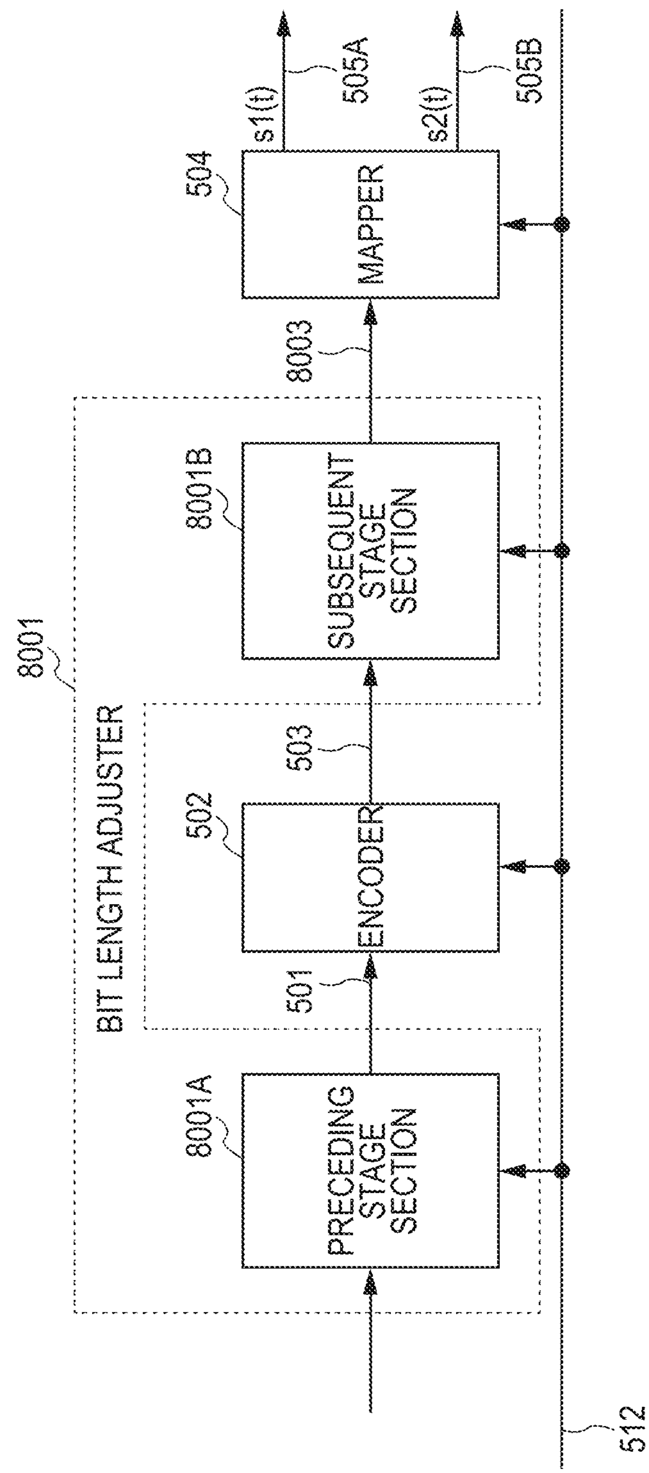
FIG. 80 is a configuration diagram illustrating a modulator according to a fourth exemplary embodiment.

FIG. 80 illustrates a configuration of a modulator of the fourth exemplary embodiment.

Bit length adjuster 8001 of the fourth exemplary embodiment includes preceding stage section 8001A and bit length adjuster subsequent stage section 8001B.

Preceding stage section 8001A performs processing associated with the preceding stage section. The preceding stage section temporarily adds the adjustment bit string that is of the known information to the bit string of the input information, and output the K-bit bit string.

The information bit string including the K-bit known information is input to encoder 502, and encoder 502 outputs first bit string (503) that is of the coded N-bit code word. It is assumed that the error correction code used in encoder 502 is a systematic code (the code constructed with the information and the parity).

Subsequent stage section 8001B performs processing associated with the subsequent stage section. Bit string 503 is input to subsequent stage section, and subsequent stage section deletes (removes) the adjustment bit string that is of the known information temporarily inserted with preceding stage section 8001A. Therefore, a series length of bit-length-adjusted bit string 8003 output from preceding stage section 8001A is a multiple of the value of (X+Y).

The value of (X+Y) is similar to that of the first to third exemplary embodiments.

Figure 81:
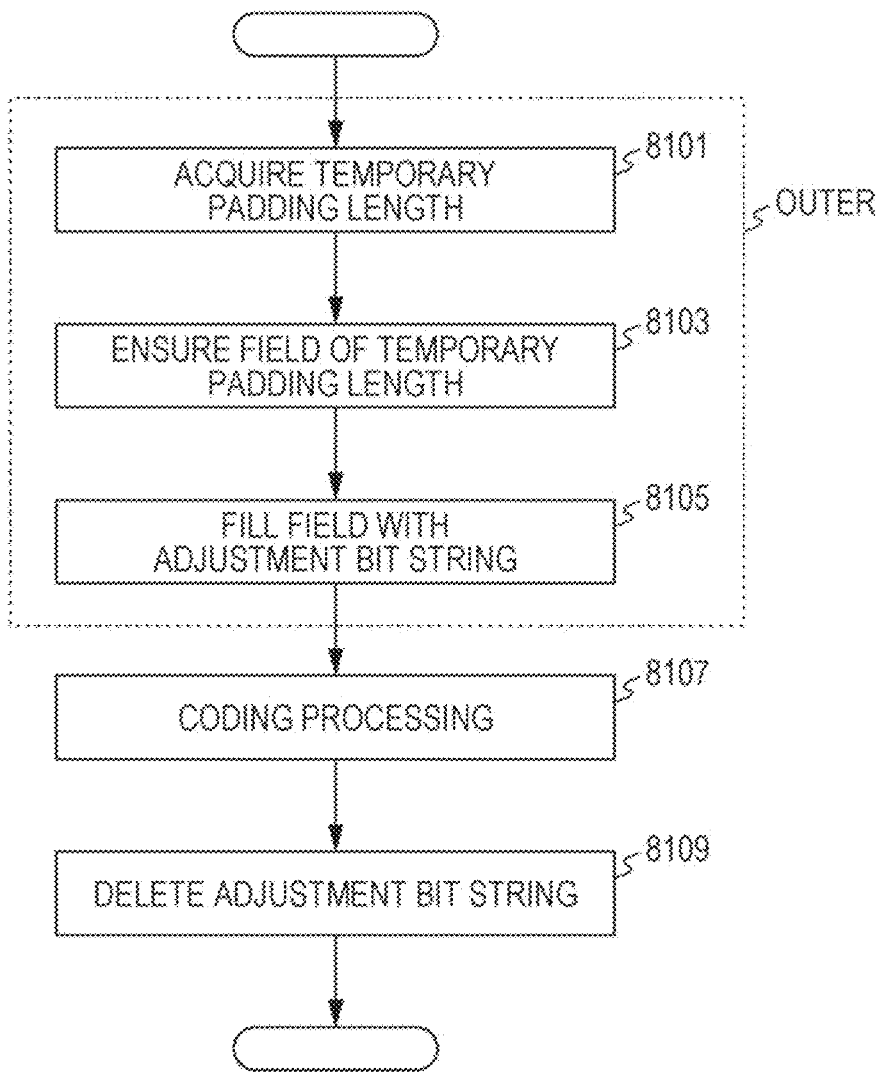
FIG. 81 is a flowchart illustrating processing.

FIG. 81 is a flowchart illustrating processing of the fourth exemplary embodiment.

Broken-line frame OUTER indicates the processing associated with the preceding stage section.

The processing associated with the preceding stage section is processing in which the controller sets a processing content to the preceding stage section. The controller (not illustrated in FIG. 80) outputs signal line 512.

The controller acquires bit length TmpPadNum of the known information in the k-bit information of the N-bit code word of the error correction code based on the value of (X+Y) (S8101).

For example, the following calculation expression is considered as the acquired value.

$$TmpPadNum=N-(floor(N/(X+Y))\times(X+Y))$$

In the expression, floor is a function that rounds up figures after the decimal point.

The value is not necessarily acquired by the calculation, but may be acquired using a table having a parameter such as code word length (block length) N of the error correction code of encoder 502.

Then the controller ensures a field of length TmpPadNum such that output bit string 501 of the preceding stage section becomes K bits. That is, the controller performs control such that the information in K bits is K-TmpPadNum (bits) while the inserted known information is TmpPadNum (bits) (S8103).

(Example 1) In the case that preceding stage section 8001A in FIG. 80 is a part of a frame generating processor:

Preceding stage section 8001A in FIG. 80 may be located in a frame configurator that is a functionally front stage of the modulator.

Figure 82:
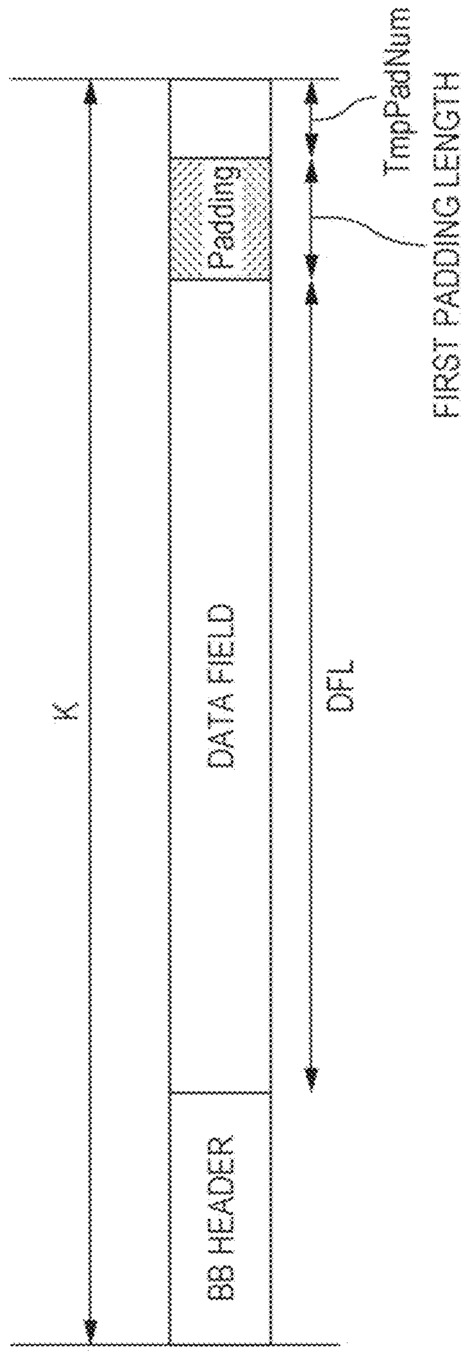
FIG. 82 is a view illustrating a relationship between a length of K bits of BB FRAME and an ensured length of TmpPadNum.

For example, in a system such as DVB, a field having length TmpPadNum may previously be ensured in a baseband frame (what is called BB FRAME) configured usually as the K-bit (information) bit string according to the value of (X+Y). FIG. 82 is a view illustrating a relationship between BB FRAME having a length of K bits and an ensured length of TmpPadNum. BB HEADER is a header of BB FRAME. DATA FIELD is a data bit string having length DFL (bits). A first padding length that is of a length of the hatched portion is padding used to adjust the number of bits that are an integral multiple of a TS packet and are less than DFL irrespective of the value of (X+Y). As illustrated in FIG. 82, bit length TmpPadNum that is of a temporarily padded number is ensured in addition to the first padding.

The preceding stage section located at the input stage may ensure the field length based on code word length N (including an index (such as the coding rate) of a table providing information equivalent to code word length N).

(Example 2) The case that preceding stage section 8001A in FIG. 80 is another encoder that performs external code coding processing:

Preceding stage section 8001A in FIG. 80 may be an external code processor that generates an external code coupled as the external code of the code word of encoder 502 in the modulator.

In this case, the field for (X+Y) can be ensured by changing the coding rate (code word length) of the external code. For example, in the case that a BCH code is used in the external code processing, code word length Nouter (of the external code) can be shortened by (X+Y) by decreasing a degree of generator polynomial g(x) by (X+Y). The (X+Y)-bit field can be ensured by this method.

There are various modifications in changing the degree. For example, a value (or an index changing the degree) is set in a table such that the degree of generator polynomial g(x) is smaller than that of the case that no adjustment is required, and generator polynomial g(x) may be provided through a control signal by the table.

The field means a field including at least one value of TmpPadNum that is added or intermittently inserted irrespective of continuation or discretion of the bit arrangement in the K-bit bit string processed by the code at the subsequent stage.

The controller issues an instruction to fill the field having lengthTmpPadNum ensured in the preceding stage section with the adjustment bit string (known information) (S8105). Preceding stage section 8001A in FIG. 80 fills the field with the adjustment bit string, and outputs bit string 501 having the K-bit length to encoder 502 (S8105).

At this point, for example, it is assumed that all the values are 0 (zero) in the known information (adjustment bit string). Encoder 502 in FIG. 80 codes the K bits constructed with the known information and the transmission information, and obtains N-bit code word constructed with the information and the parity (S8107). There is a method for setting all the values of the known information (adjustment bit string) to 0 (zero) as one of methods for simply performing the coding. However, the known information is not limited to one in which all the values are 0 (zero) as long as what is the known information series can be shared by the coding side and the decoding side. Bit interleaving processing may be included in a processing result of encoder 502 in FIG. 80.

Subsequent stage section 8001B in FIG. 80 removes the temporarily-inserted adjustment bit string (known information) (or an interleaved bit group corresponding to each bit of the original adjustment bit string), and outputs second bit string (bit-length-adjusted bit string) 8003 having the number of bits shorten than N bits (S8109). Subsequent stage section 8001B may be instructed to perform the processing in step S8109 by a value of a table that indicates a position to be deleted according to the value of (X+Y).

Effect

In second bit string (bit-length-adjusted bit string) 8003 having (N−TmpPadNum) bits in which the temporarily-inserted adjustment bit string is deleted from code length N of the code word of the LDPC code in the ith block, the number of bits (N−TmpPadNum) of second bit string (bit-length-adjusted bit string) 8003 is a multiple of the number of bits (X+Y) decided by the set of the first modulation scheme of s1(t) and the second modulation scheme of s2(t).

In the case that the value of (X+Y), namely, the set of the first and second modulation schemes of s1(t) and s2(t) is switched (or in the case that the setting of the set of the first and second modulation schemes of s1(t) and s2(t) can be changed) while the vector of the code word (of the LDPC code) in the ith block has fixed code word length (block length (code length)) N of 64800 bits, the number of adjustment bit strings (the number of bits TmpPadNum), which are temporarily inserted and then deleted, is properly changed (sometimes the number of bits TmpPadNum is zero depending on the value of (X+Y) (the set of the first and second modulation schemes of s1 (t) and s2(t))).

Therefore, when the encoder outputs the code word of the error correction code having the N-bit code word length (block length (code length)), the number of bits (X+Y) that can be transmitted at the identical frequency and the identical time using first and second complex signals s1 and s2 does not include the data of the plurality of blocks (of the error correction code) irrespective of the value of N with respect to a set of complex signals based on any combination of the modulation schemes. Therefore, there is a high possibility of reducing the memory of the transmitter and/or receiver.

Figure 83:
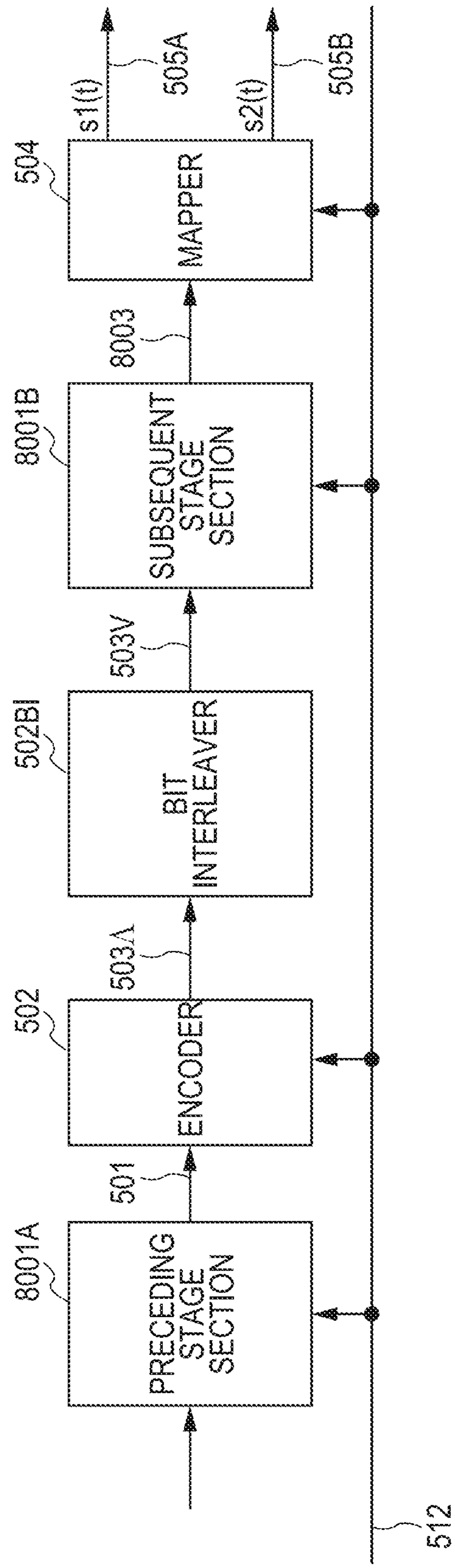
FIG. 83 is a configuration diagram illustrating a modulator different from the modulator in FIG. 80.

FIG. 83 illustrates a configuration of a modulator different from that in FIG. 80. In FIG. 83, the component similar to that in FIG. 80 is designated by the identical reference mark. The modulator in FIG. 83 differs from the modulator in FIG. 80 in that bit interleaver 502BI is inserted at the subsequent stage of encoder 502 and a preceding stage of subsequent stage section 8001B. The action of the modulator in FIG. 83 will be described with reference to FIG. 84.

Figure 84:
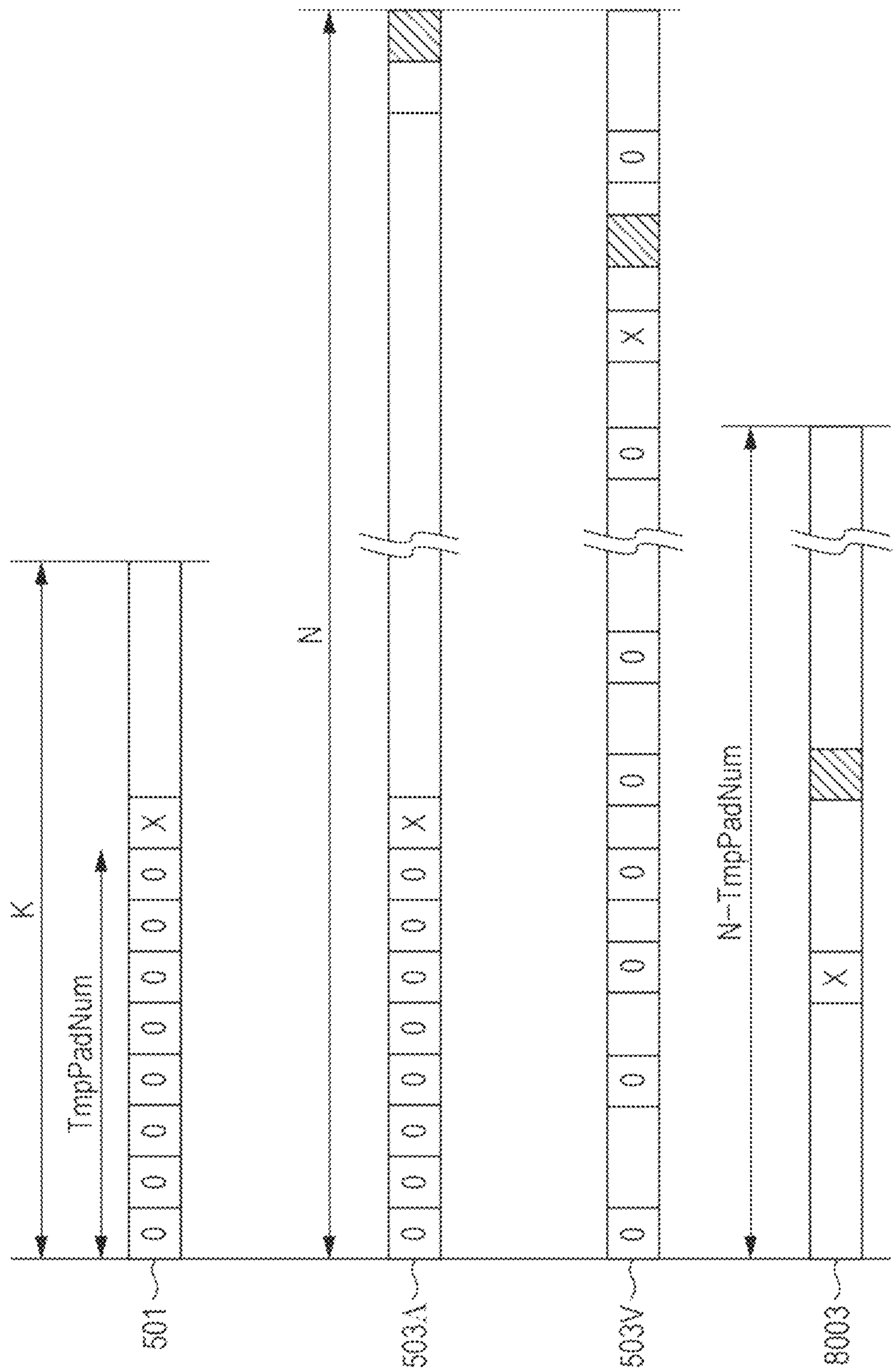
FIG. 84 is a view illustrating bit lengths of bit strings 501 to 8003.

FIG. 84 is a view illustrating the bit lengths of bit strings 501 to 8003.

Bit string 501 is output from preceding stage section 8001A, and is the (information) bit string having the length of K bits including the field having length of TmpPadNum (bits) for the known information.

Bit string 503Λ is output from encoder 502, and is the bit string (first bit string) having the length of N bits that are of the code word of the error correction code.

Bit string 503V has the N-bit length in which the order of the bit value is replaced by a bit interleaver.

Bit string 8003 is the second bit string (bit-length-adjusted bit string) adjusted to the length of the (N−TmpPadNum) bits, and bit string 8003 is output from subsequent stage section 8001B. Bit string 8003 becomes one in which the known information having the TmpPadNum bits is deleted from bit string 503V.

Effect of Fourth Exemplary Embodiment

In the configuration of the fourth exemplary embodiment, the code word of the error correction code can be estimated (decoding) without performing special processing in the decoding on the reception side.

In the configuration on the transmission side, the inserted adjustment bit string is set to the known information, and only the temporarily-inserted adjustment bit string (known information) is deleted. Therefore, in the decoding of the receiver, a possibility of obtaining a high error correction ability is enhanced because the error correction code is decoded using the known information.

In the case that the processor performs the processing of generating the BCH or RS external code, suitably the field is easily ensured.

Fifth Exemplary Embodiment

A method and a configuration in which bit string 501 transmitted from the transmitter is decoded (on the receiver side) will be described in fifth and sixth exemplary embodiments.

More particularly, modulation (detection) processing is performed on complex signals s1(t) and s2(t), which are generated from (information) bit string 501 by "the section that generates the modulated signal" (modulator) of the first to fourth exemplary embodiments and transmitted after the pieces of processing such as MIMO pre-coding, and the bit string is restored from complex signals (x1(t) and x2(t)).

Complex signals x1(t) and x2(t) are a complex baseband signal obtained from the received signal received each receiving antenna.

Figure 85:
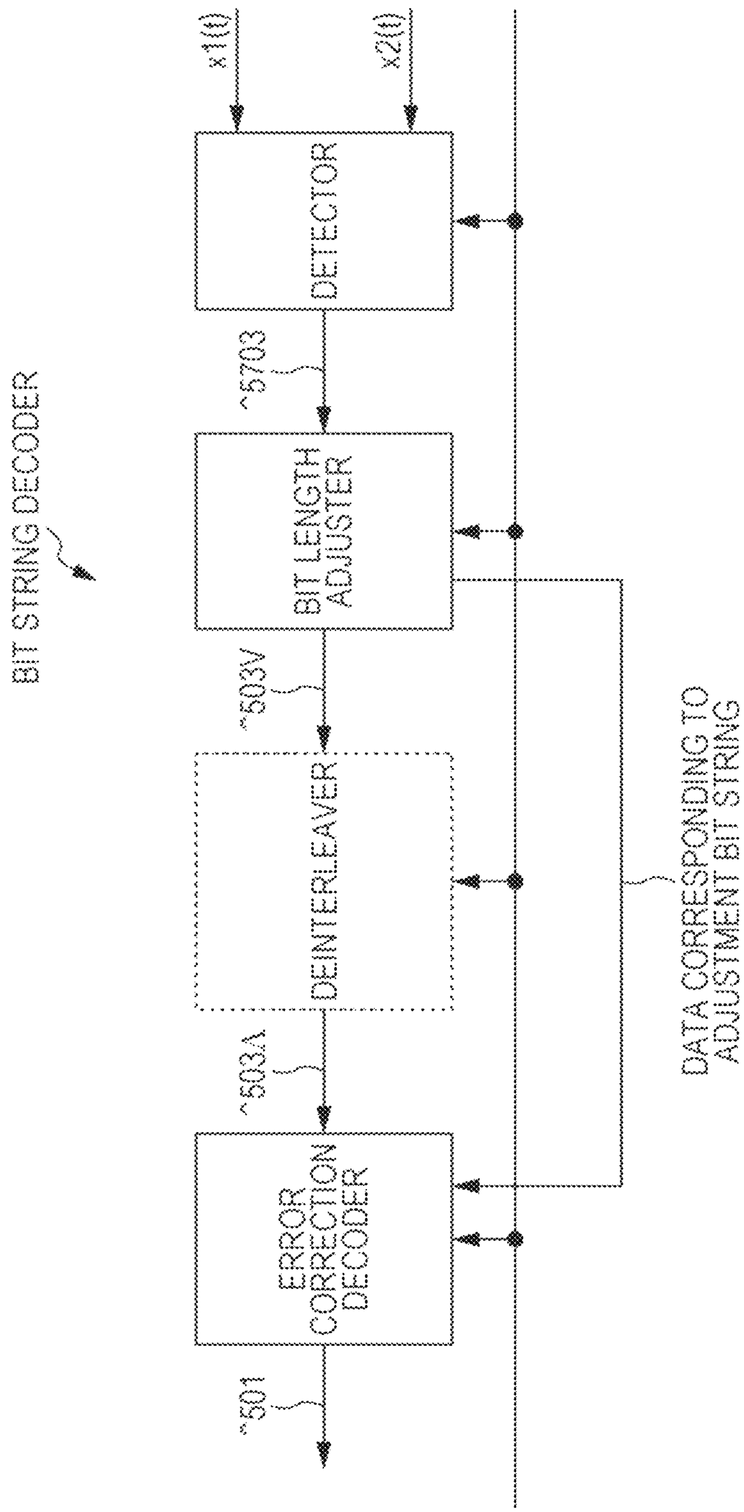
FIG. 85 is a view illustrating an example of a bit string decoder of the receiver.

FIG. 85 illustrates a bit string decoder of the receiver that receives the modulated signal transmitted by the transmission methods of the first to third exemplary embodiments.

In FIG. 85, "ˆ" (caret) indicates an estimation result of the signal having the reference mark under the caret, hereinafter, the caret is omitted by adding "ˆ" to the reference mark.

The bit string decoder in FIG. 85 includes a detector (demodulator), a bit length adjuster, and an error correction decoder.

The detector (demodulator) generates pieces of data, such as a hard decision value, a soft decision value, a log-likelihood and a log-likelihood ratio, which correspond to the bit of the number of bits (X+Y) of the number of first bits included in first complex signal s1 and the number of second bits included in second complex signal s2, from complex baseband signals x1(t) and x2(t) obtained from the received signals received with the receiving antennas, and outputs the data string corresponding to the second bit string having the length of an integral multiple of (X+Y). For example, data strings ˆ5703 corresponds to second bit string R202 having length (N+PadNum).

Data string ˆ5703 corresponding to the bit string of the second bit string is input to the bit length adjuster in FIG. 85. The bit length adjuster extracts data corresponding to the adjustment bit string having length PadNum inserted on the transmission side, and outputs the data to the error correction decode, or outputs data string (ˆ503V) corresponding to N bit strings.

The deinterleaver deinterleaves data string (ˆ503V) corresponding to the N bit strings, and outputs N deinterleaved data strings (ˆ503Λ) to the error correction decoder. Data strings ˆ503V and ˆ503Λ correspond to bit strings 503V and 503Λ, respectively.

The data corresponding to the adjustment bit string having length PadNum and N deinterleaved data strings (ˆ503Λ) are input to the error correction decoder in FIG. 85, and the error correction decoder performs error correction decoding (for example, BP (Belief Propagation) decoding (such as sum-product decoding, min-sum decoding, Normalized BP decoding and offset BP decoding) or Bit Flipping decoding for the use of the LDPC code) to obtain a K-bit information bit estimation series.

In the case that the bit interleaver is used on the transmission side, a deinterleaver is inserted as illustrated in FIG. 85. On the other hand, in the case that the bit interleaver is used on the transmission side, the necessity of the deinterleaver in FIG. 85 is eliminated.

Figure 86:
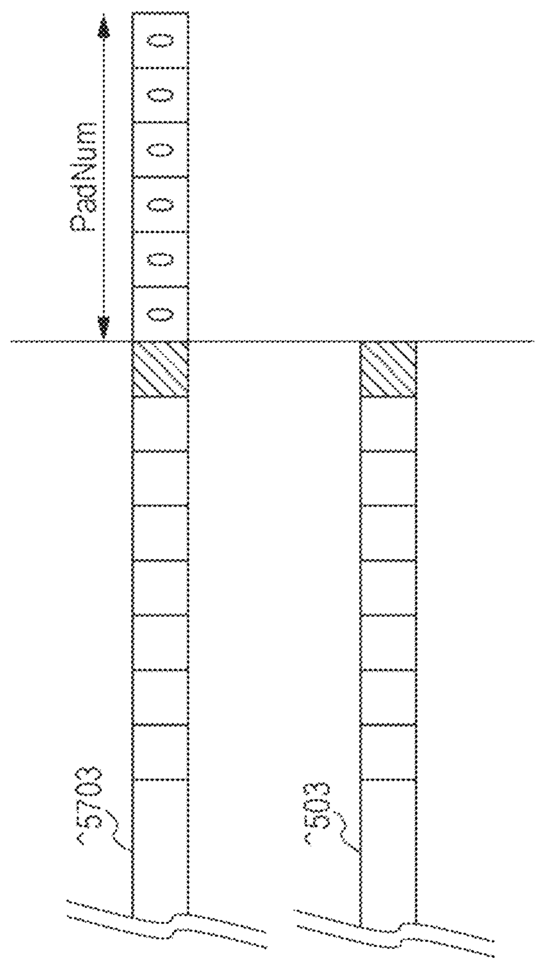
FIG. 86 is a view illustrating input and output of the bit string adjuster.

FIG. 86 is a view illustrating the input and output of the bit string adjuster of the fifth exemplary embodiment.

Data string ˆ5703 corresponds to the bit string having length (N bits+PadNum). Six zeros each of which is surrounded by a square indicate the adjustment bit string. Data string ˆ503 corresponds to the N-bit code word output from the bit length adjuster.

Figure 87:
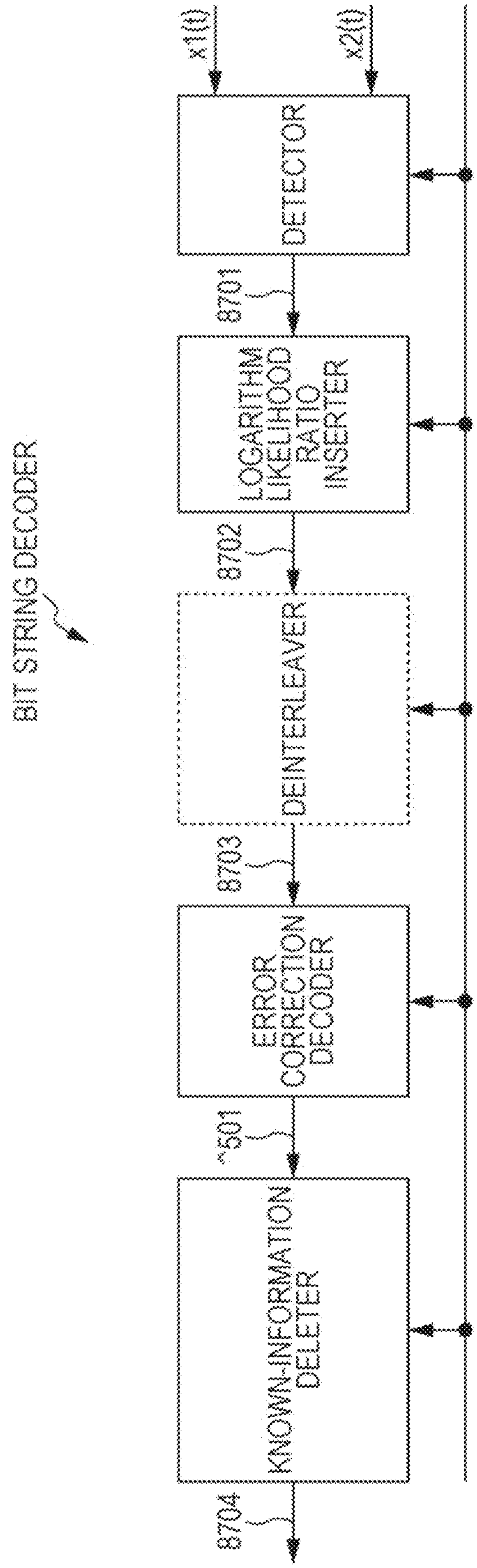
FIG. 87 is a view illustrating an example of the bit string decoder of the receiver.

FIG. 87 illustrates a bit string decoder of the receiver that receives the modulated signal transmitted by the transmission methods of the fourth exemplary embodiment.

The detector (demodulator) generates pieces of data, such as the hard decision value, the soft decision value, the log-likelihood and the log-likelihood ratio, which correspond to the bit of the number of bits (X+Y) of the number of first bits included in first complex signal s1 and the number of second bits included in second complex signal s2, from complex baseband signals x1(t) and x2(t) obtained from the received signals received with the receiving antennas, and outputs data string 8701 corresponding to the second bit string having the length of an integral multiple of (X+Y). For example, data string 8701 corresponds to second bit string 8003 (see FIG. 83) having length (N− TmpPadNum).

Data string 8701 corresponding to the second bit string is input to the log-likelihood ratio inserter in FIG. 87, and the log-likelihood ratio inserter inserts, for example, the log-likelihood ratio (for TmpPadNum) corresponding to the adjustment bit string that is of the known information deleted on the transmission side of the fourth exemplary embodiment in data string 8701 corresponding to the second bit string, and outputs adjusted data string 8702. Accordingly, adjusted data string 8702 becomes the N data strings.

Adjusted data string 8702 is input to the deinterleaver in FIG. 87, and the deinterleaver rearranges the data, and outputs rearranged data string 8703.

Rearranged data string 8703 is input to the error correction decoder in FIG. 87, and the error correction decoder performs the error correction decoding (for example, the BP (Belief Propagation) decoding (such as sum-product decoding, min-sum decoding, Normalized BP decoding and offset BP decoding) or the Bit Flipping decoding for the use of the LDPC code) to obtain the K-bit information bit estimation series. The known-information deleter obtains and outputs data 8704 in which the known information is deleted from the K-bit information bit estimation series.

In the case that the bit interleaver is used on the transmission side, the deinterleaver is inserted as illustrated in FIG. 87. On the other hand, in the case that the bit interleaver is used on the transmission side, the necessity of the deinterleaver in FIG. 87 is eliminated.

Effect of Fifth Exemplary Embodiment

The action of the receiver in transmitting the modulated signal by the transmission methods of the first to fourth exemplary embodiments is described with reference to FIGS. 85 and 87.

In the receiver, the action of the receiver is changed to perform the error correction coding based on the pieces of information corresponding to the modulation schemes of s1 (t) and s2(t) that are used in the transmitter, so that there is a high possibility of being able to obtain the high data reception quality.

When the encoder outputs the code word of the error correction code having the N-bit code word length (block length (code length)), the number of bits (X+Y) that can be transmitted at the identical frequency and the identical time using first and second complex signals s1 and s2 does not include the data of the plurality of blocks (of the error correction code) irrespective of the value of N with respect to a set of complex signals based on any combination of the modulation schemes, and therefore the error correction decoder properly performs the demodulation and the decoding to enhance a possibility of being able to reduce the memory of the receiver.

Sixth Exemplary Embodiment

Figure 88:
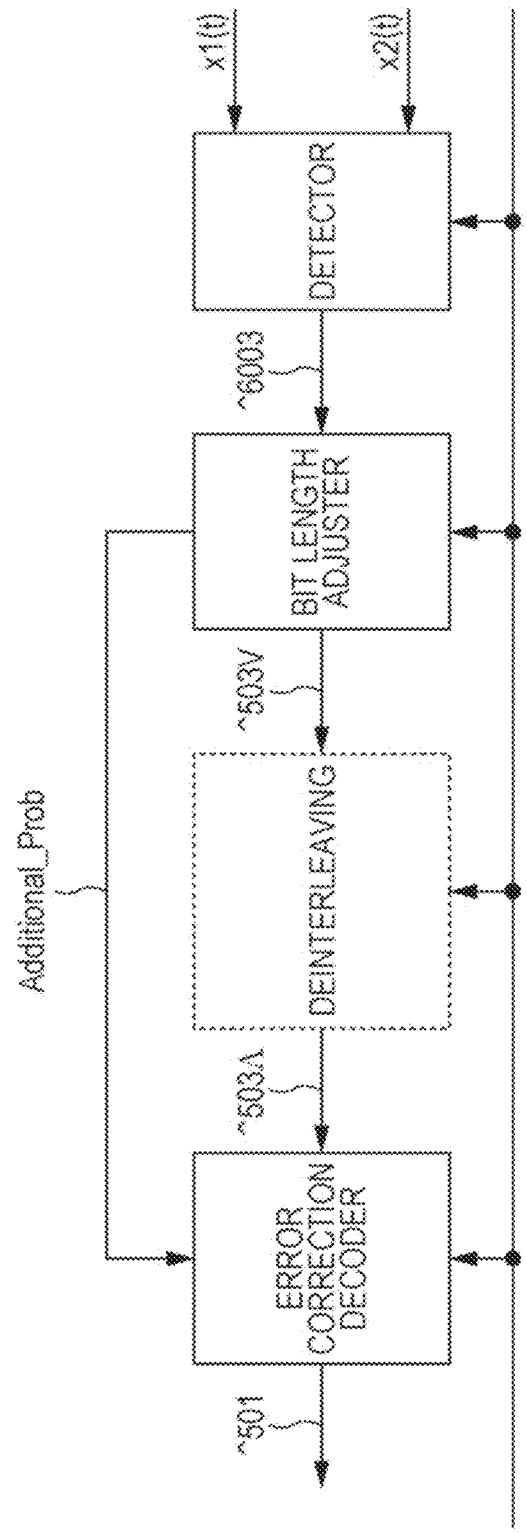
FIG. 88 is a view illustrating an example of the bit string decoder of the receiver.

FIG. 88 illustrates a bit string decoder of a receiver according to a sixth exemplary embodiment.

The operations of the deinterleaver and detector are identical to those of the fifth exemplary embodiment.

The detector outputs bit string ˆ6003 in which one of the adjustment bit strings of the first to ninth modifications of the second exemplary embodiment is inserted.

The bit length adjuster of the sixth exemplary embodiment extracts the data string (for example, the log-likelihood ratio corresponding to the second bit string) corresponding to the second bit string and partial data (for example, the log-likelihood ratio) corresponding to the bit value in a predetermined art of the N bits.

For example, the bit string adjuster performs the following processing in order to obtain the high error correction ability.

The data corresponding to the adjustment bit string is selectively extracted from bit string ˆ6003 having (N+TmpPadNum) bits.

For example, log-likelihood ratio Additional_Prob associated with the adjustment bit string is generated from the data corresponding to each bit of the adjustment bit string.

Generated AdditionalProb is supplied to the error correction decoder.

The error correction decoder estimates the N-bit code word of the error correction code using AdditionalProb and the partial data (for example, the log-likelihood ratio) corresponding to the bit value of the predetermined part in the N bits.

At this point, for example, the error correction decoder performs the sum-product decoding based on the Taner graph structure (parity check matrix) of the second exemplary embodiment.

Figure 89:
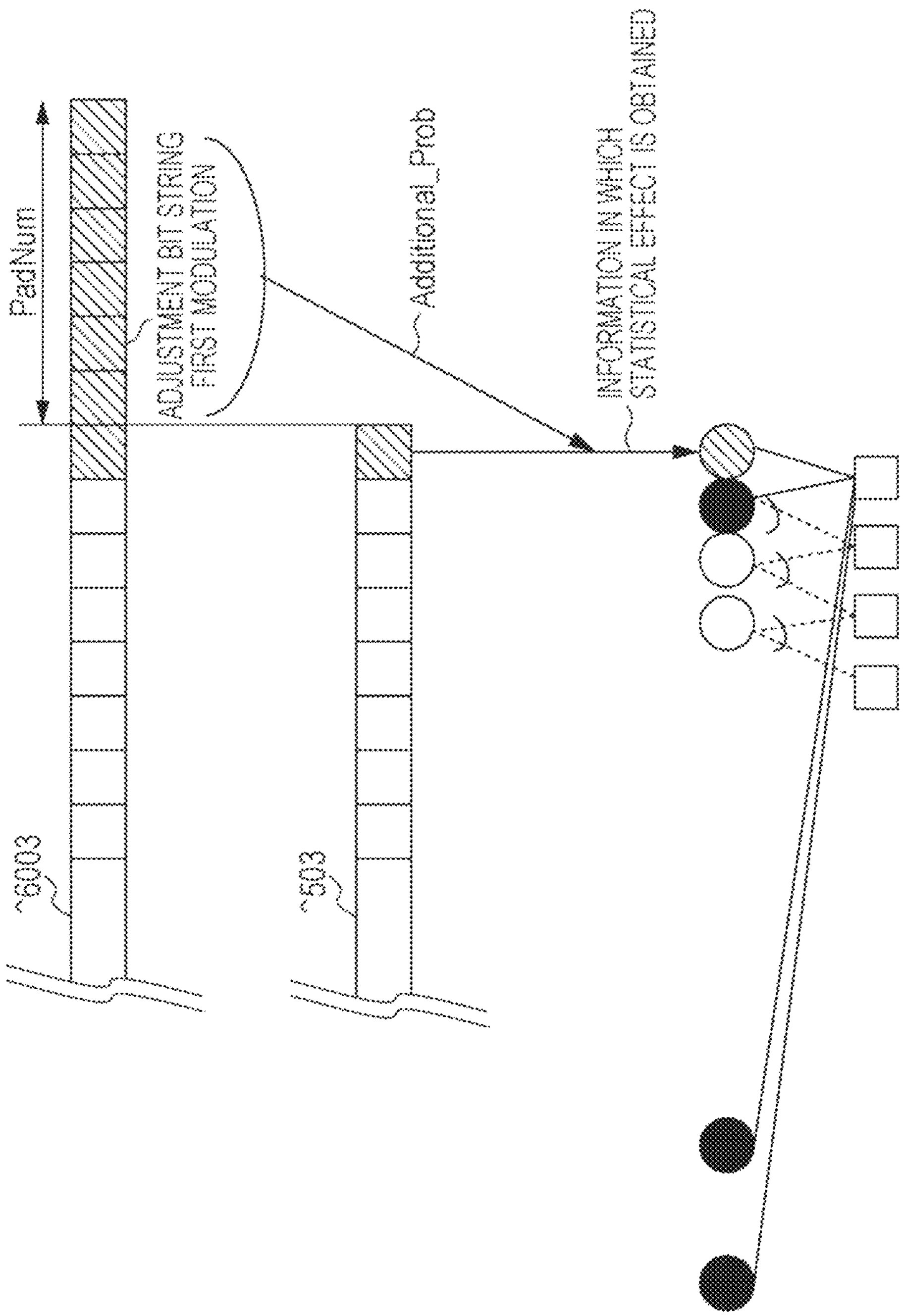
FIG. 89 is a view conceptually illustrating processing according to a sixth exemplary embodiment.

FIG. 89 is a view conceptually illustrating processing of the sixth exemplary embodiment.

In FIG. 89, a circle or a square indicate the same information as the second exemplary embodiment.

In FIG. 89, second bit string ˆ6003 having bit length (N+padNum) is output from the demapper.

In FIG. 89, bit string ˆ503 having bit length N is output from the bit length adjuster. In FIG. 89, Additional_Prob is an additional log-likelihood ratio obtained from, for example, the log-likelihood ratio of the adjustment bit string. The log-likelihood ratio of the predetermined part described in the modifications of the second exemplary embodiment is provided using the additional log-likelihood ratio.

For example, in the case that the predetermined part is p_last, the log-likelihood ratio of p_last can be provided. By adding p_2ndlast to the predetermined part, the log-likelihood ratio of p_2ndlast is provided or the log-likelihood ratio is indirectly provided to p_last.

Therefore, the possibility of being able to obtain the high error correction ability is enhanced.

Seventh Exemplary Embodiment

The transmission method and the transmission-side device are described in the first to fourth exemplary embodiments, and the reception method and the reception-side device are described in the fifth and sixth exemplary embodiments. The transmission method and transmission-side device and the reception method and reception-side device are supplemented in a seventh exemplary embodiment.

Figure 90:
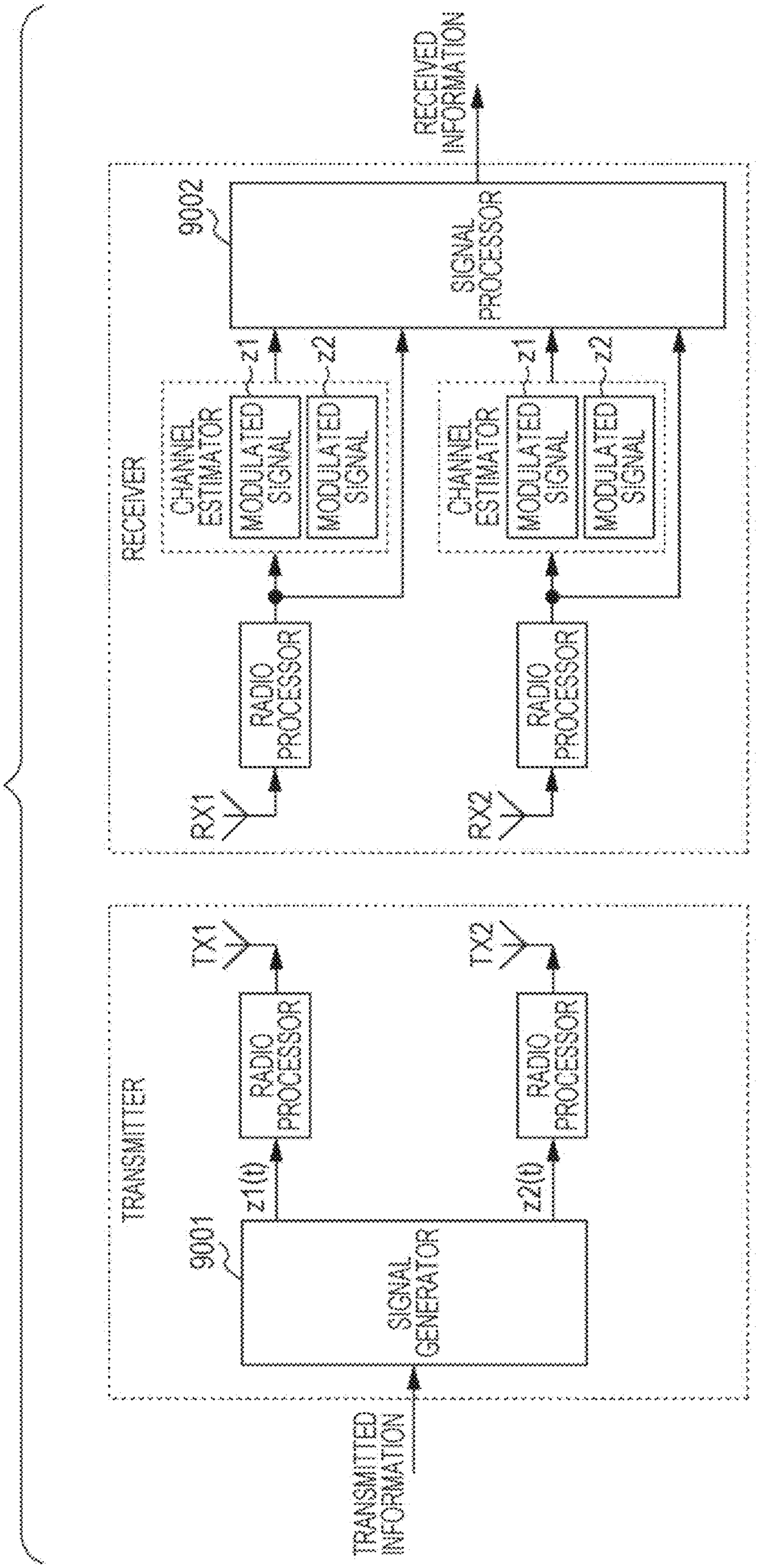
FIG. 90 is a view illustrating a relationship between the transmitter and the receiver.

FIG. 90 is a view illustrating a relationship between a transmitter and a receiver in the seventh exemplary embodiment.

As illustrated in FIG. 90, the transmitter transmits two modulated signals from different antennas. For example, a radio processor of the transmitter performs pieces of processing such as OFDM signal processing, frequency conversion, and power amplification.

Transmitted information is input to signal generator 9001 of the transmitter in FIG. 90, and signal generator 9001 performs pieces of processing such as coding, mapping, and precoding, and outputs precoded modulated signals z1(t) and z2(t). Therefore, signal generator 9001 performs the pieces of processing associated with the transmission methods of the first to fourth exemplary embodiments and the precoding processing.

Receiving antenna RX1 of the receiver in FIG. 90 receives a signal in which spaces of the signal transmitted from antenna TX1 of the transmitter and the signal transmitted from transmitting antenna TX2 are multiplexed.

Similarly, receiving antenna RX2 of the receiver receives a signal in which spaces of the signal transmitted from antenna TX1 of the transmitter and the signal transmitted from transmitting antenna TX2 multiplexed.

In a channel estimator of the receiver in FIG. 90, each antenna estimates channel fluctuations of modulated signals z1(t) and z2(t).

Signal processor 9002 of the receiver in FIG. 90 performs the reception processing of the fifth and sixth exemplary embodiments and the like. As a result, the receiver obtains the estimation result of the transmitted information from the transmitter.

The seventh exemplary embodiment is described while applied to the first to sixth exemplary embodiments. The description of the transmitter in FIG. 90 is made in the case that the transmission method and the transmission-side device are described in the following exemplary embodiments, and the description of the receiver in FIG. 90 is made in the case that the reception method and the reception-side device are described.

Eighth Exemplary Embodiment

Modifications of "the adjustment method in which the excess portion is shortened such that the bit length is the multiple of the value of (X+Y)" of the fourth exemplary embodiment will be described in an eighth exemplary embodiment.

Example 1

Figure 91:
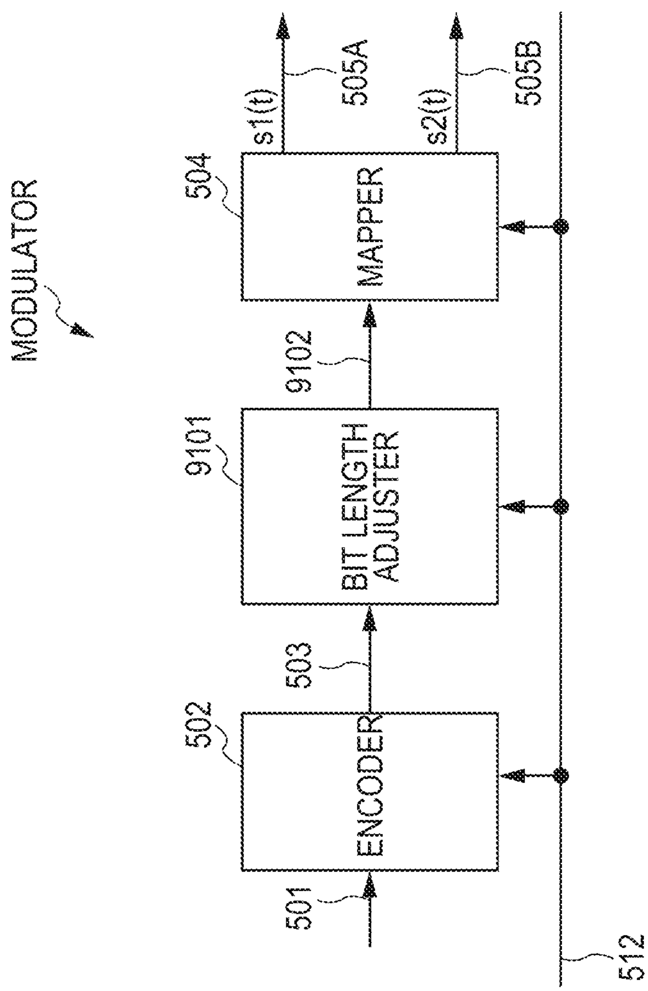
FIG. 91 is a view illustrating a configuration example of a transmission-side modulator.

FIG. 91 illustrates a configuration of a transmission-side modulator of the eighth exemplary embodiment. In FIG. 91, the component similar to that of the first to seventh exemplary embodiments is designated by the identical reference mark.

Control information 512 and K-bit information 501 of ith block are input to encoder 502, and encoder 502 performs the error correction coding such as the LDPC coding to output N-bit code word 503 of the ith block based on the pieces of information about the scheme, coding rate, and block length (code length) of the error correction code included in control information 512.

Control information 512 and N-bit code word 503 of the ith block are input to bit length adjuster 9101, and bit length adjuster 9101 decides the number of bits PunNum deleted from N-bit code word 503 based on the pieces of information about the modulation schemes of s1(t) and s2(t) included in control information 512 or the value of (X+Y), deletes the PunNum-bit data from N-bit code word 503, and outputs (N− PunNum)-bit data string 9102. Similarly to the first to seventh exemplary embodiments, PunNum is decided such that (N− PunNum) is a multiple of the value of (X+Y) (sometimes PunNum becomes 0 (zero) depending on the value of (X+Y) (the set of the first and second modulation schemes of s1 (t) and s2(t)).

However, the value of (X+Y) is similar to that of the first to seventh exemplary embodiments.

Control information 512 and (N− PunNum)-bit data string 9102 are input to mapper 504, and mapper 504 performs the mapping from the modulation schemes of s1 (t) and s2(t) included in control information 512, and outputs first complex signal s1(t) (505A) and second complex signal s2(t) (505B).

Figure 92:
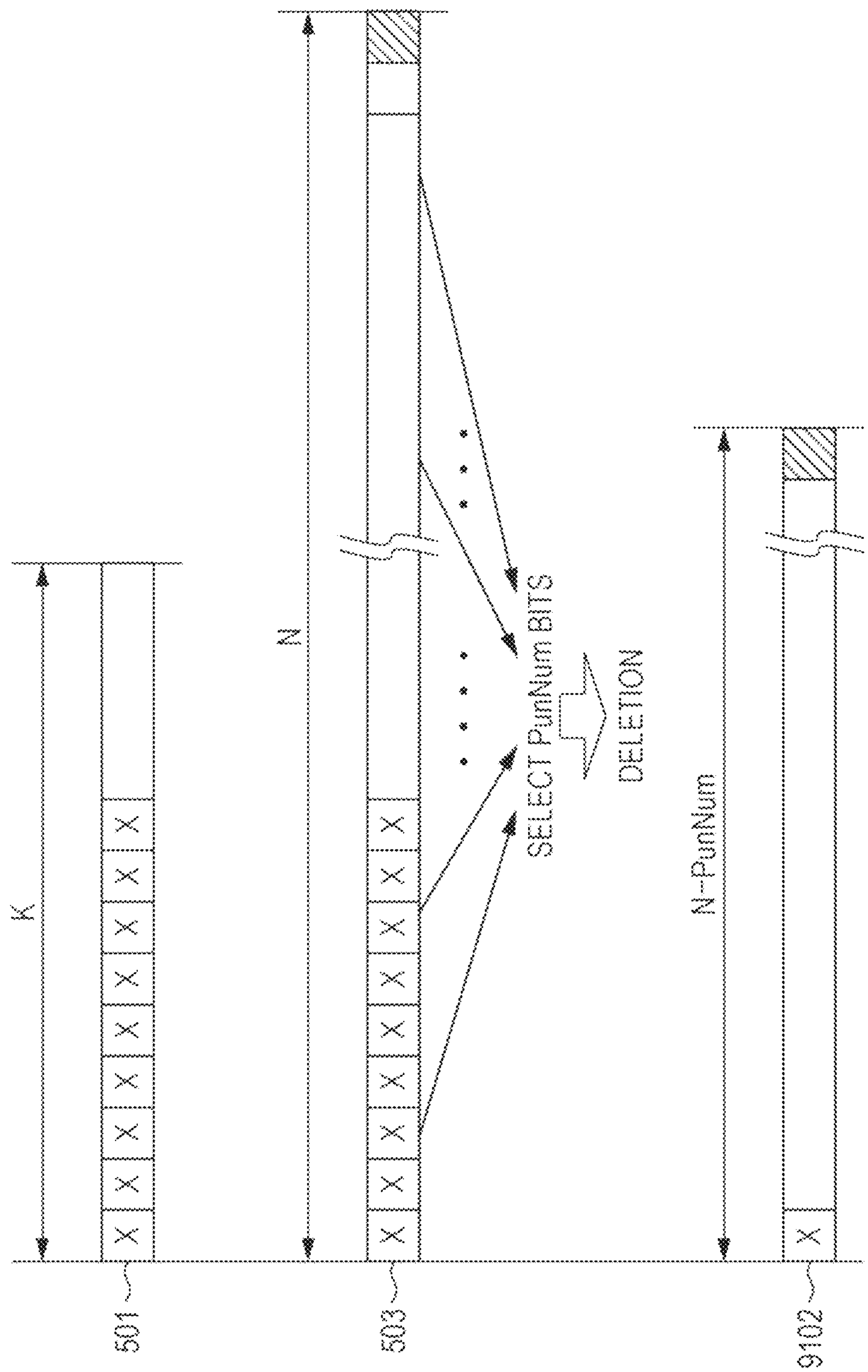
FIG. 92 is a view illustrating a bit length of each bit string.

FIG. 92 illustrates the bit length of each bit string, and a square indicates one bit. K-bit information 501 of the ith block in FIG. 91 is similar to that in FIG. 92.

N-bit code word 503 of the ith block in FIG. 91 is similar to that in FIG. 92. PunNum bits are selected and deleted from N-bit code word 503 of the ith block to generate (N−PunNum)-bit data string 9102 (see FIG. 92).

Example 2

Figure 93:
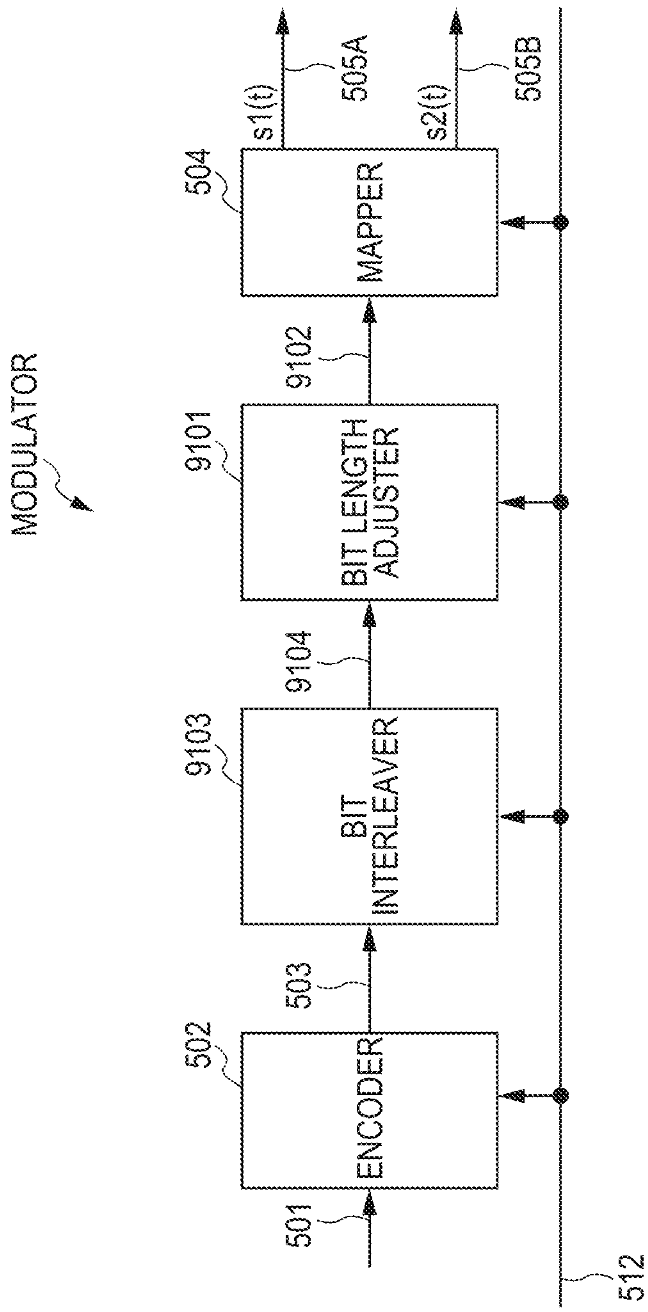
FIG. 93 is a configuration diagram illustrating a transmission-side modulator different from the modulator in FIG. 91.

FIG. 93 illustrates a configuration of a modulator different from that in FIG. 91 in the eighth exemplary embodiment. In FIG. 93, the component similar to that of the first to seventh exemplary embodiments is designated by the identical reference mark.

Control information 512 and K-bit information 501 of ith block are input to encoder 502, and encoder 502 performs the error correction coding such as the LDPC coding to output N-bit code word 503 of the ith block based on the pieces of information about the scheme, coding rate, and block length (code length) of the error correction code included in control information 512.

Control information 512 and N-bit code word 503 of the ith block are input to bit interleaver 9103, and bit interleaver 9103 rearranges the N-bit code word of the ith block based on the information about the interleaving method included in control information 512, and outputs interleaved N-bit code word 9104 of the ith block.

Control information 512 and interleaved N-bit code word 9104 of the ith block are input to bit length adjuster 9101, and bit length adjuster 9101 decides the number of bits PunNum deleted from interleaved N-bit code word 9104 based on the pieces of information about the modulation schemes of s1(t) and s2(t) included in control information 512 or the value of (X+Y), deletes the PunNum-bit data from interleaved N-bit code word 9104 of the ith block, and outputs (N− PunNum)-bit data string 9102. Similarly to the first to seventh exemplary embodiments, PunNum is decided such that (N− PunNum) is a multiple of the value of (X+Y) (sometimes PunNum becomes 0 (zero) depending on the value of (X+Y) (the set of the first and second modulation schemes of s1 (t) and s2(t)).

However, the value of (X+Y) is similar to that of the first to seventh exemplary embodiments.

Control information 512 and (N− PunNum)-bit data string 9102 are input to mapper 504, and mapper 504 performs the mapping from the modulation schemes of s1 (t) and s2(t) included in control information 512, and outputs first complex signal s1(t) (505A) and second complex signal s2(t) (505B).

Figure 94:
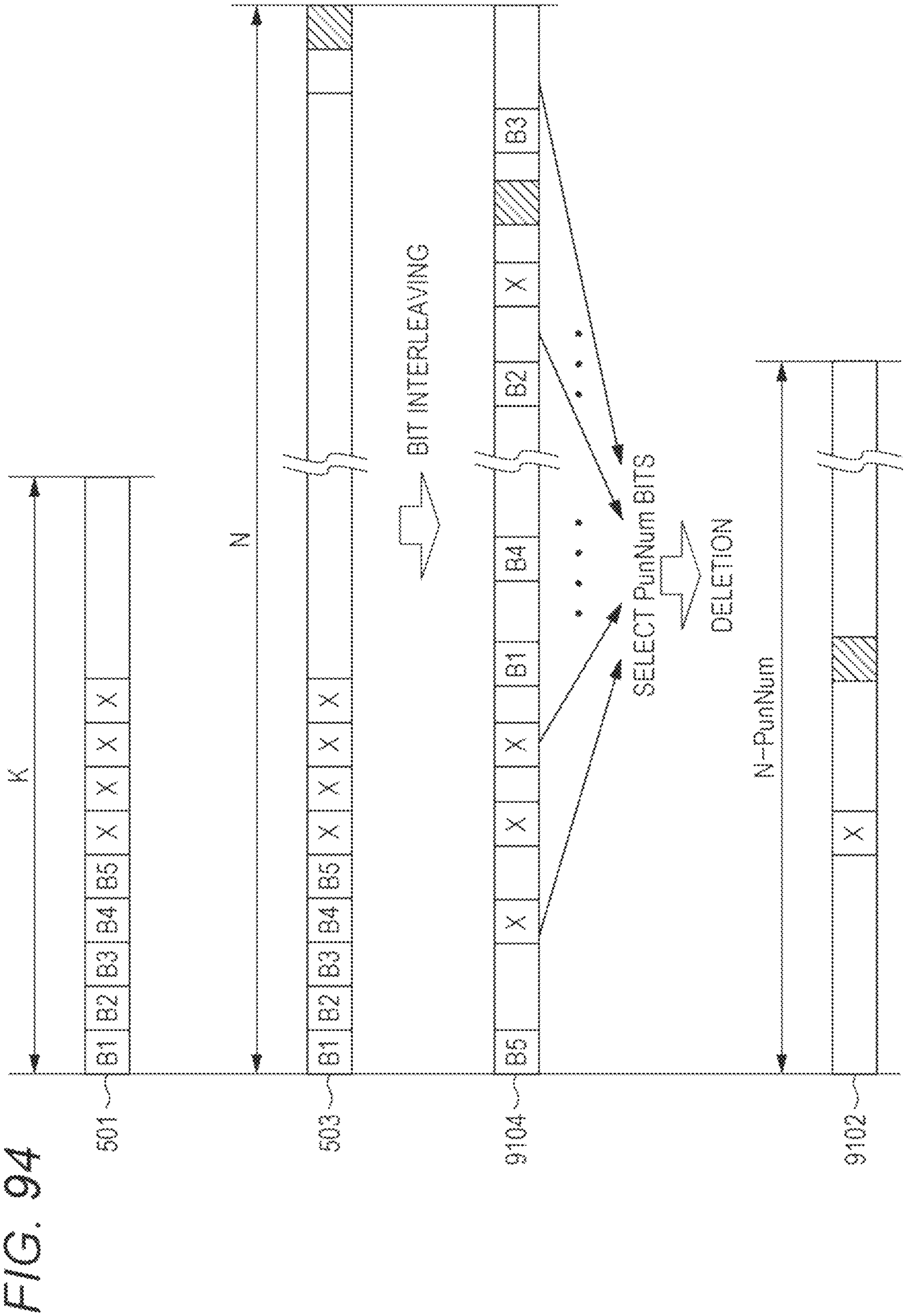
FIG. 94 is a view illustrating the bit length of each bit string.

FIG. 94 illustrates the bit length of each bit string, and a square indicates one bit. K-bit information 501 of the ith block in FIG. 94 is similar to that in FIG. 93.

N-bit code word 503 of the ith block in FIG. 93 is similar to that in FIG. 94. Then, as illustrated in FIG. 94, the bit interleaving, namely, the bit rearrangement is performed on N-bit code word 503 of the ith block to generate interleaved N-bit code word 9104 of the ith block.

PunNum bits are selected and deleted from interleaved N-bit code word 9104 of the ith block to generate (N−PunNum)-bit data string 9102 (see FIG. 94).

Effect

As described above, PunNum is decided such that (N−PunNum) is the multiple of the value of (X+Y) in (N−PunNum)-bit data string 9102 output from bit length adjuster 9101.

Therefore, when the encoder outputs the code word of the error correction code having the N-bit code word length (block length (code length)), because (N− PunNum) is the multiple of the value of (X+Y) irrespective of the value of N with respect to a set of complex signals based on any combination of the modulation schemes, the number of bits (X+Y) that can be transmitted at the identical frequency and the identical time using first and second complex signals s1 and s2 does not include the data of the plurality of blocks (of the error correction code). Therefore, there is a high possibility of reducing the memory of the transmitter and/or receiver.

In the case that the value of (X+Y), namely, the set of the first modulation schemes of s1(t) and the second modulation scheme of s2(t) is switched (or in the case that the setting of the set of the first modulation schemes of s1(t) and the second modulation scheme of s2(t) can be changed), bit length adjuster 9101 is disposed at the stage subsequent to bit interleaver 9103 as illustrated in FIG. 93, which allows the memory size of the bit interleaver to be kept constant irrespective of the set of the first modulation schemes of s1(t) and the second modulation scheme of s2(t). Therefore, the increase in memory size of the bit interleaver can be prevented. (When the order of bit length adjuster 9101 and bit interleaver 9103 becomes reversed, it is necessary to change the memory size due to the set of the first modulation schemes of s1(t) and the second modulation scheme of s2(t). For this reason, it is necessary to dispose bit length adjuster 9101 at the stage subsequent to bit interleaver 9103. In FIG. 93, bit length adjuster 9101 is disposed just behind bit interleaver 9103. Alternatively, an interleaver that performs another piece of interleaving or another processor may be inserted between bit interleaver 9103 and bit length adjuster 9101.

A plurality of code word lengths (block lengths (code lengths)) of the error correction code may be prepared. For example, it is assumed that Na bits and Nb bits are prepared as the code word length (block length (code length)) of the error correction code. When the error correction code of the Na-bit code word length (block length (code length)) is used, the memory size of the bit interleaver is set to the Na bits, the bit interleaving is performed, and bit length adjuster 9101 in FIG. 93 deletes the necessary number of bits as needed. Similarly, when the error correction code of the Nb-bit code word length (block length (code length)) is used, the memory size of the bit interleaver is set to the Nb bits, the bit interleaving is performed, and bit length adjuster 9101 in FIG. 93 deletes the necessary number of bits as needed.

Example 3

FIG. 93 illustrates a configuration of a modulator different from that in FIG. 91 in the eighth exemplary embodiment. In FIG. 93, the component similar to that of the first to seventh exemplary embodiments is designated by the identical reference mark.

Control information 512 and K-bit information 501 of ith block are input to encoder 502, and encoder 502 performs the error correction coding such as the LDPC coding to output N-bit code word 503 of the ith block based on the pieces of information about the scheme, coding rate, and block length (code length) of the error correction code included in control information 512.

Control information 512 and z N-bit code words, namely, (N×z) bits (z is an integer of 1 or more) are input to bit interleaver 9103, and bit interleaver 9103 rearranges the (N×z) bits based on the information about the interleaving method included in control information 512, and outputs interleaved N-bit code word 9104.

Control information 512 and interleaved N-bit code word 9104 are input to bit length adjuster 9101, and bit length adjuster 9101 decides the number of bits PunNum deleted from interleaved bit string 9104 based on the pieces of information about the modulation schemes of s1(t) and s2(t) included in control information 512 or the value of (X+Y), deletes the PunNum-bit data from interleaved bit string 9104, and outputs (N×z −PunNum)-bit data string 9102.

Similarly to the first to seventh exemplary embodiments, PunNum is decided such that (N×z−PunNum) is a multiple of the value of (X+Y) (sometimes PunNum becomes 0 (zero) depending on the value of (X+Y) (the set of the first and second modulation schemes of s1 (t) and s2(t)).

However, the value of (X+Y) is similar to that of the first to seventh exemplary embodiments.

Control information 512 and (N×z−PunNum)-bit data string 9102 are input to mapper 504, and mapper 504 performs the mapping from the modulation schemes of s1(t) and s2(t) included in control information 512, and outputs first complex signal s1(t) (505A) and second complex signal s2(t) (505B).

Figure 95:
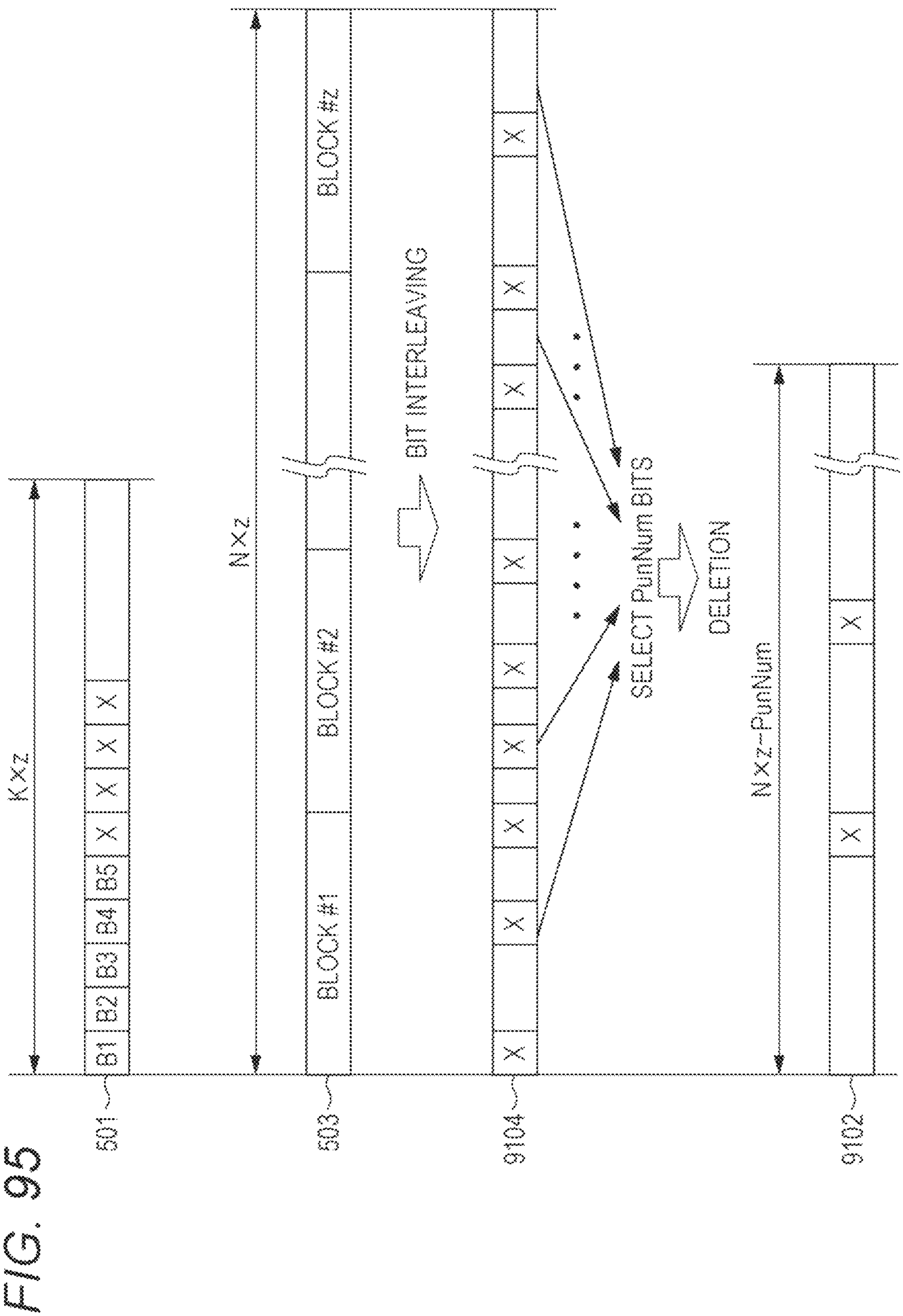
FIG. 95 is a view illustrating the bit length of each bit string.

FIG. 95 illustrates the bit length of each bit string, and a square indicates one bit. In FIG. 95, reference mark 501 designates z bundles of the pieces of K-bit information.

Z N-bit code words 503 in FIG. 95 is similar to that in FIG. 94. Then, as illustrated in FIG. 95, the bit interleaving, namely, the bit rearrangement is performed on z N-bit code words 503 to generate interleaved (N×z)-bit bit string 9104.

PunNum bits are selected and deleted from interleaved (N×z)-bit bit string 9104 to generate (N×z−PunNum)-bit data string 9102 (see FIG. 95).

Effect

As described above, PunNum is decided such that (N×z−PunNum) is the multiple of the value of (X+Y) in (N×z−PunNum)-bit data string 9102 output from bit length adjuster 9101.

Therefore, when the encoder outputs the code word of the error correction code having the N-bit code word length (block length (code length)), because (N− PunNum) is the multiple of the value of (X+Y) irrespective of the value of N with respect to a set of complex signals based on any combination of the modulation schemes, the number of bits (X+Y) that can be transmitted at the identical frequency and the identical time using first and second complex signals s1 and s2 does not include the data of the blocks except for the z code words. Therefore, there is a high possibility of reducing the memory of the transmitter and/or receiver.

In the case that the value of (X+Y), namely, the set of the first modulation schemes of s1(t) and the second modulation scheme of s2(t) is switched (or in the case that the setting of the set of the first modulation schemes of s1(t) and the second modulation scheme of s2(t) can be changed), bit length adjuster 9101 is disposed at the stage subsequent to bit interleaver 9103 as illustrated in FIG. 93, which allows the memory size of the bit interleaver to be kept constant irrespective of the set of the first modulation schemes of s1(t) and the second modulation scheme of s2(t). Therefore, the increase in memory size of the bit interleaver can be prevented. (When the order of bit length adjuster 9101 and bit interleaver 9103 becomes reversed, it is necessary to change the memory size due to the set of the first modulation schemes of s1(t) and the second modulation scheme of s2(t). For this reason, it is necessary to dispose bit length adjuster 9101 at the stage subsequent to bit interleaver 9103. In FIG. 93, bit length adjuster 9101 is disposed just behind bit interleaver 9103. Alternatively, an interleaver that performs another piece of interleaving or another processor may be inserted between bit interleaver 9103 and bit length adjuster 9101.

A plurality of code word lengths (block lengths (code lengths)) of the error correction code may be prepared. For example, it is assumed that Na bits and Nb bits are prepared as the code word length (block length (code length)) of the error correction code. When the error correction code of the Na-bit code word length (block length (code length)) is used, the memory size of the bit interleaver is set to the Na bits, the bit interleaving is performed, and bit length adjuster 9101 in FIG. 93 deletes the necessary number of bits as needed. Similarly, when the error correction code of the Nb-bit code word length (block length (code length)) is used, the memory size of the bit interleaver is set to the Nb bits, the bit interleaving is performed, and bit length adjuster 9101 in FIG. 93 deletes the necessary number of bits as needed.

A plurality of bit interleaving sizes may be prepared with respect to the code length (block length (code length)) of each error correction code. For example, when the error correction code has the N-bit code word length, (N×a) bits and (N×b) bits are prepared as the bit interleaving size (a and b are an integer of 1 or more). When the (N×a) bits are used as the bit interleaving size, the bit interleaving is performed, and bit length adjuster 9101 in FIG. 93 deletes the necessary number of bits as needed. Similarly, when the (N× b) bits are used as the bit interleaving size, the bit interleaving is performed, and bit length adjuster 9101 in FIG. 93 deletes the necessary number of bits as needed.

Ninth Exemplary Embodiment

An action of the receiver that receives the modulated signal transmitted by the transmission method of the eighth exemplary embodiment, particularly the bit string decoder will be described in a ninth exemplary embodiment.

That is, modulation (detection) processing is performed on complex signals s1(t) and s2(t), which are generated from (information) bit string 501 by "the section that generates the modulated signal" (modulator) of the eighth exemplary embodiment and transmitted after the pieces of processing such as the MIMO pre-coding, and the bit string is restored from complex signals (x1(t) and x2(t)).

Complex signals x1(t) and x2(t) are a complex baseband signal obtained from the received signal received each receiving antenna.

Figure 96:
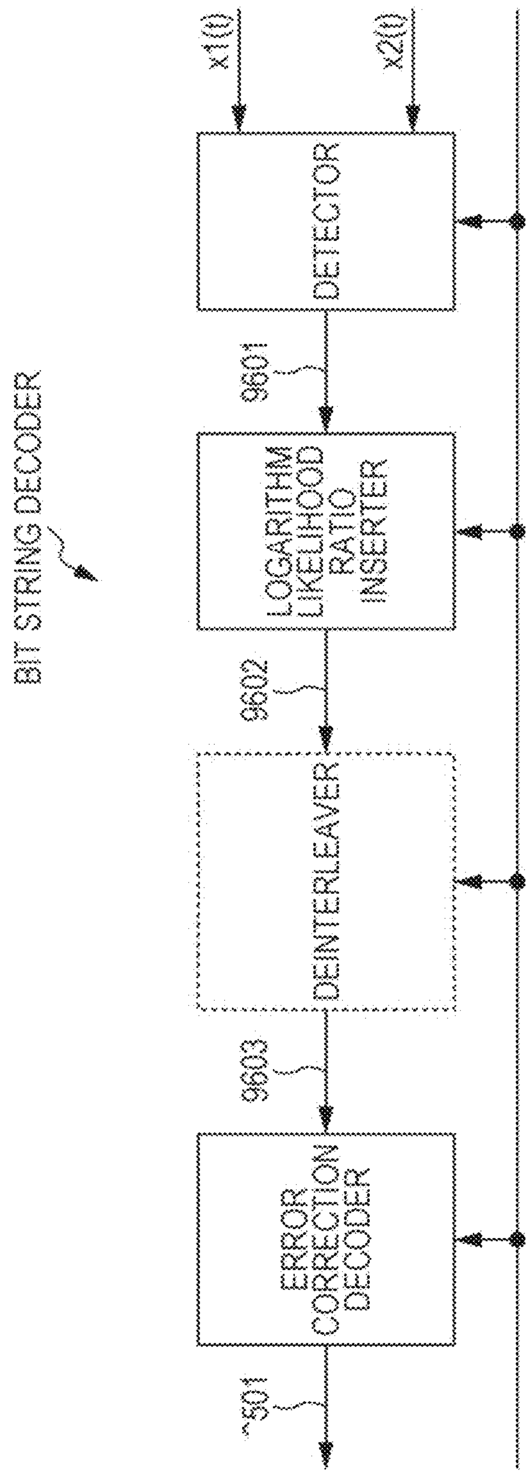
FIG. 96 is a view illustrating an example of the bit string decoder of the receiver.

FIG. 96 illustrates a bit string decoder of the receiver that receives the modulated signal transmitted by the transmission methods of the eighth exemplary embodiment.

In FIG. 85, "^" (caret) indicates an estimation result of the signal having the reference mark under the caret, hereinafter, the caret is omitted by adding "^" to the reference mark.

The bit string decoder in FIG. 96 includes a detector (demodulator), a bit length adjuster, and an error correction decoder.

The detector (demodulator) in FIG. 96 generates pieces of data, such as the hard decision value, the soft decision value, the log-likelihood and the log-likelihood ratio, which correspond to the bit of the number of bits (X+Y) of the number of first bits included in first complex signal s1 and the number of second bits included in second complex signal s2, from complex baseband signals x1(t) and x2(t) obtained from the received signals received with the receiving antennas, and outputs data string 9601 corresponding to the (N−PunNum)-bit data string or (N×z−PunNum)-bit data string 9102, which is of the length of the integral multiple of (X+Y).

Data string 9601 corresponding to the (N− PunNum)-bit data string or (N×z −PunNum)-bit data string 9102 is input to the log-likelihood ratio inserter in FIG. 96, and the log-likelihood ratio inserter inserts the log-likelihood ratio of each of the PunNum bits deleted on the transmission side, namely, the PunNum log-likelihood ratios in data string 9601 corresponding to the (N− PunNum)-bit data string or (N×z−PunNum)-bit data string 9102, and outputs N or (N×z) log-likelihood ratio series 9602.

N or (N×z) log-likelihood ratio series 9602 are input to the deinterleaver in FIG. 96, and the deinterleaver performs the deinterleaving to output N or (N×z) deinterleaved log-likelihood ratio series 9603.

N or (N×z) deinterleaved log-likelihood ratio series 9603 is input to the error correction decoder in FIG. 96, and the error correction decoder performs the error correction decoding (for example, BP (Belief Propagation) decoding (such as sum-product decoding, min-sum decoding, Normalized BP decoding and offset BP decoding) or Bit Flipping decoding for the use of the LDPC code) to obtain the K-bit or (K×z)-bit information bit estimation series.

In the case that the bit interleaver is used on the transmission side, the deinterleaver is inserted as illustrated in FIG. 96. On the other hand, in the case that the bit interleaver is used on the transmission side, the necessity of the deinterleaver in FIG. 96 is eliminated.

Effect of Ninth Exemplary Embodiment

The action of the receiver in transmitting the modulated signal by the transmission methods of the eighth exemplary embodiment is described with reference to FIG. 96.

In the receiver, the action of the receiver is changed to perform the error correction coding based on the pieces of information corresponding to the modulation schemes of s1 (t) and s2(t) that are used in the transmitter, so that there is a high possibility of being able to obtain the high data reception quality.

When the encoder outputs the code word of the error correction code having the N-bit code word length (block length (code length)), the number of bits (X+Y) that can be transmitted at the identical frequency and the identical time using first and second complex signals s1 and s2 does not include the data of the plurality of blocks (of the error correction code) irrespective of the value of N with respect to a set of complex signals based on any combination of the modulation schemes, and therefore the error correction decoder properly performs the demodulation and the decoding to enhance a possibility of being able to reduce the memory of the receiver.

Tenth Exemplary Embodiment

The bit length adjusting method widely applied to the precoding method is described above. A bit length adjusting method using a transmission method in which the phase change is regularly performed after the precoding will be described in a tenth exemplary embodiment.

Figure 97:
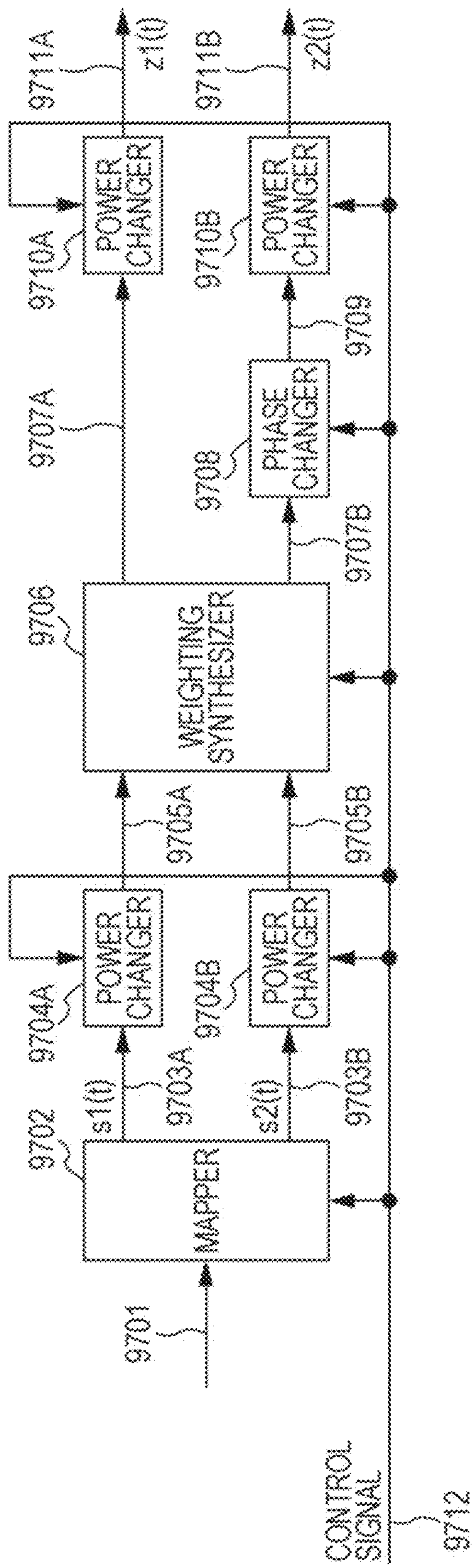
FIG. 97 is a view illustrating a section that performs precoding-associated processing.

FIG. 97 is a view illustrating a section that performs precoding-associated processing in the transmitter of the tenth exemplary embodiment.

Referring to FIG. 97, bit series 9701 and control signal 9712 are input to mapper 9702. It is assumed that control signal 9712 assigns the transmission of the two streams as a transmission scheme. Additionally, it is assumed that control signal 9712 assigns modulation scheme α and modulation scheme β as respective modulation schemes of the two streams. It is assumed that modulation scheme α is a modulation scheme for modulating x-bit data, and that modulation scheme β is a modulation scheme for modulating y-bit data (for example, a modulation scheme for modulating 4-bit data for 16QAM (16 Quadrature Amplitude Modulation), and a modulation scheme for modulating 6-bit data for 64QAM (64 Quadrature Amplitude Modulation)).

Mapper 9702 modulates the x-bit data in (x+y)-bit data using modulation scheme α to generate and output baseband signal $s_1(t)$ (9703A), and modulates the y-bit data using modulation scheme β to output baseband signal $s_2(t)$ (9703B). (One mapper is provided in FIG. 97. Alternatively, a mapper that generates baseband signal $s_1(t)$ and a mapper that generates baseband signal $s_2(t)$ may separately be provided. At this point, bit series 9701 is divided in the mapper that generates baseband signal $s_1(t)$ and the mapper that generates baseband signal $s_2(t)$.)

Each of $s_1(t)$ and $s_2(t)$ is represented as a complex number (however, may be one of a complex number and a real number), and t is time. For the transmission scheme in which multi-carrier such as OFDM (Orthogonal Frequency Division Multiplexing) is used, it can also be considered that $s_1$ and $s_2$ are a function of frequency f like $s_1(f)$ and $s_2(f)$ or that $s_1$ and $s_2$ are a function of time t and frequency f like $s_1(t,f)$ and $s_2(t,f)$.

Hereinafter, the baseband signal, a precoding matrix, a phase change, and the like are described as the function of time t. Alternatively, the baseband signal, the precoding matrix, the phase change, and the like may be considered to be the function of frequency f or the function of time t and frequency f.

Accordingly, sometimes the baseband signal, the precoding matrix, the phase change, and the like are described as a function of symbol number i. In this case, the baseband signal, the precoding matrix, the phase change, and the like may be considered to be the function of time t, the function of frequency f, or the function of time t and frequency f. That is, the symbol and the baseband signal may be generated and disposed in either a time-axis direction or a frequency-axis direction. The symbol and the baseband signal may be generated and disposed in the time-axis direction and the frequency-axis direction.

Baseband signal $s_1(t)$ (9703A) and control signal 9712 are input to power changer 9704A (power adjuster 9704A), and power changer 9704A (power adjuster 9704A) sets real number $P_1$ based on control signal 9712, and outputs ($P_1\times s_1(t)$) as power-changed signal 9705A ($P_1$ may be a complex number).

Similarly, baseband signal $s_2(t)$ (9703B) and control signal 9712 are input to power changer 9704B (power adjuster 9704B), and power changer 9704B (power adjuster 9704B) sets real number $P_2$, and outputs ($P_2\times s_2(t)$) as power-changed signal 9705B ($P_2$ may be a complex number).

Power-changed signal 9705A, power-changed signal 9705B, and control signal 9712 are input to weighting synthesizer 9706, and weighting synthesizer 9706 sets precoding matrix F (or F(i)) based on control signal 9712. Assuming that i is a slot number (symbol number), weighting synthesizer 9706 performs the following calculation.

[Mathematical formula 357]

$$\begin{pmatrix}u_1(i)\\u_2(i)\end{pmatrix}=F\begin{pmatrix}P_1\times s_1(i)\\P_2\times s_2(i)\end{pmatrix}=\begin{pmatrix}a&b\\c&d\end{pmatrix}\begin{pmatrix}P_1\times s_1(i)\\P_2\times s_2(i)\end{pmatrix}=\begin{pmatrix}a&b\\c&d\end{pmatrix}\begin{pmatrix}P_1&0\\0&P_2\end{pmatrix}\begin{pmatrix}s_1(i)\\s_2(i)\end{pmatrix}\tag{R10-1}$$

In the formula, each of a, b, c, and d is represented as a complex number (may be represented as a real number), and at least three of a, b, c, and d must not be 0 (zero), where each of a, b, c, and d is a coefficient that depends on the decision of the set of modulation schemes of $s_1(t)$ and $s_2(t)$.

Weighting synthesizer 9706 outputs $u_1(i)$ in equation (R10-1) as weighting-synthesized signal 9707A, and outputs $u_2(i)$ in equation (R10-1) as weighting-synthesized signal 9707B.

$u_2(i)$ (weighting-synthesized signal 9707B) in equation (R10-1) and control signal 9712 are input to phase changer 9708, and phase changer 9708 changes the phase of $u_2(i)$ (weighting-synthesized signal 9707B) in equation (R10-1) based on control signal 9712.

Accordingly, the signal in which the phase of $u_2(i)$ (weighting-synthesized signal 9707B) in equation (R10-1) is changed is represented as ($e^{j\theta(i)}\times u_2(i)$), and phase changer 9708 outputs ($e^{j\theta(i)}\times u_2(i)$) as phase-changed signal 9709 (j is an imaginary unit). The changed phase constitutes a characteristic portion that the changed phase is the function of i like θ(i).

Weighting-synthesized signal 9707A ($u_1(i)$) and control signal 9712 are input to power changer 9710A, and power changer 9710A sets real number $Q_1$ based on control signal 9712, and outputs ($Q_1$($Q_1$ is a real number)$\times u_1(t)$) as power-changed signal 9711A ($z_1(i)$) (alternatively, $Q_1$ is a complex number).

Similarly, phase-changed signal 9709 ($e^{j\theta(i)}\times u_2(i)$) and control signal 9712 are input to power changer 9710B, and power changer 9710B sets real number $Q_2$ based on control signal 9712, and outputs ($Q_2$ ($Q_2$ is a real number)$\times e^{j\theta(i)}\times u_2(t)$) as power-changed signal 9711B ($z_2(i)$) (alternatively, $Q_2$ is a complex number).

Accordingly, outputs $z_1(i)$ and $z_2(i)$ of power changers 9710A and 9710B in FIG. 97 are given by the following equation.

[Mathematical formula 358]

$$\begin{pmatrix}z_1(i)\\z_2(i)\end{pmatrix}=\begin{pmatrix}Q_1&0\\0&Q_2\end{pmatrix}\begin{pmatrix}1&0\\0&e^{j\theta(i)}\end{pmatrix}F\begin{pmatrix}P_1\times s_1(i)\\P_2\times s_2(i)\end{pmatrix}=\begin{pmatrix}Q_1&0\\0&Q_2\end{pmatrix}\begin{pmatrix}1&0\\0&e^{j\theta(i)}\end{pmatrix}\begin{pmatrix}a&b\\c&d\end{pmatrix}\begin{pmatrix}P_1\times s_1(i)\\P_2\times s_2(i)\end{pmatrix}=\begin{pmatrix}Q_1&0\\0&Q_2\end{pmatrix}\begin{pmatrix}1&0\\0&e^{j\theta(i)}\end{pmatrix}\begin{pmatrix}a&b\\c&d\end{pmatrix}\begin{pmatrix}P_1&0\\0&P_2\end{pmatrix}\begin{pmatrix}s_1(i)\\s_2(i)\end{pmatrix}\tag{R10-2}$$

Figure 98:
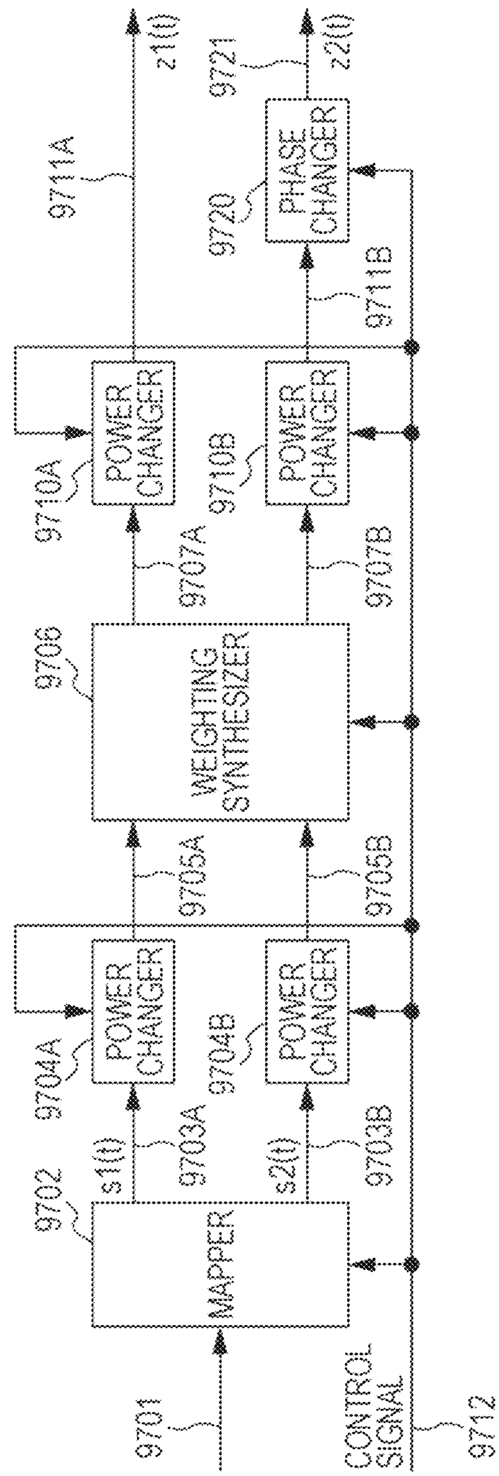
FIG. 98 is a view illustrating the section that performs the precoding-associated processing.

FIG. 98 illustrates a configuration different from that in FIG. 97 as a method for performing equation (R10-2). A difference between the configurations in FIGS. 97 and 98 is that the positions of the power changer and phase changer are exchanged (the function of changing the power and the function of changing the phase are not changed). At this point, $z_1(i)$ and $z_2(i)$ are given by the following equation.

[Mathematical formula 359]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 \times s_1(i) \\ P_2 \times s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a & b \\ c & d \end{pmatrix} \begin{pmatrix} P_1 \times s_1(i) \\ P_2 \times s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a & b \\ c & d \end{pmatrix} \begin{pmatrix} P_1 & 0 \\ 0 & P_2 \end{pmatrix} \begin{pmatrix} s_1(i) \\ s_2(i) \end{pmatrix} \quad \text{(R10-3)}$$

$z_1(i)$ in equation (R10-2) is equal to $z_1(i)$ in equation (R10-3), and $z_2(i)$ in equation (R10-2) is equal to $z_2(i)$ in equation (R10-3).

As to phase value $\theta(i)$ to be changed in equations (R10-2) and (R10-3), assuming that $\theta(i+1)-\theta(i)$ is set to a fixed value, there is a high possibility that the receiver obtains the good data reception quality in a radio wave propagation environment where a direct wave is dominant. However, a method for providing phase value $\theta(i)$ to be changed is not limited to the above example. A relationship between a way to give $\theta(i)$ and the operation of the bit length adjuster is described in detail later.

Figure 99:
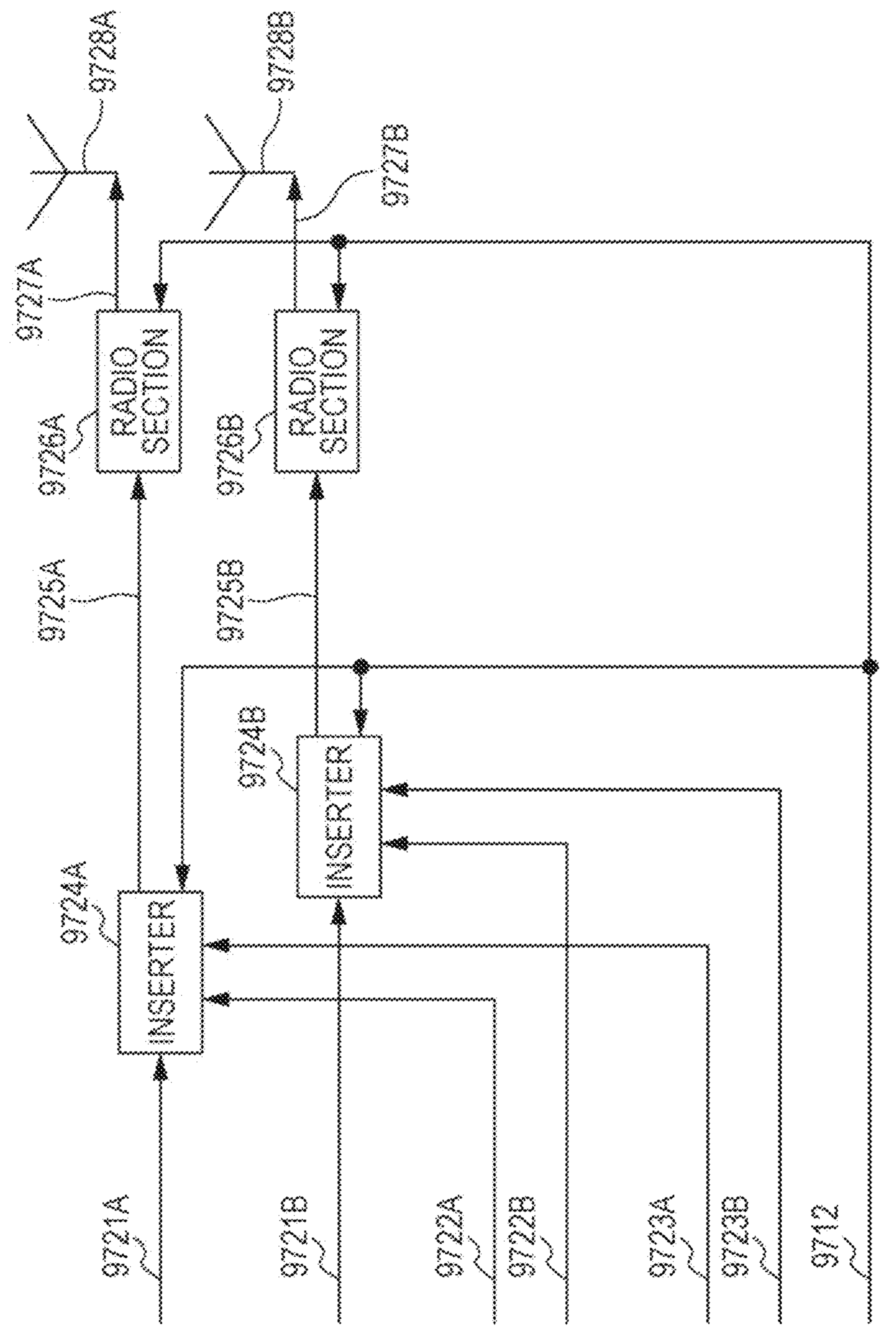
FIG. 99 is a view illustrating a configuration example of the signal processor.

FIG. 99 illustrates a configuration example of a signal processor that processes signals $z_1(i)$ and $z_2(i)$ obtained in FIGS. 97 to 98.

Signal $z_1(i)$ (9721A), pilot symbol 9722A, control information symbol 9723A, and control signal 9712 are input to inserter 9724A, and inserter 9724A inserts pilot symbol 9722A and control information symbol 9723A in signal (symbol) $z_1(i)$ (9721A) according to the frame configuration included in control signal 9712, and outputs modulated signal 209725A according to the frame configuration.

Pilot symbol 9722A and control information symbol 9723A are a symbol modulated using BPSK (Binary Phase Shift Keying), QPSK (Quadrature Phase Shift Keying), and the like (other modulation schemes may be used).

Modulated signal 9725A and control signal 9712 are input to radio section 9726A, and radio section 9726A performs the pieces of processing such as the frequency conversion and the amplification on modulated signal 9725A based on control signal 9712 (performs inverse Fourier transform when the OFDM scheme is used), and outputs transmitted signal 9727A as the radio wave from antenna 9728A.

Signal $z_2(i)$ (9721B), pilot symbol 9722B, control information symbol 9723B, and control signal 9712 are input to inserter 9724B, and inserter 9724B inserts pilot symbol 9722B and control information symbol 9723B in signal (symbol) $z_2(i)$ (9721B) according to the frame configuration included in control signal 9712, and outputs modulated signal 9725B according to the frame configuration.

Pilot symbol 9722B and control information symbol 9723B are a symbol modulated using BPSK (Binary Phase Shift Keying), QPSK (Quadrature Phase Shift Keying), and the like (other modulation schemes may be used).

Modulated signal 9725B and control signal 9712 are input to radio section 9726B, and radio section 9726B performs the pieces of processing such as the frequency conversion and the amplification on modulated signal 9725B based on control signal 9712 (performs the inverse Fourier transform when the OFDM scheme is used), and outputs transmitted signal 9727B as the radio wave from antenna 9728B.

Signals $z_1(i)$ (9721A) and $z_2(i)$ (9721B) having the identical number of i are transmitted from different antennas at the identical time and the identical (common) frequency (that is, the transmission method in which the MIMO scheme is used).

Pilot symbols 9722A and 9722B are a symbol that is used when the receiver performs the signal detection, the estimation of the frequency offset, gain control, the channel estimation, and the like. Although the symbol is named the pilot symbol in this case, the symbol may be named other names such as a reference symbol.

Control information symbols 9723A and 9723B are a symbol that transmits the information about the modulation scheme used in the transmitter, the information about the transmission scheme, the information about the precoding scheme, the information about an error correction code scheme, the information about the coding rate of an error correction code, and the information about a block length (code length) of the error correction code to the receiver. The control information symbol may be transmitted using only one of control information symbols 9723A and 9723B.

Figure 100:
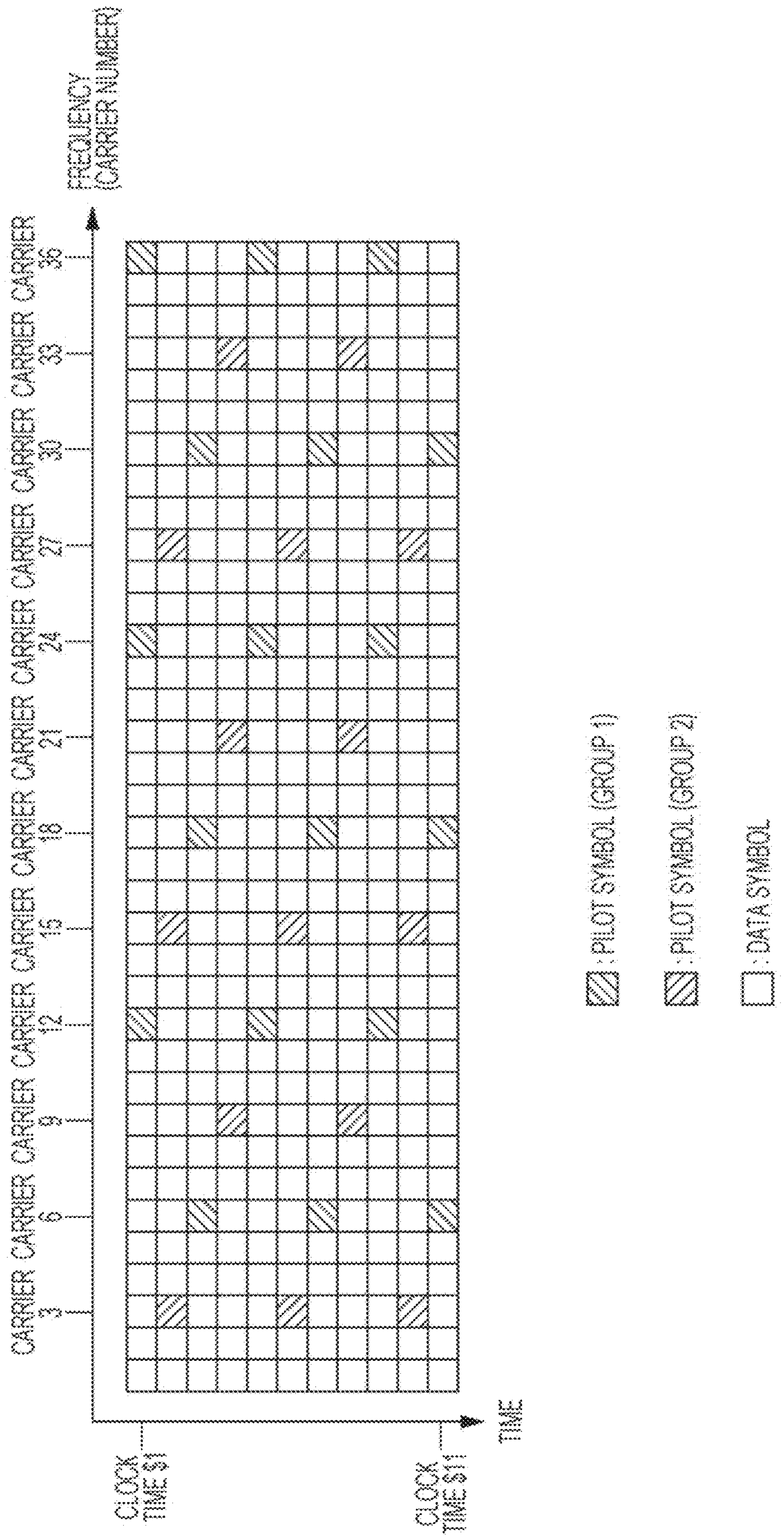
FIG. 100 is a view illustrating an example of a frame configuration at time-frequency when two streams are transmitted.

FIG. 100 illustrates an example of the frame configuration at time-frequency when the two streams are transmitted. In FIG. 100, a horizontal axis indicates a frequency, a vertical axis indicates time. FIG. 9 illustrates a configuration of the symbol from carriers 1 to 38 from clock time \$1 to clock time \$11.

FIG. 100 simultaneously illustrates the frame configuration of the transmitted signal transmitted from antenna 9728A in FIG. 99 and the frame of the transmitted signal transmitted from antenna 9728B in FIG. 99.

In FIG. 100, a data symbol corresponds to signal (symbol) $z_1(i)$ for the frame of the transmitted signal transmitted from antenna 9728A in FIG. 99. The pilot symbol corresponds to pilot symbol 9722A.

In FIG. 100, the data symbol corresponds to signal (symbol) $z_2(i)$ for the frame of the transmitted signal transmitted from antenna 9728B in FIG. 99. The pilot symbol corresponds to pilot symbol 9722B.

Accordingly, as described above, signals $z_1(i)$ (9721A) and $z_2(i)$ (9721B) having the identical number of i are transmitted from different antennas at the identical time and the identical (common) frequency. The configuration of the pilot symbol is not limited to that in FIG. 100. For example, a time interval and a frequency interval of the pilot symbol are not limited to those in FIG. 100. In FIG. 100, the pilot symbols are transmitted at the identical clock time and the identical frequency (identical (sub-) carrier) from antennas 9728A and 9728B in FIG. 99. Alternatively, for example, the pilot symbol may be disposed in not antenna 9728B in FIG. 99 but antenna 9728A in FIG. 99 at time A and frequency a ((sub-) carrier a), and the pilot symbol may be disposed in not antenna 9728A in FIG. 99 but antenna 9728B in FIG. 99 at time B and frequency b ((sub-) carrier b).

Although only the data symbol and the pilot symbol are illustrated in FIG. 99, other symbols such as a control information symbol may be included in the frame.

Although the case that a part (or whole) of the power changer exists is described with reference to FIGS. 97 and 98, it is also considered that a part of the power changer is missing.

In the case that power changer 9704A (power adjuster 9704A) and power changer 9704B (power adjuster 9704B) do not exist in FIG. 97 or 98, $z_1(i)$ and $z_2(i)$ are given as follows.

[Mathematical formula 360]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a & b \\ c & d \end{pmatrix} \begin{pmatrix} s_1(i) \\ s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a & b \\ c & d \end{pmatrix} \begin{pmatrix} s_1(i) \\ s_2(i) \end{pmatrix} \quad \text{(R10-4)}$$

In the case that power changer 9710A (power adjuster 9710A) and power changer 9710B (power adjuster 9710B) do not exist in FIG. 97 or 98, $z_1(i)$ and $z_2(i)$ are given as follows.

[Mathematical formula 361]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a & b \\ c & d \end{pmatrix} \begin{pmatrix} P_1 & 0 \\ 0 & P_2 \end{pmatrix} \begin{pmatrix} s_1(i) \\ s_2(i) \end{pmatrix} \quad \text{(R10-5)}$$

In the case that power changer 9704A (power adjuster 9704A), power changer 9704B (power adjuster 9704B), power changer 9710A (power adjuster 9710A), and power changer 9710B (power adjuster 9710B) do not exist in FIG. 97 or 98, $z_1(i)$ and $z_2(i)$ are given as follows.

[Mathematical formula 362]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a & b \\ c & d \end{pmatrix} \begin{pmatrix} s_1(i) \\ s_2(i) \end{pmatrix} \quad \text{(R10-6)}$$

The relationship between the way to give θ(i) and the operation of the bit length adjuster in the precoding-associated processing will be described below.

In the tenth exemplary embodiment, for example, "radian" is used in a phase unit such as an argument on a complex plane.

The use of the complex plane can display a polar coordinate of the complex number in terms of a polar form. Assuming that point (a, b) on the complex plane is represented as [r,θ] in terms of the polar coordinate when complex number z=a+jb (a and b are a real number and j is an imaginary unit) corresponds to point (a, b), the following equation holds:

$$a = r \times \cos\theta$$

$$b = r \times \sin\theta$$

[Mathematical Formula 363]

$$r = \sqrt{a^2 + b^2} \quad \text{(R10-7)}$$

where r is an absolute value of z (r=|z|) and θ is an argument, and z=a+jb is represented as $r \times e^{j\theta}$.

Baseband signals s1, s2, z1, and z2 are a complex signal, and the complex signal is represented as I+jQ (j is an imaginary unit) when I is the in-phase signal while Q is the quadrature signal. At this point, I may be zero, and Q may be zero.

First, an example of the way to give θ(i) in the precoding-associated processing will be described.

In the tenth exemplary embodiment, it is assumed that θ(i) is regularly changed by way of example. Specifically, it is assumed that θ(i) is periodically changed. It is assumed that z is a change period of θ(i) (z is an integer of 2 or more). When change period z of θ(i) is set to 9, θ(i) is changed as follows.

Change period (z=9) of θ(i) can be formed as follows.

For slot number (symbol number) i=9×k+0, θ(i=9×k+0)=0 radian

For slot number (symbol number) i=9×k+1, θ(i=9×k+1)=(2×1×π)/9 radian

For slot number (symbol number) i=9×k+2, θ(i=9×k+2)=(2×2×π)/9 radian

For slot number (symbol number) i=9×k+3, θ(i=9×k+3)=(2×3×π)/9 radian

For slot number (symbol number) i=9×k+4, θ(i=9×k+4)=(2×4×π)/9 radian

For slot number (symbol number) i=9×k+5, θ(i=9×k+5)=(2×5×π)/9 radian

For slot number (symbol number) i=9×k+6, θ(i=9×k+6)=(2×6×π)/9 radian

For slot number (symbol number) i=9×k+7, θ(i=9×k+7)=(2×7×π)/9 radian

For slot number (symbol number) i=9×k+8, θ(i=9×k+8)=(2×8×π)/9 radian (k is an integer)

The method for forming change period (z=9) of θ(i) is not limited to the above method. Alternatively, nine phases $\lambda_0$, $\lambda_1$, $\lambda_2$, $\lambda_3$, $\lambda_4$, $\lambda_5$, $\lambda_6$, $\lambda_7$, and $\lambda_8$ are prepared, and change period (z=9) of θ(i) may be formed as follows.

For slot number (symbol number) i=9×k+0, θ(i=9×k+0)=$\lambda_0$ radian

For slot number (symbol number) i=9×k+1, θ(i=9×k+1)=$\lambda_1$ radian

For slot number (symbol number) i=9×k+2, θ(i=9×k+2)=$\lambda_2$ radian

For slot number (symbol number) i=9×k+3, θ(i=9×k+3)=$\lambda_3$ radian

For slot number (symbol number) i=9×k+4, θ(i=9×k+4)=$\lambda_4$ radian

For slot number (symbol number) i=9×k+5, θ(i=9×k+5)=$\lambda_5$ radian

For slot number (symbol number) i=9×k+6, θ(i=9×k+6)=$\lambda_6$ radian

For slot number (symbol number) i=9×k+7, θ(i=9×k+7)=$\lambda_7$ radian

For slot number (symbol number) i=9×k+8, θ(i=9×k+8)=$\lambda_8$ radian (k is an integer, and $0 \le \lambda_v < 2\pi$ (V is an integer from 0 to 8))

There are two methods as the method for accomplishing period z=9.

(1) Assuming that x is an integer from 0 to 8 and that y is an integer from 0 to 8 and satisfies y≠x, $\lambda_x \neq \lambda_y$ holds in all values x and all values y satisfying the assumptions.

(2) Assuming that x is an integer from 0 to 8 and that y is an integer from 0 to 8 and satisfies y≠x, x and y satisfying $\lambda_x = \lambda_y$ exist, and x and y form the period of 9.

Generally, in a method for forming change period z (z is an integer of 2 or more) of θ(i), z phases and $\lambda_v$ (v is an integer from 0 to (z−1)) are prepared, and change period z (z is an integer of 2 or more) of θ(i) can be formed such that slot number (symbol number) i is obtained as follows.

for i=z×k+v, θ(i=z×k+v)=$\lambda_v$ radian (k is an integer, and $0 \le \lambda_v < 2\pi$ holds.)

There are two methods as the method for accomplishing period z.

(1) Assuming that x is an integer from 0 to (z−1) and that y is an integer from 0 to (z−1) and satisfies y≠x, $\lambda_x \neq \lambda_y$ holds in all values x and all values y satisfying the assumptions.

(2) Assuming that x is an integer from 0 to (z−1) and that y is an integer from 0 to (z−1) and satisfies y≠x, x and y satisfying $\lambda_x=\lambda_y$ exist, and x and y form period z.

The pieces of processing before mapper 9702 in FIGS. 97 and 98 are similar to those of the first to ninth exemplary embodiments. A necessary point of the tenth exemplary embodiment will be described in detail below.

Modification of First Exemplary Embodiment

In the first exemplary embodiment, the configuration of the modulator that performs the pieces of processing before mapper 9702 in FIGS. 97 and 98 is similar to that in FIG. 57. One of the characteristics of the first exemplary embodiment is that "In order that the number of bits (X+Y) that can be transmitted by first and second complex signals s1 and s2 transmitted at the identical frequency and the identical time does not include the data of the plurality of blocks (of the error correction code) with respect to the set of the complex signals based on any combination of the modulation schemes used in mapper 504 irrespective of the value of N when encoder 502 in FIG. 57 outputs the code word having code word length (block length (code length)) N of the error correction code, first bit string 503 is input to bit length adjuster 5701, the adjustment bit string is added to the front end, the rear end, the predetermined position, and the like of the code word of the error correction code having the code word length (block length (code length)) N, and the second bit string for the mapper is output such that the number of constituting bits is the multiple of the number of bits (X+Y)".

The value of (X+Y) is similar to that of the first to third exemplary embodiments.

In a modulation of the first exemplary embodiment in the tenth exemplary embodiment, the number of bits of the adjustment bit string is decided in consideration of change period z of θ(i). The description will specifically be made below.

A more specific example will be described for convenience.

The error correction code used is set to the code length (block length) of 64800 bits, and change period z of θ(i) is set to 9. QPSK, 16QAM, 64QAM, and 256QAM can be used as the modulation scheme. Accordingly, sets of (QPSK, QPSK), (QPSK,16QAM), (QPSK,64QAM), (QPSK, 256QAM), (16QAM,16QAM), (16QAM,64QAM), (16QAM,256QAM), (64QAM,256QAM), and (256QAM, 256QAM) can be considered as (modulation scheme of $s_1(t)$ (first complex signal s1), modulation scheme of $s_2(t)$ (second complex signal s2)), and some examples will be picked up and described below.

In the tenth exemplary embodiment, similarly to other exemplary embodiments, it is assumed that both the modulation scheme of first complex signal $s_1$ ($s_1(t)$) and the modulation scheme of the second complex signal s2 ($s_2(t)$) can be switched from the plurality of modulation schemes.

The following definitions are given for convenience.

α is an integer of 0 or more, and β is an integer of 0 or more. A least common multiple of α and β is expressed by LCM(α,β). For example, assuming that α is set to 8 and that β is set to 6, LCM(α,β) is 24.

One of the characteristics of the modulation of the first exemplary embodiment in the tenth exemplary embodiment is that, assuming that γ=LCM(X+Y,z) is given for the sum of the value of (X+Y), change period z of θ(i), the number of bits (N) of the code length, and the number of bits of the adjustment bit string, a sum of the number of bits (N) of the code length and the number of bits of the adjustment bit string is a multiple of γ. That is, the sum of the number of bits (N) of the code length and the number of bits of the adjustment bit string is the multiple of the least common multiple of (X+Y) and z, where X is an integer of 1 or more, Y is an integer of 1 or more, and z is an integer of 2 or more. Accordingly, (X+Y) is an integer of 2 or more. Although it is ideal that the number of bits of the adjustment bit string is 0, and sometimes the number of bits of the adjustment bit string cannot be set to 0. At this point, it is necessary to add the adjustment bit string.

This point will be described below with an example.

Example 1

It is assumed that (modulation scheme of $s_1(t)$ (first complex signal s1), modulation scheme of $s_2(t)$ (second complex signal s2)) is (16QAM,16QAM), that the error correction code (for example, the block code of the LDPC code) has the code word length (block length (code length)) of 64800 bits, and that change period z of θ(i) is set to 9. Therefore, γ=LCM(X+Y,z)=(8,9)=72 is obtained. Accordingly, the number of bits of the adjustment bit string necessary to satisfy the above characteristic is (72×n) bits (n is an integer of 0 or more).

Figure 101A:
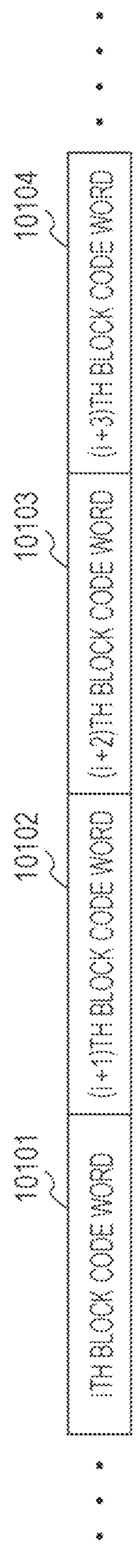
FIG. 101A is a view illustrating a state of output first bit string 503.

FIG. 101A illustrates a state of first bit string 503 that is output from encoder 502 of the modulator in FIG. 57. In FIG. 101A, reference mark 10101 designates the ith-block code word in which the number of bits is 64800, reference mark 10102 designates the (i+1) th-block code word in which the number of bits is 64800, reference mark 10103 designates the (i+2)th-block code word in which the number of bits is 64800, reference mark 10104 designates the (i+3)th-block code word in which the number of bits is 64800, and the (i+4)th-block code word, the (i+5)th-block code word, and . . . are arranged.

Figure 101B:
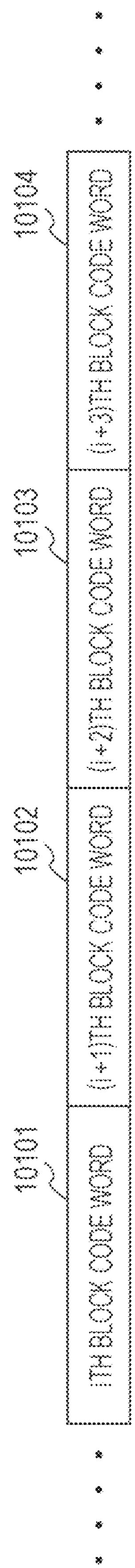
FIG. 101B is a view illustrating a state of output second bit string 5703.

As described above, the number of bits of the adjustment bit string necessary to satisfy the above characteristic is (72×n) bits (n is an integer of 0 or more). In this case, the number of bits of the adjustment bit string is set to 0 (zero). FIG. 101B illustrates a state of second bit string 5703 that is output from bit length adjuster 5701 of the modulator in FIG. 57. In FIG. 101B, similarly to the state of first bit string 503 output from encoder 502 of the modulator in FIG. 57, in second bit string 5703 output from bit length adjuster 5701 of the modulator in FIG. 57, reference mark 10101 designates the ith-block code word in which the number of bits is 64800, reference mark 10102 designates the (i+1)th-block code word in which the number of bits is 64800, reference mark 10103 designates the (i+2) th-block code word in which the number of bits is 64800, reference mark 10104 designates the (i+3)th-block code word in which the number of bits is 64800, and (i+4)th-block code word, (i+5)th-block code word, and . . . are arranged.

Example 2

It is assumed that (modulation scheme of $s_1(t)$ (first complex signal s1), modulation scheme of $s_2(t)$ (second complex signal s2)) is (64QAM,256QAM), that the error correction code (for example, the block code of the LDPC code) has the code word length (block length (code length)) of 64800 bits, and that change period z of θ(i) is set to 9. Therefore, γ=LCM(X+Y,z)=(14,9)=126 is obtained. Accordingly, the number of bits of the adjustment bit string necessary to satisfy the above characteristic is (126×n+90) bits (n is an integer of 0 or more).

Figure 102A:
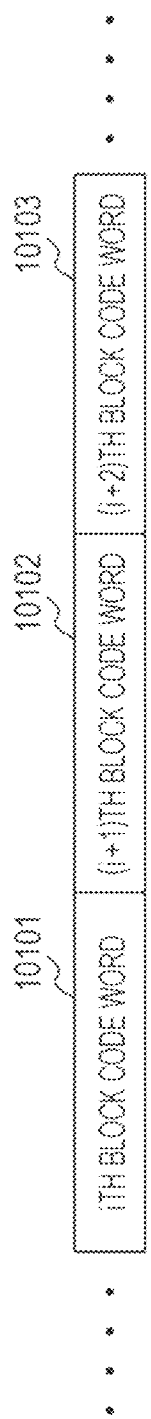
FIG. 102A is a view illustrating the state of output first bit string 503.

FIG. 102A illustrates the state of first bit string 503 that is output from encoder 502 of the modulator in FIG. 57. In FIG. 102A, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and the (i+4)th-block code word, the (i+5)th-block code word, and . . . are arranged.

Figure 102B:
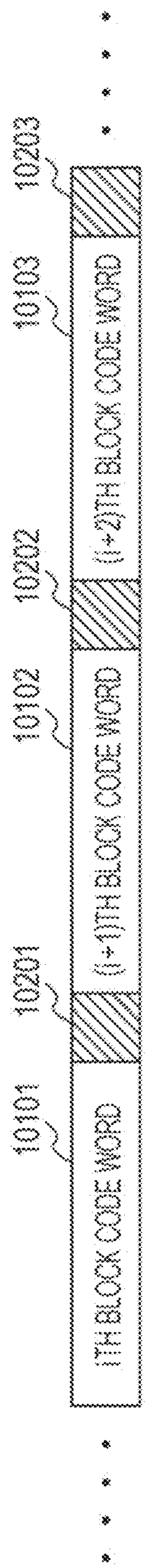
FIG. 102B is a view illustrating the state of output second bit string 5703.

As described above, the number of bits of the adjustment bit string necessary to satisfy the above characteristic is (126×n+90) bits (n is an integer of 0 or more). In this case, the number of bits of the adjustment bit string is set to 90. FIG. 102B illustrates the state of second bit string 5703 that is output from bit length adjuster 5701 of the modulator in FIG. 57.

In FIG. 102B, reference marks 10201, 10202, and 10203 designate the adjustment bit string. Adjustment bit string 10201 is used in ith-block code word 10101 in which the number of bits is 64800, and the number of bits of adjustment bit string 10201 is 90 bits. Accordingly, a total of the numbers of bits of ith-block code word 10101 and adjustment bit string 10201 is 64890 bits. Therefore, the effect of the first exemplary embodiment can be obtained. The sum of code word 10101 of the ith block having 64800 bits and the number of bits of adjustment bit string 10201 is the number of slots necessary for the transmission of 64890 bits (in this case, one slot means one formed by one symbol of s1 and one symbol of s2), and is an integral multiple of change period (z=9) of θ(i).

Therefore, in the slot having 64890 bits that is of the sum of code word 10101 in the ith block having 64800 bits and the number of bits of adjustment bit string 10201, the number of occurrences of nine values that can be taken by θ(i) are equal to one another, so that a possibility of obtaining the information included in code word 10101 of the ith block with high reception quality can be enhanced.

Similarly, adjustment bit string 10202 is used in code word 10102 in (i+1)-th-block having 64800 bits, and adjustment bit string 10202 has 90 bits. Accordingly, the total of the numbers of bits of (i+1)th-block code word 10102 and adjustment bit string 10202 is 64890 bits. Therefore, the effect of the first exemplary embodiment can be obtained. The sum of code word 10102 of the (i+1)th block having 64800 bits and the number of bits of adjustment bit string 10202 is an integral multiple of period (z=9) of the change in the number of slots θ(i) necessary for the transmission of 64890 bits. Therefore, in the slot having 64890 bits that is of the sum of code word 10102 in the (i+1)th block having 64800 bits and the number of bits of adjustment bit string 10202, the number of occurrences of nine values that can be taken by θ(i) are equal to one another, so that a possibility of obtaining the information included in code word 10102 of the (i+1)th block with high reception quality can be enhanced.

Similarly, adjustment bit string 10203 is used in code word 10103 in the (i+2)th-block having 64800 bits, and adjustment bit string 10203 has 90 bits. Accordingly, the total of the numbers of bits of (i+2)th-block code word 10103 and adjustment bit string 10203 is 64890 bits. Therefore, the effect of the first exemplary embodiment can be obtained. The sum of code word 10103 of the (i+2)th block having 64800 bits and the number of bits of adjustment bit string 10203 is an integral multiple of period (z=9) of the change in the number of slots θ(i) necessary for the transmission of 64890 bits. Therefore, in the slot having 64890 bits that is of the sum of code word 10103 in the (i+2)th block having 64800 bits and the number of bits of adjustment bit string 10203, the number of occurrences of nine values that can be taken by θ(i) are equal to one another, so that a possibility of obtaining the information included in code word 10103 of the (i+2)th block with high reception quality can be enhanced.

The adjustment bit string inserting method is not limited to that in FIG. 102, but the total of 64890 bits of the code word having the 64800 bits and the adjustment bit string having the 90 bits may be arranged in any order.

Modification of Second Exemplary Embodiment

In the second exemplary embodiment, the configuration of the modulator that performs the pieces of processing before mapper 9702 in FIGS. 97 and 98 is similar to that in FIG. 60. One of the characteristics of the second exemplary embodiment is that "In order that the number of bits (X+Y) that can be transmitted by first and second complex signals s1 and s2 transmitted at the identical frequency and the identical time does not include the data of the plurality of blocks (of the error correction code) with respect to the set of the complex signals based on any combination of the modulation schemes used in mapper 504 irrespective of the value of N when encoder 502LA in FIG. 60 outputs the code word having code word length (block length (code length)) N of the error correction code, first bit string 503 is input to bit length adjuster 6001, the adjustment bit string is added to the front end, the rear end, the predetermined position, and the like of the code word of the error correction code having the code word length (block length (code length)) N, and the second bit string for the mapper is output such that the number of constituting bits is the multiple of the number of bits (X+Y). The adjustment bit string is constructed by repeating the bit value in a predetermined portion of the N-bit code word obtained through the coding processing at least once (repetition)".

The value of (X+Y) is similar to that of the first to third exemplary embodiments.

In a modulation of the second exemplary embodiment in the tenth exemplary embodiment, the number of bits of the adjustment bit string is decided in consideration of change period z of θ(i). The description will specifically be made below.

A more specific example will be described for convenience.

The error correction code used is set to the code length (block length) of 64800 bits, and change period z of θ(i) is set to 9. QPSK, 16QAM, 64QAM, and 256QAM can be used as the modulation scheme. Accordingly, sets of (QPSK, QPSK), (QPSK,16QAM), (QPSK,64QAM), (QPSK, 256QAM), (16QAM,16QAM), (16QAM,64QAM), (16QAM,256QAM), (64QAM,256QAM), and (256QAM, 256QAM) can be considered as (modulation scheme of $s_1(t)$ (first complex signal s1), modulation scheme of $s_2(t)$ (second complex signal s2)), and some examples will be picked up and described below.

In the tenth exemplary embodiment, similarly to other exemplary embodiments, it is assumed that both the modulation scheme of first complex signal s1 ($s_1(t)$) and the modulation scheme of the second complex signal s2 ($s_2(t)$) can be switched from the plurality of modulation schemes.

One of the characteristics of the modulation of the second exemplary embodiment in the tenth exemplary embodiment is that, assuming that γ=LCM(X+Y,z) is given for the sum of the value of (X+Y), change period z of θ(i), the number of bits (N) of the code length, and the number of bits of the adjustment bit string, a sum of the number of bits (N) of the code length and the number of bits of the adjustment bit string is a multiple of γ. That is, the sum of the number of bits (N) of the code length and the number of bits of the adjustment bit string is the multiple of the least common multiple of (X+Y) and z, where X is an integer of 1 or more, Y is an integer of 1 or more, and z is an integer of 2 or more. Accordingly, (X+Y) is an integer of 2 or more. Although it is ideal that the number of bits of the adjustment bit string is 0, and sometimes the number of bits of the adjustment bit string cannot be set to 0. At this point, it is necessary to add the adjustment bit string.

This point will be described below with an example.

Example 3

It is assumed that (modulation scheme of $s_1(t)$ (first complex signal s1), modulation scheme of $s_2(t)$ (second complex signal s2)) is (16QAM,16QAM), that the error correction code (for example, the block code of the LDPC code) has the code word length (block length (code length)) of 64800 bits, and that change period z of θ(i) is set to 9. Therefore, γ=LCM(X+Y,z)=(8,9)=72 is obtained. Accordingly, the number of bits of the adjustment bit string necessary to satisfy the above characteristic is (72×n) bits (n is an integer of 0 or more).

FIG. 101A illustrates the state of first bit string 503 that is output from encoder 502LA of the modulator in FIG. 60. In FIG. 101A, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and the (i+4)th-block code word, the (i+5)th-block code word, and . . . are arranged.

As described above, the number of bits of the adjustment bit string necessary to satisfy the above characteristic is (72×n) bits (n is an integer of 0 or more).
In this case, the number of bits of the adjustment bit string is set to 0 (zero). FIG. 101B illustrates the state of second bit string 6003 that is output from bit length adjuster 6001 of the modulator in FIG. 60. In FIG. 101B, similarly to the state of first bit string 503 output from Encoder 502LA in FIG. 60, in second bit string 6003 output from bit length adjuster 6001 of the modulator in FIG. 60, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and (i+4)th-block code word, (i+5)th-block code word, and . . . are arranged.

Example 4

It is assumed that (modulation scheme of $s_1(t)$ (first complex signal s1), modulation scheme of $s_2(t)$ (second complex signal s2)) is (64QAM,256QAM), that the error correction code (for example, the block code of the LDPC code) has the code word length (block length (code length)) of 64800 bits, and that change period z of θ(i) is set to 9. Therefore, γ=LCM(X+Y,z)=(14,9)=126 is obtained. Accordingly, the number of bits of the adjustment bit string necessary to satisfy the above characteristic is (126×n+90) bits (n is an integer of 0 or more).

FIG. 102A illustrates the state of first bit string 503 that is output from encoder 502LA of the modulator in FIG. 60. In FIG. 102A, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and the (i+4)th-block code word, the (i+5)th-block code word, and . . . are arranged.

As described above, the number of bits of the adjustment bit string necessary to satisfy the above characteristic is (126×n+90) bits (n is an integer of 0 or more). In this case, the number of bits of the adjustment bit string is set to 90. FIG. 102B illustrates the state of second bit string 6003 that is output from bit length adjuster 6001 of the modulator in FIG. 60.

In FIG. 102B, reference marks 10201, 10202, and 10203 designate the adjustment bit string. Adjustment bit string 10201 is used in code word 10101 in the ith-block code having 64800 bits, and adjustment bit string 10201 has 90 bits. Accordingly, a total of the numbers of bits of ith-block code word 10101 and adjustment bit string 10201 is 64890 bits. Therefore, the effect of the second exemplary embodiment can be obtained. The sum of code word 10101 of the ith block having 64800 bits and the number of bits of adjustment bit string 10201 is the number of slots necessary for the transmission of 64890 bits (in this case, one slot means one formed by one symbol of s1 and one symbol of s2), and is an integral multiple of change period (z=9) of θ(i).

Therefore, in the slot having 64890 bits that is of the sum of code word 10101 in the ith block having 64800 bits and the number of bits of adjustment bit string 10201, the number of occurrences of nine values that can be taken by θ(i) are equal to one another, so that a possibility of obtaining the information included in code word 10101 of the ith block with high reception quality can be enhanced.

Similarly, adjustment bit string 10202 is used in code word 10102 in the (i+1) th-block having 64800 bits, and adjustment bit string 10202 has 90 bits. Accordingly, the total of the numbers of bits of (i+1)th-block code word 10102 and adjustment bit string 10202 is 64890 bits. Therefore, the effect of the second exemplary embodiment can be obtained. The sum of code word 10102 of the (i+1)th block having 64800 bits and the number of bits of adjustment bit string 10202 is an integral multiple of period (z=9) of the change in the number of slots θ(i) necessary for the transmission of 64890 bits. Therefore, in the slot having 64890 bits that is of the sum of code word 10102 in the (i+1)th block having 64800 bits and the number of bits of adjustment bit string 10202, the number of occurrences of nine values that can be taken by θ(i) are equal to one another, so that a possibility of obtaining the information included in code word 10102 of the (i+1)th block with high reception quality can be enhanced.

Similarly, adjustment bit string 10203 is used in code word 10103 in the (i+2) th-block having 64800 bits, and adjustment bit string 10203 has 90 bits. Accordingly, the total of the numbers of bits of (i+2)th-block code word 10103 and adjustment bit string 10203 is 64890 bits. Therefore, the effect of the second exemplary embodiment can be obtained. The sum of code word 10103 of the (i+2)th block having 64800 bits and the number of bits of adjustment bit string 10203 is an integral multiple of period (z=9) of the change in the number of slots θ(i) necessary for the transmission of 64890 bits. Therefore, in the slot having 64890 bits that is of the sum of code word 10103 in the (i+2)th block having 64800 bits and the number of bits of adjustment bit string 10203, the number of occurrences of nine values that can be taken by θ(i) are equal to one another, so that a possibility of obtaining the information included in code word 10103 of the (i+2)th block with high reception quality can be enhanced.

As described in the second exemplary embodiment, the adjustment bit string is constructed by repeating the bit value in a predetermined portion of the N-bit code word obtained through the coding processing at least once (repetition). The specific method for constructing the adjustment bit string is described in the second exemplary embodiment.

The adjustment bit string inserting method is not limited to that in FIG. 102, but the total of 64890 bits of the code word having the 64800 bits and the adjustment bit string having the 90 bits may be arranged in any order.

Modification of Third Exemplary Embodiment

In the third exemplary embodiment, the configuration of the modulator that performs the pieces of processing before mapper 9702 in FIGS. 97 and 98 is similar to that in FIG. 73. One of the characteristics of the third exemplary embodiment is that "In order that the number of bits (X+Y) that can be transmitted by first and second complex signals s1 and s2 transmitted at the identical frequency and the identical time does not include the data of the plurality of blocks (of the error correction code) with respect to the set of the complex signals based on any combination of the modulation schemes used in mapper 504 irrespective of the value of N when encoder 502LA in FIG. 73 outputs the code word having code word length (block length (code length)) N of the error correction code, bit string 503V is input to bit length adjuster 7301, the adjustment bit string is added to the front end, the rear end, the predetermined position, and the like of the code word of the error correction code having the code word length (block length (code length)) N, and the bit-length-adjusted bit string for the mapper is output such that the number of constituting bits is the multiple of the number of bits (X+Y). The adjustment bit string is constructed by repeating the bit value in a predetermined portion of the N-bit code word obtained through the coding processing at least once (repetition), or constructed with the predetermined bit string".

The value of (X+Y) is similar to that of the first to third exemplary embodiments.

In a modulation of the third exemplary embodiment in the tenth exemplary embodiment, the number of bits of the adjustment bit string is decided in consideration of change period z of θ(i). The description will specifically be made below.

A more specific example will be described for convenience.

The error correction code used is set to the code length (block length) of 64800 bits, and change period z of θ(i) is set to 9. QPSK, 16QAM, 64QAM, and 256QAM can be used as the modulation scheme. Accordingly, sets of (QPSK, QPSK), (QPSK,16QAM), (QPSK,64QAM), (QPSK, 256QAM), (16QAM,16QAM), (16QAM,64QAM), (16QAM,256QAM), (64QAM,256QAM), and (256QAM, 256QAM) can be considered as (modulation scheme of $s_1(t)$ (first complex signal s1), modulation scheme of $s_2(t)$ (second complex signal s2)), and some examples will be picked up and described below.

In the tenth exemplary embodiment, similarly to other exemplary embodiments, it is assumed that both the modulation scheme of first complex signal s1 ($s_1(t)$) and the modulation scheme of the second complex signal s2 ($s_2(t)$) can be switched from the plurality of modulation schemes.

One of the characteristics of the modulation of the third exemplary embodiment in the tenth exemplary embodiment is that, assuming that γ=LCM(X+Y,z) is given for the sum of the value of (X+Y), change period z of θ(i), the number of bits (N) of the code length, and the number of bits of the adjustment bit string, a sum of the number of bits (N) of the code length and the number of bits of the adjustment bit string is a multiple of γ. That is, the sum of the number of bits (N) of the code length and the number of bits of the adjustment bit string is the multiple of the least common multiple of (X+Y) and z, where X is an integer of 1 or more, Y is an integer of 1 or more, and z is an integer of 2 or more. Accordingly, (X+Y) is an integer of 2 or more. Although it is ideal that the number of bits of the adjustment bit string is 0, and sometimes the number of bits of the adjustment bit string cannot be set to 0. At this point, it is necessary to add the adjustment bit string.

This point will be described below with an example.

Example 5

It is assumed that (modulation scheme of $s_1(t)$ (first complex signal s1), modulation scheme of $s_2(t)$ (second complex signal s2)) is (16QAM,16QAM), that the error correction code (for example, the block code of the LDPC code) has the code word length (block length (code length)) of 64800 bits, and that change period z of θ(i) is set to 9. Therefore, γ=LCM(X+Y,z)=(8,9)=72 is obtained. Accordingly, the number of bits of the adjustment bit string necessary to satisfy the above characteristic is (72×n) bits (n is an integer of 0 or more).

FIG. 101A illustrates the state of first bit string 503Λ that is output from encoder 502LA of the modulator in FIG. 73. In FIG. 101A, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and the (i+4)th-block code word, the (i+5)th-block code word, and . . . are arranged.

As described above, the number of bits of the adjustment bit string necessary to satisfy the above characteristic is (72×n) bits (n is an integer of 0 or more).

In this case, the number of bits of the adjustment bit string is set to 0 (zero). FIG. 101B illustrates the state of bit-length-adjusted bit string 7303 that is output from bit length adjuster 7301 of the modulator in FIG. 73. In FIG. 101B, similarly to the state of first bit string 503Λ output from encoder 502LA in FIG. 73, in bit-length-adjusted bit string 7303 output from bit length adjuster 7301 of the modulator in FIG. 73, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and (i+4)th-block code word, (i+5)th-block code word, and . . . are arranged.

Example 6

It is assumed that (modulation scheme of $s_1(t)$ (first complex signal s1), modulation scheme of $s_2(t)$ (second complex signal s2)) is (64QAM,256QAM), that the error correction code (for example, the block code of the LDPC code) has the code word length (block length (code length)) of 64800 bits, and that change period z of θ(i) is set to 9. Therefore, γ=LCM(X+Y,z)=(14,9)=126 is obtained. Accordingly, the number of bits of the adjustment bit string necessary to satisfy the above characteristic is (126×n+90) bits (n is an integer of 0 or more).

Figure 103A:
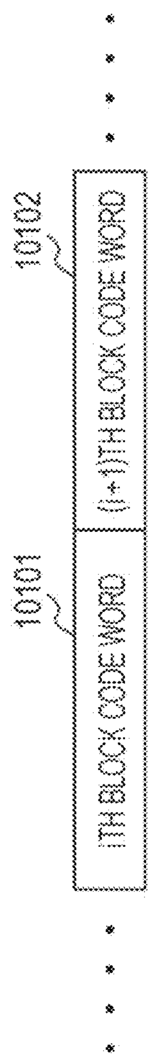
FIG. 103A is a view illustrating a state of output first bit string 503Λ.

FIG. 103A illustrates the state of first bit string 503Λ that is output from encoder 502LA of the modulator in FIG. 73. In FIG. 103A, reference mark 10101 designates the ith-block code word in which the number of bits is 64800, reference mark 10102 designates the (i+1)th-block code word in which the number of bits is 64800, and the (i+2) th-block code word, the (i+3)th-block code word, and . . . are arranged.

Figure 103B:
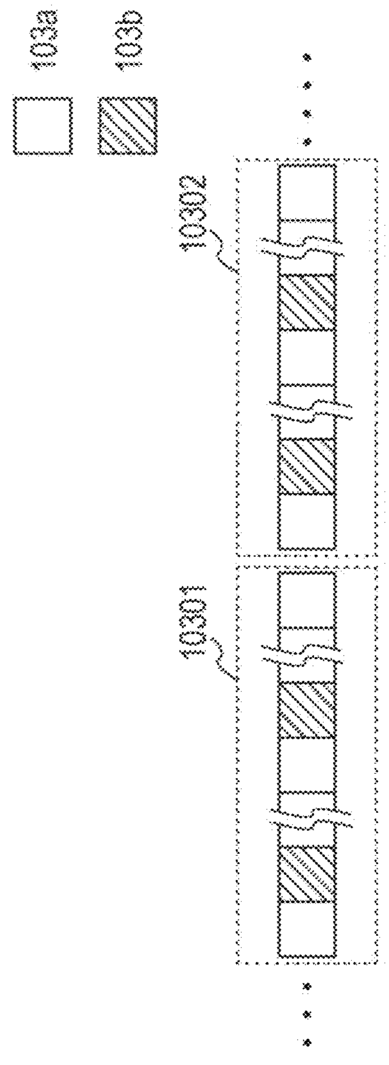
FIG. 103B is a view illustrating a state of output bit-length-adjusted bit string 7303.

As described above, the number of bits of the adjustment bit string necessary to satisfy the above characteristic is (126×n+90) bits (n is an integer of 0 or more). In this case, the number of bits of the adjustment bit string is set to 90. FIG. 103B illustrates the state of bit-length-adjusted bit string 7303 that is output from bit length adjuster 7301 of the modulator in FIG. 73.

In FIG. 103B, reference mark 103*a* designates (1) bit of the code word, and reference mark 103*b* designates the bit of the adjustment bit string. Total 10301 of code word 10101 of the ith block and the adjustment bit string for code word 10101 of the ith block is 64890 bits. Total 10302 of code word 10102 of the (i+1)th block and the adjustment bit string for code word 10102 of the (i+1)th block is 64890 bits.

Therefore, the effect of the third exemplary embodiment can be obtained. The sum of code word 10101 of the ith block having 64800 bits and the number of bits of the adjustment bit string is the number of slots necessary for the transmission of 64890 bits (in this case, one slot means one formed by one symbol of s1 and one symbol of s2), and is an integral multiple of change period (z=9) of θ(i).

Therefore, in the slot having 64890 bits that is of the sum of code word 10101 in the ith block having 64800 bits and the number of bits of the adjustment bit string, the number of occurrences of nine values that can be taken by θ(i) are equal to one another, so that a possibility of obtaining the information included in code word 10101 of the ith block with high reception quality can be enhanced.

Similarly, the sum of code word 10102 of the (i+1)th block having 64800 bits and the number of bits of the adjustment bit string is an integral multiple of period (z=9) of the change in the number of slots θ(i) necessary for the transmission of 64890 bits. Therefore, in the slot having 64890 bits that is of the sum of code word 10102 in the (i+1)th block having 64800 bits and the number of bits of the adjustment bit string, the number of occurrences of nine values that can be taken by θ(i) are equal to one another, so that a possibility of obtaining the information included in code word 10102 of the (i+1)th block with high reception quality can be enhanced.

As described in the third exemplary embodiment, the adjustment bit string is constructed by repeating the bit value in a predetermined portion of the N-bit code word obtained through the coding processing at least once (repetition) or constructed with the predetermined bit string. The specific method for constructing the adjustment bit string is described in the third exemplary embodiment.

The adjustment bit string inserting method is not limited to that in FIG. 103, but the total of 64890 bits of the code word having the 64800 bits and the adjustment bit string having the 90 bits may be arranged in any order.

Sometimes the interleaving has the size of (N×z) bits as described in the third exemplary embodiment. In this case, the following characteristic is given.

"In order that the number of bits (X+Y) that can be transmitted by first and second complex signals s1 and s2 transmitted at the identical frequency and the identical time does not include the data of the plurality of blocks (of the error correction code) with respect to the set of the complex signals based on any combination of the modulation schemes used in mapper 504 irrespective of the value of N when encoder 502LA in FIG. 73 outputs the code word having code word length (block length (code length)) N of the error correction code, bit length adjuster 7301 adds the adjustment bit string to the (N×z) bits accumulated in the interleaver, and the total of the (N×z) bits and the number of bits of the adjustment bit string is a multiple of γ=LCM(X+Y,z)."

Modification of Fourth Exemplary Embodiment

In the fourth exemplary embodiment, the configuration of the modulator that performs the pieces of processing before mapper 9702 in FIGS. 97 and 98 is similar to that in FIGS. 80 and 83. One of the characteristics of the fourth exemplary embodiment is that "In second bit string (bit-length-adjusted bit string) 8003 in which the temporarily-inserted adjustment bit string is deleted from code length N of the code word of the LDPC code in the ith block before the coding, the number of bits of second bit string (bit-length-adjusted bit string) 8003 is a multiple of the number of bits (X+Y) decided by the set of the first modulation scheme of s1 (t) and the second modulation scheme of s2(t)". The value of (X+Y) is similar to that of the first to third exemplary embodiments.

In a modulation of the fourth exemplary embodiment in the tenth exemplary embodiment, the number of bits of the adjustment bit string is decided in consideration of change period z of θ(i). The description will specifically be made below.

A more specific example will be described for convenience.

The error correction code used is set to the code length (block length) of 64800 bits, and change period z of θ(i) is set to 9. QPSK, 16QAM, 64QAM, and 256QAM can be used as the modulation scheme. Accordingly, sets of (QPSK, QPSK), (QPSK,16QAM), (QPSK,64QAM), (QPSK, 256QAM), (16QAM,16QAM), (16QAM,64QAM), (16QAM,256QAM), (64QAM,256QAM), and (256QAM, 256QAM) can be considered as (modulation scheme of $s_1(t)$ (first complex signal s1), modulation scheme of $s_2(t)$ (second complex signal s2)), and some examples will be picked up and described below.

In the tenth exemplary embodiment, similarly to other exemplary embodiments, it is assumed that both the modulation scheme of first complex signal s1 ($s_1(t)$) and the modulation scheme of the second complex signal s2 ($s_2(t)$) can be switched from the plurality of modulation schemes.

One of the characteristics of the modulation of the fourth exemplary embodiment in the tenth exemplary embodiment is that, assuming that $\gamma$=LCM(X+Y,z) is given for the sum of the value of (X+Y), change period z of $\theta(i)$, the number of bits (N) of the code length, and the number of bits of the adjustment bit string, the number of bits of the bit-length-adjusted bit string is a multiple of $\gamma$. That is, the bit-length-adjusted bit string is the multiple of the least common multiple of (X+Y) and z, where X is an integer of 1 or more, Y is an integer of 1 or more, and z is an integer of 2 or more. Accordingly, (X+Y) is an integer of 2 or more. Although it is ideal that a difference between the number of bits of the bit-length-adjusted bit string and the number of bits of the code word is 0, and sometimes the difference cannot be set to 0. At this point, it is necessary to adjust the bit length as described in the characteristic of the fourth exemplary embodiment.

This point will be described below with an example.

Example 7

It is assumed that (modulation scheme of $s_1(t)$ (first complex signal s1), modulation scheme of $s_2(t)$ (second complex signal s2)) is (16QAM,16QAM), that the error correction code (for example, the block code of the LDPC code) has the code word length (block length (code length)) of 64800 bits, and that change period z of $\theta(i)$ is set to 9. Therefore, $\gamma$=LCM(X+Y,z)=(8,9)=72 is obtained. Accordingly, the number of bits of the temporarily-inserted adjustment bit string (known information) necessary to satisfy the above characteristic is (72×n) bits (n is an integer of 0 or more).

FIG. 101A illustrates the state of first bit string 503' (or 503Λ) that is output from encoder 502 of the modulator in FIGS. 80 and 83. In FIG. 101A, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and the (i+4)th-block code word, the (i+5)th-block code word, and . . . are arranged. The temporarily-inserted adjustment bit string (known information) is not included in code words 10101, 10102, 10103, 10104 of the block.

As described above, the number of bits of the temporarily-inserted adjustment bit string (known information) necessary to satisfy the above characteristic is (72×n) bits (n is an integer of 0 or more). At this point, it is assumed that the number of bits of the temporarily-inserted adjustment bit string (known information) is set to 0 (zero). FIG. 101B illustrates the state of bit-length-adjusted bit string 8003 that is output from subsequent stage section 8001B in FIGS. 80 and 83. In FIG. 101B, similarly to the state of first bit string 503' (or 503Λ) output from R102 of the modulator in FIGS. 80 and 83, in bit-length-adjusted bit string 8003 output from subsequent stage section 8001B in FIGS. 80 and 83, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and (i+4)th-block code word, (i+5)th-block code word, and . . . are arranged.

Example 8

It is assumed that (modulation scheme of $s_1(t)$ (first complex signal s1), modulation scheme of $s_2(t)$ (second complex signal s2)) is (64QAM,256QAM), that the error correction code (for example, the block code of the LDPC code) has the code word length (block length (code length)) of 64800 bits, and that change period z of $\theta(i)$ is set to 9. Therefore, $\gamma$=LCM(X+Y,z)=(14,9)=126 is obtained. Accordingly, the number of bits of the temporarily-inserted adjustment bit string (known information) necessary to satisfy the above characteristic is (126×n+36) bits (n is an integer of 0 or more).

Figure 104A:
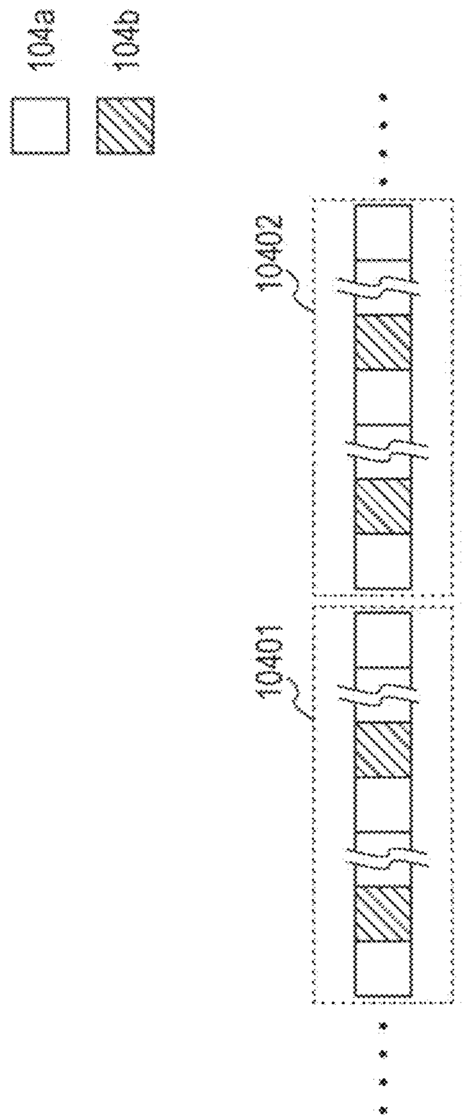
FIG. 104A is a view illustrating a state of output first bit string 503' (or 503Λ)

FIG. 104A illustrates the state of first bit string 503' (or 503Λ) that is output from encoder 502 of the modulator in FIGS. 80 and 83. In FIG. 104A, reference mark 10401 designates the ith-block code word in which the number of bits is 64800, reference mark 10402 designates the (i+1)th-block code word in which the number of bits is 64800, and the (i+2)th-block code word, the (i+3)th-block code word, and . . . are arranged.

In FIG. 104, reference mark **104*b* designates the bit of the temporarily-inserted adjustment bit string, and reference mark 104*a*** designates the other bits.

Accordingly, bits **104*b* of the temporarily-inserted adjustment bit string having the 36 bits exist in code word 10401 of FIG. 104A of the ith block having the 64800 bits, and bits 104*b* of the temporarily-inserted adjustment bit string having the 36 bits exist in code word 10402** of the (i+1)th block having the 64800 bits.

Figure 104B:
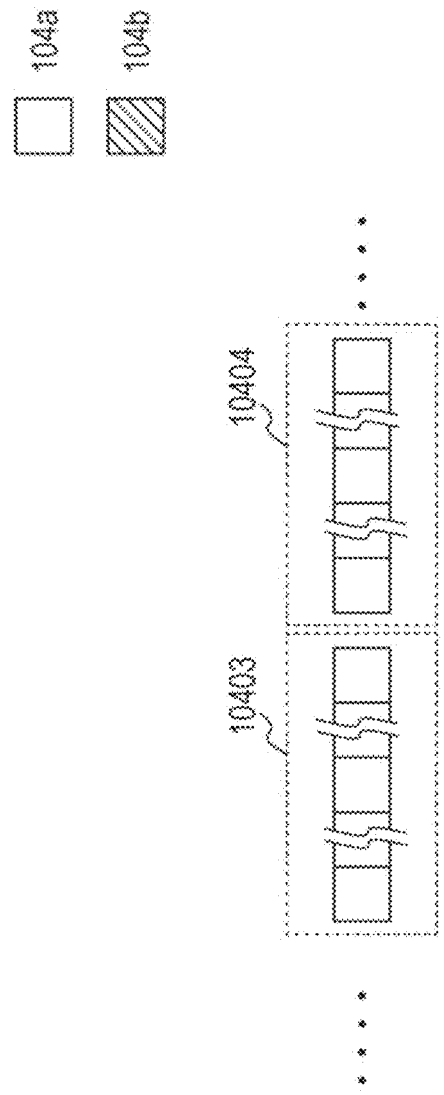
FIG. 104B is a view illustrating a state of output bit-length-adjusted bit string 8003.

As described above, the number of bits of the temporarily-inserted adjustment bit string (known information) necessary to satisfy the above characteristic is (126×n+36) bits (n is an integer of 0 or more). At this point, it is assumed that the number of bits of the temporarily-inserted adjustment bit string (known information) is set to 36. Subsequent stage section 8001B in FIGS. 80 and 83 deletes the temporarily-inserted adjustment bit string (known information). FIG. 104B illustrates the state of bit-length-adjusted bit string 8003 that is output from subsequent stage section 8001B of the modulator in FIGS. 80 and 83.

In FIG. 104B, ith bit-length-adjusted bit string 10403 is constructed only with bits **104*a*. The number of bits of ith bit-length-adjusted bit string 10403** is 64800−36=64764.

Similarly, (i+1)th bit-length-adjusted bit string 10404 is constructed only with bits **104*a*. The number of bits of (i+1)th bit-length-adjusted bit string 10404** is 64800−36=64764.

Therefore, the effect of the fourth exemplary embodiment can be obtained.

The number of slots necessary for the transmission of the ith bit-length-adjusted bit string (in this case, one slot means one formed by one symbol of $s_1$ and one symbol of s2) is an integral multiple of change period (z=9) of $\theta(i)$.

Therefore, in the slot forming the ith bit-length-adjusted bit string, the number of occurrences of nine values that can be taken by $\theta(i)$ are equal to one another, so that a possibility of obtaining the information included in the ith bit-length-adjusted bit string with high reception quality can be enhanced.

The number of slots necessary for the transmission of the (i+1)th bit-length-adjusted bit string (in this case, one slot means one formed by one symbol of s1 and one symbol of s2) is an integral multiple of change period (z=9) of θ(i).

Therefore, in the slot forming the (i+1)th bit-length-adjusted bit string, the number of occurrences of nine values that can be taken by θ(i) are equal to one another, so that a possibility of obtaining the information included in the (i+1)th bit-length-adjusted bit string with high reception quality can be enhanced.

The specific method for constructing the temporarily-inserted adjustment bit string (known information) is described in the fourth exemplary embodiment.

Modification of Eighth Exemplary Embodiment

In the eighth exemplary embodiment, the configuration of the modulator that performs the pieces of processing before mapper 9702 in FIGS. 97 and 98 is similar to that in FIGS. 91 and 93. One of the characteristics of the eighth exemplary embodiment is that "The bit length adjuster deletes the PunNum-bit data from the N-bit code word, and outputs the (N− PunNum)-bit data string. At this point, PunNum is decided such that (N− PunNum) is the multiple of the value of (X+Y)".

The value of (X+Y) is similar to that of the first to third exemplary embodiments.

In a modulation of the eighth exemplary embodiment in the tenth exemplary embodiment, the number of bits PunNum of the deleted data is decided in consideration of change period z of θ(i). The description will specifically be made below.

A more specific example will be described for convenience.

The error correction code used is set to the code length (block length) of 64800 bits, and change period z of θ(i) is set to 9. QPSK, 16QAM, 64QAM, and 256QAM can be used as the modulation scheme. Accordingly, sets of (QPSK, QPSK), (QPSK,16QAM), (QPSK,64QAM), (QPSK, 256QAM), (16QAM,16QAM), (16QAM,64QAM), (16QAM,256QAM), (64QAM,256QAM), and (256QAM, 256QAM) can be considered as (modulation scheme of $s_1(t)$ (first complex signal s1), modulation scheme of $s_2(t)$ (second complex signal s2)), and some examples will be picked up and described below.

In the tenth exemplary embodiment, similarly to other exemplary embodiments, it is assumed that both the modulation scheme of first complex signal s1 ($s_1(t)$) and the modulation scheme of the second complex signal s2 ($s_2(t)$) can be switched from the plurality of modulation schemes.

One of the characteristics of the modulation of the eighth exemplary embodiment in the tenth exemplary embodiment is that, assuming that γ=LCM(X+Y,z) is given for the sum of the value of (X+Y), change period z of θ(i), the number of bits (N) of the code length, and the number of bits of the adjustment bit string, the number of bits (N− PunNum) of the (N− PunNum)-bit data string is a multiple of γ. That is, (N− PunNum) is the multiple of the least common multiple of (X+Y) and z, where X is an integer of 1 or more, Y is an integer of 1 or more, and z is an integer of 2 or more. Accordingly, (X+Y) is an integer of 2 or more. Although it is ideal that PunNum is 0, and sometimes PunNum cannot be set to 0. At this point, it is necessary to adjust (N− PunNum) as described in the characteristic of the eighth exemplary embodiment.

This point will be described below with an example.

Example 9

It is assumed that (modulation scheme of $s_1(t)$ (first complex signal s1), modulation scheme of $s_2(t)$ (second complex signal s2)) is (16QAM,16QAM), that the error correction code (for example, the block code of the LDPC code) has the code word length (block length (code length)) of 64800 bits, and that change period z of θ(i) is set to 9. Therefore, γ=LCM(X+Y,z)=(8,9)=72 is obtained. Accordingly, PunNum necessary to satisfy the above characteristic is (72×n) bits (n is an integer of 0 or more).

FIG. 101A illustrates the state of N-bit code word 503 that is output from encoder 502 of the modulator in FIGS. 91 and 93. In FIG. 101A, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and the (i+4)th-block code word, the (i+5)th-block code word, and . . . are arranged.

As described above, PunNum necessary to satisfy the above characteristic is (72×n) bits (n is an integer of 0 or more). At this point, PunNum is set to 0 (zero). FIG. 101B illustrates the state of (N− PunNum)-bit data string 9102 that is output from bit length adjuster 9101 in FIGS. 91 and 93. In FIG. 101B, similarly to the state of first bit string 503' (or 503A) output from encoder 502 in FIGS. 91 and 93, in (N− PunNum)-bit data string 9102 output from bit length adjuster 9101, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and (i+4)th-block code word, (i+5)th-block code word, and . . . are arranged.

Example 10

It is assumed that (modulation scheme of $s_1(t)$ (first complex signal s1), modulation scheme of $s_2(t)$ (second complex signal s2)) is (64QAM,256QAM), that the error correction code (for example, the block code of the LDPC code) has the code word length (block length (code length)) of 64800 bits, and that change period z of θ(i) is set to 9. Therefore, γ=LCM(X+Y,z)=(14,9)=126 is obtained. Accordingly, PunNum necessary to satisfy the above characteristic is (126×n+36) bits (n is an integer of 0 or more).

Figure 105A:
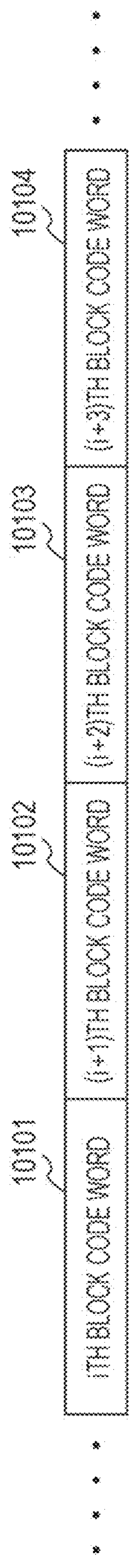
FIG. 105A is a view illustrating a state of output N-bit code word 503.

FIG. 105A illustrates the state of N-bit code word 503 that is output from encoder 502 of the modulator in FIGS. 91 and 93. In FIG. 105A, reference mark 10101 designates the ith-block code word in which the number of bits is 64800, reference mark 10102 designates the (i+1)th-block code word in which the number of bits is 64800, reference mark 10103 designates the (i+2)th-block code word in which the number of bits is 64800, reference mark 10104 designates the (i+3)th-block code word in which the number of bits is 64800, and the (i+4)th-block code word, the (i+5)th-block code word, and . . . are arranged.

Figure 105B:
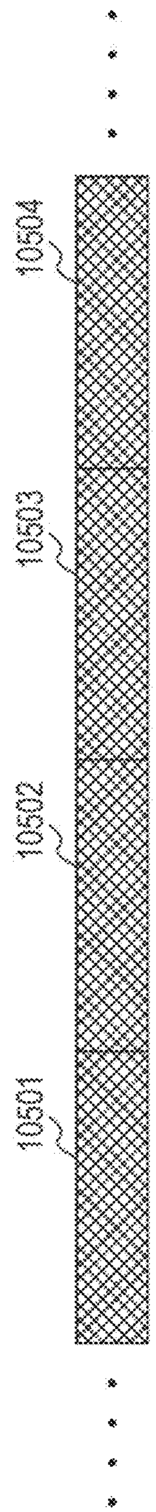
FIG. 105B is a view illustrating a state of output (N-PunNum)-bit data string 9102.

As described above, PunNum necessary to satisfy the above characteristic is (126×n+36) bits (n is an integer of 0 or more). In this case, PunNum is set to 36 bits. FIG. 105B illustrates the state of (N-PunNum)-bit data string 9102 that is output from bit length adjuster 9101 in FIGS. 91 and 93.

In FIG. 105B, ith bit-length-adjusted bit string 10501 is the ith data string having (N− PunNum) bits. Accordingly, ith bit-length-adjusted bit string 10501 is constructed with (64800−36=64764) bits.

Similarly, (i+1)th bit-length-adjusted bit string 10502 is the (i+1)th data string having (N− PunNum) bits. Accordingly, (i+1)th bit-length-adjusted bit string 10502 is constructed with (64800-36=64764) bits, (i+2)th bit-length-adjusted bit string 10503 is the (i+2)th data string having (N− PunNum) bits. Accordingly, (i+2)th bit-length-adjusted bit string 10503 is constructed with (64800−36=64764) bits.

(i+3)th bit-length-adjusted bit string 10504 is the (i+3)th data string having (N− PunNum) bits. Accordingly, (i+3)th bit-length-adjusted bit string 10504 is constructed with (64800−36=64764) bits. Therefore, the effect of the eighth exemplary embodiment can be obtained.

The number of slots necessary for the transmission of the ith bit-length-adjusted block (in this case, one slot means one formed by one symbol of s1 and one symbol of s2) is an integral multiple of change period (z=9) of θ(i).

Therefore, in the slot forming the ith bit-length-adjusted block, the number of occurrences of nine values that can be taken by θ(i) are equal to one another, so that a possibility of obtaining the information included in the ith bit-length-adjusted block with high reception quality can be enhanced.

The number of slots necessary for the transmission of the (i+1)th bit-length-adjusted block (in this case, one slot means one formed by one symbol of s1 and one symbol of s2) is an integral multiple of change period (z=9) of θ(i).

Therefore, in the slot forming the (i+1)th bit-length-adjusted block, the number of occurrences of nine values that can be taken by θ(i) are equal to one another, so that a possibility of obtaining the information included in the (i+1)th bit-length-adjusted block with high reception quality can be enhanced.

The number of slots necessary for the transmission of the (i+2)th bit-length-adjusted block (in this case, one slot means one formed by one symbol of s1 and one symbol of s2) is an integral multiple of change period (z=9) of θ(i).

Therefore, in the slot forming the (i+2)th bit-length-adjusted block, the number of occurrences of nine values that can be taken by θ(i) are equal to one another, so that a possibility of obtaining the information included in the (i+2)th bit-length-adjusted block with high reception quality can be enhanced.

The number of slots necessary for the transmission of the (i+3)th bit-length-adjusted block (in this case, one slot means one formed by one symbol of s1 and one symbol of s2) is an integral multiple of change period (z=9) of θ(i).

Therefore, in the slot forming the (i+3)th bit-length-adjusted block, the number of occurrences of nine values that can be taken by θ(i) are equal to one another, so that a possibility of obtaining the information included in the (i+3)th bit-length-adjusted block with high reception quality can be enhanced.

The same holds true for the subsequent bit-length-adjusted block.

The receiver can obtain the data having the high reception quality by performing the above examples. The configuration of the receiver is similar to that of the fifth to eighth exemplary embodiments (however, the bit length adjusting method is described in the tenth exemplary embodiment).

When the bit-length-adjusted block satisfied one of the above examples with respect to the set of the complex signals based on any combination of the modulation schemes (s1 and s2) irrespective of the value of N while the encoder outputs the code word code word having the N-bit code word length (block length (code length)) of the error correction code, there is a high possibility of effectively reducing the memory of the transmitter and/or receiver.

Eleventh Exemplary Embodiment

In the first to tenth exemplary embodiments, the method in which the control is performed such that “the bit-length-adjusted block is the multiple of the value of (X+Y) when the encoder outputs the code word having the N-bit code word length (block length (code length)) of the error correction code” is described using the plurality of examples. “The bit-length-adjusted block is the multiple of the value of (X+Y) when the encoder outputs the code word having the N-bit code word length (block length (code length)) of the error correction code” will be described again in an eleventh exemplary embodiment.

The value of (X+Y) is similar to that of the first to third exemplary embodiments.

In the eleventh exemplary embodiment, the code length (block length) of the error correction code is set to 16200 bits or 64800 bits, and sets of (QPSK,QPSK), (QPSK, 16QAM), (QPSK,64QAM), (QPSK,256QAM), (16QAM, 16QAM), (16QAM,64QAM), (16QAM,256QAM), (64QAM,256QAM), and (256QAM,256QAM) are considered as (modulation scheme of $s_1(t)$ (first complex signal s1), modulation scheme of $s_2(t)$ (second complex signal s2)) (hereinafter, n is an integer of 0 or more).

From the above, the following are given.

[1]

It is assumed that (modulation scheme of $s_1(t)$ (first complex signal s1), modulation scheme of $s_2(t)$ (second complex signal s2)) is set to (QPSK,QPSK), and that the code length (block length) of the error correction code is set to 16200 bits (the value of (X+Y) is 4).

[1-1] The number of bits of the adjustment bit string (to be added) is (4×n) when one of the methods of the first to third exemplary embodiments is adopted.

[1-2] The number of bits of the temporarily-inserted adjustment bit string (known information) is (4×n) when the method of the fourth exemplary embodiment is adopted (where 4×n<16200).

[1-3] The number of bits of PunNum (the bits to be deleted) is (4×n) when the method of the eighth exemplary embodiment is adopted (where 4×n<16200).

[2]

It is assumed that (modulation scheme of $s_1(t)$ (first complex signal s1), modulation scheme of $s_2(t)$ (second complex signal s2)) is set to (QPSK,16QAM), and that the code length (block length) of the error correction code is set to 16200 bits (the value of (X+Y) is 6).

[2-1] The number of bits of the adjustment bit string (to be added) is (6×n) when one of the methods of the first to third exemplary embodiments is adopted.

[2-2] The number of bits of the temporarily-inserted adjustment bit string (known information) is (6×n) when the method of the fourth exemplary embodiment is adopted (where 6×n<16200).

[2-3] The number of bits of PunNum (the bits to be deleted) is (6×n) when the method of the eighth exemplary embodiment is adopted (where 6×n<16200).

[3]

It is assumed that (modulation scheme of $s_1(t)$ (first complex signal s1), modulation scheme of $s_2(t)$ (second complex signal s2)) is set to (QPSK,64QAM), and that the code length (block length) of the error correction code is set to 16200 bits (the value of (X+Y) is 8).

[3-1] The number of bits of the adjustment bit string (to be added) is (8×n) when one of the methods of the first to third exemplary embodiments is adopted.
[3-2] The number of bits of the temporarily-inserted adjustment bit string (known information) is (8×n) when the method of the fourth exemplary embodiment is adopted (where 8×n<16200).
[3-3] The number of bits of PunNum (the bits to be deleted) is (8×n) when the method of the eighth exemplary embodiment is adopted (where 8×n<16200).

[4]

It is assumed that (modulation scheme of $s_1(t)$ (first complex signal s1), modulation scheme of $s_2(t)$ (second complex signal s2)) is set to (QPSK,256QAM), and that the code length (block length) of the error correction code is set to 16200 bits (the value of (X+Y) is 10).
[4-1] The number of bits of the adjustment bit string (to be added) is (10×n) when one of the methods of the first to third exemplary embodiments is adopted.
[4-2] The number of bits of the temporarily-inserted adjustment bit string (known information) is (10×n) when the method of the fourth exemplary embodiment is adopted (where 10×n<16200).
[4-3] The number of bits of PunNum (the bits to be deleted) is (10×n) when the method of the eighth exemplary embodiment is adopted (where 10×n<16200).

[5]

It is assumed that (modulation scheme of $s_1(t)$ (first complex signal s1), modulation scheme of $s_2(t)$ (second complex signal s2)) is set to (16QAM,16QAM), and that the code length (block length) of the error correction code is set to 16200 bits (the value of (X+Y) is 8).
[5-1] The number of bits of the adjustment bit string (to be added) is (8×n) when one of the methods of the first to third exemplary embodiments is adopted.
[5-2] The number of bits of the temporarily-inserted adjustment bit string (known information) is (8×n) when the method of the fourth exemplary embodiment is adopted (where 8×n<16200).
[5-3] The number of bits of PunNum (the bits to be deleted) is (8×n) when the method of the eighth exemplary embodiment is adopted (where 8×n<16200).

[6]

It is assumed that (modulation scheme of $s_1(t)$ (first complex signal s1), modulation scheme of $s_2(t)$ (second complex signal s2)) is set to (16QAM,64QAM), and that the code length (block length) of the error correction code is set to 16200 bits (the value of (X+Y) is 10).
[6-1] The number of bits of the adjustment bit string (to be added) is (10×n) when one of the methods of the first to third exemplary embodiments is adopted.
[6-2] The number of bits of the temporarily-inserted adjustment bit string (known information) is (10×n) when the method of the fourth exemplary embodiment is adopted (where 10×n<16200).
[6-3] The number of bits of PunNum (the bits to be deleted) is (10×n) when the method of the eighth exemplary embodiment is adopted (where 10×n<16200).

[7]

It is assumed that (modulation scheme of $s_1(t)$ (first complex signal s1), modulation scheme of $s_2(t)$ (second complex signal s2)) is set to (16QAM,256QAM), and that the code length (block length) of the error correction code is set to 16200 bits (the value of (X+Y) is 12).
[7-1] The number of bits of the adjustment bit string (to be added) is (12×n) when one of the methods of the first to third exemplary embodiments is adopted.
[7-2] The number of bits of the temporarily-inserted adjustment bit string (known information) is (12×n) when the method of the fourth exemplary embodiment is adopted (where 12×n<16200).
[7-3] The number of bits of PunNum (the bits to be deleted) is (12×n) when the method of the eighth exemplary embodiment is adopted (where 12×n<16200).

[8]

It is assumed that (modulation scheme of $s_1(t)$ (first complex signal s1), modulation scheme of $s_2(t)$ (second complex signal s2)) is set to (64QAM,256QAM), and that the code length (block length) of the error correction code is set to 16200 bits (the value of (X+Y) is 14).
[8-1] The number of bits of the adjustment bit string (to be added) is (14×n+12) when one of the methods of the first to third exemplary embodiments is adopted.
[8-2] The number of bits of the temporarily-inserted adjustment bit string (known information) is (14×n+2) when the method of the fourth exemplary embodiment is adopted (where 14×n+2<16200).
[8-3] The number of bits of PunNum (the bits to be deleted) is (14×n+2) when the method of the eighth exemplary embodiment is adopted (where 14×n+2<16200).

[9]

It is assumed that (modulation scheme of $s_1(t)$ (first complex signal s1), modulation scheme of $s_2(t)$ (second complex signal s2)) is set to (256QAM,256QAM), and that the code length (block length) of the error correction code is set to 16200 bits (the value of (X+Y) is 16).
[9-1] The number of bits of the adjustment bit string (to be added) is (16×n+8) when one of the methods of the first to third exemplary embodiments is adopted.
[9-2] The number of bits of the temporarily-inserted adjustment bit string (known information) is (16×n+8) when the method of the fourth exemplary embodiment is adopted (where 16×n+8<16200).
[9-3] The number of bits of PunNum (the bits to be deleted) is (16×n+8) when the method of the eighth exemplary embodiment is adopted (where 16×n+8<16200).

[10]

It is assumed that (modulation scheme of $s_1(t)$ (first complex signal s1), modulation scheme of $s_2(t)$ (second complex signal s2)) is set to (QPSK,QPSK), and that the code length (block length) of the error correction code is set to 64800 bits (the value of (X+Y) is 4).
[10-1] The number of bits of the adjustment bit string (to be added) is (4×n) when one of the methods of the first to third exemplary embodiments is adopted.
[10-2] The number of bits of the temporarily-inserted adjustment bit string (known information) is (4×n) when the method of the fourth exemplary embodiment is adopted (where 4×n<64800).
[10-3] The number of bits of PunNum (the bits to be deleted) is (4×n) when the method of the eighth exemplary embodiment is adopted (where 4×n<64800).

[11]

It is assumed that (modulation scheme of $s_1(t)$ (first complex signal s1), modulation scheme of $s_2(t)$ (second complex signal s2)) is set to (QPSK,16QAM), and that the code length (block length) of the error correction code is set to 64800 bits (the value of (X+Y) is 6).
[11-1] The number of bits of the adjustment bit string (to be added) is (6×n) when one of the methods of the first to third exemplary embodiments is adopted.

[11-2] The number of bits of the temporarily-inserted adjustment bit string (known information) is (6×n) when the method of the fourth exemplary embodiment is adopted (where 6×n<64800).

[11-3] The number of bits of PunNum (the bits to be deleted) is (6×n) when the method of the eighth exemplary embodiment is adopted (where 6×n<64800).

[12]

It is assumed that (modulation scheme of $s_1(t)$ (first complex signal s1), modulation scheme of $s_2(t)$ (second complex signal s2)) is set to (QPSK,64QAM), and that the code length (block length) of the error correction code is set to 64800 bits (the value of (X+Y) is 8).

[12-1] The number of bits of the adjustment bit string (to be added) is (8×n) when one of the methods of the first to third exemplary embodiments is adopted.

[12-2] The number of bits of the temporarily-inserted adjustment bit string (known information) is (8×n) when the method of the fourth exemplary embodiment is adopted (where 8×n<64800).

[12-3] The number of bits of PunNum (the bits to be deleted) is (8×n) when the method of the eighth exemplary embodiment is adopted (where 8×n<64800).

[13]

It is assumed that (modulation scheme of $s_1(t)$ (first complex signal s1), modulation scheme of $s_2(t)$ (second complex signal s2)) is set to (QPSK,256QAM), and that the code length (block length) of the error correction code is set to 64800 bits (the value of (X+Y) is 10).

[13-1] The number of bits of the adjustment bit string (to be added) is (10×n) when one of the methods of the first to third exemplary embodiments is adopted.

[13-2] The number of bits of the temporarily-inserted adjustment bit string (known information) is (10×n) when the method of the fourth exemplary embodiment is adopted (where 10×n<64800).

[13-3] The number of bits of PunNum (the bits to be deleted) is (10×n) when the method of the eighth exemplary embodiment is adopted (where 10×n<64800).

[14]

It is assumed that (modulation scheme of $s_1(t)$ (first complex signal s1), modulation scheme of $s_2(t)$ (second complex signal s2)) is set to (16QAM,16QAM), and that the code length (block length) of the error correction code is set to 64800 bits (the value of (X+Y) is 8). [14-1] The number of bits of the adjustment bit string (to be added) is (8×n) when one of the methods of the first to third exemplary embodiments is adopted. [14-2] The number of bits of the temporarily-inserted adjustment bit string (known information) is (8×n) when the method of the fourth exemplary embodiment is adopted (where 8×n<64800). [14-3] The number of bits of PunNum (the bits to be deleted) is (8×n) when the method of the eighth exemplary embodiment is adopted (where 8×n<64800).

[15]

It is assumed that (modulation scheme of $s_1(t)$ (first complex signal $s_1$), modulation scheme of $s_2(t)$ (second complex signal s2)) is set to (16QAM,64QAM), and that the code length (block length) of the error correction code is set to 64800 bits (the value of (X+Y) is 10).

[15-1] The number of bits of the adjustment bit string (to be added) is (10×n) when one of the methods of the first to third exemplary embodiments is adopted.

[15-2] The number of bits of the temporarily-inserted adjustment bit string (known information) is (10×n) when the method of the fourth exemplary embodiment is adopted (where 10×n<64800).

[15-3] The number of bits of PunNum (the bits to be deleted) is (10×n) when the method of the eighth exemplary embodiment is adopted (where 10×n<64800).

[16]

It is assumed that (modulation scheme of $s_1(t)$ (first complex signal s1), modulation scheme of $s_2(t)$ (second complex signal s2)) is set to (16QAM,256QAM), and that the code length (block length) of the error correction code is set to 64800 bits (the value of (X+Y) is 12).

[16-1] The number of bits of the adjustment bit string (to be added) is (12×n) when one of the methods of the first to third exemplary embodiments is adopted.

[16-2] The number of bits of the temporarily-inserted adjustment bit string (known information) is (12×n) when the method of the fourth exemplary embodiment is adopted (where 12>n<64800).

[16-3] The number of bits of PunNum (the bits to be deleted) is (12×n) when the method of the eighth exemplary embodiment is adopted (where 12×n<64800).

[17]

It is assumed that (modulation scheme of $s_1(t)$ (first complex signal s1), modulation scheme of $s_2(t)$ (second complex signal s2)) is set to (64QAM,256QAM), and that the code length (block length) of the error correction code is set to 64800 bits (the value of (X+Y) is 14).

[17-1] The number of bits of the adjustment bit string (to be added) is (14×n+6) when one of the methods of the first to third exemplary embodiments is adopted.

[17-2] The number of bits of the temporarily-inserted adjustment bit string (known information) is (14×n+8) when the method of the fourth exemplary embodiment is adopted (where 14×n+8<64800).

[17-3] The number of bits of PunNum (the bits to be deleted) is (14×n+8) when the method of the eighth exemplary embodiment is adopted (where 14×n+8<64800).

[18]

It is assumed that (modulation scheme of $s_1(t)$ (first complex signal s1), modulation scheme of $s_2(t)$ (second complex signal s2)) is set to (256QAM,256QAM), and that the code length (block length) of the error correction code is set to 64800 bits (the value of (X+Y) is 16).

[18-1] The number of bits of the adjustment bit string (to be added) is (16×n) when one of the methods of the first to third exemplary embodiments is adopted.

[18-2] The number of bits of the temporarily-inserted adjustment bit string (known information) is (16×n) when the method of the fourth exemplary embodiment is adopted (where 16×n<64800).

[18-3] The number of bits of PunNum (the bits to be deleted) is (16×n) when the method of the eighth exemplary embodiment is adopted (where 16×n<64800).

For example, the communication system can set one of the modulation scheme sets of (QPSK,QPSK), (QPSK,16QAM), (QPSK,64QAM), (QPSK,256QAM), (16QAM,16QAM), (16QAM,64QAM), (16QAM,256QAM), (64QAM,256QAM), and (256QAM,256QAM) as (modulation scheme of $s_1(t)$ (first complex signal s1), modulation scheme of $s_2(t)$ (second complex signal s2)), and set the code length (block length) of the error correction code to one of 16200 bits and 64800 bits.

At this point, it is necessary to satisfy one of the conditions described in [1] to [18], One of the characteristics is that, even if (modulation scheme of $s_1(t)$ (first complex signal s1), modulation scheme of $s_2(t)$ (second complex signal s2)) is a certain modulation scheme set, the number of bits to be added or the number of bits to be deleted varies depending on the code length (block length) of the error correction code.

Case 1 and Case 2 are cited as a specific example.

Case 1:

It is assumed that (modulation scheme of $s_1(t)$ (first complex signal s1), modulation scheme of $s_2(t)$ (second complex signal s2)) is (64QAM,256QAM). It is assumed that the transmitter can set the code length (block length) of the error correction code to one of the 16200 bits and the 64800 bits.

When the transmitter selects the 16200 bits as the code length (block length) of the error correction code, for example, the number of bits of the adjustment bit string (to be added) is set to 12 in applying [8-1], the number of bits of the temporarily-inserted adjustment bit string (known information) is set to 2 in applying [8-2], and the number of bits of PunNum (to be deleted) is set to 2 in applying [8-3], When the transmitter selects the 64800 bits as the code length (block length) of the error correction code, for example, the number of bits of the adjustment bit string (to be added) is set to 6 in applying [17-1], the number of bits of the temporarily-inserted adjustment bit string (known information) is set to 8 in applying [17-2], and the number of bits of PunNum (to be deleted) is set to 8 in applying [17-3], Case 2:

It is assumed that (modulation scheme of $s_1(t)$ (first complex signal s1), modulation scheme of $s_2(t)$ (second complex signal s2)) is (256QAM,256QAM). It is assumed that the transmitter can set the code length (block length) of the error correction code to one of the 16200 bits and the 64800 bits.

When the transmitter selects the 16200 bits as the code length (block length) of the error correction code, for example, the number of bits of the adjustment bit string (to be added) is set to 8 in applying [9-1], the number of bits of the temporarily-inserted adjustment bit string (known information) is set to 8 in applying [9-2], and the number of bits of PunNum (to be deleted) is set to 8 in applying [9-3], When the transmitter selects the 64800 bits as the code length (block length) of the error correction code, for example, the number of bits of the adjustment bit string (to be added) is set to 0 in applying [18-1], the number of bits of the temporarily-inserted adjustment bit string (known information) is set to 0 in applying [18-2], and the number of bits of PunNum (to be deleted) is set to 0 in applying [18-3], Then, the code length (block length) of the error correction code is set to 16200 bits or 64800 bits, sets of (QPSK, QPSK), (QPSK,16QAM), (QPSK,64QAM), (QPSK, 256QAM), (16QAM,16QAM), (16QAM,64QAM), (16QAM,256QAM), (64QAM,256QAM), and (256QAM, 256QAM) are considered as (modulation scheme of $s_1(t)$ (first complex signal s1), modulation scheme of $s_2(t)$ (second complex signal s2)), and it is considered that the method of the tenth exemplary embodiment is adopted. However, change period z of 0(i) of the tenth exemplary embodiment is set to 9 (hereinafter, n is an integer of 0 or more).

From the above, the following are given.

[19]

It is assumed that (modulation scheme of $s_1(t)$ (first complex signal s1), modulation scheme of $s_2(t)$ (second complex signal s2)) is set to (QPSK,QPSK), and that the code length (block length) of the error correction code is set to 16200 bits (the value of (X+Y) is 4).

[19-1] The number of bits of the adjustment bit string (to be added) is (36×n) when one of the methods of the modifications of the first to third exemplary embodiments in the tenth exemplary embodiment is adopted.

[19-2] The number of bits of the temporarily-inserted adjustment bit string (known information) is (36×n) when the method of the modification of the fourth exemplary embodiment in the tenth exemplary embodiment is adopted (where 36×n<16200)

[19-3] The number of bits of PunNum (the bits to be deleted) is (36×n) when the method of the modification of the eighth exemplary embodiment in the tenth exemplary embodiment is adopted (where 36×n<216200).

[20]

It is assumed that (modulation scheme of $s_1(t)$ (first complex signal s1), modulation scheme of $s_2(t)$ (second complex signal s2)) is set to (QPSK,16QAM), and that the code length (block length) of the error correction code is set to 16200 bits (the value of (X+Y) is 6).

[20-1] The number of bits of the adjustment bit string (to be added) is (18×n) when one of the methods of the modifications of the first to third exemplary embodiments in the tenth exemplary embodiment is adopted.

[20-2] The number of bits of the temporarily-inserted adjustment bit string (known information) is (18×n) when the method of the modification of the fourth exemplary embodiment in the tenth exemplary embodiment is adopted (where 18×n<16200)

[20-3] The number of bits of PunNum (the bits to be deleted) is (18×n) when the method of the modification of the eighth exemplary embodiment in the tenth exemplary embodiment is adopted (where 18×n<16200).

[21]

It is assumed that (modulation scheme of $s_1(t)$ (first complex signal s1), modulation scheme of $s_2(t)$ (second complex signal s2)) is set to (QPSK,64QAM), and that the code length (block length) of the error correction code is set to 16200 bits (the value of (X+Y) is 8).

[21-1] The number of bits of the adjustment bit string (to be added) is (72×n) when one of the methods of the modifications of the first to third exemplary embodiments in the tenth exemplary embodiment is adopted.

[21-2] The number of bits of the temporarily-inserted adjustment bit string (known information) is (72×n) when the method of the modification of the fourth exemplary embodiment in the tenth exemplary embodiment is adopted (where 72×n<16200).

[21-3] The number of bits of PunNum (the bits to be deleted) is (72×n) when the method of the modification of the eighth exemplary embodiment in the tenth exemplary embodiment is adopted (where 72×n<16200).

[22]

It is assumed that (modulation scheme of $s_1(t)$ (first complex signal $s_1$), modulation scheme of $s_2(t)$ (second complex signal s2)) is set to (QPSK,256QAM), and that the code length (block length) of the error correction code is set to 16200 bits (the value of (X+Y) is 10).

[22-1] The number of bits of the adjustment bit string (to be added) is (90×n) when one of the methods of the modifications of the first to third exemplary embodiments in the tenth exemplary embodiment is adopted.

[22-2] The number of bits of the temporarily-inserted adjustment bit string (known information) is (90×n) when the method of the modification of the fourth exemplary embodiment in the tenth exemplary embodiment is adopted (where 90×n<16200).

[22-3] The number of bits of PunNum (the bits to be deleted) is (90×n) when the method of the modification of the eighth exemplary embodiment in the tenth exemplary embodiment is adopted (where 90×n<16200).

[23]

It is assumed that (modulation scheme of $s_1(t)$ (first complex signal s1), modulation scheme of $s_2(t)$ (second complex signal s2)) is set to (16QAM,16QAM), and that the code length (block length) of the error correction code is set to 16200 bits (the value of (X+Y) is 8).

[23-1] The number of bits of the adjustment bit string (to be added) is (72×n) when one of the methods of the modifications of the first to third exemplary embodiments in the tenth exemplary embodiment is adopted.

[23-2] The number of bits of the temporarily-inserted adjustment bit string (known information) is (72×n) when the method of the modification of the fourth exemplary embodiment in the tenth exemplary embodiment is adopted (where 72×n<16200).

[23-3] The number of bits of PunNum (the bits to be deleted) is (72×n) when the method of the modification of the eighth exemplary embodiment in the tenth exemplary embodiment is adopted (where 72×n<16200).

[24]

It is assumed that (modulation scheme of $s_1(t)$ (first complex signal s1), modulation scheme of $s_2(t)$ (second complex signal s2)) is set to (16QAM,64QAM), and that the code length (block length) of the error correction code is set to 16200 bits (the value of (X+Y) is 10).

[24-1] The number of bits of the adjustment bit string (to be added) is (90×n) when one of the methods of the modifications of the first to third exemplary embodiments in the tenth exemplary embodiment is adopted.

[24-2] The number of bits of the temporarily-inserted adjustment bit string (known information) is (90×n) when the method of the modification of the fourth exemplary embodiment in the tenth exemplary embodiment is adopted (where 90×n<16200).

[24-3] The number of bits of PunNum (the bits to be deleted) is (90×n) when the method of the modification of the eighth exemplary embodiment in the tenth exemplary embodiment is adopted (where 90×n<16200).

[25]

It is assumed that (modulation scheme of $s_1(t)$ (first complex signal s1), modulation scheme of $s_2(t)$ (second complex signal s2)) is set to (16QAM,256QAM), and that the code length (block length) of the error correction code is set to 16200 bits (the value of (X+Y) is 12).

[25-1] The number of bits of the adjustment bit string (to be added) is (36×n) when one of the methods of the modifications of the first to third exemplary embodiments in the tenth exemplary embodiment is adopted.

[25-2] The number of bits of the temporarily-inserted adjustment bit string (known information) is (36×n) when the method of the modification of the fourth exemplary embodiment in the tenth exemplary embodiment is adopted (where 36×n<16200).

[25-3] The number of bits of PunNum (the bits to be deleted) is (36×n) when the method of the modification of the eighth exemplary embodiment in the tenth exemplary embodiment is adopted (where 36×n<16200).

[26]

It is assumed that (modulation scheme of $s_1(t)$ (first complex signal s1), modulation scheme of $s_2(t)$ (second complex signal s2)) is set to (64QAM,256QAM), and that the code length (block length) of the error correction code is set to 16200 bits (the value of (X+Y) is 14).

[26-1] The number of bits of the adjustment bit string (to be added) is (126×n+54) when one of the methods of the modifications of the first to third exemplary embodiments in the tenth exemplary embodiment is adopted.

[26-2] The number of bits of the temporarily-inserted adjustment bit string (known information) is (126×n+72) when the method of the modification of the fourth exemplary embodiment in the tenth exemplary embodiment is adopted (where 126×n+72<16200).

[26-3] The number of bits of PunNum (the bits to be deleted) is (126×n+72) when the method of the modification of the eighth exemplary embodiment in the tenth exemplary embodiment is adopted (where 126×n+72<16200).

[27]

It is assumed that (modulation scheme of $s_1(t)$ (first complex signal s1), modulation scheme of $s_2(t)$ (second complex signal s2)) is set to (256QAM,256QAM), and that the code length (block length) of the error correction code is set to 16200 bits (the value of (X+Y) is 16).

[27-1] The number of bits of the adjustment bit string (to be added) is (144×n+72) when one of the methods of the modifications of the first to third exemplary embodiments in the tenth exemplary embodiment is adopted.

[27-2] The number of bits of the temporarily-inserted adjustment bit string (known information) is (144×n+72) when the method of the modification of the fourth exemplary embodiment in the tenth exemplary embodiment is adopted (where 144×n+72<16200).

[27-3] The number of bits of PunNum (the bits to be deleted) is (144×n+72) when the method of the modification of the eighth exemplary embodiment in the tenth exemplary embodiment is adopted (where 144×n+72<16200).

[28]

It is assumed that (modulation scheme of $s_1(t)$ (first complex signal s1), modulation scheme of $s_2(t)$ (second complex signal s2)) is set to (QPSK,QPSK), and that the code length (block length) of the error correction code is set to 64800 bits (the value of (X+Y) is 4).

[28-1] The number of bits of the adjustment bit string (to be added) is (36×n) when one of the methods of the modifications of the first to third exemplary embodiments in the tenth exemplary embodiment is adopted.

[28-2] The number of bits of the temporarily-inserted adjustment bit string (known information) is (36×n) when the method of the modification of the fourth exemplary embodiment in the tenth exemplary embodiment is adopted (where 36×n<64800).

[28-3] The number of bits of PunNum (the bits to be deleted) is (36×n) when the method of the modification of the eighth exemplary embodiment in the tenth exemplary embodiment is adopted (where 36×n<64800).

[29]

It is assumed that (modulation scheme of $s_1(t)$ (first complex signal s1), modulation scheme of $s_2(t)$ (second complex signal s2)) is set to (QPSK,16QAM), and that the code length (block length) of the error correction code is set to 64800 bits (the value of (X+Y) is 6).

[29-1] The number of bits of the adjustment bit string (to be added) is (18×n) when one of the methods of the modifications of the first to third exemplary embodiments in the tenth exemplary embodiment is adopted.

[29-2] The number of bits of the temporarily-inserted adjustment bit string (known information) is (18×n) when the method of the modification of the fourth exemplary embodiment in the tenth exemplary embodiment is adopted (where 18×n<64800).

[29-3] The number of bits of PunNum (the bits to be deleted) is (18×n) when the method of the modification of the eighth exemplary embodiment in the tenth exemplary embodiment is adopted (where 18×n<64800).

[30]

It is assumed that (modulation scheme of $s_1(t)$ (first complex signal s1), modulation scheme of $s_2(t)$ (second complex signal s2)) is set to (QPSK,64QAM), and that the code length (block length) of the error correction code is set to 64800 bits (the value of (X+Y) is 8).

[30-1] The number of bits of the adjustment bit string (to be added) is (72×n) when one of the methods of the modifications of the first to third exemplary embodiments in the tenth exemplary embodiment is adopted.

[30-2] The number of bits of the temporarily-inserted adjustment bit string (known information) is (72×n) when the method of the modification of the fourth exemplary embodiment in the tenth exemplary embodiment is adopted (where 72×n<64800).

[30-3] The number of bits of PunNum (the bits to be deleted) is (72×n) when the method of the modification of the eighth exemplary embodiment in the tenth exemplary embodiment is adopted (where 72×n<64800).

[31]

It is assumed that (modulation scheme of $s_1(t)$ (first complex signal s1), modulation scheme of $s_2(t)$ (second complex signal s2)) is set to (QPSK,256QAM), and that the code length (block length) of the error correction code is set to 64800 bits (the value of (X+Y) is 10).

[31-1] The number of bits of the adjustment bit string (to be added) is (90×n) when one of the methods of the modifications of the first to third exemplary embodiments in the tenth exemplary embodiment is adopted.

[31-2] The number of bits of the temporarily-inserted adjustment bit string (known information) is (90×n) when the method of the modification of the fourth exemplary embodiment in the tenth exemplary embodiment is adopted (where 90×n<64800). [31-3] The number of bits of PunNum (the bits to be deleted) is (90×n) when the method of the modification of the eighth exemplary embodiment in the tenth exemplary embodiment is adopted (where 90×n<64800).

[32]

It is assumed that (modulation scheme of $s_1(t)$ (first complex signal s1), modulation scheme of $s_2(t)$ (second complex signal s2)) is set to (16QAM,16QAM), and that the code length (block length) of the error correction code is set to 64800 bits (the value of (X+Y) is 8).

[32-1] The number of bits of the adjustment bit string (to be added) is (72×n) when one of the methods of the modifications of the first to third exemplary embodiments in the tenth exemplary embodiment is adopted.

[32-2] The number of bits of the temporarily-inserted adjustment bit string (known information) is (72×n) when the method of the modification of the fourth exemplary embodiment in the tenth exemplary embodiment is adopted (where 72×n<64800).

[32-3] The number of bits of PunNum (the bits to be deleted) is (72×n) when the method of the modification of the eighth exemplary embodiment in the tenth exemplary embodiment is adopted (where 72×n<64800).

[33]

It is assumed that (modulation scheme of $s_1(t)$ (first complex signal s1), modulation scheme of $s_2(t)$ (second complex signal s2)) is set to (16QAM,64QAM), and that the code length (block length) of the error correction code is set to 64800 bits (the value of (X+Y) is 10).

[33-1] The number of bits of the adjustment bit string (to be added) is (90×n) when one of the methods of the modifications of the first to third exemplary embodiments in the tenth exemplary embodiment is adopted.

[33-2] The number of bits of the temporarily-inserted adjustment bit string (known information) is (90×n) when the method of the modification of the fourth exemplary embodiment in the tenth exemplary embodiment is adopted (where 90×n<64800).

[33-3] The number of bits of PunNum (the bits to be deleted) is (90×n) when the method of the modification of the eighth exemplary embodiment in the tenth exemplary embodiment is adopted (where 90×n<64800).

[34]

It is assumed that (modulation scheme of $s_1(t)$ (first complex signal s1), modulation scheme of $s_2(t)$ (second complex signal s2)) is set to (16QAM,256QAM), and that the code length (block length) of the error correction code is set to 64800 bits (the value of (X+Y) is 12).

[34-1] The number of bits of the adjustment bit string (to be added) is (36×n) when one of the methods of the modifications of the first to third exemplary embodiments in the tenth exemplary embodiment is adopted.

[34-2] The number of bits of the temporarily-inserted adjustment bit string (known information) is (36×n) when the method of the modification of the fourth exemplary embodiment in the tenth exemplary embodiment is adopted (where 36×n<64800).

[34-3] The number of bits of PunNum (the bits to be deleted) is (36×n) when the method of the modification of the eighth exemplary embodiment in the tenth exemplary embodiment is adopted (where 36×n<64800).

[35]

It is assumed that (modulation scheme of $s_1(t)$ (first complex signal s1), modulation scheme of $s_2(t)$ (second complex signal s2)) is set to (64QAM,256QAM), and that the code length (block length) of the error correction code is set to 64800 bits (the value of (X+Y) is 14).

[35-1] The number of bits of the adjustment bit string (to be added) is (126×n+90) when one of the methods of the modifications of the first to third exemplary embodiments in the tenth exemplary embodiment is adopted.

[35-2] The number of bits of the temporarily-inserted adjustment bit string (known information) is (126×n+36) when the method of the modification of the fourth exemplary embodiment in the tenth exemplary embodiment is adopted (where 126×n+36<64800).

[35-3] The number of bits of PunNum (the bits to be deleted) is (126×n+36) when the method of the modification of the eighth exemplary embodiment in the tenth exemplary embodiment is adopted (where 126×n+36<64800).

[36]

It is assumed that (modulation scheme of $s_1(t)$ (first complex signal s1), modulation scheme of $s_2(t)$ (second complex signal s2)) is set to (256QAM,256QAM), and that the code length (block length) of the error correction code is set to 64800 bits (the value of (X+Y) is 16).

[36-1] The number of bits of the adjustment bit string (to be added) is (144×n) when one of the methods of the modifications of the first to third exemplary embodiments in the tenth exemplary embodiment is adopted.

[36-2] The number of bits of the temporarily-inserted adjustment bit string (known information) is (144×n) when the method of the modification of the fourth exemplary embodiment in the tenth exemplary embodiment is adopted (where 144×n<64800).

[36-3] The number of bits of PunNum (the bits to be deleted) is (144×n) when the method of the modification of the eighth exemplary embodiment in the tenth exemplary embodiment is adopted (where 144×n<64800).

For example, the communication system can set one of the modulation scheme sets of (QPSK,QPSK), (QPSK, 16QAM), (QPSK,64QAM), (QPSK,256QAM), (16QAM, 16QAM), (16QAM,64QAM), (16QAM,256QAM), (64QAM,256QAM), and (256QAM,256QAM) as (modulation scheme of $s_1(t)$ (first complex signal s1), modulation scheme of $s_2(t)$ (second complex signal s2)), and set the code length (block length) of the error correction code to one of 16200 bits and 64800 bits. However, change period z of θ(i) in the tenth exemplary embodiment is set to 9.

At this point, it is necessary to satisfy one of the conditions described in [19] to [36], One of the characteristics is that, even if (modulation scheme of $s_1(t)$ (first complex signal s1), modulation scheme of $s_2(t)$ (second complex signal s2)) is a certain modulation scheme set, the number of bits to be added or the number of bits to be deleted varies depending on the code length (block length) of the error correction code.

Case 3 and Case 4 are cited as a specific example.

Case 3:

It is assumed that (modulation scheme of $s_1(t)$ (first complex signal s1), modulation scheme of $s_2(t)$ (second complex signal s2)) is (64QAM,256QAM). It is assumed that the transmitter can set the code length (block length) of the error correction code to one of the 16200 bits and the 64800 bits.

When the transmitter selects the 16200 bits as the code length (block length) of the error correction code, for example, the number of bits of the adjustment bit string (to be added) is set to 54 in applying [26-1], the number of bits of the temporarily-inserted adjustment bit string (known information) is set to 72 in applying [26-2], and the number of bits of PunNum (to be deleted) is set to 72 in applying [26-3], When the transmitter selects the 64800 bits as the code length (block length) of the error correction code, for example, the number of bits of the adjustment bit string (to be added) is set to 90 in applying [35-1], the number of bits of the temporarily-inserted adjustment bit string (known information) is set to 36 in applying [35-2], and the number of bits of PunNum (to be deleted) is set to 36 in applying [35-3], Case 4:

It is assumed that (modulation scheme of $s_1(t)$ (first complex signal s1), modulation scheme of $s_2(t)$ (second complex signal s2)) is (256QAM,256QAM). It is assumed that the transmitter can set the code length (block length) of the error correction code to one of the 16200 bits and the 64800 bits.

When the transmitter selects the 16200 bits as the code length (block length) of the error correction code, for example, the number of bits of the adjustment bit string (to be added) is set to 72 in applying [27-1], the number of bits of the temporarily-inserted adjustment bit string (known information) is set to 72 in applying [27-2], and the number of bits of PunNum (to be deleted) is set to 72 in applying [27-3], When the transmitter selects the 64800 bits as the code length (block length) of the error correction code, for example, the number of bits of the adjustment bit string (to be added) is set to 0 in applying [36-1], the number of bits of the temporarily-inserted adjustment bit string (known information) is set to 0 in applying [36-2], and the number of bits of PunNum (to be deleted) is set to 0 in applying [36-3],

Twelfth Exemplary Embodiment

A method for applying the bit length adjusting methods of the first to eleventh exemplary embodiments to a DVB standard will be described in a twelfth exemplary embodiment.

The case that the method is applied to a broadcasting system in which a DVB (Digital Video Broadcasting)—T2 (T: Terrestrial) standard is used will be described below. First, a frame configuration of the broadcasting system in which the DVB-T2 standard is used will be described.

Figure 106:
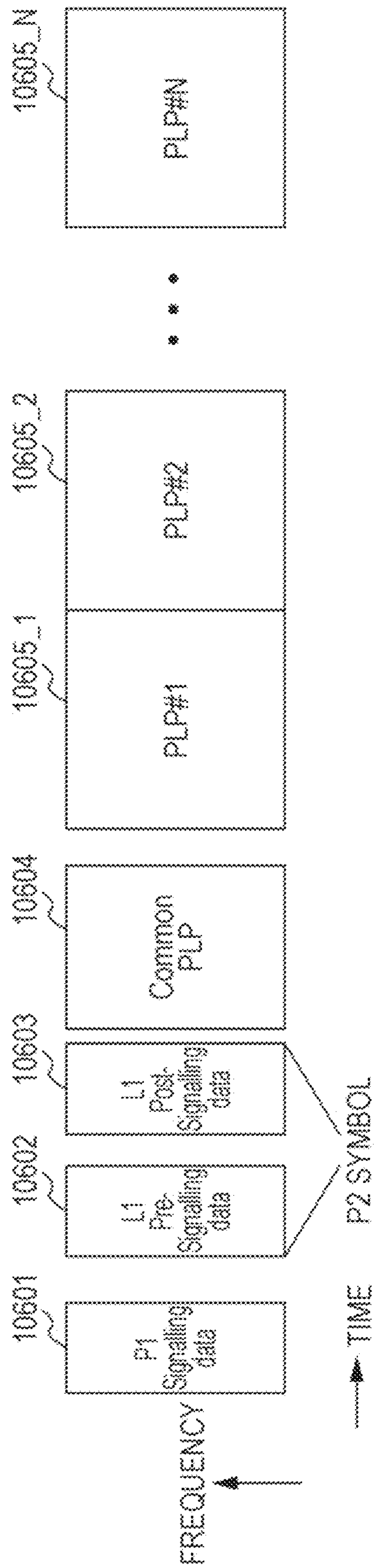
FIG. 106 is a view illustrating an outline of the frame configuration.

FIG. 106 illustrates an outline of the frame configuration of the signal transmitted from the broadcasting station in the DVB-T2 standard. In the DVB-T2 standard, the frame is constructed on the time-frequency axis because of the use of the OFDM scheme. FIG. 106 illustrates the frame configuration on the time-frequency axis, the frame is constructed with P1 signalling data (hereinafter, sometimes referred to as a P1 symbol) (10601), L1 pre-signalling data (10602), L1 post-signalling data (10603), common PLP (10604), and PLPs (Physical Layer Pipes) #1 to #N (10605_1 to 10605_N) (hereinafter, L1 pre-signalling data (10602) and L1 post-signalling data (10603) are referred to as P2 symbol). The frame constructed with P1 signalling data (10601), L1 pre-signalling data (10602), L1 post-signalling data (10603), common PLP (10604), and PLPs #1 to #N (10605_1 to 10605_N) is referred to as a T2 frame, and is a unit of the frame configuration.

P1 signalling data (10601) transmits information, which indicates a symbol for performing the signal detection and frequency synchronization (including frequency offset estimation) with the receiver, about an FFT (Fast Fourier Transform) size in the frame, and also transmits information indicating which one of an SISO (Single-Input Single-Output) scheme and an MISO (Multiple-Input Single-Output) scheme is used to transmit the modulated signal (in the DVB-T2 standard, one modulated signal is transmitted by the SISO scheme, a plurality of modulated signals are transmitted by the MISO scheme, and the time-space block code described in NPLs 5, 7, and 8 is used).

In the twelfth exemplary embodiment, a plurality of modulated signals may be generated for the SISO scheme, and transmitted from a plurality of antennas.

L1 pre-signalling data (10602) transmits information about a guard interval used in a transmission frame, information about a signal processing method for reducing a PAPR (Peak to Average Power Ratio), a modulation scheme used to transmit the L1 post-signalling data, FEC (Forward Error Correction), information about a coding rate of the FEC, information about a size of the L1 post-signalling data and information size, information about a pilot pattern, information about a cell (frequency region) unique number, and information indicating which one of a normal mode and an extension mode (the normal mode and the extension mode differ from each other in the number of sub-carriers used in the data transmission) is used.

L1 post-signalling data (10603) transmits information about the number of PLPs, information about the frequency region to be used, information about the unique number of each PLP, the modulation scheme used to transmit each PLP, the EFC, the information about the coding rate of the FEC, and information about the number of blocks transmitted using each PLP.

Common PLP (10604) and PLPs #1 to #N (10605_1 to 10605_N) are a region where the data is transmitted.

Figure 107:
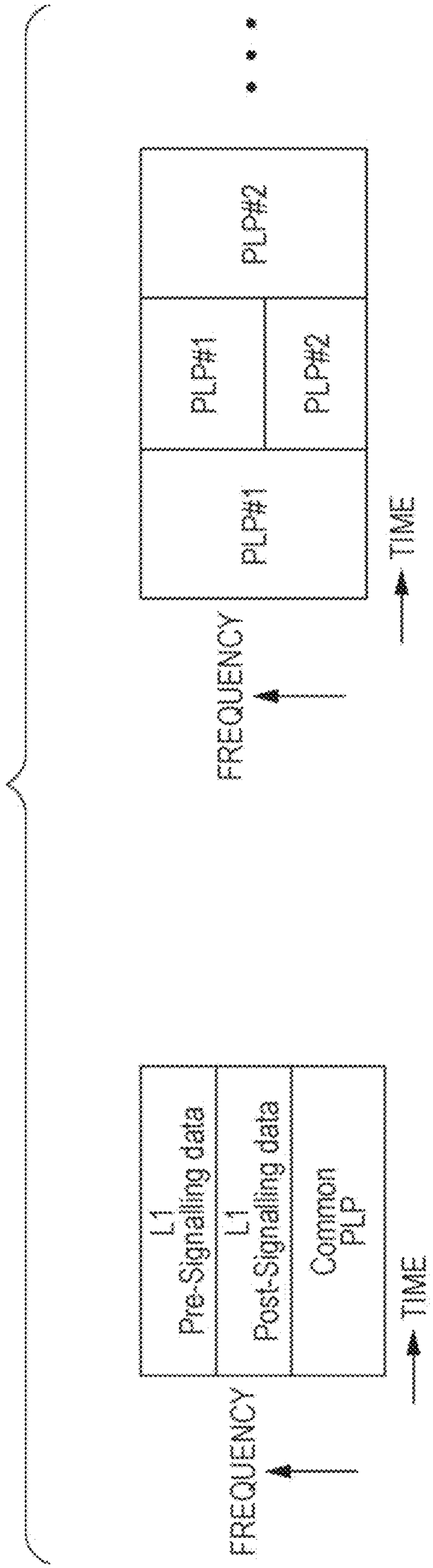
FIG. 107 is a view illustrating an example in which at least two kinds of signals exist at an identical clock time.

In the frame configuration of FIG. 106, P1 signalling data (10601), L1 pre-signalling data (10602), L1 post-signalling data (10603), common PLP (10604), and PLPs #1 to #N (10605_1 to 10605_N) are transmitted in a time-division manner. However, actually at least two kinds of signals exist at the identical clock time. FIG. 107 illustrates an example of the case that at least two kinds of the signals exist at the identical clock time. As illustrated in FIG. 107, sometimes the L1 pre-signalling data, the L1 post-signalling data, and the common PLP exist at the identical clock time or PLPs #1 and #2 exist at the identical clock time. That is, the frame is constructed while each signal is transmitted in both the time division manner and the frequency-division manner.

Figure 108:
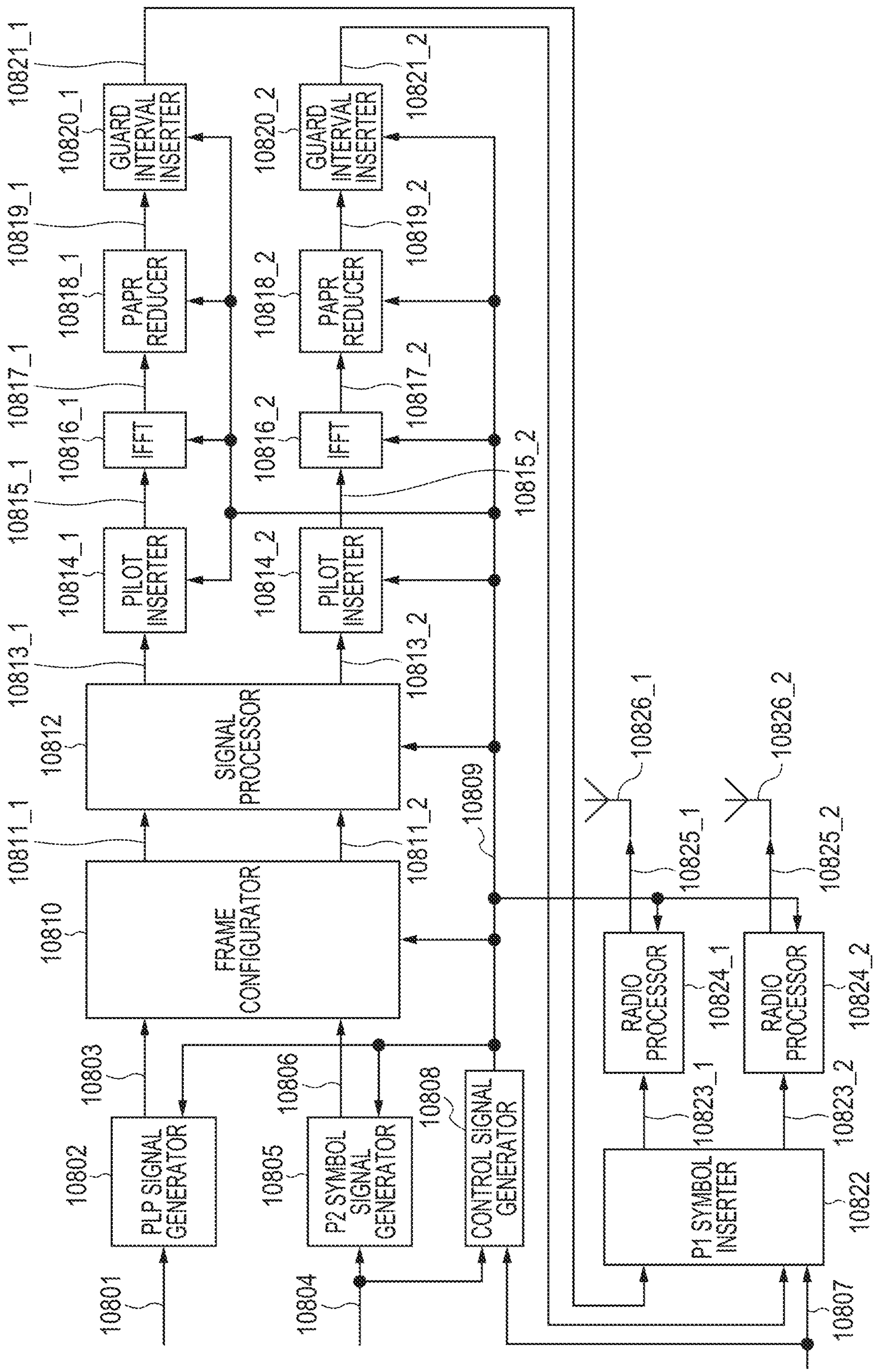
FIG. 108 is a view illustrating a configuration example of the transmitter.

FIG. 108 illustrates an example of the configuration of the transmitter to which the transmission method in which the precoding and the phase change are performed is applied (for example, in the broadcasting station) pursuant to the DVB-T2 standard.

PLP transmission data 10801 (data for the plurality of PLPs) and control signal 10809 are input to PLP signal generator 10802, and PLP signal generator 10802 performs the error correction coding based on information about the error correction coding of each PLP included in control signal 10809 and information about the modulation scheme, performs the mapping based on the modulation scheme, and outputs PLP (quadrature) baseband signal 10803.

P2 symbol transmission data 10804 and control signal 10809 are input to P2 symbol signal generator 10805, and P2 symbol signal generator 10805 performs the error correction coding based on information about the error correction coding of the P2 symbol and the information about the modulation scheme, which are included in control signal 10809, performs the mapping based on the modulation scheme, and outputs P2 symbol (quadrature) baseband signal 10806.

P1 symbol transmission data 10807 and P2 symbol transmission data 10804 are input to control signal generator 10808, and control signal generator 10808 outputs information about the method (the error correction code, the coding rate of the error correction code, the modulation scheme, the block length, the frame configuration, the selected transmission method including the transmission method in which the precoding matrix is regularly switched, the pilot symbol inserting method, the information about the IFFT (Inverse Fast Fourier Transform)/FFT, the information about the PAPR reducing method, and the information about the guard interval inserting method) for transmitting each symbol group (P1 signalling data (10601), L1 pre-signalling data (10602), L1 post-signalling data (10603), common PLP (10604), and PLPs #1 to #N (10605_1 to 10605_N)) in FIG. 106 as control signal 10809.

PLP baseband signal 10812, P2 symbol baseband signal 10806, and control signal 10809 are input to frame configurator 10810, and frame configurator 10810 performs the rearrangement on the frequency and time axes based on the frame configuration information included in the control signal, and outputs (quadrature) baseband signal 10811_1 (the mapped signal, namely, the baseband signal based on the modulation scheme used) of stream 1 and (quadrature) baseband signal 10811_2 (the mapped signal, namely, the baseband signal based on the modulation scheme used) of stream 2 according to the frame configuration.

Baseband signal 10811_1 of stream 1, baseband signal 10811_2 of stream 2, and control signal 10809 are input to signal processor 10812, and signal processor 10812 outputs post-signal-processing modulated signal 1 (10813_1) and post-signal-processing modulated signal 2 (108313_2) based on the transmission method information included in control signal 7609.

The operation of signal processor 10812 is described in detail later.

Post-signal-processing modulated signal 1 (10813_1) and control signal 10809 are input to pilot inserter 10814_1, and pilot inserter 10814_1 inserts the pilot symbol in post-signal-processing modulated signal 1 (10813_1) based on the pilot symbol inserting method information included in control signal 10809, and outputs pilot-symbol-inserted modulated signal 10815_1.

Post-signal-processing modulated signal 2 (10813_2) and control signal 10809 are input to pilot inserter 10814_2, and pilot inserter 10814_2 inserts the pilot symbol in post-signal-processing modulated signal 1 (10813_2) based on the pilot symbol inserting method information included in control signal 10809, and outputs pilot-symbol-inserted modulated signal 10815_2.

Pilot-symbol-inserted modulated signal 10815_1 and control signal 10809 are input to IFFT (Inverse Fast Fourier Transform) section 10816_1, and IFFT (Inverse Fast Fourier Transform) section 10816_1 performs the IFFT based on the IFFT method information included in control signal 10809, and outputs post-IFFT signal 10816_1.

Pilot-symbol-inserted modulated signal 10815_2 and control signal 10809 are input to IFFT section 10816_2, and IFFT section 10816_2 performs the IFFT based on the IFFT method information included in control signal 10809, and outputs post-IFFT signal 10817_2.

Post-IFFT signal 10817_1 and control signal 10809 are input to PAPR reducer 10818_1, and PAPR reducer 10818_1 performs PAPR reducing processing on post-IFFT signal 10817_1 based on the PAPR reduction information included in control signal 10809, and outputs PAPR-reduced signal 10819_1.

Post-IFFT signal 10817_2 and control signal 10809 are input to PAPR reducer 10818_2, and PAPR reducer 10818_2 performs PAPR reducing processing on post-IFFT signal 10817_2 based on the PAPR reduction information included in control signal 10809, and outputs PAPR-reduced signal 10819_2.

PAPR-reduced signal 10819_1 and control signal 10809 are input to guard interval inserter 10820_1, and guard interval inserter 10820_1 inserts the guard interval in PAPR-reduced signal 10819_1 based on the guard interval inserting method information included in control signal 10809, and outputs guard-interval-inserted signal 10821_1.

PAPR-reduced signal 10819_2 and control signal 10809 are input to guard interval inserter 10820_2, and guard interval inserter 10820_2 inserts the guard interval in PAPR-reduced signal 10819_2 based on the guard interval inserting method information included in control signal 10809, and outputs guard-interval-inserted signal 10821_2.

Guard-interval-inserted signal 10821_1, guard-interval-inserted signal 10821_2, and P1 symbol transmission data 10807 are input to P1 symbol inserter 10822, and P1 symbol inserter 10822 generates the signal of the P1 symbol from P1 symbol transmission data 10807, adds the P1 symbol signal to guard-interval-inserted signal 10821_1, adds the P1 symbol to P1-symbol-added signal 10823_1 and guard-interval-inserted signal 10821_2, and outputs P1-symbol-added signal 10823_2. The signal of the P1 symbol may be added to both or one of P1-symbol-added signal 10823_1 and P1-symbol-added signal 10823_2. In the case that the signal of the P1 symbol is added to one of P1-symbol-added signal 10823_1 and P1-symbol-added signal 10823_2, in an interval of the signal to which the P1 symbol is added, the signal of zero exists as the baseband signal in the signal to which the P1 symbol is not added.

P1-symbol-added signal 10823_1 is input to radio processor 10824_1, and radio processor 10824_1 performs the pieces of processing such as the frequency conversion and the amplification on P1-symbol-added signal 10823_1, and outputs transmitted signal 10825_1. Transmitted signal 10825_1 is output as a radio wave from antenna 10826_1.

P1-symbol-added signal 10823_2 is input to radio processor 10824_2, and radio processor 10824_2 performs the pieces of processing such as the frequency conversion and the amplification on P1-symbol-added signal 10823_2, and outputs transmitted signal 10825_2. Transmitted signal 10825_2 is output as a radio wave from antenna 10826_2.

Figure 109:
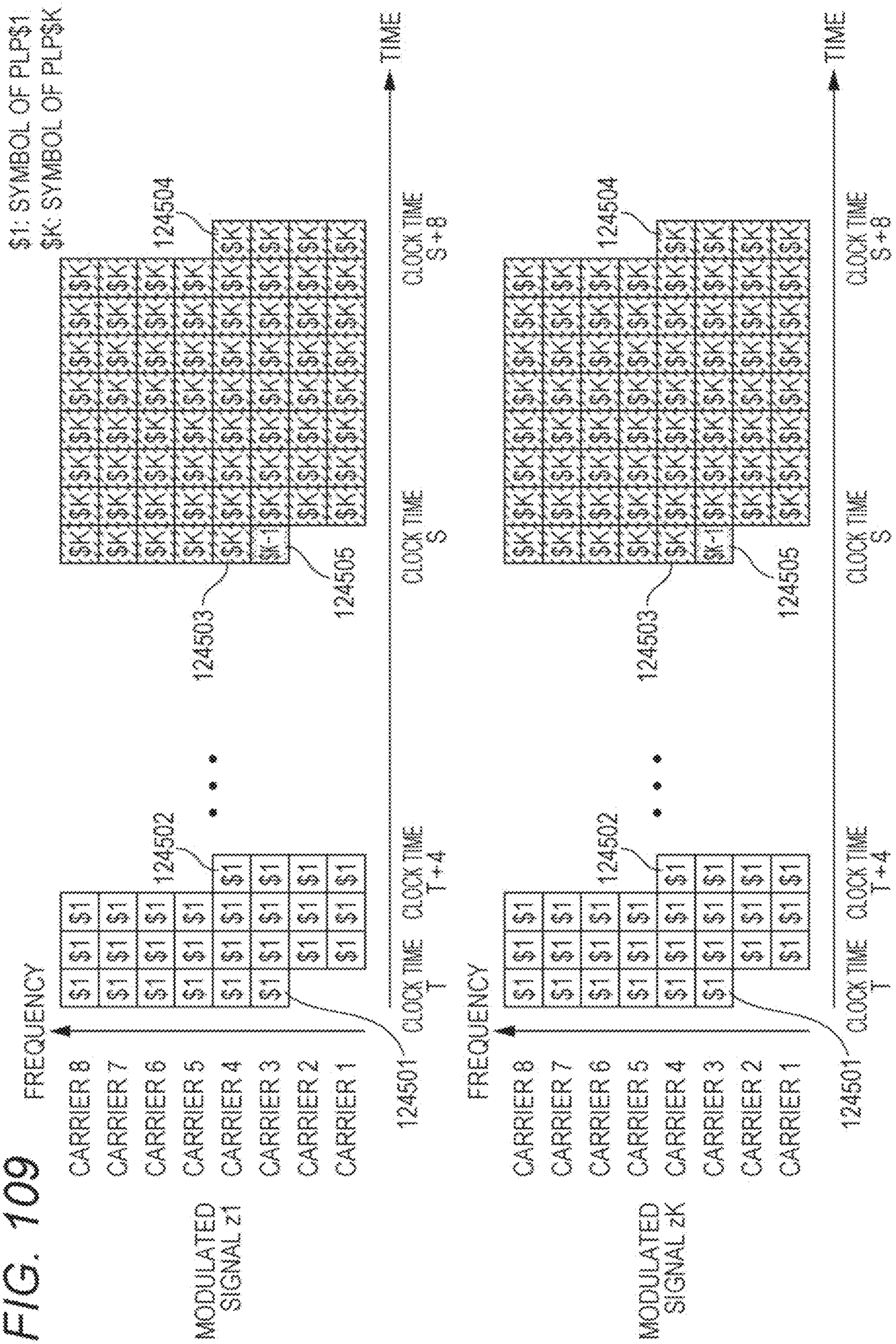
FIG. 109 is a view illustrating an example of the frame configuration.

For example, it is assumed that each broadcasting station transmits the symbol with the frame configuration in FIG. 106. FIG. 109 illustrates an example of the frame configuration on the frequency-time axis when the broadcasting station transmits two modulated signals described in the first to eleventh exemplary embodiments, namely, PLP (#1 is changed to $1 in order to avoid confusion) $1 and PLP $K from two antennas.

As illustrated in FIG. 109, a slot (symbol) exists in PLP $1, carrier 3 at clock time T is a head (124501) of the slot, and carrier 4 at clock time (T+4) is an end (124502) of the slot.

That is, a first slot is carrier 3 at clock time T for PLP $1, a second slot is carrier 4 at clock time T, a third slot is carrier 5 at clock time T, . . . , a seventh slot is carrier 1 at clock time (T+1), an eighth slot is carrier 2 at clock time (T+1), a ninth slot is carrier 3 at clock time (T+1), . . . , a fourteenth slot is carrier 8 at clock time (T+1), a fifteenth slot is carrier 0 at clock time (T+2), . . . .

As illustrated in FIG. 109, a slot (symbol) exists in PLP $K, carrier 4 at clock time S is a head (124503) of the slot, and carrier 4 at clock time (S+8) is an end (124504) of the slot.

That is, a first slot is carrier 4 at clock time S for PLP $K, a second slot is carrier 5 at clock time S, a third slot is carrier 6 at clock time S, . . . , a fifth slot is carrier 8 at clock time S, a ninth slot is a carrier 1 at clock time (S+1), a tenth slot is carrier 2 at clock time (S+1), . . . , a sixteenth slot is carrier 8 at clock time (S+1), a seventeenth slot is carrier 0 at clock time (S+2), . . . .

The information about the slot used in each PLP including the information about the leading slot (symbol) of each PLP and the information about the last slot (symbol) is transmitted by control symbols such as the P1 symbol, the P2 symbol, and the control symbol group.

The operation of signal processor 10812 in FIG. 108 will be described below. It is assumed that signal processor 10812 includes an encoder for the LDPC code, a mapper, a precoder, a bit length adjuster, and interleaver.

Control signal 10809 is input to signal processor 10812, and signal processor 10812 decides the signal processing method based on the code length (block length) of the LDPC code, the transmission method information (SISO transmission, MIMO transmission, and MISO transmission), the modulation scheme information, and the like, which are included in control signal 10809. In the case that the MIMO transmission is selected as the transmission scheme, based on the code length (block length) of the LDPC code, the modulation scheme set, and one of the bit length adjusting methods of the first to eleventh exemplary embodiments, signal processor 10812 adjusts the bit length, performs the interleaving and the mapping, performs the precoding for some situations, and outputs post-signal-processing modulated signal 1 (10813_1) and post-signal-processing modulated signal 2 (10813_2).

As described above, the method for transmitting each PLP (for example, the transmission method for transmitting one stream, the transmission method in which the time-space block code is used, and the method for transmitting two streams) and the information about the currently-used modulation scheme are transmitted to the terminal using the P1 symbol, the P2 symbol, and the control symbol group.

The operation of the terminal at that time will be described below.

Figure 110:
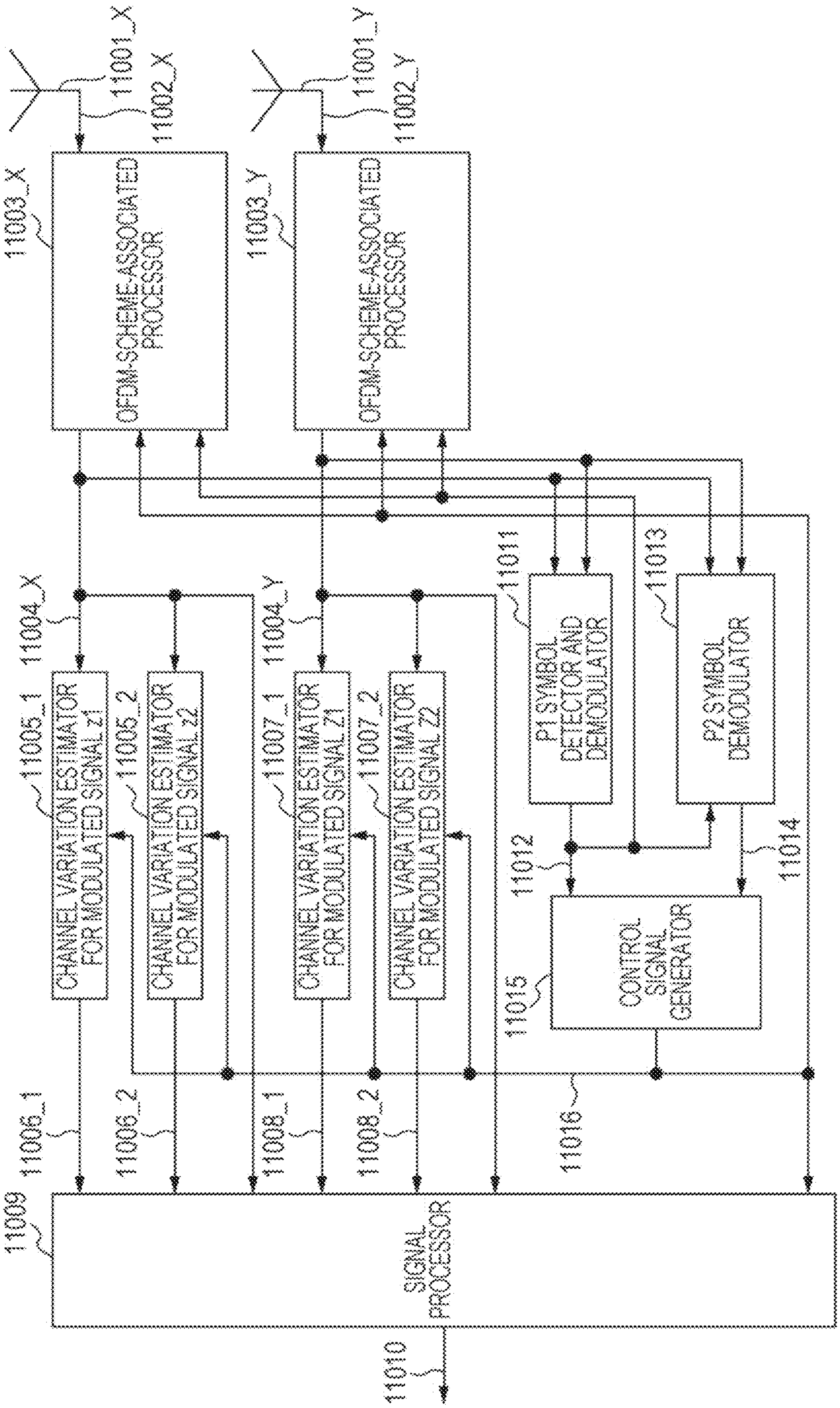
FIG. 110 is a view illustrating a configuration example of the receiver.

Referring to FIG. 110, post-signal-processing signals 11004_X and 11004_Y that are of the signals transmitted from broadcasting station (FIG. 108) are input to P1 symbol detector and decoder 11011, and P1 symbol detector and decoder 11011 detects the P1 symbol to perform the signal detection and time-frequency synchronization, obtains the control information included in the P1 symbol (by performing the demodulation and the error correction decoding), and outputs P1 symbol control information 11012.

Received signal 11002_X received with antenna 11001_X is input to OFDM-scheme-associated processor 11003_X, and OFDM-scheme-associated processor 11003_X performs the reception-side signal processing for the OFDM scheme, and outputs post-signal-processing signal 11004_X. Similarly, received signal 11002_Y received with antenna 11001_Y is input to OFDM-scheme-associated processor 11003_Y, and OFDM-scheme-associated processor 11003_Y performs the reception-side signal processing for the OFDM scheme, and outputs post-signal-processing signal 11004_Y.

P1 symbol control information 11012 is input to OFDM-scheme-associated processors 11003_X and 11003_Y, and OFDM-scheme-associated processors 11003_X and 11003_Y change the signal processing method for the OFDM scheme based on P1 symbol control information 11012 (as described above, this is because the P1 symbol includes the information about the method for transmitting the signal transmitted from the broadcasting station).

Post-signal-processing signals 11004_X and 11004_Y and P1 symbol control information 11012 are input to P2 symbol demodulator 11013, and P2 symbol demodulator 11013 performs the signal processing based on the P1 symbol control information, performs the demodulation (including the error correction decoding), and outputs P2 symbol control information 11014.

P1 symbol control information 11012 and P2 symbol control information 11014 are input to control information generator 11015, and control information generator 11015 bundles the pieces of control information (about the reception operation), and outputs the bundled control information as control signal 11016. As illustrated in FIG. 110, control signal 11016 is input to each section.

Post-signal-processing signal 11004_X and control signal 11016 are input to channel variation estimator 11005_1 for modulated signal $z_1$ (modulated signal $z_1$ is described in exemplary embodiment A1), and channel variation estimator 11005_1 for modulated signal $z_1$ estimates the channel variation between the antenna from which the transmitter transmits modulated signal $z_1$ and receiving antenna 11001_X using the pilot symbol included in post-signal-processing signal 11004_X, and outputs channel estimation signal 11006_1.

Post-signal-processing signal 11004_X and control signal 11016 are input to channel variation estimator 11005_2 for modulated signal $z_2$ (modulated signal $z_2$ is described in exemplary embodiment A1), and channel variation estimator 11005_2 for modulated signal $z_2$ estimates the channel variation between the antenna from which the transmitter transmits modulated signal $z_2$ and receiving antenna 11001_X using the pilot symbol included in post-signal-processing signal 11004_X, and outputs channel estimation signal 11006_2.

Post-signal-processing signal 11004_Y and control signal 11016 are input to channel variation estimator 11007_1 for modulated signal $z_1$ (modulated signal $z_1$ is described in exemplary embodiment A1), and channel variation estimator 11007_1 for modulated signal $z_1$ estimates the channel variation between the antenna from which the transmitter transmits modulated signal $z_1$ and receiving antenna 11001_Y using the pilot symbol included in post-signal-processing signal 11004_Y, and outputs channel estimation signal 11008_1.

Post-signal-processing signal 11004_Y and control signal 11016 are input to channel variation estimator 11007_2 for modulated signal $z_2$ (modulated signal $z_2$ is described in exemplary embodiment A1), and channel variation estimator 11007_2 for modulated signal $z_2$ estimates the channel variation between the antenna from which the transmitter transmits modulated signal $z_2$ and receiving antenna 11001_Y using the pilot symbol included in post-signal-processing signal 11004_Y, and outputs channel estimation signal 11008_2.

Signals 11006_1, 11006_2, 11008_1, 11008_2, 11004_X, and 11004_Y and control signal 11016 are input to signal processor 11009, and signal processor 11009 performs the demodulation and the decoding based on the pieces of information, such as the transmission scheme, the modulation scheme, the error correction coding scheme, the error correction coding rate, and the block size of the error correction code, which are included in control signal 11016 and used to transmit each PLP, and outputs received data 11010. The receiver extracts the necessary PLP from the information about the slot, which is included in the control symbols such as the P1 symbol, the P2 symbol, and the control symbol group and used by each PLP, demodulates (including signal separation and signal detection) the PLP, and performs the error correction decoding.

The configuration of the transmitter to which the transmission method in which the precoding and the phase change are performed is applied (for example, in the broadcasting station pursuant to the DVB-T2 standard) and the configuration of the receiver that receives the signal transmitted from the transmitter are mainly described above.

In the case that the broadcasting system in which the DVB-T2 standard is used is operated while the receiver that can receive the modulated signal pursuant to the DVB-T2 standard becomes already widespread, it is desirable that the receiver that can receive the modulated signal pursuant to the DVB-T2 standard is not influenced when a new standard is introduced.

A method for configuring the P1 symbol (P1 signalling data) and the P2 symbol (L1 pre-signalling data and L1 post-signalling data) in which the transmission method for transmitting one stream and the transmission method for transmitting two streams are introduced without influencing the receiver that can receive the modulated signal pursuant to the DVB-T2 standard and a method for configuring the P1 symbol (P1 signalling data) and the P2 symbol (L1 pre-signalling data and L1 post-signalling data) in which the bit length adjusting methods of the first to eleventh exemplary embodiments will be described below.

In the DVB-T2 standard, an S1 field of the P1 symbol (P1 signalling data) is specified as follows.

TABLE 1

| VALUE OF S1 | TYPE | DESCRIPTION |
|---|---|---|
| 000 | T2_SISO | The transmitter sets S1 to the value ("000") such that the receiver recognizes that the modulated signal is transmitted using the SISO transmission scheme in the DVB-T2 standard. |
| 001 | T2_MISO | The transmitter sets S1 to the value ("001") such that the receiver recognizes that the modulated signal is transmitted using the MISO transmission scheme in the DVB-T2 standard. |
| 010 | Reserved | Usable in a future system |
| 011 | | |
| 100 | | |
| 101 | | |
| 110 | | |
| 111 | | |

In TABLE 1, the SISO scheme is one in which one stream is transmitted using one antenna or a plurality of antennas, and the MISO scheme is one in which a plurality of modulated signals are generated using the space-time (or space-frequency) block code of NPLs 5, 7, and 8 to transmit the modulated signals using a plurality of antennas.

A type of the FEC (Forward Error Correction) used in the PLP is specified by two bits of PLP_FEC_TYPE of the P2 symbol L1 post-signalling data.

TABLE 2

| VALUE OF PLP_FEC_TYPE | PLP FEC TYPE |
|---|---|
| 00 | The transmitter sets the value of PLP_FEC_TYPE to the value ("00") in order that the receiver recognizes the use of the LDPC code having the block length of 16k (16200 bits). |
| 01 | The transmitter sets the value of PLP_FEC_TYPE to the value ("01") in order that the receiver recognizes the use of the LDPC code having the block length of 64k (64800 bits). |
| 10 | Reserved |
| 11 | |

The configurations of the P1 symbol and P2 symbol for the purpose of the bit length adjustment described in the first to eleventh exemplary embodiments without influencing the receiver that can receive the modulated signal pursuant to the DVB-T2 standard will be described below.

The S1 field of the P1 symbol (P1 signalling data) in the DVB-T2 standard is described above. In the DVB standard, the S1 field of the P1 symbol (P1 signalling data) is further specified as follows.

TABLE 3-1

| VALUE OF S1 | TYPE | DESCRIPTION |
|---|---|---|
| 000 | T2_SISO | The transmitter sets S1 to the value ("000") such that the receiver recognizes that the modulated signal is transmitted using the SISO transmission scheme in the DVB-T2 standard. |

TABLE 3-1-continued

| VALUE OF S1 | TYPE | DESCRIPTION |
|---|---|---|
| 001 | T2_MISO | The transmitter sets S1 to the value ("001") such that the receiver recognizes that the modulated signal is transmitted using the MISO transmission scheme in the DVB-T2 standard. |
| 010 | Non-T2 | SPECIAL MODE |
| 011 | T2_LITE_SISO | The transmitter sets S1 to the value ("011") such that the receiver recognizes that the modulated signal is transmitted using the SISO transmission scheme in the DVB-T2 Lite standard. |

TABLE 3-2

| VALUE OF S1 | TYPE | DESCRIPTION |
|---|---|---|
| 100 | T2_LITE_MISO | The transmitter sets S1 to the value ("100") such that the receiver recognizes that the modulated signal is transmitted using the MISO transmission scheme in the DVB-T2 Lite standard. |
| 101 | NGH_SISO | The transmitter sets S1 to the value ("101") such that the receiver recognizes that the modulated signal is transmitted using the SISO transmission scheme in the DVB-NGH standard. |
| 110 | NGH_MISO | The transmitter sets S1 to the value ("110") such that the receiver recognizes that the modulated signal is transmitted using the MISO transmission scheme in the DVB-NGH standard. |
| 111 | ESC | The transmitter sets S1 to the value ("111") in the case that a transmission scheme except for the transmission schemes defined in 000-110 is selected in S1. |

In TABLES 3-1 and 3-2, the SISO scheme is one in which one stream is transmitted using one antenna or a plurality of antennas, and the MISO scheme is one in which a plurality of modulated signals are generated using the space-time (or space-frequency) block code of NPLs 5, 7, and 8 to transmit the modulated signals using a plurality of antennas.

In the case that s2 field 1 and s2 field 2 are set for a new standard while S1 is set to the value ("111") in TABLES 3-1 and 3-2, the definition is as follows.

TABLE 4-1

| S2 field 1 | S2 field 2 | MEANING | DESCRIPTION |
|---|---|---|---|
| 000 | x | Preamble format of the NGH MIMO signal | When S1 has the value "111" while S2 field 1 and S2 field 2 have the values "000" and "x", the receiver recognizes that the modulated signal is transmitted using the MIMO transmission scheme in the DVB-NGH standard. When transmitting the modulated signal using the MIMO transmission scheme in the DVB-NGH standard, the transmitter sets S1, S2 field 1, and S2 field 2 to the values "111", "000", and "x", respectively. |

TABLE 4-1-continued

| S2 field 1 | S2 field 2 | MEANING | DESCRIPTION |
|---|---|---|---|
| 001 | x | Preamble format of the NGH hybrid SISO signal | When S1 has the value "111" while S2 field 1 and S2 field 2 have the values "001" and "x", the receiver recognizes that the modulated signal is transmitted using the hybrid SISO transmission scheme in the DVB-NGH standard. When transmitting the modulated signal using the hybrid SISO transmission scheme in the DVB-NGH standard, the transmitter sets S1, S2 field 1, and S2 field 2 to the values "111", "001", and "x", respectively. |

TABLE 4-2

| S2 field 1 | S2 field 2 | MEANING | DESCRIPTION |
|---|---|---|---|
| 010 | x | Preamble format of the NGH hybrid MISO signal | When S1 has the value "111" while S2 field 1 and S2 field 2 have the values "010" and "x", the receiver recognizes that the modulated signal is transmitted using the hybrid MISO transmission scheme in the DVB-NGH standard. When transmitting the modulated signal using the hybrid MISO transmission scheme in the DVB-NGH standard, the transmitter sets S1, S2 field 1, and S2 field 2 to the values "111", "010", and "x", respectively. |
| 011 | x | Preamble format of the NGH hybrid MIMO signal | When S1 has the value "111" while S2 field 1 and S2 field 2 have the values "011" and "x", the receiver recognizes that the modulated signal is transmitted using the hybrid MIMO transmission scheme in the DVB-NGH standard. When transmitting the modulated signal using the hybrid MIMO transmission scheme in the DVB-NGH standard, the transmitter sets S1, S2 field 1, and S2 field 2 to the values "111", "011", and "x", respectively. |

TABLE 4-3

| S2 field 1 | S2 field 2 | MEANING | DESCRIPTION |
|---|---|---|---|
| 100 | x | Ω STANDARD SISO | When S1 has the value "111" while S2 field 1 and S2 field 2 have the values "100" and "x", the receiver recognizes that the modulated signal is transmitted using the SISO transmission scheme in the Ω standard. When transmitting the modulated signal using the SISO transmission scheme in the Ω standard, the |

TABLE 4-3-continued

| S2 field 1 | S2 field 2 | MEANING | DESCRIPTION |
|---|---|---|---|
| | | | transmitter sets S1, S2 field 1, and S2 field 2 to the values "111", "100", and "x", respectively. |
| 101 | x | Ω STANDARD MISO | When S1 has the value "111" while S2 field 1 and S2 field 2 have the values "101" and "x", the receiver recognizes that the modulated signal is transmitted using the MISO transmission scheme in the Ω standard. When transmitting the modulated signal using the MISO transmission scheme in the Ω standard, the transmitter sets S1, S2 field 1, and S2 field 2 to the values "111", "101", and "x", respectively. |

TABLE 4-4

| S2 field 1 | S2 field 2 | MEANING | DESCRIPTION |
|---|---|---|---|
| 110 | x | Ω STANDARD MIMO | When S1 has the value "111" while S2 field 1 and S2 field 2 have the values "110" and "x", the receiver recognizes that the modulated signal is transmitted using the MIMO transmission scheme in the Ω standard. When transmitting the modulated signal using the MIMO transmission scheme in the Ω standard, the transmitter sets S1, S2 field 1, and S2 field 2 to the values "111", "110", and "x", respectively. |
| 111 | x | Reserved | For future extension |

In TABLES 4-1 to 4-4, "x" means an unsettled value (any value), the SISO scheme is one in which one stream is transmitted using one antenna or a plurality of antennas, the MISO scheme is one in which a plurality of modulated signals are generated using the space-time (or space-frequency) block code of NPLs 5, 7, and 8 to transmit the modulated signals using a plurality of antennas, and the MIMO scheme is one in which the two streams subjected to, for example, the actual precoding are transmitted.

Thus, using the P1 symbol transmitted from the transmitter, the receiver can recognize which one of the transmission method for transmitting the one stream and the transmission method for transmitting two streams is used to transmit the modulated signal.

As described above, when the transmission method for transmitting one stream, the SISO scheme (the scheme in which the one stream is transmitted using one antenna or a plurality of antennas), the MISO scheme (the scheme in which a plurality of modulated signals are generated using the space-time (or space-frequency) block code of NPLs X1 and X2 to transmit the modulated signals using a plurality of antennas), or the MIMO transmission scheme is selected, the two bits of PLP_FEC_TYPE of the P2 symbol L1 post-signalling data are defined as follows (the method for setting S1 and s2 of the P1 symbol is described in TABLES 3-1, 3-2, and 4-1 to 4-4).

TABLE 5

| VALUE OF PLP_FEC_TYPE | PLP FEC TYPE |
|---|---|
| 00 | The transmitter sets the value of PLP_FEC_TYPE to the value ("00") in order that the receiver recognizes the use of the LDPC code having the block length of 16k (16200 bits). |
| 01 | The transmitter sets the value of PLP_FEC_TYPE to the value ("01") in order that the receiver recognizes the use of the LDPC code having the block length of 64k (64800 bits). |
| 10 | Reserved |
| 11 | Reserved |

The three bits of PLP_NUM_PER_CHANNEL_USE of the P2 symbol L1 post-signalling data is defined as follows.

TABLE 6-1

| VALUE OF PLP_NUM_PER_CHANNEL_USE | BPCU (Bit Per Channel Use) (VALUE OF X + Y) | Modulation |
|---|---|---|
| 000 | 6 | When PLP_NUM_PRE_CHANNEL_USE has the value ("000"), the Tx1 modulation scheme is set to QPSK, and the Tx2 modulation scheme is set to 16QAM. (When PLP_NUM_PRE_CHANNEL_USE has the value ("000"), the s1 modulation scheme is set to QPSK, and the s2 modulation scheme is set to 16QAM.) |
| 001 | 8 | When PLP_NUM_PRE_CHANNEL_USE has the value ("000"), the Tx1 modulation scheme is set to 16QAM, and the Tx2 modulation scheme is set to 16QAM. (When PLP_NUM_PRE_CHANNEL_USE has the value ("000"), the s1 modulation scheme is set to 16QAM, and the s2 modulation scheme is set to 16QAM.) |

TABLE 6-2

| VALUE OF PLP_NUM_PRE_CHANNEL_USE | BPCU (Bit Per Channel Use) (VALUE OF X + Y) | Modulation |
|---|---|---|
| 010 | 10 | When PLP_NUM_PRE_CHANNEL_USE has the value ("000"), the Tx1 modulation scheme is set to 16QAM, and the Tx2 modulation scheme is set to 64QAM. (When PLP_NUM_PRE_CHANNEL_USE has the value ("000"), the s1 modulation scheme is set to 16QAM, and the s2 modulation scheme is set to 64QAM.) |
| 011 | 12 | When PLP_NUM_PRE_CHANNEL_USE has the value ("000"), the Tx1 modulation scheme is set to 64QAM, and the Tx2 modulation scheme is set to 64QAM. (When PLP_NUM_PRE_CHANNEL_USE has the value ("000"), the s1 modulation scheme is set to 64QAM, and the s2 modulation scheme is set to 64QAM.) |

TABLE 6-3

| VALUE OF PLP_NUM_PRE_CHANNEL_USE | BPCU (Bit Per Channel Use) (VALUE OF X + Y) | Modulation |
|---|---|---|
| 100 | 14 | When PLP_NUM_PRE_CHANNEL_USE has the value ("000"), the Tx1 modulation scheme is set to 64QAM, and the Tx2 modulation scheme is set to 256QAM. (When PLP_NUM_PRE_CHANNEL_USE has value ("000"), the s1 modulation scheme is set to 64QAM, and the s2 modulation scheme is set to 256QAM.) |
| 101 | 16 | When PLP_NUM_PRE_CHANNEL_USE has the value ("000"), the Tx1 modulation scheme is set to 256QAM, and the Tx2 modulation scheme is set to 256QAM. (When PLP_NUM_PRE_CHANNEL_USE has the value ("000"), the s1 modulation scheme is set to 256QAM, and the s2 modulation scheme is set to 256QAM.) |
| 101-111 | Reserved | Reserved |

It is assumed that the value of (X+Y), s1, and s2 are similar to those of the first to third exemplary embodiments.

Accordingly, in the case that Ω standard MIMO transmission scheme is assigned by the P1 symbol, signal processor 10812 in FIG. 108 adjusts the bit length (the number of bits of the adjustment bit string) by one of the bit length adjusting methods of the first to eleventh exemplary embodiments using the block length of the LDPC code assigned by the two bits of PLP_FEC_TYPE of the P2 symbol L1 post-signalling data and the s1 and s2 modulation schemes assigned by the three bits of PLP_NUM_PER_CHANNEL_USE of the P2 symbol L1 post-signalling data, performs the interleaving and the mapping, performs the precoding for some situations, and outputs post-signal-processing modulated signal 1 (10813_1) and post-signal-processing modulated signal 2 (10813_2).

The specific numerical examples of the bit length adjustment (the adjustment of the number of bits of the adjustment bit string) are described in the first to eleventh exemplary embodiments. However, the specific numerical examples are described only by way of example.

In the terminal receiver of FIG. 110, P1 symbol detector and decoder 11011 and P2 symbol demodulator 11013 obtain the P1 symbol, PLP_FEC_TYPE of the P2 symbol L1 post-signalling data, and PLP_NUM_PER_CHANNEL_USE of the P2 symbol L1 post-signalling data, control signal generator 11015 estimates the bit length adjusting method used in the transmitter based on the pieces of data, and signal processor 11009 performs the signal processing based on the estimated bit length adjusting method. The detailed signal processing is described in the operation examples of the receivers of the first to eleventh exemplary embodiments.

Therefore, the transmitter can efficiently transmit the modulated signal of the new standard in addition to the modulated signal based on the DVB-T2 standard, namely, the pieces of control information of the P1 and P2 symbols can be reduced. The effects of the first to eleventh exemplary embodiments can also be obtained in transmitting the modulated signal of the new standard.

Additionally, the receiver can determine whether the received signal is the signal of the DVB-T2 standard or the signal of the new standard using the P1 and P2 symbols, and the effects of the first to eleventh exemplary embodiments can be obtained.

The bit length adjustments of the first to eleventh exemplary embodiments are performed, and the broadcasting station transmits the modulated signal. Therefore, in the terminal receiver, the configurations of the P1 symbol control information and P2 symbol control information can be reduced because of the clear symbol constituting each block of the block code such as the LDPC code (absence of the symbol constructed with the pieces of data of the plurality of blocks) (for presence of the symbol constructed with the pieces of data of the plurality of blocks, it is necessary to add information about the frame configuration at that time).

The configurations of the P1 and P2 symbols of the twelfth exemplary embodiment are described only by way of example. Alternatively, the P1 and P2 symbols of the twelfth exemplary embodiment may be configured by another method. A symbol used to transmit the control information may newly be added to the transmission frame while the control information is transmitted using the P1 and P2 symbols.

(Supplement 1)

The plurality of exemplary embodiments may be combined.

In the description, "∀" designates a universal quantifier, and "∃" designates an existential quantifier.

In the description, for example, "radian" is used in a phase unit such as an argument on a complex plane.

The use of the complex plane can display a polar coordinate of the complex number in terms of a polar form. Assuming that point (a, b) on the complex plane is represented as [r,θ] in terms of the polar coordinate when complex number z=a+jb (a and b are a real number and j is an imaginary unit) corresponds to point (a, b), the following equation holds:

$$a=r\times\cos\theta$$

$$b=r\times\sin\theta$$

$$r=\sqrt{a^2+b^2}$$ [Mathematical Formula 364]

where r is an absolute value of z (r=|z|) and θ is an argument, and z=a+jb is represented as ($r\times e^{j\theta}$).

In the present disclosure, baseband signals s1, s2, z1, and z2 are a complex signal, and the complex signal is represented as I+jQ (j is an imaginary unit) when I is the in-phase signal while Q is the quadrature signal. At this point, I may be zero, and Q may be zero.

For example, a program executing the above communication method is previously stored in a ROM (Read Only Memory), and the program may be operated with a CPU (Central Processing Unit).

The program executing the above communication method is stored in a computer-readable storage medium, the program stored in the storage medium is recorded in a RAM (Random Access Memory) of a computer, and the computer may be operated according to the program.

Typically, each of the configurations of the above exemplary embodiments may be implemented as LSI (Large Scale Integration) that is of an integrated circuit. The configuration of each exemplary embodiment may separately be formed into one chip, or a whole or part of the configuration of each exemplary embodiment may separately be formed into one chip.

Although the term of LSI is used, sometimes the terms of IC (Integrated Circuit), system LSI, super LSI, and ultra LSI are used depending on a degree of integration. A technique of integrating the circuit is not limited to LSI, but the technique may be performed by a dedicated circuit or a general-purpose processor. A programmable FPGA (Field Programmable Gate Array) or a reconfigurable processor that can reconfigure connection and setting of circuit cell in LSI may be used after the production of LSI.

When a circuit integrating technology with which LSI is replaced is put into use by the progress of the semiconductor technology or a derivative technology, the functional block may be integrated using the technology. Possibly a biotechnology may be applied.

The bit length adjusting method is described in the first to eleventh exemplary embodiments. The method for applying the bit length adjusting methods of the first to eleventh exemplary embodiments to the DVB standard is described in the twelfth exemplary embodiment. The case that 16QAM, 64QAM, and 256QAM are applied as the modulation scheme is described in the above exemplary embodiments.

In the first to twelfth exemplary embodiments, the modulation scheme having the 16 signal points may be used instead of 16QAM in the I-Q plane. Similarly, n the first to twelfth exemplary embodiments, the modulation scheme having the 64 signal points may be used instead of 64QAM in the I-Q plane, and the modulation scheme having the 256 signal points may be used instead of 256QAM in the I-Q plane.

Alternatively, one antenna may be constructed with a plurality of antennas.

Alternatively, the receiver and the antenna may separately be configured. For example, the receiver includes an interface that inputs the signal received with the antenna and the signal in which the frequency conversion performed on the signal received with the antenna through a cable, and the receiver performs the subsequent processing.

The data and information, which are obtained with the receiver, are converted into video and audio, and displayed on a display (monitor) or output as sound from a speaker. The data and information, which are obtained with the receiver, may be subjected to the signal processing associated with the video or audio (the signal processing does not need to be performed), and output from an RCA terminal (video terminal and audio terminal), USB (Universal Serial Bus), HDMI (registered trademark) (High-Definition Multimedia Interface), and digital terminal, which are included in the receiver.

(Supplement 2)

The bit length adjusting method is described in the first to eleventh exemplary embodiments. The method for applying the bit length adjusting methods of the first to eleventh exemplary embodiments to the DVB standard is described in the twelfth exemplary embodiment. The case that 16QAM, 64QAM, and 256QAM are applied as the modulation scheme is described in the above exemplary embodiments. A specific mapping method with respect to 16QAM, 64QAM, and 256QAM is described in (Configuration example R1).

A specific mapping method with respect to 16QAM, 64QAM, and 256QAM different from that of (Configuration example R1) will be described below. The following 16QAM, 64QAM, and 256QAM may be applied to the first to twelfth exemplary embodiments, and the effects of the first to twelfth exemplary embodiments can also be obtained.

The case that 16QAM is extended will be described.

Figure 111:
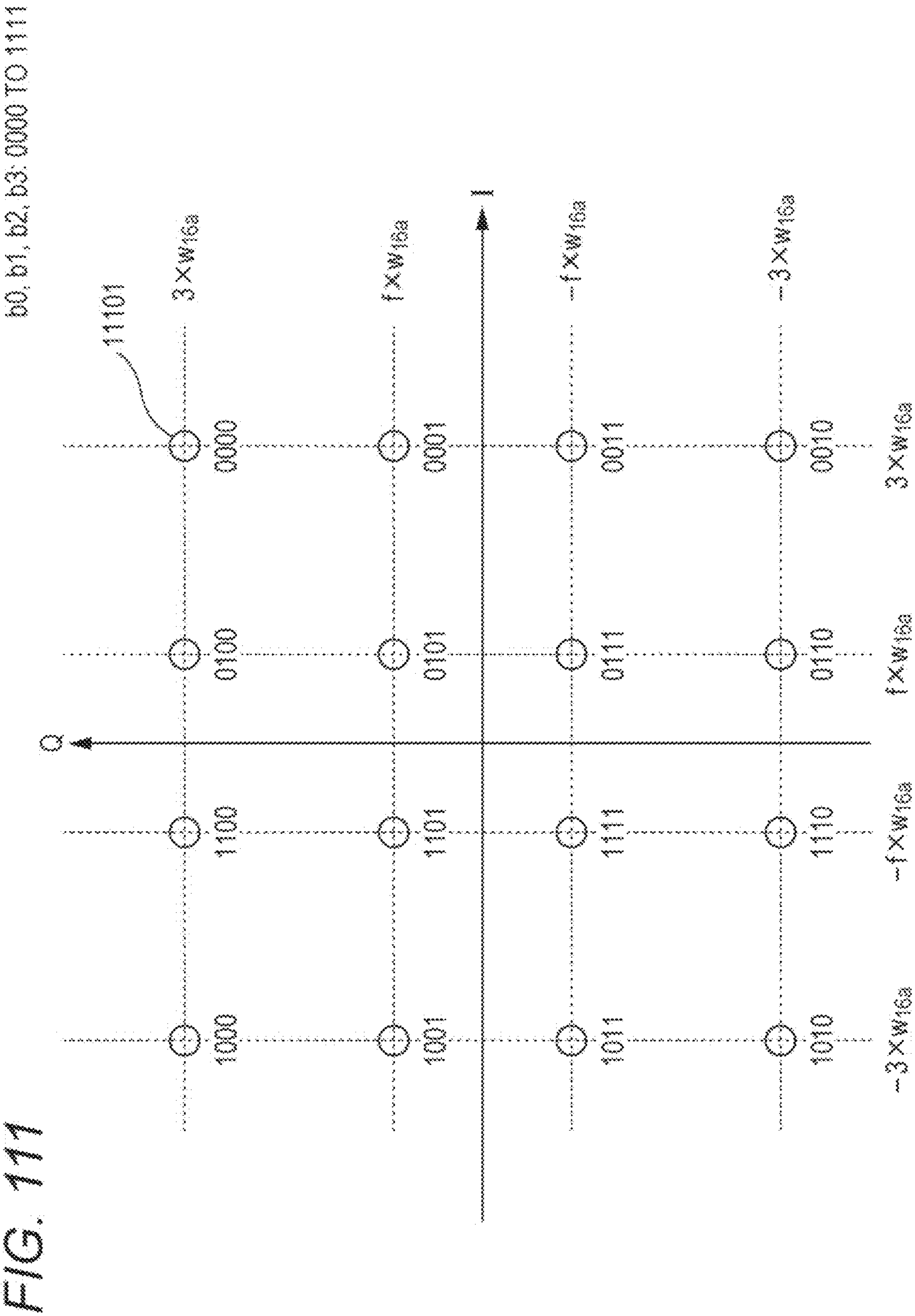
FIG. 111 is a view illustrating an arrangement example of the 16QAM signal points in the I-Q plane.

The 16QAM mapping method will be described below. FIG. 111 illustrates an arrangement example of 16QAM signal points in the I-Q plane. In FIG. 111, 16 marks "○" indicate 16QAM signal points, a horizontal axis indicates I, and a vertical axis indicates Q. In FIG. 111, it is assumed that f>0 (f is a real number larger than 0), f≠3, and f≠1 hold.

In the I-Q plane, 16 signal points included in 16QAM (indicated by the marks "○" in FIG. 111) are obtained as follows. ($w_{16a}$ is a real number larger than 0)

$(3\times w_{16a}, 3\times w_{16a})$, $(3\times w_{16a}, f\times w_{16a})$, $(3\times w_{16a}, -f\times w_{16a})$, $(3\times w_{16a}, -3\times w_{16a})$, $(f\times w_{16a}, 3\times w_{16a})$, $(f\times w_{16a}, f\times w_{16a})$, $(f\times w_{16a}, -f\times w_{16a})$, $(f\times w_{16a}, -3\times w_{16a})$, $(-f\times w_{16a}, 3\times w_{16a})$, $(-f\times w_{16a}, f\times w_{16a})$, $(-f\times w_{16a}, -f\times w_{16a})$, $(-f\times w_{16a}, -3\times w_{16a})$, $(-3\times w_{16a}, 3\times w_{16a})$, $(-3\times w_{16a}, f\times w_{16a})$, $(-3\times w_{16a}, -f\times w_{16a})$, $(-3\times w_{16a}, -3\times w_{16a})$ At this point, the bits to be transmitted (input bits) are set to b0, b1, b2, and b3. For example, for the bits to be transmitted (b0, b1, b2, b3)=(0,0,0,0), the bits are mapped at signal point 11101 in FIG. 111, and $(I,Q)=(3\times w_{16a}, 3\times w_{16a})$ is obtained when I is an in-phase component while Q is a quadrature component of the mapped baseband signal.

Based on the bits to be transmitted (b0, b1, b2, b3), in-phase component I and quadrature component Q of the mapped baseband signal are decided (during 16QAM modulation). FIG. 111 illustrates an example of the relationship between the set of b0, b1, b2, and b3 (0000 to 1111) and the signal point coordinates. Values 0000 to 1111 of the set of b0, b1, b2, and b3 are indicated immediately below 16 signal points included in 16QAM (the marks "○" in FIG. 111) $(3\times w_{16a}, 3\times w_{16a})$, $(3\times w_{16a}, f\times w_{16a})$, $(3\times w_{16a}, -f\times w_{16a})$, $(3\times w_{16a}, -3\times w_{16a})$, $(f\times w_{16a}, 3\times w_{16a})$, $(f\times w_{16a}, f\times w_{16a})$, $(f\times w_{16a}, -f\times w_{16a})$, $(f\times w_{16a}, -3\times w_{16a})$, $(-f\times w_{16a}, 3\times w_{16a})$, $(-f\times w_{16a}, f\times w_{16a})$, $(-f\times w_{16a}, -f\times w_{16a})$, $(-f\times w_{16a}, -3\times w_{16a})$, $(-3\times w_{16a}, 3\times w_{16a})$, $(-3\times w_{16a}, f\times w_{16a})$, $(-3\times w_{16a}, -f\times w_{16a})$, $(-3\times w_{16a}, -3\times w_{16a})$. Respective coordinates of the signal points ("○") immediately above the values 0000 to 1111 of the set of b0, b1, b2, and b3 in the I-Q plane serve as in-phase component I and quadrature component Q of the mapped baseband signal. The relationship between the set of b0, b1, b2, and b3 (0000 to 1111) and the signal point coordinates during 16QAM modulation is not limited to that in FIG. 111.

16 signal points in FIG. 111 are named as "signal point 1", "signal point 2", . . . , "signal point 15", and "signal point 16" (because of the presence of 16 signal points, "signal point 1" to "signal point 16" exist). In the I-Q plane, Di is a distance between "signal point i" and the origin. At this point, $w_{16a}$ is given by the following equation.

[Mathematical formula 365]

$$w_{16a} = \frac{z}{\sqrt{\frac{\sum_{i=1}^{16} D_i^2}{16}}} = \frac{z}{\sqrt{\frac{((3^2+3^2)\times 4+(f^2+f^2)\times 4+(f^2+3^2)\times 8)}{16}}} \tag{H1}$$

Therefore, the mapped baseband signal has an average power of $z_2$.

In the above description, the case equal to (Configuration example R1) is referred to as uniform-16QAM, and other cases are referred to as non-uniform 16QAM.

Figure 112:
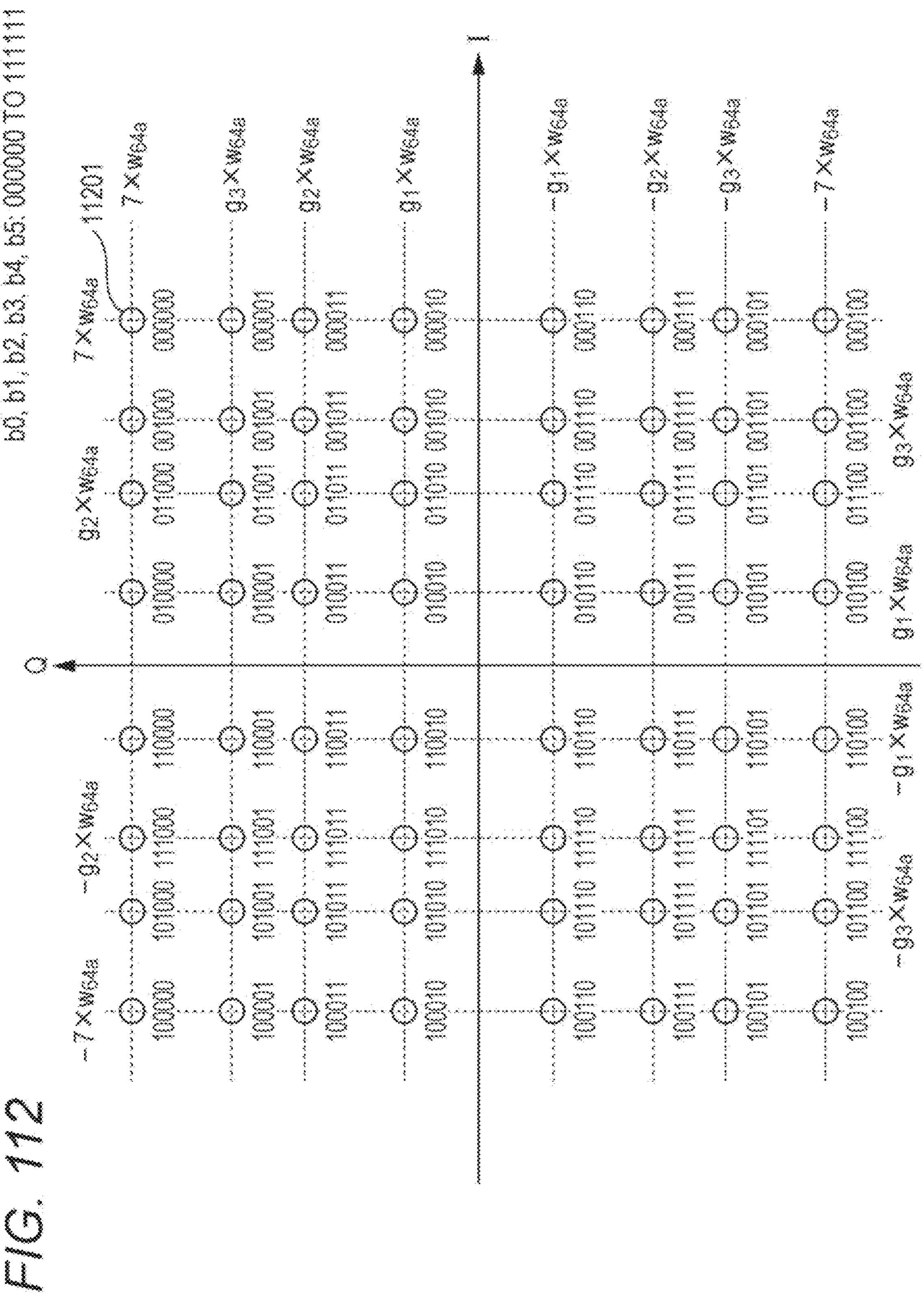
FIG. 112 is a view illustrating an arrangement example of the 64QAM signal points in the I-Q plane.

The 64QAM mapping method will be described below. FIG. 112 illustrates an arrangement example of 64QAM signal points in the I-Q plane. In FIG. 112, 64 marks "○" indicate 64QAM signal points, a horizontal axis indicates I, and a vertical axis indicates Q. In FIG. 112, it is assumed that $g_1>0$ ($g_1$ is a real number larger than 0), $g_2>0$ ($g_2$ is a real number larger than 0), and $g_3>0$ ($g_3$ is a real number larger than 0) hold, and that $\{\{g_1\neq 7$ and $g_2\neq 7$ and $g_3\neq 7\}$ holds$\}$ and $\{\{(g_1,g_2,g_3)\neq(1,3,5)$ and $(g_1,g_2,g_3)\neq(1,5,3)$ and $(g_1,g_2,g_3)\neq(3,1,5)$ and $(g_1,g_2,g_3)\neq(3,5,1)$ and $(g_1,g_2,g_3)\neq(5,1,3)$ and $(g_1,g_2,g_3)\neq(5,3,1)\}$ hold$\}$ and $\{\{g_1\neq g_2$ and $g_1\neq g_3$ and $g_2\neq g_3\}$ holds$\}$.

In the I-Q plane, 64 signal points included in 64QAM (indicated by the marks "○" in FIG. 112) are obtained as follows. ($w_{64a}$ is a real number larger than 0)

$(7\times w_{64a}, 7\times w_{64a})$, $(7\times w_{64a}, g_3\times w_{64a})$, $(7\times w_{64a}, g_2\times w_{64a})$, $(7\times w_{64a}, g_1\times w_{64a})$, $(7\times w_{64a}, -g_1\times w_{64a})$, $(7\times w_{64a}, -g_2\times w_{64a})$, $(7\times w_{64a}, -g_3\times w_{64a})$, $(7\times w_{64a}, -7\times w_{64a})$ $(g_3\times w_{64a}, 7\times w_{64a})$, $(g_3\times w_{64a}, g_3\times w_{64a})$, $(g_3\times w_{64a}, g_2\times w_{64a})$, $(g_3\times w_{64a}, g_1\times w_{64a})$, $(g_3\times w_{64a}, -g_1\times w_{64a})$, $(g_3\times w_{64a}, -g_2\times w_{64a})$, $(g_3\times w_{64a}, -g_3\times w_{64a})$, $(g_3\times w_{64a}, -7\times w_{64a})$ $(g_2\times w_{64a}, 7\times w_{64a})$, $(g_2\times w_{64a}, g_3\times w_{64a})$, $(g_2\times w_{64a}, g_2\times w_{64a})$, $(g_2\times w_{64a}, g_1\times w_{64a})$, $(g_2\times w_{64a}, -g_1\times w_{64a})$, $(g_2\times w_{64a}, -g_2\times w_{64a})$, $(g_2\times w_{64a}, -g_3\times w_{64a})$, $(g_2\times w_{64a}, -7\times w_{64a})$ $(g_1\times w_{64a}, 7\times w_{64a})$, $(g_1\times w_{64a}, g_3\times w_{64a})$, $(g_1\times w_{64a}, g_2\times w_{64a})$, $(g_1\times w_{64a}, g_1\times w_{64a})$, $(g_1\times w_{64a}, -g_1\times w_{64a})$, $(g_1\times w_{64a}, -g_2\times w_{64a})$, $(g_1\times w_{64a}, -g_3\times w_{64a})$, $(g_1\times w_{64a}, -7\times w_{64a})$ $(-g_1\times w_{64a}, 7\times w_{64a})$, $(-g_1\times w_{64a}, g_3\times w_{64a})$, $(-g_1\times w_{64a}, g_2\times w_{64a})$, $(-g_1\times w_{64a}, g_1\times w_{64a})$, $(-g_1\times w_{64a}, -g_1\times w_{64a})$, $(-g_1\times w_{64a}, -g_2\times w_{64a})$, $(-g_1\times w_{64a}, -g_3\times w_{64a})$, $(-g_1\times w_{64a}, -7\times w_{64a})$ $(-g_2\times w_{64a}, 7\times w_{64a})$, $(-g_2\times w_{64a}, g_3\times w_{64a})$, $(-g_2\times w_{64a}, g_2\times w_{64a})$, $(-g_2\times w_{64a}, g_1\times w_{64a})$, $(-g_2\times w_{64a}, -g_1\times w_{64a})$, $(-g_2\times w_{64a}, -g_2\times w_{64a})$, $(-g_2\times w_{64a}, -g_3\times w_{64a})$, $(-g_2\times w_{64a}, -7\times w_{64a})$ $(-g_3\times w_{64a}, 7\times w_{64a})$, $(-g_3\times w_{64a}, g_3\times w_{64a})$, $(-g_3\times w_{64a}, g_2\times w_{64a})$, $(-g_3\times w_{64a}, g_1\times w_{64a})$, $(-g_3\times w_{64a}, -g_1\times w_{64a})$, $(-g_3\times w_{64a}, -g_2\times w_{64a})$, $(-g_3\times w_{64a}, -g_3\times w_{64a})$, $(-g_3\times w_{64a}, -7\times w_{64a})$ $(-7\times w_{64a}, 7\times w_{64a})$, $(-7\times w_{64a}, g_3\times w_{64a})$, $(-7\times w_{64a}, g_2\times w_{64a})$, $(-7\times w_{64a}, g_1\times w_{64a})$, $(-7\times w_{64a}, -g_1\times w_{64a})$, $(-7\times w_{64a}, -g_2\times w_{64a})$, $(-7\times w_{64a}, -g_3\times w_{64a})$, $(-7\times w_{64a}, -7\times w_{64a})$ At this point, the bits to be transmitted (input bits) are set to b0, b1, b2, b3, b4, and b5. For example, for the bits to be transmitted (b0, b1, b2, b3, b4, b5)=(0,0,0,0,0,0), the bits are mapped at signal point 11201 in FIG. 112, and $(I,Q)=(7\times w_{64a}, 7\times w_{64a})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 112 illustrates an example of a relationship between the set of b0, b1, b2, b3, b4, and b5 (000000 to 111111) and the signal point coordinates. Values 000000 to 111111 of the set of b0, b1, b2, b3, b4, and b5 are indicated immediately below 64 signal points included in 64QAM (the marks "○" in FIG. 112) $(7\times w_{64a}, 7\times w_{64a})$, $(7\times w_{64a}, g_3\times w_{64a})$, $(7\times w_{64a}, g_2\times w_{64a})$, $(7\times w_{64a}, g_1\times w_{64a})$, $(7\times w_{64a}, -g_1\times w_{64a})$, $(7\times w_{64a}, -g_2\times w_{64a})$, $(7\times w_{64a}, -g_3\times w_{64a})$, $(7\times w_{64a}, -7\times w_{64a})$ $(g_3\times w_{64a}, 7\times w_{64a})$, $(g_3\times w_{64a}, g_3\times w_{64a})$, $(g_3\times w_{64a}, g_2\times w_{64a})$, $(g_3\times w_{64a}, g_1\times w_{64a})$, $(g_3\times w_{64a}, -g_1\times w_{64a})$, $(g_3\times w_{64a}, -g_2\times w_{64a})$, $(g_3\times w_{64a}, -g_3\times w_{64a})$, $(g_3\times w_{64a}, -7\times w_{64a})$ $(g_2\times w_{64a}, 7\times w_{64a})$, $(g_2\times w_{64a}, g_3\times w_{64a})$, $(g_2\times w_{64a}, g_2\times w_{64a})$, $(g_2\times w_{64a}, g_1\times w_{64a})$, $(g_2\times w_{64a}, -g_1\times w_{64a})$, $(g_2\times w_{64a}, -g_2\times w_{64a})$, $(g_2\times w_{64a}, -g_3\times w_{64a})$, $(g_2\times w_{64a}, -7\times w_{64a})$ $(g_1\times w_{64a}, 7\times w_{64a})$, $(g_1\times w_{64a}, g_3\times w_{64a})$, $(g_1\times w_{64a}, g_2\times w_{64a})$, $(g_1\times w_{64a}, g_1\times w_{64a})$, $(g_1\times w_{64a}, -g_1\times w_{64a})$, $(g_1\times w_{64a}, -g_2\times w_{64a})$, $(g_1\times w_{64a}, -g_3\times w_{64a})$, $(g_1\times w_{64a}, -7\times w_{64a})$ $(-g_1\times w_{64a}, 7\times w_{64a})$, $(-g_1\times w_{64a}, g_3\times w_{64a})$, $(-g_1\times w_{64a}, g_2\times w_{64a})$, $(-g_1\times w_{64a}, g_1\times w_{64a})$, $(-g_1\times w_{64a}, -g_1\times w_{64a})$, $(-g_1\times w_{64a}, -g_2\times w_{64a})$, $(-g_1\times w_{64a}, -g_3\times w_{64a})$, $(-g_1\times w_{64a}, -7\times w_{64a})$ $(-g_2\times w_{64a}, 7\times w_{64a})$, $(-g_2\lambda w_{64a}, g_3\times w_{64a})$, $(-g_2\times w_{64a}, g_2\times w_{64a})$, $(-g_2\times w_{64a}, g_1\times w_{64a})$, $(-g_2\times w_{64a}, -g_1\times w_{64a})$, $(-g_2\times w_{64a}, -g_2\times w_{64a})$, $(-g_2\times w_{64a}, -g_3\times w_{64a})$, $(-g_2\times w_{64a}, -7\times w_{64a})$ $(-g_3\times w_{64a}, 7\times w_{64a})$, $(-g_3\times w_{64a}, g_3\times w_{64a})$, $(-g_3\times w_{64a}, g_2\times w_{64a})$, $(-g_3\times w_{64a}, g_1\times w_{64a})$, $(-g_3\times w_{64a}, -g_1\times w_{64a})$, $(-g_3\times w_{64a}, -g_2\times w_{64a})$, $(-g_3\times w_{64a}, -g_3\times w_{64a})$, $(-g_3\times w_{64a}, -7\times w_{64a})$ $(-7\times w_{64a}, 7\times w_{64a})$, $(-7\times w_{64a}, g_3\times w_{64a})$, $(-7\times w_{64a}, g_2\times w_{64a})$, $(-7\times w_{64a}, g_1\times w_{64a})$, $(-7\times w_{64a}, g_1\times w_{64a})$, $(-7\times w_{64a}, -g_2\times w_{64a})$, $(-7\times w_{64a}, -g_3\times w_{64a})$, $(-7\times w_{64a}, -7\times w_{64a})$. Respective coordinates of the signal points ("○") immediately above the values 000000 to of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 112.

64 signal points in FIG. 112 are named as "signal point 1", "signal point 2", . . . , "signal point 63", and "signal point 64" (because of the presence of 64 signal points, "signal point 1" to "signal point 64" exist). In the I-Q plane, Di is a distance between "signal point i" and the origin. At this point, $w_{64a}$ is given by the following equation.

[Mathematical formula 366]

$$w_{64a} = \frac{z}{\sqrt{\frac{\sum_{i=1}^{64} D_i^2}{64}}} \tag{H2}$$

Therefore, the mapped baseband signal has an average power of $z_2$.

In the above description, the case equal to (Configuration example R1) is referred to as uniform-64QAM, and other cases are referred to as non-uniform 64QAM.

Figure 113:
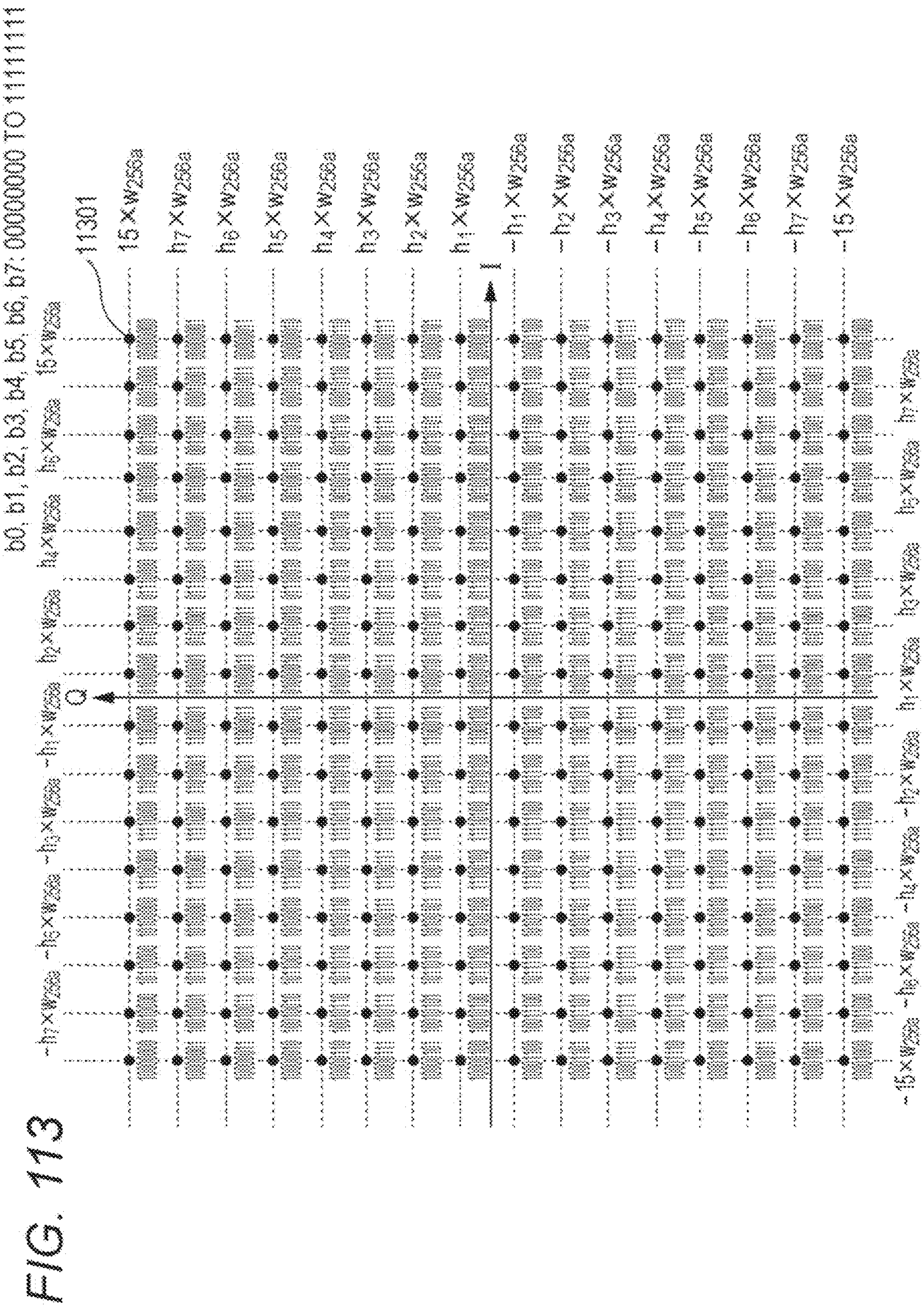
FIG. 113 is a view illustrating an arrangement example of the 256QAM signal points in the I-Q plane.

The 256QAM mapping method will be described below. FIG. 113 illustrates an arrangement example of 256QAM signal points in the I-Q plane. In FIG. 113, 256 marks "○" indicate 256QAM signal points, a horizontal axis indicates I, and a vertical axis indicates Q. In FIG. 113, it is assumed that $h_1>0$ ($h_1$ is a real number larger than 0) and $h_2>0$ ($h_2$ is a real number larger than 0) and $h_3>0$ ($h_3$ is a real number larger than 0) and $h_4>0$ ($h_4$ is a real number larger than 0) and $h_5>0$ ($h_5$ is a real number larger than 0) and $h_6>0$ ($h_6$ is a real number larger than 0) and $h_7>0$ ($h_7$ is a real number larger than 0), that {{$h_1\neq 15$ and $h_2\neq 15$ and $h_3\neq 15$ and $h_4\neq 15$ and $h_5\neq 15$ and $h_6\neq 15$ and $h_7\neq 15$} holds}, and that {when {a1 is an integer from 1 to 7 and a2 is an integer from 1 to 7 and a3 is an integer from 1 to 7 and a4 is an integer from 1 to 7 and a5 is an integer from 1 to 7 and a6 is an integer from 1 to 7 and a7 is an integer from 1 to 7} holds, when {x is an integer from 1 to 7 and γ is an integer from 1 to 7 and x≠y} holds, and when {ax≠ay holds for all the values x and y}, $(h_{a1}, h_{a2}, h_{a3}, h_{a4}, h_{a5}, h_{a6}, h_{a7})\neq(1,3,5,7,9,11,13)$ holds.}, and that {{$h_1\neq h_2$ and $h_1\neq h_3$ and $h_1\neq h_4$ and $h_1\neq h_5$ and $h_1\neq h_6$ and $h_1\neq h_7$, and $h_2\neq h_3$ and $h_2\neq h_4$ and $h_2\neq h_5$ and $h_2\neq h_6$ and $h_2\neq h_7$, and $h_3\neq h_4$ and $h_3\neq h_5$ and $h_3\neq h_6$ and $h_3\neq h_7$, and $h_4\neq h_5$ and $h_4\neq h_6$ and $h_4\neq h_7$, and $h_5\neq h_6$ and $h_5\neq h_7$, and $h_6\neq h_7$} hold.}

256 signal points included in 256QAM (indicated by the marks "○" in FIG. 113) in the I-Q plane are obtained as follows. ($w_{256a}$ is a real number larger than 0)

$(15\times w_{256a}, 15\times w_{256a})$, $(15\times w_{256a}, h_7\times w_{256a})$, $(15\times w_{256a}, h_6\times w_{256a})$, $(15\times w_{256a}, h_5\times w_{256a})$, $(15\times w_{256a}, h_4\times w_{256a})$, $(15\times w_{256a}, h_3\times w_{256a})$, $(15\times w_{256a}, h_2\times w_{256a})$, $(15\times w_{256a}, h_1\times w_{256a})$, $(15\times w_{256a}, -15\times w_{256a})$, $(15\times w_{256a}, -h_7\times w_{256a})$, $(15\times w_{256a}, -h_6\times w_{256a})$, $(15\times w_{256a}, -h_5\times w_{256a})$, $(15\times w_{256a}, -h_4\times w_{256a})$, $(15\times w_{256a}, -h_3\times w_{256a})$, $(15\times w_{256a}, -h_2\times w_{256a})$, $(15\times w_{256a}, -h_1\times w_{256a})$, $(h_7\times w_{256a}, 15\times w_{256a})$, $(h_7\times w_{256a}, h_7\times w_{256a})$, $(h_7\times w_{256a}, h_6\times w_{256a})$, $(h_7\times w_{256a}, h_5\times w_{256a})$, $(h_7\times w_{256a}, h_4\times w_{256a})$, $(h_7\times w_{256a}, h_3\times w_{256a})$, $(h_7\times w_{256a}, h_2\times w_{256a})$, $(h_7\times w_{256a}, h_1\times w_{256a})$, $(h_7\times w_{256a}, -15\times w_{256a})$, $(h_7\times w_{256a}, -h_7\times w_{256a})$, $(h_7\times w_{256a}, -h_6\times w_{256a})$, $(h_7\times w_{256a}, -h_5\times w_{256a})$, $(h_7\times w_{256a}, -h_4\times w_{256a})$, $(h_7\times w_{256a}, -h_3\times w_{256a})$, $(h_7\times w_{256a}, -h_2\times w_{256a})$, $(h_7\times w_{256a}, -h_1\times w_{256a})$, $(h_6\times w_{256a}, 15\times w_{256a})$, $(h_6\times w_{256a}, h_7\times w_{256a})$, $(h_6\times w_{256a}, h_6\times w_{256a})$, $(h_6\times w_{256a}, h_5\times w_{256a})$, $(h_6\times w_{256a}, h_4\times w_{256a})$, $(h_6\times w_{256a}, h_3\times w_{256a})$, $(h_6\times w_{256a}, h_2\times w_{256a})$, $(h_6\times w_{256a}, h_1\times w_{256a})$, $(h_6\times w_{256a}, -15\times w_{256a})$, $(h_6\times w_{256a}, -h_7\times w_{256a})$, $(h_6\times w_{256a}, -h_6\times w_{256a})$, $(h_6\times w_{256a}, -h_5\times w_{256a})$, $(h_6\times w_{256a}, -h_4\times w_{256a})$, $(h_6\times w_{256a}, -h_3\times w_{256a})$, $(h_6\times w_{256a}, -h_2\times w_{256a})$, $(h_6\times w_{256a}, -h_1\times w_{256a})$, $(h_5\times w_{256a}, 15\times w_{256a})$, $(h_5\times w_{256a}, h_7\times w_{256a})$, $(h_5\times w_{256a}, h_6\times w_{256a})$, $(h_5\times w_{256a}, h_5\times w_{256a})$, $(h_5\times w_{256a}, h_4\times w_{256a})$, $(h_5\times w_{256a}, h_3\times w_{256a})$, $(h_5\times w_{256a}, h_2\times w_{256a})$, $(h_5\times w_{256a}, h_1\times w_{256a})$, $(h_5\times w_{256a}, -15\times w_{256a})$, $(h_5\times w_{256a}, -h_7\times w_{256a})$, $(h_5\times w_{256a}, -h_6\times w_{256a})$, $(h_5\times w_{256a}, -h_5\times w_{256a})$, $(h_5\times w_{256a}, -h_4\times w_{256a})$, $(h_5\times w_{256a}, -h_3\times w_{256a})$, $(h_5\times w_{256a}, -h_2\times w_{256a})$, $(h_5\times w_{256a}, -h_1\times w_{256a})$, $(h_4\times w_{256a}, 15\times w_{256a})$, $(h_4\times w_{256a}, h_7\times w_{256a})$, $(h_4\times w_{256a}, h_6\times w_{256a})$, $(h_4\times w_{256a}, h_5\times w_{256a})$, $(h_4\times w_{256a}, h_4\times w_{256a})$, $(h_4\times w_{256a}, h_3\times w_{256a})$, $(h_4\times w_{256a}, h_2\times w_{256a})$, $(h_4\times w_{256a}, h_1\times w_{256a})$, $(h_4\times w_{256a}, -15\times w_{256a})$, $(h_4\times w_{256a}, -h_7\times w_{256a})$, $(h_4\times w_{256a}, -h_6\times w_{256a})$, $(h_4\times w_{256a}, -h_5\times w_{256a})$, $(h_4\times w_{256a}, -h_4\times w_{256a})$, $(h_4\times w_{256a}, -h_3\times w_{256a})$, $(h_4\times w_{256a}, -h_2\times w_{256a})$, $(h_4\times w_{256a}, -h_1\times w_{256a})$, $(h_3\times w_{256a}, 15\times w_{256a})$, $(h_3\times w_{256a}, h_7\times w_{256a})$, $(h_3\times w_{256a}, h_6\times w_{256a})$, $(h_3\times w_{256a}, h_5\times w_{256a})$, $(h_3\times w_{256a}, h_4\times w_{256a})$, $(h_3\times w_{256a}, h_3\times w_{256a})$, $(h_3\times w_{256a}, h_2\times w_{256a})$, $(h_3\times w_{256a}, h_1\times w_{256a})$, $(h_3\times w_{256a}, -15\times w_{256a})$, $(h_3\times w_{256a}, -h_7\times w_{256a})$, $(h_3\times w_{256a}, -h_6\times w_{256a})$, $(h_3\times w_{256a}, -h_5\times w_{256a})$, $(h_3\times w_{256a}, -h_4\times w_{256a})$, $(h_3\times w_{256a}, -h_3\times w_{256a})$, $(h_3\times w_{256a}, -h_2\times w_{256a})$, $(h_3\times w_{256a}, -h_1\times w_{256a})$, $(h_2\times w_{256a}, 15\times w_{256a})$, $(h_2\times w_{256a}, h_7\times w_{256a})$, $(h_2\times w_{256a}, h_6\times w_{256a})$, $(h_2\times w_{256a}, h_5\times w_{256a})$, $(h_2\times w_{256a}, h_4\times w_{256a})$, $(h_2\times w_{256a}, h_3\times w_{256a})$, $(h_2\times w_{256a}, h_2\times w_{256a})$, $(h_2\times w_{256a}, h_1\times w_{256a})$, $(h_2\times w_{256a}, -15\times w_{256a})$, $(h_2\times w_{256a}, -h_7\times w_{256a})$, $(h_2\times w_{256a}, -h_6\times w_{256a})$, $(h_2\times w_{256a}, -h_5\times w_{256a})$, $(h_2\times w_{256a}, -h_4\times w_{256a})$, $(h_2\times w_{256a}, -h_3\times w_{256a})$, $(h_2\times w_{256a}, -h_2\times w_{256a})$, $(h_2\times w_{256a}, -h_1\times w_{256a})$, $(h_1\times w_{256a}, 15\times w_{256a})$, $(h_1\times w_{256a}, h_7\times w_{256a})$, $(h_1\times w_{256a}, h_6\times w_{256a})$, $(h_1\times w_{256a}, h_5\times w_{256a})$, $(h_1\times w_{256a}, h_4\times w_{256a})$, $(h_1\times w_{256a}, h_3\times w_{256a})$, $(h_1\times w_{256a}, h_2\times w_{256a})$, $(h_1\times w_{256a}, h_1\times w_{256a})$, $(h_1\times w_{256a}, -15\times w_{256a})$, $(h_1\times w_{256a}, -h_7\times w_{256a})$, $(h_1\times w_{256a}, -h_6\times w_{256a})$, $(h_1\times w_{256a}, -h_5\times w_{256a})$, $(h_1\times w_{256a}, -h_4\times w_{256a})$, $(h_1\times w_{256a}, -h_3\times w_{256a})$, $(h_1\times w_{256a}, -h_2\times w_{256a})$, $(h_1\times w_{256a}, -h_1\times w_{256a})$, $(-15\times w_{256a}, 15\times w_{256a})$, $(-15\times w_{256a}, h_7\times w_{256a})$, $(-15\times w_{256a}, h_6\times w_{256a})$, $(-15\times w_{256a}, h_5\times w_{256a})$, $(-15\times w_{256a}, h_4\times w_{256a})$, $(-15\times w_{256a}, h_3\times w_{256a})$, $(-15\times w_{256a}, h_2\times w_{256a})$, $(-15\times w_{256a}, h_1\times w_{256a})$, $(-15\times w_{256a},-15\times w_{256a})$, $(-15\times w_{256a},-h_7\times w_{256a})$, $(-15\times w_{256a},-h_6\times w_{256a})$, $(-15\times w_{256a},-h_5\times w_{256a})$, $(-15\times w_{256a},-h_4\times w_{256a})$, $(-15\times w_{256a},-h_3\times w_{256a})$, $(-15\times w_{256a},-h_2\times w_{256a})$, $(-15\times w_{256a},-h_1\times w_{256a})$, $(-h_7\times w_{256a}, 15\times w_{256a})$, $(-h_7\times w_{256a},h_7\times w_{256a})$, $(-h_7\times w_{256a}, h_6\times w_{256a})$, $(-h_7\times w_{256a}, h_5\times w_{256a})$, $(-h_7\times w_{256a},h_4\times w_{256a})$, $(-h_7\times w_{256a},h_3\times w_{256a})$, $(-h_7\times w_{256a},h_2\times w_{256a})$, $(-h_7\times w_{256a}, h_1\times w_{256a})$, $(-h_7\times w_{256a}, -15\times w_{256a})$, $(-h_7\times w_{256a},-h_7\times w_{256a})$, $(-h_7\times w_{256a},-h_6\times w_{256a})$, $(-h_7\times w_{256a},-h_5\times w_{256a})$, $(-h_7\times w_{256a},-h_4\times w_{256a})$, $(-h_7\times w_{256a},-h_3\times w_{256a})$, $(-h_7\times w_{256a},-h_2\times w_{256a})$, $(-h_7\times w_{256a},-h_1\times w_{256a})$, $(-h_6\times w_{256a}, 15\times w_{256a})$, $(-h_6\times w_{256a}, h_7\times w_{256a})$, $(-h_6\times w_{256a}, h_6\times w_{256a})$, $(-h_6\times w_{256a}, h_5\times w_{256a})$, $(-h_6\times w_{256a},h_4\times w_{256a})$, $(-h_6\times w_{256a},h_3\times w_{256a})$, $(-h_6\times w_{256a},h_2\times w_{256a})$, $(-h_6\times w_{256a},h_1\times w_{256a})$, $(-h_6\times w_{256a}, -15\times w_{256a})$, $(-h_6\times w_{256a},-h_7\times w_{256a})$, $(-h_6\times w_{256a},-h_6\times w_{256a})$, $(-h_6\times w_{256a},-h_5\times w_{256a})$, $(-h_6\times w_{256a},-h_4\times w_{256a})$, $(-h_6\times w_{256a},-h_3\times w_{256a})$, $(-h_6\times w_{256a},-h_2\times w_{256a})$, $(-h_6\times w_{256a},-h_1\times w_{256a})$, $(-h_5\times w_{256a}, 15\times w_{256a})$, $(-h_5\times w_{256a}, h_7\times w_{256a})$, $(-h_5\times w_{256a}, h_6\times w_{256a})$, $(-h_5\times w_{256a}, h_5\times w_{256a})$, $(-h_5\times w_{256a},h_4\times w_{256a})$, $(-h_5\times w_{256a},h_3\times w_{256a})$, $(-h_5\times w_{256a},h_2\times w_{256a})$, $(-h_5\times w_{256a},h_1\times w_{256a})$, $(-h_5\times w_{256a}, -15\times w_{256a})$, $(-h_5\times w_{256a},-h_7\times w_{256a})$, $(-h_5\times w_{256a},-h_6\times w_{256a})$, $(-h_5\times w_{256a},-h_5\times w_{256a})$, $(-h_5\times w_{256a},-h_4\times w_{256a})$, $(-h_5\times w_{256a},-h_3\times w_{256a})$, $(-h_5\times w_{256a},-h_2\times w_{256a})$, $(-h_5\times w_{256a},-h_1\times w_{256a})$, $(-h_4\times w_{256a}, 15\times w_{256a})$, $(-h_4\times w_{256a},h_7\times w_{256a})$, $(-h_4\times w_{256a}, h_6\times w_{256a})$, $(-h_4\times w_{256a}, h_5\times w_{256a})$, $(-h_4\times w_{256a},h_4\times w_{256a})$, $(-h_4\times w_{256a},h_3\times w_{256a})$, $(-h_4\times w_{256a},h_2\times w_{256a})$, $(-h_4\times w_{256a}, h_1\times w_{256a})$, $(-h_4\times w_{256a}, -15\times w_{256a})$, $(-h_4\times w_{256a},-h_7\times w_{256a})$, $(-h_4\times w_{256a},-h_6\times w_{256a})$, $(-h_4\times w_{256a},-h_5\times w_{256a})$, $(-h_4\times w_{256a},-h_4\times w_{256a})$, $(-h_4\times w_{256a},-h_3\times w_{256a})$, $(-h_4\times w_{256a},-h_2\times w_{256a})$, $(-h_4\times w_{256a},-h_1\times w_{256a})$, $(-h_3\times w_{256a}, 15\times w_{256a})$, $(-h_3\times w_{256a}, h_7\times w_{256a})$, $(-h_3\times w_{256a}, h_6\times w_{256a})$, $(-h_3\times w_{256a}, h_5\times w_{256a})$, $(-h_3\times w_{256a},h_4\times w_{256a})$, $(-h_3\times w_{256a},h_3\times w_{256a})$, $(-h_3\times w_{256a},h_2\times w_{256a})$, $(-h_3\times w_{256a},h_1\times w_{256a})$, $(-h_3\times w_{256a}, -15\times w_{256a})$, $(-h_3\times w_{256a},-h_7\times w_{256a})$, $(-h_3\times w_{256a},-h_6\times w_{256a})$, $(-h_3\times w_{256a},-h_5\times w_{256a})$, $(-h_3\times w_{256a},-h_4\times w_{256a})$, $(-h_3\times w_{256a},-h_3\times w_{256a})$, $(-h_3\times w_{256a},-h_2\times w_{256a})$, $(-h_3\times w_{256a},-h_1\times w_{256a})$, $(-h_2\times w_{256a}, 15\times w_{256a})$, $(-h_2\times w_{256a}, h_7\times w_{256a})$, $(-h_2\times w_{256a}, h_6\times w_{256a})$, $(-h_2\times w_{256a}, h_5\times w_{256a})$, $(-h_2\times w_{256a},h_4\times w_{256a})$, $(-h_2\times w_{256a},h_3\times w_{256a})$, $(-h_2\times w_{256a},h_2\times w_{256a})$, $(-h_2\times w_{256a},h_1\times w_{256a})$, $(-h_2\times w_{256a}, -15\times w_{256a})$, $(-h_2\times w_{256a},-h_7\times w_{256a})$, $(-h_2\times w_{256a},-h_6\times w_{256a})$, $(-h_2\times w_{256a},-h_5\times w_{256a})$, $(-h_2\times w_{256a},-h_4\times w_{256a})$, $(-h_2\times w_{256a},-h_3\times w_{256a})$, $(-h_2\times w_{256a},-h_2\times w_{256a})$, $(-h_2\times w_{256a},-h_1\times w_{256a})$, $(-h_1\times w_{256a}, 15\times w_{256a})$, $(-h_1\times w_{256a},h_7\times w_{256a})$, $(-h_1\times w_{256a}, h_6\times w_{256a})$, $(-h_1\times w_{256a}, h_5\times w_{256a})$, $(-h_1\times w_{256a},h_4\times w_{256a})$, $(-h_1\times w_{256a},h_3\times w_{256a})$, $(-h_1\times w_{256a}, h_2\times w_{256a})$, $(-h_1\times w_{256a}, h_1\times w_{256a})$, $(-h_1\times w_{256a}, -15\times w_{256a})$, $(-h_1\times w_{256a},-h_7\times w_{256a})$, $(-h_1\times w_{256a},-h_6\times w_{256a})$, $(-h_1\times w_{256a},-h_5\times w_{256a})$, $(-h_1\times w_{256a},-h_4\times w_{256a})$, $(-h_1\times w_{256a},-h_3\times w_{256a})$, $(-h_1\times w_{256a},-h_2\times w_{256a})$, $(-h_1\times w_{256a},-h_1\times w_{256a})$ At this point, the bits to be transmitted (input bits) are set to b0, b1, b2, b3, b4, b5, b6, and b7. For example, for the bits to be transmitted (b0, b1, b2, b3, b4, b5, b6, b7)=(0,0,0,0, 0,0,0,0), the bits are mapped at signal point 11301 in FIG. 113, and $(I,Q)=(15\times w_{256a}, 15\times w_{256a})$ is obtained when I is an in-phase component while Q is a quadrature component of the mapped baseband signal.

Based on the bits to be transmitted (b0, b1, b2, b3, b4, b5, b6, b7), in-phase component I and quadrature component Q of the mapped baseband signal are decided (during 256QAM modulation). FIG. 113 illustrates an example of a relationship between the set of b0, b1, b2, b3, b4, b5, b6, and b7 (00000000 to 11111111) and the signal point coordinates. Values 00000000 to 11111111 of the set of b0, b1, b2, b3, b4, b5, b6, and b7 are indicated immediately below 256 signal points included in 256QAM (the marks "○" in FIG. 113)

$(15\times w_{256a}, 15\times w_{256a})$, $(15\times w_{256a},h_7\times w_{256a})$, $(15\times w_{256a},h_6\times w_{256a})$, $(15\times w_{256a}, h_5\times w_{256a})$, $(15\times w_{256a}, h_4\times w_{256a})$, $(15\times w_{256a}, h_3\times w_{256a})$, $(15\times w_{256a}, h_2\times w_{256a})$, $(15\times w_{256a},h_1\times w_{256a})$, $(15\times w_{256a}, -15\times w_{256a})$, $(15\times w_{256a},-h_7\times w_{256a})$, $(15\times w_{256a},-h_6\times w_{256a})$, $(15\times w_{256a},-h_5\times w_{256a})$, $(15\times w_{256a},-h_4\times w_{256a})$, $(15\times w_{256a},-h_3\times w_{256a})$, $(15\times w_{256a},-h_2\times w_{256a})$, $(15\times w_{256a},-h_1\times w_{256a})$, $(h_7\times w_{256a}, 15\times w_{256a})$, $(h_7\times w_{256a},h_7\times w_{256a})$, $(h_7\times w_{256a},h_6\times w_{256a})$, $(h_7\times w_{256a}, h_5\times w_{256a})$, $(h_7\times w_{256a},h_4\times w_{256a})$, $(h_7\times w_{256a},h_3\times w_{256a})$, $(h_7\times w_{256a}, h_2\times w_{256a})$, $(h_7\times w_{256a}, h_1\times w_{256a})$, $(h_7\times w_{256a},-15\times w_{256a})$, $(h_7\times w_{256a},-h_7\times w_{256a})$, $(h_7\times w_{256a},-h_6\times w_{256a})$, $(h_7\times w_{256a},-h_5\times w_{256a})$, $(h_7\times w_{256a},-h_4\times w_{256a})$, $(h_7\times w_{256a},-h_3\times w_{256a})$, $(h_7\times w_{256a},-h_2\times w_{256a})$, $(h_7\times w_{256a},-h_1\times w_{256a})$, $(h_6\times w_{256a}, 15\times w_{256a})$, $(h_6\times w_{256a}, h_7\times w_{256a})$, $(h_6\times w_{256a}, h_6\times w_{256a})$, $(h_6\times w_{256a}, h_5\times w_{256a})$, $(h_6\times w_{256a},h_4\times w_{256a})$, $(h_6\times w_{256a}, h_3\times w_{256a})$, $(h_6\times w_{256a}, h_2\times w_{256a})$, $(h_6\times w_{256a}, h_1\times w_{256a})$, $(h_6\times w_{256a},-15\times w_{256a})$, $(h_6\times w_{256a},-h_7\times w_{256a})$, $(h_6\times w_{256a},-h_6\times w_{256a})$, $(h_6\times w_{256a},-h_5\times w_{256a})$, $(h_6\times w_{256a},-h_4\times w_{256a})$, $(h_6\times w_{256a},-h_3\times w_{256a})$, $(h_6\times w_{256a},-h_2\times w_{256a})$, $(h_6\times w_{256a},-h_1\times w_{256a})$, $(h_5\times w_{256a}, 15\times w_{256a})$, $(h_5\times w_{256a}, h_7\times w_{256a})$, $(h_5\times w_{256a}, h_6\times w_{256a})$, $(h_5\times w_{256a}, h_5\times w_{256a})$, $(h_5\times w_{256a},h_4\times w_{256a})$, $(h_5\times w_{256a}, h_3\times w_{256a})$, $(h_5\times w_{256a}, h_2\times w_{256a})$, $(h_5\times w_{256a}, h_1\times w_{256a})$, $(h_5\times w_{256a},-15\times w_{256a})$, $(h_5\times w_{256a},-h_7\times w_{256a})$, $(h_5\times w_{256a},-h_6\times w_{256a})$, $(h_5\times w_{256a},-h_5\times w_{256a})$, $(h_5\times w_{256a},-h_4\times w_{256a})$, $(h_5\times w_{256a},-h_3\times w_{256a})$, $(h_5\times w_{256a},-h_2\times w_{256a})$, $(h_5\times w_{256a},-h_1\times w_{256a})$, $(h_4\times w_{256a}, 15\times w_{256a})$, $(h_4\times w_{256a},h_7\times w_{256a})$, $(h_4\times w_{256a},h_6\times w_{256a})$, $(h_4\times w_{256a}, h_5\times w_{256a})$, $(h_4\times w_{256a},h_4\times w_{256a})$, $(h_4\times w_{256a},h_3\times w_{256a})$, $(h_4\times w_{256a}, h_2\times w_{256a})$, $(h_4\times w_{256a}, h_1\times w_{256a})$, $(h_4\times w_{256a},-15\times w_{256a})$, $(h_4\times w_{256a},-h_7\times w_{256a})$, $(h_4\times w_{256a},-h_6\times w_{256a})$, $(h_4\times w_{256a},-h_5\times w_{256a})$, $(h_4\times w_{256a},-h_4\times w_{256a})$, $(h_4\times w_{256a},-h_3\times w_{256a})$, $(h_4\times w_{256a},-h_2\times w_{256a})$, $(h_4\times w_{256a},-h_1\times w_{256a})$, $(h_3\times w_{256a}, 15\times w_{256a})$, $(h_3\times w_{256a}, h_7\times w_{256a})$, $(h_3\times w_{256a}, h_6\times w_{256a})$, $(h_3\times w_{256a}, h_5\times w_{256a})$, $(h_3\times w_{256a},h_4\times w_{256a})$, $(h_3\times w_{256a}, h_3\times w_{256a})$, $(h_3\times w_{256a}, h_2\times w_{256a})$, $(h_3\times w_{256a}, h_1\times w_{256a})$, $(h_3\times w_{256a},-15\times w_{256a})$, $(h_3\times w_{256a},-h_7\times w_{256a})$, $(h_3\times w_{256a},-h_6\times w_{256a})$, $(h_3\times w_{256a},-h_5\times w_{256a})$, $(h_3\times w_{256a},-h_4\times w_{256a})$, $(h_3\times w_{256a},-h_3\times w_{256a})$, $(h_3\times w_{256a},-h_2\times w_{256a})$, $(h_3\times w_{256a},-h_1\times w_{256a})$, $(h_2\times w_{256a}, 15\times w_{256a})$, $(h_2\times w_{256a}, h_7\times w_{256a})$, $(h_2\times w_{256a}, h_6\times w_{256a})$, $(h_2\times w_{256a}, h_5\times w_{256a})$, $(h_2\times w_{256a},h_4\times w_{256a})$, $(h_2\times w_{256a}, h_3\times w_{256a})$, $(h_2\times w_{256a}, h_2\times w_{256a})$, $(h_2\times w_{256a}, h_1\times w_{256a})$, $(h_2\times w_{256a},-15\times w_{256a})$, $(h_2\times w_{256a},-h_7\times w_{256a})$, $(h_2\times w_{256a},-h_6\times w_{256a})$, $(h_2\times w_{256a},-h_5\times w_{256a})$, $(h_2\times w_{256a},-h_4\times w_{256a})$, $(h_2\times w_{256a},-h_3\times w_{256a})$, $(h_2\times w_{256a},-h_2\times w_{256a})$, $(h_2\times w_{256a},-h_1\times w_{256a})$, $(h_1\times w_{256a}, 15\times w_{256a})$, $(h_1\times w_{256a},h_7\times w_{256a})$, $(h_1\times w_{256a},h_6\times w_{256a})$, $(h_1\times w_{256a}, h_5\times w_{256a})$, $(h_1\times w_{256a},h_4\times w_{256a})$, $(h_1\times w_{256a},h_3\times w_{256a})$, $(h_1\times w_{256a}, h_2\times w_{256a})$, $(h_1\times w_{256a}, h_1\times w_{256a})$, $(h_1\times w_{256a},-15\times w_{256a})$, $(h_1\times w_{256a},-h_7\times w_{256a})$, $(h_1\times w_{256a},-h_6\times w_{256a})$, $(h_1\times w_{256a},-h_5\times w_{256a})$, $(h_1\times w_{256a},-h_4\times w_{256a})$, $(h_1\times w_{256a},-h_3\times w_{256a})$, $(h_1\times w_{256a},-h_2\times w_{256a})$, $(h_1\times w_{256a},-h_1\times w_{256a})$, $(-15\times w_{256a}, 15\times w_{256a})$, $(-15\times w_{256a},h_7\times w_{256a})$, $(-15\times w_{256a},h_6\times w_{256a})$, $(-15\times w_{256a}, h_5\times w_{256a})$, $(-15\times w_{256a},h_4\times w_{256a})$, $(-15\times w_{256a},h_3\times w_{256a})$, $(-15\times w_{256a}, h_2\times w_{256a})$, $(-15\times w_{256a}, h_1\times w_{256a})$, $(-15\times w_{256a},-15\times w_{256a})$, $(-15\times w_{256a},-h_7\times w_{256a})$, $(-15\times w_{256a},-h_6\times w_{256a})$, $(-15\times w_{256a},-h_5\times w_{256a})$, $(-15\times w_{256a},-h_4\times w_{256a})$, $(-15\times w_{256a},-h_3\times w_{256a})$, $(-15\times w_{256a},-h_2\times w_{256a})$, $(-15\times w_{256a},-h_1\times w_{256a})$, $(-h_7\times w_{256a}, 15\times w_{256a})$, $(-h_7\times w_{256a}, h_7\times w_{256a})$, $(-h_7\times w_{256a}, h_6\times w_{256a})$, $(-h_7\times w_{256a}, h_5\times w_{256a})$, $(-h_7\times w_{256a}, h_4\times w_{256a})$, $(-h_7\times w_{256a}, h_3\times w_{256a})$, $(-h_7\times w_{256a}, h_2\times w_{256a})$, $(-h_7\times w_{256a}, h_1\times w_{256a})$, $(-h_7\times w_{256a}, -15\times w_{256a})$, $(-h_7\times w_{256a}, -h_7\times w_{256a})$, $(-h_7\times w_{256a}, -h_6\times w_{256a})$, $(-h_7\times w_{256a}, -h_5\times w_{256a})$, $(-h_7\times w_{256a}, -h_4\times w_{256a})$, $(-h_7\times w_{256a}, -h_3\times w_{256a})$, $(-h_7\times w_{256a}, -h_2\times w_{256a})$, $(-h_7\times w_{256a}, -h_1\times w_{256a})$, $(-h_6\times w_{256a}, 15\times w_{256a})$, $(-h_6\times w_{256a}, h_7\times w_{256a})$, $(-h_6\times w_{256a}, h_6\times w_{256a})$, $(-h_6\times w_{256a}, h_5\times w_{256a})$, $(-h_6\times w_{256a}, h_4\times w_{256a})$, $(-h_6\times w_{256a}, h_3\times w_{256a})$, $(-h_6\times w_{256a}, h_2\times w_{256a})$, $(-h_6\times w_{256a}, h_1\times w_{256a})$, $(-h_6\times w_{256a}, -15\times w_{256a})$, $(-h_6\times w_{256a}, -h_7\times w_{256a})$, $(-h_6\times w_{256a}, -h_6\times w_{256a})$, $(-h_6\times w_{256a}, -h_5\times w_{256a})$, $(-h_6\times w_{256a}, -h_4\times w_{256a})$, $(-h_6\times w_{256a}, -h_3\times w_{256a})$, $(-h_6\times w_{256a}, -h_2\times w_{256a})$, $(-h_6\times w_{256a}, -h_1\times w_{256a})$, $(-h_5\times w_{256a}, 15\times w_{256a})$, $(-h_5\times w_{256a}, h_7\times w_{256a})$, $(-h_5\times w_{256a}, h_6\times w_{256a})$, $(-h_5\times w_{256a}, h_5\times w_{256a})$, $(-h_5\times w_{256a}, h_4\times w_{256a})$, $(-h_5\times w_{256a}, h_3\times w_{256a})$, $(-h_5\times w_{256a}, h_2\times w_{256a})$, $(-h_5\times w_{256a}, h_1\times w_{256a})$, $(-h_5\times w_{256a}, -15\times w_{256a})$, $(-h_5\times w_{256a}, -h_7\times w_{256a})$, $(-h_5\times w_{256a}, -h_6\times w_{256a})$, $(-h_5\times w_{256a}, -h_5\times w_{256a})$, $(-h_5\times w_{256a}, -h_4\times w_{256a})$, $(-h_5\times w_{256a}, -h_3\times w_{256a})$, $(-h_5\times w_{256a}, -h_2\times w_{256a})$, $(-h_5\times w_{256a}, -h_1\times w_{256a})$, $(-h_4\times w_{256a}, 15\times w_{256a})$, $(-h_4\times w_{256a}, h_7\times w_{256a})$, $(-h_4\times w_{256a}, h_6\times w_{256a})$, $(-h_4\times w_{256a}, h_5\times w_{256a})$, $(-h_4\times w_{256a}, h_4\times w_{256a})$, $(-h_4\times w_{256a}, h_3\times w_{256a})$, $(-h_4\times w_{256a}, h_2\times w_{256a})$, $(-h_4\times w_{256a}, h_1\times w_{256a})$, $(-h_4\times w_{256a}, -15\times w_{256a})$, $(-h_4\times w_{256a}, -h_7\times w_{256a})$, $(-h_4\times w_{256a}, -h_6\times w_{256a})$, $(-h_4\times w_{256a}, -h_5\times w_{256a})$, $(-h_4\times w_{256a}, -h_4\times w_{256a})$, $(-h_4\times w_{256a}, -h_3\times w_{256a})$, $(-h_4\times w_{256a}, -h_2\times w_{256a})$, $(-h_4\times w_{256a}, -h_1\times w_{256a})$, $(-h_3\times w_{256a}, 15\times w_{256a})$, $(-h_3\times w_{256a}, h_7\times w_{256a})$, $(-h_3\times w_{256a}, h_6\times w_{256a})$, $(-h_3\times w_{256a}, h_5\times w_{256a})$, $(-h_3\times w_{256a}, h_4\times w_{256a})$, $(-h_3\times w_{256a}, h_3\times w_{256a})$, $(-h_3\times w_{256a}, h_2\times w_{256a})$, $(-h_3\times w_{256a}, h_1\times w_{256a})$, $(-h_3\times w_{256a}, -15\times w_{256a})$, $(-h_3\times w_{256a}, -h_7\times w_{256a})$, $(-h_3\times w_{256a}, -h_6\times w_{256a})$, $(-h_3\times w_{256a}, -h_5\times w_{256a})$, $(-h_3\times w_{256a}, -h_4\times w_{256a})$, $(-h_3\times w_{256a}, -h_3\times w_{256a})$, $(-h_3\times w_{256a}, -h_2\times w_{256a})$, $(-h_3\times w_{256a}, -h_1\times w_{256a})$, $(-h_2\times w_{256a}, 15\times w_{256a})$, $(-h_2\times w_{256a}, h_7\times w_{256a})$, $(-h_2\times w_{256a}, h_6\times w_{256a})$, $(-h_2\times w_{256a}, h_5\times w_{256a})$, $(-h_2\times w_{256a}, h_4\times w_{256a})$, $(-h_2\times w_{256a}, h_3\times w_{256a})$, $(-h_2\times w_{256a}, h_2\times w_{256a})$, $(-h_2\times w_{256a}, h_1\times w_{256a})$, $(-h_2\times w_{256a}, -15\times w_{256a})$, $(-h_2\times w_{256a}, -h_7\times w_{256a})$, $(-h_2\times w_{256a}, -h_6\times w_{256a})$, $(-h_2\times w_{256a}, -h_5\times w_{256a})$, $(-h_2\times w_{256a}, -h_4\times w_{256a})$, $(-h_2\times w_{256a}, -h_3\times w_{256a})$, $(-h_2\times w_{256a}, -h_2\times w_{256a})$, $(-h_2\times w_{256a}, -h_1\times w_{256a})$, $(-h_1\times w_{256a}, 15\times w_{256a})$, $(-h_1\times w_{256a}, h_7\times w_{256a})$, $(-h_1\times w_{256a}, h_6\times w_{256a})$, $(-h_1\times w_{256a}, h_5\times w_{256a})$, $(-h_1\times w_{256a}, h_4\times w_{256a})$, $(-h_1\times w_{256a}, h_3\times w_{256a})$, $(-h_1\times w_{256a}, h_2\times w_{256a})$, $(-h_1\times w_{256a}, h_1\times w_{256a})$, $(-h_1\times w_{256a}, -15\times w_{256a})$, $(-h_1\times w_{256a}, -h_7\times w_{256a})$, $(-h_1\times w_{256a}, -h_6\times w_{256a})$, $(-h_1\times w_{256a}, -h_5\times w_{256a})$, $(-h_1\times w_{256a}, -h_4\times w_{256a})$, $(-h_1\times w_{256a}, -h_3\times w_{256a})$, $(-h_1\times w_{256a}, -h_2\times w_{256a})$, $(-h_1\times w_{256a}, -h_1\times w_{256a})$. Respective coordinates of the signal points ("○") immediately above the values 00000000 to 11111111 of the set of b0, b1, b2, b3, b4, b5, b6, and b7 in the I-Q plane serve as in-phase component I and quadrature component Q of the mapped baseband signal. The relationship between the set of b0, b1, b2, b3, b4, b5, b6, and b7 (00000000 to 11111111) and the signal point coordinates during 256QAM modulation is not limited to that in FIG. 113.

256 signal points in FIG. 113 are named as "signal point 1", "signal point 2", . . . , "signal point 255", and "signal point 256" (because of the presence of 256 signal points, "signal point 1" to "signal point 256" exist). In the I-Q plane, Di is a distance between "signal point i" and the origin. At this point, $w_{256a}$ is given by the following equation.

[Mathematical formula 367]

$$w_{256a} = \frac{z}{\sqrt{\dfrac{\sum_{i=1}^{256} D_i^2}{256}}} \tag{H3}$$

Therefore, the mapped baseband signal has an average power of $z_2$.

In the above description, the case equal to (Configuration example R1) is referred to as uniform-256QAM, and other cases are referred to as non-uniform 256QAM.

(Supplement 3)

The bit length adjusting method is described in the first to eleventh exemplary embodiments. The method for applying the bit length adjusting methods of the first to eleventh exemplary embodiments to the DVB standard is described in the twelfth exemplary embodiment. The case that 16QAM, 64QAM, and 256QAM are applied as the modulation scheme is described in the above exemplary embodiments. A specific mapping method with respect to 16QAM, 64QAM, and 256QAM is described in (Configuration example R1).

A specific mapping method with respect to 16QAM, 64QAM, and 256QAM different from that of (Configuration example R1) and (Supplement 2) will be described below. The following 16QAM, 64QAM, and 256QAM may be applied to the first to twelfth exemplary embodiments, and the effects of the first to twelfth exemplary embodiments can also be obtained.

Figure 114:
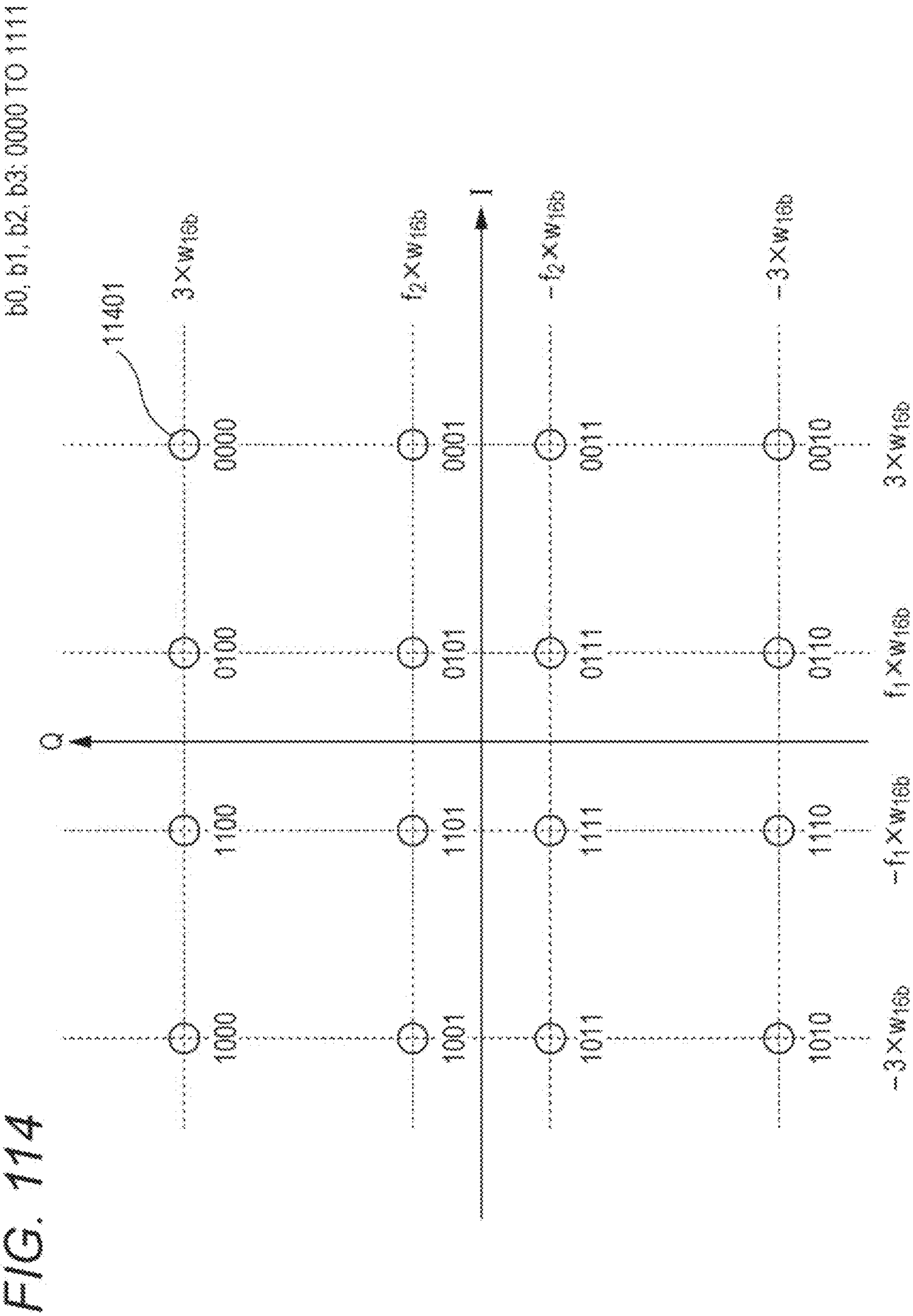
FIG. 114 is a view illustrating an arrangement example of the 16QAM signal points in the I-Q plane.

The 16QAM mapping method will be described below. FIG. 114 illustrates an arrangement example of 16QAM signal points in the I-Q plane. In FIG. 114, 16 marks "○" indicate 16QAM signal points, a horizontal axis indicates I, and a vertical axis indicates Q. In FIG. 114, it is assumed that $f_1>0$ ($f_1$ is a real number larger than 0), $f_2>0$ ($f_2$ is a real number larger than 0), $f_1\neq 3$, and $f_1\neq f_2$ hold.

In the I-Q plane, 16 signal points included in 16QAM (indicated by the marks "○" in FIG. 114) are obtained as follows. ($w_{16b}$ is a real number larger than 0)

$(3\times w_{16b}, 3\times w_{16b})$, $(3\times w_{16b}, f_2\times w_{16b})$, $(3\times w_{16b}, -f_2\times w_{16b})$, $(3\times w_{16b}, -3\times w_{16b})$, $(f_1\times w_{16b}, 3\times w_{16b})$, $(f_1\times w_{16b}, f_2\times w_{16b})$, $(f_1\times w_{16b}, -f_2\times w_{16b})$, $(f_1\times w_{16b}, -3\times w_{16b})$, $(-f_1\times w_{16b}, 3\times w_{16b})$, $(-f_1\times w_{16b}, f_2\times w_{16b})$, $(-f_1\times w_{16b}, f_2\times w_{16b})$, $(-f_1\times w_{16b}, -3\times w_{16b})$, $(-3\times w_{16b}, 3\times w_{16b})$, $(-3\times w_{16b}, f_2\times w_{16b})$, $(-3\times w_{16b}, -f_2\times w_{16b})$, $(-3\times w_{16b}, -3\times w_{16b})$ At this point, the bits to be transmitted (input bits) are set to b0, b1, b2, and b3. For example, for the bits to be transmitted (b0, b1, b2, b3)=(0,0,0,0), the bits are mapped at signal point 11401 in FIG. 114, and $(I,Q)=(3\times w_{16b}, 3\times w_{16b})$ is obtained when I is an in-phase component while Q is a quadrature component of the mapped baseband signal.

Based on the bits to be transmitted (b0, b1, b2, b3), in-phase component I and quadrature component Q of the mapped baseband signal are decided (during 16QAM modulation). FIG. 114 illustrates an example of the relationship between the set of b0, b1, b2, and b3 (0000 to 1111) and the signal point coordinates. Values 0000 to 1111 of the set of b0, b1, b2, and b3 are indicated immediately below 16 signal points included in 16QAM (the marks "○" in FIG. 114) $(3\times w_{16b}, 3\times w_{16b})$, $(3\times w_{16b}, f_2\times w_{16b})$, $(3\times w_{16b}, -f_2\times w_{16b})$, $(3\times w_{16b}, -3\times w_{16b})$, $(f_1\times w_{16b}, 3\times w_{16b})$, $(f_1\times w_{16b}, f_2\times w_{16b})$, $(f_1\times w_{16b}, -f_2\times w_{16b})$, $(f_1\times w_{16b}, -3\times w_{16b})$, $(-f_1\times w_{16b}, 3\times w_{16b})$, $(-f_1\times w_{16b}, f_2\times w_{16b})$, $(-f_1\times w_{16b}, -f_2\times w_{16b})$, $(-f_1\times w_{16b}, -3\times w_{16b})$, $(-3\times w_{16b}, 3\times w_{16b})$, $(-3\times w_{16b}, f_2\times w_{16b})$, $(-3\times w_{16b}, -f_2\times w_{16b})$, $(-3\times w_{16b}, -3\times w_{16b})$. Respective coordinates of the signal points ("○") immediately above the values 0000 to 1111 of the set of b0, b1, b2, and b3 in the I-Q plane serve as in-phase component I and quadrature component Q of the mapped baseband signal. The relationship between the set of b0, b1, b2, and b3 (0000 to 1111) and the signal point coordinates during 16QAM modulation is not limited to that in FIG. 114.

16 signal points in FIG. 114 are named as "signal point 1", "signal point 2", . . . , "signal point 15", and "signal point 16" (because of the presence of 16 signal points, "signal point 1" to "signal point 16" exist). In the I-Q plane, Di is a distance between "signal point i" and the origin. At this point, $w_{16b}$ is given by the following equation.

[Mathematical formula 368]

$$w_{16b} = \frac{z}{\sqrt{\frac{\sum_{i=1}^{16} D_i^2}{16}}} = \frac{z}{\sqrt{\frac{((3^2+3^2)\times 4+(f_1^2+f_2^2)\times 4+(f_1^2+3^2)\times 4+(f_2^2+3^2)\times 4)}{16}}} \qquad \text{(H4)}$$

Therefore, the mapped baseband signal has an average power of $z_2$. The effect of 16QAM is described later.

Figure 115:
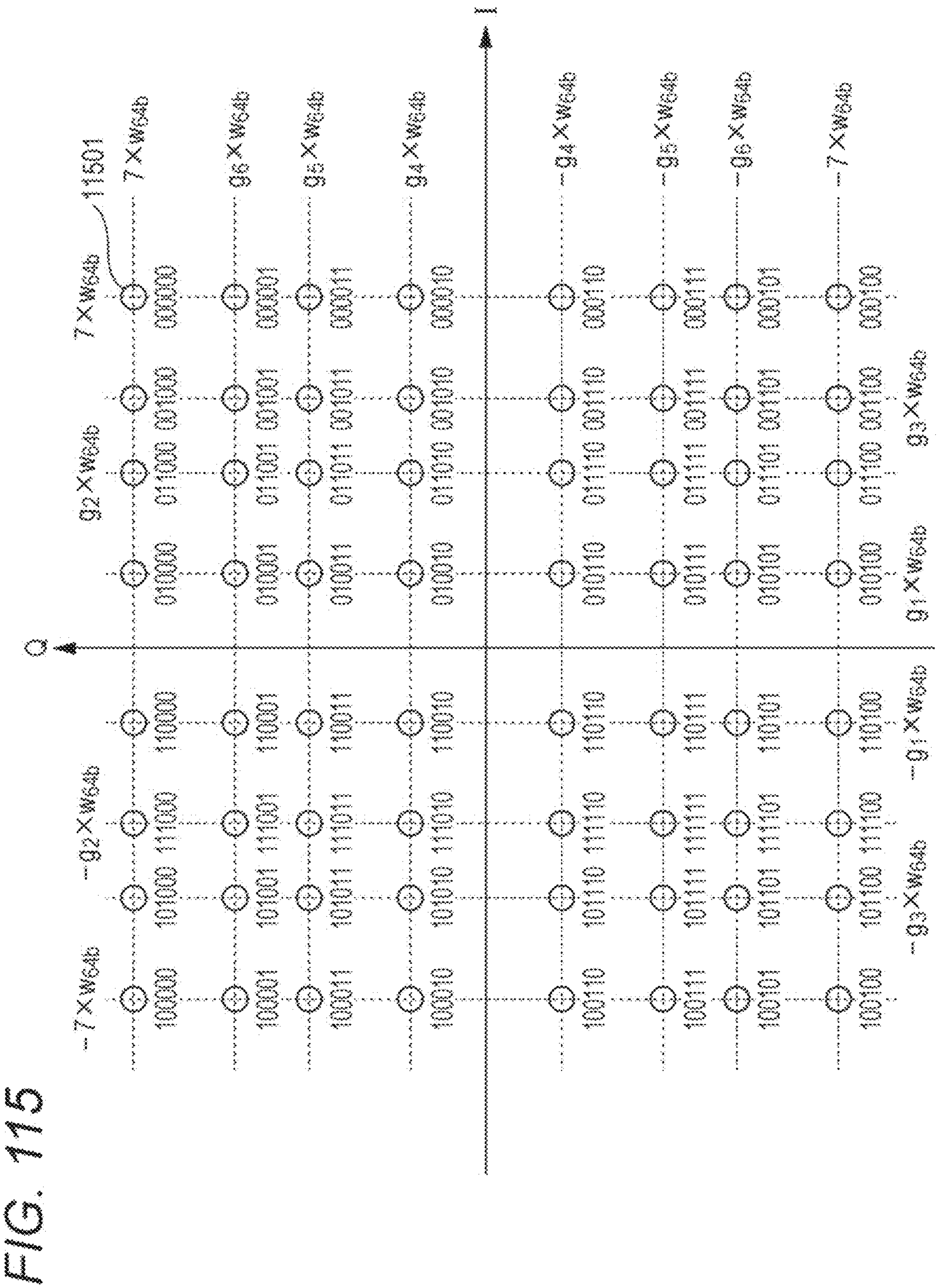

The 64QAM mapping method will be described below. FIG. 115 illustrates an arrangement example of 64QAM signal points in the I-Q plane. In FIG. 115, 64 marks "○" indicate 64QAM signal points, a horizontal axis indicates I, and a vertical axis indicates Q.

In FIG. 115, $g_1>0$ ($g_1$ is a real number larger than 0) and $g_2>0$ ($g_2$ is a real number larger than 0) and $g_3>0$ ($g_3$ is a real number larger than 0) and $g_4>0$ ($g_4$ is a real number larger than 0) and $g_5>0$ ($g_5$ is a real number larger than 0) and $g_{6>0}$ ($g_6$ is a real number larger than 0) hold, and $\{g_1\neq 7$ and $g_2\neq 7$ and $g_3\neq 7$ and $g_1\neq g_2$ and $g_1\neq g_3$ and $g_2\neq g_3\}$ and $\{g_4\neq 7$ and $g_5\neq 7$ and $g_6\neq 7$ and $g_4\neq g_5$ and $g_4\neq g_6$ and $g_5\neq g_6\}$ and $\{\{g_1\neq g_4$ or $g_2..g_5$ or $g_3\neq g_6\}$ holds.$\}$ hold.

In the I-Q plane, 64 signal points included in 64QAM (indicated by the marks "○" in FIG. 115) are obtained as follows. ($w_{64b}$ is a real number larger than 0)

$(7\times w_{64b},7\times w_{64b})$, $(7\times w_{64b},g_6\times w_{64b})$, $(7\times w_{64b},g_5\times w_{64b})$, $(7\times w_{64b},g_4\times w_{64b})$, $(7\times w_{64b},-g_4\times w_{64b})$, $(7\times w_{64b},-g_5\times w_{64b})$, $(7\times w_{64b},-g_6\times w_{64b})$, $(7\times w_{64b},-7\times w_{64b})$ $(g_3\times w_{64b},7\times w_{64b})$, $(g_3\times w_{64b},g_6\times w_{64b})$, $(g_3\times w_{64b},g_5\times w_{64b})$, $(g_3\times w_{64b},g_4\times w_{64b})$, $(g_3\times w_{64b},-g_4\times w_{64b})$, $(g_3\times w_{64b},-g_5\times w_{64b})$, $(g_3\times w_{64b},-g_6\times w_{64b})$, $(g_3\times w_{64b},-7\times w_{64b})$ $(g_2\times w_{64b},7\times w_{64b})$, $(g_2\times w_{64b},g_6\times w_{64b})$, $(g_2\times w_{64b},g_5\times w_{64b})$, $(g_2\times w_{64b},g_4\times w_{64b})$, $(g_2\times w_{64b},-g_4\times w_{64b})$, $(g_2\times w_{64b},-g_5\times w_{64b})$, $(g_2\times w_{64b},-g_6\times w_{64b})$, $(g_2\times w_{64b},-7\times w_{64b})$ $(g_1\times w_{64b},7\times w_{64b})$, $(g_1\times w_{64b},g_6\times w_{64b})$, $(g_1\times w_{64b},g_5\times w_{64b})$, $(g_1\times w_{64b},g_4\times w_{64b})$, $(g_1\times w_{64b},-g_4\times w_{64b})$, $(g_1\times w_{64b},-g_5\times w_{64b})$, $(g_1\times w_{64b},-g_6\times w_{64b})$, $(g_1\times w_{64b},-7\times w_{64b})$ $(-g_1\times w_{64b},7\times w_{64b})$, $(-g_1\times w_{64b},g_6\times w_{64b})$, $(-g_1\times w_{64b},g_5\times w_{64b})$, $(-g_1\times w_{64b},g_4\times w_{64b})$, $(-g_1\times w_{64b},-g_4\times w_{64b})$, $(-g_1\times w_{64b},-g_5\times w_{64b})$, $(-g_1\times w_{64b},-g_6\times w_{64b})$, $(-g_1\times w_{64b},-7\times w_{64b})$ $(-g_2\times w_{64b},7\times w_{64b})$, $(-g_2\times w_{64b},g_6\times w_{64b})$, $(-g_2\times w_{64b},g_5\times w_{64b})$, $(-g_2\times w_{64b},g_4\times w_{64b})$, $(-g_2\times w_{64b},-g_4\times w_{64b})$, $(-g_2\times w_{64b},-g_5\times w_{64b})$, $(-g_2\times w_{64b},-g_6\times w_{64b})$, $(-g_2\times w_{64b},-7\times w_{64b})$ $(-g_3\times w_{64b},7\times w_{64b})$, $(-g_3\times w_{64b},g_6\times w_{64b})$, $(-g_3\times w_{64b},g_5\times w_{64b})$, $(-g_3\times w_{64b},g_4\times w_{64b})$, $(-g_3\times w_{64b},-g_4\times w_{64b})$, $(-g_3\times w_{64b},-g_5\times w_{64b})$, $(-g_3\times w_{64b},-g_6\times w_{64b})$, $(-g_3\times w_{64b},-7\times w_{64b})$ $(-7\times w_{64b},7\times w_{64b})$, $(-7\times w_{64b},g_6\times w_{64b})$, $(-7\times w_{64b},g_5\times w_{64b})$, $(-7\times w_{64b},g_4\times w_{64b})$, $(-7\times w_{64b},-g_4\times w_{64b})$, $(-7\times w_{64b},-g_5\times w_{64b})$, $(-7\times w_{64b},-g_6\times w_{64b})$, $(-7\times w_{64b},-7\times w_{64b})$ At this point, the bits to be transmitted (input bits) are set to b0, b1, b2, b3, b4, and b5. For example, for the bits to be transmitted (b0, b1, b2, b3, b4, b5)=(0,0,0,0,0,0), the bits are mapped at signal point 11501 in FIG. 115, and $(I,Q)=(7\times w_{64b},7\times w_{64b})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 115 illustrates an example of a relationship between the set of b0, b1, b2, b3, b4, and b5 (000000 to 111111) and the signal point coordinates. Values 000000 to 111111 of the set of b0, b1, b2, b3, b4, and b5 are indicated immediately below 64 signal points included in 64QAM (the marks "○" in FIG. 115) $(7\times w_{64b},7\times w_{64b})$, $(7\times w_{64b},g_6\times w_{64b})$, $(7\times w_{64b},g_5\times w_{64b})$, $(7\times w_{64b},g_4\times w_{64b})$, $(7\times w_{64b},-g_4\times w_{64b})$, $(7\times w_{64b},-g_5\times w_{64b})$, $(7\times w_{64b},-g_6\times w_{64b})$, $(7\times w_{64b},-7\times w_{64b})$ $(g_3\times w_{64b},7\times w_{64b})$, $(g_3\times w_{64b},g_6\times w_{64b})$, $(g_3\times w_{64b},g_5\times w_{64b})$, $(g_3\times w_{64b},g_4\times w_{64b})$, $(g_3\times w_{64b},-g_4\times w_{64b})$, $(g_3\times w_{64b},-g_5\times w_{64b})$, $(g_3\times w_{64b},-g_6\times w_{64b})$, $(g_3\times w_{64b},-7\times w_{64b})$ $(g_2\times w_{64b},7\times w_{64b})$, $(g_2\times w_{64b},g_6\times w_{64b})$, $(g_2\times w_{64b},g_5\times w_{64b})$, $(g_2\times w_{64b},g_4\times w_{64b})$, $(g_2\times w_{64b},-g_4\times w_{64b})$, $(g_2\times w_{64b},-g_5\times w_{64b})$, $(g_2\times w_{64b},-g_6\times w_{64b})$, $(g_2\times w_{64b},-7\times w_{64b})$ $(g_1\times w_{64b},7\times w_{64b})$, $(g_1\times w_{64b},g_6\times w_{64b})$, $(g_1\times w_{64b},g_5\times w_{64b})$, $(g_1\times w_{64b},g_4\times w_{64b})$, $(g_1\times w_{64b},-g_4\times w_{64b})$, $(g_1\times w_{64b},-g_5\times w_{64b})$, $(g_1\times w_{64b},-g_6\times w_{64b})$, $(g_1\times w_{64b},-7\times w_{64b})$ $(-g_1\times w_{64b},7\times w_{64b})$, $(-g_1\times w_{64b},g_6\times w_{64b})$, $(-g_1\times w_{64b},g_5\times w_{64b})$, $(-g_1\times w_{64b},g_4\times w_{64b})$, $(-g_1\times w_{64b},-g_4\times w_{64b})$, $(-g_1\times w_{64b},-g_5\times w_{64b})$, $(-g_1\times w_{64b},-g_6\times w_{64b})$, $(-g_1\times w_{64b},-7\times w_{64b})$ $(-g_2\times w_{64b},7\times w_{64b})$, $(-g_2\times w_{64b},g_6\times w_{64b})$, $(-g_2\times w_{64b},g_5\times w_{64b})$, $(-g_2\times w_{64b},g_4\times w_{64b})$, $(-g_2\times w_{64b},-g_4\times w_{64b})$, $(\sim g_2\times w_{64b},-g_5\times w_{64b})$, $(\sim g_2\times w_{64b},-g_6\times w_{64b})$, $(\sim g_2\times w_{64b},-7\times w_{64b})$ $(-g_3\times w_{64b},7\times w_{64b})$, $(-g_3\times w_{64b},g_6\times w_{64b})$, $(-g_3\times w_{64b},g_5\times w_{64b})$, $(-g_3\times w_{64b},g_4\times w_{64b})$, $(-g_3\times w_{64b},-g_4\times w_{64b})$, $(-g_3\times w_{64b},-g_5\times w_{64b})$, $(-g_3\times w_{64b},-g_6\times w_{64b})$, $(-g_3\times w_{64b},-7\times w_{64b})$ $(-7\times w_{64b},7\times w_{64b})$, $(-7\times w_{64b},g_6\times w_{64b})$, $(-7\times w_{64b},g_5\times w_{64b})$, $(-7\times w_{64b},g_4\times w_{64b})$, $(-7\times w_{64b},-g_4\times w_{64b})$, $(-7\times w_{64b},-g_5\times w_{64b})$, $(-7\times w_{64b},-g_6\times w_{64b})$, $(-7\times w_{64b},-7\times w_{64b})$. Respective coordinates of the signal points ("○") immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 115.

64 signal points in FIG. 115 are named as "signal point 1", "signal point 2", . . . , "signal point 63", and "signal point 64" (because of the presence of 64 signal points, "signal point 1" to "signal point 64" exist). In the I-Q plane, Di is a distance between "signal point i" and the origin. At this point, $w_{64b}$ is given by the following equation.

[Mathematical formula 369]

$$w_{64b} = \frac{z}{\sqrt{\frac{\sum_{i=1}^{64} D_i^2}{64}}} \qquad \text{(H5)}$$

Therefore, the mapped baseband signal has an average power of $z_2$. The effect is described later.

Figure 116:
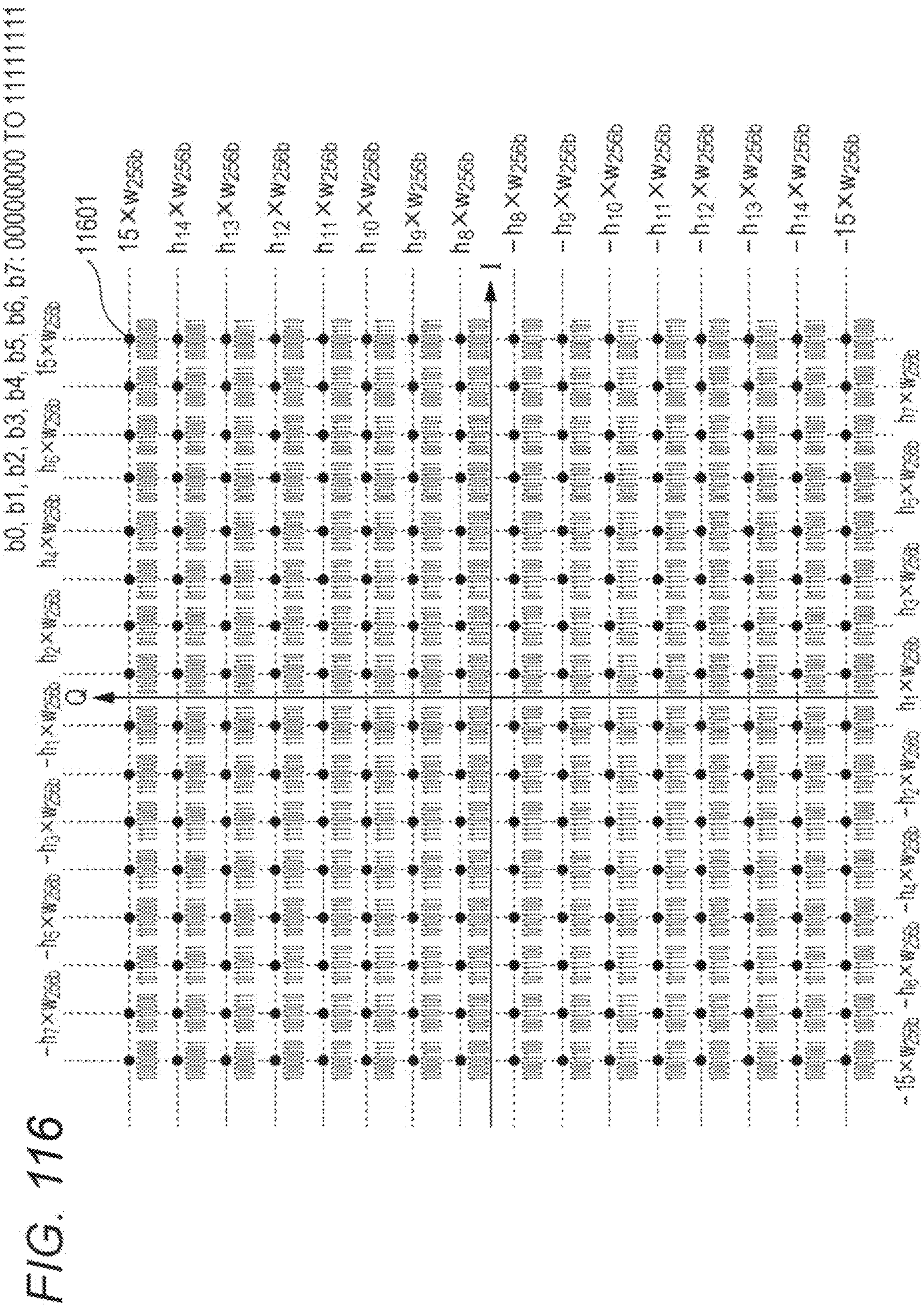

The 256QAM mapping method will be described below. FIG. 116 illustrates an arrangement example of 256QAM signal points in the I-Q plane. In FIG. 116, 256 marks "○" indicate 256QAM signal points, a horizontal axis indicates I, and a vertical axis indicates Q.

In FIG. 116, $h_1>0$ ($h_1$ is a real number larger than 0) and $h_2>0$ ($h_2$ is a real number larger than 0) and $h_3>0$ ($h_3$ is a real number larger than 0) and $h_4>0$ ($h_4$ is a real number larger than 0) and $h_5>0$ ($h_5$ is a real number larger than 0) and $h_6>0$ ($h_6$ is a real number larger than 0) and $h_7>0$ ($h_7$ is a real number larger than 0), and $h_8>0$ ($h_8$ is a real number larger than 0) and $h_9>0$ ($h_9$ is a real number larger than 0) and $h_{10}>0$ ($h_{10}$ is a real number larger than 0) and $h_{11}>0$ ($h_{11}$ is a real number larger than 0) and $h_{12}>0$ ($h_{12}$ is a real number larger than 0) and $h_{13}>0$ ($h_{13}$ is a real number larger than 0) and $h_{14}>0$ ($h_{14}$ is a real number larger than 0), {$h_1\neq15$ and $h_2\neq15$ and $h_3\neq15$ and $h_4\neq15$ and $h_5\neq15$ and $h_6\neq15$ and $h_7\neq15$,
and $h_1\neq h_2$ and $h_1\neq h_3$ and $h_1\neq h_4$ and $h_1\neq h_5$ and $h_1\neq h_6$ and $h_1\neq h_7$,
and $h_2\neq h_3$ and $h_2\neq h_4$ and $h_2\neq h_5$ and $h_2\neq h_6$ and $h_2\neq h_7$,
and $h_3\neq h_4$ and $h_3\neq h_5$ and $h_3\neq h_6$ and $h_3\neq h_7$,
and $h_4\neq h_5$ and $h_4\neq h_6$ and $h_4\neq h_7$,
and $h_5\neq h_6$ and $h_5\neq h_7$,
and $h_6\neq h_7$}
and
{$h_8\neq15$ and $h_9\neq15$ and $h_{10}\neq15$ and $h_{11}\neq15$ and $h_{12}\neq15$ and $h_{13}\neq15$ and $h_{14}\neq15$,
and $h_8\neq h_9$ and $h_8\neq h_{10}$ and $h_8\neq h_{11}$ and $h_8\neq h_{12}$ and $h_8\neq h_{13}$ and $h_8\neq h_{14}$,
and $h_9\neq h_{10}$ and $h_9\neq h_{11}$ and $h_9\neq h_{12}$ and $h_9\neq h_{13}$ and $h_9\neq h_{14}$,
and $h_{10}\neq h_{11}$ and $h_{10}\neq h_{12}$ and $h_{10}\neq h_{13}$ and $h_{10}\neq h_{14}$,
and $h_{11}\neq h_{12}$ and $h_{11}\neq h_{13}$ and $h_{11}\neq h_{14}$,
and $h_{12}\neq h_{13}$ and $h_{12}\neq h_{14}$,
and $h_{13}\neq h_{14}$}
and
{$h_1\neq h_8$ or $h_2\neq h_9$ or $h_3\neq h_{10}$ or $h_4\neq h_{11}$ or $h_5\neq h_{12}$ or $h_6\neq h_{13}$ or $h_7\neq h_{14}$ holds} hold.

In the I-Q plane, 256 signal points included in 256QAM (indicated by the marks "○" in FIG. 116) are obtained as follows. ($w_{256b}$ is a real number larger than 0)

$(15\times w_{256b}, 15\times w_{256b})$, $(15\times w_{256b}, h_{14}\times w_{256b})$, $(15\times w_{256b}, h_{13}\times w_{256b})$, $(15\times w_{256b}, h_{12}\times w_{256b})$, $(15\times w_{256b}, h_{11}\times w_{256b})$, $(15\times w_{256b}, h_{10}\times w_{256b})$, $(15\times w_{256b}, h_9\times w_{256b})$, $(15\times w_{256b}, h_8\times w_{256b})$, $(15\times w_{256b}, -15\times w_{256b})$, $(15\times w_{256b}, -h_{14}\times w_{256b})$, $(15\times w_{256b}, -h_{13}\times w_{256b})$, $(15\times w_{256b}, -h_{12}\times w_{256b})$, $(15\times w_{256b}, -h_{11}\times w_{256b})$, $(15\times w_{256b}, -h_{10}\times w_{256b})$, $(15\times w_{256b}, -h_9\times w_{256b})$, $(15\times w_{256b}, -h_8\times w_{256b})$, $(h_7\times w_{256b}, 15\times w_{256b})$, $(h_7\times w_{256b}, h_{14}\times w_{256b})$, $(h_7\times w_{256b}, h_{13}\times w_{256b})$, $(h_7\times w_{256b}, h_{12}\times w_{256b})$, $(h_7\times w_{256b}, h_{11}\times w_{256b})$, $(h_7\times w_{256b}, h_{10}\times w_{256b})$, $(h_7\times w_{256b}, h_9\times w_{256b})$, $(h_7\times w_{256b}, h_8\times w_{256b})$, $(h_7\times w_{256b}, -15\times w_{256b})$, $(h_7\times w_{256b}, -h_{14}\times w_{256b})$, $(h_7\times w_{256b}, -h_{13}\times w_{256b})$, $(h_7\times w_{256b}, -h_{12}\times w_{256b})$, $(h_7\times w_{256b}, -h_{11}\times w_{256b})$, $(h_7\times w_{256b}, -h_{10}\times w_{256b})$, $(h_7\times w_{256b}, -h_9\times w_{256b})$, $(h_7\times w_{256b}, -h_8\times w_{256b})$, $(h_6\times w_{256b}, 15\times w_{256b})$, $(h_6\times w_{256b}, h_{14}\times w_{256b})$, $(h_6\times w_{256b}, h_{13}\times w_{256b})$, $(h_6\times w_{256b}, h_{12}\times w_{256b})$, $(h_6\times w_{256b}, h_{11}\times w_{256b})$, $(h_6\times w_{256b}, h_{10}\times w_{256b})$, $(h_6\times w_{256b}, h_9\times w_{256b})$, $(h_6\times w_{256b}, h_8\times w_{256b})$, $(h_6\times w_{256b}, -15\times w_{256b})$, $(h_6\times w_{256b}, -h_{14}\times w_{256b})$, $(h_6\times w_{256b}, -h_{13}\times w_{256b})$, $(h_6\times w_{256b}, -h_{12}\times w_{256b})$, $(h_6\times w_{256b}, -h_{11}\times w_{256b})$, $(h_6\times w_{256b}, -h_{10}\times w_{256b})$, $(h_6\times w_{256b}, -h_9\times w_{256b})$, $(h_6\times w_{256b}, -h_8\times w_{256b})$, $(h_5\times w_{256b}, 15\times w_{256b})$, $(h_5\times w_{256b}, h_{14}\times w_{256b})$, $(h_5\times w_{256b}, h_{13}\times w_{256b})$, $(h_5\times w_{256b}, h_{12}\times w_{256b})$, $(h_5\times w_{256b}, h_{11}\times w_{256b})$, $(h_5\times w_{256b}, h_{10}\times w_{256b})$, $(h_5\times w_{256b}, h_9\times w_{256b})$, $(h_5\times w_{256b}, h_8\times w_{256b})$, $(h_5\times w_{256b}, -15\times w_{256b})$, $(h_5\times w_{256b}, -h_{14}\times w_{256b})$, $(h_5\times w_{256b}, -h_{13}\times w_{256b})$, $(h_5\times w_{256b}, -h_{12}\times w_{256b})$, $(h_5\times w_{256b}, -h_{11}\times w_{256b})$, $(h_5\times w_{256b}, -h_{10}\times w_{256b})$, $(h_5\times w_{256b}, -h_9\times w_{256b})$, $(h_5\times w_{256b}, -h_8\times w_{256b})$, $(h_4\times w_{256b}, 15\times w_{256b})$, $(h_4\times w_{256b}, h_{14}\times w_{256b})$, $(h_4\times w_{256b}, h_{13}\times w_{256b})$, $(h_4\times w_{256b}, h_{12}\times w_{256b})$, $(h_4\times w_{256b}, h_{11}\times w_{256b})$, $(h_4\times w_{256b}, h_{10}\times w_{256b})$, $(h_4\times w_{256b}, h_9\times w_{256b})$, $(h_4\times w_{256b}, h_8\times w_{256b})$, $(h_4\times w_{256b}, -15\times w_{256b})$, $(h_4\times w_{256b}, -h_{14}\times w_{256b})$, $(h_4\times w_{256b}, -h_{13}\times w_{256b})$, $(h_4\times w_{256b}, -h_{12}\times w_{256b})$, $(h_4\times w_{256b}, -h_{11}\times w_{256b})$, $(h_4\times w_{256b}, -h_{10}\times w_{256b})$, $(h_4\times w_{256b}, -h_9\times w_{256b})$, $(h_4\times w_{256b}, -h_8\times w_{256b})$, $(h_3\times w_{256b}, 15\times w_{256b})$, $(h_3\times w_{256b}, h_{14}\times w_{256b})$, $(h_3\times w_{256b}, h_{13}\times w_{256b})$, $(h_3\times w_{256b}, h_{12}\times w_{256b})$, $(h_3\times w_{256b}, h_{11}\times w_{256b})$, $(h_3\times w_{256b}, h_{10}\times w_{256b})$, $(h_3\times w_{256b}, h_9\times w_{256b})$, $(h_3\times w_{256b}, h_8\times w_{256b})$, $(h_3\times w_{256b}, -15\times w_{256b})$, $(h_3\times w_{256b}, -h_{14}\times w_{256b})$, $(h_3\times w_{256b}, -h_{13}\times w_{256b})$, $(h_3\times w_{256b}, -h_{12}\times w_{256b})$, $(h_3\times w_{256b}, -h_{11}\times w_{256b})$, $(h_3\times w_{256b}, -h_{10}\times w_{256b})$, $(h_3\times w_{256b}, -h_9\times w_{256b})$, $(h_3\times w_{256b}, -h_8\times w_{256b})$, $(h_2\times w_{256b}, 15\times w_{256b})$, $(h_2\times w_{256b}, h_{14}\times w_{256b})$, $(h_2\times w_{256b}, h_{13}\times w_{256b})$, $(h_2\times w_{256b}, h_{12}\times w_{256b})$, $(h_2\times w_{256b}, h_{11}\times w_{256b})$, $(h_2\times w_{256b}, h_{10}\times w_{256b})$, $(h_2\times w_{256b}, h_9\times w_{256b})$, $(h_2\times w_{256b}, h_8\times w_{256b})$, $(h_2\times w_{256b}, -15\times w_{256b})$, $(h_2\times w_{256b}, -h_{14}\times w_{256b})$, $(h_2\times w_{256b}, -h_{13}\times w_{256b})$, $(h_2\times w_{256b}, -h_{12}\times w_{256b})$, $(h_2\times w_{256b}, -h_{11}\times w_{256b})$, $(h_2\times w_{256b}, -h_{10}\times w_{256b})$, $(h_2\times w_{256b}, -h_9\times w_{256b})$, $(h_2\times w_{256b}, -h_8\times w_{256b})$, $(h_1\times w_{256b}, 15\times w_{256b})$, $(h_1\times w_{256b}, h_{14}\times w_{256b})$, $(h_1\times w_{256b}, h_{13}\times w_{256b})$, $(h_1\times w_{256b}, h_{12}\times w_{256b})$, $(h_1\times w_{256b}, h_{11}\times w_{256b})$, $(h_1\times w_{256b}, h_{10}\times w_{256b})$, $(h_1\times w_{256b}, h_9\times w_{256b})$, $(h_1\times w_{256b}, h_8\times w_{256b})$, $(h_1\times w_{256b}, -15\times w_{256b})$, $(h_1\times w_{256b}, -h_{14}\times w_{256b})$, $(h_1\times w_{256b}, -h_{13}\times w_{256b})$, $(h_1\times w_{256b}, -h_{12}\times w_{256b})$, $(h_1\times w_{256b}, -h_{11}\times w_{256b})$, $(h_1\times w_{256b}, -h_{10}\times w_{256b})$, $(h_1\times w_{256b}, -h_9\times w_{256b})$, $(h_1\times w_{256b}, -h_8\times w_{256b})$, $(-15\times w_{256b}, 15\times w_{256b})$, $(-15\times w_{256b}, h_{14}\times w_{256b})$, $(-15\times w_{256b}, h_{13}\times w_{256b})$, $(-15\times w_{256b}, h_{12}\times w_{256b})$, $(-15\times w_{256b}, h_{11}\times w_{256b})$, $(-15\times w_{256b}, h_{10}\times w_{256b})$, $(-15\times w_{256b}, h_9\times w_{256b})$, $(-15\times w_{256b}, h_8\times w_{256b})$, $(-15\times w_{256b}, -15\times w_{256b})$, $(-15\times w_{256b}, -h_{14}\times w_{256b})$, $(-15\times w_{256b}, -h_{13}\times w_{256b})$, $(-15\times w_{256b}, -h_{12}\times w_{256b})$, $(-15\times w_{256b}, -h_{11}\times w_{256b})$, $(-15\times w_{256b}, -h_{10}\times w_{256b})$, $(-15\times w_{256b}, -h_9\times w_{256b})$, $(-15\times w_{256b}, -h_8\times w_{256b})$, $(-h_7\times w_{256b}, 15\times w_{256b})$, $(-h_7\times w_{256b}, h_{14}\times w_{256b})$, $(-h_7\times w_{256b}, h_{13}\times w_{256b})$, $(-h_7\times w_{256b}, h_{12}\times w_{256b})$, $(-h_7\times w_{256b}, h_{11}\times w_{256b})$, $(-h_7\times w_{256b}, h_{10}\times w_{256b})$, $(-h_7\times w_{256b}, h_9\times w_{256b})$, $(-h_7\times w_{256b}, h_8\times w_{256b})$, $(-h_7\times w_{256b}, -15\times w_{256b})$, $(-h_7\times w_{256b}, -h_{14}\times w_{256b})$, $(-h_7\times w_{256b}, -h_{13}\times w_{256b})$, $(-h_7\times w_{256b}, -h_{12}\times w_{256b})$, $(-h_7\times w_{256b}, -h_{11}\times w_{256b})$, $(-h_7\times w_{256b}, -h_{10}\times w_{256b})$, $(-h_7\times w_{256b}, -h_9\times w_{256b})$, $(-h_7\times w_{256b}, -h_8\times w_{256b})$, $(-h_6\times w_{256b}, 15\times w_{256b})$, $(-h_6\times w_{256b}, h_{14}\times w_{256b})$, $(-h_6\times w_{256b}, h_{13}\times w_{256b})$, $(-h_6\times w_{256b}, h_{12}\times w_{256b})$, $(-h_6\times w_{256b}, h_{11}\times w_{256b})$, $(-h_6\times w_{256b}, h_{10}\times w_{256b})$, $(-h_6\times w_{256b}, h_9\times w_{256b})$, $(-h_6\times w_{256b}, h_8\times w_{256b})$, $(-h_6\times w_{256b}, -15\times w_{256b})$, $(-h_6\times w_{256b}, -h_{14}\times w_{256b})$, $(-h_6\times w_{256b}, -h_{13}\times w_{256b})$, $(-h_6\times w_{256b}, -h_{12}\times w_{256b})$, $(-h_6\times w_{256b}, -h_{11}\times w_{256b})$, $(-h_6\times w_{256b}, -h_{10}\times w_{256b})$, $(-h_6\times w_{256b}, -h_9\times w_{256b})$, $(-h_6\times w_{256b}, -h_8\times w_{256b})$, $(-h_5\times w_{256b}, 15\times w_{256b})$, $(-h_5\times w_{256b}, h_{14}\times w_{256b})$, $(-h_5\times w_{256b}, h_{13}\times w_{256b})$, $(-h_5\times w_{256b}, h_{12}\times w_{256b})$, $(-h_5\times w_{256b}, h_{11}\times w_{256b})$, $(-h_5\times w_{256b}, h_{10}\times w_{256b})$, $(-h_5\times w_{256b}, h_9\times w_{256b})$, $(-h_5\times w_{256b}, h_8\times w_{256b})$, $(-h_5\times w_{256b}, -15\times w_{256b})$, $(-h_5\times$ $w_{256b},-h_{14}\times w_{256b})$, $(-h_5\times w_{256b},-h_{13}\times w_{256b})$, $(-h_5\times w_{256b},-h_{12}\times w_{256b})$, $(-h_5\times w_{256b},-h_{11}\times w_{256b})$, $(-h_5\times w_{256b},-h_{10}\times w_{256b})$, $(-h_5\times w_{256b},-h_9\times w_{256b})$, $(-h_5\times w_{256b},-h_8\times w_{256b})$, $(-h_4\times w_{256b},15\times w_{256b})$, $(-h_4\times w_{256b},h_{14}\times w_{256b})$, $(-h_4\times w_{256b},h_{13}\times w_{256b})$, $(-h_4\times w_{256b},h_{12}\times w_{256b})$, $(-h_4\times w_{256b},h_{11}\times w_{256b})$, $(-h_4\times w_{256b},h_{10}\times w_{256b})$, $(-h_4\times w_{256b},h_9\times w_{256b})$, $(-h_4\times w_{256b},h_8\times w_{256b})$, $(-h_4\times w_{256b},-15\times w_{256b})$, $(-h_4\times w_{256b},-h_{14}\times w_{256b})$, $(-h_4\times w_{256b},-h_{13}\times w_{256b})$, $(-h_4\times w_{256b},-h_{12}\times w_{256b})$, $(-h_4\times w_{256b},-h_{11}\times w_{256b})$, $(-h_4\times w_{256b},-h_{10}\times w_{256b})$, $(-h_4\times w_{256b},-h_9\times w_{256b})$, $(-h_4\times w_{256b},-h_8\times w_{256b})$, $(-h_3\times w_{256b},15\times w_{256b})$, $(-h_3\times w_{256b},h_{14}\times w_{256b})$, $(-h_3\times w_{256b},h_{13}\times w_{256b})$, $(-h_3\times w_{256b},h_{12}\times w_{256b})$, $(-h_3\times w_{256b},h_{11}\times w_{256b})$, $(-h_3\times w_{256b},h_{10}\times w_{256b})$, $(-h_3\times w_{256b},h_9\times w_{256b})$, $(-h_3\times w_{256b},h_8\times w_{256b})$, $(-h_3\times w_{256b},-15\times w_{256b})$, $(-h_3\times w_{256b},-h_{14}\times w_{256b})$, $(-h_3\times w_{256b},-h_{13}\times w_{256b})$, $(-h_3\times w_{256b},-h_{12}\times w_{256b})$, $(-h_3\times w_{256b},-h_{11}\times w_{256b})$, $(-h_3\times w_{256b},-h_{10}\times w_{256b})$, $(-h_3\times w_{256b},-h_9\times w_{256b})$, $(-h_3\times w_{256b},-h_8\times w_{256b})$, $(-h_2\times w_{256b},15\times w_{256b})$, $(-h_2\times w_{256b},h_{14}\times w_{256b})$, $(-h_2\times w_{256b},h_{13}\times w_{256b})$, $(-h_2\times w_{256b},h_{12}\times w_{256b})$, $(-h_2\times w_{256b},h_{11}\times w_{256b})$, $(-h_2\times w_{256b},h_{10}\times w_{256b})$, $(-h_2\times w_{256b},h_9\times w_{256b})$, $(-h_2\times w_{256b},h_8\times w_{256b})$, $(-h_2\times w_{256b},-15\times w_{256b})$, $(-h_2\times w_{256b},-h_{14}\times w_{256b})$, $(-h_2\times w_{256b},-h_{13}\times w_{256b})$, $(-h_2\times w_{256b},-h_{12}\times w_{256b})$, $(-h_2\times w_{256b},-h_{11}\times w_{256b})$, $(-h_2\times w_{256b},-h_{10}\times w_{256b})$, $(-h_2\times w_{256b},-h_9\times w_{256b})$, $(-h_2\times w_{256b},-h_8\times w_{256b})$, $(-h_1\times w_{256b},15\times w_{256b})$, $(-h_1\times w_{256b},h_{14}\times w_{256b})$, $(-h_1\times w_{256b},h_{13}\times w_{256b})$, $(-h_1\times w_{256b},h_{12}\times w_{256b})$, $(-h_1\times w_{256b},h_{11}\times w_{256b})$, $(-h_1\times w_{256b},h_{10}\times w_{256b})$, $(-h_1\times w_{256b},h_9\times w_{256b})$, $(-h_1\times w_{256b},h_8\times w_{256b})$, $(-h_1\times w_{256b},-15\times w_{256b})$, $(-h_1\times w_{256b},-h_{14}\times w_{256b})$, $(-h_1\times w_{256b},-h_{13}\times w_{256b})$, $(-h_{11}\times w_{256b},-h_{12}\times w_{256b})$, $(-h_1\times w_{256b},-h_{11}\times w_{256b})$, $(-h_1\times w_{256b},-h_{10}\times w_{256b})$, $(-h_1\times w_{256b},-h_9\times w_{256b})$, $(-h_1\times w_{256b},-h_8\times w_{256b})$ At this point, the bits to be transmitted (input bits) are set to b0, b1, b2, b3, b4, b5, b6, and b7. For example, for the bits to be transmitted (b0, b1, b2, b3, b4, b5, b6, b7)=(0,0,0,0, 0,0,0,0), the bits are mapped at signal point 11601 in FIG. 116, and $(I,Q)=(15\times w_{256b},15\times w_{256b})$ is obtained when I is an in-phase component while Q is a quadrature component of the mapped baseband signal.

Based on the bits to be transmitted (b0, b1, b2, b3, b4, b5, b6, b7), in-phase component I and quadrature component Q of the mapped baseband signal are decided (during 256QAM modulation). FIG. 116 illustrates an example of a relationship between the set of b0, b1, b2, b3, b4, b5, b6, and b7 (00000000 to 11111111) and the signal point coordinates. Values 00000000 to 11111111 of the set of b0, b1, b2, b3, b4, b5, b6, and b7 are indicated immediately below 256 signal points included in 256QAM (the marks "○" in FIG. 116)

$(15\times w_{256b},15\times w_{256b})$, $(15\times w_{256b},h_{14}\times w_{256b})$, $(15\times w_{256b},h_{13}\times w_{256b})$, $(15\times w_{256b},h_{12}\times w_{256b})$, $(15\times w_{256b},h_{11}\times w_{256b})$, $(15\times w_{256b},h_{10}\times w_{256b})$, $(15\times w_{256b},h_9\times w_{256b})$, $(15\times w_{256b},h_8\times w_{256b})$, $(15\times w_{256b},-15\times w_{256b})$, $(15\times w_{256b},-h_{14}\times w_{256b})$, $(15\times w_{256b},-h_{13}\times w_{256b})$, $(15\times w_{256b},-h_{12}\times w_{256b})$, $(15\times w_{256b},-h_{11}\times w_{256b})$, $(15\times w_{256b},-h_{10}\times w_{256b})$, $(15\times w_{256b},-h_9\times w_{256b})$, $(15\times w_{256b},-h_8\times w_{256b})$, $(h_7\times w_{256b},15\times w_{256b})$, $(h_7\times w_{256b},h_{14}\times w_{256b})$, $(h_7\times w_{256b},h_{13}\times w_{256b})$, $(h_7\times w_{256b},h_{12}\times w_{256b})$, $(h_7\times w_{256b},h_{11}\times w_{256b})$, $(h_7\times w_{256b},h_{10}\times w_{256b})$, $(h_7\times w_{256b},h_9\times w_{256b})$, $(h_7\times w_{256b},h_8\times w_{256b})$, $(h_7\times w_{256b},-15\times w_{256b})$, $(h_7\times w_{256b},-h_{14}\times w_{256b})$, $(h_7\times w_{256b},-h_{13}\times w_{256b})$, $(h_7\times w_{256b},-h_{12}\times w_{256b})$, $(h_7\times w_{256b},-h_{11}\times w_{256b})$, $(h_7\times w_{256b},-h_{10}\times w_{256b})$, $(h_7\times w_{256b},-h_9\times w_{256b})$, $(h_7\times w_{256b},-h_8\times w_{256b})$, $(h_6\times w_{256b},15\times w_{256b})$, $(h_6\times w_{256b},h_{14}\times w_{256b})$, $(h_6\times w_{256b},h_{13}\times w_{256b})$, $(h_6\times w_{256b},h_{12}\times w_{256b})$, $(h_6\times w_{256b},h_{11}\times w_{256b})$, $(h_6\times w_{256b},h_{10}\times w_{256b})$, $(h_6\times w_{256b},h_9\times w_{256b})$, $(h_6\times w_{256b},h_8\times w_{256b})$, $(h_6\times w_{256b},-15\times w_{256b})$, $(h_6\times w_{256b},-h_{14}\times w_{256b})$, $(h_6\times w_{256b},-h_{13}\times w_{256b})$, $(h_6\times w_{256b},-h_{12}\times w_{256b})$, $(h_6\times w_{256b},-h_{11}\times w_{256b})$, $(h_6\times w_{256b},-h_{10}\times w_{256b})$, $(h_6\times w_{256b},-h_9\times w_{256b})$, $(h_6\times w_{256b},-h_8\times w_{256b})$, $(h_5\times w_{256b},15\times w_{256b})$, $(h_5\times w_{256b},h_{14}\times w_{256b})$, $(h_5\times w_{256b},h_{13}\times w_{256b})$, $(h_5\times w_{256b},h_{12}\times w_{256b})$, $(h_5\times w_{256b},h_{11}\times w_{256b})$, $(h_5\times w_{256b},h_{10}\times w_{256b})$, $(h_5\times w_{256b},h_9\times w_{256b})$, $(h_5\times w_{256b},h_8\times w_{256b})$, $(h_5\times w_{256b},-15\times w_{256b})$, $(h_5\times w_{256b},-h_{14}\times w_{256b})$, $(h_5\times w_{256b},-h_{13}\times w_{256b})$, $(h_5\times w_{256b},-h_{12}\times w_{256b})$, $(h_5\times w_{256b},-h_{11}\times w_{256b})$, $(h_5\times w_{256b},-h_{10}\times w_{256b})$, $(h_5\times w_{256b},-h_9\times w_{256b})$, $(h_5\times w_{256b},-h_8\times w_{256b})$, $(h_4\times w_{256b},15\times w_{256b})$, $(h_4\times w_{256b},h_{14}\times w_{256b})$, $(h_4\times w_{256b},h_{13}\times w_{256b})$, $(h_4\times w_{256b},h_{12}\times w_{256b})$, $(h_4\times w_{256b},h_{11}\times w_{256b})$, $(h_4\times w_{256b},h_{10}\times w_{256b})$, $(h_4\times w_{256b},h_9\times w_{256b})$, $(h_4\times w_{256b},h_8\times w_{256b})$, $(h_4\times w_{256b},-15\times w_{256b})$, $(h_4\times w_{256b},-h_{14}\times w_{256b})$, $(h_4\times w_{256b},-h_{13}\times w_{256b})$, $(h_4\times w_{256b},-h_{12}\times w_{256b})$, $(h_4\times w_{256b},-h_{11}\times w_{256b})$, $(h_4\times w_{256b},-h_{10}\times w_{256b})$, $(h_4\times w_{256b},-h_9\times w_{256b})$, $(h_4\times w_{256b},-h_8\times w_{256b})$, $(h_3\times w_{256b},15\times w_{256b})$, $(h_3\times w_{256b},h_{14}\times w_{256b})$, $(h_3\times w_{256b},h_{13}\times w_{256b})$, $(h_3\times w_{256b},h_{12}\times w_{256b})$, $(h_3\times w_{256b},h_{11}\times w_{256b})$, $(h_3\times w_{256b},h_{10}\times w_{256b})$, $(h_3\times w_{256b},h_9\times w_{256b})$, $(h_3\times w_{256b},h_8\times w_{256b})$, $(h_3\times w_{256b},-15\times w_{256b})$, $(h_3\times w_{256b},-h_{14}\times w_{256b})$, $(h_3\times w_{256b},-h_{13}\times w_{256b})$, $(h_3\times w_{256b},-h_{12}\times w_{256b})$, $(h_3\times w_{256b},-h_{11}\times w_{256b})$, $(h_3\times w_{256b},-h_{10}\times w_{256b})$, $(h_3\times w_{256b},-h_9\times w_{256b})$, $(h_3\times w_{256b},-h_8\times w_{256b})$, $(h_2\times w_{256b},15\times w_{256b})$, $(h_2\times w_{256b},h_{14}\times w_{256b})$, $(h_2\times w_{256b},h_{13}\times w_{256b})$, $(h_2\times w_{256b},h_{12}\times w_{256b})$, $(h_2\times w_{256b},h_{11}\times w_{256b})$, $(h_2\times w_{256b},h_{10}\times w_{256b})$, $(h_2\times w_{256b},h_9\times w_{256b})$, $(h_2\times w_{256b},h_8\times w_{256b})$, $(h_2\times w_{256b},-15\times w_{256b})$, $(h_2\times w_{256b},-h_{14}\times w_{256b})$, $(h_2\times w_{256b},-h_{13}\times w_{256b})$, $(h_2\times w_{256b},-h_{12}\times w_{256b})$, $(h_2\times w_{256b},-h_{11}\times w_{256b})$, $(h_2\times w_{256b},-h_{10}\times w_{256b})$, $(h_2\times w_{256b},-h_9\times w_{256b})$, $(h_2\times w_{256b},-h_8\times w_{256b})$, $(h_1\times w_{256b},15\times w_{256b})$, $(h_1\times w_{256b},h_{14}\times w_{256b})$, $(h_1\times w_{256b},h_{13}\times w_{256b})$, $(h_1\times w_{256b},h_{12}\times w_{256b})$, $(h_1\times w_{256b},h_{11}\times w_{256b})$, $(h_1\times w_{256b},h_{10}\times w_{256b})$, $(h_1\times w_{256b},h_9\times w_{256b})$, $(h_1\times w_{256b},h_8\times w_{256b})$, $(h_1\times w_{256b},-15\times w_{256b})$, $(h_1\times w_{256b},-h_{14}\times w_{256b})$, $(h_1\times w_{256b},-h_{13}\times w_{256b})$, $(h_1\times w_{256b},-h_{12}\times w_{256b})$, $(h_1\times w_{256b},-h_{11}\times w_{256b})$, $(h_1\times w_{256b},-h_{10}\times w_{256b})$, $(h_1\times w_{256b},-h_9\times w_{256b})$, $(h_1\times w_{256b},-h_8\times w_{256b})$, $(-15\times w_{256b},15\times w_{256b})$, $(-15\times w_{256b},h_{14}\times w_{256b})$, $(-15\times w_{256b},h_{13}\times w_{256b})$, $(-15\times w_{256b},h_{12}\times w_{256b})$, $(-15\times w_{256b},h_{11}\times w_{256b})$, $(-15\times w_{256b},h_{10}\times w_{256b})$, $(-15\times w_{256b},h_9\times w_{256b})$, $(-15\times w_{256b},h_8\times w_{256b})$, $(-15\times w_{256b},-15\times w_{256b})$, $(-15\times w_{256b},-h_{14}\times w_{256b})$, $(-15\times w_{256b},-h_{13}\times w_{256b})$, $(-15\times w_{256b},-h_{12}\times w_{256b})$, $(-15\times w_{256b},-h_{11}\times w_{256b})$, $(-15\times w_{256b},-h_{10}\times w_{256b})$, $(-15\times w_{256b},-h_9\times w_{256b})$, $(-15\times w_{256b},-h_8\times w_{256b})$, $(-h_7\times w_{256b},15\times w_{256b})$, $(-h_7\times w_{256b},h_{14}\times w_{256b})$, $(-h_7\times w_{256b},h_{13}\times w_{256b})$, $(-h_7\times w_{256b},h_{12}\times w_{256b})$, $(-h_7\times w_{256b},h_{11}\times w_{256b})$, $(-h_7\times w_{256b},h_{10}\times w_{256b})$, $(-h_7\times w_{256b},h_9\times w_{256b})$, $(-h_7\times w_{256b},h_8\times w_{256b})$, $(-h_7\times w_{256b},-15\times w_{256b})$, $(-h_7\times w_{256b},-h_{14}\times w_{256b})$, $(-h_7\times w_{256b},-h_{13}\times w_{256b})$, $(-h_7\times w_{256b},-h_{12}\times w_{256b})$, $(-h_7\times w_{256b},-h_{11}\times w_{256b})$, $(-h_7\times w_{256b},-h_{10}\times w_{256b})$, $(-h_7\times w_{256b},-h_9\times w_{256b})$, $(-h_7\times w_{256b},-h_8\times w_{256b})$, $(-h_6\times w_{256b},15\times w_{256b})$, $(-h_6\times w_{256b},h_{14}\times w_{256b})$, $(-h_6\times w_{256b},h_{13}\times w_{256b})$, $(-h_6\times w_{256b},h_{12}\times w_{256b})$, $(-h_6\times w_{256b},h_{11}\times w_{256b})$, $(-h_6\times w_{256b},h_{10}\times w_{256b})$, $(-h_6\times w_{256b},h_9\times w_{256b})$, $(-h_6\times w_{256b},h_8\times w_{256b})$, $(-h_6\times w_{256b},-15\times w_{256b})$, $(-h_6\times w_{256b},-h_{14}\times w_{256b})$, $(-h_6\times w_{256b},-h_{13}\times w_{256b})$, $(-h_6\times w_{256b},-h_{12}\times w_{256b})$, $(-h_6\times w_{256b},-h_{11}\times w_{256b})$, $(-h_6\times w_{256b},-h_{10}\times w_{256b})$, $(-h_6\times w_{256b},-h_9\times w_{256b})$, $(-h_6\times w_{256b},-h_8\times w_{256b})$, $(-h_5\times w_{256b},15\times w_{256b})$, $(-h_5\times w_{256b},h_{14}\times w_{256b})$, $(-h_5\times w_{256b},h_{13}\times w_{256b})$, $(-h_5\times w_{256b},h_{12}\times w_{256b})$, $(-h_5\times w_{256b},h_{11}\times w_{256b})$, $(-h_5\times w_{256b},h_{10}\times w_{256b})$, $(-h_5\times w_{256b},h_9\times w_{256b})$, $(-h_5\times w_{256b},h_8\times w_{256b})$, $(-h_5\times w_{256b},-15\times w_{256b})$, $(-h_5\times w_{256b},-h_{14}\times w_{256b})$, $(-h_5\times w_{256b},-h_{13}\times w_{256b})$, $(-h_5\times w_{256b},-h_{12}\times w_{256b})$, $(-h_5\times w_{256b},-h_{11}\times w_{256b})$, $(-h_5\times w_{256b},-h_{10}\times w_{256b})$, $(-h_5\times w_{256b},-h_9\times w_{256b})$, $(-h_5\times w_{256b},-h_8\times w_{256b})$, $(-h_4\times w_{256b}, 15\times w_{256b})$, $(-h_4\times w_{256b}, h_{14}\times w_{256b})$, $(-h_4\times w_{256b}, h_{13}\times w_{256b})$, $(-h_4\times w_{256b}, h_{12}\times w_{256b})$, $(-h_4\times w_{256b}, h_{11}\times w_{256b})$, $(-h_4\times w_{256b}, h_{10}\times w_{256b})$, $(-h_4\times w_{256b}, h_9\times w_{256b})$, $(-h_4\times w_{256b}, h_8\times w_{256b})$, $(-h_4\times w_{256b}, -15\times w_{256b})$, $(-h_4\times w_{256b}, -h_{14}\times w_{256b})$, $(-h_4\times w_{256b}, -h_{13}\times w_{256b})$, $(-h_4\times w_{256b}, -h_{12}\times w_{256b})$, $(-h_4\times w_{256b}, -h_{11}\times w_{256b})$, $(-h_4\times w_{256b}, -h_{10}\times w_{256b})$, $(-h_4\times w_{256b}, -h_9\times w_{256b})$, $(-h_4\times w_{256b}, -h_8\times w_{256b})$,
$(-h_3\times w_{256b}, 15\times w_{256b})$, $(-h_3\times w_{256b}, h_{14}\times w_{256b})$, $(-h_3\times w_{256b}, h_{13}\times w_{256b})$, $(-h_3\times w_{256b}, h_{12}\times w_{256b})$, $(-h_3\times w_{256b}, h_{11}\times w_{256b})$, $(-h_3\times w_{256b}, h_{10}\times w_{256b})$, $(-h_3\times w_{256b}, h_9\times w_{256b})$, $(-h_3\times w_{256b}, h_8\times w_{256b})$, $(-h_3\times w_{256b}, -15\times w_{256b})$, $(-h_3\times w_{256b}, -h_{14}\times w_{256b})$, $(-h_3\times w_{256b}, -h_{13}\times w_{256b})$, $(-h_3\times w_{256b}, -h_{12}\times w_{256b})$, $(-h_{13}\times w_{256b}, -h_{11}\times w_{256b})$, $(-h_3\times w_{256b}, -h_{10}\times w_{256b})$, $(-h_3\times w_{256b}, -h_9\times w_{256b})$, $(-h_3\times w_{256b}, -h_8\times w_{256b})$,
$(-h_2\times w_{256b}, 15\times w_{256b})$, $(-h_2\times w_{256b}, h_{14}\times w_{256b})$, $(-h_2\times w_{256b}, h_{13}\times w_{256b})$, $(-h_2\times w_{256b}, h_{12}\times w_{256b})$, $(-h_2\times w_{256b}, h_{11}\times w_{256b})$, $(-h_2\times w_{256b}, h_{10}\times w_{256b})$, $(-h_2\times w_{256b}, h_9\times w_{256b})$, $(-h_2\times w_{256b}, h_8\times w_{256b})$, $(-h_2\times w_{256b}, -15\times w_{256b})$, $(-h_2\times w_{256b}, -h_{14}\times w_{256b})$, $(-h_2\times w_{256b}, -h_{13}\times w_{256b})$, $(-h_2\times w_{256b}, -h_{12}\times w_{256b})$, $(-h_2\times w_{256b}, -h_{11}\times w_{256b})$, $(-h_2\times w_{256b}, -h_{10}\times w_{256b})$, $(-h_2\times w_{256b}, -h_9\times w_{256b})$, $(-h_2\times w_{256b}, -h_8\times w_{256b})$,
$(-h_1\times w_{256b}, 15\times w_{256b})$, $(-h_1\times w_{256b}, h_{14}\times w_{256b})$, $(-h_1\times w_{256b}, h_{13}\times w_{256b})$, $(-h_1\times w_{256b}, h_{12}\times w_{256b})$, $(-h_1\times w_{256b}, h_{11}\times w_{256b})$, $(-h_1\times w_{256b}, h_{10}\times w_{256b})$, $(-h_1\times w_{256b}, h_9\times w_{256b})$, $(-h_1\times w_{256b}, h_8\times w_{256b})$, $(-h_1\times w_{256b}, -15\times w_{256b})$, $(-h_1\times w_{256b}, -h_{14}\times w_{256b})$, $(-h_1\times w_{256b}, -h_{13}\times w_{256b})$, $(-h_1\times w_{256b}, -h_{12}\times w_{256b})$, $(-h_1\times w_{256b}, -h_{11}\times w_{256b})$, $(-h_1\times w_{256b}, -h_{10}\times w_{256b})$, $(-h_1\times w_{256b}, -h_9\times w_{256b})$, $(-h_1\times w_{256b}, -h_8\times w_{256b})$.
Respective coordinates of the signal points ("○") immediately above the values 00000000 to 11111111 of the set of b0, b1, b2, b3, b4, b5, b6, and b7 in the I-Q plane serve as in-phase component I and quadrature component Q of the mapped baseband signal.
The relationship between the set of b0, b1, b2, b3, b4, b5, b6, and b7 (00000000 to 11111111) and the signal point coordinates during 256QAM modulation is not limited to that in FIG. 116.

256 signal points in FIG. 116 are named as "signal point 1", "signal point 2", . . . , "signal point 255", and "signal point 256" (because of the presence of 256 signal points, "signal point 1" to "signal point 256" exist). In the I-Q plane, Di is a distance between "signal point i" and the origin. At this point, $w_{256b}$ is given by the following equation.

[Mathematical formula 370]

$$w_{256b} = \frac{z}{\sqrt{\frac{\sum_{i=1}^{256} D_i^2}{256}}} \tag{H6}$$

Therefore, the mapped baseband signal has an average power of $z_2$. The effect is described later.

The effect of the use of QAM will be described below.

First, the configurations of the transmitter and receiver will be described.

Figure 117:
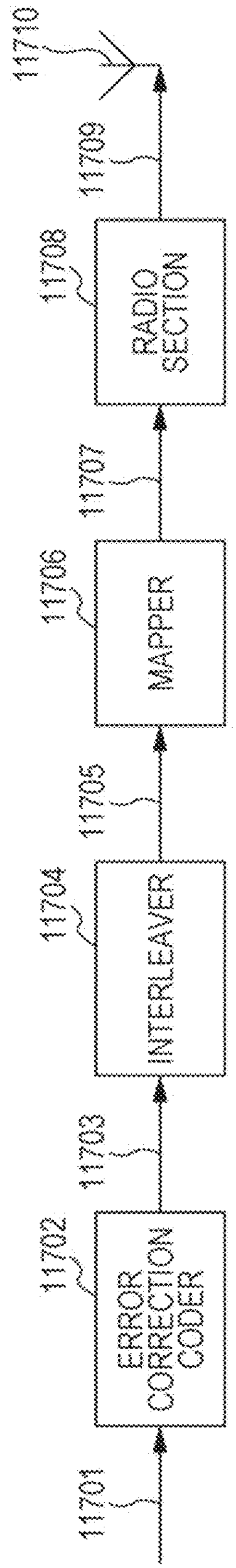

FIG. 117 illustrates a configuration example of the transmitter. Information 11701 is input to error correction encoder 11702, and error correction encoder 11702 performs the error correction coding on the LDPC code or a turbo code, and outputs error-correction-coded data 11703.

Error-correction-coded data 11703 is input to interleaver 11704, and interleaver 11704 performs the data rearrangement, and outputs the interleaved data 11705.

Interleaved data 11705 is input to mapper 11706, and mapper 11706 performs the mapping based on the modulation scheme set with the transmitter, and outputs quadrature baseband signal (in-phase component I and quadrature component Q) 11707.

Quadrature baseband signal 11707 is input to radio section 11708, and radio section 11708 performs the pieces of processing such as the quadrature modulation, the frequency conversion, and the amplification, and outputs transmitted signal 11709. Transmitted signal 11709 is output as a radio wave from antenna 11710.

Figure 118:
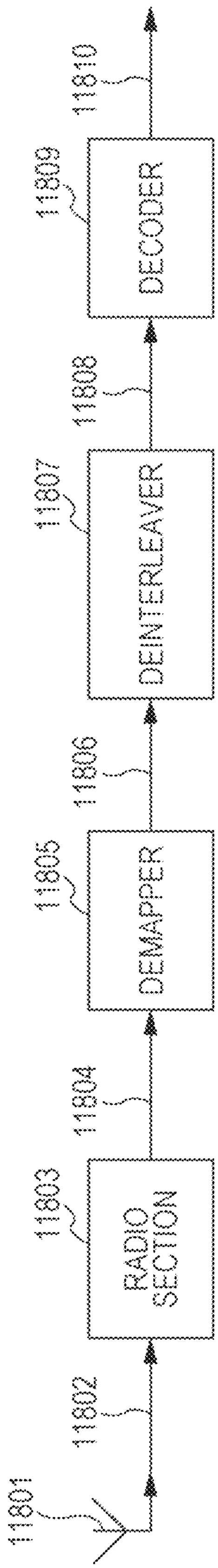

FIG. 118 illustrates an example of the configuration of the receiver that receives the modulated signal transmitted from the transmitter in FIG. 117.

Received signal 11802 received with antenna 11801 is input to radio section 11803, and radio section 11803 performs the pieces of processing such as the frequency conversion and the quadrature demodulation, and outputs quadrature baseband signal 11804.

Quadrature baseband signal 11804 is input to demapper 11805, and demapper 11805 performs the frequency offset estimation and removal and the estimation of the channel variation (transmission path variation), estimates each bit of the data symbol, for example, the log-likelihood ratio, and outputs log-likelihood ratio signal 11806.

Log-likelihood ratio signal 11806 is input to deinterleaver 11807, and deinterleaver 11807 performs the rearrangement, and outputs deinterleaved log-likelihood ratio signal 11808.

Deinterleaved log-likelihood ratio signal 11808 is input to decoder 11809, and decoder 11809 decodes the error correction code, and outputs received data 11810.

The effect will be described below with 16QAM as an example. The following two cases (<16QAM #1> and <16QAM #2>) are compared to each other.

<16QAM #1>16QAM #1 is 16QAM described in (Supplement 2), and FIG. 111 illustrates the arrangement of the signal points in the I-Q plane.

<16QAM #2> FIG. 114 illustrates the arrangement of the signal points in the I-Q plane, and $f_1>0$ ($f_1$ is a real number larger than 0), $f_2>0$ ($f_2$ is a real number larger than 0), $f_1\neq 3$, $f_2\neq 3$, and $f_1\neq f_2$ hold as described above.

As described above, four bits of b0, b1, b2, and b3 are transmitted in 16QAM. For <16QAM #1>, in the receiver, the four bits are divided into two high-quality bits and two low-quality bits in the case that the log-likelihood ratio of each bit is obtained. On the other hand, for <16QAM #2>, depending on the conditions of $f_1>0$ ($f_1$ is a real number larger than 0) and $f_2>0$ ($f_2$ is a real number larger than 0), $f_1\neq 3$, $f_1\neq 3$, and $f_1\neq f_2$, the four bits are divided into two high-quality bits, one intermediate-quality bit, and one low-quality bit. Thus, the quality distribution of the 4 bits depends on the <16QAM #1> and <16QAM #2>. At this point, in the case that decoder 11809 in FIG. 118 decodes the error correction code, depending on the error correction code used, the receiver has a higher possibility of obtaining the high data reception quality using<16QAM #2>.

In the case that the arrangement of the signal points are arranged in the I-Q plane as illustrated in FIG. 115 for 64QAM, similarly the receiver has the higher possibility of obtaining the high data reception quality. At this point, it is necessary to satisfy the following conditions. That is, "$g_1>0$ ($g_1$ is a real number larger than 0) and $g_{2>0}$ ($g_2$ is a real number larger than 0) and $g_3>0$ ($g_3$ is a real number larger than 0) and $g_4>0$ ($g_4$ is a real number larger than 0) and $g_5>0$ ($g_5$ is a real number larger than 0) and $g_6>0$ ($g_6$ is a real number larger than 0), $\{g_1 \neq 7, g_2 \neq 7, g_3 \neq 7, g_1 \neq g_2, g_1 \neq g_3$, and $g_2 \neq g_3\}$ and $\{g_4 \neq 7$ and $g_5 \neq 7$ and $g_6 \neq 7$ and $g_4 \neq g_5$ and $g_4 \neq g_6$ and $g_5 \neq g_6\}$ and $\{g_1 \neq g_4$ or $g_2 \neq g_5$ or $g_3 \neq g_6$ holds$\}$ hold.", which necessary point differs from that in the arrangement of the signal points of (Supplement 2).

Similarly, in the case that the arrangement of the signal points are arranged in the I-Q plane as illustrated in FIG. 116 for 256QAM, similarly the receiver has the higher possibility of obtaining the high data reception quality. At this point, it is necessary to satisfy the following conditions. That is, "$h_1>0$ ($h_1$ is a real number larger than 0) and $h_2>0$ ($h_2$ is a real number larger than 0) and $h_3>0$ ($h_3$ is a real number larger than 0) and $h_4>0$ ($h_4$ is a real number larger than 0) and $h_5>0$ ($h_5$ is a real number larger than 0) and $h_6>0$ ($h_6$ is a real number larger than 0) and $h_7>0$ ($h_7$ is a real number larger than 0) and $h_8>0$ ($h_8$ is a real number larger than 0) and $h_9>0$ ($h_9$ is a real number larger than 0) and $h_{10}>0$ ($h_{10}$ is a real number larger than 0) and $h_{11}>0$ ($h_{11}$ is a real number larger than 0) and $h_{12}>0$ ($h_{12}$ is a real number larger than 0) and $h_{13}>0$ ($h_{13}$ is a real number larger than 0) and $h_{14}>0$ ($h_{14}$ is a real number larger than 0), $\{h_1 \neq 15$ and $h_2 \neq 15$ and $h_3 \neq 15$ and $h_4 \neq 15$ and $h_5 \neq 15$ and $h_6 \neq 15$ and $h_7 \neq 15$, and $h_1 \neq h_2$ and $h_1 \neq h_3$ and $h_1 \neq h_4$ and $h_1 \neq h_5$ and $h_1 \neq h_6$ and $h_1 \neq h_7$, and $h_2 \neq h_3$ and $h_2 \neq h_4$ and $h_2 \neq h_5$ and $h_2 \neq h_6$ and $h_2 \neq h_7$, and $h_3 \neq h_4$ and $h_3 \neq h_5$ and $h_3 \neq h_6$ and $h_3 \neq h_7$, and $h_4 \neq h_5$ and $h_4 \neq h_6$ and $h_4 \neq h_7$, and $h_5 \neq h_6$ and $h_5 + h_7$, and $h_6 + h_7\}$ and $\{h_8 \neq 15$ and $h_9 \neq 15$ and $h_{10} \neq 15$ and $h_{11} \neq 15$ and $h_{12} \neq 15$ and $h_{13} \neq 15$ and $h_{14} \neq 15$, and $h_8 \neq h_9$ and $h_8 \neq h_{10}$ and $h_8 \neq h_{11}$ and $h_8 \neq h_{12}$ and $h_8 \neq h_{13}$ and $h_8 \neq h_{14}$, and $h_9 \neq h_{10}$ and $h_9 \neq h_{11}$ and $h_9 \neq h_{12}$ and $h_9 \neq h_{13}$ and $h_9 \neq h_{14}$, and $h_{10} \neq h_{11}$ and $h_{10} \neq h_{12}$ and $h_{10} \neq h_{13}$ and $h_{10} \neq h_{14}$, and $h_{11} \neq h_{12}$ and $h_{11} \neq h_{13}$ and $h_{11} + h_{14}$, and $h_{12} \neq h_{13}$ and $h_{12} \neq h_{14}$, and $h_{13} \neq h_{14}\}$ and $\{h_1 \neq h_8$ or $h_2 \neq h_9$ or $h_3 \neq h_{10}$ or $h_4 \neq h_{11}$ or $h_5 \neq h_{12}$ or $h_6 \neq h_{13}$ or $h_7 \neq h_{14}$ holds$\}$ hold.", which necessary point differs from that in the arrangement of the signal points of (Supplement 2).

Although the detailed configuration is not illustrated in FIGS. 117 and 118, similarly the modulated signal can be transmitted and received using the OFDM scheme and spectral spread communication scheme, which are described in another exemplary embodiment.

In the MIMO transmission scheme, the space-time codes such as the space-time block code (however, the symbol mat be arranged on the frequency axis), and the MIMO transmission scheme in which the precoding is performed or not performed, which are described in the first to twelfth exemplary embodiments, there is a possibility of improving the data reception quality even if 16QAM, 64QAM, and 256QAM are used.

(Supplement 4)

The bit length adjusting method is described in the first to eleventh exemplary embodiments. The method for applying the bit length adjusting methods of the first to eleventh exemplary embodiments to the DVB standard is described in the twelfth exemplary embodiment. The case that 16QAM, 64QAM, and 256QAM are applied as the modulation scheme is described in the above exemplary embodiments. A specific mapping method with respect to 16QAM, 64QAM, and 256QAM is described in (Configuration example R1).

A mapping method with respect to 16QAM, 64QAM, and 256QAM different from that of (Configuration example R1), (Supplement 2), and (Supplement 3) will be described below. The following 16QAM, 64QAM, and 256QAM may be applied to the first to twelfth exemplary embodiments, and the effects of the first to twelfth exemplary embodiments can also be obtained.

Figure 119:
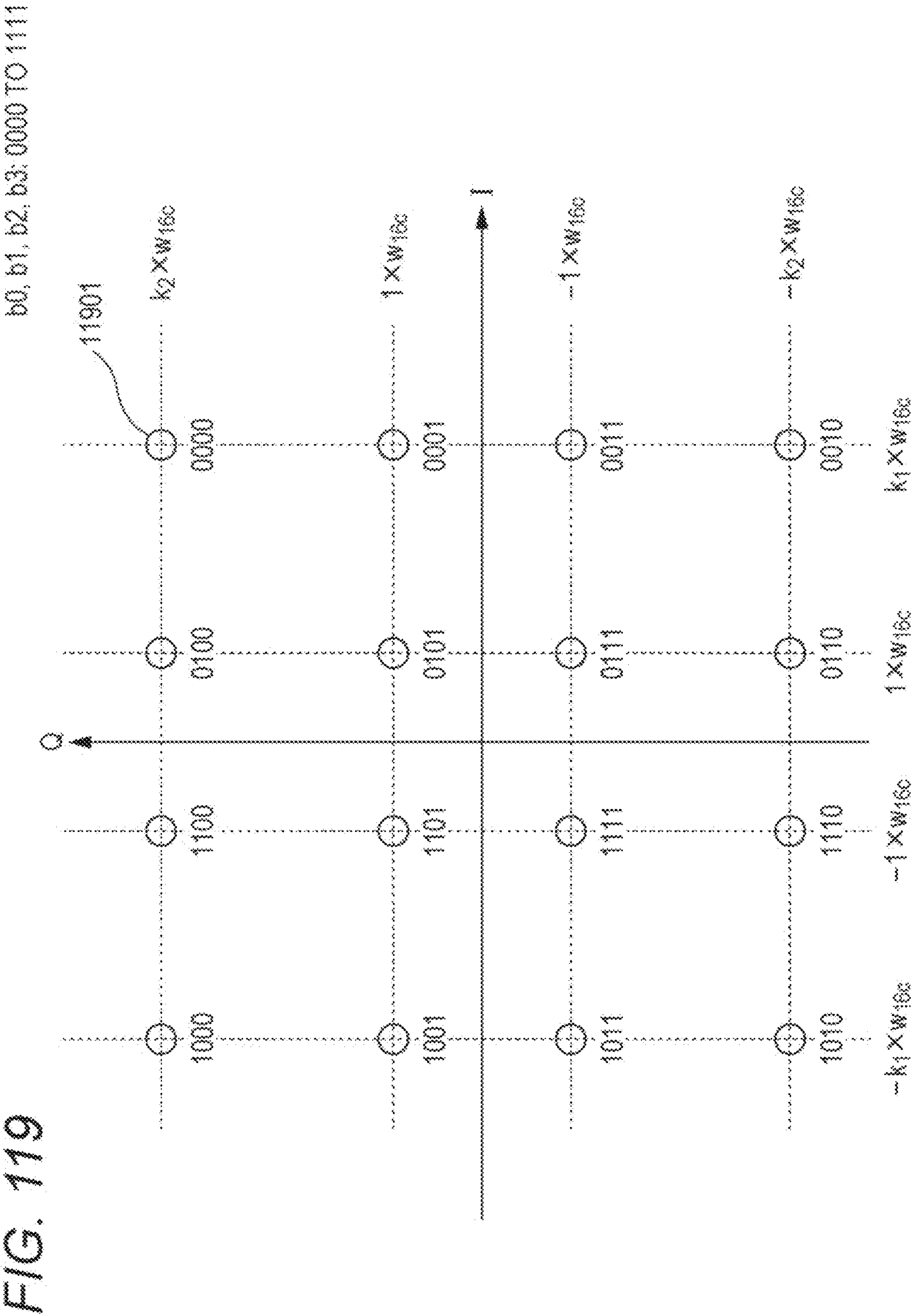

The 16QAM mapping method will be described below. FIG. 119 illustrates an arrangement example of 16QAM signal points in the I-Q plane. In FIG. 119, 16 marks "○" indicate 16QAM signal points, a horizontal axis indicates I, and a vertical axis indicates Q.

In FIG. 119, it is assumed that $k_1>0$ ($k_1$ is a real number larger than 0), $k_2>0$ ($k_2$ is a real number larger than 0), $k_1 \neq 1$, $k_2 \neq 1$, and $k_1 \neq k_2$ hold.

In the I-Q plane, 16 signal points included in 16QAM (indicated by the marks "○" in FIG. 119) are obtained as follows. ($w_{16c}$ is a real number larger than 0) $(k_1 \times w_{16c}, k_2 \times w_{16c})$, $(k_1 \times w_{16c}, 1 \times w_{16c})$, $(k_1 \times w_{16c}, -1 \times w_{16c})$, $(k_1 \times w_{16c}, -k_2 \times w_{16c})$, $(1 \times w_{16c}, k_2 \times w_{16c})$, $(1 \times w_{16c}, 1 \times w_{16c})$, $(1 \times w_{16c}, -1 \times w_{16c})$, $(1 \times w_{16c}, -k_2 \times w_{16c})$, $(-1 \times w_{16c}, k_2 \times w_{16c})$, $(-1 \times w_{16c}, 1 \times w_{16c})$, $(-1 \times w_{16c}, -1 \times w_{16c})$, $(-1 \times w_{16c}, -k_2 \times w_{16c})$, $(-k_1 \times w_{16c}, k_2 \times w_{16c})$, $(-k_1 \times w_{16c}, 1 \times w_{16c})$, $(-k_1 \times w_{16c}, -1 \times w_{16c})$, $(-k_1 \times w_{16c}, -k_2 \times w_{16c})$ At this point, the bits to be transmitted (input bits) are set to b0, b1, b2, and b3. For example, for the bits to be transmitted (b0, b1, b2, b3)=(0,0,0,0), the bits are mapped at signal point 11901 in FIG. 119, and $(I,Q)=(k_1 \times w_{16c}, k_2 \times w_{16c})$ is obtained when I is an in-phase component while Q is a quadrature component of the mapped baseband signal.

Based on the bits to be transmitted (b0, b1, b2, b3), in-phase component I and quadrature component Q of the mapped baseband signal are decided (during 16QAM modulation). FIG. 119 illustrates an example of the relationship between the set of b0, b1, b2, and b3 (0000 to 1111) and the signal point coordinates. Values 0000 to 1111 of the set of b0, b1, b2, and b3 are indicated immediately below 16 signal points included in 16QAM (the marks "○" in FIG. 119) $(k_1 \times w_{16c}, k_2 \times w_{16c})$, $(k_1 \times w_{16c}, 1 \times w_{16c})$, $(k_1 \times w_{16c}, -1 \times w_{16c})$, $(k_1 \times w_{16c}, k_2 \times w_{16c})$, $(1 \times w_{16c}, k_2 \times w_{16c})$, $(1 \times w_{16c}, 1 \times w_{16c})$, $(1 \times w_{16C}, -1 \times w_{16c})$, $(1 \times w_{16c}, -k_2 \times w_{16c})$, $(-1 \times w_{16c}, k_2 \times w_{16c})$, $(-1 \times w_{16C}, 1 \times w_{16c})$, $(-1 \times w_{16c}, -1 \times w_{16c})$, $(-1 \times w_{16c}, -k_2 \times w_{16c})$, $(-k_1 \times w_{16c}, k_2 \times w_{16c})$, $(-k_1 \times w_{16c}, 1 \times w_{16c})$, $(-k_1 \times w_{16c}, -1 \times w_{16c})$, $(-k_1 \times w_{16c}, -k_2 \times w_{16c})$. Respective coordinates of the signal points ("○") immediately above the values 0000 to 1111 of the set of b0, b1, b2, and b3 in the I-Q plane serve as in-phase component I and quadrature component Q of the mapped baseband signal. The relationship between the set of b0, b1, b2, and b3 (0000 to 1111) and the signal point coordinates during 16QAM modulation is not limited to that in FIG. 119.

16 signal points in FIG. 119 are named as "signal point 1", "signal point 2", . . . , "signal point 15", and "signal point 16" (because of the presence of 16 signal points, "signal point 1" to "signal point 16" exist). In the I-Q plane, Di is a distance between "signal point i" and the origin. At this point, $w_{16c}$ is given by the following equation.

[Mathematical formula 371]

$$w_{16c} = \frac{z}{\sqrt{\frac{\sum_{i=1}^{16} D_i^2}{16}}} = \frac{z}{\sqrt{\frac{((1^2+1^2)\times 4 + (k_1^2+k_2^2)\times 4 + (k_1^2+1^2)\times 4 + (k_2^2+1^2)\times 4)}{16}}} \tag{H7}$$

Therefore, the mapped baseband signal has an average power of $z_2$. The effect of 16QAM is described later.

Figure 120:
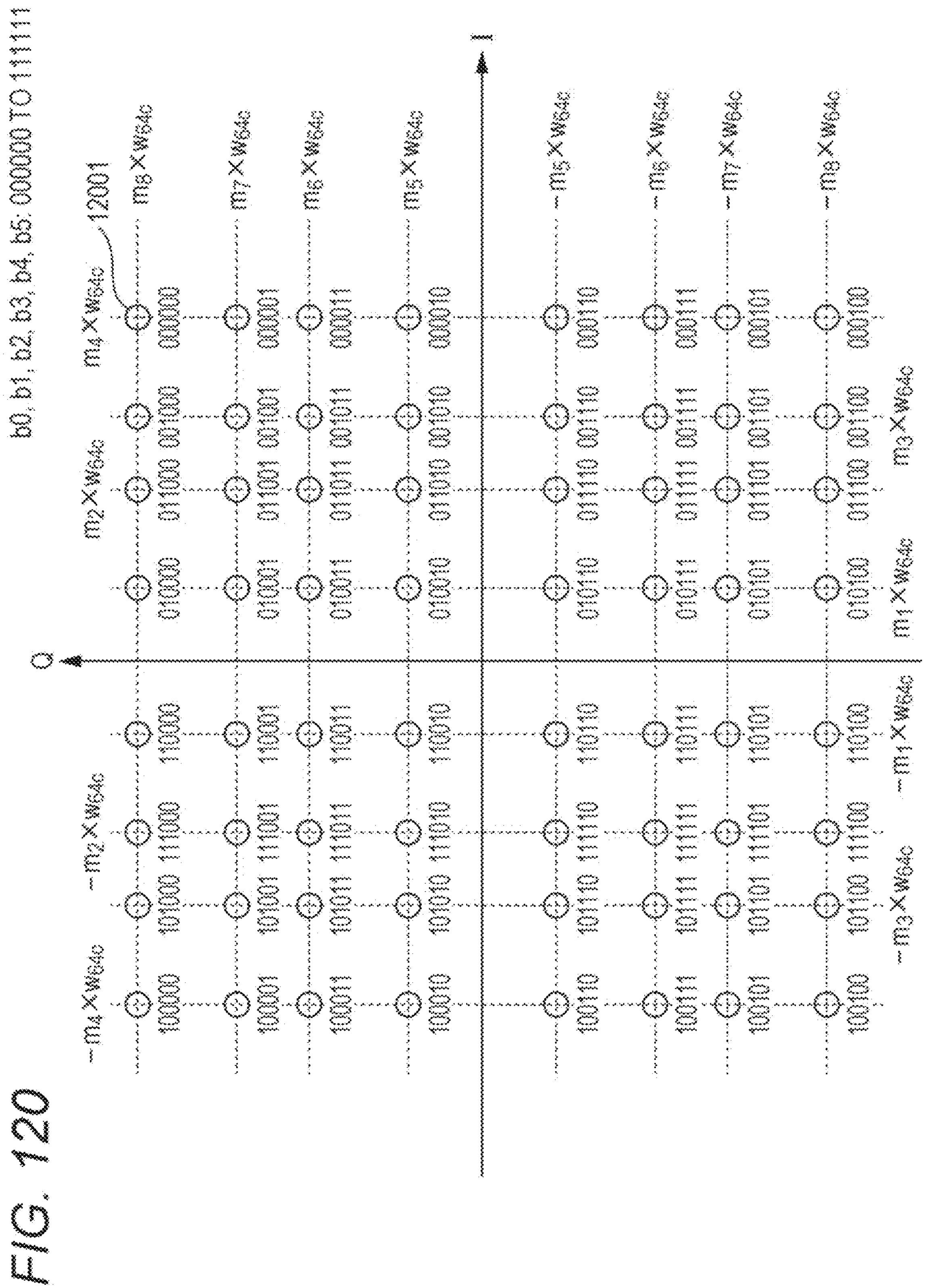

The 64QAM mapping method will be described below. FIG. 120 illustrates an arrangement example of 64QAM signal points in the I-Q plane. In FIG. 120, 64 marks "○" indicate 64QAM signal points, a horizontal axis indicates I, and a vertical axis indicates Q.

In FIG. 120, it is assumed that "$m_1>0$ ($m_1$ is a real number larger than 0) and $m_2>0$ ($m_2$ is a real number larger than 0) and $m_3>0$ ($m_3$ is a real number larger than 0) and $m_4>0$ ($m_4$ is a real number larger than 0) and $m_5>0$ ($m_5$ is a real number larger than 0) and $m_6>0$ ($m_6$ is a real number larger than 0) and $m_7>0$ ($m_7$ is a real number larger than 0) and $m_8>0$ ($m_8$ is a real number larger than 0), and $\{m_1\neq m_2$ and $m_1\neq m_3$ and $m_1\neq m_4$ and $m_2\neq m_3$ and $m_2\neq m_4$ and $m_3\neq m_4\}$ and $\{m_5\neq m_6$ and $m_5\neq m_7$ and $m_5\neq m_8$ and $m_6\neq m_7$ and $m_6\neq m_8$ and $m_7\neq m_8\}$ and $\{m_1\neq m_5$ or $m_2\neq m_6$ or $m_3\neq m_7$ or $m_4\neq m_8$ holds$\}$ hold."

or that

"$m_1>0$ ($m_1$ is a real number larger than 0) and $m_2>0$ ($m_2$ is a real number larger than 0) and $m_3>0$ ($m_3$ is a real number larger than 0) and $m_4>0$ ($m_4$ is a real number larger than 0) and $m_5>0$ ($m_5$ is a real number larger than 0) and $m_6>0$ ($m_6$ is a real number larger than 0) and $m_7>0$ ($m_7$ is a real number larger than 0) and $m_8>0$ ($m_8$ is a real number larger than 0), and $\{m_1\neq m_2$ and $m_1\neq m_3$ and $m_1\neq m_4$ and $m_2\neq m_3$ and $m_2\neq m_4$ and $m_3\neq m_4\}$ and $\{m_5\neq m_6$ and $m_5\neq m_7$ and $m_5+m_8$ and $m_6\neq m_7$ and $m_6\neq m_8$ and $m_7\neq m_8\}$ and $\{m_1\neq m_5$ or $m_2\neq m_6$ or $m_3\neq m_7$ or $m_4+m_8$ holds$\}$ and $\{m_1=m_5$ or $m_2=m_6$ or $m_3=m_7$ or $m_4=m_8$ holds$\}$ hold."

In the I-Q plane, 64 signal points included in 64QAM (indicated by the marks "○" in FIG. 120) are obtained as follows. ($w_{64c}$ is a real number larger than 0)

$(m_4\times w_{64c}, m_8\times w_{64c})$, $(m_4\times w_{64c}, m_7\times w_{64c})$, $(m_4\times w_{64c}, m_6\times w_{64c})$, $(m_4\times w_{64c}, m_5\times w_{64c})$, $(m_4\times w_{64c}, -m_5\times w_{64c})$, $(m_4\times w_{64c}, -m_6\times w_{64c})$, $(m_4\times w_{64c}, -m_7\times w_{64c})$, $(m_4\times w_{64c}, -m_8\times w_{64c})$ $(m_3\times w_{64c}, m_8\times w_{64c})$, $(m_3\times w_{64c}, m_7\times w_{64c})$, $(m_3\times w_{64c}, m_6\times w_{64c})$, $(m_3\times w_{64c}, m_5\times w_{64c})$, $(m_3\times w_{64c}, -m_5\times w_{64c})$, $(m_3\times w_{64c}, -m_6\times w_{64c})$, $(m_3\times w_{64c}, -m_7\times w_{64c})$, $(m_3\times w_{64c}, -m_8\times w_{64c})$ $(m_2\times w_{64c}, m_8\times w_{64c})$, $(m_2\times w_{64c}, m_7\times w_{64c})$, $(m_2\times w_{64c}, m_6\times w_{64c})$, $(m_2\times w_{64c}, m_5\times w_{64c})$, $(m_2\times w_{64c}, -m_5\times w_{64c})$, $(m_2\times w_{64c}, -m_6\times w_{64c})$, $(m_2\times w_{64c}, -m_7\times w_{64c})$, $(m_2\times w_{64c}, -m_8\times w_{64c})$ $(m_1\times w_{64c}, m_8\times w_{64c})$, $(m_1\times w_{64c}, m_7\times w_{64c})$, $(m_1\times w_{64c}, m_6\times w_{64c})$, $(m_1\times w_{64c}, m_5\times w_{64c})$, $(m_1\times w_{64c}, -m_5\times w_{64c})$, $(m_1\times w_{64c}, -m_6\times w_{64c})$, $(m_1\times w_{64c}, -m_7\times w_{64c})$, $(m_1\times w_{64c}, -m_8\times w_{64c})$ $(-m_1\times w_{64c}, m_8\times w_{64c})$, $(-m_1\times w_{64c}, m_7\times w_{64c})$, $(-m_1\times w_{64c}, m_6\times w_{64c})$, $(-m_1\times w_{64c}, m_5\times w_{64c})$, $(-m_1\times w_{64c}, -m_5\times w_{64c})$, $(-m_1\times w_{64c}, -m_6\times w_{64c})$, $(-m_1\times w_{64c}, -m_7\times w_{64c})$, $(-m_1\times w_{64c}, -m_8\times w_{64c})$ $(-m_2\times w_{64c}, m_8\times w_{64c})$, $(-m_2\times w_{64c}, m_7\times w_{64c})$, $(-m_2\times w_{64c}, m_6\times w_{64c})$, $(-m_2\times w_{64c}, m_5\times w_{64c})$, $(-m_2\times w_{64c}, -m_5\times w_{64c})$, $(-m_2\times w_{64c}, -m_6\times w_{64c})$, $(-m_2\times w_{64c}, -m_7\times w_{64c})$, $(-m_2\times w_{64c}, -m_8\times w_{64c})$ $(-m_3\times w_{64c}, m_8\times w_{64c})$, $(-m_3\times w_{64c}, m_7\times w_{64c})$, $(-m_3\times w_{64c}, m_6\times w_{64c})$, $(-m_3\times w_{64c}, m_5\times w_{64c})$, $(-m_3\times w_{64c}, -m_5\times w_{64c})$, $(-m_3\times w_{64c}, -m_6\times w_{64c})$, $(-m_3\times w_{64c}, -m_7\times w_{64c})$, $(-m_3\times w_{64c}, -m_8\times w_{64c})$ $(-m_4\times w_{64c}, m_8\times w_{64c})$, $(-m_4\times w_{64c}, m_7\times w_{64c})$, $(-m_4\times w_{64c}, m_6\times w_{64c})$, $(-m_4\times w_{64c}, m_5\times w_{64c})$, $(-m_4\times w_{64c}, -m_5\times w_{64c})$, $(-m_4\times w_{64c}, -m_6\times w_{64c})$, $(-m_4\times w_{64c}, -m_7\times w_{64c})$, $(-m_4\times w_{64c}, -m_8\times w_{64c})$ At this point, the bits to be transmitted (input bits) are set to b0, b1, b2, b3, b4, and b5. For example, for the bits to be transmitted (b0, b1, b2, b3, b4, b5)=(0,0,0,0,0,0), the bits are mapped at signal point 12001 in FIG. 120, and $(I,Q)=(m_4\times w_{64c}, m_8\times w_{64c})$ is obtained when I is an in-phase component while Q is a quadrature component of the mapped baseband signal.

Based on the bits to be transmitted (b0, b1, b2, b3, b4, b5), in-phase component I and quadrature component Q of the mapped baseband signal are decided (during 64QAM modulation). FIG. 120 illustrates an example of a relationship between the set of b0, b1, b2, b3, b4, and b5 (000000 to 111111) and the signal point coordinates. Values 000000 to 111111 of the set of b0, b1, b2, b3, b4, and b5 are indicated immediately below 64 signal points included in 64QAM (the marks "○" in FIG. 120) $(m_4\times w_{64c}, m_8\times w_{64c})$, $(m_4\times w_{64c}, m_7\times w_{64c})$, $(m_4\times w_{64c}, m_6\times w_{64c})$, $(m_4\times w_{64c}, m_5\times w_{64c})$, $(m_4\times w_{64c}, -m_5\times w_{64c})$, $(m_4\times w_{64c}, -m_6\times w_{64c})$, $(m_4\times w_{64c}, -m_7\times w_{64c})$, $(m_4\times w_{64c}, -m_8\times w_{64c})$ $(m_3\times w_{64c}, m_8\times w_{64c})$, $(m_3\times w_{64c}, m_7\times w_{64c})$, $(m_3\times w_{64c}, m_6\times w_{64c})$, $(m_3\times w_{64c}, m_5\times w_{64c})$, $(m_3\times w_{64c}, -m_5\times w_{64c})$, $(m_3\times w_{64c}, -m_6\times w_{64c})$, $(m_3\times w_{64c}, -m_7\times w_{64c})$, $(m_3\times w_{64c}, -m_8\times w_{64c})$ $(m_2\times w_{64c}, m_8\times w_{64c})$, $(m_2\times w_{64c}, m_7\times w_{64c})$, $(m_2\times w_{64c}, m_6\times w_{64c})$, $(m_2\times w_{64c}, m_5\times w_{64c})$, $(m_2\times w_{64c}, -m_5\times w_{64c})$, $(m_2\times w_{64c}, -m_6\times w_{64c})$, $(m_2\times w_{64c}, -m_7\times w_{64c})$, $(m_2\times w_{64c}, -m_8\times w_{64c})$ $(m_1\times w_{64c}, m_8\times w_{64c})$, $(m_1\times w_{64c}, m_7\times w_{64c})$, $(m_1\times w_{64c}, m_6\times w_{64c})$, $(m_1\times w_{64c}, m_5\times w_{64c})$, $(m_1\times w_{64c}, -m_5\times w_{64c})$, $(m_1\times w_{64c}, -m_6\times w_{64c})$, $(m_1\times w_{64c}, -m_7\times w_{64c})$, $(m_1\times w_{64c}, -m_8\times w_{64c})$ $(-m_1\times w_{64c}, m_8\times w_{64c})$, $(-m_1\times w_{64c}, m_7\times w_{64c})$, $(-m_1\times w_{64c}, m_6\times w_{64c})$, $(-m_1\times w_{64c}, m_5\times w_{64c})$, $(-m_1\times w_{64c}, -m_5\times w_{64c})$, $(-m_1\times w_{64c}, -m_6\times w_{64c})$, $(-m_1\times w_{64c}, -m_7\times w_{64c})$, $(-m_1\times w_{64c}, -m_8\times w_{64c})$ $(-m_2\times w_{64c}, m_8\times w_{64c})$, $(-m_2\times w_{64c}, m_7\times w_{64c})$, $(-m_2\times w_{64c}, m_6\times w_{64c})$, $(-m_2\times w_{64c}, m_5\times w_{64c})$, $(-m_2\times w_{64c}, -m_5\times w_{64c})$, $(-m_2\times w_{64c}, -m_6\times w_{64c})$, $(-m_2\times w_{64c}, -m_7\times w_{64c})$, $(-m_2\times w_{64c}, -m_8\times w_{64c})$ $(-m_3\times w_{64c}, m_8\times w_{64c})$, $(-m_3\times w_{64c}, m_7\times w_{64c})$, $(-m_3\times w_{64c}, m_6\times w_{64c})$, $(-m_3\times w_{64c}, m_5\times w_{64c})$, $(-m_3\times w_{64c}, -m_5\times w_{64c})$, $(-m_3\times w_{64c}, -m_6\times w_{64c})$, $(-m_3\times w_{64c}, -m_7\times w_{64c})$, $(-m_3\times w_{64c}, -m_8\times w_{64c})$ $(-m_4\times w_{64c}, m_8\times w_{64c})$, $(-m_4\times w_{64c}, m_7\times w_{64c})$, $(-m_4\times w_{64c}, m_6\times w_{64c})$, $(-m_4\times w_{64c}, m_5\times w_{64c})$, $(-m_4\times w_{64c}, -m_5\times w_{64c})$, $(-m_4\times w_{64c}, -m_6\times w_{64c})$, $(-m_4\times w_{64c}, -m_7\times w_{64c})$, $(-m_4\times w_{64c}, -m_8\times w_{64c})$. Respective coordinates of the signal points ("○") immediately above the values 000000 to 111111 of the set of b0, b1, b2, b3, b4, and b5 in the I-Q plane serve as in-phase component I and quadrature component Q of the mapped baseband signal. The relationship between the set of b0, b1, b2, b3, b4, and b5 (000000 to 111111) and the signal point coordinates during 64QAM modulation is not limited to that in FIG. 120.

64 signal points in FIG. 120 are named as "signal point 1", "signal point 2", . . . , "signal point 63", and "signal point 64" (because of the presence of 64 signal points, "signal point 1" to "signal point 64" exist). In the I-Q plane, Di is a distance between "signal point i" and the origin. At this point, $w_{64c}$ is given by the following equation.

[Mathematical formula 372]

$$w_{64c} = \frac{z}{\sqrt{\frac{\sum_{i=1}^{64} D_i^2}{64}}} \tag{H8}$$

Therefore, the mapped baseband signal has an average power of $z_2$. The effect is described later.

Figure 121:
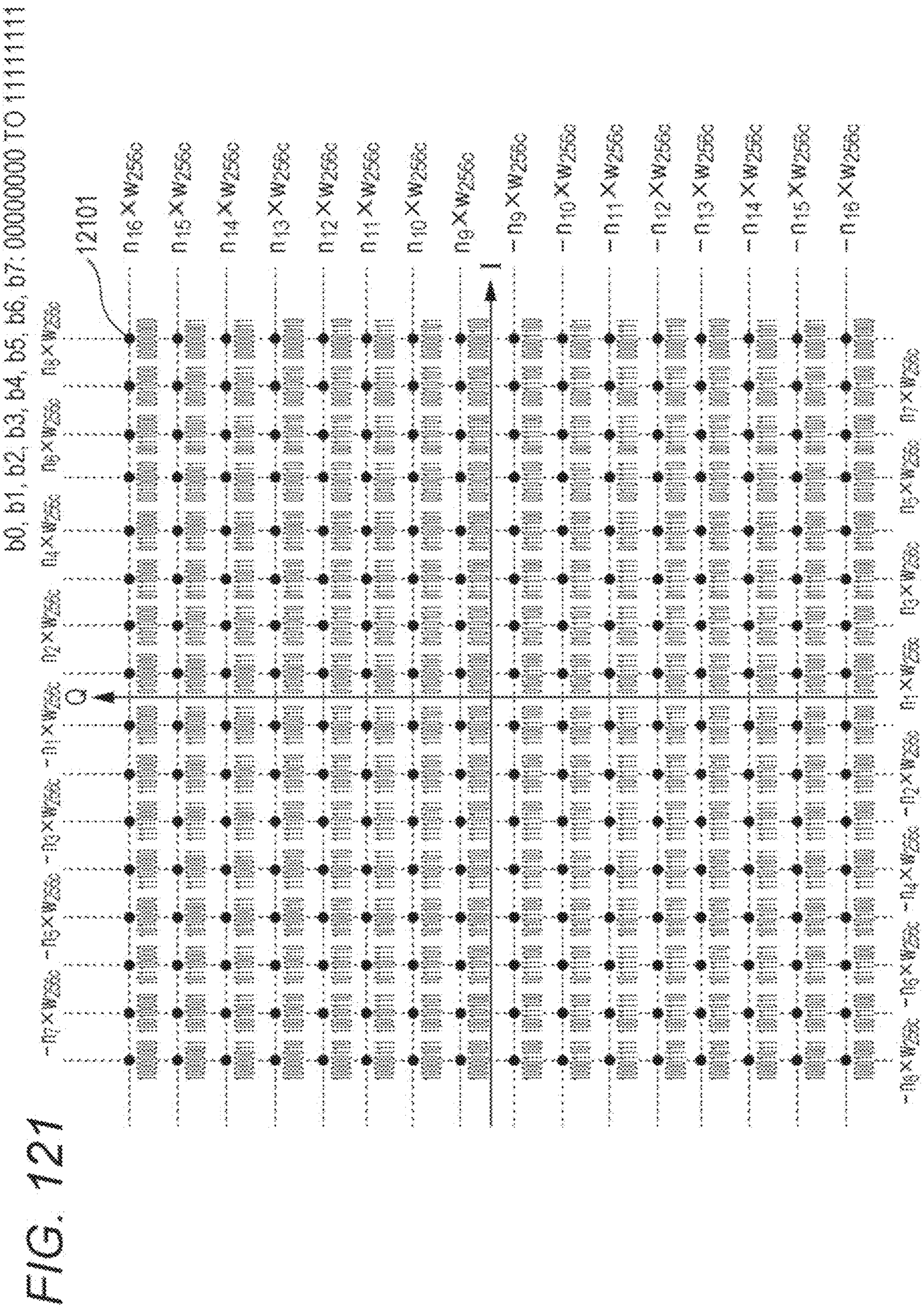

The 256QAM mapping method will be described below. FIG. 121 illustrates an arrangement example of 256QAM signal points in the I-Q plane. In FIG. 121, 256 marks "○" indicate 256QAM signal points, a horizontal axis indicates I, and a vertical axis indicates Q.

In FIG. 121, it is assumed that "$n_1>0$ ($n_1$ is a real number larger than 0) and $n_2>0$ ($n_2$ is a real number larger than 0) and $n_3>0$ (m is a real number larger than 0) and $n_4>0$ ($n_4$ is a real number larger than 0) and $n_5>0$ ($n_6$ is a real number larger than 0) and $n_7>0$ ($n_7$ is a real number larger than 0) and $n_8>0$ ($n_8$ is a real number larger than 0)
and $n_9>0$ ($n_9$ is a real number larger than 0) and $n_{10}>0$ ($n_{10}$ is a real number larger than 0) and $n_{11}>0$ ($n_{11}$ is a real number larger than 0) and $n_{12}>0$ ($n_{12}$ is a real number larger than 0) and $n_{13}>0$ ($n_{13}$ is a real number larger than 0) and $n_{14}>0$ ($n_{14}$ is a real number larger than 0) and $n_{15}>0$ ($n_{15}$ is a real number larger than 0) and $n_16>0$ ($n_{16}$ is a real number larger than 0), and
{$n_1 \neq n_2$ and $n_1 \neq n_3$ and $n_1 \neq n_4$ and $n_1 \neq n_5$ and $n_1 \neq n_6$ and $n_1 \neq n_7$ and $n_1 \neq n_8$
and $n_2 \neq n_3$ and $n_2 \neq n_4$ and $n_2 \neq n_5$ and $n_2 \neq n_6$ and $n_2 \neq n_7$ and $n_2 \neq n_8$
and $n_3 \neq n_4$ and $n_3 \neq n_5$ and $n_3 \neq n_6$ and $n_3 \neq n_7$ and $n_3 \neq n_8$
and $n_4 \neq n_5$ and $n_4 \neq n_6$ and $n_4 \neq n_7$ and $n_4 \neq n_5$
and $n_5 \neq n_6$ and $n_5 \neq n_7$ and $n_5 \neq n_8$
and $n_6 \neq n_7$ and $n_6 \neq n_8$
and $n_7 \neq n_8$}
and
{$n_9 \neq n_{10}$ and $n_9 \neq n_{11}$ and $n_9 \neq n_{12}$ and $n_9 \neq n_{13}$ and $n_9 \neq n_{14}$ and $n_9 \neq n_{15}$ and $n_9 \neq n_{16}$
and $n_{10} \neq n_{11}$ and $n_{10} \neq n_{12}$ and $n_{10} \neq n_{13}$ and $n_{10} \neq n_{14}$ and $n_{10} \neq n_{15}$ and $n_{10} \neq n_{16}$
and $n_{11} \neq n_{12}$ and $n_{11} \neq n_{13}$ and $n_{11} \neq n_{14}$ and $n_{11} \neq n_{15}$ and $n_{11} \neq n_{16}$
and $n_{12} \neq n_{13}$ and $n_{12} \neq n_{14}$ and $n_{12} \neq n_{15}$ and $n_{12} \neq n_{16}$
and $n_{13} \neq n_{14}$ and $n_{13} \neq n_{15}$ and $n_{13} \neq n_{16}$
and $n_{14} \neq n_{15}$ and $n_{14} \neq n_{16}$
and $n_{15} \neq n_{16}$}
and
{$n_1 \neq n_9$ or $n_2 \neq n_{10}$ or $n_3 \neq n_{11}$ or $n_4 \neq n_{12}$ or $n_5 \neq n_{13}$ or $n_6 \neq n_{14}$ or $n_7 \neq n_{15}$ or $n_8 \neq n_{16}$ holds} hold".
or
that "$n_1>0$ ($n_1$ is a real number larger than 0) and $n_2>0$ ($n_2$ is a real number larger than 0)
and $n_3>0$ ($n_3$ is a real number larger than 0) and $n_4>0$ ($n_4$ is a real number larger than 0)
and $n_5>0$ ($n_6$ is a real number larger than 0) and $n_7>0$ ($n_7$ is a real number larger than 0)
and $n_8>0$ ($n_8$ is a real number larger than 0)
and $n_9>0$ ($n_9$ is a real number larger than 0) and $n_{10}>0$ ($n_{10}$ is a real number larger than 0)
and $n_{11}>0$ ($n_{11}$ is a real number larger than 0) and $n_{12}>0$ ($n_{12}$ is a real number larger than 0) and $n_{13}>0$ ($n_{13}$ is a real number larger than 0) and $n_{14}>0$ ($n_{14}$ is a real number larger than 0) and $n_{15}>0$ ($n_{15}$ is a real number larger than 0) and $n_{16}>0$ ($n_{16}$ is a real number larger than 0), and
{$n_1 \neq n_2$ and $n_1 \neq n_3$ and $n_1 \neq n_4$ and $n_1 \neq n_5$ and $n_1 \neq n_6$ and $n_1 \neq n_7$ and $n_1 \neq n_8$
and $n_2 \neq n_3$ and $n_2 \neq n_4$ and $n_2 \neq n_5$ and $n_2 \neq n_6$ and $n_2 \neq n_7$ and $n_2 \neq n_8$
and $n_3 \neq n_4$ and $n_3 \neq n_5$ and $n_3 \neq n_6$ and $n_3 \neq n_7$ and $n_3 \neq n_8$
and $n_4 \neq n_5$ and $n_4 \neq n_6$ and $n_4 \neq n_7$ and $n_4 \neq n_8$
and $n_5 \neq n_6$ and $n_5 \neq n_7$ and $n_5 \neq n_8$
and $n_6 \neq n_7$ and $n_6 \neq n_8$
and $n_7 \neq n_8$}
and
{$n_9 \neq n_{10}$ and $n_9 \neq n_{11}$ and $n_9 \neq n_{12}$ and $n_9 \neq n_{13}$ and $n_9 \neq n_{14}$ and $n_9 \neq n_{15}$ and $n_9 \neq n_{16}$
and $n_{10} \neq n_{11}$ and $n_{10} \neq n_{12}$ and $n_{10} \neq n_{13}$ and $n_{10} \neq n_{14}$ and $n_{10} \neq n_{15}$ and $n_{10}+n_{16}$
and $n_{11} \neq n_{12}$ and $n_{11} \neq n_{13}$ and $n_{11} \neq n_{14}$ and $n_{11} \neq n_{15}$ and $n_{11} \neq n_{16}$
and $n_{12} \neq n_{13}$ and $n_{12} \neq n_{14}$ and $n_{12} \neq n_{15}$ and $n_{12} \neq n_{16}$
and $n_{13} \neq n_{14}$ and $n_{13} \neq n_{15}$ and $n_{13} \neq n_{16}$
and $n_{14} \neq n_{15}$ and $n_{14} \neq n_{16}$
and $n_{15} \neq n_{16}$}
and
{$n_1 \neq n_9$ or $n_2 \neq n_{10}$ or $n_3 \neq n_{11}$ or $n_4 \neq n_{12}$ or $n_5 \neq n_{13}$ or $n_6 \neq n_{14}$ or $n_7 \neq n_{15}$ or $n_8 \neq n_{16}$ holds}
and
{$n_1 = n_9$ or $n_2 = n_{10}$ or $n_3 = n_{11}$ or $n_4 = n_{12}$ or $n_5 = n_{13}$ or $n_6 = n_{14}$ or $n_7 = n_{15}$ or $n_8 = n_{16}$ holds} hold."

In the I-Q plane, 256 signal points included in 256QAM (indicated by the marks "○" in FIG. 121) are obtained as follows. ($w_{256c}$ is a real number larger than 0) ($n_8 \times w_{256c}$, $n_{16} \times w_{256c}$), ($n_8 \times w_{256c}$, $n_{15} \times w_{256c}$), ($n_8 \times w_{256c}$, $n_{14} \times w_{256c}$), ($n_8 \times w_{256c}$, $n_{13} \times w_{256c}$), ($n_8 \times w_{256c}$, $n_{12} \times w_{256c}$), ($n_8 \times w_{256c}$, $n_{11} \times w_{256c}$), ($n_8 \times w_{256c}$, $n_{10} \times w_{256c}$), ($n_8 \times w_{256c}$, $n_9 \times w_{256c}$),
($n_8 \times w_{256c}$, $-n_{16} \times w_{256c}$), ($n_8 \times w_{256c}$, $-n_{15} \times w_{256c}$), ($n_8 \times w_{256c}$, $-n_{14} \times w_{256c}$), ($n_8 \times w_{256c}$, $-n_{13} \times w_{256c}$), ($n_8 \times w_{256c}$, $-n_{12} \times w_{256c}$), ($n_8 \times w_{256c}$, $-n_{11} \times w_{256c}$), ($n_8 \times w_{256c}$, $-n_{10} \times w_{256c}$), ($n_8 \times w_{256c}$, $-n_9 \times w_{256c}$),
($n_7 \times w_{256c}$, $n_{16} \times w_{256c}$), ($n_7 \times w_{256c}$, $n_{15} \times w_{256c}$), ($n_7 \times w_{256c}$, $n_{14} \times w_{256c}$), ($n_7 \times w_{256c}$, $n_{13} \times w_{256c}$), ($n_7 \times w_{256c}$, $n_{12} \times w_{256c}$), ($n_7 \times w_{256c}$, $n_{11} \times w_{256c}$), ($n_7 \times w_{256c}$, $n_{10} \times w_{256c}$), ($n_7 \times w_{256c}$, $n_9 \times w_{256c}$), ($n_7 \times w_{256c}$, $-n_{16} \times w_{256c}$), ($n_7 \times w_{256c}$, $-n_{15} \times w_{256c}$), ($n_7 \times w_{256c}$, $-n_{14} \times w_{256c}$), ($n_7 \times w_{256c}$, $-n_{13} \times w_{256c}$), ($n_7 \times w_{256c}$, $-n_{12} \times w_{256c}$), ($n_7 \times w_{256c}$, $-n_{11} \times w_{256c}$), ($n_7 \times w_{256c}$, $-n_{10} \times w_{256c}$), ($n_7 \times w_{256c}$, $-n_9 \times w_{256c}$),
($n_6 \times w_{256c}$, $n_{16} \times w_{256c}$), ($n_6 \times w_{256c}$, $n_{15} \times w_{256c}$), ($n_6 \times w_{256c}$, $n_{14} \times w_{256c}$), ($n_6 \times w_{256c}$, $n_{13} \times w_{256c}$), ($n_6 \times w_{256c}$, $n_{12} \times w_{256c}$), ($n_6 \times w_{256c}$, $n_{11} \times w_{256c}$), ($n_6 \times w_{256c}$, $n_{10} \times w_{256c}$), ($n_6 \times w_{256c}$, $n_9 \times w_{256c}$), ($n_6 \times w_{256c}$, $-n_{16} \times w_{256c}$), ($n_6 \times w_{256c}$, $-n_{15} \times w_{256c}$), ($n_6 \times w_{256c}$, $-n_{14} \times w_{256c}$), ($n_6 \times w_{256c}$, $-n_{13} \times w_{256c}$), ($n_6 \times w_{256c}$, $-n_{12} \times w_{256c}$), ($n_6 \times w_{256c}$, $-n_{11} \times w_{256c}$), ($n_6 \times w_{256c}$, $-n_{10} \times w_{256c}$), ($n_6 \times w_{256c}$, $-n_9 \times w_{256c}$),
($n_5 \times w_{256c}$, $n_{16} \times w_{256c}$), ($n_5 \times w_{256c}$, $n_{15} \times w_{256c}$), ($n_5 \times w_{256c}$, $n_{14} \times w_{256c}$), ($n_5 \times w_{256c}$, $n_{13} \times w_{256c}$), ($n_5 \times w_{256c}$, $n_{12} \times w_{256c}$), ($n_5 \times w_{256c}$, $n_{11} \times w_{256c}$), ($n_5 \times w_{256c}$, $n_{10} \times w_{256c}$), ($n_5 \times w_{256c}$, $n_9 \times$ $w_{256c})$, $(n_5\times w_{256c},-n_{16}\times w_{256c})$, $(n_5\times w_{256c},-n_{15}\times w_{256c})$, $(n_5\times w_{256c},-n_{14}\times w_{256c})$, $(n_5\times w_{256c},-n_{13}\times w_{256c})$, $(n_5\times w_{256c},-n_{12}\times w_{256c})$, $(n_5\times w_{256c},-n_{11}\times w_{256c})$, $(n_5\times w_{256c},-n_{10}\times w_{256c})$, $(n_5\times w_{256c},-n_9\times w_{256c})$, $(n_4\times w_{256c}, n_{16}\times w_{256c})$, $(n_4\times w_{256c},n_{15}\times w_{256c})$, $(n_4\times w_{256c}, n_{14}\times w_{256c})$, $(n_4\times w_{256c},n_{13}\times w_{256c})$, $(n_4\times w_{256c}, n_{12}\times w_{256c})$, $(n_4\times w_{256c}, n_{11}\times w_{256c})$, $(n_4\times w_{256c},n_{10}\times w_{256c})$, $(n_4\times w_{256c}, n_9\times w_{256c})$, $(n_4\times w_{256c},-n_{16}\times w_{256c})$, $(n_4\times w_{256c},-n_{15}\times w_{256c})$, $(n_4\times w_{256c},-n_{14}\times w_{256c})$, $(n_4\times w_{256c},-n_{13}\times w_{256c})$, $(n_4\times w_{256c},-n_{12}\times w_{256c})$, $(n_4\times w_{256c},-n_{11}\times w_{256c})$, $(n_4\times w_{256c},-n_{10}\times w_{256c})$, $(n_4\times w_{256c},-n_9\times w_{256c})$, $(n_3\times w_{256c}, n_{16}\times w_{256c})$, $(n_3\times w_{256c},n_{15}\times w_{256c})$, $(n_3\times w_{256c}, n_{14}\times w_{256c})$, $(n_3\times w_{256c},n_{13}\times w_{256c})$, $(n_3\times w_{256c},n_{12}\times w_{256c})$, $(n_3\times w_{256c},n_{11}\times w_{256c})$, $(n_3\times w_{256c},n_{10}\times w_{256c})$, $(n_3\times w_{256c},n_9\times w_{256c})$, $(n_3\times w_{256c},-n_{16}\times w_{256c})$, $(n_3\times w_{256c},-n_{15}\times w_{256c})$, $(n_3\times w_{256c},-n_{14}\times w_{256c})$, $(n_3\times w_{256c},-n_{13}\times w_{256c})$, $(n_3\times w_{256c},-n_{12}\times w_{256c})$, $(n_3\times w_{256c},-n_{11}\times w_{256c})$, $(n_3\times w_{256c},-n_{10}\times w_{256c})$, $(n_3\times w_{256c},-n_9\times w_{256c})$, $(n_2\times w_{256c}, n_{16}\times w_{256c})$, $(n_2\times w_{256c},n_{15}\times w_{256c})$, $(n_2\times w_{256c}, n_{14}\times w_{256c})$, $(n_2\times w_{256c},n_{13}\times w_{256c})$, $(n_2\times w_{256c}, n_{12}\times w_{256c})$, $(n_2\times w_{256c}, n_{11}\times w_{256c})$, $(n_2\times w_{256c},n_{10}\times w_{256c})$, $(n_2\times w_{256c}, n_9\times w_{256c})$, $(n_2\times w_{256c},-n_{16}\times w_{256c})$, $(n_2\times w_{256c},-n_{15}\times w_{256c})$, $(n_2\times w_{256c},-n_{14}\times w_{256c})$, $(n_2\times w_{256c},-n_{13}\times w_{256c})$, $(n_2\times w_{256c},-n_{12}\times w_{256c})$, $(n_2\times w_{256c},-n_{11}\times w_{256c})$, $(n_2\times w_{256c},-n_{10}\times w_{256c})$, $(n_2\times w_{256c},-n_9\times w_{256c})$, $(n_1\times w_{256c},n_{16}\times w_{256c})$, $(n_1\times w_{256c},n_{15}\times w_{256c})$, $(n_1\times w_{256c}, n_{14}\times w_{256c})$, $(n_1\times w_{256c},n_{13}\times w_{256c})$, $(n_1\times w_{256c},n_{12}\times w_{256c})$, $(n_1\times w_{256c},n_{11}\times w_{256c})$, $(n_1\times w_{256c},n_{10}\times w_{256c})$, $(n_1\times w_{256c}, n_9\times w_{256c})$, $(n_1\times w_{256c},-n_{16}\times w_{256c})$, $(n_1\times w_{256c},-n_{15}\times w_{256c})$, $(n_1\times w_{256c},-n_{14}\times w_{256c})$, $(n_1\times w_{256c},-n_{13}\times w_{256c})$, $(n_1\times w_{256c},-n_{12}\times w_{256c})$, $(n_1\times w_{256c},-n_{11}\times w_{256c})$, $(n_1\times w_{256c},-n_{10}\times w_{256c})$, $(n_1\times w_{256c},-n_9\times w_{256c})$, $(-n_8\times w_{256c},n_{16}\times w_{256c})$, $(-n_8\times w_{256c},n_{15}\times w_{256c})$, $(-n_8\times w_{256c}, n_{14}\times w_{256c})$, $(-n_8\times w_{256c},n_{13}\times w_{256c})$, $(-n_8\times w_{256c},n_{12}\times w_{256c})$, $(-n_8\times w_{256c},n_{11}\times w_{256c})$, $(-n_8\times w_{256c},n_{10}\times w_{256c})$, $(-n_8\times w_{256c},n_9\times w_{256c})$, $(-n_8\times w_{256c},-n_{16}\times w_{256c})$, $(-n_8\times w_{256c},n_{15}\times w_{256c})$, $(-n_8\times w_{256c},-n_{14}\times w_{256c})$, $(-n_8\times w_{256c},-n_{13}\times w_{256c})$, $(-n_8\times w_{256c},-n_{12}\times w_{256c})$, $(-n_8\times w_{256c},-n_{11}\times w_{256c})$, $(-n_8\times w_{256c}, -n_{10}\times w_{256c})$, $(-n_8\times w_{256c}, -n_9\times w_{256c})$, $(-n_7\times w_{256c}, n_{16}\times w_{256c})$, $(-n_7\times w_{256c},n_{15}\times w_{256c})$, $(-n_7\times w_{256c}, n_{14}\times w_{256c})$, $(-n_7\times w_{256c},n_{13}\times w_{256c})$, $(-n_7\times w_{256c},n_{12}\times w_{256c})$, $(-n_7\times w_{256c},n_{11}\times w_{256c})$, $(-n_7\times w_{256c},n_{10}\times w_{256c})$, $(-n_7\times w_{256c},n_9\times w_{256c})$, $(-n_7\times w_{256c},-n_{16}\times w_{256c})$, $(-n_7\times w_{256c},-n_{15}\times w_{256c})$, $(-n_7\times w_{256c},-n_{14}\times w_{256c})$, $(-n_7\times w_{256c},-n_{13}\times w_{256c})$, $(-n_7\times w_{256c},-n_{12}\times w_{256c})$, $(-n_7\times w_{256c},-n_{11}\times w_{256c})$, $(-n_7\times w_{256c}, -n_{10}\times w_{256c})$, $(-n_7\times w_{256c}, n_9\times w_{256c})$, $(-n_6\times w_{256c},n_{16}\times w_{256c})$, $(-n_6\times w_{256c},n_{15}\times w_{256c})$, $(-n_6\times w_{256c}, n_{14}\times w_{256c})$, $(-n_6\times w_{256c},n_{13}\times w_{256c})$, $(-n_6\times w_{256c}, n_{12}\times w_{256c})$, $(-n_6\times w_{256c}, n_{11}\times w_{256c})$, $(-n_6\times w_{256c}, n_{10}\times w_{256c})$, $(-n_6\times w_{256c}, n_9\times w_{256c})$, $(-n_6\times w_{256c},-n_{16}\times w_{256c})$, $(-n_6\times w_{256c},-n_{15}\times w_{256c})$, $(-n_6\times w_{256c},-n_{14}\times w_{256c})$, $(-n_6\times w_{256c},-n_{13}\times w_{256c})$, $(-n_6\times w_{256c},-n_{12}\times w_{256c})$, $(-n_6\times w_{256c},-n_{11}\times w_{256c})$, $(-n_6\times w_{256c},-n_{10}\times w_{256c})$, $(-n_6\times w_{256c},-n_9\times w_{256c})$, $(-n_5\times w_{256c},n_{16}\times w_{256c})$, $(-n_5\times w_{256c},n_{15}\times w_{256c})$, $(-n_5\times w_{256c}, n_{14}\times w_{256c})$, $(-n_5\times w_{256c},n_{13}\times w_{256c})$, $(-n_5\times w_{256c},n_{12}\times w_{256c})$, $(-n_5\times w_{256c}, n_{11}\times w_{256c})$, $(-n_5\times w_{256c}, n_{10}\times w_{256c})$, $(-n_5\times w_{256c}, n_9\times w_{256c})$, $(-n_5\times w_{256c},-n_{16}\times w_{256c})$, $(-n_5\times w_{256c},-n_{15}\times w_{256c})$, $(-n_5\times w_{256c},-n_{14}\times w_{256c})$, $(-n_5\times w_{256c},-n_{13}\times w_{256c})$, $(-n_5\times w_{256c},-n_{12}\times w_{256c})$, $(-n_5\times w_{256c},-n_{11}\times w_{256c})$, $(-n_5\times w_{256c}, -n_{10}\times w_{256c})$, $(-n_5\times w_{256c}, -n_9\times w_{256c})$, $(-n_4\times w_{256c}, n_{16}\times w_{256c})$, $(-n_4\times w_{256c},n_{15}\times w_{256c})$, $(-n_4\times w_{256c}, n_{14}\times w_{256c})$, $(-n_4\times w_{256c},n_{13}\times w_{256c})$, $(-n_4\times w_{256c},n_{12}\times w_{256c})$, $(-n_4\times w_{256c},n_{11}\times w_{256c})$, $(-n_4\times w_{256c},n_{10}\times w_{256c})$, $(-n_4\times w_{256c},n_9\times w_{256c})$, $(-n_4\times w_{256c},-n_{16}\times w_{256c})$, $(-n_4\times w_{256c},-n_{15}\times w_{256c})$, $(-n_4\times w_{256c},-n_{14}\times w_{256c})$, $(-n_4\times w_{256c},-n_{13}\times w_{256c})$, $(-n_4\times w_{256c},-n_{12}\times w_{256c})$, $(-n_4\times w_{256c},-n_{11}\times w_{256c})$, $(-n_4\times w_{256c},-n_{10}\times w_{256c})$, $(-n_4\times w_{256c}, -n_9\times w_{256c})$, $(-n_3\times w_{256c}, n_{16}\times w_{256c})$, $(-n_3\times w_{256c},n_{15}\times w_{256c})$, $(-n_3\times w_{256c}, n_{14}\times w_{256c})$, $(-n_3\times w_{256c},n_{13}\times w_{256c})$, $(-n_3\times w_{256c}, n_{12}\times w_{256c})$, $(-n_3\times w_{256c}, n_{11}\times w_{256c})$, $(-n_3\times w_{256c}, n_{10}\times w_{256c})$, $(-n_3\times w_{256c}, n_9\times w_{256c})$, $(-n_3\times w_{256c},-n_{16}\times w_{256c})$, $(-n_3\times w_{256c},-n_{15}\times w_{256c})$, $(-n_3\times w_{256c},-n_{14}\times w_{256c})$, $(-n_3\times w_{256c},-n_{13}\times w_{256c})$, $(-n_3\times w_{256c},-n_{12}\times w_{256c})$, $(-n_3\times w_{256c},-n_{11}\times w_{256c})$, $(-n_3\times w_{256c}, -n_{10}\times w_{256c})$, $(-n_3\times w_{256c}, n_9\times w_{256c})$, $(-n_2\times w_{256c}, n_{16}\times w_{256c})$, $(-n_2\times w_{256c},n_{15}\times w_{256c})$, $(-n_2\times w_{256c}, n_{14}\times w_{256c})$, $(-n_2\times w_{256c},n_{13}\times w_{256c})$, $(-n_2\times w_{256c},n_{12}\times w_{256c})$, $(-n_2\times w_{256c},n_{11}\times w_{256c})$, $(-n_2\times w_{256c},n_{10}\times w_{256c})$, $(-n_2\times w_{256c},n_9\times w_{256c})$, $(-n_2\times w_{256c},-n_{16}\times w_{256c})$, $(-n_2\times w_{256c},-n_{15}\times w_{256c})$, $(-n_2\times w_{256c},-n_{14}\times w_{256c})$, $(-n_2\times w_{256c},-n_{13}\times w_{256c})$, $(-n_2\times w_{256c},-n_{12}\times w_{256c})$, $(-n_2\times w_{256c},-n_{11}\times w_{256c})$, $(-n_2\times w_{256c}, -n_{10}\times w_{256c})$, $(-n_2\times w_{256c}, n_9\times w_{256c})$, $(-n_1\times w_{256c},n_{16}\times w_{256c})$, $(-n_1\times w_{256c},n_{15}\times w_{256c})$, $(-n_1\times w_{256c},n_{14}\times w_{256c})$, $(-n_1\times w_{256c},n_{13}\times w_{256c})$, $(-n_1\times w_{256c},n_{12}\times w_{256c})$, $(-n_1\times w_{256c}, n_{11}\times w_{256c})$, $(-n_1\times w_{256c},n_{10}\times w_{256c})$, $(-n_1\times w_{256c}, n_9\times w_{256c})$, $(-n_1\times w_{256c},-n_{16}\times w_{256c})$, $(-n_1\times w_{256c},-n_{15}\times w_{256c})$, $(-n_1\times w_{256c},-n_{14}\times w_{256c})$, $(-n_1\times w_{256c},-n_{13}\times w_{256c})$, $(-n_1\times w_{256c},-n_{12}\times w_{256c})$, $(-n_1\times w_{256c},-n_{11}\times w_{256c})$, $(-n_1\times w_{256c},-n_{10}\times w_{256c})$, $(-n_1\times w_{256c},-n_9\times w_{256c})$ At this point, the bits to be transmitted (input bits) are set to b0, b1, b2, b3, b4, b5, b6, and b7. For example, for the bits to be transmitted (b0, b1, b2, b3, b4, b5, b6, b7)=(0,0,0,0, 0,0,0,0), the bits are mapped at signal point 12101 in FIG. 121, and $(I,Q)=(n_8\times w_{256c},n_{16}\times w_{256c})$ is obtained when I is an in-phase component while Q is a quadrature component of the mapped baseband signal.

Based on the bits to be transmitted (b0, b1, b2, b3, b4, b5, b6, b7), in-phase component I and quadrature component Q of the mapped baseband signal are decided (during 256QAM modulation). FIG. 121 illustrates an example of a relationship between the set of b0, b1, b2, b3, b4, b5, b6, and b7 (00000000 to 11111111) and the signal point coordinates. Values 00000000 to 11111111 of the set of b0, b1, b2, b3, b4, b5, b6, and b7 are indicated immediately below 256 signal points included in 256QAM (the marks "○" in FIG. 121)

$(n_8\times w_{256c},n_{16}\times w_{256c})$, $(n_8\times w_{256c},n_{15}\times w_{256c})$, $(n_8\times w_{256c}, n_{14}\times w_{256c})$, $(n_8\times w_{256c},n_{13}\times w_{256c})$, $(n_8\times w_{256c},n_{12}\times w_{256c})$, $(n_8\times w_{256c},n_{11}\times w_{256c})$, $(n_8\times w_{256c},n_{10}\times w_{256c})$, $(n_8\times w_{256c}, n_9\times w_{256c})$, $(n_8\times w_{256c},-n_{16}\times w_{256c})$, $(n_8\times w_{256c},-n_{15}\times w_{256c})$, $(n_8\times w_{256c},-n_{14}\times w_{256c})$, $(n_8\times w_{256c},-n_{13}\times w_{256c})$, $(n_8\times w_{256c},-n_{12}\times w_{256c})$, $(n_8\times w_{256c},-n_{11}\times w_{256c})$, $(n_8\times w_{256c},-n_{10}\times w_{256c})$, $(n_8\times w_{256c},-n_9\times w_{256c})$, $(n_7\times w_{256c}, n_{16}\times w_{256c})$, $(n_7\times w_{256c},n_{15}\times w_{256c})$, $(n_7\times w_{256c}, n_{14}\times w_{256c})$, $(n_7\times w_{256c},n_{13}\times w_{256c})$, $(n_7\times w_{256c},n_{12}\times w_{256c})$, $(n_7\times w_{256c},n_{11}\times w_{256c})$, $(n_7\times w_{256c},n_{10}\times w_{256c})$, $(n_7\times w_{256c},n_9\times w_{256c})$, $(n_7\times w_{256c},-n_{16}\times w_{256c})$, $(n_7\times w_{256c},-n_{15}\times w_{256c})$, $(n_7\times w_{256c},-n_{14}\times w_{256c})$, $(n_7\times w_{256c},-n_{13}\times w_{256c})$, $(n_7\times w_{256c},-n_{12}\times w_{256c})$, $(n_7\times w_{256c},-n_{11}\times w_{256c})$, $(n_7\times w_{256c},-n_{10}\times w_{256c})$, $(n_7\times w_{256c},-n_9\times w_{256c})$, $(n_6\times w_{256c}, n_{16}\times w_{256c})$, $(n_6\times w_{256c},n_{15}\times w_{256c})$, $(n_6\times w_{256c}, n_{14}\times w_{256c})$, $(n_6\times w_{256c},n_{13}\times w_{256c})$, $(n_6\times w_{256c},n_{12}\times w_{256c})$, $(n_6\times w_{256c},n_{11}\times w_{256c})$, $(n_6\times w_{256c},n_{10}\times w_{256c})$, $(n_6\times w_{256c},n_9\times w_{256c})$, $(n_6\times w_{256c},-n_{16}\times w_{256c})$, $(n_6\times w_{256c},-n_{15}\times w_{256c})$, $(n_6\times w_{256c},-n_{14}\times w_{256c})$, $(n_6\times w_{256c},-n_{13}\times w_{256c})$, $(n_6\times w_{256c},-n_{12}\times w_{256c})$, $(n_6\times w_{256c},-n_{11}\times w_{256c})$, $(n_6\times w_{256c},-n_{10}\times w_{256c})$, $(n_6\times w_{256c},-n_9\times w_{256c})$, $(n_5\times w_{256c}, n_{16}\times w_{256c})$, $(n_5\times w_{256c},n_{15}\times w_{256c})$, $(n_5\times w_{256c}, n_{14}\times w_{256c})$, $(n_5\times w_{256c},n_{13}\times w_{256c})$, $(n_5\times w_{256c},n_{12}\times w_{256c})$, $(n_5\times w_{256c},n_{11}\times w_{256c})$, $(n_5\times w_{256c},n_{10}\times w_{256c})$, $(n_5\times w_{256c},n_9\times w_{256c})$, $(n_5\times w_{256c},-n_{16}\times w_{256c})$, $(n_5\times w_{256c},-n_{15}\times w_{256c})$, $(n_5\times w_{256c},-n_{14}\times w_{256c})$, $(n_5\times w_{256c},-n_{13}\times w_{256c})$, $(n_5\times$ $w_{256c}, -n_{12} \times w_{256c})$, $(n_5 \times w_{256c}, -n_{11} \times w_{256c})$, $(n_5 \times w_{256c}, -n_{10} \times w_{256c})$, $(n_5 \times w_{256c}, -n_9 \times w_{256c})$, $(n_4 \times w_{256c}, n_{16} \times w_{256c})$, $(n_4 \times w_{256c}, n_{15} \times w_{256c})$, $(n_4 \times w_{256c}, n_{14} \times w_{256c})$, $(n_4 \times w_{256c}, n_{13} \times w_{256c})$, $(n_4 \times w_{256c}, n_{12} \times w_{256c})$, $(n_4 \times w_{256c}, n_{11} \times w_{256c})$, $(n_4 \times w_{256c}, n_{10} \times w_{256c})$, $(n_4 \times w_{256c}, n_9 \times w_{256c})$, $(n_4 \times w_{256c}, -n_{16} \times w_{256c})$, $(n_4 \times w_{256c}, -n_{15} \times w_{256c})$, $(n_4 \times w_{256c}, -n_{14} \times w_{256c})$, $(n_4 \times w_{256c}, -n_{13} \times w_{256c})$, $(n_4 \times w_{256c}, -n_{12} \times w_{256c})$, $(n_4 \times w_{256c}, -n_{11} \times w_{256c})$, $(n_4 \times w_{256c}, -n_{10} \times w_{256c})$, $(n_4 \times w_{256c}, -n_9 \times w_{256c})$, $(n_3 \times w_{256c}, n_{16} \times w_{256c})$, $(n_3 \times w_{256c}, n_{15} \times w_{256c})$, $(n_3 \times w_{256c}, n_{14} \times w_{256c})$, $(n_3 \times w_{256c}, n_{13} \times w_{256c})$, $(n_3 \times w_{256c}, n_{12} \times w_{256c})$, $(n_3 \times w_{256c}, n_{11} \times w_{256c})$, $(n_3 \times w_{256c}, n_{10} \times w_{256c})$, $(n_3 \times w_{256c}, n_9 \times w_{256c})$, $(n_3 \times w_{256c}, -n_{16} \times w_{256c})$, $(n_3 \times w_{256c}, -n_{15} \times w_{256c})$, $(n_3 \times w_{256c}, -n_{14} \times w_{256c})$, $(n_3 \times w_{256c}, -n_{13} \times w_{256c})$, $(n_3 \times w_{256c}, -n_{12} \times w_{256c})$, $(n_3 \times w_{256c}, -n_{11} \times w_{256c})$, $(n_3 \times w_{256c}, -n_{10} \times w_{256c})$, $(n_3 \times w_{256c}, -n_9 \times w_{256c})$, $(n_2 \times w_{256c}, n_{16} \times w_{256c})$, $(n_2 \times w_{256c}, n_{15} \times w_{256c})$, $(n_2 \times w_{256c}, n_{14} \times w_{256c})$, $(n_2 \times w_{256c}, n_{13} \times w_{256c})$, $(n_2 \times w_{256c}, n_{12} \times w_{256c})$, $(n_2 \times w_{256c}, n_{11} \times w_{256c})$, $(n_2 \times w_{256c}, n_{10} \times w_{256c})$, $(n_2 \times w_{256c}, n_9 \times w_{256c})$, $(n_2 \times w_{256c}, -n_{16} \times w_{256c})$, $(n_2 \times w_{256c}, -n_{15} \times w_{256c})$, $(n_2 \times w_{256c}, -n_{14} \times w_{256c})$, $(n_2 \times w_{256c}, -n_{13} \times w_{256c})$, $(n_2 \times w_{256c}, -n_{12} \times w_{256c})$, $(n_2 \times w_{256c}, -n_{11} \times w_{256c})$, $(n_2 \times w_{256c}, -n_{10} \times w_{256c})$, $(n_2 \times w_{256c}, -n_9 \times w_{256c})$, $(n_1 \times w_{256c}, n_{16} \times w_{256c})$, $(n_1 \times w_{256c}, n_{15} \times w_{256c})$, $(n_1 \times w_{256c}, n_{14} \times w_{256c})$, $(n_1 \times w_{256c}, n_{13} \times w_{256c})$, $(n_1 \times w_{256c}, n_{12} \times w_{256c})$, $(n_1 \times w_{256c}, n_{11} \times w_{256c})$, $(n_1 \times w_{256c}, n_{10} \times w_{256c})$, $(n_1 \times w_{256c}, n_9 \times w_{256c})$, $(n_1 \times w_{256c}, -n_{16} \times w_{256c})$, $(n_1 \times w_{256c}, -n_{15} \times w_{256c})$, $(n_1 \times w_{256c}, -n_{14} \times w_{256c})$, $(n_1 \times w_{256c}, -n_{13} \times w_{256c})$, $(n_1 \times w_{256c}, -n_{12} \times w_{256c})$, $(n_1 \times w_{256c}, -n_{11} \times w_{256c})$, $(n_1 \times w_{256c}, -n_{10} \times w_{256c})$, $(n_1 \times w_{256c}, -n_9 \times w_{256c})$, $(-n_8 \times w_{256c}, n_{16} \times w_{256c})$, $(-n_8 \times w_{256c}, n_8 \times w_{256c})$, $(-n_8 \times w_{256c}, n_{14} \times w_{256c})$, $(-n_8 \times w_{256c}, n_{13} \times w_{256c})$, $(-n_8 \times w_{256c}, n_{12} \times w_{256c})$, $(-n_8 \times w_{256c}, n_{11} \times w_{256c})$, $(-n_8 \times w_{256c}, n_{10} \times w_{256c})$, $(-n_8 \times w_{256c}, n_9 \times w_{256c})$, $(-n_8 \times w_{256c}, -n_{16} \times w_{256c})$, $(-n_8 \times w_{256c}, -n_{15} \times w_{256c})$, $(-n_8 \times w_{256c}, -n_{14} \times w_{256c})$, $(-n_8 \times w_{256c}, -n_{13} \times w_{256c})$, $(-n_8 \times w_{256c}, -n_{12} \times w_{256c})$, $(-n_8 \times w_{256c}, -n_{11} \times w_{256c})$, $(-n_8 \times w_{256c}, -n_{10} \times w_{256c})$, $(-n_8 \times w_{256c}, -n_9 \times w_{256c})$, $(-n_7 \times w_{256c}, n_{16} \times w_{256c})$, $(-n_7 \times w_{256c}, n_{15} \times w_{256c})$, $(-n_7 \times w_{256c}, n_{14} \times w_{256c})$, $(-n_7 \times w_{256c}, n_{13} \times w_{256c})$, $(-n_7 \times w_{256c}, n_{12} \times w_{256c})$, $(-n_7 \times w_{256c}, n_{11} \times w_{256c})$, $(-n_7 \times w_{256c}, n_{10} \times w_{256c})$, $(-n_7 \times w_{256c}, n_9 \times w_{256c})$, $(-n_7 \times w_{256c}, -n_{16} \times w_{256c})$, $(-n_7 \times w_{256c}, -n_{15} \times w_{256c})$, $(-n_7 \times w_{256c}, -n_{14} \times w_{256c})$, $(-n_7 \times w_{256c}, -n_{13} \times w_{256c})$, $(-n_7 \times w_{256c}, -n_{12} \times w_{256c})$, $(-n_7 \times w_{256c}, -n_{11} \times w_{256c})$, $(-n_7 \times w_{256c}, -n_{10} \times w_{256c})$, $(-n_7 \times w_{256c}, -n_9 \times w_{256c})$, $(-n_6 \times w_{256c}, n_{16} \times w_{256c})$, $(-n_6 \times w_{256c}, n_{15} \times w_{256c})$, $(-n_6 \times w_{256c}, n_{14} \times w_{256c})$, $(-n_6 \times w_{256c}, n_{13} \times w_{256c})$, $(-n_6 \times w_{256c}, n_{12} \times w_{256c})$, $(-n_6 \times w_{256c}, n_{11} \times w_{256c})$, $(-n_6 \times w_{256c}, n_{10} \times w_{256c})$, $(-n_6 \times w_{256c}, n_9 \times w_{256c})$, $(-n_6 \times w_{256c}, -n_{16} \times w_{256c})$, $(-n_6 \times w_{256c}, -n_{15} \times w_{256c})$, $(-n_6 \times w_{256c}, -n_{14} \times w_{256c})$, $(-n_6 \times w_{256c}, -n_{13} \times w_{256c})$, $(-n_6 \times w_{256c}, -n_{12} \times w_{256c})$, $(-n_6 \times w_{256c}, -n_{11} \times w_{256c})$, $(-n_6 \times w_{256c}, -n_{10} \times w_{256c})$, $(-n_6 \times w_{256c}, -n_9 \times w_{256c})$, $(-n_5 \times w_{256c}, n_{16} \times w_{256c})$, $(-n_5 \times w_{256c}, n_{15} \times w_{256c})$, $(-n_5 \times w_{256c}, n_{14} \times w_{256c})$, $(-n_5 \times w_{256c}, n_{13} \times w_{256c})$, $(-n_5 \times w_{256c}, n_{12} \times w_{256c})$, $(-n_5 \times w_{256c}, n_{13} \times w_{256c})$, $(-n_5 \times w_{256c}, n_{10} \times w_{256c})$, $(-n_5 \times w_{256c}, n_9 \times w_{256c})$, $(-n_5 \times w_{256c}, -n_{16} \times w_{256c})$, $(-n_5 \times w_{256c}, -n_{15} \times w_{256c})$, $(-n_{15} \times w_{256c}, -n_{14} \times w_{256c})$, $(-n_5 \times w_{256c}, -n_{13} \times w_{256c})$, $(-n_5 \times w_{256c}, -n_{12} \times w_{256c})$, $(-n_5 \times w_{256c}, -n_{11} \times w_{256c})$, $(-n_5 \times w_{256c}, -n_{10} \times w_{256c})$, $(-n_5 \times w_{256c}, -n_9 \times w_{256c})$, $(-n_4 \times w_{256c}, n_{16} \times w_{256c})$, $(-n_4 \times w_{256c}, n_{15} \times w_{256c})$, $(-n_4 \times w_{256c}, n_{14} \times w_{256c})$, $(-n_4 \times w_{256c}, n_{13} \times w_{256c})$, $(-n_4 \times w_{256c}, n_{12} \times w_{256c})$, $(-n_4 \times w_{256c}, n_{11} \times w_{256c})$, $(-n_4 \times w_{256c}, n_{10} \times w_{256c})$, $(-n_4 \times w_{256c}, n_9 \times w_{256c})$, $(-n_4 \times w_{256c}, -n_{16} \times w_{256c})$, $(-n_4 \times w_{256c}, -n_{15} \times w_{256c})$, $(-n_4 \times w_{256c}, -n_{14} \times w_{256c})$, $(-n_4 \times w_{256c}, -n_{13} \times w_{256c})$, $(-n_4 \times w_{256c}, -n_{12} \times w_{256c})$, $(-n_4 \times w_{256c}, -n_{11} \times w_{256c})$, $(-n_4 \times w_{256c}, -n_{10} \times w_{256c})$, $(-n_4 \times w_{256c}, n_9 \times w_{256c})$, $(-n_3 \times w_{256c}, n_{16} \times w_{256c})$, $(-n_3 \times w_{256c}, n_{15} \times w_{256c})$, $(-n_3 \times w_{256c}, n_{14} \times w_{256c})$, $(-n_3 \times w_{256c}, n_{13} \times w_{256c})$, $(-n_3 \times w_{256c}, n_{12} \times w_{256c})$, $(-n_3 \times w_{256c}, n_{11} \times w_{256c})$, $(-n_3 \times w_{256c}, n_{10} \times w_{256c})$, $(-n_3 \times w_{256c}, n_9 \times w_{256c})$, $(-n_3 \times w_{256c}, -n_{16} \times w_{256c})$, $(-n_3 \times w_{256c}, -n_{15} \times w_{256c})$, $(-n_3 \times w_{256c}, -n_{14} \times w_{256c})$, $(-n_3 \times w_{256c}, -n_{13} \times w_{256c})$, $(-n_3 \times w_{256c}, -n_{12} \times w_{256c})$, $(-n_3 \times w_{256c}, -n_{11} \times w_{256c})$, $(-n_3 \times w_{256c}, -n_{10} \times w_{256c})$, $(-n_3 \times w_{256c}, n_{19} \times w_{256c})$, $(-n_2 \times w_{256c}, n_{16} \times w_{256c})$, $(-n_2 \times w_{256c}, n_{15} \times w_{256c})$, $(-n_2 \times w_{256c}, n_{14} \times w_{256c})$, $(-n_2 \times w_{256c}, n_{13} \times w_{256c})$, $(-n_2 \times w_{256c}, n_{12} \times w_{256c})$, $(-n_2 \times w_{256c}, n_{11} \times w_{256c})$, $(-n_2 \times w_{256c}, n_{10} \times w_{256c})$, $(-n_2 \times w_{256c}, n_9 \times w_{256c})$, $(-n_2 \times w_{256c}, -n_{16} \times w_{256c})$, $(-n_2 \times w_{256c}, -n_{15} \times w_{256c})$, $(-n_2 \times w_{256c}, -n_{14} \times w_{256c})$, $(-n_2 \times w_{256c}, -n_{13} \times w_{256c})$, $(-n_2 \times w_{256c}, -n_{12} \times w_{256c})$, $(-n_2 \times w_{256c}, -n_{11} \times w_{256c})$, $(-n_2 \times w_{256c}, -n_{10} \times w_{256c})$, $(-n_2 \times w_{256c}, -n_9 \times w_{256c})$, $(-n_1 \times w_{256c}, n_{16} \times w_{256c})$, $(-n_1 \times w_{256c}, n_{15} \times w_{256c})$, $(-n_1 \times w_{256c}, n_{14} \times w_{256c})$, $(-n_1 \times w_{256c}, n_{13} \times w_{256c})$, $(-n_1 \times w_{256c}, n_{12} \times w_{256c})$, $(-n_1 \times w_{256c}, n_{11} \times w_{256c})$, $(-n_1 \times w_{256c}, n_{10} \times w_{256c})$, $(-n_1 \times w_{256c}, n_9 \times w_{256c})$, $(-n_1 \times w_{256c}, -n_{16} \times w_{256c})$, $(-n_1 \times w_{256c}, -n_{15} \times w_{256c})$, $(-n_1 \times w_{256c}, -n_{14} \times w_{256c})$, $(-n_1 \times w_{256c}, -n_{13} \times w_{256c})$, $(-n_1 \times w_{256c}, -n_{12} \times w_{256c})$, $(-n_1 \times w_{256c}, -n_{11} \times w_{256c})$, $(-n_1 \times w_{256c}, -n_{10} \times w_{256c})$, $(-n_1 \times w_{256c}, -n_9 \times w_{256c})$.

Respective coordinates of the signal points ("○") immediately above the values 00000000 to 11111111 of the set of b0, b1, b2, b3, b4, b5, b6, and b7 in the I-Q plane serve as in-phase component I and quadrature component Q of the mapped baseband signal. The relationship between the set of b0, b1, b2, b3, b4, b5, b6, and b7 (00000000 to 11111111) and the signal point coordinates during 256QAM modulation is not limited to that in FIG. 121.

256 signal points in FIG. 121 are named as "signal point 1", "signal point 2", . . . , "signal point 255", and "signal point 256" (because of the presence of 256 signal points, "signal point 1" to "signal point 256" exist). In the I-Q plane, Di is a distance between "signal point i" and the origin. At this point, $w_{256c}$ is given by the following equation.

[Mathematical formula 373]

$$w_{256c} = \frac{z}{\sqrt{\frac{\sum_{i=1}^{256} D_i^2}{256}}} \tag{H9}$$

Therefore, the mapped baseband signal has an average power of $z_2$. The effect is described later.

The effect of the use of QAM will be described below.

First, the configurations of the transmitter and receiver will be described.

FIG. 117 illustrates a configuration example of the transmitter. Information 11701 is input to error correction encoder 11702, and error correction encoder 11702 performs the error correction coding on the LDPC code or a turbo code, and outputs error-correction-coded data 11703.

Error-correction-coded data 11703 is input to interleaver 11704, and interleaver 11704 performs the data rearrangement, and outputs the interleaved data 11705.

Interleaved data 11705 is input to mapper 11706, and mapper 11706 performs the mapping based on the modulation scheme set with the transmitter, and outputs quadrature baseband signal (in-phase component I and quadrature component Q) 11707.

Quadrature baseband signal 11707 is input to radio section 11708, and radio section 11708 performs the pieces of processing such as the quadrature modulation, the frequency conversion, and the amplification, and outputs transmitted signal 11709.

Transmitted signal 11709 is output as a radio wave from antenna 11710.

FIG. 118 illustrates an example of the configuration of the receiver that receives the modulated signal transmitted from the transmitter in FIG. 117.

Received signal 11802 received with antenna 11801 is input to radio section 11803, and radio section 11803 performs the pieces of processing such as the frequency conversion and the quadrature demodulation, and outputs quadrature baseband signal 11804.

Quadrature baseband signal 11804 is input to demapper 11805, and demapper 11805 performs the frequency offset estimation and removal and the estimation of the channel variation (transmission path variation), estimates each bit of the data symbol, for example, the log-likelihood ratio, and outputs log-likelihood ratio signal 11806.

Log-likelihood ratio signal 11806 is input to deinterleaver 11807, and deinterleaver 11807 performs the rearrangement, and outputs deinterleaved log-likelihood ratio signal 11808.

Deinterleaved log-likelihood ratio signal 11808 is input to decoder 11809, and decoder 11809 decodes the error correction code, and outputs received data 11810.

The effect will be described below with 16QAM as an example. The following two cases (<16QAM #3> and <16QAM #4>) are compared to each other.

<16QAM #3>16QAM #1 is 16QAM described in (Supplement 2), and FIG. 111 illustrates the arrangement of the signal points in the I-Q plane.

<16QAM #4> FIG. 119 illustrates the arrangement of the signal points in the I-Q plane, and $k_1>0$ ($k_1$ is a real number larger than 0), $k_2>0$ ($k_2$ is a real number larger than 0), $k_1\neq1$, $k_2\neq1$, and $k_1\neq k_2$ hold as described above.

As described above, four bits of b0, b1, b2, and b3 are transmitted in 16QAM. For <16QAM #3>, in the receiver, the four bits are divided into two high-quality bits and two low-quality bits in the case that the log-likelihood ratio of each bit is obtained. On the other hand, for <16QAM #4>, depending on the conditions of $k_1>0$ ($k_1$ is a real number larger than 0) and $k_2>0$ ($k_2$ is a real number larger than 0), $k_1\neq1$, $k_2\neq1$, and $k_1\neq k_2$, the four bits are divided into one high-quality bit, two intermediate-quality bits, and one low-quality bit. Thus, the quality distribution of the 4 bits depends on the <16QAM #3> and <16QAM #4>. At this point, in the case that decoder 11809 in FIG. 118 decodes the error correction code, depending on the error correction code used, the receiver has a higher possibility of obtaining the high data reception quality using <16QAM #4>.

In the case that the arrangement of the signal points are arranged in the I-Q plane as illustrated in FIG. 120 for 64QAM, similarly the receiver has the higher possibility of obtaining the high data reception quality. At this point, as described above, it is assumed that "$m_1>0$ ($m_1$ is a real number larger than 0) and $m_2>0$ ($m_2$ is a real number larger than 0) and $m_3>0$ ($m_3$ is a real number larger than 0) and $m_4>0$ ($m_4$ is a real number larger than 0) and $m_5>0$ ($m_5$ is a real number larger than 0) and $m_6>0$ ($m_6$ is a real number larger than 0) and $m_7>0$ ($m_7$ is a real number larger than 0) and $m_8>0$ ($m_8$ is a real number larger than 0), and $\{m_1\neq m_2$ and $m_1\neq m_3$ and $m_1\neq m_4$ and $m_2\neq m_3$ and $m_2\neq m_4$ and $m_3\neq m_4\}$ and $\{m_5\neq m_6$ and $m_5\neq m_7$ and $m_5\neq m_8$ and $m_6\neq m_7$ and $m_6\neq m_8$ and $m_7\neq m_8\}$ and $\{m_1\neq m_5$ or $m_2\neq m_6$ or $m_3\neq m_7$ or $m_4\neq m_8$ holds$\}$ hold."

or that "$m_1>0$ ($m_1$ is a real number larger than 0) and $m_2>0$ ($m_2$ is a real number larger than 0) and $m_3>0$ ($m_3$ is a real number larger than 0) and $m_4>0$ ($m_4$ is a real number larger than 0) and $m_5>0$ ($m_5$ is a real number larger than 0) and $m_6>0$ ($m_6$ is a real number larger than 0) and $m_7>0$ ($m_7$ is a real number larger than 0) and $m_8>0$ ($m_8$ is a real number larger than 0), and $\{m_1\neq m_2$ and $m_1\neq m_3$ and $m_1\neq m_4$ and $m_2\neq m_3$ and $m_2\neq m_4$ and $m_3\neq m_4\}$ and $\{m_5+m_6$ and $m_5\neq m_7$ and $m_5\neq m_8$ and $m_6\neq m_7$ and $m_6\neq m_8$ and $m_7\neq m_8\}$ and $\{m_1\neq m_5$ or $m_2\neq m_6$ or $m_3\neq m_7$ or $m_4\neq m_8$ holds$\}$ and $\{m_1=m_5$ or $m_2=m_6$ or $m_3=m_7$ or $m_4=m_8$ holds$\}$hold", which necessary point differs from that in the arrangement of the signal points of (Supplement 2).

Similarly, in the case that the arrangement of the signal points are arranged in the I-Q plane as illustrated in FIG. 121 for 256QAM, similarly the receiver has the higher possibility of obtaining the high data reception quality. At this point, as described above, it is assumed that "$n_1>0$ ($n_1$ is a real number larger than 0) and $n_2>0$ ($n_2$ is a real number larger than 0) and $n_3>0$ ($n_3$ is a real number larger than 0) and $n_4>0$ ($n_4$ is a real number larger than 0) and $n_5>0$ ($n_6$ is a real number larger than 0) and $n_7>0$ ($n_7$ is a real number larger than 0) and $n_5>0$ ($n_5$ is a real number larger than 0)

and $n_9>0$ ($n_9$ is a real number larger than 0) and $n_{10}>0$ ($n_{10}$ is a real number larger than 0) and $n_{11}>0$ ($n_{11}$ is a real number larger than 0) and $n_{12}>0$ ($n_{12}$ is a real number larger than 0) and $n_{13}>0$ ($n_{13}$ is a real number larger than 0) and $n_{14}>0$ ($n_{14}$ is a real number larger than 0) and $n_{15}>0$ ($n_{15}$ is a real number larger than 0) and $n_{16}>0$ ($n_{16}$ is a real number larger than 0), and $\{n_1\neq n_2$ and $n_1\neq n_3$ and $n_1\neq n_4$ and $n_1\neq n_5$ and $n_1\neq n_6$ and $n_1\neq n_7$ and $n_1\neq n_8$ and $n_2\neq n_3$ and $n_2\neq n_4$ and $n_2\neq n_5$ and $n_2\neq n_6$ and $n_2\neq n_7$ and $n_2\neq n_8$ and $n_3\neq n_4$ and $n_3\neq n_5$ and $n_3\neq n_6$ and $n_3\neq n_7$ and $n_3\neq n_8$ and $n_4\neq n_5$ and $n_4\neq n_6$ and $n_4\neq n_7$ and $n_4\neq n_8$ and $n_5\neq n_6$ and $n_5\neq n_7$ and $n_5+n_8$ and $n_6\neq n_7$ and $n_6\neq n_8$ and $n_7\neq n_8\}$ and $\{n_9\neq n_{10}$ and $n_9\neq n_{11}$ and $n_9\neq n_{12}$ and $n_9\neq n_{13}$ and $n_9\neq n_{14}$ and $n_9\neq n_{15}$ and $n_9\neq n_{16}$ and $n_{10}\neq n_{11}$ and $n_{10}\neq n_{12}$ and $n_{10}\neq n_{13}$ and $n_{10}\neq n_{14}$ and $n_{10}\neq n_{15}$ and $n_{10}\neq n_{16}$ and $n_{11}\neq n_{12}$ and $n_{11}\neq n_{13}$ and $n_{11}\neq n_{14}$ and $n_{11}\neq n_{15}$ and $n_{11}\neq n_{16}$ and $n_{12}\neq n_{13}$ and $n_{12}\neq n_{14}$ and $n_{12}\neq n_{15}$ and $n_{12}\neq n_{16}$ and $n_{13}\neq n_{14}$ and $n_{13}\neq n_{15}$ and $n_{13}\neq n_{16}$ and $n_{14}\neq n_{15}$ and $n_{14}\neq n_{16}$ and $n_{15}\neq n_{16}\}$ and $\{n_1\neq n_9$ or $n_2\neq n_{10}$ or $n_3\neq n_{11}$ or $n_4\neq n_{12}$ or $n_5\neq n_{13}$ or $n_6\neq n_{14}$ or $n_7\neq n_{15}$ or $n_8\neq n_{16}$ holds$\}$hold."

or that "$n_1>0$ ($n_1$ is a real number larger than 0) and $n_2>0$ ($n_2$ is a real number larger than 0) and $n_3>0$ ($n_3$ is a real number larger than 0) and $n_4>0$ ($n_4$ is a real number larger than 0)

and $n_5>0$ ($n_6$ is a real number larger than 0) and $n_7>0$ ($n_7$ is a real number larger than 0) and $n_8>0$ ($n_8$ is a real number larger than 0)

and $n_{9>0}$ ($n_9$ is a real number larger than 0) and $n_{10}>0$ ($n_{10}$ is a real number larger than 0) and $n_{11}>0$ ($n_{11}$ is a real number larger than 0) and $n_{12}>0$ ($n_{12}$ is a real number larger than 250) and $n_{13}>0$ ($n_{13}$ is a real number larger than 0) and $n_{14}>0$ ($n_{14}$ is a real number larger than 0) and $n_{15}>0$ ($n_{15}$ is a real number larger than 0) and $n_{16}>0$ ($n_{16}$ is a real number larger than 0), and $\{n_1 \neq n_2$ and $n_1 \neq n_3$ and $n_1 \neq n_4$ and $n_1 \neq n_5$ and $n_1 \neq n_6$ and $n_1 \neq n_7$ and $n_1 \neq n_5$ and $n_2 \neq n_3$ and $n_2 \neq n_4$ and $n_2 \neq n_5$ and $n_2 \neq n_6$ and $n_2 \neq n_7$ and $n_2 \neq n_5$ and $n_3 \neq n_4$ and $n_3 \neq n_5$ and $n_3 \neq n_6$ and $n_3 \neq n_7$ and $n_3 \neq n_8$ and $n_4 \neq n_5$ and $n_4 \neq n_6$ and $n_4 \neq n_7$ and $n_4 \neq n_8$ and $n_5 \neq n_6$ and $n_5 \neq n_7$ and $n_5 \neq n_8$ and $n_6 \neq n_7$ and $n_6 \neq n_8$ and $n_7 \neq n_8\}$ and $\{n_9 \neq n_{10}$ and $n_9 \neq n_{11}$ and $n_9 \neq n_{12}$ and $n_9 \neq n_{13}$ and $n_9 \neq n_{14}$ and $n_9 \neq n_{15}$ and $n_9 \neq n_{16}$ and $n_{10} \neq n_{11}$ and $n_{10} \neq n_{12}$ and $n_{10} \neq n_{13}$ and $n_{10} \neq n_{14}$ and $n_{10} \neq n_{15}$ and $n_{10} \neq n_{16}$ and $n_{11} \neq n_{12}$ and $n_{11} \neq n_{13}$ and $n_{11} \neq n_{14}$ and $n_{11} \neq n_{15}$ and $n_{11} \neq n_{16}$ and $n_{12} \neq n_{13}$ and $n_{12} \neq n_{14}$ and $n_{12} \neq n_{15}$ and $n_{12} \neq n_{16}$ and $n_{13} \neq n_{14}$ and $n_{13} \neq n_{15}$ and $n_{13} \neq n_{16}$ and $n_{14} \neq n_{15}$ and $n_{14} \neq n_{16}$ and $n_{15} \neq n_{16}\}$ and $\{n_1 \neq n_9$ or $n_2 \neq n_{10}$ or $n_3 \neq n_{11}$ or $n_4 \neq n_{12}$ or $n_5 \neq n_{13}$ or $n_6 \neq n_{14}$ or $n_7 \neq n_{15}$ or $n_8 \neq n_{16}$ holds$\}$ and $\{n_1 = n_9$ or $n_2 = n_{10}$ or $n_3 = n_{11}$ or $n_4 = n_{12}$ or $n_5 = n_{13}$ or $n_6 = n_{14}$ or $n_7 = n_{15}$ or $n_8 = n_{16}$ holds$\}$hold.", which necessary point differs from that in the arrangement of the signal points of (Supplement 2).

Although the detailed configuration is not illustrated in FIGS. 117 and 118, similarly the modulated signal can be transmitted and received using the OFDM scheme and spectral spread communication scheme, which are described in another exemplary embodiment.

In the MIMO transmission scheme, the space-time codes such as the space-time block code (however, the symbol mat be arranged on the frequency axis), and the MIMO transmission scheme in which the precoding is performed or not performed, which are described in the first to twelfth exemplary embodiments, there is a possibility of improving the data reception quality even if 16QAM, 64QAM, and 256QAM are used.

(Supplement 5)

A configuration example of a communication and broadcasting system in which QAM of (Supplement 2), (Supplement 3), and (Supplement 4) is used will be described below.

Figure 122:
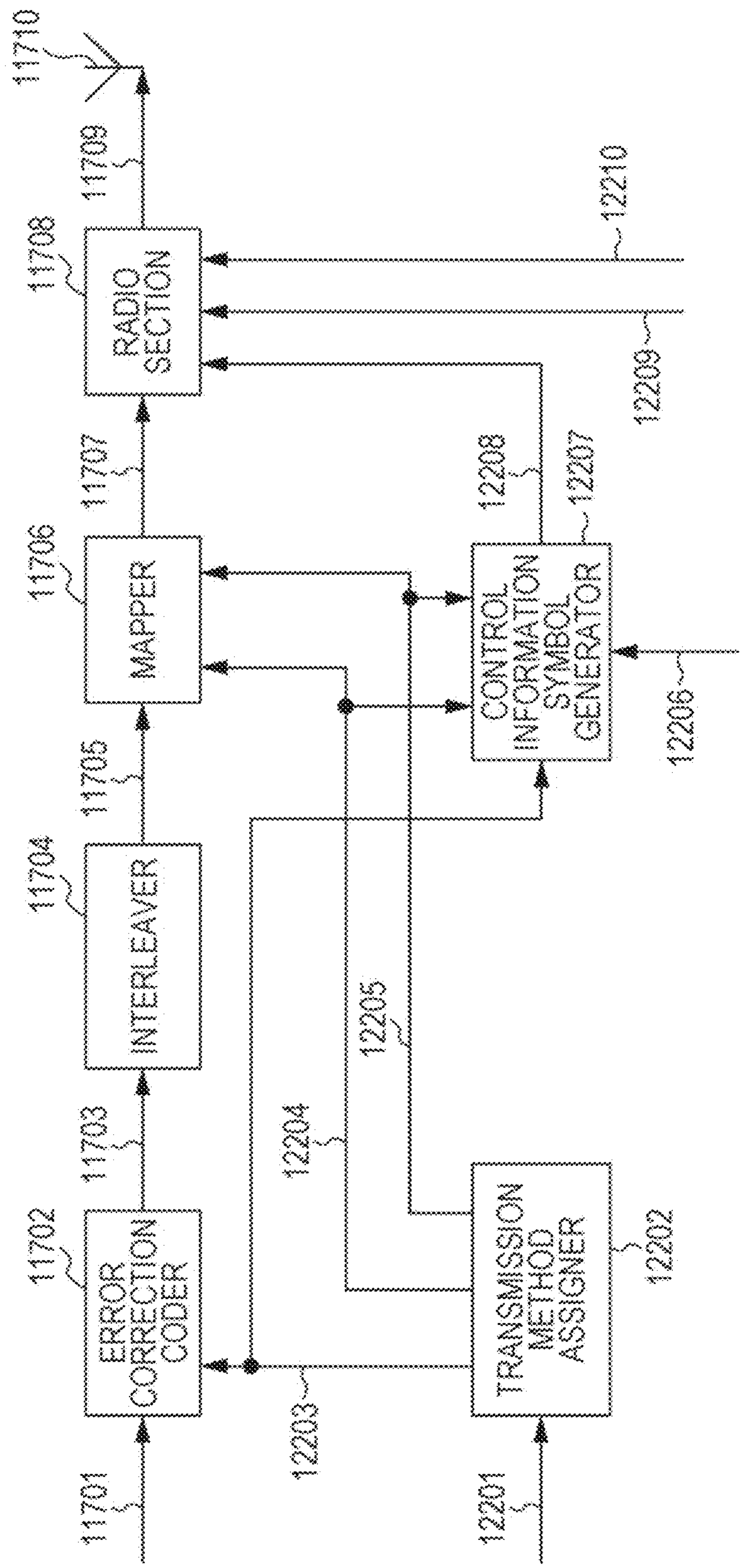

FIG. 122 illustrates an example of the transmitter. In FIG. 122, the component similarly to that in FIG. 117 is designated by the identical reference mark.

Input signal 12201 is input to transmission method assigner 12202, and transmission method assigner 12202 outputs information signal 12203 associated with the error correction code (for example, the coding rate of the error correction code and the block length of the error correction code), information signal 12204 associated with the modulation scheme (for example, the modulation scheme), and information signal 12205 of the parameter associated with the modulation scheme (for example, information about an amplitude in QAM) in order to generate the data symbol based on based on input signal 12201. A user who uses the transmitter may generate input signal 12201, and feedback information about a communication partner communication may be used as input signal 12201 when input signal 12201 is use in the communication system.

Information 11701 and information signal 12203 associated with the error correction code are input to error correction encoder 11702, and error correction encoder 11702 performs the error correction coding based on information signal 12203 associated with the error correction code, and outputs error-correction-coded data 11703.

Interleaved data 11705, information signal 12204 associated with the modulation scheme, and information signal 12205 of the parameter associated with the modulation scheme are input to mapper 11706, and mapper 11706 performs the mapping based on information signal 12204 associated with the modulation scheme and information signal 12205 of the parameter associated with the modulation scheme, and outputs quadrature baseband signal 11707.

Information signal 12203 associated with the error correction code, information signal 12204 associated with the modulation scheme, information signal 12205 of the parameter associated with the modulation scheme, and control data 12206 are input to control information symbol generator 12207, and control information symbol generator 12207 performs the error correction coding and the BPSK or QPSK modulation, and outputs control information symbol signal 12208.

Figure 123:
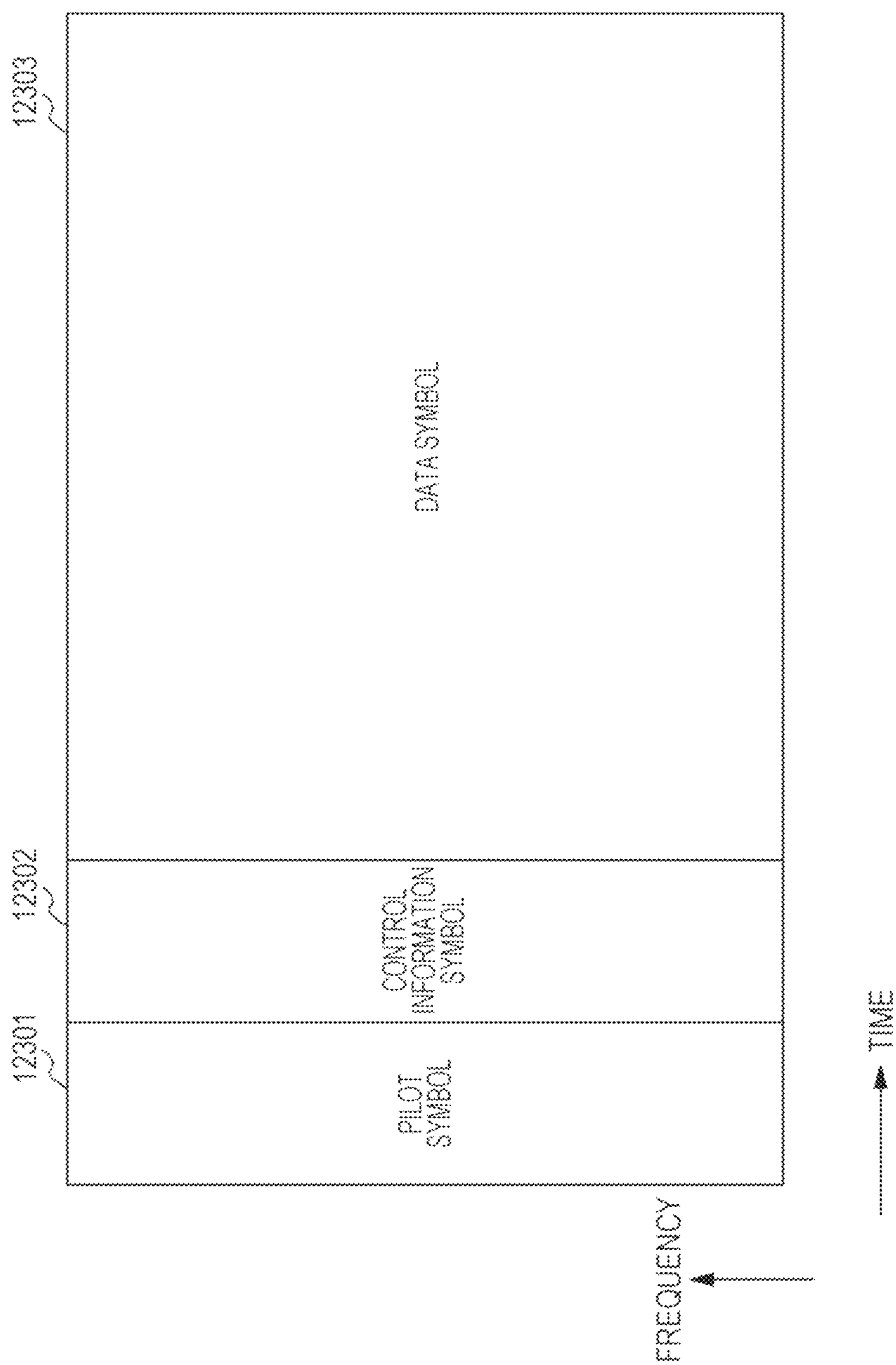

Quadrature baseband signal 11707, control symbol signal 12208, pilot symbol signal 12209, and frame configuration signal 12210 are input to radio section 11708, and radio section 11708 outputs transmitted signal 11709 based on frame configuration signal 12210. FIG. 123 illustrates an example of the frame configuration.

In the frame configuration of FIG. 123, a vertical axis indicates the frequency and a horizontal axis indicates the time. In FIG. 123, reference mark 12301 designates the pilot symbol, reference mark 12302 designates the control information symbol, and reference mark 12303 designates the data symbol. Pilot symbol 12301 corresponds to pilot symbol signal 12209 in FIG. 122, control information symbol 12302 corresponds to control information symbol signal 12208 in FIG. 122, and data symbol 12303 corresponds to quadrature baseband signal 11707 in FIG. 122.

Figure 124:
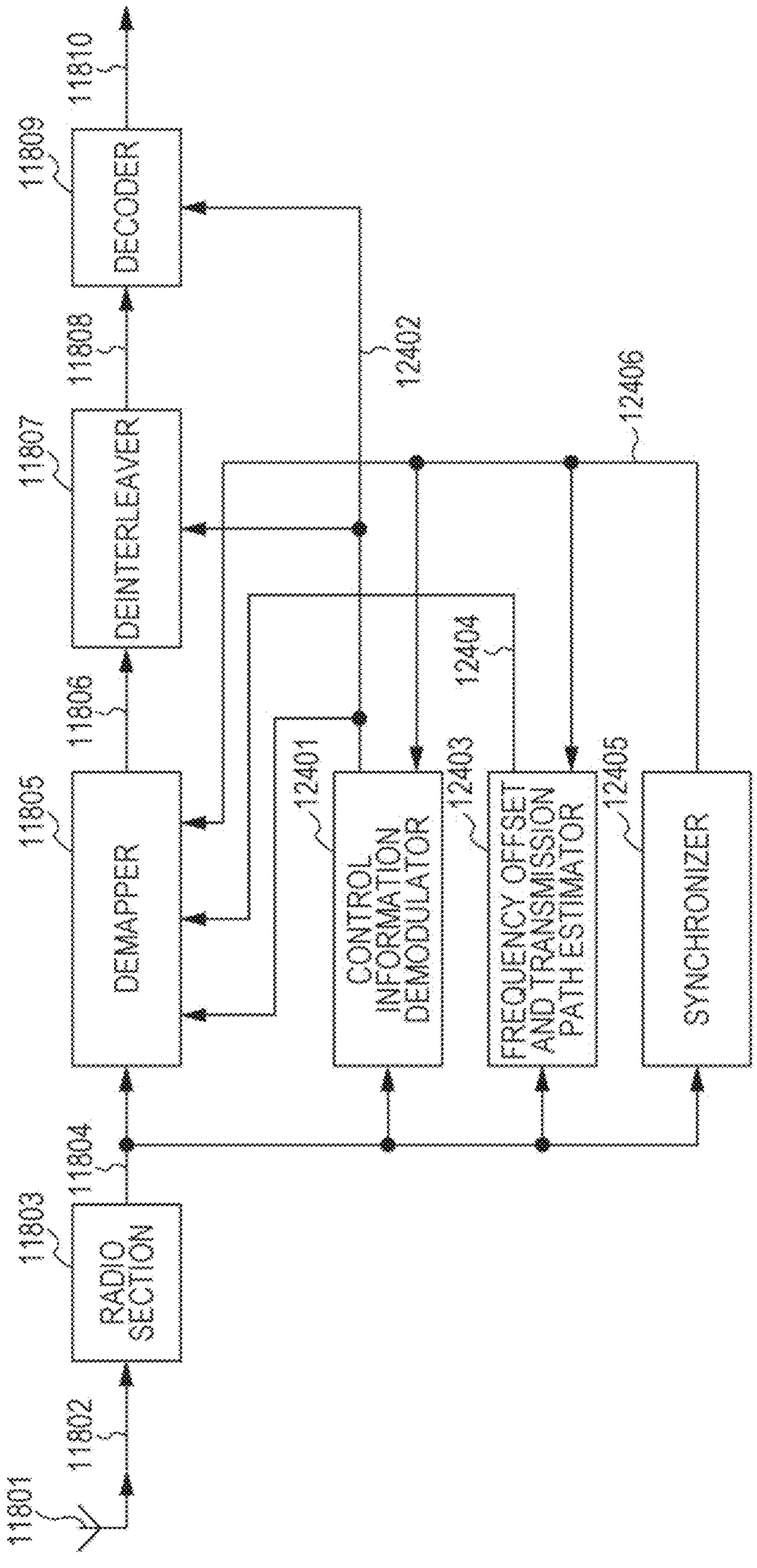

FIG. 124 illustrates an example of the receiver that receives the modulated signal transmitted from the transmitter in FIG. 122. In FIG. 124, the component similarly to that in FIG. 118 is designated by the identical reference mark.

Quadrature baseband signal 11804 is input to synchronizer 12405, and synchronizer 12405 performs the frequency synchronization, the time synchronization, and the frame synchronization by detecting and using pilot symbol 12301 in FIG. 123, and outputs synchronization signal 12406.

Quadrature baseband signal 11804 and synchronization signal 12406 are input to control information demodulator 12401, and control information demodulator 12401 demodulates control information symbol 12302 in FIG. 123 (and the error correction decoding), and outputs control information signal 12402.

Quadrature baseband signal 11804 and synchronization signal 12406 are input to frequency offset and transmission path estimator 12403, and frequency offset and transmission path estimator 12403 estimates a frequency offset and a transmission path variation caused by a current using pilot symbol 12301 in FIG. 123, and outputs frequency offset and transmission path variation estimated signal 12404.

Quadrature baseband signal 11804, control information signal 12402, frequency offset and transmission path variation estimated signal 12404, and synchronization signal 12406 are input to demapper 11805, and demapper 11805 determines the modulation scheme of data symbol 12303 in FIG. 123 using control information signal 12402, obtains the log-likelihood ratio of each bit in the data symbol using quadrature baseband signal 12403 and frequency offset and transmission path variation estimated signal 12404, and outputs log-likelihood ratio signal 11806.

Log-likelihood ratio signal 11808 and control information signal 12402 are input to deinterleaver 11807, and deinterleaver 11807 performs processing for the deinterleaving method corresponding to the interleaving method used in the transmitter from the information about the transmission method, such as the modulation scheme and the error correction coding scheme, which is included in control information signal 12402, and outputs deinterleaved log-likelihood ratio signal 11808.

Deinterleaved log-likelihood ratio signal 11808 and control information signal 12402 are input to decoder 11809, and decoder 11809 performs the error correction decoding from the error correction coding scheme included in the control information, and outputs received data 11810.

Examples in which QAM of (Supplement 2), (Supplement 3), and (Supplement 4) is used will be described below.

Example 1

It is assumed that the transmitter in FIG. 122 can transmit the plurality of block lengths (code lengths) as the error correction code.

For example, it is assumed that the transmitter in FIG. 122 selects one of the error correction coding with the LDPC (block) code having the block length (code length) of 16200 bits and the error correction coding with the LDPC (block) code having the block length (code length) 64800 bits to performs the error correction code. Accordingly, the following two error correction schemes are considered.

<Error Correction Scheme #1>

The coding is performed using the LDPC (block) code having the coding rate of ⅔ and the block length (code length) 16200 bits (information: 10800 bits and parity: 5400 bits).

<Error Correction Scheme #2>

The coding is performed using the LDPC (block) code having the coding rate of ⅔ and the block length (code length) 64800 bits (information: 43200 bits and parity: 21600 bits).

It is assumed that 16QAM in FIG. 111 is used in the transmitter in FIG. 122. At this point, the transmitter in FIG. 122 sets $f=f_{\#1}$ in FIG. 111 using <error correction scheme #1>, and sets $f=f_{\#2}$ in FIG. 111 using <error correction scheme #2>. At this point, <Condition #H1>

$f_{\#1}\neq 1$ and $f_{\#2}\neq 1$ and $f_{\#1}\neq f_{\#2}$ preferably hold. Therefore, the receiver has a higher possibility of obtaining the high data reception quality in both <error correction scheme #1> and <error correction scheme #2> (because <error correction scheme #1> differs from <error correction scheme #2> in a suitable value of f).

It is assumed that 64QAM in FIG. 112 is used in the transmitter in FIG. 122. At this point, the transmitter in FIG. 122 sets $g_1=g_{1,\#1}$, $g_2=g_{2,\#1}$, and $g_3=g_{3,\#1}$ in FIG. 112 using <error correction scheme #1>, and sets $g_1=g_{1,\#2}$, $g_2=g_{2,\#2}$, and $g_3=g_{3,\#2}$ in FIG. 112 using <error correction scheme #2>. Therefore, the following condition preferably holds.

<Condition #H2>

$\{(g_{1,\#1},g_{2,\#1},g_{3,\#1})\neq(1,3,5)$ and $(g_{1},\#_{1},g_{2,\#1},g_{3,\#1})\neq(1,5,3)$ and $(g_{1,\#1},g_{2,\#1},g_{3,\#1})\neq(3,1,5)$ and $(g_{1,\#1},g_{2,\#1},g_{3,\#1})+(3,5,1)$ and $(g_{1,\#1},g_{2,\#1},g_{3,\#1})+(5,1,3)$ and $(g_{1,\#1},g_{2,\#1},g_{3,\#1})+(5,3,1)\}$ and $\{(g_{1,\#2},g_{2,\#2},g_{3,\#2})+(1,3,5)$ and $(g_{1,\#2},g_{2,\#2},g_{3,\#2})\neq(1,5,3)$ and $(g_{1,\#2},g_{2,\#2},g_{3,\#2})\neq(3,1,5)$ and $(g_{1,\#2},g_{2,\#2},g_{3,\#2})\neq(3,5,1)$ and $(g_{1,\#2},g_{2,\#2},g_{3,\#2})\neq(5,1,3)$ and $(g_{1,\#2},g_{2,\#2},g_{3,\#2})\neq(5,3,1)\}$ and $\{\{g_{1,\#1}\neq g_{1,\#2}$ or $g_{2,\#1}\neq g_{2,\#2}$ or $g_{3,\#1}\neq g_{3,\#2}\}$ holds$\}$ hold.

Therefore, the receiver has a higher possibility of obtaining the high data reception quality in both <error correction scheme #1> and <error correction scheme #2> (because <error correction scheme #1> differs from <error correction scheme #2> in a suitable set of $g_1$, $g_2$, and $g_3$).

It is assumed that 256QAM in FIG. 113 is used in the transmitter in FIG. 122. At this point, the transmitter in FIG. 122 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ in FIG. 113 using <error correction scheme #1>, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ in FIG. 113 using <error correction scheme #2>. Therefore, the following condition preferably holds.

<Condition #H3>

{When {a1 is an integer from 1 to 7 and a2 is an integer from 1 to 7 and a3 is an integer from 1 to 7 and a4 is an integer from 1 to 7 and a5 is an integer from 1 to 7 and a6 is an integer from 1 to 7 and a7 is an integer from 1 to 7} and {x is an integer from 1 to 7 and y is an integer from 1 to 7 and x≠y} and {ax≠ay holds for all values x and y} hold, $(h_{a1,\#1}, h_{a2,\#1}, h_{a3,\#1}, h_{a4,\#1}, h_{a5,\#1}, h_{a6,\#1}, h_{a7,\#1})+(1,3,5,7,9,11,13)$ holds}, and {when {a1 is an integer from 1 to 7 and a2 is an integer from 1 to 7 and a3 is an integer from 1 to 7 and a4 is an integer from 1 to 7 and a5 is an integer from 1 to 7 and a6 is an integer from 1 to 7 and a7 is an integer from 1 to 7} and {x is an integer from 1 to 7 and y is an integer from 1 to 7 and x≠y} and {ax≠ay holds for all values x and y} hold, $(h_{a1,\#2}, h_{a2,\#2}, h_{a3,\#2}, h_{a4,\#2}, h_{a5,\#2}, h_{a6,\#2}, h_{a7,\#2})+(1,3,5,7,9,11,13)$ holds} and $\{\{h_{1,\#1}\neq h_{1,\#2}$ or $h_{2,\#1}\neq h_{2,\#2}$ or $h_{3,\#1}\neq h_{3,\#2}$ or $h_{4,\#1}\neq h_{4,\#2}$ or $h_{5,\#1}\neq h_{5,\#2}$ or $h_{6,\#1}\neq h_{6,\#2}$ or $h_{7,\#1}\neq h_{7,\#2}\}$ holds$\}$ hold.

Therefore, the receiver has a higher possibility of obtaining the high data reception quality in both <error correction scheme #1> and <error correction scheme #2> (because <error correction scheme #1> differs from <error correction scheme #2> in a suitable set of $h_1$, $h_2$, $h_3$, $h_4$, $h_5$, $h_6$, and $h_7$).

The following is a summary of the above.

The following two error correction schemes are considered.

<Error Correction Scheme #1*>

The coding is performed using the block code having coding rate A and the block length (code length) of B bits (A is a real number, $0<A<1$ holds, and B is an integer larger than 0).

<Error Correction Scheme #2*>

The coding is performed using the block code having coding rate A and the block length (code length) of C bits (A is a real number, $0<A<1$ holds, C is an integer larger than 0, and B≠C holds).

It is assumed that 16QAM in FIG. 111 is used in the transmitter in FIG. 122. At this point, the transmitter in FIG. 122 sets $f=f_{\#1}$ in FIG. 111 using <error correction scheme #1*>, and sets $f=f_{\#2}$ in FIG. 111 using <error correction scheme #2*>. At this point, <Condition #H1> preferably holds.

It is assumed that 64QAM in FIG. 112 is used in the transmitter in FIG. 122. At this point, the transmitter in FIG. 122 sets $g_1=g_{1,\#1}$, $g_2=g_{2,\#1}$, and $g_3=g_{3,\#1}$ in FIG. 112 using <error correction scheme #1*>, and sets $g_1=g_{1,\#2}$, $g_2=g_{2,\#2}$, and $g_3=g_{3,\#2}$ in FIG. 112 using <error correction scheme #2*>. At this point, <Condition #H2> preferably holds.

It is assumed that 256QAM in FIG. 113 is used in the transmitter in FIG. 122. At this point, the transmitter in FIG. 122 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ in FIG. 113 using <error correction scheme #1*>, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ in FIG. 112 using <error correction scheme #2*>. At this point, <Condition #H3> preferably holds.

Example 2

It is assumed that the transmitter in FIG. 122 can transmit the plurality of block lengths (code lengths) as the error correction code.

<Error Correction Scheme #4>

The coding is performed using the LDPC (block) code having the coding rate of ⅔ and the block length (code length) 64800 bits (information: 43200 bits and parity: 21600 bits).

It is assumed that 16QAM in FIG. 114 is used in the transmitter in FIG. 122. At this point, the transmitter in FIG. 122 sets $f_1=f_{1,\#1}$ and $f_2=f_{2,\#1}$ in FIG. 114 using <error correction scheme #3>, and sets $f_1=f_{1,\#2}$ and $f_2=f_{2,\#2}$ in FIG. 114 using <error correction scheme #4>. At this point, <Condition #H4>

$\{f_{1,\#1}+f_{1,\#2}$ or $f_{2,\#1}\neq f_{2,\#2}\}$ preferably holds. Therefore, the receiver has a higher possibility of obtaining the high data reception quality in both <error correction scheme #1> and <error correction scheme #3> (because <error correction scheme #3> differs from <error correction scheme #4> in a suitable set of $f_1$ and $f_2$).

It is assumed that 64QAM in FIG. 115 is used in the transmitter in FIG. 122. At this point, the transmitter in FIG. 122 sets $g_1=g_{1,\#1}$, $g_2=g_{2,\#1}$, $g_3=g_{3,\#1}$, $g_4=g_{4,\#1}$, $g_5=g_{5,\#1}$, and $g_6=g_{6,\#1}$ in FIG. 115 using <error correction scheme #3>, and sets $g_1=g_{1,\#2}$, $g_2=g_{2,\#2}$, $g_3=g_{3,\#2}$, $g_4=g_{4,\#2}$, $g_5=g_{5,\#2}$, and $g_6=g_{6,\#2}$ in FIG. 115 using <error correction scheme #4>. Therefore, the following condition preferably holds.

<Condition #H5>

{
{{$g_{1,\#1}\neq g_{1,\#2}$ and $g_{1,\#1}\neq g_{2,\#2}$ and $g_{1,\#1}\neq g_{3,\#2}$} or {$g_{2,\#1}\neq g_{1,\#2}$ and $g_{2,\#1}\neq g_{2,\#2}$ and $g_{2,\#1}\neq g_{3,\#2}$} or {$g_{3,\#1}\neq g_{1,\#2}$ and $g_{3,\#1}\neq g_{2,\#2}$ and $g_{3,\#1}\neq g_{3,\#2}$} holds}
or
{{$g_{4,\#1}\neq g_{4,\#2}$ and $g_{4,\#1}\neq g_{5,\#2}$ and $g_{4,\#1}\neq g_{6,\#2}$} or {$g_{5,\#1}\neq g_{4,\#2}$ and $g_{5,\#1}\neq g_{5,\#2}$ and $g_{5,\#1}\neq g_{6,\#2}$} or {$g_{6,\#1}\neq g_{4,\#2}$ and $g_{6,\#1}\neq g_{5,\#2}$ and $g_{6,\#1}\neq g_{6,\#2}$} holds}
}
holds.

For example, it is assumed that the transmitter in FIG. 122 selects one of the error correction coding with the LDPC (block) code having the block length (code length) of 16200 bits and the error correction coding with the LDPC (block) code having the block length (code length) 64800 bits to performs the error correction code. Accordingly, the following two error correction schemes are considered.

<Error Correction Scheme #3>

The coding is performed using the LDPC (block) code having the coding rate of ⅔ and the block length (code length) 16200 bits (information: 10800 bits and parity: 5400 bits).

Therefore, the receiver has a higher possibility of obtaining the high data reception quality in both <error correction scheme #3> and <error correction scheme #4> (because <error correction scheme #3> differs from <error correction scheme #4> in a suitable set of $g_1$, $g_2$, $g_3$, $g_4$, $g_5$, and $g_6$).

It is assumed that 256QAM in FIG. 116 is used in the transmitter in FIG. 122. At this point, the transmitter in FIG. 122 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, $h_7=h_{7,\#1}$, $h_8=h_{8,\#1}$, $h_9=h_{9,\#1}$, $h_{10}=h_{10,\#1}$, $h_{11}=h_{11,\#1}$, $h_{12}=h_{12,\#1}$, $h_{13}=h_{13,\#1}$, and $h_{14}=h_{14,\#1}$ in FIG. 116 using <error correction scheme #3>, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, $h_7=h_{7,\#2}$, $h_8=h_{8,\#2}$, $h_9=h_{9,\#2}$, $h_{10}=h_{10,\#2}$, $h_{11}=h_{11,\#2}$, $h_{12}=h_{12,\#2}$, $h_{13}=h_{13,\#2}$, and $h_{14}=h_{14,\#2}$ in FIG. 116 using <error correction scheme #4>. Therefore, the following condition preferably holds.

<Condition #H6>

{
{k is an integer from 1 to 7, and $h_{1,\#1}\neq h_{k,\#2}$ holds for all the value of k}
or {k is an integer from 1 to 7, and $h_{2,\#1}\neq h_{k,\#2}$ holds for all the value of k}
or {k is an integer from 1 to 7, and $h_{3,\#1}\neq h_{k,\#2}$ holds for all the value of k}
or {k is an integer from 1 to 7, and $h_{4,\#1}\neq h_{k,\#2}$ holds for all the value of k}
or {k is an integer from 1 to 7, and $h_{5,\#1}\neq h_{k,\#2}$ holds for all the value of k}
or {k is an integer from 1 to 7, and $h_{6,\#1}\neq h_{k,\#2}$ holds for all the value of k}
or {k is an integer from 1 to 7, and $h_{7,\#1}\neq h_{k,\#2}$ holds for all the value of k}
}
or
{
{k is an integer from 8 to 14, and $h_{8,\#1}\neq h_{k,\#2}$ holds for all the value of k}
or {k is an integer from 8 to 14, and $h_{9,\#1}\neq h_{k,\#2}$ holds for all the value of k}
or {k is an integer from 8 to 14, and $h_{10,\#1}\neq h_{k,\#2}$ holds for all the value of k}
or {k is an integer from 8 to 14, and $h_{11,\#1}\neq h_{k,\#2}$ holds for all the value of k}
or {k is an integer from 8 to 14, and $h_{12,\#1}\neq h_{k,\#2}$ holds for all the value of k}

-continued or {k is an integer from 8 to 14, and $h_{13,\#1} \neq h_{k,\#2}$ holds for all the value of k}
or {k is an integer from 8 to 14, and $h_{14,\#1} \neq h_{k,\#2}$ holds for all the value of k}
}

Therefore, the receiver has a higher possibility of obtaining the high data reception quality in both <error correction scheme #3> and <error correction scheme #4> (because <error correction scheme #3> differs from <error correction scheme #4> in a suitable set of $h_1$, $h_2$, $h_3$, $h_4$, $h_5$, $h_6$, $h_7$, $h_8$, $h_9$, $h_{10}$, $h_{11}$, $h_{12}$, $h_{13}$, and $h_{14}$).

The following is a summary of the above.

The following two error correction schemes are considered.

<Error Correction Scheme #3*>

The coding is performed using the block code having coding rate A and the block length (code length) of B bits (A is a real number, $0<A<1$ holds, and B is an integer larger than 0).

<Error Correction Scheme #4*>

The coding is performed using the block code having coding rate A and the block length (code length) of C bits (A is a real number, $0<A<1$ holds, C is an integer larger than 0, and $B \neq C$ holds).

It is assumed that 16QAM in FIG. 114 is used in the transmitter in FIG. 122. At this point, the transmitter in FIG. 122 sets $f_1=f_{1,\#1}$ and $f_2=f_{2,\#1}$ in FIG. 114 using <error correction scheme #3*>, and sets $f_1=f_{1,\#2}$ and $f_2=f_{2,\#2}$ in FIG. 114 using <error correction scheme #4*>. At this point, <Condition #H4> preferably holds.

It is assumed that 64QAM in FIG. 115 is used in the transmitter in FIG. 122. At this point, the transmitter in FIG. 122 sets $g_1=g_{1,\#1}$, $g_2=g_{2,\#1}$, $g_3=g_{3,\#1}$, $g_4=g_{4,\#1}$, $g_5=g_{5,\#1}$, and $g_6=g_{6,\#1}$ in FIG. 115 using <error correction scheme #3*>, and sets $g_1=g_{1,\#2}$, $g_2=g_{2,\#2}$, $g_3=g_{3,\#2}$, $g_4=g_{4,\#2}$, $g_5=g_{5,\#2}$, and $g_6=g_{6,\#2}$ in FIG. 115 using <error correction scheme #4*>. At this point, <Condition #H5> preferably holds.

It is assumed that 256QAM in FIG. 116 is used in the transmitter in FIG. 122. At this point, the transmitter in FIG. 122 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ in FIG. 116 using <error correction scheme #3*>, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ in FIG. 116 using <error correction scheme #4*>. At this point, <Condition #H6> preferably holds.

Example 3

It is assumed that the transmitter in FIG. 122 can transmit the plurality of block lengths (code lengths) as the error correction code.

For example, it is assumed that the transmitter in FIG. 122 selects one of the error correction coding with the LDPC (block) code having the block length (code length) of 16200 bits and the error correction coding with the LDPC (block) code having the block length (code length) 64800 bits to performs the error correction code. Accordingly, the following two error correction schemes are considered.

<Error Correction Scheme #5>

The coding is performed using the LDPC (block) code having the coding rate of ⅔ and the block length (code length) 16200 bits (information: 10800 bits and parity: 5400 bits).

<Error Correction Scheme #6>

The coding is performed using the LDPC (block) code having the coding rate of ⅔ and the block length (code length) 64800 bits (information: 43200 bits and parity: 21600 bits).

It is assumed that 16QAM in FIG. 119 is used in the transmitter in FIG. 122. At this point, the transmitter in FIG. 122 sets $k_1=k_{1,\#1}$ and $k_2=k_{2,\#1}$ in FIG. 119 using <error correction scheme #5>, and sets $k_1=k_{1,\#2}$ and $k_2=k_{2,\#2}$ in FIG. 119 using <error correction scheme #6>. At this point, <Condition #H7>

$\{k_{1,\#1} \neq k_{1,\#2}$ or $k_{2,\#1} \neq k_{2,\#2}\}$ preferably holds. Therefore, the receiver has a higher possibility of obtaining the high data reception quality in both <error correction scheme #5> and <error correction scheme #6> (because <error correction scheme #5> differs from <error correction scheme #6> in a suitable set of $k_1$ and $k_2$).

It is assumed that 64QAM in FIG. 120 is used in the transmitter in FIG. 122. At this point, the transmitter in FIG. 122 sets $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$, and $m_8=m_{8,\#1}$ in FIG. 120 using <error correction scheme #5>, and sets $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$, and $m_8=m_{8,\#2}$ in FIG. 120 using <error correction scheme #6>. Therefore, the following condition preferably holds.

<Condition #H8>

{
{$\{m_{1,\#1} \neq m_{1,\#2}$ and $m_{1,\#1} \neq m_{2,\#2}$ and $m_{1,\#1} \neq m_{3,\#2}$ and $m_{1,\#1} \neq m_{4,\#2}\}$ or $\{m_{2,\#1} \neq m_{1,\#2}$ and $m_{2,\#1} \neq m_{2,\#2}$ and $m_{2,\#1} \neq m_{3,\#2}$ and $m_{2,\#1} \neq m_{4,\#2}\}$ or $\{m_{3,\#1} \neq m_{1,\#2}$ and $m_{3,\#1} \neq m_{2,\#2}$ and $m_{3,\#1} \neq m_{3,\#2}$ and $m_{3,\#1} \neq m_{4,\#2}\}$ or $\{m_{4,\#1} \neq m_{1,\#2}$ and $m_{4,\#1} \neq m_{2,\#2}$ and $m_{4,\#1} \neq m_{3,\#2}$ and $m_{4,\#1} \neq m_{4,\#2}\}$ holds}
or
{$\{m_{5,\#1} \neq m_{5,\#2}$ and $m_{5,\#1} \neq m_{6,\#2}$ and $m_{5,\#1} \neq m_{7,\#2}$ and $m_{5,\#1} \neq m_{8,\#2}\}$ or $\{m_{6,\#1} \neq m_{5,\#2}$ and $m_{6,\#1} \neq m_{6,\#2}$ and $m_{6,\#1} \neq m_{7,\#2}$ and $m_{6,\#1} \neq m_{8,\#2}\}$ or $\{m_{7,\#1} \neq m_{5,\#2}$ and $m_{7,\#1} \neq m_{6,\#2}$ and $m_{7,\#1} \neq m_{7,\#2}$ and $m_{7,\#1} \neq m_{8,\#2}\}$ or $\{m_{8,\#1} \neq m_{5,\#2}$ and $m_{8,\#1} \neq m_{6,\#2}$ and $m_{8,\#1} \neq m_{7,\#2}$ and $m_{8,\#1} \neq m_{8,\#2}\}$ holds}
}
holds.

Therefore, the receiver has a higher possibility of obtaining the high data reception quality in both <error correction scheme #5> and <error correction scheme #6> (because <error correction scheme #5> differs from <error correction scheme #6> in a suitable set of $m_1$, $m_2$, $m_3$, $m_4$, $m_5$, $m_6$, $m_7$, and $m_8$).

It is assumed that 256QAM in FIG. 121 is used in the transmitter in FIG. 122. At this point, the transmitter in FIG. 122 sets $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$, and $n_{16}=n_{16,\#1}$ in FIG. 121 using <error correction scheme #5>, and sets $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ in FIG. 121 using <error correction scheme #6>. Therefore, the following condition preferably holds.

<Condition #H9>

{
{k is an integer from 1 to 8, and $n_{1,\#1} \neq n_{k,\#2}$ holds for all the value of k}
or {k is an integer from 1 to 8, and $n_{2,\#1} \neq n_{k,\#2}$ holds for all the value of k}
or {k is an integer from 1 to 8, and $n_{3,\#1} \neq n_{k,\#2}$ holds for all the value of k}
or {k is an integer from 1 to 8, and $n_{4,\#1} \neq n_{k,\#2}$ holds for all the value of k}
or {k is an integer from 1 to 8, and $n_{5,\#1} \neq n_{k,\#2}$ holds for all the value of k}
or {k is an integer from 1 to 8, and $n_{6,\#1} \neq n_{k,\#2}$ holds for all the value of k}
or {k is an integer from 1 to 8, and $n_{7,\#1} \neq n_{k,\#2}$ holds for all the value of k}
or {k is an integer from 1 to 8, and $n_{8,\#1} \neq n_{k,\#2}$ holds for all the value of k}
}
or
{
{k is an integer from 9 to 16, and $n_{9,\#1} \neq n_{k,\#2}$ holds for all the value of k}
or {k is an integer from 9 to 16, and $n_{10,\#1} \neq n_{k,\#2}$ holds for all the value of k}
or {k is an integer from 9 to 16, and $n_{11,\#1} \neq n_{k,\#2}$ holds for all the value of k}
or {k is an integer from 9 to 16, and $n_{12,\#1} \neq n_{k,\#2}$ holds for all the value of k}
or {k is an integer from 9 to 16, and $n_{13,\#1} \neq n_{k,\#2}$ holds for all the value of k}
or {k is an integer from 9 to 16, and $n_{14,\#1} \neq n_{k,\#2}$ holds for all the value of k}
or {k is an integer from 9 to 16, and $n_{15,\#1} \neq n_{k,\#2}$ holds for all the value of k}
or {k is an integer from 9 to 16, and $n_{16,\#1} \neq n_{k,\#2}$ holds for all the value of k}
}

Therefore, the receiver has a higher possibility of obtaining the high data reception quality in both <error correction scheme #5> and <error correction scheme #6> (because <error correction scheme #5> differs from <error correction scheme #6> in a suitable set of $n_1$, $n_2$, $n_3$, $n_4$, $n_5$, $n_6$, $n_7$, $n_8$, $n_9$, $n_{10}$, $n_{11}$, $n_{12}$, $n_{13}$, $n_{14}$, $n_{15}$, and $n_{16}$).

The following is a summary of the above.

The following two error correction schemes are considered.

<Error Correction Scheme #5*>

The coding is performed using the block code having coding rate A and the block length (code length) of B bits (A is a real number, 0<A<1 holds, and B is an integer larger than 0).

<Error Correction Scheme #6*>

The coding is performed using the block code having coding rate A and the block length (code length) of C bits (A is a real number, 0<A<1 holds, C is an integer larger than 0, and B≠C holds).

It is assumed that 16QAM in FIG. 119 is used in the transmitter in FIG. 122. At this point, the transmitter in FIG. 122 sets $k_1=k_{1,\#1}$ and $k_2=k_{2,\#1}$ in FIG. 119 using <error correction scheme #5*>, and sets $k_1=k_{1,\#2}$ and $k_2=k_{2,\#2}$ in FIG. 119 using <error correction scheme #6*>. At this point, <Condition #H7> preferably holds.

It is assumed that 64QAM in FIG. 120 is used in the transmitter in FIG. 122. At this point, the transmitter in FIG. 122 sets $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$, and $m_8=m_{8,\#1}$ in FIG. 120 using <error correction scheme #5*>, and sets $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$, and $m_8=m_{8,\#2}$ in FIG. 120 using <error correction scheme #6*>. At this point, <Condition #H8> preferably holds.

It is assumed that 256QAM in FIG. 121 is used in the transmitter in FIG. 122. At this point, the transmitter in FIG. 122 sets $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$, and $n_{16}=n_{16,\#1}$ in FIG. 121 using <error correction scheme #5*>, and sets $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ in FIG. 121 using <error correction scheme #6*>. At this point, <Condition #H9> preferably holds.

Although the detailed configuration is not illustrated in FIGS. 122 and 124, similarly the modulated signal can be transmitted and received using the OFDM scheme and spectral spread communication scheme, which are described in another exemplary embodiment.

In the MIMO transmission scheme, the space-time codes such as the space-time block code (however, the symbol mat be arranged on the frequency axis), and the MIMO transmission scheme in which the precoding is performed or not performed, which are described in the first to twelfth exemplary embodiments, there is a possibility of improving the data reception quality even if 16QAM, 64QAM, and 256QAM are used.

As described above, when the transmitter performs the modulation (mapping) to transmit the modulated signal, the transmitter transmits the control information such that the receiver can identify the modulation scheme and the parameters of the modulation scheme, which allows the receiver in FIG. 124 to perform the demapping (demodulation) by obtaining the control information.

(Supplement 6)

A configuration example of a communication and broadcasting system in which QAM of (Supplement 2), (Supplement 3), and (Supplement 4), particularly the MIMO transmission scheme is used will be described below.

Figure 125:
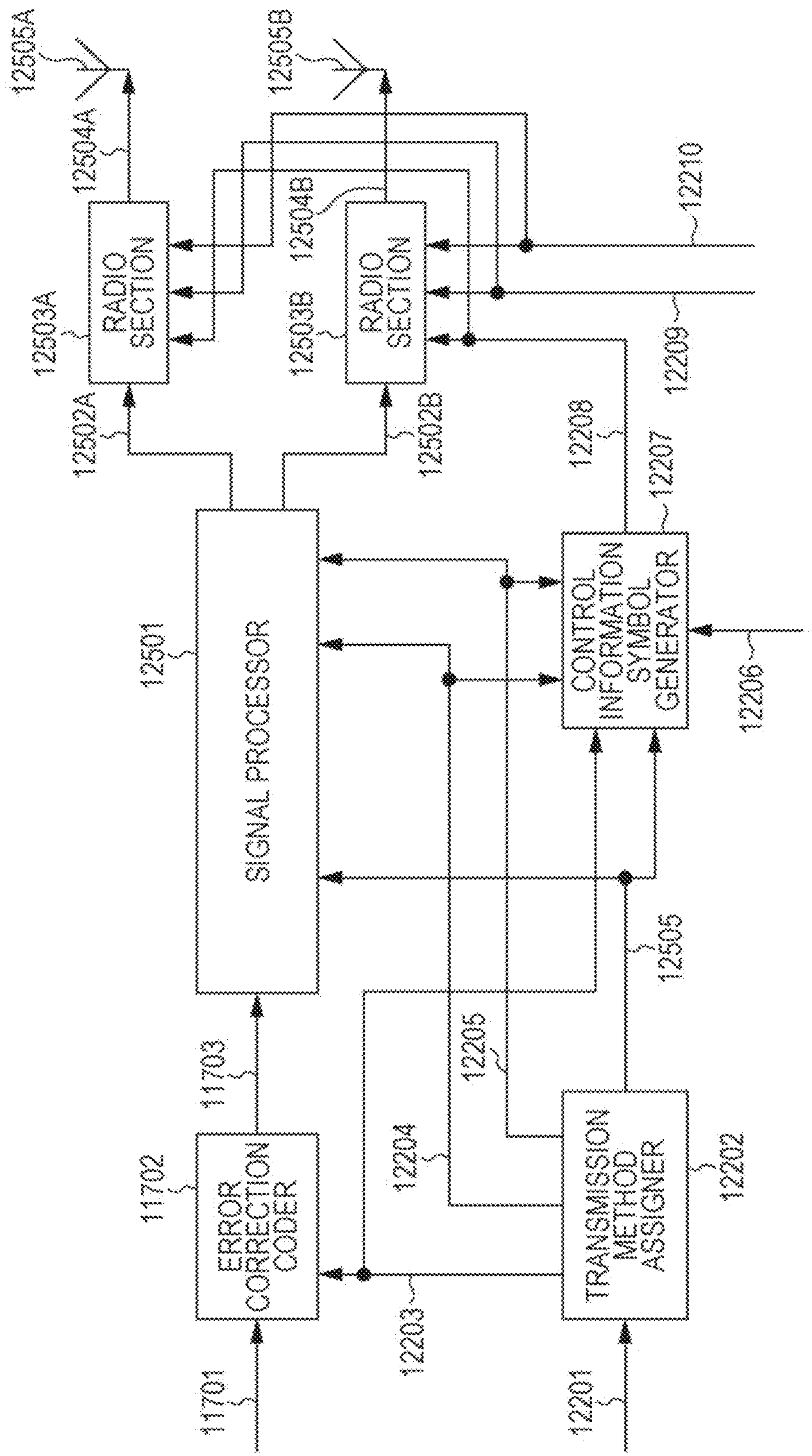

FIG. 125 illustrates an example of the transmitter. In FIG. 125, the component similarly to that in FIG. 122 is designated by the identical reference mark.

Input signal 12201 is input to transmission method assigner 12202, and transmission method assigner 12202 outputs information signal 12203 associated with the error correction code (for example, the coding rate of the error correction code and the block length of the error correction code), information signal 12204 associated with the modulation scheme (for example, the modulation scheme), information signal 12205 of the parameter associated with the modulation scheme (for example, information about an amplitude in QAM), and information signal 12505 associated with the transmission method (the information about the MIMO transmission, the single stream transmission, and the MISO transmission (the transmission with the space-time block cod)) in order to generate the data symbol based on based on input signal 12201. A user who uses the transmitter may generate input signal 12201, and feedback information about a communication partner communication may be used as input signal 12201 when input signal 12201 is use in the communication system. It is assumed that the MIMO transmission, the single stream transmission, and the MISO transmission (the transmission with the space-time block cod) can be assigned as the transmission method, and that the transmission method in which the precoding and phase change of the first to twelfth exemplary embodiments are performed is dealt with as the MIMO transmission.

Information 11701 and information signal 12203 associated with the error correction code are input to error correction encoder 11702, and error correction encoder 11702 performs the error correction coding based on information signal 12203 associated with the error correction code, and outputs error-correction-coded data 11703.

Error-correction-coded data 11703, information signal 12204 associated with the modulation scheme, information signal 12205 of the parameter associated with the modulation scheme, and information signal 12505 associated with the transmission method are input to signal processor 12501, and signal processor 12501 performs the pieces of processing such as the interleaving, the mapping, the precoding, the phase change, and the power change on error-correction-coded data 11703 based on the information signals, and outputs post-processing baseband signals 12502A and 12502B.

Information signal 12203 associated with the error correction code, information signal 12204 associated with the modulation scheme, information signal 12205 of the parameter associated with the modulation scheme, control data 12206, and information signal 12505 associated with the transmission method are input to control information symbol generator 12207, and control information symbol generator 12207 performs the error correction coding and the BPSK or QPSK modulation, and outputs control information symbol signal 12208.

Figure 126:
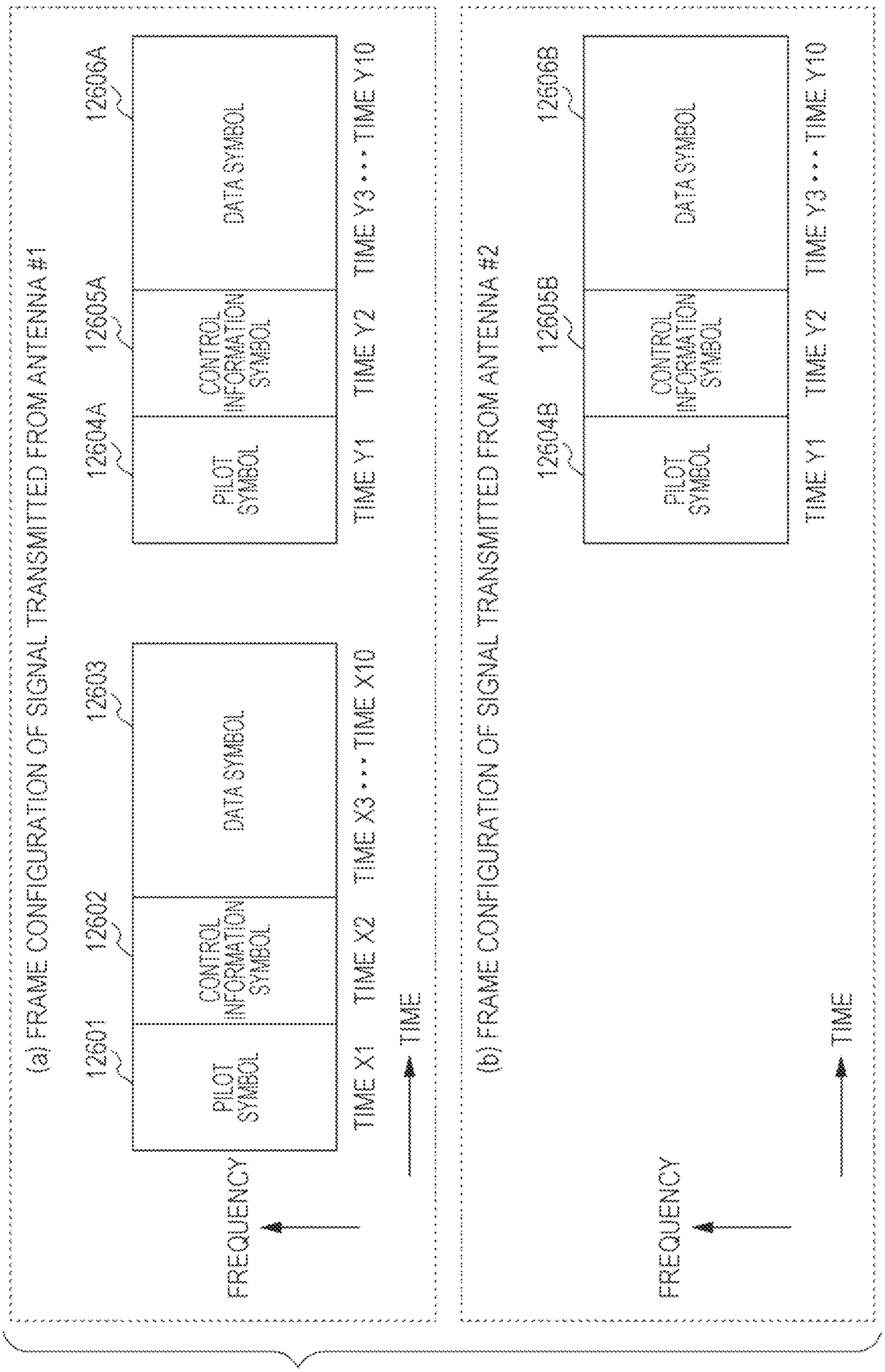

Post-processing baseband signal 12502A, control symbol signal 12208, pilot symbol signal 12209, and frame configuration signal 12210 are input to radio section 12503A, and radio section 12503A outputs transmitted signal 12504A as the radio wave from antenna #1 (12505A) based on frame configuration signal 12210. FIG. 126 illustrates an example of the frame configuration.

Post-processing baseband signal 12502B, control symbol signal 12208, pilot symbol signal 12209, and frame configuration signal 12210 are input to radio section 12503B, and radio section 12503B outputs transmitted signal 12504B as the radio wave from antenna #2 (12505B) based on frame configuration signal 12210. FIG. 126 illustrates an example of the frame configuration.

The operation of signal processor 12501 in FIG. 125 will be described below with reference to FIG. 126.

In the frame configuration of FIG. 126, a vertical axis indicates the frequency and a horizontal axis indicates the time. In FIG. 126, (a) illustrates the frame configuration of the signal transmitted from antenna #1 (12505A) in FIG. 125, and (b) illustrates the frame configuration of the signal transmitted from antenna #2 (12505B) in FIG. 125.

First, the operation of the transmitter that transmits pilot symbol 12601, control information symbol 12602, and data symbol 12603 in FIG. 126 will be described.

As to the transmission scheme, one-stream modulated signal is transmitted from the transmitter in FIG. 125. At this point, for example, first and second methods are considered.

First Method:

Error-correction-coded data 11703, information signal 12204 associated with the modulation scheme, information signal 12205 of the parameter associated with the modulation scheme, and information signal 12505 associated with the transmission method are input to signal processor 12501, and signal processor 12501 decides the modulation scheme according to information signal 12204 associated with the modulation scheme and information signal 12205 of the parameter associated with the modulation scheme, performs the mapping according to the decided modulation scheme, and outputs post-processing baseband signal 12502A. At this point, it is assumed that post-processing baseband signal 12502B is not output (it is assumed that signal processor 12501 performs the processing such as the interleaving).

Post-processing baseband signal 12502A, control symbol signal 12208, pilot symbol signal 12209, and frame configuration signal 12210 are input to radio section 12503A, and radio section 12503A outputs transmitted signal 12504A as the radio wave from antenna #1 (12505A) based on frame configuration signal 12210. It is assumed that the radio section 12503B is not operated and therefore the radio wave is not output from antenna #2 (12505B).

As to the transmission scheme, the second method in which one-stream modulated signal is transmitted from the transmitter in FIG. 125 will be described below.

Second Method:

Error-correction-coded data 11703, information signal 12204 associated with the modulation scheme, information signal 12205 of the parameter associated with the modulation scheme, and information signal 12505 associated with the transmission method are input to signal processor 12501, and signal processor 12501 decides the modulation scheme according to information signal 12204 associated with the modulation scheme and information signal 12205 of the parameter associated with the modulation scheme, performs the mapping according to the decided modulation scheme, and generates the mapped signal.

Signal processor 12501 generates the signals of two series based on the mapped signal, and outputs the signals as post-processing baseband signals 12502A and 12502B. The term "generating the signals of two series based on the mapped signal" means that the signals of two series are generated based on the mapped signal by performing the phase change or the power change on the mapped signal (as described above, it is assumed that signal processor 12501 performs the processing such as the interleaving).

Post-processing baseband signal 12502A, control symbol signal 12208, pilot symbol signal 12209, and frame configuration signal 12210 are input to radio section 12503A, and radio section 12503A outputs transmitted signal 12504A as the radio wave from antenna #1 (12505A) based on frame configuration signal 12210.

Post-processing baseband signal 12502B, control symbol signal 12208, pilot symbol signal 12209, and frame configuration signal 12210 are input to radio section 12503B, and radio section 12503B outputs transmitted signal 12504B as the radio wave from antenna #2 (12505B) based on frame configuration signal 12210.

The operation of the transmitter that transmits pilot symbols 12604A and 12604B, control information symbols 12605A and 12605B, and data symbols 12606A and 12606B in FIG. 126 will be described below.

Pilot symbols 12604A and 12604B are transmitted from the transmitter at time Y1 using the identical frequency (common frequency).

Similarly, control information symbols 12505A and 12605B are transmitted from the transmitter at time Y2 using the identical frequency (common frequency).

Data symbols 12606A and 12606B are transmitted from the transmitter between times Y3 and Y10 using the identical frequency (common frequency).

Signal processor 12501 performs the signal processing according to the MIMO transmission scheme, the space-time codes such as the space-time block code (however, the symbol mat be arranged on the frequency axis), and the MIMO transmission scheme in which the precoding is performed or not performed, which are described in the first to twelfth exemplary embodiments. Particularly, in the case that the precoding, the phase change, and the power change are performed, signal processor 12501 includes at least the sections in FIGS. 97 and 98 (or the sections except for the encoder in FIGS. 5 to 7).

Error-correction-coded data 11703, information signal 12204 associated with the modulation scheme, information signal 12205 of the parameter associated with the modulation scheme, and information signal 12505 associated with the transmission method are input to signal processor 12501. In the case that information signal 12505 associated with the transmission method is the information indicating that the precoding, the phase change, and the power change are performed, signal processor 12501 performs the operation similar to that in FIGS. 97 and 98 (or the sections except for the encoder in FIGS. 5 to 7) of the first to twelfth exemplary embodiments. Accordingly, signal processor 12501 outputs post-processing baseband signals 12502A and 12502B (it is assumed that signal processor 12501 performs the processing such as the interleaving).

Post-processing baseband signal 12502A, control symbol signal 12208, pilot symbol signal 12209, and frame configuration signal 12210 are input to radio section 12503Λ, and radio section 12503Λ outputs transmitted signal 12504A as the radio wave from antenna #1 (12505A) based on frame configuration signal 12210.

Post-processing baseband signal 12502B, control symbol signal 12208, pilot symbol signal 12209, and frame configuration signal 12210 are input to radio section 12503B, and radio section 12503B outputs transmitted signal 12504B as the radio wave from antenna #2 (12505B) based on frame configuration signal 12210.

The configuration of the case that signal processor 12501 performs the transmission method with the space-time block code will be described below with reference to FIG. 128.

Data signal (error-correction-coded data) 12801 and control signal 12806 are input to mapper 12802, and mapper 12802 performs the mapping based on the information about the modulation scheme included in control signal 12806, and outputs mapped signal 12803. For example, it is assumed that mapped signal 12803 is arranged in the order of $s0, s_1, s2, s3, \ldots, s(2i), s(2i+1), \ldots$ (i is an integer of 0 or more).

Mapped signal 12803 and control signal 12806 are input to MISO (Multiple Input Multiple Output) processor 12804, and MISO processor 12804 outputs post-MISO-processing signals 12805A and 12805B in the case that control signal 12806 issues an instruction to transmit the signal using the MISO (Multiple Input Multiple Output) scheme. For example, post-MISO-processing signal 12805A is $s0, s_1, s2, s3, \ldots, s(2i), s(2i+1), \ldots$, and post-MISO-processing signal 12805B is $-s1^*, s0^* -s3^*, s2^*, \ldots, -s(2i+1)^*, s(2i)^*, \ldots$. The mark means a complex conjugate.

At this point, post-MISO-processing signals 12805A and 12805B correspond to post-processing baseband signals 12502A and 12502B in FIG. 125, respectively. The space-time block coding method is not limited to the above method.

Post-processing baseband signal 12502A, control symbol signal 12208, pilot symbol signal 12209, and frame configuration signal 12210 are input to radio section 12503Λ, and radio section 12503Λ outputs transmitted signal 12504A as the radio wave from antenna #1 (12505A) based on frame configuration signal 12210.

Post-processing baseband signal 12502B, control symbol signal 12208, pilot symbol signal 12209, and frame configuration signal 12210 are input to radio section 12503B, and radio section 12503B outputs transmitted signal 12504B as the radio wave from antenna #2 (12505B) based on frame configuration signal 12210.

FIG. 127 illustrates an example of the receiver that receives the modulated signal transmitted from the transmitter in FIG. 125. In FIG. 127, the component similarly to that in FIG. 124 is designated by the identical reference mark.

Quadrature baseband signal 11804 is input to synchronizer 12405, and synchronizer 12405 performs the frequency synchronization, the time synchronization, and the frame synchronization by detecting and using pilot symbols 12601, 12604A, and 12604B in FIG. 126, and outputs synchronization signal 12406.

Quadrature baseband signal 11804 and synchronization signal 12406 are input to control information demodulator 12401, and control information demodulator 12401 demodulates control information symbols 12602, 12605A, and 1605B in FIG. 126 (and the error correction decoding), and outputs control information signal 12402.

Quadrature baseband signal 11804 and synchronization signal 12406 are input to frequency offset and transmission path estimator 12403, and frequency offset and transmission path estimator 12403 estimates a frequency offset and a transmission path variation caused by a current using pilot symbols 12601, 12604A, and 12604B in FIG. 126, and outputs frequency offset and transmission path variation estimated signal 12404.

Received signal 12702X received with antenna #1 (12701X) is input to radio section 12703X, and radio section 12703X performs the pieces of processing such as the frequency conversion and the quadrature demodulation (and the Fourier transform), and outputs quadrature baseband signal 12704X.

Similarly, received signal 12702Y received with antenna #2 (12701Y) is input to radio section 12703Y, and radio section 12703Y performs the pieces of processing such as the frequency conversion and the quadrature demodulation (and the Fourier transform), and outputs quadrature baseband signal 12704Y.

Quadrature baseband signals 12704X and 12704Y, control information signal 12402, frequency offset and transmission path variation estimated signal 12404, and synchronization signal 12406 are input to signal processor 12705. Signal processor 12705 determines the modulation scheme and the transmission method using control information signal 12402, performs the signal processing and the demodulation based on the determined modulation scheme and transmission method, obtains the log-likelihood ratio of each bit in the data symbol, and outputs log-likelihood ratio signal 12706 (sometimes signal processor 12705 performs the processing such as the deinterleaving).

Log-likelihood ratio signal 12706 and control information signal 12402 are input to decoder 12707, and decoder 12707 performs the error correction decoding from the error correction coding scheme included in the control information, and outputs received data 12708.

Examples in which QAM of (Supplement 2), (Supplement 3), and (Supplement 4) is used will be described below.

Example 1

It is assumed that the transmitter in FIG. 125 can transmit the plurality of block lengths (code lengths) as the error correction code.

For example, it is assumed that the transmitter in FIG. 125 selects one of the error correction coding with the LDPC (block) code having the block length (code length) of 16200 bits and the error correction coding with the LDPC (block) code having the block length (code length) 64800 bits to performs the error correction code. Accordingly, the following two error correction schemes are considered.

<Error Correction Scheme #1>

The coding is performed using the LDPC (block) code having the coding rate of ⅔ and the block length (code length) 16200 bits (information: 10800 bits and parity: 5400 bits).

<Error Correction Scheme #2>

The coding is performed using the LDPC (block) code having the coding rate of ⅔ and the block length (code length) 64800 bits (information: 43200 bits and parity: 21600 bits).

It is assumed that 16QAM in FIG. 111 is used in the transmitter in FIG. 125. At this point, the transmitter in FIG. 125 sets $f=f_{\#1}$ in FIG. 111 using <error correction scheme #1>, and sets $f=f_{\#2}$ in FIG. 111 using <error correction scheme #2>. At this point, <Condition #H10>

In each transmission method corresponding to the configuration in FIG. 125, $f_{\#1}\neq 1$ and $f_{\#2}\neq 1$ and $f_{\#1}\neq f_{\#2}$ preferably hold. Therefore, the receiver has a higher possibility of obtaining the high data reception quality in both <error correction scheme #1> and <error correction scheme #2> (because <error correction scheme #1> differs from <error correction scheme #2> in a suitable value of f).

It is assumed that 64QAM in FIG. 112 is used in the transmitter in FIG. 125. At this point, the transmitter in FIG. 125 sets $g_1=g_{1,\#1}$, $g_2=g_{2,\#1}$, and $g_3=g_{3,\#1}$ in FIG. 112 using <error correction scheme #1>, and sets $g_1=g_{1,\#2}$, $g_2=g_{2,\#2}$, and $g_3=g_{3,\#2}$ in FIG. 112 using <error correction scheme #2>. Therefore, the following condition preferably holds.

<Condition #H11>

The following condition holds in each transmission method corresponding to the configuration in FIG. 125.

$\{(g_{1,\#1},g_{2,\#1},g_{3,\#1})+(1,3,5)$ and $(g_{1,\#1},g_{2,\#1},g_{3,\#1})\neq(1,5,3)$ and $(g_{1,\#1},g_{2,\#1},g_{3,\#1})\neq(3,1,5)$ and $(g_{1,\#1},g_{2,\#1},g_{3,\#1})\neq(3,5,1)$ and $(g_{1,\#1},g_{2,\#1},g_{3,\#1})\neq(5,1,3)$ and $(g_{1,\#1},g_{2,\#1},g_{3,\#1})\neq(5,3,1)\}$ and $\{(g_{1,\#2},g_{2,\#2},g_{3,\#2})\neq(1,3,5)$ and $(g_{1,\#2},g_{2,\#2},g_{3,\#2})\neq(1,5,3)$ and $(g_{1,\#2},g_{2,\#2},g_{3,\#2})\neq(3,1,5)$ and $(g_{1,\#2},g_{2,\#2},g_{3,\#2})\neq(3,5,1)$ and $(g_{1,\#2},g_{2,\#2},g_{3,\#2})\neq(5,1,3)$ and $(g_{1,\#2},g_{2,\#2},g_{3,\#2})\neq(5,3,1)\}$ and $\{\{g_{1,\#1}\neq g_{1,\#2}$ or $g_{2,\#1}\neq g_{2,\#2}$ or $g_{3,\#1}\neq g_{3,\#2}\}$ holds$\}$ hold.

Therefore, the receiver has a higher possibility of obtaining the high data reception quality in both <error correction scheme #1> and <error correction scheme #2> (because <error correction scheme #1> differs from <error correction scheme #2> in a suitable set of $g_1$, $g_2$, and $g_3$).

It is assumed that 256QAM in FIG. 113 is used in the transmitter in FIG. 125. At this point, the transmitter in FIG. 125 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ in FIG. 113 using <error correction scheme #1>, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ in FIG. 113 using <error correction scheme #2>. Therefore, the following condition preferably holds.

<Condition #H12>

The following condition holds in each transmission method corresponding to the configuration in FIG. 125.

{When {a1 is an integer from 1 to 7 and a2 is an integer from 1 to 7 and a3 is an integer from 1 to 7 and a4 is an integer from 1 to 7 and a5 is an integer from 1 to 7 and a6 is an integer from 1 to 7 and a7 is an integer from 1 to 7} and {x is an integer from 1 to 7 and y is an integer from 1 to 7 and $x\neq y$} and {$ax\neq ay$ holds for all values x and y} hold, $(h_{a1,\#1}, h_{a2,\#1}, h_{a3,\#1}, h_{a4,\#1}, h_{a5,\#1}, h_{a6,\#1}, h_{a7,\#1})\neq(1,3,5,7,9,11,13)$ holds}, and {when {a1 is an integer from 1 to 7 and a2 is an integer from 1 to 7 and a3 is an integer from 1 to 7 and a4 is an integer from 1 to 7 and a5 is an integer from 1 to 7 and a6 is an integer from 1 to 7 and a7 is an integer from 1 to 7} and {x is an integer from 1 to 7 and y is an integer from 1 to 7 and $x\neq y$} and {$ax\neq ay$ holds for all values x and y} hold, $(h_{a1,\#2}, h_{a2,\#2}, h_{a3,\#2}, h_{a4,\#2}, h_{a5,\#2}, h_{a6,\#2}, h_{a7,\#2})+(1,3,5,7,9,11,13)$ holds} and $\{\{h_{1,\#1}\neq h_{1,\#2}$ or $h_{2,\#1}\neq h_{2,\#2}$ or $h_{3,\#1}\neq h_{3,\#2}$ or $h_{4,\#1}\neq h_{4,\#2}$ or $h_{5,\#1}\neq h_{5,\#2}$ or $h_{6,\#1}\neq h_{6,\#2}$ or $h_{7,\#1}+h_{7},\#2\}$ holds.$\}$ hold.

Therefore, the receiver has a higher possibility of obtaining the high data reception quality in both <error correction scheme #1> and <error correction scheme #2> (because <error correction scheme #1> differs from <error correction scheme #2> in a suitable set of $h_1$, $h_2$, $h_3$, $h_4$, $h_5$, $h_6$, and $h_7$).

The following is a summary of the above.

The following two error correction schemes are considered.

<Error Correction Scheme #1*>

The coding is performed using the block code having coding rate A and the block length (code length) of B bits (A is a real number, $0<A<1$ holds, and B is an integer larger than 0).

<Error Correction Scheme #2*>

The coding is performed using the block code having coding rate A and the block length (code length) of C bits (A is a real number, $0<A<1$ holds, C is an integer larger than 0, and $B\neq C$ holds).

It is assumed that 16QAM in FIG. 111 is used in the transmitter in FIG. 125. At this point, the transmitter in FIG. 125 sets $f=f_{\#1}$ in FIG. 111 using <error correction scheme #1*>, and sets $f=f_{\#2}$ in FIG. 111 using <error correction scheme #2*>. At this point, <Condition #H10> preferably holds.

It is assumed that 64QAM in FIG. 112 is used in the transmitter in FIG. 125. At this point, the transmitter in FIG. 125 sets $g_1=g_{1,\#1}$, $g_2=g_{2,\#1}$, and $g_3=g_{3,\#1}$ in FIG. 112 using <error correction scheme #1*>, and sets $g_1=g_{1,\#2}$, $g_2=g_{2,\#2}$, and $g_3=g_{3,\#2}$ in FIG. 112 using <error correction scheme #2*>. At this point, <Condition #H11> preferably holds.

It is assumed that 256QAM in FIG. 113 is used in the transmitter in FIG. 125. At this point, the transmitter in FIG. 125 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ in FIG. 113 using <error correction scheme #1*>, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ in FIG. 112 using <error correction scheme #2*>. At this point, <Condition #H12> preferably holds.

Example 2

It is assumed that the transmitter in FIG. 125 can transmit the plurality of block lengths (code lengths) as the error correction code.

For example, it is assumed that the transmitter in FIG. 125 selects one of the error correction coding with the LDPC (block) code having the block length (code length) of 16200 bits and the error correction coding with the LDPC (block) code having the block length (code length) 64800 bits to performs the error correction code. Accordingly, the following two error correction schemes are considered.

<Error Correction Scheme #3>

The coding is performed using the LDPC (block) code having the coding rate of ⅔ and the block length (code length) 16200 bits (information: 10800 bits and parity: 5400 bits).

<Error Correction Scheme #4>

The coding is performed using the LDPC (block) code having the coding rate of ⅔ and the block length (code length) 64800 bits (information: 43200 bits and parity: 21600 bits).

It is assumed that 16QAM in FIG. 114 is used in the transmitter in FIG. 125. At this point, the transmitter in FIG. 125 sets $f_1=f_{1,\#1}$ and $f_2=f_{2,\#1}$ in FIG. 114 using <error correction scheme #3>, and sets $f_1=f_{1,\#2}$ and $f_2=f_{2,\#2}$ in FIG. 114 using <error correction scheme #4>. At this point, <Condition #H13>

The following condition holds in each transmission method corresponding to the configuration in FIG. 125.

$\{f_{1,\#1}\neq f_{1,\#2}$ or $f_{2,\#1}\neq f_{2,\#2}\}$ preferably holds. Therefore, the receiver has a higher possibility of obtaining the high data reception quality in both <error correction scheme #3> and <error correction scheme #4> (because <error correction scheme #3> differs from <error correction scheme #4> in a suitable set of $f_1$ and $f_2$).

It is assumed that 64QAM in FIG. 115 is used in the transmitter in FIG. 125. At this point, the transmitter in FIG. 125 sets $g_1=g_{1,\#1}$, $g_2=g_{2,\#1}$, $g_3=g_{3,\#1}$, $g_4=g_{4,\#1}$, $g_5=g_{5,\#1}$, and $g_6=g_{6,\#1}$ in FIG. 115 using <error correction scheme #3>, and sets $g_1=g_1$,#2, $g_2=g_{2,\#2}$, $g_3=g_{3,\#2}$, $g_4=g_{4,\#2}$, $g_5=g_{5,\#2}$, and $g_6=g_{6,\#2}$ in FIG. 115 using <error correction scheme #4>. Therefore, the following condition preferably holds.

<Condition #H14>

The following condition holds in each transmission method corresponding to the configuration in FIG. 125.

{{{$g_{1,\#1}\neq g_{1,\#2}$ and $g_{1,\#1}\neq g_{2,\#2}$ and $g_{1,\#1}\neq g_{3,\#2}$} or {$g_{2,\#1}\neq g_{1,\#2}$ and $g_{2,\#1}\neq g_{2,\#2}$ and $g_{2,\#1}\neq$
$g_{3,\#2}$} or {$g_{3,\#1}\neq g_{1,\#2}$ and $g_{3,\#1}\neq g_{2,\#2}$ and $g_{3,\#1}\neq g_{3,\#2}$} holds}
or
{{$g_{4,\#1}\neq g_{4,\#2}$ and $g_{4,\#1}\neq g_{5,\#2}$ and $g_{4,\#1}\neq g_{6,\#2}$} or {$g_{5,\#1}\neq g_{4,\#2}$ and $g_{5,\#1}\neq g_{5,\#2}$ and $g_{5,\#1}\neq g_{6,\#2}$}
or {$g_{6,\#1}\neq g_{4,\#2}$ and $g_{6,\#1}\neq g_{5,\#2}$ and $g_{6,\#1}\neq g_{6,\#2}$} holds.}
}
holds.

Therefore, the receiver has a higher possibility of obtaining the high data reception quality in both <error correction scheme #3> and <error correction scheme #4> (because <error correction scheme #3> differs from <error correction scheme #4> in a suitable set of $g_1$, $g_2$, $g_3$, $g_4$, $g_5$, and $g_6$).

It is assumed that 256QAM in FIG. 116 is used in the transmitter in FIG. 125. At this point, the transmitter in FIG. 125 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, $h_7=h_{7,\#1}$, $h_8=h_{8,\#1}$, $h_9=h_{9,\#1}$, $h_{10}=h_{10,\#1}$, $h_{11}=h_{11,\#1}$, $h_{12}=h_{12,\#1}$, $h_{13}=h_{13,\#1}$, and $h_{14}=h_{14,\#1}$ in FIG. 116 using <error correction scheme #3>, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, $h_7=h_{7,\#2}$, $h_8=h_{8,\#2}$, $h_9=h_{9,\#2}$, $h_{10}=h_{10,\#2}$, $h_{11}=h_{11,\#2}$, $h_{12}=h_{12,\#2}$, $h_{13}=h_{13,\#2}$, and $h_{14}=h_{14,\#2}$ in FIG. 116 using <error correction scheme #4>. Therefore, the following condition preferably holds.

<Condition #H15>

The following condition holds in each transmission method corresponding to the configuration in FIG. 125.

{
{k is an integer from 1 to 7, and $h_{1,\#1}\neq h_{k,\#2}$ holds for all the value of k}
or {k is an integer from 1 to 7, and $h_{2,\#1}\neq h_{k,\#2}$ holds for all the value of k}
or {k is an integer from 1 to 7, and $h_{3,\#1}\neq h_{k,\#2}$ holds for all the value of k}
or {k is an integer from 1 to 7, and $h_{4,\#1}\neq h_{k,\#2}$ holds for all the value of k}
or {k is an integer from 1 to 7, and $h_{5,\#1}\neq h_{k,\#2}$ holds for all the value of k}
or {k is an integer from 1 to 7, and $h_{6,\#1}\neq h_{k,\#2}$ holds for all the value of k}
or {k is an integer from 1 to 7, and $h_{7,\#1}\neq h_{k,\#2}$ holds for all the value of k}
}
or
{
{k is an integer from 8 to 14, and $h_{8,\#1}\neq h_{k,\#2}$ holds for all the value of k}
or {k is an integer from 8 to 14, and $h_{9,\#1}\neq h_{k,\#2}$ holds for all the value of k}
or {k is an integer from 8 to 14, and $h_{10,\#1}\neq h_{k,\#2}$ holds for all the value of k}
or {k is an integer from 8 to 14, and $h_{11,\#1}\neq h_{k,\#2}$ holds for all the value of k}
or {k is an integer from 8 to 14, and $h_{12,\#1}\neq h_{k,\#2}$ holds for all the value of k}
or {k is an integer from 8 to 14, and $h_{13,\#1}\neq h_{k,\#2}$ holds for all the value of k}
or {k is an integer from 8 to 14, and ${}_{h14,\#1}\neq h_{k,\#2}$ holds for all the value of k}
}

Therefore, the receiver has a higher possibility of obtaining the high data reception quality in both <error correction scheme #3> and <error correction scheme #4> (because <error correction scheme #3> differs from <error correction scheme #4> in a suitable set of $h_1$, $h_2$, $h_3$, $h_4$, $h_5$, $h_6$, $h_7$, $h_8$, $h_9$, $h_{10}$, $h_{11}$, $h_{12}$, $h_{13}$, and $h_{14}$).

The following is a summary of the above.

The following two error correction schemes are considered.

<Error Correction Scheme #3*>

The coding is performed using the block code having coding rate A and the block length (code length) of B bits (A is a real number, 0<A<1 holds, and B is an integer larger than 0).

<Error Correction Scheme #4*>

The coding is performed using the block code having coding rate A and the block length (code length) of C bits (A is a real number, 0<A<1 holds, C is an integer larger than 0, and B≠C holds).

It is assumed that 16QAM in FIG. 114 is used in the transmitter in FIG. 125. At this point, the transmitter in FIG. 125 sets $f_1=f_{1,\#1}$ and $f_2=f_{2,\#1}$ in FIG. 114 using <error correction scheme #3*>, and sets $f_1=f_{1,\#2}$ and $f_2=f_{2,\#2}$ in FIG. 114 using <error correction scheme #4*>. At this point, <Condition #H13> preferably holds.

It is assumed that 64QAM in FIG. 115 is used in the transmitter in FIG. 125. At this point, the transmitter in FIG. 125 sets $g_1=g_{1,\#1}$, $g_2=g_{2,\#1}$, $g_3=g_{3,\#1}$, $g_4=g_{4,\#1}$, $g_5=g_{5,\#1}$, and $g_6=g_{6,\#1}$ in FIG. 115 using <error correction scheme #3*>, and sets $g_1=g_{1,\#2}$, $g_2=g_{2,\#2}$, $g_3=g_{3,\#2}$, $g_4=g_{4,\#2}$, $g_5=g_{5,\#2}$, and $g_6=g_{6,\#2}$ in FIG. 115 using <error correction scheme #4*>. At this point, <Condition #H14> preferably holds.

It is assumed that 256QAM in FIG. 116 is used in the transmitter in FIG. 125. At this point, the transmitter in FIG. 125 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ in FIG. 116 using <error correction scheme #3*>, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ in FIG. 116 using <error correction scheme #4*>. At this point, <Condition #H15> preferably holds.

Example 3

It is assumed that the transmitter in FIG. 125 can transmit the plurality of block lengths (code lengths) as the error correction code.

For example, it is assumed that the transmitter in FIG. 125 selects one of the error correction coding with the LDPC (block) code having the block length (code length) of 16200 bits and the error correction coding with the LDPC (block) code having the block length (code length) 64800 bits to performs the error correction code. Accordingly, the following two error correction schemes are considered.

<Error Correction Scheme #5>

The coding is performed using the LDPC (block) code having the coding rate of ⅔ and the block length (code length) 16200 bits (information: 10800 bits and parity: 5400 bits).

<Error Correction Scheme #6>

The coding is performed using the LDPC (block) code having the coding rate of ⅔ and the block length (code length) 64800 bits (information: 43200 bits and parity: 21600 bits).

It is assumed that 16QAM in FIG. 119 is used in the transmitter in FIG. 125. At this point, the transmitter in FIG. 125 sets $k_1=k_{1,\#1}$ and $k_2=k_{2,\#1}$ in FIG. 119 using <error correction scheme #5>, and sets $k_1=k_{1,\#2}$ and $k_2=k_{2,\#2}$ in FIG. 119 using <error correction scheme #6>. At this point, <Condition #H16>

The following condition holds in each transmission method corresponding to the configuration in FIG. 125.

$\{k_{1,\#1}\neq k_{1,\#2}$ or $k_{2,\#1}\neq k_{2,\#2}\}$ preferably holds. Therefore, the receiver has a higher possibility of obtaining the high data reception quality in both <error correction scheme #5> and <error correction scheme #6> (because <error correction scheme #5> differs from <error correction scheme #6> in a suitable set of $k_1$ and $k_2$).

It is assumed that 64QAM in FIG. 120 is used in the transmitter in FIG. 125. At this point, the transmitter in FIG. 125 sets $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$, and $m_8=m_{8,\#1}$ in FIG. 120 using <error correction scheme #5>, and sets $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$, and $m_8=m_{8,\#2}$ in FIG. 120 using <error correction scheme #6>. Therefore, the following condition preferably holds.

<Condition #H17>

The following condition holds in each transmission method corresponding to the configuration in FIG. 125.

{
{ $\{m_{1,\#1}\neq m_{1,\#2}$ and $m_{1,\#1}\neq m_{2,\#2}$ and $m_{1,\#1}\neq m_{3,\#2}$ and $m_{1,\#1}\neq m_{4,\#2}\}$ or $\{m_{2,\#1}\neq m_{1,\#2}$ and $m_{2,\#1}\neq m_{2,\#2}$ and $m_{2,\#1}\neq m_{3,\#2}$ and $m_{2,\#1}\neq m_{4,\#2}\}$ or $\{m_{3,\#1}\neq m_{1,\#2}$ and $m_{3,\#1}\neq m_{2,\#2}$ and $m_{3,\#1}\neq m_{3,\#2}$ and $m_{3,\#1}\neq m_{4,\#2}\}$ or $\{m_{4,\#1}\neq m_{1,\#2}$ and $m_{4,\#1}\neq m_{2,\#2}$ and $m_{4,\#1}\neq m_{3,\#2}$ and $m_{4,\#1}\neq m_{4,\#2}\}$
holds.}
or
{ $\{m_{5,\#1}\neq m_{5,\#2}$ and $m_{5,\#1}\neq m_{6,\#2}$ and $m_{5,\#1}\neq m_{7,\#2}$ and $m_{5,\#1}\neq m_{8,\#2}\}$ or $\{m_{6,\#1}\neq m_{5,\#2}$ and $m_{6,\#1}\neq m_{6,\#2}$ and $m_{6,\#1}\neq m_{7,\#2}$ and $m_{6,\#1}\neq m_{8,\#2}\}$ or $\{m_{7,\#1}\neq m_{5,\#2}$ and $m_{7,\#1}\neq m_{6,\#2}$ and $m_{7,\#1}\neq m_{7,\#2}$ and $m_{7,\#1}\neq m_{8,\#2}\}$ or $\{m_{8,\#1}\neq m_{5,\#2}$ and $m_{8,\#1}\neq m_{6,\#2}$ and $m_{8,\#1}\neq m_{7,\#2}$ and $m_{8,\#1}\neq m_{8,\#2}\}$
holds.}
}
holds.

Therefore, the receiver has a higher possibility of obtaining the high data reception quality in both <error correction scheme #5> and <error correction scheme #6> (because <error correction scheme #5> differs from <error correction scheme #6> in a suitable set of $m_1$, $m_2$, $m_3$, $m_4$, $m_5$, $m_6$, $m_7$, and $m_8$).

It is assumed that 256QAM in FIG. 121 is used in the transmitter in FIG. 125. At this point, the transmitter in FIG. 125 sets $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$, and $n_{16}=n_{16,\#1}$ in FIG. 121 using <error correction scheme #5>, and sets $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ in FIG. 121 using <error correction scheme #6>. Therefore, the following condition preferably holds.

<Condition #H18>

The following condition holds in each transmission method corresponding to the configuration in FIG. 125.

$$
\begin{aligned}
&\{\\
&\{k \text{ is an integer from 1 to 8, and } n_{1,\#1} \neq n_{k,\#2} \text{ holds for all the value of } k\}\\
&\text{or } \{k \text{ is an integer from 1 to 8, and } n_{2,\#1} \neq n_{k,\#2} \text{ holds for all the value of } k\}\\
&\text{or } \{k \text{ is an integer from 1 to 8, and } n_{3,\#1} \neq n_{k,\#2} \text{ holds for all the value of } k\}\\
&\text{or } \{k \text{ is an integer from 1 to 8, and } n_{4,\#1} \neq n_{k,\#2} \text{ holds for all the value of } k\}\\
&\text{or } \{k \text{ is an integer from 1 to 8, and } n_{5,\#1} \neq n_{k,\#2} \text{ holds for all the value of } k\}\\
&\text{or } \{k \text{ is an integer from 1 to 8, and } n_{6,\#1} \neq n_{k,\#2} \text{ holds for all the value of } k\}\\
&\text{or } \{k \text{ is an integer from 1 to 8, and } n_{7,\#1} \neq n_{k,\#2} \text{ holds for all the value of } k\}\\
&\text{or } \{k \text{ is an integer from 1 to 8, and } n_{8,\#1} \neq n_{k,\#2} \text{ holds for all the value of } k\}\\
&\}\\
&\text{or}\\
&\{\\
&\{k \text{ is an integer from 9 to 16, and } n_{9,\#1} \neq n_{k,\#2} \text{ holds for all the value of } k\}\\
&\text{or } \{k \text{ is an integer from 9 to 16, and } n_{10,\#1} \neq n_{k,\#2} \text{ holds for all the value of } k\}\\
&\text{or } \{k \text{ is an integer from 9 to 16, and } n_{11,\#1} \neq n_{k,\#2} \text{ holds for all the value of } k\}\\
&\text{or } \{k \text{ is an integer from 9 to 16, and } n_{12,\#1} \neq n_{k,\#2} \text{ holds for all the value of } k\}\\
&\text{or } \{k \text{ is an integer from 9 to 16, and } n_{13,\#1} \neq n_{k,\#2} \text{ holds for all the value of } k\}\\
&\text{or } \{k \text{ is an integer from 9 to 16, and } n_{14,\#1} \neq n_{k,\#2} \text{ holds for all the value of } k\}\\
&\text{or } \{k \text{ is an integer from 9 to 16, and } n_{15,\#1} \neq n_{k,\#2} \text{ holds for all the value of } k\}\\
&\text{or } \{k \text{ is an integer from 9 to 16, and } n_{16,\#1} \neq n_{k,\#2} \text{ holds for all the value of } k\}\\
&\}
\end{aligned}
$$

Therefore, the receiver has a higher possibility of obtaining the high data reception quality in both <error correction scheme #5> and <error correction scheme #6> (because <error correction scheme #5> differs from <error correction scheme #6> in a suitable set of $n_1$, $n_2$, $n_3$, $n_4$, $n_5$, $n_6$, $n_7$, $n_8$, $n_9$, $n_{10}$, $n_{11}$, $n_{12}$, $n_{13}$, $n_{14}$, $n_{15}$, and $n_{16}$).

The following is a summary of the above.

The following two error correction schemes are considered.

<Error Correction Scheme #5*>

The coding is performed using the block code having coding rate A and the block length (code length) of B bits (A is a real number, 0<A<1 holds, and B is an integer larger than 0).

<Error Correction Scheme #6*>

The coding is performed using the block code having coding rate A and the block length (code length) of C bits (A is a real number, 0<A<1 holds, C is an integer larger than 0, and B≠C holds).

It is assumed that 16QAM in FIG. 119 is used in the transmitter in FIG. 125. At this point, the transmitter in FIG. 125 sets $k_1=k_{1,\#1}$ and $k_2=k_{2,\#1}$ in FIG. 119 using <error correction scheme #5*>, and sets $k_1=k_{1,\#2}$ and $k_2=k_{2,\#2}$ in FIG. 119 using <error correction scheme #6*>. At this point, <Condition #H16> preferably holds.

It is assumed that 64QAM in FIG. 120 is used in the transmitter in FIG. 125. At this point, the transmitter in FIG. 125 sets $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$, and $m_8=m_{8,\#1}$ in FIG. 120 using <error correction scheme #5*>, and sets $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$, and $m_8=m_{8,\#2}$ in FIG. 120 using <error correction scheme #6*>. At this point, <Condition #H17> preferably holds.

It is assumed that 256QAM in FIG. 121 is used in the transmitter in FIG. 125. At this point, the transmitter in FIG. 125 sets $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$, and $n_{16}=n_{16,\#1}$ in FIG. 121 using <error correction scheme #5*>, and sets $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ in FIG. 121 using <error correction scheme #6*>. At this point, <Condition #H18> preferably holds.

Although the detailed configuration is not illustrated in FIGS. 125 and 127, similarly the modulated signal can be transmitted and received using the OFDM scheme and spectral spread communication scheme, which are described in another exemplary embodiment.

Example 4

As described above with reference to FIG. 126, sometimes the transmitter in FIG. 125 performs the transmission method with the space-time block code, when the one-stream signal is transmitted using at least one antenna, or when the precoding, the phase change, and the power change are performed. It is assumed that the transmitter in FIG. 125 performs the following coding.

"The coding is performed using the block code having coding rate A and the block length (code length) of B bits (A is a real number, 0<A<1 holds, and B is an integer larger than 0)."

The following transmission methods are defined.

Transmission method #1: the one-stream signal is transmitted using at least one antenna.

Transmission method #2: the precoding, the phase change, and the power change are performed.

Transmission method #3: the space-time block code is used.

It is assumed that 16QAM in FIG. 111 is used in the transmitter in FIG. 125. At this point, the transmitter in FIG. 125 sets $f=f_{\#1}$ in FIG. 111 when transmission method #X is adopted, and sets $f=f_{\#2}$ in FIG. 111 when transmission method #Y is adopted. At this point, <Condition #H19>

$f_{\#1}\neq 1$ and $f_{\#2}+1$ and $f_{\#1}\neq f_{\#2}$ preferably hold, where (X,Y)=(1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable value of f).

It is assumed that 64QAM in FIG. 112 is used in the transmitter in FIG. 125. At this point, the transmitter in FIG. 125 sets $g_1=g_{1,\#1}$, $g_2=g_{2,\#1}$, and $g_3=g_{3,\#1}$ in FIG. 112 when transmission method #X is adopted, and sets $g_1=g_{1,\#2}$, $g_2=g_{2,\#2}$, and $g_3=g_{3,\#2}$ in FIG. 112 when transmission method #Y is adopted. Therefore, the following condition preferably holds.

<Condition #H20>

$\{(g_{1,\#1},g_{2,\#1},g_{3,\#1})\neq(1,3,5)$ and $(g_{1,\#1},g_{2,\#1},g_{3,\#1})\neq(1,5,3)$ and $(g_{1,\#1},g_{2,\#1},g_{3,\#1})\neq(3,1,5)$ and $(g_{1,\#1},g_{2,\#1},g_{3,\#1})\neq(3,5,1)$ and $(g_{1,\#1},g_{2,\#1},g_{3,\#1})\neq(5,1,3)$ and $(g_{1,\#1},g_{2,\#1},g_{3,\#1})\neq(5,3,1)\}$ and $\{(g_{1,\#2},g_{2,\#2},g_{3,\#2})\neq(1,3,5)$ and $(g_{1,\#2},g_{2,\#2},g_{3,\#2})\neq(1,5,3)$ and $(g_{1,\#2},g_{2,\#2},g_{3,\#2})\neq(3,1,5)$ and $(g_{1,\#2},g_{2,\#2},g_{3,\#2})\neq(3,5,1)$ and $(g_{1,\#2},g_{2,\#2},g_{3,\#2})\neq(5,1,3)$ and $(g_{1,\#2},g_{2,\#2},g_{3,\#2})\neq(5,3,1)\}$ and $\{\{g_{1,\#1}\neq g_{1,\#2}$ or $g_{2,\#1}\neq g_{2,\#2}$ or $g_{3,\#1}\neq g_{3,\#2}\}$ holds.} hold, where (X,Y)=(1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable set of $g_1$, $g_2$, and $g_3$).

It is assumed that 256QAM in FIG. 113 is used in the transmitter in FIG. 125. At this point, the transmitter in FIG. 125 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ in FIG. 113 when transmission method #X is adopted, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ in FIG. 113 when transmission method #Y is adopted. Therefore, the following condition preferably holds.

<Condition #H21>

{When {a1 is an integer from 1 to 7 and a2 is an integer from 1 to 7 and a3 is an integer from 1 to 7 and a4 is an integer from 1 to 7 and a5 is an integer from 1 to 7 and a6 is an integer from 1 to 7 and a7 is an integer from 1 to 7} and {x is an integer from 1 to 7 and y is an integer from 1 to 7 and x≠y} and {ax≠ay holds for all values x and y} hold, $(h_{a1,\#1},h_{a2,\#1},h_{a3,\#1},h_{a4,\#1},h_{a5,\#1},h_{a6,\#1},h_{a7,\#1})\neq(1,3,5,7,9,11,13)$ holds.}, and {when {a1 is an integer from 1 to 7 and a2 is an integer from 1 to 7 and a3 is an integer from 1 to 7 and a4 is an integer from 1 to 7 and a5 is an integer from 1 to 7 and a6 is an integer from 1 to 7 and a7 is an integer from 1 to 7} and {x is an integer from 1 to 7 and y is an integer from 1 to 7 and x≠y} and {ax≠ay holds for all values x and y} hold, $(h_{a1,\#2},h_{a2,\#2},h_{a3,\#2},h_{a4,\#2},h_{a5,\#2},h_{a6,\#2},h_{a7,\#2})\neq(1,3,5,7,9,11,13)$ holds.} and $\{\{h_{1,\#1}\neq h_{1,\#2}$ or $h_{2,\#1}\neq h_{2,\#2}$ or $h_{3,\#1}\neq h_{3,\#2}$ or $h_{4,\#1}\neq h_{4,\#2}$ or $h_{5,\#1}\neq h_{5,\#2}$ or $h_{6,\#1}\neq h_{6,\#2}$ or $h_{7,\#1}\neq h_{7,\#2}\}$ holds.} hold, where (X,Y)=(1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable set of $h_1$, $h_2$, $h_3$, $h_4$, $h_5$, $h_6$, and $h_7$).

Example 5

As described above with reference to FIG. 126, sometimes the transmitter in FIG. 125 performs the transmission method with the space-time block code, when the one-stream signal is transmitted using at least one antenna, or when the precoding, the phase change, and the power change are performed. It is assumed that the transmitter in FIG. 125 performs the following coding.

"The coding is performed using the block code having coding rate A and the block length (code length) of B bits (A is a real number, $0<A<1$ holds, and B is an integer larger than 0)."

The following transmission methods are defined.

Transmission method #1: the one-stream signal is transmitted using at least one antenna.

Transmission method #2: the precoding, the phase change, and the power change are performed.

Transmission method #3: the space-time block code is used.

It is assumed that 16QAM in FIG. 114 is used in the transmitter in FIG. 125. At this point, the transmitter in FIG. 125 sets $f_1=f_{1,\#1}$ and $f_2=f_{2,\#1}$ in FIG. 114 when transmission method #X is adopted, and sets $f_1=f_{1,\#2}$ and $f_2=f_{2,\#2}$ in FIG. 114 when transmission method #Y is adopted. At this point, <Condition #H22>

$\{f_{1,\#1}\neq f_{1,\#2}$ or $f_{2,\#1}\neq f_{2,\#2}\}$ preferably holds, where (X,Y)=(1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable set of $f_1$ and $f_2$).

It is assumed that 64QAM in FIG. 115 is used in the transmitter in FIG. 125. At this point, the transmitter in FIG. 125 sets $g_1=g_{1,\#1}$, $g_2=g_{2,\#1}$, $g_3=g_{3,\#1}$, $g_4=g_{4,\#1}$, $g_5=g_{5,\#1}$, and $g_6=g_{6,\#1}$ in FIG. 115 when transmission method #X is adopted, and sets $g_1=g_{1,\#2}$, $g_2=g_{2,\#2}$, $g_3=g_{3,\#2}$, $g_4=g_{4,\#2}$, $g_5=g_{5,\#2}$, and $g_6=g_{6,\#2}$ in FIG. 115 when transmission method #Y is adopted. Therefore, the following condition preferably holds.

<Condition #H23>

{

$\{\{g_{1,\#1}\neq g_{1,\#2}$ and $g_{1,\#1}\neq g_{2,\#2}$ and $g_{1,\#1}\neq g_{3,\#2}\}$ or $\{g_{2,\#1}\neq g_{1,\#2}$ and $g_{2,\#1}\neq g_{2,\#2}$ and $g_{2,\#1}\neq g_{3,\#2}\}$ or $\{g_{3,\#1}\neq g_{1,\#2}$ and $g_{3,\#1}\neq g_{2,\#2}$ and $g_{3,\#1}\neq g_{3,\#2}\}$ holds.} or $\{\{g_{4,\#1}\neq g_{4,\#2}$ and $g_{4,\#1}\neq g_{5,\#2}$ and $g_{4,\#1}\neq g_{6,\#2}\}$ or $\{g_{5,\#1}\neq g_{4,\#2}$ and $g_{5,\#1}\neq g_{5,\#2}$ and $g_{5,\#1}\neq g_{6,\#2}\}$ or $\{g_{6,\#1}\neq g_{4,\#2}$ and $g_{6,\#1}\neq g_{5,\#2}$ and $g_{6,\#1}\neq g_{6,\#2}\}$ holds.

} holds, where (X,Y) = (1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable set of $g_1$, $g_2$, $g_3$, $g_4$, $g_5$, and $g_6$).

It is assumed that 256QAM in FIG. 116 is used in the transmitter in FIG. 125. At this point, the transmitter in FIG. 125 sets $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, $h_7=h_{7,\#1}$, $h_8=h_{8,\#1}$, $h_9=h_{9,\#1}$, $h_{10}=h_{10,\#1}$, $h_{11}=h_{11,\#1}$, $h_{12}=h_{12,\#1}$, $h_{13}=h_{13,\#1}$, and $h_{14}=h_{14,\#1}$ in FIG. 116 when transmission method #X is adopted, and sets $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, $h_7=h_{7,\#2}$, $h_8=h_{8,\#2}$, $h_9=h_{9,\#2}$, $h_{10}=h_{10,\#2}$, $h_{11}=h_{11,\#2}$, $h_{12}=h_{12,\#2}$, $h_{13}=h_{13,\#2}$, and $h_{14}=h_{14,\#2}$ in FIG. 116 when transmission method #Y is adopted. Therefore, the following condition preferably holds.

<Condition #H24>

{
{k is an integer from 1 to 7, and $h_{1,\#1} \neq h_{k,\#2}$ holds for all the value of k}
or {k is an integer from 1 to 7, and $h_{2,\#1} \neq h_{k,\#2}$ holds for all the value of k}
or {k is an integer from 1 to 7, and $h_{3,\#1} \neq h_{k,\#2}$ holds for all the value of k}
or {k is an integer from 1 to 7, and $h_{4,\#1} \neq h_{k,\#2}$ holds for all the value of k}
or {k is an integer from 1 to 7, and $h_{5,\#1} \neq h_{k,\#2}$ holds for all the value of k}
or {k is an integer from 1 to 7, and $h_{6,\#1} \neq h_{k,\#2}$ holds for all the value of k}
or {k is an integer from 1 to 7, and $h_{7,\#1} \neq h_{k,\#2}$ holds for all the value of k}
}
or
{
{k is an integer from 8 to 14, and $h_{8,\#1} \neq h_{k,\#2}$ holds for all the value of k}
or {k is an integer from 8 to 14, and $h_{9,\#1} \neq h_{k,\#2}$ holds for all the value of k}
or {k is an integer from 8 to 14, and $h_{10,\#1} \neq h_{k,\#2}$ holds for all the value of k}
or {k is an integer from 8 to 14, and $h_{11,\#1} \neq h_{k,\#2}$ holds for all the value of k}
or {k is an integer from 8 to 14, and $h_{12,\#1} \neq h_{k,\#2}$ holds for all the value of k}
or {k is an integer from 8 to 14, and $h_{13,\#1} \neq h_{k,\#2}$ holds for all the value of k}
or {k is an integer from 8 to 14, and $_{h14,\#1} \neq h_{k,\#2}$ holds for all the value of k}
} where (X,Y) = (1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable set of $h_1$, $h_2$, $h_3$, $h_4$, $h_5$, $h_6$, $h_7$, $h_8$, $h_9$, $h_{10}$, $h_{11}$, $h_{12}$, $h_{13}$, and $h_{14}$).

Example 6

As described above with reference to FIG. 126, sometimes the transmitter in FIG. 125 performs the transmission method with the space-time block code, when the one-stream signal is transmitted using at least one antenna, or when the precoding, the phase change, and the power change are performed. It is assumed that the transmitter in FIG. 125 performs the following coding.

"The coding is performed using the block code having coding rate A and the block length (code length) of B bits (A is a real number, $0<A<1$ holds, and B is an integer larger than 0)."

The following transmission methods are defined.

Transmission method #1: the one-stream signal is transmitted using at least one antenna.

Transmission method #2: the precoding, the phase change, and the power change are performed.

Transmission method #3: the space-time block code is used.

It is assumed that 16QAM in FIG. 119 is used in the transmitter in FIG. 125. At this point, the transmitter in FIG. 125 sets $k_1=k_{1,\#1}$ and $k_2=k_{2,\#1}$ in FIG. 119 when transmission method #X is adopted, and sets $k_1=k_{1,\#2}$ and $k_2=k_{2,\#2}$ in FIG. 119 when transmission method #Y is adopted. At this point, <Condition #H25>

$\{k_{1,\#1} \neq k_{1,\#2}$ or $k_{2,\#1}+k_{2,\#2}\}$ preferably holds, where (X,Y)=(1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable set of $k_1$ and $k_2$).

It is assumed that 64QAM in FIG. 120 is used in the transmitter in FIG. 125. At this point, the transmitter in FIG. 125 sets $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$, and $m_8=m_{8,\#1}$ in FIG. 120 when transmission method #X is adopted, and sets $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$, and $m_8=m_{8,\#2}$ in FIG. 120 when transmission method #Y is adopted. Therefore, the following condition preferably holds.

<Condition #H26>

{
{{$m_{1,\#1} \neq m_{1,\#2}$ and $m_{1,\#1} \neq m_{2,\#2}$ and $m_{1,\#1} \neq m_{3,\#2}$ and $m_{1,\#1} \neq m_{4,\#2}$} or {$m_{2,\#1} \neq m_{1,\#2}$ and $m_{2,\#1} \neq m_{2,\#2}$ and $m_{2,\#1} \neq m_{3,\#2}$ and $m_{2,\#1} \neq m_{4,\#2}$} or {$m_{3,\#1} \neq m_{1,\#2}$ and $m_{3,\#1} \neq m_{2,\#2}$ and $m_{3,\#1} \neq m_{3,\#2}$ and $m_{3,\#1} \neq m_{4,\#2}$} or {$m_{4,\#1} \neq m_{1,\#2}$ and $m_{4,\#1} \neq m_{2,\#2}$ and $m_{4,\#1} \neq m_{3,\#2}$ and $m_{4,\#1} \neq m_{4,\#2}$}
holds.}
or
{{$m_{5,\#1} \neq m_{5,\#2}$ and $m_{5,\#1} \neq m_{6,\#2}$ and $m_{5,\#1} \neq m_{7,\#2}$ and $m_{5,\#1} \neq m_{8,\#2}$} or {$m_{6,\#1} \neq m_{5,\#2}$ and $m_{6,\#1} \neq m_{6,\#2}$ and $m_{6,\#1} \neq m_{7,\#2}$ and $m_{6,\#1} \neq m_{8,\#2}$} or {$m_{7,\#1} \neq m_{5,\#2}$ and $m_{7,\#1} \neq m_{6,\#2}$ and $m_{7,\#1} \neq m_{7,\#2}$ and $m_{7,\#1} \neq m_{8,\#2}$} or {$m_{8,\#1} \neq m_{5,\#2}$ and $m_{8,\#1} \neq m_{6,\#2}$ and $m_{8,\#1} \neq m_{7,\#2}$ and $m_{8,\#1} \neq m_{8,\#2}$}
holds.}
}
holds, where (X,Y) = (1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable set of $m_1$, $m_2$, $m_3$, $m_4$, $m_5$, $m_6$, $m_7$, and $m_8$).

It is assumed that 256QAM in FIG. 121 is used in the transmitter in FIG. 125. At this point, the transmitter in FIG. 125 sets $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$, and $n_{16}=n_{16,\#1}$ in FIG. 121 when transmission method #X is adopted, and sets $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ in FIG. 121 when transmission method #Y is adopted. Therefore, the following condition preferably holds.

<Condition #H27>

{
{k is an integer from 1 to 8, and $n_{1,\#1} \neq n_{k,\#2}$ holds for all the value of k}
or {k is an integer from 1 to 8, and $n_{2,\#1} \neq n_{k,\#2}$ holds for all the value of k}
or {k is an integer from 1 to 8, and $n_{3,\#1} \neq n_{k,\#2}$ holds for all the value of k}
or {k is an integer from 1 to 8, and $n_{4,\#1} \neq n_{k,\#2}$ holds for all the value of k}
or {k is an integer from 1 to 8, and $n_{5,\#1} \neq n_{k,\#2}$ holds for all the value of k}
or {k is an integer from 1 to 8, and $n_{6,\#1} \neq n_{k,\#2}$ holds for all the value of k}
or {k is an integer from 1 to 8, and $n_{7,\#1} \neq n_{k,\#2}$ holds for all the value of k}
or {k is an integer from 1 to 8, and $n_{8,\#1} \neq n_{k,\#2}$ holds for all the value of k}
}
or
{
{k is an integer from 9 to 16, and $n_{9,\#1} \neq n_{k,\#2}$ holds for all the value of k}
or {k is an integer from 9 to 16, and $n_{10,\#1} \neq n_{k,\#2}$ holds for all the value of k}
or {k is an integer from 9 to 16, and $n_{11,\#1} \neq n_{k,\#2}$ holds for all the value of k}
or {k is an integer from 9 to 16, and $n_{12,\#1} \neq n_{k,\#2}$ holds for all the value of k}
or {k is an integer from 9 to 16, and $n_{13,\#1} \neq n_{k,\#2}$ holds for all the value of k}
or {k is an integer from 9 to 16, and $n_{14,\#1} \neq n_{k,\#2}$ holds for all the value of k}
or {k is an integer from 9 to 16, and $n_{15,\#1} \neq n_{k,\#2}$ holds for all the value of k}
or {k is an integer from 9 to 16, and $n_{16,\#1} \neq n_{k,\#2}$ holds for all the value of k}
}
, where (X,Y) = (1,2) or (1,3) or (2,3).

Therefore, the receiver has a high possibility of obtaining the high data reception quality in both the adoption of transmission method #X and the adoption of transmission method #Y (the adoption of transmission method #X differs from the adoption of transmission method #Y in a suitable set of $n_1$, $n_2$, $n_3$, $n_4$, $n_5$, $n_6$, $n_7$, $n_8$, $n_9$, $n_{10}$, $n_{11}$, $n_{12}$, $n_{13}$, $n_{14}$, $n_{15}$, and $n_{16}$).

Although the detailed configuration is not illustrated in FIGS. 125 and 127, similarly the modulated signal can be transmitted and received using the OFDM scheme and spectral spread communication scheme, which are described in another exemplary embodiment.

As described above, when the transmitter performs the modulation (mapping) to transmit the modulated signal, the transmitter transmits the control information such that the receiver can identify the modulation scheme and the parameters of the modulation scheme, which allows the receiver in FIG. 127 to perform signal detection and the demapping (demodulation) by obtaining the control information.

(Supplement 7)

The plurality of exemplary embodiments and supplements may be combined.

The contents of the exemplary embodiments and supplements are described only by way of example. For example, even if "the modulation scheme, the error correction coding scheme (such as the error correction code, code length, and coding rate, which should be used), and the control information" are illustrated, the contents can be performed by the similar configuration in the case that "another modulation scheme, another error correction coding scheme (such as the error correction code, code length, and coding rate, which should be used), and another control information" are applied.

The contents of the exemplary embodiments and supplements can be performed even if a modulation scheme except for the modulation scheme of the present disclosure modulation scheme is used. For example, APSK (Amplitude Phase Shift Keying) (such as 16APSK, 64APSK, 128APSK, 256APSK, 1024APSK, and 4096APSK), PAM (Pulse Amplitude Modulation) (such as 4PAM, 8PAM, 16PAM, 64PAM, 128PAM, 256PAM, 1024PAM, and 4096PAM), PSK (Phase Shift Keying) (such as BPSK, QPSK, 8PSK, 16PSK, 64PSK, 128PSK, 256PSK, 1024PSK, and 4096PSK), QAM (Quadrature Amplitude Modulation) (such as 4QAM, 8QAM, 16QAM, 64QAM, 128QAM, 256QAM, 1024QAM, and 4096QAM) may be applied, or uniform mapping and nonuniform modulation scheme may be performed.

The method for arranging the 2, 4, 8, 16, 64, 128, 256, or 1024 signal points in the I-Q plane (the modulation scheme having the 2, 4, 8, 16, 64, 128, 256, or 1024 signal points) may be switched by the time, the frequency, or the time and frequency.

The configuration (for example, FIGS. 5, 6, 7, 97, and 98) that performs the pieces of processing such as the precoding (weighting synthesis), the phase change, and the power change on modulated signal s1 pursuant to the first modulation scheme and modulated signal s2 pursuant to the second modulation scheme are described above. Each exemplary embodiment may be implemented by performing the following processing instead of the above pieces of processing.

The processing method will be described below.

FIGS. 129 and 130 illustrate modifications of "the configuration (for example, FIGS. 5, 6, 7, 97, and 98) that performs the pieces of processing such as the precoding (weighting synthesis), the phase change, and the power change on modulated signal s1 pursuant to the first modulation scheme and modulated signal s2 pursuant to the second modulation scheme".

In the configuration of FIGS. 129 and 130, a phase changer is added to a front stage of weighting synthesis (precoding). The component similar to that in FIGS. 5, 6, and 7 is designated by the identical reference mark, and the detailed description is omitted.

Phase changer 12902 in FIG. 129 performs first phase change processing on modulated signal 12901 output from mapper 504 such that a phase of modulated signal 12901 differs from that of modulated signal 505A, and outputs phase-changed modulated signal $s_2(t)$ (505B) to power changer 506B.

Phase changer 13002 in FIG. 130 performs first phase change processing on modulated signal 13001 output from mapper 504 such that a phase of modulated signal 13001 differs from that of modulated signal 505A, and outputs phase-changed modulated signal $s_2(t)$ (505B) to power changer 506B.

FIG. 131 illustrates a modification of the configuration example of the transmitter in FIG. 129. FIG. 132 illustrates a modification of the configuration example of the transmitter in FIG. 130.

Phase changer 13102 in FIG. 131 performs second phase change processing on modulated signal 13101 output from mapper 504, and outputs phase-changed modulated signal s1 (t) (505A) to power changer 506A.

Phase changer 13202 in FIG. 132 performs second phase change processing on modulated signal 13201 output from mapper 504, and outputs phase-changed modulated signal s1 (t) (505A) to power changer 506A.

As illustrated in FIGS. 131 and 132, the phase change may be performed on not only one of the modulated signals output from the mapper but also both the modulated signals.

The phase change processing of phase changers (12902, 13002, 13102, and 13202) can be given by the following numerical expression.

[Mathematical formula 374]

$$\begin{pmatrix} I' \\ Q' \end{pmatrix} = \begin{pmatrix} \cos(\lambda(i)) & -\sin(\lambda(i)) \\ \sin(\lambda(i)) & \cos(\lambda(i)) \end{pmatrix} \begin{pmatrix} I \\ Q \end{pmatrix}$$

In the formula, λ(i) is a phase, λ(i) is a function of i (for example, the time, the frequency, and the slot), I and Q are an in-phase component of the input signal and a quadrature component, and phase changers (12902, 13002, 13102, and 13202) output I' and Q'.

The receiver that receives the modulated signal transmitted using the configurations in FIGS. 129 to 132 performs the signal processing corresponding to the above signal processing, and obtains the log-likelihood ratio of each bit included in the modulated signal.

The method for arranging the 2, 4, 8, 16, 64, 128, 256, or 1024 signal points in the I-Q plane (the modulation scheme having the 2, 4, 8, 16, 64, 128, 256, or 1024 signal points) is not limited to the signal point arranging method of the above modulation schemes. Accordingly, the mapper has the function of outputting the in-phase component and the quadrature component based on the plurality of bits, and then performing the precoding and the phase change becomes effective function of the present disclosure.

In the twelfth exemplary embodiments, the precoding weight and the phase are changed on the time axis. However, as described above, the twelfth exemplary embodiment can be implemented even if the multi-carrier transmission scheme such as the OFDM transmission is used. Particularly, when the precoding switching method is changed only by the number of transmitted signals, the receiver can recognize the method for switching the precoding weight and the phase by obtaining the information about the number of transmitted signals transmitted from the transmitter.

In the description, for example, it is conceivable that communication and broadcasting equipment such as a broadcasting station, a base station, an access point, a terminal, and a mobilephone includes the transmitter, and it is conceivable that communication equipment such as a television set, a radio receiver, a terminal, a personal computer, a mobilephone, an access point, and a base station includes the receiver. The transmitter and receiver of the present disclosure are equipment having a communication function, and it is conceivable that the equipment can be connected to a device, such as a television set, a radio receiver, a terminal, a personal computer, and a mobilephone, which executes an application, through a certain interface.

In the twelfth exemplary embodiments, the symbols, such as the pilot symbol (for example, a preamble, a unique word, a post-amble, and a reference symbol) and the control information symbol, which excludes the data symbol, may be arranged in the frame in any way. Although the terms of the pilot symbol and control information symbol are used, any way of calling may be used and the function itself is required.

For example, the pilot symbol may be a known symbol modulated using the PSK modulation in the transmitter and receiver (or the receiver may recognize the symbol transmitted from the transmitter by synchronizing with the transmitter), and the receiver performs the frequency synchronization, the time synchronization, the channel estimation (of each modulated signal) (estimation of CSI (Channel State Information)), and the signal detection using the pilot symbol.

The control information symbol is used to transmit the information (for example, the coding rates of the modulation scheme, error correction coding scheme, and error correction coding scheme, which are used in the communication, and setting information in an upper layer) necessary to be transmitted to the communication partner in order to conduct communication except for the data (of the application).

The present disclosure is not limited to each exemplary embodiment, and various changes can be made. For example, each exemplary embodiment is implemented as the communication device. Alternatively, the communication method used in the communication device may be performed as software.

The precoding switching method in the method for transmitting the two modulated signals from the two antennas is described above. Alternatively, a method for performing the precoding on four mapped signals, generating four modulated signals, and transmitting the four modulated signals from four antennas, namely, a method for performing the precoding on N mapped signals, generating N modulated signals, and transmitting the N modulated signals from N antennas can similarly be performed as the precoding switching method for changing the precoding weight (matrix).

In the description, the terms of the precoding and the precoding weight are used. However, in the present disclosure, any way of calling may be used and the function itself is required.

Different pieces of data may be transmitted using streams s1(t) and s2(t), or identical data may be transmitted using streams s1(t) and s2(t).

Although one transmitting antenna for the transmitter and one receiving antenna for the receiver are illustrated in the drawings, the transmitter and receiver may be constructed with a plurality of antennas.

There is a frame transmitted from the transmitter, which is omitted depending on the exemplary embodiment in which it is necessary to notify the transmitter and receiver of the transmission method (MIMO, SISO, the space-time block code, the interleaving scheme), the modulation scheme, and the error correction coding scheme. The receiver changes the operation by obtaining the frame.

The bit length adjusting method is described in the first to eleventh exemplary embodiments, and the case that the bit length adjusting methods of the first to eleventh exemplary embodiments are applied to the DVB standard is described in the twelfth exemplary embodiment. In the first to twelfth exemplary embodiments, the bit length adjusting method in the transmitter is described with reference to FIGS. 57, 60, 73, 78, 79, 80, 83, 91, and 93, and the operation of the receiver is described with reference to FIGS. 85, 87, 88, and 96. In the first to twelfth exemplary embodiments, the MIMO transmission method (the precoding (weighting synthesis), the power change, and the phase change are used) is described with reference to FIGS. 5, 6, 7, 97, and 98.

At this point, the first to twelfth exemplary embodiments can be implemented, even if the space-time block code and the space-frequency block code (symbols are arranged in the frequency direction) in FIG. 128 (sometimes referred to as MISO transmission scheme or transmission diversity) is used instead of the MIMO transmission method (precoding (weighting synthesis), the power change, and the phase change are used) in FIGS. 5, 6, 7, 97, and 98 as the transmission method after the bit length adjustments of the first to twelfth exemplary embodiments. That is, the bit series (digital signal) in which the bit length is adjusted using the configurations in FIGS. 57, 60, 73, 78, 79, 80, 83, 91, and 93 corresponds to data signal 12801 in FIG. 128, and then the mapping and the MISO processing are performed as illustrated in FIG. 128.

The method of the space-time block code and the space-frequency block code (symbols are arranged in the frequency direction) (sometimes referred to as MISO transmission scheme or transmission diversity) is not limited to the configuration in FIG. 128, but the space-time block code and the space-frequency block code may be transmitted as illustrated in FIG. 133. The configuration in FIG. 133 will be described below (in FIG. 133, the component similar to that in FIG. 128 is designated by the identical reference mark).

Data signal (error-correction-coded data) 12801 and control signal 12806 are input to mapper 12802, and mapper 12802 performs the mapping based on the information about the modulation scheme included in control signal 12806, and outputs mapped signal 12803. For example, it is assumed that mapped signal 12803 is arranged in the order of s0,s1,s2,s3, . . . ,s(2i),s(2i+1), . . . (i is an integer of 0 or more).

Mapped signal 12803 and control signal 12806 are input to MISO (Multiple Input Multiple Output) processor 12804, and MISO processor 12804 outputs post-MISO-processing signals 12805A and 12805B in the case that control signal 12806 issues an instruction to transmit the signal using the MISO (Multiple Input Multiple Output) scheme. For example, post-MISO-processing signal 12805A is s0, −s1*, s2, −s3*, . . . , s(2i), −s(2i+1)*, . . . , and post-MISO-processing signal 12805B is s1, s0*s3, s2*, . . . , s(2i+1), s(2i)*, . . . . The mark means a complex conjugate.

At this point, post-MISO-processing signals 12805A and 12805B correspond to post-processing baseband signals 12502A and 12502B in FIG. 125, respectively. The space-time block coding method is not limited to the above method. Post-processing baseband signal 12502A, control symbol signal 12208, pilot symbol signal 12209, and frame configuration signal 12210 are input to radio section 12503A, and radio section 12503A outputs transmitted signal 12504A as the radio wave from antenna #1 (12505A) based on frame configuration signal 12210.

Post-processing baseband signal 12502B, control symbol signal 12208, pilot symbol signal 12209, and frame configuration signal 12210 are input to radio section 12503B, and radio section 12503B outputs transmitted signal 12504B as the radio wave from antenna #2 (12505B) based on frame configuration signal 12210.

The bit length adjusting method is described in the first to eleventh exemplary embodiments, and the case that the bit length adjusting methods of the first to eleventh exemplary embodiments are applied to the DVB standard is described in the twelfth exemplary embodiment. In the first to twelfth exemplary embodiments, the bit length adjusting method in the transmitter is described with reference to FIGS. 57, 60, 73, 78, 79, 80, 83, 91, and 93, and the operation of the receiver is described with reference to FIGS. 85, 87, 88, and 96. In the first to twelfth exemplary embodiments, the MIMO transmission method (the precoding (weighting synthesis), the power change, and the phase change are used) is described with reference to FIGS. 5, 6, 7, 97, and 98.

At this point, the first to twelfth exemplary embodiments can be implemented, even if the single-stream transmission is performed instead of the MIMO transmission method (precoding (weighting synthesis), the power change, and the phase change are used) in FIGS. 5, 6, 7, 97, and 98 as the transmission method after the bit length adjustments of the first to twelfth exemplary embodiments.

That is, the bit series (digital signal) in which the bit length is adjusted using the configurations in FIGS. 57, 60, 73, 78, 79, 80, 83, 91, and 93 corresponds to bit series 503 in FIGS. 5, 6, and 7 or bit series 9701 in FIGS. 97 and 98, and is input to mapper 504 in FIGS. 5, 6, and 7 or mapper 9702 in FIGS. 97 and 98.

Modulation scheme α of $s_1(t)$ is used to transmit the x-bit data, but the data is not transmitted in s2(t) (non-modulation, data transmission of y=0 bit). Accordingly, (x+y=x+0=x) is obtained. For (x+y=x+0=x), the first to twelfth exemplary embodiments can also be implemented in the case that the single stream is transmitted.

(Supplement 8)

Matrix F for the weighting synthesis (precoding) is indicated in the description. Alternatively, each exemplary embodiment of the present disclosure can be implemented even if the following precoding matrix F (or F(i)) is used.

[Mathematical formula 375]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{Formula (H10)}$$

or

[Mathematical formula 376]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{Formula (H11)}$$

or

[Mathematical formula 377]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{Formula (H12)}$$

or

[Mathematical formula 378]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{Formula (H13)}$$

or

-continued

[Mathematical formula 379]

$$F = \begin{pmatrix} \beta\times\alpha\times e^{j0} & \beta\times e^{j\pi} \\ \beta\times e^{j0} & \beta\times\alpha\times e^{j0} \end{pmatrix} \quad \text{Formula (H14)}$$

or

[Mathematical formula 380]

$$F = \frac{1}{\sqrt{\alpha^2+1}}\begin{pmatrix} \alpha\times e^{j0} & e^{j\pi} \\ e^{j0} & \alpha\times e^{j0} \end{pmatrix} \quad \text{Formula (H15)}$$

or

[Mathematical formula 381]

$$F = \begin{pmatrix} \beta\times\alpha\times e^{j0} & \beta\times e^{j0} \\ \beta\times e^{j0} & \beta\times\alpha\times e^{j\pi} \end{pmatrix} \quad \text{Formula (H16)}$$

or

[Mathematical formula 382]

$$F = \frac{1}{\sqrt{\alpha^2+1}}\begin{pmatrix} \alpha\times e^{j0} & e^{j0} \\ e^{j0} & \alpha\times e^{j\pi} \end{pmatrix} \quad \text{Formula (H17)}$$

In equations (H10), (H11), (H12), (H13), (F14), (H15), (H16), and (H17), α may be either a real number or an imaginary number, and β may be either a real number or an imaginary number. However, α is not 0 (zero). Also β is not 0 (zero), or

[Mathematical formula 383]

$$F = \begin{pmatrix} \beta\times\cos\theta & \beta\times\sin\theta \\ \beta\times\sin\theta & -\beta\times\cos\theta \end{pmatrix} \quad \text{Formula (H18)}$$

or

[Mathematical formula 384]

$$F = \begin{pmatrix} \cos\theta & \sin\theta \\ \sin\theta & -\cos\theta \end{pmatrix} \quad \text{Formula (H19)}$$

or

[Mathematical formula 385]

$$F = \begin{pmatrix} \beta\times\cos\theta & -\beta\times\sin\theta \\ \beta\times\sin\theta & \beta\times\cos\theta \end{pmatrix} \quad \text{Formula (H20)}$$

or

[Mathematical formula 386]

$$F = \begin{pmatrix} \cos\theta & -\sin\theta \\ \sin\theta & \cos\theta \end{pmatrix} \quad \text{Formula (H21)}$$

or

[Mathematical formula 387]

$$F = \begin{pmatrix} \beta\times\sin\theta & -\beta\times\cos\theta \\ \beta\times\cos\theta & \beta\times\sin\theta \end{pmatrix} \quad \text{Formula (H22)}$$

or

[Mathematical formula 388]

$$F = \begin{pmatrix} \sin\theta & -\cos\theta \\ \cos\theta & \sin\theta \end{pmatrix} \quad \text{Formula (H23)}$$

or

[Mathematical formula 389]

$$F = \begin{pmatrix} \beta\times\sin\theta & \beta\times\cos\theta \\ \beta\times\cos\theta & -\beta\times\sin\theta \end{pmatrix} \quad \text{Formula (H24)}$$

or

[Mathematical formula 390]

$$F = \begin{pmatrix} \sin\theta & \cos\theta \\ \cos\theta & -\sin\theta \end{pmatrix} \quad \text{Formula (H25)}$$

In equations (H18), (H20), (H22), and (H24), β may be either a real number or an imaginary number. However, β is not 0 (zero).
or

[Mathematical formula 391]

$$F(i) = \begin{pmatrix} \beta\times e^{j\theta_{11}(i)} & \beta\times\alpha\times e^{j(\theta_{11}(i)+\lambda)} \\ \beta\times\alpha\times e^{j\theta_{21}(i)} & \beta\times e^{j(\theta_{21}(i)+\lambda+\pi)} \end{pmatrix} \quad \text{Formula (H26)}$$

or

[Mathematical formula 392]

$$F(i) = \frac{1}{\sqrt{\alpha^2+1}}\begin{pmatrix} e^{j\theta_{11}(i)} & \alpha\times e^{j(\theta_{11}(i)+\lambda)} \\ \alpha\times e^{j\theta_{21}(i)} & e^{j(\theta_{21}(i)+\lambda+\pi)} \end{pmatrix} \quad \text{Formula (H27)}$$

or

[Mathematical formula 393]

$$F(i) = \begin{pmatrix} \beta\times\alpha\times e^{j\theta_{21}(i)} & \beta\times e^{j(\theta_{21}(i)+\lambda+\pi)} \\ \beta\times e^{j\theta_{11}(i)} & \beta\times\alpha\times e^{j(\theta_{11}(i)+\lambda)} \end{pmatrix} \quad \text{Formula (H28)}$$

or

[Mathematical formula 394]

$$F(i) = \frac{1}{\sqrt{\alpha^2+1}}\begin{pmatrix} \alpha\times e^{j\theta_{21}(i)} & e^{j(\theta_{21}(i)+\lambda+\pi)} \\ e^{j\theta_{11}(i)} & \alpha\times e^{j(\theta_{11}(i)+\lambda)} \end{pmatrix} \quad \text{Formula (H29)}$$

or

[Mathematical formula 395]

$$F(i) = \begin{pmatrix} \beta\times e^{j\theta_{11}} & \alpha\times\alpha\times e^{j(\theta_{11}(i)+\lambda(i))} \\ \beta\times\alpha\times e^{j\theta_{21}} & \beta\times e^{j(\theta_{21}+\lambda(i)+\pi)} \end{pmatrix} \quad \text{Formula (H30)}$$

or

[Mathematical formula 396]

$$F(i) = \frac{1}{\sqrt{\alpha^2+1}}\begin{pmatrix} e^{j\theta_{11}} & \alpha\times e^{j(\theta_{11}+\lambda(i))} \\ \alpha\times e^{j\theta_{21}} & e^{j(\theta_{21}+\lambda(i)+\pi)} \end{pmatrix} \quad \text{Formula (H31)}$$

or

[Mathematical formula 397]

$$F(i) = \frac{1}{\sqrt{\alpha^2+1}}\begin{pmatrix} \beta\times\alpha\times e^{j\theta_{21}} & \beta\times e^{j(\theta_{21}(i)+\pi)} \\ \beta\times e^{j\theta_{11}} & \beta\times\alpha\times e^{j(\theta_{11}+\lambda(i))} \end{pmatrix} \quad \text{Formula (H32)}$$

or

[Mathematical formula 398]

$$F(i) = \frac{1}{\sqrt{\alpha^2+1}}\begin{pmatrix} \alpha\times e^{j\theta_{21}} & e^{j(\theta_{21}(i)+\pi)} \\ e^{j\theta_{11}} & \alpha\times e^{j(\theta_{11}+\lambda(i))} \end{pmatrix} \quad \text{Formula (H33)}$$

or

-continued

[Mathematical formula 399]

$$F(i) = \begin{pmatrix} \beta \times e^{j\theta_{11}} & \alpha \times \alpha \times e^{j(\theta_{11}+\lambda)} \\ \beta \times \alpha \times e^{j\theta_{21}} & \beta \times e^{j(\theta_{21}+\lambda+\pi)} \end{pmatrix} \quad \text{Formula (H34)}$$

or

[Mathematical formula 400]

$$F(i) = \frac{1}{\sqrt{\alpha^2+1}} \begin{pmatrix} e^{j\theta_{11}} & \alpha \times e^{j(\theta_{21}+\lambda)} \\ \alpha \times e^{j\theta_{21}} & e^{j(\theta_{21}+\lambda+\pi)} \end{pmatrix} \quad \text{Formula (H35)}$$

or

[Mathematical formula 401]

$$F(i) = \frac{1}{\sqrt{\alpha^2+1}} \begin{pmatrix} \beta \times \alpha \times e^{j\theta_{21}} & \beta \times e^{j(\theta_{21}+\lambda+\pi)} \\ \beta \times e^{j\theta_{11}} & \beta \times \alpha \times e^{j(\theta_{11}+\lambda)} \end{pmatrix} \quad \text{Formula (H36)}$$

or

[Mathematical formula 402]

$$F(i) = \frac{1}{\sqrt{\alpha^2+1}} \begin{pmatrix} \alpha \times e^{j\theta_{21}} & e^{j(\theta_{21}+\lambda+\pi)} \\ e^{j\theta_{11}} & \alpha \times e^{j(\theta_{11}+\lambda)} \end{pmatrix} \quad \text{Formula (H37)}$$

In the formulas, $\theta_{11}$ (i), $\theta_{21}$(i), and $\lambda$(i) are a function of i (time or frequency), $\lambda$ is a fixed value, $\alpha$ may be either a real number or an imaginary number, and $\beta$ may be either a real number or an imaginary number. However, $\alpha$ is not 0 (zero). Also $\beta$ is not 0 (zero).

Each exemplary embodiment of the present disclosure can be implemented even if a precoding matrix except for the above precoding matrix is used.

The present disclosure can widely applied to a radio system that transmits different modulated signals from the plurality of antennas. The present disclosure can also applied to the case that the MIMO transmission is performed in wired communication system (such as a PLC (Power Line Communication) system, an optical communication system, and a DSL (Digital Subscriber Line) system) including the plurality of transmission points.

Thirteenth Exemplary Embodiment

The bit length adjusting method for performing the mapping processing of an example in which the mapper performs the mapping in units of code lengths on the code length (N bits) of the code word output from the encoder is described in the first to eleventh exemplary embodiments. The method for applying the bit length adjusting methods of the first to eleventh exemplary embodiments to the DVB standard is described in the twelfth exemplary embodiment.

A transmission method instead of the above bit length adjusting method will be described in a thirteenth exemplary embodiment.

FIG. 134 illustrates configuration of a section that generates a modulated signal in a transmitter according to a thirteenth exemplary embodiment. In FIG. 134, the function and signal identical to those of the section that generates the modulated signal of the transmitter in FIG. 5 are designated by the identical reference marks, and the description is omitted. s1(i) and s2(i) in FIG. 134 are transmitted while subjected to the above pieces of processing such as the precoding (weighting synthesis), the power change, and the phase change.

According to control signal 512, mapper 13401 performs the mapping to generate first complex signal s1(i) (13402A) and second complex signal s2(i) (13402B) from input bit string 503.

It is assumed that control signal 512 assigns the N bits as the code length of the code word of the error correction coding processing, and assigns modulation schemes $\alpha$ and $\beta$ as the modulation schemes used to generated first and second complex signals s1 and s2. Modulation scheme $\alpha$ is one that is used to map the x-bit bit string, and modulation scheme $\beta$ is one that is used to map the y-bit bit string. (For example, BPSK is the modulation scheme used to map the 1-bit bit string, QPSK is the modulation scheme used to map the 2-bit bit string, 16QAM is the modulation scheme used to map the 4-bit bit string, 64QAM is the modulation scheme used to map the 6-bit bit string, and 256QAM is the modulation scheme used to map the 8-bit bit string. The modulation scheme is not limited to these modulation schemes, but the above modulation scheme may be used.)

<Case 1> the case that code length N has 64800 bits while the set of modulation schemes $\alpha$ and $\beta$ is the set of 64QAM and 256QAM (the case is referred to as (modulation scheme $\alpha$, modulation scheme $\beta$)=(64QAM,256QAM)), <Case 2> the case that code length N has 16200 bits while the set of modulation schemes $\alpha$ and $\beta$ is the set of 64QAM and 256QAM ((modulation scheme $\alpha$, modulation scheme $\beta$)=(64QAM,256QAM)), <Case 3> the case that code length N has 16200 bits while the set of modulation schemes $\alpha$ and $\beta$ is the set of 256QAM and 256QAM ((modulation scheme $\alpha$, modulation scheme $\beta$)=(256QAM,256QAM)) will be described below with respect to code length N (bits) assigned by control signal 512 and modulation schemes $\alpha$ and $\beta$.

<Case 1>

FIG. 135 is a view illustrating an example of the mapping performed with mapper 13401 in Case 1. In FIG. 135, a square surrounding "X" indicates each bit of bit string 503 input to mapper 13401 (accordingly, 64800 pieces of "X" exists).

Mapper 13401 maps the (x=6)-bit bit string using 64QAM to generate first complex signal s1, and maps the (y=8)-bit bit string using 256QAM to generate second complex signal s2. Mapper 13401 performs the mapping on the total of 4626 sets from set #1 to set #4626, and one set of the mapping includes the mapping of the (x=6)-bit bit string using 64QAM and the mapping of the (y=8)-bit bit string using 256QAM.

As illustrated in FIG. 135, because the modulation scheme for s1 of "set #1" is 64QAM while the modulation scheme of s2 of "set #1" is 256QAM, "set #1" is expressed as (s1,s2)=(64QAM,256QAM).

Similarly, "set #2" to "set #4626" are expressed as (s1, s2)=(64QAM,256QAM) (see FIG. 135).

Therefore, in bit string 503 input to mapper 13401, 4626 sets ("set #1" to "set #4626") of (s1,s2)=(64QAM, 256QAM) are generated from ((6+8)×4626=64764)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, "set #1" to "set #4626" are similarly expressed as (s1,s2)=(256QAM,64QAM) (see FIG. 135).

In "set #1" to "set #4626", (s1,s2) may be either (64QAM, 256QAM) or (256QAM,64QAM) (the modulation schemes of $s_1$ and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in “set #1” to “set #4626”, s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

Mapper 13401 maps the remaining 36 (=64800-64764) bits of input bit string 503 while switching the set of modulation schemes α and β to the set of 64QAM and 64QAM. That is, mapper 13401 maps the (x=6)-bit bit string using 64QAM to generate first complex signal $s_1$, and maps the (y=6)-bit bit string using 64QAM to generate second complex signal s2. Mapper 13401 performs the mapping on the total of 3 sets from set $1 to set $3, and 1 set of the mapping includes the mapping of the (x=6)-bit bit string using 64QAM and the mapping of the (y=6)-bit bit string using 64QAM. Therefore, 3 sets (“set $1” to “set $3”) of ($s_1$,s2)=(64QAM,64QAM) are generated from ((6+6)×3=36)-bit bit string.

The mapping is performed using 64QAM. Alternatively, the modulation scheme (such as 64APSK) having 64 signal points may be used instead of 64QAM in the I-Q plane.

Accordingly, in “set $1” to “set $3”, $s_1$ is one of the 64 signal points of the modulation scheme in the I-Q plane, and s2 is one of the 64 signal points of the modulation scheme in the I-Q plane.

Accordingly, mapper 13401 can generate the symbol set in units of code lengths each of which has the input 64800 bits.

FIG. 136 is a view illustrating an example different from the mapping performed with mapper 13401 in FIG. 135 in Case 1. The processing in FIG. 136 differs from the processing in FIG. 135 in two points. The two points will be described below.

The first point will be described below.

The set of modulation schemes α and β is the set of 64QAM and 256QAM, and the total of 4625 sets from set #1 to set #4625 is mapped.

As illustrated in FIG. 136, because the modulation scheme for s1 of “set #1” is 64QAM while the modulation scheme of s2 of “set #1” is 256QAM, “set #1” is expressed as (s1,s2)=(64QAM,256QAM).

Similarly, “set #2” to “set #4625” are expressed as (s1, s2)=(64QAM,256QAM) (see FIG. 136).

Therefore, in bit string 503 input to mapper 13401, 4625 sets (“set #1” to “set #4625”) of (s1,s2)=(64QAM, 256QAM) are generated from ((6+8)×4625=64750)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, “set #1” to “set #4625” are similarly expressed as ($s_1$,s2)=(256QAM,64QAM) (see FIG. 136).

In “set #1” to “set #4625”, (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in “set #1” to “set #4625”, s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

The second point will be described below.

Mapper 13401 maps the remaining 50 (=64800−64750) bits of input bit string 503 while switching the set of modulation schemes α and β to the set of 16QAM and 64QAM. That is, mapper 13401 maps the (x=4)-bit bit string using 16QAM to generate first complex signal s1, and maps the (y=6)-bit bit string using 64QAM to generate second complex signal s2. Mapper 13401 performs the mapping on the total of 5 sets from set $1 to set $5, and 1 set of the mapping includes the mapping of the (x=4)-bit bit string using 16QAM and the mapping of the (y=6)-bit bit string using 64QAM. Therefore, 5 sets (“set $1” to “set $5”) of (s1,s2)=(16QAM,64QAM) are generated from ((4+6)×5=50)-bit bit string.

In this case, the modulation scheme used to generate first complex signal s1 is 16QAM while the modulation scheme used to generate second complex signal s2 is 64QAM. Alternatively, the modulation scheme used to generate first complex signal s1 may be 64QAM while the modulation scheme used to generate second complex signal s2 is 16QAM. That is, “set $1” to “set $5” may be expressed as (s1,s2)=(64QAM,16QAM) (see FIG. 136).

In “set $1” to “set $5”, (s1,s2) may be either (16QAM, 64QAM) or (64QAM,16QAM) (the modulation schemes of s1 and s2 are not necessarily fixed).

The mapping is performed using 16QAM and 64QAM. Alternatively, the modulation scheme (such as 16APSK) having 16 signal points may be used instead of 16QAM in the I-Q plane, and the modulation scheme (such as 64APSK) having 64 signal points may be used instead of 64QAM in the I-Q plane.

Accordingly, in “set $1” to “set $5”, s2 is one of the 64 signal points of the modulation scheme in the I-Q plane in the case that s1 is one of the 16 signal points of the modulation scheme in the I-Q plane, and s1 is one of the 64 signal points of the modulation scheme in the I-Q plane in the case that s2 is one of the 16 signal points of the modulation scheme in the I-Q plane.

Accordingly, mapper 13401 can generate the symbol set in units of code lengths each of which has the input 64800 bits.

FIG. 137 is a view illustrating an example different from the mapping performed with mapper 13401 in FIGS. 135 and 136 in Case 1. The processing in FIG. 137 differs from the processing in FIGS. 135 and 136 in two points. The two points will be described below.

The first point will be described below.

The set of modulation schemes α and β is the set of 64QAM and 256QAM, and the total of 4628 sets from set #1 to set #4628 is mapped.

As illustrated in FIG. 137, because the modulation scheme for s1 of “set #1” is 64QAM while the modulation scheme of s2 of “set #1” is 256QAM, “set #1” is expressed as (s1,s2)=(64QAM,256QAM).

Similarly, “set #2” to “set #4628” are expressed as (s1, s2)=(64QAM,256QAM) (see FIG. 137).

Therefore, in bit string 503 input to mapper 13401, 4628 sets ("set #1" to "set #4628") of (s1,s2)=(64QAM, 256QAM) are generated from ((6+8)×4628=64792)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, "set #1" to "set #4628" are similarly expressed as (s1,s2)=(256QAM,64QAM) (see FIG. 137).

In "set #1" to "set #4628", (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in "set #1" to "set #4628", s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

The second point will be described below.

Mapper 13401 maps the remaining 8 (=64800-64792) bits of input bit string 503 while switching the set of modulation schemes α and β to the set of 16QAM and 16QAM. That is, mapper 13401 maps the (x=4)-bit bit string using 16QAM to generate first complex signal s1, and maps the (y=4)-bit bit string using 16QAM to generate second complex signal s2. Mapper 13401 performs the mapping on 1 set of set $1, and 1 set of the mapping includes the mapping of the (x=4)-bit bit string using 16QAM and the mapping of the (y=4)-bit bit string using 16QAM. Therefore, 1 set ("set $1" to "set $5") of ($s_1$,s2)=(16QAM,16QAM) is generated from ((4+4) *1=8)-bit bit string.

The mapping is performed using 16QAM. Alternatively, the modulation scheme (such as 16APSK) having 16 signal points may be used instead of 16QAM in the I-Q plane.

Accordingly, in "set $1", s1 is one of the 16 signal points of the modulation scheme in the I-Q plane, and s2 is one of the 16 signal points of the modulation scheme in the I-Q plane.

Accordingly, mapper 13401 can generate the symbol set in units of code lengths each of which has the input 64800 bits.

As illustrated in FIG. 138, mapper 13401 performs the mapping on the 4628 sets in each of which the set of modulation schemes α and β is the set of 64QAM and 256QAM, and does not need to map the remaining 8 bits.

Because the modulation scheme for s1 of "set #1" is 64QAM while the modulation scheme of s2 of "set #1" is 256QAM in FIG. 138, "set #1" is expressed as (s1,s2)= (64QAM,256QAM) as illustrated in FIG. 137.

Similarly, "set #2" to "set #4628" are expressed as (s1, s2)=(64QAM,256QAM) (see FIG. 138).

Therefore, in bit string 503 input to mapper 13401, 4628 sets ("set #1" to "set #4628") of (s1,s2)=(64QAM, 256QAM) are generated from ((6+8)×4628=64792)-bit bit string.

In this case, the modulation scheme used to generate first complex signal s1 is 64QAM while the modulation scheme used to generate second complex signal s2 is 256QAM. Alternatively, the modulation scheme used to generate first complex signal $s_1$ may be 256QAM while the modulation scheme used to generate second complex signal s2 is 64QAM. That is, "set #1" to "set #4628" are similarly expressed as (s1,s2)=(256QAM,64QAM) (see FIG. 138).

In "set #1" to "set #4628", (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in "set #1" to "set #4628", s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

Each of the transmission methods in FIGS. 135, 136, 137, and 138 may independently be performed. When code length N (bits) assigned by control signal 512 and modulation schemes α and β are Case 1, mapper 13401 may use the transmission method in FIG. 135 or the transmission methods in FIGS. 136, 137, and 138 irrespective of the coding rate of the error correction coding processing assigned by control signal 512.

Mapper 13401 may switch the transmission methods in FIGS. 135, 136, 137, and 138 according to the coding rate of the error correction coding processing assigned by control signal 512. Depending on the coding rate, mapper 13401 may use the bit string adjusting methods of the first to eleventh exemplary embodiments.

That is, one of the transmission methods is properly selected to perform the processing by the set of the error correction coding scheme, the code length, the coding rate, and the modulation scheme.

The above description is made for the code length of 64800 bits. For other code lengths, sometimes another piece of processing is performed such that a special set of the modulation schemed is inserted. In this case, the transmission method is similarly performed.

<Case 2>

FIG. 139 is a view illustrating an example of the mapping performed with mapper 13401 in Case 2. The processing in FIG. 139 differs from the processing in FIG. 135 in three points. The three points will be described below.

The first point will be described below.

Bit string 503 input to mapper 13401 has bit length N of 16200 bits.

The second point will be described below.

As illustrated in FIG. 139, because the modulation scheme for s1 of "set #1" is 64QAM while the modulation scheme of s2 of "set #1" is 256QAM, "set #1" is expressed as (s1,s2)=(64QAM,256QAM).

Similarly, "set #2" to "set #1152" are expressed as (s1, s2)=(64QAM,256QAM) (see FIG. 139).

Therefore, in bit string 503 input to mapper 13401, 1152 sets ("set #1" to "set #1152") of (s1,s2)=(64QAM,256QAM) are generated from ((6+8)×1152=16128)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, “set #1” to “set #1152” are similarly expressed as (s1,s2)=(256QAM,64QAM) (see FIG. 139).

In “set #1” to “set #1152”, (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in “set #1” to “set #1152”, s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

The third point will be described below.

Mapper 13401 maps the remaining 72 (=16200-16128) bits of input bit string 503 while switching the set of modulation schemes α and β to the set of 64QAM and 64QAM. That is, mapper 13401 maps the (x=6)-bit bit string using 64QAM to generate first complex signal s1, and maps the (y=6)-bit bit string using 64QAM to generate second complex signal s2. Mapper 13401 performs the mapping on the total of 6 sets from set $1 to set $6, and 1 set of the mapping includes the mapping of the (x=6)-bit bit string using 64QAM and the mapping of the (y=6)-bit bit string using 64QAM. Therefore, 6 sets (“set $1” to “set $6”) of ($s_1$,s2)=(64QAM,64QAM) are generated from ((6+6)×6=72)-bit bit string.

The mapping is performed using 64QAM. Alternatively, the modulation scheme (such as 64APSK) having 64 signal points may be used instead of 64QAM in the I-Q plane.

Accordingly, in “set $1” to “set $6”, s1 is one of the 64 signal points of the modulation scheme in the I-Q plane, and s2 is one of the 64 signal points of the modulation scheme in the I-Q plane.

Accordingly, mapper 13401 can generate the symbol set in units of code lengths each of which has the input 16200 bits.

FIG. 140 is a view illustrating an example different from the mapping performed with mapper 13401 in FIG. 139 in Case 2. The processing in FIG. 140 differs from the processing in FIG. 139 in two points. The two points will be described below.

The first point will be described below.

As illustrated in FIG. 140, because the modulation scheme for s1 of “set #1” is 64QAM while the modulation scheme of s2 of “set #1” is 256QAM, “set #1” is expressed as (s1,s2)=(64QAM,256QAM).

Similarly, “set #2” to “set #1155” are expressed as (s1, s2)=(64QAM,256QAM) (see FIG. 140).

Therefore, in bit string 503 input to mapper 13401, 1155 sets (“set #1” to “set #1155”) of (s1,s2)=(64QAM,256QAM) are generated from ((6+8)×1155=16170)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, “set #1” to “set #1155” are similarly expressed as (s1,s2)=(256QAM,64QAM) (see FIG. 140).

In “set #1” to “set #1155”, (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in “set #1” to “set #1155”, s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

The second point will be described below.

Mapper 13401 maps the remaining 30 (=16200-16170) bits of input bit string 503 while switching the set of modulation schemes α and β to the set of 16QAM and 64QAM. That is, mapper 13401 maps the (x=4)-bit bit string using 16QAM to generate first complex signal s1, and maps the (y=6)-bit bit string using 64QAM to generate second complex signal s2. Mapper 13401 performs the mapping on the total of 3 sets from set $1 to set $3, and 1 set of the mapping includes the mapping of the (x=6)-bit bit string using 64QAM *and* the mapping of the (y=6)-bit bit string using 64QAM. Therefore, 3 sets (“set $1” to “set $3”) of (s1,s2)=(16QAM,64QAM) are generated from ((4+6)×3=30)-bit bit string.

In this case, the modulation scheme used to generate first complex signal s1 is 16QAM while the modulation scheme used to generate second complex signal s2 is 64QAM. Alternatively, the modulation scheme used to generate first complex signal s1 may be 64QAM while the modulation scheme used to generate second complex signal s2 is 16QAM. That is, “set $1” to “set $3” may be expressed as (s1,s2)=(64QAM,16QAM) (see FIG. 140).

In “set $1” to “set $3”, (s1,s2) may be either (16QAM, 64QAM) or (64QAM,16QAM) (the modulation schemes of s1 and s2 are not necessarily fixed).

The mapping is performed using 16QAM and 64QAM. Alternatively, the modulation scheme (such as 16APSK) having 16 signal points may be used instead of 16QAM in the I-Q plane, and the modulation scheme (such as 64APSK) having 64 signal points may be used instead of 64QAM in the I-Q plane.

Accordingly, in “set $1” to “set $3”, s2 is one of the 64 signal points of the modulation scheme in the I-Q plane in the case that $s_1$ is one of the 16 signal points of the modulation scheme in the I-Q plane, and s1 is one of the 64 signal points of the modulation scheme in the I-Q plane in the case that s2 is one of the 16 signal points of the modulation scheme in the I-Q plane.

Accordingly, mapper 13401 can generate the symbol set in units of code lengths each of which has the input 16200 bits.

FIG. 141 is a view illustrating an example different from the mapping performed with mapper 13401 in FIGS. 139 and 140 in Case 2. The processing in FIG. 142 differs from the processing in FIGS. 139 and 140 in two points. The two points will be described below.

The first point will be described below.

As illustrated in FIG. 141, because the modulation scheme for s1 of “set #1” is 64QAM while the modulation scheme of s2 of “set #1” is 256QAM, “set #1” is expressed as (s1,s2)=(64QAM,256QAM).

Similarly, "set #2" to "set #1156" are expressed as (s1, s2)=(64QAM,256QAM) (see FIG. 141).

Therefore, in bit string 503 input to mapper 13401, 1156 sets ("set #1" to "set #1156") of (s1,s2)=(64QAM,256QAM) are generated from ((6+8)×1156=16184)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, "set #1" to "set #1156" are similarly expressed as (s1,s2)=(256QAM,64QAM) (see FIG. 141).

In "set $1" to "set $1156", (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in "set #1" to "set #1156", s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

The second point will be described below.

Mapper 13401 maps the remaining 16 (=16200-16184) bits of input bit string 503 while switching the set of modulation schemes α and β to the set of 16QAM and 16QAM. That is, mapper 13401 maps the (x=4)-bit bit string using 16QAM to generate first complex signal s1, and maps the (y=4)-bit bit string using 16QAM to generate second complex signal s2. Mapper 13401 performs the mapping on the total of 2 sets of "set $1" and "set $2", and 1 set of the mapping includes the mapping of the (x=4)-bit bit string using 16QAM and the mapping of the (y=4)-bit bit string using 16QAM. Therefore, 2 sets ("set $1" and "set $2") of (s1,s2)=(16QAM,16QAM) are generated from ((4+4)×2=16)-bit bit string.

The mapping is performed using 16QAM. Alternatively, the modulation scheme (such as 16APSK) having 16 signal points may be used instead of 16QAM in the I-Q plane.

Accordingly, in "set $1" and "set $2", s1 is one of the 16 signal points of the modulation scheme in the I-Q plane, and s2 is one of the 16 signal points of the modulation scheme in the I-Q plane.

Accordingly, mapper 13401 can generate the symbol set in units of code lengths each of which has the input 16200 bits.

FIG. 142 is a view illustrating an example different from the mapping performed with mapper 13401 in FIGS. 139, 140, and 141 in Case 2. The processing in FIG. 142 differs from the processing in FIGS. 139, 140, and 141 in two points. The two points will be described below.

The first point will be described below.

As illustrated in FIG. 142, because the modulation scheme for s1 of "set #1" is 64QAM while the modulation scheme of s2 of "set #1" is 256QAM, "set #1" is expressed as (s1,s2)=(64QAM,256QAM).

Similarly, "set #2" to "set #1157" are expressed as (s1, s2)=(64QAM,256QAM) (see FIG. 142).

Therefore, in bit string 503 input to mapper 13401, 1157 sets ("set #1" to "set #1157") of (s1,s2)=(64QAM,256QAM) are generated from ((6+8)×1157=16198)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, "set #1" to "set #1157" are similarly expressed as ($s_1$,s2)=(256QAM,64QAM) (see FIG. 142).

In "set #1" to "set $#1157", (s1,s2) may be either (64QAM,256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in "set #1" to "set #1157", s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

The second point will be described below.

Mapper 13401 maps the remaining 2 (=16200-16198) bits of input bit string 503 while switching the set of modulation schemes α and β to the set of BPSK and BPSK. That is, mapper 13401 maps the (x=1)-bit bit string using BPSK to generate first complex signal s1, and maps the (y=1)-bit bit string using BPSK to generate second complex signal s2. Mapper 13401 performs the mapping on 1 set of set $1, and 1 set of the mapping includes the mapping of the (x=4)-bit bit string using 16QAM and the mapping of the (y=4)-bit bit string using 16QAM. Therefore, 1 set ("set $1" to "set $5") of (s1,s2)=(BPSK, bPSK) is generated from ((1+1)×1=2)-bit bit string.

The mapping is performed using BPSK. Alternatively, the modulation scheme having 2 signal points may be used instead of BPSK in the I-Q plane.

Accordingly, in "set $1", $s_1$ is one of the 2 signal points of the modulation scheme in the I-Q plane, and s2 is one of the 2 signal points of the modulation scheme in the I-Q plane.

Accordingly, mapper 13401 can generate the symbol set in units of code lengths each of which has the input 16200 bits.

FIG. 143 is a view illustrating an example different from the mapping performed with mapper 13401 in FIGS. 139, 140, 141, and 142 in Case 2.

As illustrated in FIG. 143, because the modulation scheme for s1 of "set #1" is 64QAM while the modulation scheme of s2 of "set #1" is 256QAM, "set #1" is expressed as (s1,s2)=(64QAM,256QAM).

Similarly, "set #2" to "set #1157" are expressed as (s1, s2)=(64QAM,256QAM) (see FIG. 142).

Therefore, in bit string 503 input to mapper 13401, 1157 sets ("set #1" to "set #1157") of (s1,s2)=(64QAM,256QAM) are generated from ((6+8)×1157=16198)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, "set #1" to "set #1157" are similarly expressed as (s1,s2)=(256QAM,64QAM) (see FIG. 143).

In "set #1" to "set #1157", (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in "set #1" to "set #1157", s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

Mapper 13401 maps the remaining 2 (=16200-16198) bits of input bit string 503 while switching the set of modulation schemes α and β to the set of QPSK and "non-mapping". That is, mapper 13401 maps the (x=2)-bit bit string using QPSK to generate first complex signal $s_1$, but does not perform the mapping on second complex signal s2. Mapper 13401 performs the mapping on 1 set of set $1, and 1 set of the mapping includes the mapping of the (x=4)-bit bit string using 16QAM and the mapping of the (y=4)-bit bit string using 16QAM. Therefore, 1 set ("set $1") of (s1,s2)=(QPSK,−) is generated from (x+y=2+0=2)-bit bit string ("−" means that the mapping is not performed).

In this case, the modulation scheme used to generate first complex signal s1 is QPSK while the modulation scheme used to generate second complex signal s2 is "non-mapping". Alternatively, the modulation scheme used to generate first complex signal s1 may be "non-mapping" while the modulation scheme used to generate second complex signal s2 is QPSK. That is, "set $1" may be expressed as (s1,s2)=(−,QPSK) (see FIG. 143).

In "set $1", (s1,s2) may be either (QPSK,−) or (−,QPSK) (the modulation schemes of s1 and s2 are not necessarily fixed).

The mapping is performed using QPSK. Alternatively, the modulation scheme having 4 signal points may be used instead of QPSK in the I-Q plane.

Accordingly, in "set $1", s2 is "non-mapping" in the case that s1 is one of the 4 signal points of the modulation scheme in the I-Q plane, and s1 is "non-mapping" in the case that s2 is one of the 4 signal points of the modulation scheme in the I-Q plane.

Alternatively, s1 and s2 may be set to the identical signal. Therefore, in "set $1", s2 is equal to S2 in the case that s1 is one of the 4 signal points of the modulation scheme in the I-Q plane (however, the phase of s2 may be changed through the subsequent processing), and s1 is equal to s2 in the case that s2 is one of the 4 signal points of the modulation scheme in the I-Q plane (however, the phase of s1 may be changed through the subsequent processing).

Accordingly, mapper 13401 can generate the symbol set in units of code lengths each of which has the input 16200 bits.

As illustrated in FIG. 144, mapper 13401 performs the mapping on the 1157 sets from set #1 to set #1157 in each of which the set of modulation schemes α and β is the set of 64QAM and 256QAM, and does not need to map the remaining 2 bits.

Because the modulation scheme for s1 of "set #1" is 64QAM while the modulation scheme of s2 of "set #1" is 256QAM in FIG. 144, "set #1" is expressed as (s1,s2)=(64QAM,256QAM) as illustrated in FIG. 143.

Similarly, "set #2" to "set #1157" are expressed as (s1, s2)=(64QAM,256QAM) (see FIG. 144).

Therefore, in bit string 503 input to mapper 13401, 1157 sets ("set #1" to "set #1157") of (s1,s2)=(64QAM,256QAM) are generated from ((6+8)×1157=16198)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, "set #1" to "set #1157" are similarly expressed as (s1,s2)=(256QAM,64QAM) (see FIG. 144).

In "set #1" to "set #1157", (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in "set #1" to "set #1157", s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

Each of the transmission methods in FIGS. 139, 140, 141, 142, 143, and 144 may independently be performed. When code length N (bits) assigned by control signal 512 and modulation schemes α and β are Case 1, mapper 13401 may use the transmission method in FIG. 139 or the transmission methods in FIGS. 140, 141, 142, 143, and 144 irrespective of the coding rate of the error correction coding processing assigned by control signal 512.

Mapper 13401 may switch the transmission methods in FIGS. 139, 140, 141, 142, 143, and 144 according to the coding rate of the error correction coding processing assigned by control signal 512. Depending on the coding rate, mapper 13401 may use the bit string adjusting methods of the first to eleventh exemplary embodiments.

That is, one of the transmission methods is properly selected to perform the processing by the set of the error correction coding scheme, the code length, the coding rate, and the modulation scheme.

The above description is made for the code length of 16200 bits. For other code lengths, sometimes another piece of processing is performed such that a special set of the modulation schemed is inserted. In this case, the transmission method is similarly performed.

<Case 3>

FIG. 145 is a view illustrating an example of the mapping performed with mapper 13401 in Case 3. The processing in FIG. 145 differs from the processing in FIG. 139 in two points. The two points will be described below.

The first point will be described below.

As illustrated in FIG. 145, because the modulation scheme for s1 of "set #1" is 256QAM while the modulation scheme of s2 of "set #1" is 256QAM, "set #1" is expressed as (s1,s2)=(256QAM,256QAM).

Similarly, "set #2" to "set #1009" are expressed as (s1, s2)=(256QAM,256QAM) (see FIG. 145).

Therefore, in bit string 503 input to mapper 13401, 1009 sets ("set #1" to "set #1009") of (s1,s2)=(256QAM, 256QAM) are generated from ((8+8)×1009=16144)-bit bit string.

The mapping is performed using 256QAM. Alternatively, the modulation scheme (such as 256APSK) having 256 signal points may be used instead of 256QAM in the I-Q plane.

Accordingly, in "set #1" to "set #1009", s1 is one of the 256 signal points of the modulation scheme in the I-Q plane, and s2 is one of the 256 signal points of the modulation scheme in the I-Q plane.

The second point will be described below.

Mapper 13401 maps the remaining 56 (=16200-16144) bits of input bit string 503 while switching the set of modulation schemes α and β to the set of 64QAM and 256QAM. That is, mapper 13401 maps the (x=6)-bit bit string using 64QAM to generate first complex signal $s_1$, and maps the (y=8)-bit bit string using 256QAM to generate second complex signal s2. Mapper 13401 performs the mapping on the total of 4 sets from set $1 to set $4, and 1 set of the mapping includes the mapping of the (x=6)-bit bit string using 64QAM and the mapping of the (y=8)-bit bit string using 256QAM. Therefore, 4 sets ("set $1" to "set $4") of ($s_1$,s2)=(64QAM,256QAM) are generated from ((6+8)*4=56)-bit bit string.

In this case, the modulation scheme used to generate first complex signal s1 is 64QAM while the modulation scheme used to generate second complex signal s2 is 256QAM. Alternatively, the modulation scheme used to generate first complex signal s1 may be 256QAM while the modulation scheme used to generate second complex signal s2 is 64QAM. That is, "set $1" to "set $4" may be expressed as (s1,s2)=(256QAM,64QAM) (see FIG. 145).

In "set $1" to "set $4", (s1,s2) may be either (64QAM, 256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in "set $1" to "set $4", s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

Accordingly, mapper 13401 can generate the symbol set in units of code lengths each of which has the input 16200 bits.

FIG. 146 is a view illustrating an example different from the mapping performed with mapper 13401 in FIG. 145 in Case 3. The processing in FIG. 146 differs from the processing in FIG. 145 in two points. The two points will be described below.

The first point will be described below.

As illustrated in FIG. 146, because the modulation scheme for s1 of "set #1" is 256QAM while the modulation scheme of s2 of "set #1" is 256QAM, "set #1" is expressed as (s1,s2)=(256QAM,256QAM).

Similarly, "set #2" to "set #1011" are expressed as (s1, s2)=(256QAM,256QAM) (see FIG. 146).

Therefore, in bit string 503 input to mapper 13401, 1011 sets ("set #1" to "set #1011") of (s1,s2)=(256QAM, 256QAM) are generated from ((8+8)×1011=16176)-bit bit string.

The mapping is performed using 256QAM. Alternatively, the modulation scheme (such as 256APSK) having 256 signal points may be used instead of 256QAM in the I-Q plane.

Accordingly, in "set #1" to "set #1011", s1 is one of the 256 signal points of the modulation scheme in the I-Q plane, and s2 is one of the 256 signal points of the modulation scheme in the I-Q plane.

The second point will be described below.

Mapper 13401 maps the remaining 24 (=16200−16176) bits of input bit string 503 while switching the set of modulation schemes α and β to the set of 64QAM and 64QAM. That is, mapper 13401 maps the (x=6)-bit bit string using 64QAM to generate first complex signal s1, and maps the (y=6)-bit bit string using 64QAM to generate second complex signal s2. Mapper 13401 performs the mapping on the total of 2 sets of set $1 and set $2, and 1 set of the mapping includes the mapping of the (x=4)-bit bit string using 16QAM and the mapping of the (y=4)-bit bit string using 16QAM. Therefore, 2 sets ("set $1" and "set $2") of (s1,s2)=(64QAM,64QAM) are generated from ((6+6)×2=24)-bit bit string.

The mapping is performed using 64QAM. Alternatively, the modulation scheme having 64 signal points may be used instead of 64QAM in the I-Q plane.

Accordingly, in "set $1" and "set $2", s1 is one of the 64 signal points of the modulation scheme in the I-Q plane, and s2 is one of the 64 signal points of the modulation scheme in the I-Q plane.

Accordingly, mapper 13401 can generate the symbol set in units of code lengths each of which has the input 16200 bits.

FIG. 147 is a view illustrating an example different from the mapping performed with mapper 13401 in FIGS. 145 and 146 in Case 3. The processing in FIG. 147 differs from the processing in FIGS. 145 and 146 in two points. The two points will be described below.

The first point will be described below.

As illustrated in FIG. 147, because the modulation scheme for s1 of "set #1" is 256QAM while the modulation scheme of s2 of "set #1" is 256QAM, "set #1" is expressed as (s1,s2)=(256QAM,256QAM).

Similarly, "set #2" to "set #1012" are expressed as (s1, s2)=(256QAM,256QAM) (see FIG. 147).

Therefore, in bit string 503 input to mapper 13401, 1012 sets ("set #1" to "set #1012") of (s1,s2)=(256QAM, 256QAM) are generated from ((8+8)×1012=16192)-bit bit string.

The mapping is performed using 256QAM. Alternatively, the modulation scheme (such as 256APSK) having 256 signal points may be used instead of 256QAM in the I-Q plane.

Accordingly, in "set #1" to "set #1012", s1 is one of the 256 signal points of the modulation scheme in the I-Q plane, and s2 is one of the 256 signal points of the modulation scheme in the I-Q plane.

The second point will be described below.

Mapper 13401 maps the remaining 8 (=16200-16192) bits of input bit string 503 while switching the set of modulation schemes α and β to the set of 16QAM and 16QAM. That is, mapper 13401 maps the (x=4)-bit bit string using 16QAM to generate first complex signal $s_1$, and maps the (y=4)-bit bit string using 16QAM to generate second complex signal s2.

Mapper 13401 performs the mapping on 1 set of set $1, and 1 set of the mapping includes the mapping of the (x=4)-bit bit string using 16QAM and the mapping of the (y=4)-bit bit string using 16QAM. Therefore, 1 set ("set $1" to "set $5") of ($s_1$,s2)=(16QAM,16QAM) is generated from ((4+4) *1=8)-bit bit string.

The mapping is performed using 16QAM. Alternatively, the modulation scheme having 16 signal points may be used instead of 16QAM in the I-Q plane.

Accordingly, in "set $1", s1 is one of the 16 signal points of the modulation scheme in the I-Q plane, and s2 is one of the 16 signal points of the modulation scheme in the I-Q plane.

Accordingly, mapper 13401 can generate the symbol set in units of code lengths each of which has the input 16200 bits.

FIG. 148 is a view illustrating an example different from the mapping performed with mapper 13401 in FIGS. 145, 146, and 147 in Case 3.

As illustrated in FIG. 148, because the modulation scheme for s1 of "set #1" is 256QAM while the modulation scheme of s2 of "set #1" is 256QAM, "set #1" is expressed as (s1,s2)=(256QAM,256QAM).

Similarly, "set #2" to "set #1012" are expressed as (s1, s2)=(256QAM,256QAM) (see FIG. 148).

Therefore, in bit string 503 input to mapper 13401, 1012 sets ("set #1" to "set #1012") of (s1,s2)=(256QAM, 256QAM) are generated from ((8+8)×1012=16192)-bit bit string.

The mapping is performed using 256QAM. Alternatively, the modulation scheme (such as 256APSK) having 256 signal points may be used instead of 256QAM in the I-Q plane.

Accordingly, in "set #1" to "set #1012", s1 is one of the 256 signal points of the modulation scheme in the I-Q plane, and s2 is one of the 256 signal points of the modulation scheme in the I-Q plane.

Mapper 13401 maps the remaining 8 (=16200-16192) bits of input bit string 503 while switching the set of modulation schemes α and β to the set of 256QAM and "non-mapping". That is, mapper 13401 maps the (x=8)-bit bit string using 256QAM to generate first complex signal s1, but does not perform the mapping on second complex signal s2. Mapper 13401 performs the mapping on 1 set of set $1, and 1 set of the mapping includes the mapping of the (x=4)-bit bit string using 16QAM and the mapping of the (y=4)-bit bit string using 16QAM. Therefore, 1 set ("set $1") of (s1,s2)=(256QAM,–) is generated from (x+y=8+0=8)-bit bit string means that the mapping is not performed).

In this case, the modulation scheme used to generate first complex signal s1 is 256QAM while the modulation scheme used to generate second complex signal s2 is "non-mapping". Alternatively, the modulation scheme used to generate first complex signal s1 may be "non-mapping" while the modulation scheme used to generate second complex signal s2 is 256QAM. That is, "set $1" may be expressed as (s1,s2)=(–,256QAM) (see FIG. 148).

In "set $1", (s1,s2) may be either (256QAM,–) or (–,256QAM) (the modulation schemes of $s_1$ and s2 are not necessarily fixed).

The mapping is performed using 256QAM. Alternatively, the modulation scheme having 256 signal points may be used instead of 256QAM in the I-Q plane.

Accordingly, in "set $1", s2 is "non-mapping" in the case that $s_1$ is one of the 256 signal points of the modulation scheme in the I-Q plane, and s1 is "non-mapping" in the case that s2 is one of the 256 signal points of the modulation scheme in the I-Q plane.

Alternatively, s1 and s2 may be set to the identical signal. Therefore, in "set $1", s2 is equal to s2 in the case that s1 is one of the 256 signal points of the modulation scheme in the I-Q plane (however, the phase of s2 may be changed through the subsequent processing), and s1 is equal to s2 in the case that s2 is one of the 256 signal points of the modulation scheme in the I-Q plane (however, the phase of s1 may be changed through the subsequent processing).

Accordingly, mapper 13401 can generate the symbol set in units of code lengths each of which has the input 16200 bits.

As illustrated in FIG. 149, mapper 13401 performs the mapping on the 1012 sets from set #1 to set #1012 in each of which the set of modulation schemes α and β is the set of 256QAM and 256QAM, and does not need to map the remaining 8 bits.

Because the modulation scheme for s1 of "set #1" is 256QAM while the modulation scheme of s2 of "set #1" is 256QAM in FIG. 149, "set #1" is expressed as (s1,s2)=(256QAM,256QAM) as illustrated in FIG. 148.

Similarly, "set #2" to "set #1012" are expressed as (s1, s2)=(256QAM,256QAM) (see FIG. 149).

Therefore, in bit string 503 input to mapper 13401, 1012 sets ("set #1" to "set #1012") of (s1,s2)=(256QAM, 256QAM) are generated from ((8+8)×1012=16192)-bit bit string.

The mapping is performed using 256QAM. Alternatively, the modulation scheme (such as 256APSK) having 256 signal points may be used instead of 256QAM in the I-Q plane.

Accordingly, in "set #1" to "set #1012", s1 is one of the 256 signal points of the modulation scheme in the I-Q plane, and s2 is one of the 256 signal points of the modulation scheme in the I-Q plane.

Each of the transmission methods in FIGS. 145, 146, 147, 148, and 149 may independently be performed. When code length N (bits) assigned by control signal 512 and modulation schemes α and β are Case 1, mapper 13401 may use the transmission method in FIG. 145 or the transmission methods in FIGS. 146, 147, 148, and 149 irrespective of the coding rate of the error correction coding processing assigned by control signal 512.

Mapper 13401 may switch the transmission methods in FIGS. 145, 146, 147, 148, and 149 according to the coding rate of the error correction coding processing assigned by control signal 512. Depending on the coding rate, mapper 13401 may use the bit string adjusting methods of the first to eleventh exemplary embodiments.

That is, one of the transmission methods is properly selected to perform the processing by the set of the error correction coding scheme, the code length, the coding rate, and the modulation scheme.

The above description is made for the code length of 16200 bits. For other code lengths, sometimes another piece of processing is performed such that a special set of the modulation schemed is inserted. In this case, the transmission method is similarly performed.

As described above, s1 and s2 (s1(i) and s2(i)) generated in FIGS. 135 to 149 are transmitted while subjected to the above pieces of processing such as the precoding (weighting synthesis), the power change, and the phase change.

Alternatively, the space-time block code (sometimes referred to as MISO transmission scheme or transmission diversity) may be performed on s1 and s2 (s1(i) and s2(i)) generated in FIGS. 135 to 149 (for example, see FIGS. 150 and 161).

The space-time block coding in FIG. 150 will be described below (the space-time block coding in FIG. 161 is described later).

Mapped signal 15001 is input to MISO processor 15002, and MISO processor 15002 outputs post-MISO-processing signals 15003A and 15003B.

For example, mapped signal 15001 input to MISO processor 15002 is set to first and second complex signal s1(i) and s2(i) obtained through the mapping processing (i is an integer larger than 0). Post-M ISO-processing signal 15003A is s1(i) in slot 2i, and is s2(i) in slot (2i+1). Post-MISO-processing signal 15003B is −s2*(i) in slot 2i, and is s1*(i) in slot (2i+1). The mark "·" means a complex conjugate.

This can be reworded as follows. It is assumed that mapped signal 15001 is arranged in the order of (s1 (1),s2 (1)), (s1(2),s2(2)), (s1(3),s2(3)), . . . , (s1(i),s2(i)), . . . (i is an integer larger than 0). For example, post-MISO-processing signal 15003A is s1(1), s2(1), s1 (2), s2(2), s1 (3), s2(3), . . . , s1(i), s2(i), . . . , and post-M ISO-processing signal 15003B is −s2*(1), s1*(1), −s2*(2), s1* (2), −s2*(3), s1*(3), . . . , −s2*(i), s1*(i), . . . .

At this point, post-M ISO-processing signals 15003A and 15003B correspond to post-processing baseband signals 12502A and 12502B in FIG. 125, respectively. The space-time block coding method is not limited to the above method.

<Case 4> and <Case 5> will be described below as an example in which the space-time block code is applied.

<Case 4>

In the case that code length N has the 16200 bits while the set of modulation schemes α and β is the set of 256QAM and 256QAM similarly to <Case 3>, the transmission method is used is performed on generated first and second complex signals s1(i) and s2(i) using the space-time block code.

FIG. 151 is a view illustrating an example of the processing performing the space-time block code on the processing in FIG. 145.

In FIG. 151, because the modulation scheme sets "set #1" to "set #1009" are similar to those in FIG. 145, the description is omitted (although the case of 256QAM is described by way of example in FIG. 151, the set of modulation schemes is not limited to the case of 256QAM as described in FIG. 145).

In "set #1" to "set #1009", it is assumed that complex signal set "set #i" is expressed as (s1(i),s2(i)) (i is an integer from 1 to 1009). When the MISO processing is performed on complex signal sets (s1(1),s2(1)), (s1(2),s2(2)), . . . , (s1 (1009),s2(1009)), the set of post-MISO-processing signals 15003A and 15003B is (s1 (1),−s2*(1)) in slot 2,
(s2(1),s1*(1)) in slot 3,
(s1(2),−s2*(2)) in slot 4,
(s2(2),s1*(2)) in slot 5,
. . . ,
(s1 (1009),−s2*(1009)) in slot 2018, and
(s2(1009),s1*(1009)) in slot 2019
(signals from slots 2 to 2019).

In FIG. 151, because the modulation scheme sets "set $1" to "set $4" are similar to those in FIG. 145, the description is omitted (although the case of 64QAM and 256QAM is described by way of example in FIG. 151, the set of modulation schemes is not limited to the case of 64QAM and 256QAM as described in FIG. 145).

It is assumed that complex signal sets "set $1", "set $2", "set $3", and "set $4" are expressed as (s1 (1010),s2(1010)), (s1 (1011),s2(1011)), (s1 (1012),s2(1012)), and (s1 (1013), s2(1013)), respectively. When the MISO processing is performed on complex signal sets (s1 (1010),s2(1010)), (s1 (1011),s2(1011)), (s1 (1012),s2(1012)), and (s1 (1013),s2 (1013)), the set of post-MISO-processing signals 15003A and 15003B is (s1 (1010),−s2*(1010)) in slot 2020,
(s2(1010),s1*(1010)) in slot 2021,
(s1 (1011),−s2*(1011)) in slot 2022,
(s2(1011),s1*(1011)) in slot 2023,
(s1 (1012),−s2*(1012)) in slot 2024,
(s2(1012),s1*(1012)) in slot 2025,
(s1 (1013),−s2*(1013)) in slot 2026, and
(s2(1013),s1*(1013)) in slot 2027
(signals from slots 2020 to 2027).

FIG. 152 is a view illustrating an example of the processing performing the space-time block code on the processing in FIG. 146.

In FIG. 152, because the modulation scheme sets "set #1" to "set #1011" are similar to those in FIG. 146, the description is omitted (although the case of 256QAM is described by way of example in FIG. 152, the set of modulation schemes is not limited to the case of 256QAM as described in FIG. 146).

In "set #1" to "set #1011", it is assumed that complex signal set "set #i" is expressed as (s1 (i),s2(i)) (i is an integer from 1 to 1011). When the MISO processing is performed on complex signal sets (s1(1),s2(1)), (s1(2),s2(2)), . . . , (s1 (1011),s2(1011)), the set of post-MISO-processing signals 15003A and 15003B is (s1 (1),−s2*(1)) in slot 2, (s2(1),s1* (1)) in slot 3, (s1 (2),−$s_2$*(2)) in slot 4, (s2(2),s1*(2)) in slot 5, . . . , (s1 (1011),−s2*(1011)) in slot 2022, and (s2(1011), s1*(1011)) in slot 2023 (signals from slots 2 to 2023).

In FIG. 152, because the modulation scheme sets "set $1" and "set $2" are similar to those in FIG. 146, the description is omitted (although the case of 64QAM is described by way of example in FIG. 152, the set of modulation schemes is not limited to the case of 64QAM as described in FIG. 146).

It is assumed that complex signal sets "set $1" and "set $2" are expressed as (s1 (1012),s2(1012)) and (s1 (1013), s2(1013)), respectively. When the MISO processing is performed on complex signal sets (s1 (1012),s2(1012)) and (s1 (1013),s2(1013)), the set of post-MISO-processing signals 15003A and 15003B is (s1 (1012),−s2*(1012)) in slot 2024,
(s2(1012),s1*(1012)) in slot 2025,
(s1 (1013),−s2*(1013)) in slot 2026, and
(s2(1013),s1*(1013)) in slot 2027
(signals from slots 2024 to 2027).

FIG. 153 is a view illustrating an example of the processing performing the space-time block code on the processing in FIG. 147.

In FIG. 153, because the modulation scheme sets "set #1" to "set #1012" are similar to those in FIG. 147, the description is omitted (although the case of 256QAM is described by way of example in FIG. 153, the set of modulation schemes is not limited to the case of 256QAM as described in FIG. 147).

In "set #1" to "set #1012", it is assumed that complex signal set "set #i" is expressed as (s1(i),s2(i)) (i is an integer from 1 to 1012). When the MISO processing is performed on complex signal sets (s1(1),s2(1)), (s1(2),s2(2)), . . . , (s1 (1012),s2(1012)), the set of post-MISO-processing signals 15003A and 15003B is (s1 (1),−s2*(1)) in slot 2, (s2(1),s1*(1)) in slot 3, (s1(2),−s2*(2)) in slot 4, (s2(2),s1*(2)) in slot 5,

. . . , (s1 (1011),−s2*(1011)) in slot 2022, (s2(1011),s1*(1011)) in slot 2023, (s1 (1012),−s2*(1012)) in slot 2024, and (s2(1012),s1*(1012)) in slot 2025

(signals from slots 2 to 2025).

In FIG. 153, because the modulation scheme set "set #1" is similar to those in FIG. 147, the description is omitted (although the case of 16QAM is described by way of example in FIG. 153, the set of modulation schemes is not limited to the case of 16QAM as described in FIG. 147).

It is assumed that complex signal set "set $1" is expressed as (s1 (1013),s2(1013)). When the MISO processing is performed on complex signal set (s1 (1013),s2(1013)), the set of post-MISO-processing signals 15003A and 15003B is s1 (1013),−s2*(1013)) in slot 2026 and (s2(1013),s1*(1013)) in slot 2027

(signals from slots 2026 and 2027).

FIG. 154 is a view illustrating an example of the processing performing the space-time block code on the processing in FIG. 148.

In FIG. 154, because the modulation scheme sets "set #1" to "set #1012" are similar to those in FIG. 148, the description is omitted (although the case of 256QAM is described by way of example in FIG. 154, the set of modulation schemes is not limited to the case of 256QAM as described in FIG. 148).

In "set #1" to "set #1012", it is assumed that complex signal set "set #i" is expressed as (s1(i),s2(i)) (i is an integer from 1 to 1012). When the MISO processing is performed on complex signal sets (s1(1),s2(1)), (s1(2),s2(2)), . . . , (s1 (1012),s2(1012)), the set of post-MISO-processing signals 15003A and 15003B is (s1 (1),−s2*(1)) in slot 2, (s2(1),s1*(1)) in slot 3, (s1(2),−s2*(2)) in slot 4, (s2(2),s1*(2)) in slot 5,

. . . , (s1 (1011),−s2*(1011)) in slot 2022, (s2(1011),s1*(1011)) in slot 2023, ($s_1$ (1012),−s2*(1012)) in slot 2024, and (s2(1012),s1*(1012)) in slot 2025

(signals from slots 2 to 2025).

In FIG. 154, because the modulation scheme set "set #1" is similar to those in FIG. 148, the description is omitted (although the case of "256QAM" and "non-mapping" is described by way of example in FIG. 154, the set of modulation schemes is not limited to the case of 16QAM as described in FIG. 148).

Because there are the plurality of transmission methods, the transmission methods will be described below.

Method 154-1: It is assumed that complex signal set "set $1" is expressed as (s1 (1013),s2(1013)). When the MISO processing is performed on complex signal set (s1 (1013),s2 (1013)), the set of post-MISO-processing signals 15003A and 15003B is (s1 (1013),−s2*(1013)) in slot 2026 and (s2(1013),s1*(1013)) in slot 2027 (signals from slots 2026 and 2027).

Method 154-2: It is assumed that complex signal set "set $1" is expressed as ($s_1$ (1013),s2(1013)).

8 bits are transmitted using s1, but the bit is not transmitted using s2. At this point, the set of signals 15003A and 15003B is set to (s1 (1013),0) in slot 2026 without performing the MISO processing.

Otherwise 8 bits are transmitted using s2, but the bit is not transmitted using s1. At this point, the set of signals 15003A and 15003B is set to (0,s2(1013)) in slot 2026 without performing the MISO processing.

Method 154-3: It is assumed that complex signal set "set $1" is expressed as ($s_1$ (1013),s2(1013)).

It is assumed that 8 bits are transmitted using $s_1$, and that similarly 8 bits are transmitted using s2. At this point, the set of signals 15003A and 15003B is set to ($s_1$ (1013),s2(1013) =$s_1$ (1013)) in slot 2026 without performing the MISO processing.

FIG. 155 is a view illustrating the processing performing the space-time block code on the processing in FIG. 149.

In FIG. 155, because the modulation scheme sets "set #1" to "set #1012" are similar to those in FIG. 149, the description is omitted (although the case of 256QAM is described by way of example in FIG. 155, the set of modulation schemes is not limited to the case of 256QAM as described in FIG. 149).

In "set #1" to "set #1012", it is assumed that complex signal set "set #i" is expressed as (s1(i),s2(i)) (i is an integer from 1 to 1012). When the MISO processing is performed on complex signal sets (s1(1),s2(1)), ($s_1$(2),s2(2)), . . . , (s1 (1012),s2(1012)), the set of post-MISO-processing signals 15003A and 15003B is (s1 (1),−s2*(1)) in slot 2, (s2(1),s1*(1)) in slot 3, (s1(2),−s2*(2)) in slot 4, (s2(2),s1*(2)) in slot 5,

. . . , (s1 (1011),−s2*(1011)) in slot 2022, (s2(1011),s1*(1011)) in slot 2023, (s1 (1012),−s2*(1012)) in slot 2024, and (s2(1012),s1*(1012)) in slot 2025

(signals from slots 2 to 2025).

The remaining 8 bits are not transmitted.

The above description is made for the code length of 16200 bits. For other code lengths, sometimes another piece of processing is performed such that a special set of the modulation schemed is inserted. In this case, the transmission method is similarly performed.

<Case 5>

The processing different from <Case 4>, which is performed with mapper 13401, in the case that the plurality of code blocks each of which has code length N of 16200 bits are continuously arranged while the set of modulation schemes α and β is the set of 256QAM and 256QAM will be described below.

FIG. 156 is a view illustrating the processing performed with mapper 13401 in the case that the code block having code length N of 16200 bits is an even number (therefore, the number of code blocks is set to 2g (g is a natural number)) while the set of modulation schemes α and β (the set of (modulation scheme of $s_1$, modulation scheme of s2)) is the set of 256QAM and 256QAM.

In FIG. 156, although "set #1" to "set #2025g" exist, and "set" means the set of (s1,s2), and is expressed as (s1,s2)= (256QAM,256QAM) because (modulation scheme of s1, modulation scheme of s2) is (256QAM,256QAM).

The number of bits of all the blocks becomes (16200×2g=32400×g) because the number of code blocks is 2g, and ((32400×g)/16=2025×g) sets exist because of (x+y=8+8=16) obtained from the set of 256QAM and 256QAM, which is of the set of modulation schemes α and β.

The mapping is performed using 256QAM. Alternatively, the modulation scheme (such as 256APSK) having 256 signal points may be used instead of 256QAM in the I-Q plane.

Accordingly, in "set #1" to "set #2025g", s1 is one of the 256 signal points of the modulation scheme in the I-Q plane, and s2 is one of the 256 signal points of the modulation scheme in the I-Q plane.

As described in <Case 4>, the MISO processing is performed using the set of s1 and s2 in each of sets "set #1" to "set #2025g", and the transmitter transmits the set of post-MISO-processing signals 15003A and 15003B.

Accordingly, mapper 13401 maps the total of 2025g sets from set #1 to set #2025g, which allows the transmission of the data. "Set #1" to "set #2025g" may be generated from (32400×g) bits by any method.

FIG. 157 is a view illustrating the processing performed with mapper 13401 in the case that the code block having code length N of 16200 bits is an odd number (therefore, the number of code blocks is set to (2g+1) (g is an integer larger than 0)) while the set of modulation schemes α and β (the set of (modulation scheme of s1, modulation scheme of s2)) is the set of 256QAM and 256QAM or the set of 64QAM and 256QAM.

In FIG. 157, although "set #1" to "set #(2025×g+1009)" and "set $1" to "set $4" exist, the set of (modulation scheme of s1, modulation scheme of s2) in "set #1" to "set #(2025×g+1009)" is expressed as (s1,s2)=(256QAM,256QAM), and the set of (modulation scheme of $s_1$, modulation scheme of s2) in "set $1" to "set $4" is expressed as (s1,s2)=(64QAM,256QAM).

In FIG. 157, the set of (modulation scheme of s1, modulation scheme of s2) in "set #1" to "set #(2025×g+1009)" is expressed as (s1,s2)=(256QAM,256QAM). Alternatively, the modulation scheme (such as 256APSK) having 256 signal points may be used instead of 256QAM in the I-Q plane.

Accordingly, in "set #1" to "set #(2025×g+1009)", $s_1$ is one of the 256 signal points of the modulation scheme in the I-Q plane, and s2 is one of the 256 signal points of the modulation scheme in the I-Q plane.

As described in <Case 4>, the MISO processing is performed using the set of s1 and s2 in each of sets "set #1" to "set #(2025×g+1009)", and the transmitter transmits the set of post-MISO-processing signals 15003A and 15003B.

In FIG. 157, although the set of (modulation scheme of s1, modulation scheme of s2) in "set $1" to "set $4" is expressed as (s1,s2)=(64QAM,256QAM), ($s_1$,s2) may be either (64QAM,256QAM) or (256QAM,64QAM) (the modulation schemes of s1 and s2 are not necessarily fixed).

The mapping is performed using 64QAM and 256QAM. Alternatively, the modulation scheme (such as 64APSK) having 64 signal points may be used instead of 64QAM in the I-Q plane, and the modulation scheme (such as 256APSK) having 256 signal points may be used instead of 256QAM in the I-Q plane.

Accordingly, in "set $1" to "set $4", s2 is one of the 256 signal points of the modulation scheme in the I-Q plane in the case that s1 is one of the 64 signal points of the modulation scheme in the I-Q plane, and s1 is one of the 256 signal points of the modulation scheme in the I-Q plane in the case that s2 is one of the 64 signal points of the modulation scheme in the I-Q plane.

As described in <Case 4>, the MISO processing is performed using the set of s1 and s2 in each of sets "set $1" to "set $4", and the transmitter transmits the set of post-MISO-processing signals 15003A and 15003B.

FIG. 158 is a view illustrating the processing performed with mapper 13401 in the case that the code block having code length N of 16200 bits is an odd number (therefore, the number of code blocks is set to (2g+1) (g is an integer larger than 0)) while the set of modulation schemes α and β (the set of (modulation scheme of s1, modulation scheme of s2)) is the set of 256QAM and 256QAM or the set of 64QAM and 64QAM.

In FIG. 158, although "set #1" to "set #(2025×g+1011)" and "set$1" and "set $2" exist, the set of (modulation scheme of s1, modulation scheme of s2) in "set #1" to "set #(2025×g+1011)" is expressed as (s1,s2)=(256QAM,256QAM), and the set of (modulation scheme of s1, modulation scheme of s2) in "set $1" and "set $2" is expressed as (s1,s2)=(64QAM,64QAM).

In FIG. 158, the set of (modulation scheme of s1, modulation scheme of s2) in "set #1" to "set #(2025×g+1011)" is expressed as (s1,s2)=(256QAM,256QAM). Alternatively, the modulation scheme (such as 256APSK) having 256 signal points may be used instead of 256QAM in the I-Q plane.

Accordingly, in "set #1" to "set #(2025×g+1011)", s1 is one of the 256 signal points of the modulation scheme in the I-Q plane, and s2 is one of the 256 signal points of the modulation scheme in the I-Q plane.

As described in <Case 4>, the MISO processing is performed using the set of s1 and s2 in each of sets "set #1" to "set #(2025×g+1011)", and the transmitter transmits the set of post-MISO-processing signals 15003A and 15003B.

In FIG. 158, the set of (modulation scheme of s1, modulation scheme of s2) in "set $1" and "set $2" is expressed as (s1,s2)=(64QAM,64QAM). Alternatively, the modulation scheme (such as 64APSK) having 64 signal points may be used instead of 64QAM in the I-Q plane.

Accordingly, in "set $1" and "set $2", s1 is one of the 64 signal points of the modulation scheme in the I-Q plane, and s2 is one of the 64 signal points of the modulation scheme in the I-Q plane.

As described in <Case 4>, the MISO processing is performed using the set of s1 and s2 in each of sets "set $1" and "set $2", and the transmitter transmits the set of post-MISO-processing signals 15003A and 15003B.

FIG. 159 is a view illustrating the processing performed with mapper 13401 in the case that the code block having code length N of 16200 bits is an odd number (therefore, the number of code blocks is set to (2g+1) (g is an integer larger than 0)) while the set of modulation schemes α and β (the set of (modulation scheme of s1, modulation scheme of s2)) is the set of 256QAM and 256QAM or the set of 16QAM and 16QAM.

In FIG. 159, although "set #1" to "set #(2025×g+1012)" and "set $1" exist, the set of (modulation scheme of s1, modulation scheme of s2) in "set #1" to "set #(2025×g+1012)" is expressed as (s1,s2)=(256QAM,256QAM), and the set of (modulation scheme of s1, modulation scheme of s2) in "set $1" is expressed as (s1,s2)=(16QAM,16QAM).

In FIG. 159, the set of (modulation scheme of s1, modulation scheme of s2) in "set #1" to "set #(2025×g+1012)" is expressed as (s1,s2)=(256QAM,256QAM). Alternatively, the modulation scheme (such as 256APSK) having 256 signal points may be used instead of 256QAM in the I-Q plane.

Accordingly, in "set #1" to "set #(2025×g+1012)", s1 is one of the 256 signal points of the modulation scheme in the I-Q plane, and s2 is one of the 256 signal points of the modulation scheme in the I-Q plane.

As described in <Case 4>, the MISO processing is performed using the set of s1 and s2 in each of sets "set #1" to "set #(2025×g+1012)", and the transmitter transmits the set of post-MISO-processing signals 15003A and 15003B.

In FIG. 159, the set of (modulation scheme of s1, modulation scheme of s2) in "set $1" is expressed as (s1,s2)=(16QAM,16QAM). Alternatively, the modulation scheme (such as 16APSK) having 16 signal points may be used instead of 16QAM in the I-Q plane.

Accordingly, in "set $1", s1 is one of the 16 signal points of the modulation scheme in the I-Q plane, and s2 is one of the 16 signal points of the modulation scheme in the I-Q plane.

As described in <Case 4>, the MISO processing is performed using the set of s1 and s2 in "set $1", and the transmitter transmits the set of post-MISO-processing signals 15003A and 15003B.

FIG. 160 is a view illustrating the processing performed with mapper 13401 in the case that the code block having code length N of 16200 bits is an odd number (therefore, the number of code blocks is set to (2g+1) (g is an integer larger than 0)) while the set of modulation schemes α and β (the set of (modulation scheme of s1, modulation scheme of s2)) is the set of 256QAM and 256QAM or the set of 256QAM and "non-mapping" (in FIG. 160, "non-mapping" is indicated by mark In FIG. 160, although "set #1" to "set #(2025×g+1012)" and "set $1" exist, the set of (modulation scheme of s1, modulation scheme of s2) in "set #1" to "set #(2025×g+1012)" is expressed as (s1,s2)=(256QAM,256QAM), and the set of (modulation scheme of s1, modulation scheme of s2) in "set $1" is expressed as (s1,s2)=(256QAM,–) or (—,256QAM).

In FIG. 160, the set of (modulation scheme of s1, modulation scheme of s2) in "set #1" to "set #(2025×g+1012)" is expressed as (s1,s2)=(256QAM,256QAM). Alternatively, the modulation scheme (such as 256APSK) having 256 signal points may be used instead of 256QAM in the I-Q plane.

Accordingly, in "set #1" to "set #(2025×g+1012)", s1 is one of the 256 signal points of the modulation scheme in the I-Q plane, and s2 is one of the 256 signal points of the modulation scheme in the I-Q plane.

As described in <Case 4>, the MISO processing is performed using the set of s1 and s2 in each of sets "set #1" to "set #(2025×g+1012)", and the transmitter transmits the set of post-MISO-processing signals 15003A and 15003B.

In FIG. 160, the set of (modulation scheme of s1, modulation scheme of s2) in "set $1" is expressed as (s1,s2)=(256QAM,–) or (—,256QAM). Alternatively, the modulation scheme (such as 256APSK) having 256 signal points may be used instead of 256QAM in the I-Q plane.

Accordingly, in "set $1", s2 is "non-mapping" in the case that s1 is one of the 256 signal points of the modulation scheme in the I-Q plane, and s1 is "non-mapping" in the case that s2 is one of the 256 signal points of the modulation scheme in the I-Q plane.

A plurality of transmission methods with respect to the "set $1" transmitting method in FIG. 160 will be described below.

Method 160-1:

It is assumed that complex signal set "set $1" is expressed as (s1,s2).

When the MISO processing is performed on complex signal set (s1,s2), (s1,–s2*) is transmit as the set of post-MISO-processing signals 15003A and 15003B in the first slot. (s2,s1*) is transmitted in the second slot of "set $1".

Method 160-2:

It is assumed that complex signal set "set $1" is expressed as (s1,s2).

At this point, "set $1" is transmitted by one slot.

8 bits are transmitted using s1, but the bit is not transmitted using s2. At this point, the set of signals 15003A and 15003B is set to (s1,0) in the first slot of "set $1"

without performing the MISO processing.

Otherwise 8 bits are transmitted using s2, but the bit is not transmitted using s1. At this point, the set of signals 15003A and 15003B is set to (0,s2) in the first slot of "set $1"

without performing the MISO processing.

Method 160-3:

It is assumed that complex signal set "set $1" is expressed as (s1,s2). At this point, "set $1" is transmitted by one slot.

It is assumed that 8 bits are transmitted using s1, and that similarly 8 bits are transmitted using s2. At this point, the set of signals 15003A and 15003B is set to (s1,s2=s1) in the first slot of "set $1"

without performing the MISO processing (however, the phase of s1 and/or s2 may be changed through the subsequent processing).

In Case 5, the description is made while the number of code blocks is divided into the even number and the odd number. For example, the transmitter counts the number of code blocks existing in the frame, and performs one of the pieces of processing for the even and odd numbers.

The case that the code length has the 16200 bits while (256QAM,256QAM) is included in (modulation scheme of s1, modulation scheme of s2) is described above. Alternatively, depending on the number of code blocks, there is a transmission method in which the slot for the space-time block coding and a slot for special processing are provided.

Modification of Transmission Method with Space-Time Block Code>

The method of the space-time block code (sometimes referred to as MISO transmission scheme or transmission diversity) is not limited to the configuration in FIG. 150, but the space-time block code may be transmitted as illustrated in FIG. 161 (because the operation in FIG. 161 is similar to that in FIG. 150, the component is designated by the identical reference mark).

Mapped signal 15001 is input to MISO processor 15002, and MISO processor 15002 outputs post-MISO-processing signals 15003A and 15003B.

For example, mapped signal 15001 input to MISO processor 15002 is set to first and second complex signal s1(i) and s2(i) obtained through the mapping processing (i is an integer larger than 0). Post-MISO-processing signal 15003A is s1(i) in slot 2i, and is –s2*(i) in slot (2i+1). Post-MISO-processing signal 15003B is s2(i) in slot 2i, and is s1*(i) in slot (2i+1). The mark "*" means a complex conjugate.

This can be reworded as follows. It is assumed that mapped signal 15001 is arranged in the order of (s1 (1),s2 (1)), (s1(2),s2(2)), (s1(3),s2(3)), . . . , (s1(i),s2(i)), . . . (i is an integer larger than 0). For example, post-MISO-processing signal 15003A is s1 (1),–s2*(1), s1 (2), –s2*(2), s1(3), −s2*(3), . . . , s1(i), −s2*(i), . . . , and post-MISO-processing signal 15003B is s2(1), s1*(1), s2(2), s1*(2), s2(3), s1*(3), . . . , s2(i), s1*(i), . . . .

At this point, post-MISO-processing signals 15003A and 15003B correspond to post-processing baseband signals 12502A and 12502B in FIG. 125, respectively. The space-time block coding method is not limited to the above method.

<Processing of Receiver>

In the transmission method, the modulation is performed based on the code length N and modulation schemes α and β, which are assigned by control signal 512. Accordingly, when recognizing code length N and modulation schemes α and β, the receiver can demodulate the modulated signal modulated by the transmission method.

For example, information identifying code length N and modulation schemes α and β is transmitted from the transmitter as control information symbols 12602, 12605A, and 1605B in FIG. 126. For example, control information symbols 12602, 12605A, and 1605B are demodulated (and error-correction-decoded) with control signal demodulator 12401 of the receiver in FIG. 127, and output as control information signal 12402.

Signal processor 12705 determines code length N and modulation schemes α and β from control information signal 12402, and demodulates quadrature baseband signals 12704X and 12704Y, which are obtained by receiving the modulated signals modulated by the transmission method, based on determined code length N and modulation schemes α and β.

For example, it is assumed that <Case 1>, in which the modulated signal is generated by the transmission method in FIG. 135 in the case that code length N has the 64800 bits while the set of modulation schemes α and β is the set of 64QAM and 256QAM, is previously decided between the transmitter and the receiver.

Signal processor 12705 recognizes that 64764 bits in the 64800-bit code word of the received signal are modulated by the set of 64QAM and 256QAM while the remaining 36 bits are modulated by the set of 64QAM and 64QAM from the information indicating code length N of 64800 bits, modulation scheme α of 64QAM, and modulation scheme β of 256QAM, the information being determined from control information signal 12402.

Therefore, signal processor 12705 obtained 64764-bit log-likelihood ratio by demodulating quadrature baseband signals 12704X and 12704Y of the total of 4626 sets from set #1 to set #4626 using the demodulation scheme corresponding to the modulation scheme set of 64QAM and 256QAM. Signal processor 12705 also obtained 36-bit log-likelihood ratio by demodulating quadrature baseband signals 12704X and 12704Y of the total of 3 sets from set $1 to set $3 using the demodulation scheme corresponding to the modulation scheme set of 64QAM and 64QAM.

signal processor 12705 outputs the obtained (64764+36=64800)-bit log-likelihood ratio as log-likelihood ratio signal 12706 (sometimes signal processor 12705 performs the deinterleaving processing).

Log-likelihood ratio signal 12706 and control information signal 12402 are input to decoder 12707, and decoder 12707 performs the error correction decoding from the error correction coding scheme included in the control information, and outputs received data 12708.

The transmission method in FIG. 135 is described above by way of example. However, the demodulation and the decoding can be performed by not only the transmission method in FIG. 135 but also any one of the transmission methods of the exemplary embodiments.

When the transmitter transmits the control information indicating which one of the transmission methods of the exemplary embodiments is used to transmit the signal, the receiver can recognize the transmission method used in the transmitter from the control information, and obtain the data. Accordingly, the control information transmitting method is not limited to the above exemplary embodiments.

Summary of Exemplary Embodiments

According to a first aspect of the present disclosure, a transmission method includes: performing error correction coding on an information bit string to generate a code word having a number of bits that is greater than a predetermined integral multiple of (X+Y); modulating a first bit string in which the number of bits is the predetermined integral multiple of (X+Y) in the code word using a first scheme, the first scheme being a set of a modulation scheme in which mapping an X-bit bit string to generate a first complex signal and a modulation scheme in which mapping a Y-bit bit string to generate a second complex signal; and modulating a second bit string in which the first bit string is removed from the code word using a second scheme different from the first scheme.

According to a second aspect of the present disclosure, in the transmission method of the first aspect, the second scheme is a set of a modulation scheme in which an A-bit bit string is mapped to generate a third complex signal and a modulation scheme in which a B-bit bit string is mapped to generate a fourth complex signal, and (A+B) is a divisor of the number of bits of the second bit string.

According to a third aspect of the present disclosure, in the transmission method of the second aspect, further includes: transmitting complex signals generated by performing space-time block coding to the first complex signal and the second complex signal.

According to a fourth aspect of the present disclosure, in the transmission method of the second aspect, the second scheme is a scheme which generates a single-stream complex signal by using the third complex signal and the fourth complex signal.

According to a fifth aspect of the present disclosure, in the transmission method of the fourth aspect, further includes: transmitting complex signals of a plurality of streams generated by performing the space-time block coding, the complex signals of a plurality of streams being generated by using the first scheme, and the single-stream complex signal generated by not performing the space-time block coding, the single-stream complex signal being generated by using the second scheme.

According to a sixth aspect of the present disclosure, a transmitter includes: an encoder that performs error correction coding on an information bit string to generate a code word having a number of bits that is greater than a predetermined integral multiple of (X+Y); and a mapper that modulates a first bit string in which the number of bits is the predetermined integral multiple of (X+Y) in the code word using a first scheme, the first scheme being a set of a modulation scheme in which mapping an X-bit bit string to generate a first complex signal and a modulation scheme in which mapping a Y-bit bit string to generate a second complex signal, and modulates a second bit string in which the first bit string is removed from the code word using a second scheme different from the first scheme.

According to a seventh aspect of the present disclosure, a reception method includes: demodulating a received signal to generate a demodulated signal according to a first scheme and a second scheme; the first scheme being a scheme of a set of a modulation scheme in which an X-bit bit string is mapped to generate a first complex signal and a modulation scheme in which a Y-bit bit string is mapped to generate a second complex signal, the second scheme being different from the first scheme, the received signal being a signal obtained by receiving a transmitted signal transmitted from a transmitter, the transmitted signal including a first signal and a second signal, the first signal being generated from a first bit string that is of a predetermined integral multiple of (X+Y) using the first scheme, the second signal being generated from the second bit string in which a number of bits is not the predetermined integral multiple of (X+Y) using the second scheme, a code word constructed with the first bit string and the second bit string being generated by performing error correction coding on information bit string; and performing error correction decoding on the demodulated signal.

According to an eighth aspect of the present disclosure, a receiver includes: a signal processor that demodulates a received signal to generate a demodulated signal according to a first scheme and a second scheme, the first scheme being a scheme of a set of a modulation scheme in which an X-bit bit string is mapped to generate a first complex signal and a modulation scheme in which a Y-bit bit string is mapped to generate a second complex signal, the second scheme being different from the first scheme, the received signal being a signal obtained by receiving a transmitted signal transmitted from a transmitter, the transmitted signal including a first signal and a second signal, the first signal being generated from a first bit string that is of a predetermined integral multiple of (X+Y) using the first scheme, the second signal being generated from the second bit string in which a number of bits is not the predetermined integral multiple of (X+Y) using the second scheme, a code word constructed with the first bit string and the second bit string being generated by performing error correction coding on information bit string; and a decoder that performs error correction decoding on the demodulated signal.

While the exemplary embodiments are described above with reference to the drawings, the present disclosure is not limited to the exemplary embodiments. It will be obvious to those skilled in the art that various changes and variations can be made within the appended claims, and it should be understood that these changes and variations fall within the technical scope of the present disclosure. The constituents of the exemplary embodiments may arbitrarily be combined without departing from the scope of the present disclosure.

INDUSTRIAL APPLICABILITY

The present disclosure can widely applied to a radio system that transmits different modulated signals from the plurality of antennas. The present disclosure can also applied to the case that the MIMO transmission is performed in wired communication system (such as a PLC (Power Line Communication) system, an optical communication system, and a DSL (Digital Subscriber Line) system) including the plurality of transmission points.

REFERENCE MARKS IN THE DRAWINGS

502,502LA encoder
502BI bit interleaver
5701,6001,7301,8001 bit length adjuster
504 mapper

What is claimed is:

1. A transmission method comprising:

encoding, with an encoder, first information according to a first coding rate and a first coding length to generate a first encoded data sequence, the first coding length being 16200;

encoding, with the encoder, second information according to the first coding rate and a second coding length to generate a second encoded data sequence, the second coding length being 64800;

generating an appended data sequence from the first encoded data sequence by appending a part of the first encoded data sequence;

mapping, with a mapper, the appended data sequence onto 64 signal points defined by a first 64 Quadrature Amplitude Modulation (QAM) scheme to generate a first modulation symbol sequence;

mapping, with the mapper, the second encoded data sequence onto 64 signal points defined by a second 64 QAM scheme to generate a second modulation symbol sequence;

transmitting a signal generated based on the first modulation symbol sequence and the second modulation symbol sequence, wherein the 64 signal points are representable on an I-Q plane having a real axis and an imaginary axis such that a distance between adjacent signal points has nonuniformity, the 64 signal points defined by the first 64 QAM scheme have a first arrangement pattern on the I-Q plane, and the 64 signal points defined by the second 64 QAM scheme have a second arrangement pattern on the I-Q plane different from the first arrangement pattern.

* * * * *